US007599421B2

(12) United States Patent
Sorrells et al.

(10) Patent No.: US 7,599,421 B2
(45) Date of Patent: Oct. 6, 2009

(54) SPREAD SPECTRUM APPLICATIONS OF UNIVERSAL FREQUENCY TRANSLATION

(75) Inventors: David F. Sorrells, Middleburg, FL (US); Michael J. Bultman, Jacksonville, FL (US); Charles D. Clements, Jacksonville, FL (US); Robert W. Cook, Switzerland, FL (US); Joseph M. Hamilla, St. Augustine, FL (US); Richard C. Looke, Jacksonville, FL (US); Charley D. Moses, Jr., DeBary, FL (US); Gregory S. Rawlins, Heathrow, FL (US); Michael W. Rawlins, Lake Mary, FL (US); Gregory S. Silver, St. Augustine, FL (US)

(73) Assignee: ParkerVision, Inc., Jacksonville, FL (US)

( * ) Notice: Subject to any disclaimer, the term of this patent is extended or adjusted under 35 U.S.C. 154(b) by 27 days.

(21) Appl. No.: 11/404,957

(22) Filed: Apr. 17, 2006

(65) Prior Publication Data

US 2006/0280231 A1 Dec. 14, 2006

Related U.S. Application Data

(63) Continuation of application No. 09/525,185, filed on Mar. 14, 2000, now Pat. No. 7,110,435.

(60) Provisional application No. 60/180,667, filed on Feb. 7, 2000, provisional application No. 60/171,496, filed on Dec. 22, 1999, provisional application No. 60/124,376, filed on Mar. 15, 1999, provisional application No. 60/177,381, filed on Jan. 24, 2000, provisional application No. 60/171,502, filed on Dec. 22, 1999, provisional application No. 60/177,705, filed on Jan. 24, 2000, provisional application No. 60/129,839, filed on Apr. 16, 1999, provisional application No. 60/158,047, filed on Oct. 7, 1999, provisional application No. 60/171,349, filed on Dec. 21, 1999, provisional application No. 60/177,702, filed on Jan. 24, 2000.

(51) Int. Cl.
*H04B 1/00* (2006.01)

(52) U.S. Cl. ....................... 375/147; 375/130; 375/136; 375/137; 375/142; 375/145; 375/149

(58) Field of Classification Search ................. 375/130, 375/136, 137, 142, 145, 147, 149
See application file for complete search history.

(56) References Cited

U.S. PATENT DOCUMENTS 2,057,613 A 10/1936 Gardner (Continued)

FOREIGN PATENT DOCUMENTS

DE 1936252 1/1971

(Continued)

OTHER PUBLICATIONS

English-language Abstract of Japanese Patent Publication No. JP 61-232706, data supplied by the espacenet, 1 page (Oct. 17, 1986—Date of publication of application).

(Continued)

*Primary Examiner*—Curtis B Odom
(74) *Attorney, Agent, or Firm*—Sterne, Kessler, Goldstein & Fox PLLC

(57) ABSTRACT

Frequency translation and spread spectrum applications of same are described herein. Such applications include, but are not limited to, unified down-conversion and de-spreading, unified up-conversion and spreading, RAKE receivers utilizing unified down-conversion and de-spreading, and Early/Late receivers utilizing unified down-conversion and de-spreading, and combinations and applications of same. Additionally, applications are included for limiting spectral growth during unified up-conversion and spreading of a baseband signal.

29 Claims, 189 Drawing Sheets

U.S. PATENT DOCUMENTS 2,241,078 A 5/1941 Vreeland
2,270,385 A 1/1942 Skillman
2,283,575 A 5/1942 Roberts
2,358,152 A 9/1944 Earp
2,410,350 A 10/1946 Labin etal.
2,451,430 A 10/1948 Barone
2,462,069 A 2/1949 Chatterjea et al.
2,462,181 A 2/1949 Grosselfinger
2,472,798 A 6/1949 Fredendall
2,497,859 A 2/1950 Boughtwood et al.
2,499,279 A 2/1950 Peterson
2,530,824 A 11/1950 King
2,802,208 A 8/1957 Hobbs
2,985,875 A 5/1961 Grisdale et al.
3,023,309 A 2/1962 Foulkes
3,069,679 A 12/1962 Sweeney et al.
3,104,393 A 9/1963 Vogelman
3,114,106 A 12/1963 McManus
3,118,117 A 1/1964 King et al.
3,226,643 A 12/1965 McNair
3,246,084 A 4/1966 Kryter
3,258,694 A 6/1966 Shepherd
3,383,598 A 5/1968 Sanders
3,384,822 A 5/1968 Miyagi
3,454,718 A 7/1969 Perreault
3,523,291 A 8/1970 Pierret
3,548,342 A 12/1970 Maxey
3,555,428 A 1/1971 Perreault
3,614,627 A 10/1971 Runyan etal.
3,614,630 A 10/1971 Rorden
3,617,892 A 11/1971 Hawley etal.
3,617,898 A 11/1971 Janning, Jr.
3,621,402 A 11/1971 Gardner
3,622,885 A 11/1971 Oberdorf etal.
3,623,160 A 11/1971 Giles et al.
3,626,417 A 12/1971 Gilbert
3,629,696 A 12/1971 Bartelink
3,641,442 A 2/1972 Boucher
3,643,168 A 2/1972 Manicki
3,662,268 A 5/1972 Gans etal.
3,689,841 A 9/1972 Bello etal.
3,694,754 A 9/1972 Baltzer
3,702,440 A 11/1972 Moore
3,714,577 A 1/1973 Hayes
3,716,730 A 2/1973 Cerny, Jr.
3,717,844 A 2/1973 Barret etal.
3,719,903 A 3/1973 Goodson
3,735,048 A 5/1973 Tomsa et al.
3,736,513 A 5/1973 Wilson
3,737,778 A 6/1973 Van Gerwen et al.
3,739,282 A 6/1973 Bruch etal.
3,764,921 A 10/1973 Huard
3,767,984 A 10/1973 Shinoda et al.
3,806,811 A 4/1974 Thompson
3,809,821 A 5/1974 Melvin
3,852,530 A 12/1974 Shen
3,868,601 A 2/1975 MacAfee
3,940,697 A 2/1976 Morgan
3,949,300 A 4/1976 Sadler
3,967,202 A 6/1976 Batz
3,980,945 A 9/1976 Bickford
3,987,280 A 10/1976 Bauer
3,991,277 A 11/1976 Hirata
4,003,002 A 1/1977 Snijders et al.
4,004,237 A 1/1977 Kratzer
4,013,966 A 3/1977 Campbell
4,016,366 A 4/1977 Kurata
4,017,798 A 4/1977 Gordy et al.
4,019,140 A 4/1977 Swerdlow
4,032,847 A 6/1977 Unkauf
4,035,732 A 7/1977 Lohrmann
4,045,740 A 8/1977 Baker
4,047,121 A 9/1977 Campbell
4,048,598 A 9/1977 Knight
4,051,475 A 9/1977 Campbell
4,066,841 A 1/1978 Young
4,066,919 A 1/1978 Huntington
4,080,573 A 3/1978 Howell
4,081,748 A 3/1978 Batz
4,115,737 A 9/1978 Hongu et al.
4,130,765 A 12/1978 Arakelian et al.
4,130,806 A 12/1978 Van Gerwen et al.
4,132,952 A 1/1979 Hongu et al.
4,142,155 A 2/1979 Adachi
4,143,322 A 3/1979 Shimamura
4,145,659 A 3/1979 Wolfram
4,158,149 A 6/1979 Otofuji
4,170,764 A 10/1979 Salz et al.
4,204,171 A 5/1980 Sutphin, Jr.
4,210,872 A 7/1980 Gregorian
4,220,977 A 9/1980 Yamanaka
4,241,451 A 12/1980 Maixner et al.
4,245,355 A 1/1981 Pascoe et al.
4,250,458 A 2/1981 Richmond et al.
4,253,066 A 2/1981 Fisher et al.
4,253,067 A 2/1981 Caples et al.
4,253,069 A 2/1981 Nossek
4,286,283 A 8/1981 Clemens
4,308,614 A 12/1981 Fisher et al.
4,313,222 A 1/1982 Katthän
4,320,361 A 3/1982 Kikkert
4,320,536 A 3/1982 Dietrich
4,334,324 A 6/1982 Hoover
4,346,477 A 8/1982 Gordy
4,355,401 A 10/1982 Ikoma et al.
4,356,558 A 10/1982 Owen et al.
4,360,867 A 11/1982 Gonda
4,363,132 A 12/1982 Collin
4,363,976 A 12/1982 Minor
4,365,217 A 12/1982 Berger et al.
4,369,522 A 1/1983 Cerny, Jr. et al.
4,370,572 A 1/1983 Cosand et al.
4,380,828 A 4/1983 Moon
4,384,357 A 5/1983 deBuda et al.
4,389,579 A 6/1983 Stein
4,392,255 A 7/1983 Del Giudice
4,393,352 A 7/1983 Volpe et al.
4,393,395 A 7/1983 Hacke et al.
4,405,835 A 9/1983 Jansen et al.
4,430,629 A 2/1984 Betzl et al.
4,439,787 A 3/1984 Mogi et al.
4,441,080 A 4/1984 Saari
4,446,438 A 5/1984 Chang et al.
4,456,990 A 6/1984 Fisher et al.
4,463,320 A 7/1984 Dawson
4,470,145 A 9/1984 Williams
4,472,785 A 9/1984 Kasuga
4,479,226 A 10/1984 Prabhu et al.
4,481,490 A 11/1984 Huntley
4,481,642 A 11/1984 Hanson
4,483,017 A 11/1984 Hampel et al.
4,484,143 A 11/1984 French et al.
4,485,347 A 11/1984 Hirasawa et al.
4,485,488 A 11/1984 Houdart
4,488,119 A 12/1984 Marshall
4,504,803 A 3/1985 Lee et al.
4,510,467 A 4/1985 Chang et al.
4,517,519 A 5/1985 Mukaiyama
4,517,520 A 5/1985 Ogawa
4,518,935 A 5/1985 van Roermund
4,521,892 A 6/1985 Vance et al.
4,562,414 A 12/1985 Linder et al.
4,563,773 A 1/1986 Dixon, Jr. et al.
4,577,157 A 3/1986 Reed 4,583,239 A 4/1986 Vance
4,591,736 A 5/1986 Hirao et al.
4,591,930 A 5/1986 Baumeister
4,596,046 A 6/1986 Richardson et al.
4,602,220 A 7/1986 Kurihara
4,603,300 A 7/1986 Welles, II et al.
4,612,464 A 9/1986 Ishikawa et al.
4,612,518 A 9/1986 Gans et al.
4,616,191 A 10/1986 Galani et al.
4,621,217 A 11/1986 Saxe et al.
4,628,517 A 12/1986 Schwarz et al.
4,633,510 A 12/1986 Suzuki et al.
4,634,998 A 1/1987 Crawford
4,648,021 A 3/1987 Alberkrack
4,651,034 A 3/1987 Sato
4,651,210 A 3/1987 Olson
4,653,117 A 3/1987 Heck
4,660,164 A 4/1987 Leibowitz
4,663,744 A 5/1987 Russell et al.
4,675,882 A 6/1987 Lillie et al.
4,688,237 A 8/1987 Brault
4,688,253 A 8/1987 Gumm
4,716,376 A 12/1987 Daudelin
4,716,388 A 12/1987 Jacobs
4,718,113 A 1/1988 Rother et al.
4,726,041 A 2/1988 Prohaska et al.
4,733,403 A 3/1988 Simone
4,734,591 A 3/1988 Ichitsubo
4,737,969 A 4/1988 Steel et al.
4,740,675 A 4/1988 Brosnan et al.
4,740,792 A 4/1988 Sagey et al.
4,743,858 A 5/1988 Everard
4,745,463 A 5/1988 Lu
4,751,468 A 6/1988 Agoston
4,757,538 A 7/1988 Zink
4,761,798 A 8/1988 Griswold, Jr. et al.
4,768,187 A 8/1988 Marshall
4,769,612 A 9/1988 Tamakoshi et al.
4,771,265 A 9/1988 Okui et al.
4,772,853 A 9/1988 Hart
4,785,463 A 11/1988 Janc et al.
4,789,837 A 12/1988 Ridgers
4,791,584 A 12/1988 Greivenkamp, Jr.
4,801,823 A 1/1989 Yokoyama
4,806,790 A 2/1989 Sone
4,810,904 A 3/1989 Crawford
4,810,976 A 3/1989 Cowley et al.
4,811,362 A 3/1989 Yester, Jr. et al.
4,811,422 A 3/1989 Kahn
4,814,649 A 3/1989 Young
4,816,704 A 3/1989 Fiori, Jr.
4,819,252 A 4/1989 Christopher
4,833,445 A 5/1989 Buchele
4,841,265 A 6/1989 Watanabe et al.
4,845,389 A 7/1989 Pyndiah et al.
4,855,894 A 8/1989 Asahi et al.
4,857,928 A 8/1989 Gailus et al.
4,862,121 A 8/1989 Hochschild et al.
4,866,441 A 9/1989 Conway et al.
4,868,654 A 9/1989 Juri et al.
4,870,659 A 9/1989 Oishi et al.
4,871,987 A 10/1989 Kawase
4,873,492 A 10/1989 Myer
4,885,587 A 12/1989 Wiegand et al.
4,885,671 A 12/1989 Peil
4,885,756 A 12/1989 Fontanes et al.
4,888,557 A 12/1989 Puckette, IV et al.
4,890,302 A 12/1989 Muilwijk
4,893,316 A 1/1990 Janc et al.
4,893,341 A 1/1990 Gehring
4,894,766 A 1/1990 De Agro
4,896,152 A 1/1990 Tiemann
4,902,979 A 2/1990 Puckette, IV
4,908,579 A 3/1990 Tawfik et al.
4,910,752 A 3/1990 Yester, Jr. et al.
4,914,405 A 4/1990 Wells
4,920,510 A 4/1990 Senderowicz et al.
4,922,452 A 5/1990 Larsen et al.
4,931,716 A 6/1990 Jovanovic et al.
4,931,921 A 6/1990 Anderson
4,943,974 A 7/1990 Motamedi
4,944,025 A 7/1990 Gehring et al.
4,955,079 A 9/1990 Connerney et al.
4,965,467 A 10/1990 Bilterijst
4,967,160 A 10/1990 Quievy et al.
4,970,703 A 11/1990 Hariharan et al.
4,972,436 A 11/1990 Halim et al.
4,982,353 A 1/1991 Jacob et al.
4,984,077 A 1/1991 Uchida
4,995,055 A 2/1991 Weinberger et al.
5,003,621 A 3/1991 Gailus
5,005,169 A 4/1991 Bronder et al.
5,006,810 A 4/1991 Popescu
5,006,854 A 4/1991 White et al.
5,010,585 A 4/1991 Garcia
5,012,245 A 4/1991 Scott et al.
5,014,130 A 5/1991 Heister et al.
5,014,304 A 5/1991 Nicollini et al.
5,015,963 A 5/1991 Sutton
5,016,242 A 5/1991 Tang
5,017,924 A 5/1991 Guiberteau et al.
5,020,149 A 5/1991 Hemmie
5,020,154 A 5/1991 Zierhut
5,052,050 A 9/1991 Collier et al.
5,058,107 A 10/1991 Stone et al.
5,062,122 A 10/1991 Pham et al.
5,063,387 A 11/1991 Mower
5,065,409 A 11/1991 Hughes et al.
5,083,050 A 1/1992 Vasile
5,091,921 A 2/1992 Minami
5,095,533 A 3/1992 Loper et al.
5,095,536 A 3/1992 Loper
5,111,152 A 5/1992 Makino
5,113,094 A 5/1992 Grace et al.
5,113,129 A 5/1992 Hughes
5,115,409 A 5/1992 Stepp
5,122,765 A 6/1992 Pataut
5,124,592 A 6/1992 Hagino
5,126,682 A 6/1992 Weinberg et al.
5,131,014 A 7/1992 White
5,136,267 A 8/1992 Cabot
5,140,699 A 8/1992 Kozak
5,140,705 A 8/1992 Kosuga
5,150,124 A 9/1992 Moore et al.
5,151,661 A 9/1992 Caldwell et al.
5,157,687 A 10/1992 Tymes
5,159,710 A 10/1992 Cusdin
5,164,985 A 11/1992 Nysen et al.
5,170,414 A 12/1992 Silvian
5,172,019 A 12/1992 Naylor et al.
5,172,070 A 12/1992 Hiraiwa et al.
5,179,731 A 1/1993 Tränkle et al.
5,191,459 A 3/1993 Thompson et al.
5,196,806 A 3/1993 Ichihara
5,204,642 A 4/1993 Asghar et al.
5,212,827 A 5/1993 Meszko et al.
5,214,787 A 5/1993 Karkota, Jr.
5,218,562 A 6/1993 Basehore et al.
5,220,583 A 6/1993 Solomon
5,220,680 A 6/1993 Lee
5,222,144 A 6/1993 Whikehart
5,230,097 A 7/1993 Currie et al.
5,239,496 A 8/1993 Vancraeynest
5,239,686 A 8/1993 Downey
5,239,687 A 8/1993 Chen
5,241,561 A 8/1993 Barnard 5,249,203 A 9/1993 Loper
5,251,218 A 10/1993 Stone et al.
5,251,232 A 10/1993 Nonami
5,260,970 A 11/1993 Henry et al.
5,260,973 A 11/1993 Watanabe
5,263,194 A 11/1993 Ragan
5,263,196 A 11/1993 Jasper
5,263,198 A 11/1993 Geddes et al.
5,267,023 A 11/1993 Kawasaki
5,278,826 A 1/1994 Murphy et al.
5,282,023 A 1/1994 Scarpa
5,282,222 A 1/1994 Fattouche et al.
5,287,516 A 2/1994 Schaub
5,293,398 A 3/1994 Hamao et al.
5,303,417 A 4/1994 Laws
5,307,517 A 4/1994 Rich
5,315,583 A 5/1994 Murphy et al.
5,319,799 A 6/1994 Morita
5,321,852 A 6/1994 Seong
5,325,204 A 6/1994 Scarpa
5,337,014 A 8/1994 Najle et al.
5,339,054 A 8/1994 Taguchi
5,339,395 A 8/1994 Pickett et al.
5,339,459 A 8/1994 Schiltz et al.
5,345,239 A 9/1994 Madni et al.
5,353,306 A 10/1994 Yamamoto
5,355,114 A 10/1994 Sutterlin et al.
5,361,408 A 11/1994 Watanabe et al.
5,369,404 A 11/1994 Galton
5,369,789 A 11/1994 Kosugi et al.
5,369,800 A 11/1994 Takagi et al.
5,375,146 A 12/1994 Chalmers
5,379,040 A 1/1995 Mizomoto et al.
5,379,141 A 1/1995 Thompson et al.
5,388,063 A 2/1995 Takatori et al.
5,389,839 A 2/1995 Heck
5,390,215 A 2/1995 Anita et al.
5,390,364 A 2/1995 Webster et al.
5,400,084 A 3/1995 Scarpa
5,404,127 A 4/1995 Lee et al.
5,410,195 A 4/1995 Ichihara
5,410,270 A 4/1995 Rybicki et al.
5,410,541 A 4/1995 Hotto
5,410,743 A 4/1995 Seely et al.
5,412,352 A 5/1995 Graham
5,416,449 A 5/1995 Joshi
5,416,803 A 5/1995 Janer
5,422,909 A 6/1995 Love et al.
5,422,913 A 6/1995 Wilkinson
5,423,082 A 6/1995 Cygan et al.
5,428,638 A 6/1995 Cioffi et al.
5,428,640 A 6/1995 Townley
5,434,546 A 7/1995 Palmer
5,438,329 A 8/1995 Gastouniotis et al.
5,438,692 A 8/1995 Mohindra
5,440,311 A 8/1995 Gallagher et al.
5,444,415 A 8/1995 Dent et al.
5,444,416 A 8/1995 Ishikawa et al.
5,444,865 A 8/1995 Heck et al.
5,446,421 A 8/1995 Kechkaylo
5,446,422 A 8/1995 Mattila et al.
5,448,602 A 9/1995 Ohmori et al.
5,451,899 A 9/1995 Lawton
5,454,007 A 9/1995 Dutta
5,454,009 A 9/1995 Fruit et al.
5,461,646 A 10/1995 Anvari
5,463,356 A 10/1995 Palmer
5,463,357 A 10/1995 Hobden
5,465,071 A 11/1995 Kobayashi et al.
5,465,410 A 11/1995 Hiben et al.
5,465,415 A 11/1995 Bien
5,465,418 A 11/1995 Zhou et al.
5,471,162 A 11/1995 McEwan
5,471,665 A 11/1995 Pace et al.
5,479,120 A 12/1995 McEwan
5,479,447 A 12/1995 Chow et al.
5,481,570 A 1/1996 Winters
5,483,193 A 1/1996 Kennedy et al.
5,483,245 A 1/1996 Ruinet
5,483,549 A 1/1996 Weinberg et al.
5,483,600 A 1/1996 Werrbach
5,483,691 A 1/1996 Heck et al.
5,483,695 A 1/1996 Pardoen
5,490,173 A 2/1996 Whikehart et al.
5,490,176 A 2/1996 Peltier
5,493,581 A 2/1996 Young et al.
5,493,721 A 2/1996 Reis
5,495,200 A 2/1996 Kwan et al.
5,495,202 A 2/1996 Hsu
5,495,500 A 2/1996 Jovanovich et al.
5,499,267 A 3/1996 Ohe et al.
5,500,758 A 3/1996 Thompson et al.
5,512,946 A 4/1996 Murata et al.
5,513,389 A 4/1996 Reeser et al.
5,515,014 A 5/1996 Troutman
5,517,688 A 5/1996 Fajen et al.
5,519,890 A 5/1996 Pinckley
5,523,719 A 6/1996 Longo et al.
5,523,726 A 6/1996 Kroeger et al.
5,523,760 A 6/1996 McEwan
5,535,402 A 7/1996 Leibowitz et al.
5,539,770 A 7/1996 Ishigaki
5,551,076 A 8/1996 Bonn
5,552,789 A 9/1996 Schuermann
5,555,453 A 9/1996 Kajimoto et al.
5,557,641 A 9/1996 Weinberg
5,557,642 A 9/1996 Williams
5,559,809 A 9/1996 Jeon et al.
5,563,550 A 10/1996 Toth
5,564,097 A 10/1996 Swanke
5,574,755 A 11/1996 Persico
5,579,341 A 11/1996 Smith et al.
5,579,347 A 11/1996 Lindquist et al.
5,584,068 A 12/1996 Mohindra
5,589,793 A 12/1996 Kassapian
5,592,131 A 1/1997 Labreche et al.
5,600,680 A 2/1997 Mishima et al.
5,602,847 A 2/1997 Pagano et al.
5,602,868 A 2/1997 Wilson
5,604,592 A 2/1997 Kotidis et al.
5,604,732 A 2/1997 Kim et al.
5,606,731 A 2/1997 Pace et al.
5,608,531 A 3/1997 Honda et al.
5,610,946 A 3/1997 Tanaka et al.
RE35,494 E 4/1997 Nicollini
5,617,451 A 4/1997 Mimura et al.
5,619,538 A 4/1997 Sempel et al.
5,621,455 A 4/1997 Rogers et al.
5,628,055 A 5/1997 Stein
5,630,227 A 5/1997 Bella et al.
5,633,610 A 5/1997 Maekawa et al.
5,633,815 A 5/1997 Young
5,634,207 A 5/1997 Yamaji et al.
5,636,140 A 6/1997 Lee et al.
5,638,396 A 6/1997 Klimek
5,640,415 A 6/1997 Pandula
5,640,424 A 6/1997 Banavong et al.
5,640,428 A 6/1997 Abe et al.
5,640,698 A 6/1997 Shen et al.
5,642,071 A 6/1997 Sevenhans et al.
5,648,985 A 7/1997 Bjerede et al.
5,650,785 A 7/1997 Rodal
5,659,372 A 8/1997 Patel et al.
5,661,424 A 8/1997 Tang
5,663,878 A 9/1997 Walker
5,663,986 A 9/1997 Striffler 5,668,836 A 9/1997 Smith et al.
5,675,392 A 10/1997 Nayebi et al.
5,678,220 A 10/1997 Fournier
5,678,226 A 10/1997 Li et al.
5,680,078 A 10/1997 Ariie
5,680,418 A 10/1997 Croft et al.
5,682,099 A 10/1997 Thompson et al.
5,689,413 A 11/1997 Jaramillo et al.
5,694,096 A 12/1997 Ushiroku et al.
5,697,074 A 12/1997 Makikallio et al.
5,699,006 A 12/1997 Zele et al.
5,703,584 A 12/1997 Hill
5,705,949 A 1/1998 Alelyunas et al.
5,705,955 A 1/1998 Freeburg et al.
5,710,992 A 1/1998 Sawada et al.
5,710,998 A 1/1998 Opas
5,714,910 A 2/1998 Skoczen et al.
5,715,281 A 2/1998 Bly et al.
5,721,514 A 2/1998 Crockett et al.
5,724,002 A 3/1998 Hulick
5,724,041 A 3/1998 Inoue et al.
5,724,653 A 3/1998 Baker et al.
5,729,577 A 3/1998 Chen
5,729,829 A 3/1998 Talwar et al.
5,732,333 A 3/1998 Cox et al.
5,734,683 A 3/1998 Hulkko et al.
5,736,895 A 4/1998 Yu et al.
5,737,035 A 4/1998 Rotzoll
5,742,189 A * 4/1998 Yoshida et al. .............. 327/113
5,745,846 A 4/1998 Myer et al.
5,748,683 A 5/1998 Smith et al.
5,751,154 A 5/1998 Tsugai
5,757,858 A 5/1998 Black et al.
5,757,870 A 5/1998 Miya et al.
RE35,829 E 6/1998 Sanderford, Jr.
5,760,629 A 6/1998 Urabe et al.
5,760,632 A 6/1998 Kawakami et al.
5,760,645 A 6/1998 Comte et al.
5,764,087 A 6/1998 Clark
5,767,726 A 6/1998 Wang
5,768,118 A 6/1998 Faulk et al.
5,768,323 A 6/1998 Kroeger et al.
5,770,985 A 6/1998 Ushiroku et al.
5,771,442 A 6/1998 Wang et al.
5,777,692 A 7/1998 Ghosh
5,777,771 A 7/1998 Smith
5,778,022 A 7/1998 Walley
5,781,600 A 7/1998 Reeve et al.
5,784,689 A 7/1998 Kobayashi
5,786,844 A 7/1998 Rogers et al.
5,787,125 A 7/1998 Mittel
5,790,587 A 8/1998 Smith et al.
5,793,801 A 8/1998 Fertner
5,793,817 A 8/1998 Wilson
5,793,818 A 8/1998 Claydon et al.
5,801,654 A 9/1998 Traylor
5,802,463 A 9/1998 Zuckerman
5,805,460 A 9/1998 Greene et al.
5,809,060 A 9/1998 Cafarella et al.
5,812,546 A 9/1998 Zhou et al.
5,818,582 A 10/1998 Fernandez et al.
5,818,869 A 10/1998 Miya et al.
5,825,254 A 10/1998 Lee
5,825,257 A 10/1998 Klymyshyn et al.
5,834,979 A 11/1998 Yatsuka
5,834,985 A 11/1998 Sundeg.ang.rd
5,834,987 A 11/1998 Dent
5,841,324 A 11/1998 Williams
5,841,811 A 11/1998 Song
5,844,449 A 12/1998 Abeno et al.
5,844,868 A 12/1998 Takahashi et al.
5,847,594 A 12/1998 Mizuno
5,859,878 A 1/1999 Phillips et al.
5,864,754 A 1/1999 Hotto
5,870,670 A 2/1999 Ripley et al.
5,872,446 A 2/1999 Cranford, Jr. et al.
5,878,088 A 3/1999 Knutson et al.
5,881,375 A 3/1999 Bonds
5,883,548 A 3/1999 Assard et al.
5,884,154 A 3/1999 Sano et al.
5,887,001 A 3/1999 Russell
5,892,380 A 4/1999 Quist
5,894,239 A 4/1999 Bonaccio et al.
5,894,496 A 4/1999 Jones
5,896,304 A 4/1999 Tiemann et al.
5,896,347 A 4/1999 Tomita et al.
5,896,562 A 4/1999 Heinonen
5,898,912 A 4/1999 Heck et al.
5,900,746 A 5/1999 Sheahan
5,900,747 A 5/1999 Brauns
5,901,054 A 5/1999 Leu et al.
5,901,187 A 5/1999 Iinuma
5,901,344 A 5/1999 Opas
5,901,347 A 5/1999 Chambers et al.
5,901,348 A 5/1999 Bang et al.
5,901,349 A 5/1999 Guegnaud et al.
5,903,178 A 5/1999 Miyatsuji et al.
5,903,187 A 5/1999 Claverie et al.
5,903,196 A 5/1999 Salvi et al.
5,903,421 A 5/1999 Furutani et al.
5,903,553 A 5/1999 Sakamoto et al.
5,903,595 A 5/1999 Suzuki
5,903,609 A 5/1999 Kool et al.
5,903,827 A 5/1999 Kennan et al.
5,903,854 A 5/1999 Abe et al.
5,905,433 A 5/1999 Wortham
5,905,449 A 5/1999 Tsubouchi et al.
5,907,149 A 5/1999 Marckini
5,907,197 A 5/1999 Faulk
5,909,447 A 6/1999 Cox et al.
5,909,460 A 6/1999 Dent
5,911,116 A 6/1999 Nosswitz
5,911,123 A 6/1999 Shaffer et al.
5,914,622 A 6/1999 Inoue
5,915,278 A 6/1999 Mallick
5,918,167 A 6/1999 Tiller et al.
5,920,199 A 7/1999 Sauer
5,926,065 A 7/1999 Wakai et al.
5,926,513 A 7/1999 Suominen et al.
5,933,467 A 8/1999 Sehier et al.
5,937,013 A 8/1999 Lam et al.
5,943,370 A 8/1999 Smith
5,945,660 A 8/1999 Nakasuji et al.
5,949,827 A 9/1999 DeLuca et al.
5,952,895 A 9/1999 McCune, Jr. et al.
5,953,642 A 9/1999 Feldtkeller et al.
5,955,992 A 9/1999 Shattil
5,959,850 A 9/1999 Lim
5,960,033 A 9/1999 Shibano et al.
5,970,053 A 10/1999 Schick et al.
5,973,570 A 10/1999 Salvi et al.
5,982,315 A 11/1999 Bazarjani et al.
5,982,329 A 11/1999 Pittman et al.
5,982,810 A * 11/1999 Nishimori .................. 375/150
5,986,600 A 11/1999 McEwan
5,994,689 A 11/1999 Charrier
5,995,030 A 11/1999 Cabler
5,999,561 A * 12/1999 Naden et al. ................ 375/142
6,005,506 A 12/1999 Bazarjani et al.
6,005,903 A 12/1999 Mendelovicz
6,011,435 A 1/2000 Takeyabu et al.
6,014,176 A 1/2000 Nayebi et al.
6,014,551 A 1/2000 Pesola et al.
6,018,262 A 1/2000 Noro et al.
6,018,553 A 1/2000 Sanielevici et al.
6,026,286 A 2/2000 Long 6,028,887 A 2/2000 Harrison et al.
6,031,217 A 2/2000 Aswell et al.
6,034,566 A 3/2000 Ohe
6,038,265 A 3/2000 Pan et al.
6,041,073 A 3/2000 Davidovici et al.
6,047,026 A 4/2000 Chao et al.
6,049,573 A 4/2000 Song
6,049,706 A 4/2000 Cook et al.
6,054,889 A 4/2000 Kobayashi
6,057,714 A 5/2000 Andrys et al.
6,061,551 A 5/2000 Sorrells et al.
6,061,555 A 5/2000 Bultman et al.
6,064,054 A 5/2000 Waczynski et al.
6,067,329 A 5/2000 Kato et al.
6,072,996 A 6/2000 Smith
6,073,001 A 6/2000 Sokoler
6,076,015 A 6/2000 Hartley et al.
6,078,630 A 6/2000 Prasanna
6,081,691 A 6/2000 Renard et al.
6,084,465 A 7/2000 Dasqupta
6,084,922 A 7/2000 Zhou et al.
6,085,073 A 7/2000 Palermo et al.
6,088,348 A 7/2000 Bell, III et al.
6,091,289 A 7/2000 Song et al.
6,091,939 A 7/2000 Banh
6,091,940 A 7/2000 Sorrells et al.
6,091,941 A 7/2000 Moriyama et al.
6,094,084 A 7/2000 Abou-Allam et al.
6,097,762 A 8/2000 Suzuki et al.
6,098,046 A 8/2000 Cooper et al.
6,098,886 A 8/2000 Swift et al.
6,112,061 A 8/2000 Rapeli
6,121,819 A 9/2000 Traylor
6,125,271 A 9/2000 Rowland et al.
6,128,746 A 10/2000 Clark et al.
6,137,321 A * 10/2000 Bazarjani .................... 327/96
6,144,236 A 11/2000 Vice et al.
6,144,331 A 11/2000 Jiang
6,144,846 A 11/2000 Durec
6,147,340 A 11/2000 Levy
6,147,763 A 11/2000 Steinlechner
6,150,890 A 11/2000 Damgaard et al.
6,151,354 A 11/2000 Abbey
6,160,280 A 12/2000 Bonn et al.
6,167,247 A 12/2000 Kannell et al.
6,169,733 B1 1/2001 Lee
6,175,728 B1 1/2001 Mitama
6,178,319 B1 1/2001 Kashima
6,182,011 B1 1/2001 Ward
6,198,941 B1 3/2001 Aho et al.
6,204,789 B1 3/2001 Nagata
6,208,636 B1 3/2001 Tawil et al.
RE37,138 E 4/2001 Dent
6,211,718 B1 4/2001 Souetinov
6,212,369 B1 4/2001 Avasarala
6,215,475 B1 4/2001 Meyerson et al.
6,215,828 B1 4/2001 Signell et al.
6,223,061 B1 4/2001 Dacus et al.
6,225,848 B1 5/2001 Tilley et al.
6,230,000 B1 5/2001 Tayloe
6,246,695 B1 6/2001 Seazholtz et al.
6,259,293 B1 7/2001 Hayase et al.
6,266,518 B1 7/2001 Sorrells et al.
6,275,542 B1 8/2001 Katayama et al.
6,298,065 B1 10/2001 Dombkowski et al.
6,307,894 B2 10/2001 Eidson et al.
6,308,058 B1 10/2001 Souetinov et al.
6,313,685 B1 11/2001 Rabii
6,313,700 B1 11/2001 Nishijima et al.
6,314,279 B1 11/2001 Mohindra
6,317,589 B1 11/2001 Nash
6,321,073 B1 11/2001 Luz et al.
6,327,313 B1 12/2001 Traylor et al.
6,330,244 B1 12/2001 Swartz et al.
6,335,656 B1 1/2002 Goldfarb et al.
6,353,735 B1 3/2002 Sorrells et al.
6,363,262 B1 3/2002 McNicol
6,366,622 B1 4/2002 Brown et al.
6,366,765 B1 4/2002 Hongo et al.
6,370,371 B1 4/2002 Sorrells et al.
6,385,439 B1 5/2002 Hellberg
6,393,070 B1 5/2002 Reber
6,400,963 B1 6/2002 Glöckler et al.
6,404,758 B1 6/2002 Wang
6,404,823 B1 6/2002 Grange et al.
6,421,534 B1 7/2002 Cook et al.
6,437,639 B1 8/2002 Nguyen et al.
6,438,366 B1 8/2002 Lindfors et al.
6,441,659 B1 8/2002 Demone
6,441,694 B1 8/2002 Turcotte et al.
6,445,726 B1 9/2002 Gharpurey
6,459,721 B1 10/2002 Mochizuki et al.
6,509,777 B2 1/2003 Razavi et al.
6,512,544 B1 1/2003 Merrill et al.
6,512,785 B1 1/2003 Zhou et al.
6,512,798 B1 1/2003 Akiyama et al.
6,516,185 B1 2/2003 MacNally
6,531,979 B1 3/2003 Hynes
6,542,722 B1 4/2003 Sorrells et al.
6,546,061 B2 4/2003 Signell et al.
6,560,301 B1 5/2003 Cook et al.
6,560,451 B1 5/2003 Somayajula
6,567,483 B1 5/2003 Dent et al.
6,580,902 B1 6/2003 Sorrells et al.
6,591,310 B1 7/2003 Johnson
6,597,240 B1 7/2003 Walburger et al.
6,600,795 B1 7/2003 Ohta et al.
6,600,911 B1 7/2003 Morishige et al.
6,608,647 B1 8/2003 King
6,611,569 B1 8/2003 Schier et al.
6,618,579 B1 9/2003 Smith et al.
6,625,470 B1 9/2003 Fourtet et al.
6,628,328 B1 9/2003 Yokouchi et al.
6,633,194 B2 10/2003 Arnborg et al.
6,634,555 B1 10/2003 Sorrells et al.
6,639,939 B1 10/2003 Naden et al.
6,647,250 B1 11/2003 Bultman et al.
6,647,270 B1 11/2003 Himmelstein
6,686,879 B2 2/2004 Shattil
6,687,493 B1 2/2004 Sorrells et al.
6,690,232 B2 2/2004 Ueno et al.
6,690,741 B1 2/2004 Larrick, Jr. et al.
6,694,128 B1 2/2004 Sorrells et al.
6,697,603 B1 2/2004 Lovinggood et al.
6,704,549 B1 3/2004 Sorrells et al.
6,704,558 B1 3/2004 Sorrells et al.
6,731,146 B1 5/2004 Gallardo
6,738,609 B1 5/2004 Clifford
6,741,139 B2 5/2004 Pleasant et al.
6,741,650 B1 5/2004 Painchaud et al.
6,775,684 B1 8/2004 Toyoyama et al.
6,798,351 B1 9/2004 Sorrells et al.
6,801,253 B1 10/2004 Yonemoto et al.
6,813,320 B1 11/2004 Claxton et al.
6,813,485 B2 11/2004 Sorrells et al.
6,823,178 B2 11/2004 Pleasant et al.
6,836,650 B2 12/2004 Sorrells et al.
6,850,742 B2 2/2005 Fayyaz
6,853,690 B1 2/2005 Sorrells et al.
6,865,399 B2 3/2005 Fujioka et al.
6,873,836 B1 3/2005 Sorrells et al.
6,876,846 B2 4/2005 Tamaki et al.
6,879,817 B1 4/2005 Sorrells et al.
6,882,194 B2 4/2005 Belot et al.
6,892,057 B2 5/2005 Nilsson
6,892,062 B2 5/2005 Lee et al.

| | | | | |
|---|---|---|---|---|
| 6,894,988 | B1 | 5/2005 | Zehavi | |
| 6,909,739 | B1 | 6/2005 | Eerola et al. | |
| 6,910,015 | B2 | 6/2005 | Kawai | |
| 6,917,796 | B2 | 7/2005 | Setty et al. | |
| 6,920,311 | B2 | 7/2005 | Rofougaran et al. | |
| 6,959,178 | B2 | 10/2005 | Macedo et al. | |
| 6,963,626 | B1 | 11/2005 | Shaeffer et al. | |
| 6,963,734 | B2 | 11/2005 | Sorrells et al. | |
| 6,973,476 | B1 | 12/2005 | Naden et al. | |
| 6,975,848 | B2 | 12/2005 | Rawlins et al. | |
| 6,999,747 | B2 | 2/2006 | Su | |
| 7,006,805 | B1 | 2/2006 | Sorrells et al. | |
| 7,010,286 | B2 | 3/2006 | Sorrells et al. | |
| 7,010,559 | B2 | 3/2006 | Rawlins et al. | |
| 7,016,663 | B2 | 3/2006 | Sorrells et al. | |
| 7,027,786 | B1 | 4/2006 | Smith et al. | |
| 7,039,372 | B1 | 5/2006 | Sorrells et al. | |
| 7,050,508 | B2 | 5/2006 | Sorrells et al. | |
| 7,054,296 | B1 | 5/2006 | Sorrells et al. | |
| 7,065,162 | B1 | 6/2006 | Sorrells et al. | |
| 7,072,390 | B1 | 7/2006 | Sorrells et al. | |
| 7,072,427 | B2 | 7/2006 | Rawlins et al. | |
| 7,072,433 | B2 | 7/2006 | Bell | |
| 7,076,011 | B2 | 7/2006 | Cook et al. | |
| 7,082,171 | B1 | 7/2006 | Johnson et al. | |
| 7,085,335 | B2 | 8/2006 | Rawlins et al. | |
| 7,107,028 | B2 | 9/2006 | Sorrells et al. | |
| 7,110,435 | B1 * | 9/2006 | Sorrells et al. | 375/147 |
| 7,110,444 | B1 | 9/2006 | Sorrells et al. | |
| 7,149,487 | B2 | 12/2006 | Yoshizawa | |
| 7,190,941 | B2 | 3/2007 | Sorrells et al. | |
| 7,193,965 | B1 | 3/2007 | Nevo et al. | |
| 7,194,044 | B2 | 3/2007 | Birkett et al. | |
| 7,194,246 | B2 | 3/2007 | Sorrells et al. | |
| 7,197,081 | B2 | 3/2007 | Saito | |
| 7,209,725 | B1 | 4/2007 | Sorrells et al. | |
| 7,212,581 | B2 | 5/2007 | Birkett et | |
| 7,218,899 | B2 | 5/2007 | Sorrells et al. | |
| 7,218,907 | B2 | 5/2007 | Sorrells et al. | |
| 7,224,749 | B2 | 5/2007 | Sorrells et al. | |
| 7,233,969 | B2 | 6/2007 | Rawlins et al. | |
| 7,236,754 | B2 | 6/2007 | Sorrells et al. | |
| 7,245,886 | B2 | 7/2007 | Sorrells et al. | |
| 7,272,164 | B2 | 9/2007 | Sorrells et al. | |
| 7,292,835 | B2 | 11/2007 | Sorrells et al. | |
| 7,295,826 | B1 | 11/2007 | Cook et al. | |
| 7,308,242 | B2 | 12/2007 | Sorrells et al. | |
| 7,321,640 | B2 | 1/2008 | Milne et al. | |
| 7,321,735 | B1 | 1/2008 | Smith et al. | |
| 7,321,751 | B2 | 1/2008 | Sorrells et al. | |
| 7,358,801 | B2 | 4/2008 | Perdoor et al. | |
| 7,376,410 | B2 | 5/2008 | Sorrells et al. | |
| 7,379,515 | B2 | 5/2008 | Johnson et al. | |
| 7,379,883 | B2 | 5/2008 | Sorrells | |
| 7,386,292 | B2 | 6/2008 | Sorrells et al. | |
| 7,389,100 | B2 | 6/2008 | Sorrells et al. | |
| 7,433,910 | B2 | 10/2008 | Rawlins et al. | |
| 2001/0015673 | A1 | 8/2001 | Yamashita et al. | |
| 2001/0036818 | A1 | 11/2001 | Dobrovolny | |
| 2002/0021685 | A1 | 2/2002 | Sakusabe | |
| 2002/0037706 | A1 | 3/2002 | Ichihara | |
| 2002/0080728 | A1 | 6/2002 | Sugar et al. | |
| 2002/0132642 | A1 | 9/2002 | Hines et al. | |
| 2002/0163921 | A1 | 11/2002 | Ethridge et al. | |
| 2003/0045263 | A1 | 3/2003 | Wakayama et al. | |
| 2003/0078011 | A1 | 4/2003 | Cheng et al. | |
| 2003/0081781 | A1 | 5/2003 | Jensen et al. | |
| 2003/0149579 | A1 | 8/2003 | Begemann et al. | |
| 2003/0193364 | A1 | 10/2003 | Liu et al. | |
| 2004/0125879 | A1 | 7/2004 | Jaussi et al. | |
| 2005/0100115 | A1 | 5/2005 | Sorrells et al. | |
| 2006/0002491 | A1 | 1/2006 | Darabi et al. | |
| 2006/0039449 | A1 | 2/2006 | Fontana et al. | |
| 2006/0209599 | A1 | 9/2006 | Kato et al. | |

FOREIGN PATENT DOCUMENTS

| | | | |
|---|---|---|---|
| DE | 35 41 031 | A1 | 5/1986 |
| DE | 42 37 692 | C1 | 3/1994 |
| DE | 196 27 640 | A1 | 1/1997 |
| DE | 692 21 098 | T2 | 1/1998 |
| DE | 196 48 915 | A1 | 6/1998 |
| DE | 197 35 798 | C1 | 7/1998 |
| EP | 0 035 166 | A1 | 9/1981 |
| EP | 0 087 336 | A1 | 8/1983 |
| EP | 0 099 265 | A1 | 1/1984 |
| EP | 0 087 336 | B1 | 7/1986 |
| EP | 0 254 844 | A2 | 2/1988 |
| EP | 0 276 130 | A2 | 7/1988 |
| EP | 0 276 130 | A3 | 7/1988 |
| EP | 0 193 899 | B1 | 6/1990 |
| EP | 0 380 351 | A2 | 8/1990 |
| EP | 0 380 351 | A3 | 2/1991 |
| EP | 0 411 840 | A2 | 2/1991 |
| EP | 0 423 718 | A2 | 4/1991 |
| EP | 0 411 840 | A3 | 7/1991 |
| EP | 0 486 095 | A1 | 5/1992 |
| EP | 0 423 718 | A3 | 8/1992 |
| EP | 0 512 748 | A2 | 11/1992 |
| EP | 0 529 836 | A1 | 3/1993 |
| EP | 0 548 542 | A1 | 6/1993 |
| EP | 0 512 748 | A3 | 7/1993 |
| EP | 0 560 228 | A1 | 9/1993 |
| EP | 0 632 288 | A2 | 1/1995 |
| EP | 0 632 577 | A1 | 1/1995 |
| EP | 0 643 477 | A2 | 3/1995 |
| EP | 0 643 477 | A3 | 3/1995 |
| EP | 0 411 840 | B1 | 10/1995 |
| EP | 0 696 854 | A1 | 2/1996 |
| EP | 0 632 288 | A3 | 7/1996 |
| EP | 0 732 803 | A1 | 9/1996 |
| EP | 0 486 095 | B1 | 2/1997 |
| EP | 0 782 275 | A2 | 7/1997 |
| EP | 0 785 635 | A1 | 7/1997 |
| EP | 0 789 449 | A2 | 8/1997 |
| EP | 0 789 449 | A3 | 8/1997 |
| EP | 0 795 955 | A2 | 9/1997 |
| EP | 0 795 955 | A3 | 9/1997 |
| EP | 0 795 978 | A2 | 9/1997 |
| EP | 0 817 369 | A2 | 1/1998 |
| EP | 0 817 369 | A3 | 1/1998 |
| EP | 0 837 565 | A1 | 4/1998 |
| EP | 0 862 274 | A1 | 9/1998 |
| EP | 0 874 499 | A2 | 10/1998 |
| EP | 0 512 748 | B1 | 11/1998 |
| EP | 0 877 476 | A1 | 11/1998 |
| EP | 0 977 351 | A1 | 2/2000 |
| FR | 2 245 130 | | 4/1975 |
| FR | 2 669 787 | A1 | 5/1992 |
| FR | 2 743 231 | A1 | 7/1997 |
| GB | 2 161 344 | A | 1/1986 |
| GB | 2 215 945 | A | 9/1989 |
| GB | 2 324 919 | A | 11/1998 |
| JP | 47-2314 | | 2/1972 |
| JP | 55-66057 | | 5/1980 |
| JP | 56-114451 | | 9/1981 |
| JP | 58-7903 | | 1/1983 |
| JP | 58-031622 | | 2/1983 |
| JP | 58-133004 | | 8/1983 |
| JP | 59-022438 | | 2/1984 |
| JP | 59-123318 | | 7/1984 |
| JP | 59-144249 | | 8/1984 |
| JP | 60-58705 | | 4/1985 |
| JP | 60-130203 | | 7/1985 |
| JP | 61-30821 | | 2/1986 |
| JP | 61-193521 | | 8/1986 |

| | | |
|---|---|---|
| JP | 61-232706 | 10/1986 |
| JP | 61-245749 | 11/1986 |
| JP | 62-12381 | 1/1987 |
| JP | 62-047214 | 2/1987 |
| JP | 63-54002 | 3/1988 |
| JP | 63-65587 | 3/1988 |
| JP | 63-153691 | 6/1988 |
| JP | 63-274214 | 11/1988 |
| JP | 64-048557 | 2/1989 |
| JP | 2-39632 | 2/1990 |
| JP | 2-131629 | 5/1990 |
| JP | 2-276351 | 11/1990 |
| JP | 4-123614 | 4/1992 |
| JP | 4-127601 | 4/1992 |
| JP | 4-154227 | 5/1992 |
| JP | 5-175730 | 7/1993 |
| JP | 5-175734 | 7/1993 |
| JP | 5-327356 | 12/1993 |
| JP | 6-237276 | 8/1994 |
| JP | 6-284038 | 10/1994 |
| JP | 7-154344 | 6/1995 |
| JP | 7-307620 | 11/1995 |
| JP | 8-23359 | 1/1996 |
| JP | 8-32556 | 2/1996 |
| JP | 8-139524 | 5/1996 |
| JP | 9-36664 | 2/1997 |
| JP | 9-171399 | 6/1997 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 97/08839 A3 | 3/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 A2 | 9/1998 |
| WO | WO 98/40968 A3 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

English-language Abstract of Japanese Patent Publication No. JP 9-171399, data supplied by the espacenet, 1 page (Jun. 30, 1997—Date of publication of application).

English-language Abstract of Japanese Patent Publication No. JP 10-41860, data supplied by the espacenet, 1 page (Feb. 13, 1998—Date of publication of application).

English-language Computer Translation of Japanese Patent Publication No. JP 10-41860, provided by the JPO, 10 pages (Jun. 26, 1998—Date of publication of application) and cited in U.S. Appl. No. 10/305,299, directed to related subject matter.

*What is I/Q Data?*, printed Sep. 16, 2006, from http://zone.ni.com, 8 pages (Copyright 2003).

English-language Abstract of Japanese Patent Publication No. JP 58-031622, data supplied by ep.espacenet.com, 1 page (Feb. 24, 1983—Date of publication of application).

English-language Abstract of Japanese Patent Publication No. JP 61-245749, data supplied by ep.espacenet.com, 1 page (Nov. 1, 1986—Date of publication of application).

English-language Abstract of Japanese Patent Publication No. JP 64-048557, data supplied by ep.espacenet.com, 1 page (Feb. 23, 1989—Date of publication of application).

English-language Abstract of Japanese Patent Publication No. JP 59-022438, data supplied by ep.espacenet.com, 1 page (Feb. 4, 1984—Date of publication of application).

English-language Abstract of Japanese Patent Publication No. JP 59-123318, data supplied by ep.espacenet.com, 1 page (Jul. 17, 1984—Date of publication of application).

English-language Abstract of Japanese Patent Publication No. JP 61-193521, data supplied by ep.espacenet.com, 1 page (Aug. 28, 1986—Date of publication of application).

English-language Abstract of Japanese Patent Publication No. JP 62-047214, data supplied by ep.espacenet.com, 1 page (Feb. 28, 1987—Date of publication of application).

English-language Abstract of Japanese Patent Publication No. JP 63-274214, data supplied by ep.espacenet.com, 1 page (Nov. 11, 1988—Date of publication of application).

Aghvami, H. et al., "Land Mobile Satellites Using the Highly Elliptic Orbits- The UK T-SAT Mobile Payload," *Fourth International Conference on Satellite Systems for Mobile Communications and Navigation*, IEE, pp. 147-153 (Oct. 17-19, 1988).

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings Of The IEEE Special Issue on Frequency Stability*, IEEE, pp. 221-230 (Feb. 1966).

Allstot, D.J. et al., "MOS Switched Capacitor Ladder Filters,"*IEEE Journal of Solid-State Circuits*, IEEE, vol. SC-13, No. 6, pp. 806-814 (Dec. 1978).

Allstot, D.J. and Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Band Very Small Aperture Terminals," *Proceedings Of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio Engineering*, Scripta Technica, vol. 43, No. 12, pp. 87-90 (Dec. 1988).

Antonetti, A. et al., "Optoelectronic Sampling in the Picosecond Range," *Optics Communications*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., "Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).

Baines, R., "The DSP Bottleneck," *IEEE Communications Magazine*, IEEE Communications Society, pp. 46-54 (May 1995).

Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).

Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).

Banjo, O.P. And Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).

Banjo, O.P. et al., "Tropospheric Amplitude Spectra Due to Absorption and Scattering in Earth-Space Paths," *Fourth International Conference on Antennas and Propagation* (*ICAP 85*), IEE, pp. 77-82 (Apr. 16-19, 1985).
Basili,P. et al., "Case Study of Intense Scintillation Events on the OTS Path," *IEEE Transactions on Antennas and Propagation*, IEEE, vol. 38, No. 1, pp. 107-113 (Jan. 1990).
Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).
Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).
Burgueño, A. et al., "Influence of rain gauge integration time on the rain rate statistics used in microwave communications," *annales des tèlècommunications*, International Union of Radio Science, pp. 522-527 (Sep./Oct. 1988).
Burgueño, A. et al., "Long-Term Joint Statistical Analysis of Duration and Intensity of Rainfall Rate with Application to Microwave Communications," *Fifth International Conference on Antennas and Propagation* (*ICAP 87*) *Part 2: Propagation*, IEE, pp. 198-201 (Mar. 30-Apr. 2, 1987).
Burgueño, A. et al., "Long Term Statistics of Precipitation Rate Return Periods in the Context of Microwave Communications," *Sixth International Conference on Antennas and Propagation* (*ICAP 89*) *Part 2: Propagation*, IEE, pp. 297-301 (Apr. 4-7, 1989).
Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).
Catalan, C. and Viler, E., "Approach for satellite slant path remote sensing," *Electronics Letters*, IEE, vol. 34, No. 12, pp. 1238-1240 (Jun. 11, 1998).
Chan, P. et al., "A Highly Linear 1-GHz CMOS Downconversion Mixer," *European Solid State Circuits Conference*, IEEE Communication Society, pp. 210-213 (Sep. 22-24, 1993).
Declaration of Michael J. Bultman filed in U.S. Appl. No. 09/176,022, which is directed to related subject matter, 2 pages
Declaration of Robert W. Cook filed in U.S. Appl. No. 09/176,022, which is directed to related subject matter, 2 pages.
Declaration of Alex Holtz filed in U.S. Appl. No. 09/176,022, which is directed to related subject matter, 3 pages.
Declaration of Richard C. Looke filed in U.S. Appl. No. 09/176,022, which is directed to related subject matter, 2 pages.
Declaration of Charley D. Moses, Jr. filed in U.S. Appl. No. 09/176,022, which is directed to related subject matter, 2 pages.
Declaration of Jeffrey L. Parker and David F. Sorrells, with attachment Exhibit 1, filed in U.S. Appl. No. 09/176,022, which is directed to related subject matter, 130 pages
Dewey, R.J. and Collier, C.J., "Multi-Mode Radio Receiver," *Electronics Division Colloquium on Digitally Implemented Radios*, IEE, pp. 3/1-3/5 (Oct. 18, 1985).
Dialog File 347 (JAPIO) English Language Patent Abstract for JP 2-276351, 1 page (Nov. 13, 1990—Date of publication of application).
Dialog File 347 (JAPIO) English Language Patent Abstract for JP 2-131629, 1 page (May 21, 1990—Date of publication of application).
Dialog File 347 (JAPIO) English Language Patent Abstract for JP 2-39632, 1 page (Feb. 8, 1990— Date of publication of application).
Dialog File 348 (European Patents) English Language Patent Abstract for EP 0 785 635 A1, 3 pages (Dec. 26, 1996— Date of publication of application).
Dialog File 348 (European Patents) English Language Patent Abstract for EP 35166 A1, 2 pages (Feb. 18, 1981—Date of publication of application).
"DSO takes sampling rate to 1 Ghz," *Electronic Engineering*, Morgan Grampian Publishers, vol. 59, No. 723, pp. 77 and 79 (Mar. 1987).
Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).
Faulkner, N.D. and Vilar, E., "Subharmonic Sampling for the Measurement of Short Term Stability of Microwave Oscillators," *IEEE Transactions on Instrumentation and Measurement*, IEEE, vol. IM-32, No. 1, pp. 208-213 (Mar. 1983).
Faulkner, N.D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).
Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).
Filip, M. and Viler, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).
Fukahori, K., "A CMOS Narrow-Band Signaling Filter with Q Reduction," *IEEE Journal of Solid-State Circuits*, IEEE, vol. SC-19, No. 6, pp. 926-932 (Dec. 1984).
Fukuchi, H. and Otsu, Y., "Available time statistics of rain attenuation on earth-space path," *IEE Proceedings-H: Microwaves, Antennas and Propagation*, IEE, vol. 135, Pt. H, No. 6, pp. 387-390 (Dec. 1988).
Gibbins, C.J. and Chadha, R., "Millimetre-wave propagation through hydrocarbon flame," *IEE Proceedings*, IEE, vol. 134, Pt. H, No. 2 , pp. 169-173 (Apr. 1987).
Gilchrist, B. et al., "Sampling hikes performance of frequency synthesizers," *Microwaves & RF*, Hayden Publishing, vol. 23, No. 1, pp. 93-94 and 110 (Jan. 1984).
Gossard, E.E., "Clear weather meteorological effects on propagation at frequencies above 1 Ghz," *Radio Science*, American Geophysical Union, vol. 16, No. 5, pp. 589-608 (Sep.-Oct. 1981).
Gregorian, R. et al., "Switched-Capacitor Circuit Design," *Proceedings of the IEEE*, IEEE, vol. 71, No. 8, pp. 941-966 (Aug. 1983).
Groshong et al., "Undersampling Techniques Simplify Digital Radio," *Electronic Design*, Penton Publishing, pp. 67-68, 70, 73-75 and 78 (May 23, 1991).
Grove, W.M., "Sampling for Oscilloscopes,and Other RF Systems: Dc through X-Band," *IEEE Transactions on Microwave Theory and Techniques*, IEEE, pp. 629-635 (Dec. 1966).
Haddon, J. et al., "Measurement of Microwave Scintillations on a Satellite Down-Link at X-Band," *Antennas and Propagation*, IEE, pp. 113-117 (1981).
Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP-34, No. 5, pp. 646-657 (May 1986).
Hafdallah, H. et al., "2-4 Ghz MESFET Sampler," *Electronics Letters*, IEE, vol. 24, No. 3, pp. 151-153 (Feb. 4, 1988).
Herben, M.H.A.J., "Amplitude and Phase Scintillation Measurements on 8-2 km Line-Of-Sight Path at 30 Ghz," *Electronics Letters*, IEE, vol. 18, No. 7, pp. 287-289 (Apr. 1, 1982).
Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).
Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).
Hewitt, A. and Vilar, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).
Hospitalier, E., "Instruments for Recording and Observing Rapidly Varying Phenomena," *Science Abstracts*, IEE, vol. VII, pp. 22-23 (1904).

Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).

Hu, X., *A Switched-Current Sample-and-Hold Amplifier for FM Demodulation*, Thesis for Master of Applied Science, Dept. of Electrical and Computer Engineering, University of Toronto, UMI Dissertation Services, pp. 1-64 (1995).

Hung, H-L. A. et al., "Characterization of Microwave Integrated Circuits Using An Optical Phase-Locking and Sampling System," *IEEE MTT-S Digest*, IEEE, pp. 507-510 (1991).

Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).

Itakura, T., "Effects of the sampling pulse width on the frequency characteristics of a sample-and-hold circuit," *IEE Proceedings Circuits, Devices and Systems*, IEE, vol. 141, No. 4, pp. 328-336 (Aug. 1994).

Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).

Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).

Jondral, V.F. et al., "Doppler Profiles for Communication Satellites," *Frequenz*, Herausberger, pp. 111-116 (May-Jun. 1996).

Kaleh, G.K., "A Frequency Diversity Spread Spectrum System for Communication in the Presence of In-band Interference," *1995 IEEE Globecom*, IEEE Communications Society, pp. 66-70 (1995).

Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).

Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).

Lam, W.K. et al., "Measurement of the Phase Noise Characteristics of an Unlocked Communications Channel Identifier," *Proceedings Of the 1993 IEEE International Frequency Control Symposium*, IEEE, pp. 283-288 (Jun. 2-4, 1993).

Lam, W.K. etal., "Wideband sounding of 11.6 Ghz transhorizon channel," *Electronics Letters*, IEE, vol. 30, No. 9, pp. 738-739 (Apr. 28, 1994).

Larkin, K.G., "Efficient demodulator for bandpass sampled AM signals," *Electronics Letters*, IEE, vol. 32, No. 2, pp. 101-102 (Jan. 18, 1996).

Lau, W.H. et al., "Analysis of the Time Variant Structure of Microwave Line-of-sight Multipath Phenomena," *IEEE Global Telecommunications Conference & Exhibition*, IEEE, pp. 1707-1711 (Nov. 28-Dec. 1, 1988).

Lau, W.H. et al., "Improved Prony Algorithm to Identify Multipath Components," *Electronics Letters*, IEE, vol. 23, No. 20, pp. 1059-1060 (Sep. 24, 1987).

Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).

Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).

Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 4443-4449 (Aug. 1979).

Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).

Lo, P. et al., "Coherent Automatic Gain Control," *IEE Colloquium on Phase Locked Techniques*, IEE, pp. 2/1-2/6 (Mar. 26, 1980).

Lo, P. et al., "Computation of Rain Induced Scintillations on Satellite Down-Links at Microwave Frequencies," *Third International Conference on Antennas and Propagation* (*ICAP 83*), pp. 127-131 (Apr. 12-15, 1983).

Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).

Madani, K. and Aithison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).

Marsland, R.A. et al., "130 Ghz GaAs monolithic integrated circuit sampling head," *Appl. Phys. Lett.*, American Institute of Physics, vol. 55, No. 6, pp. 592-594 (Aug. 7, 1989).

Martin, K. and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).

Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).

Matricciani, E., "Prediction of fade durations due to rain in satellite communication systems," *Radio Science*, American Geophysical Union, vol. 32, No. 3, pp. 935-941 (May-Jun. 1997).

McQueen, J.G. "The Monitoring of High-Speed Waveforms," *Electronic Engineering*, Morgan Brothers Limited, vol. XXIV, No. 296, pp. 436-441 (Oct. 1952).

Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).

Merlo, U. et al., "Amplitude Scintillation Cycles in a Sirio Satellite-Earth Link," *Electronics Letters*, IEE, vol. 21, No. 23, pp. 1094-1096 (Nov. 7, 1985).

Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep. 11, 1988).

Moulsley, T.J. et al., "The efficient acquisition and processing of propagation statistics," *Journal of the Institution of Electronic and Radio Engineers*, IERE, vol. 55, No. 3, pp. 97-103 (Mar. 1985).

Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).

Ndzi, D. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).

"New zero IF chipset from Philips," *Electronic Engineering*, United News & Media, vol. 67, No. 825, p. 10 (Sep. 1995).

Ohara, H. et al., "First monolithic PCM filter cuts cost of telecomm systems," *Electronic Design*, Hayden Publishing Company, vol. 27, No. 8, pp. 130-135 (Apr. 12, 1979).

Oppenheim, A.V. et al., *Signals and Systems*, Prentice-Hall, pp. 527-531 and 561-562 (1983).

Ortgies, G., "Experimental Parameters Affecting Amplitude Scintillation Measurements on Satellite Links," *Electronics Letters*, IEE, vol. 21, No. 17, pp. 771-772 (Aug. 15, 1985).

Pärssinen et al., "A 2-GHz Subharmonic Sampler for Signal Downconversion," *IEEE Transactions on Microwave Theory and Techniques*, IEEE, vol. 45, No. 12, 7 pages (Dec. 1997).

Peeters, G. etal., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce, pp. 1-14 (May 1980).

Poulton, K. et al., "A 1-Ghz 6-bit ADC System," *IEEE Journal of Solid-State Circuits*, IEEE, vol. SC-22, No. 6, pp. 962-969 (Dec. 1987).
Press Release, "Parkervision, Inc. Announces Fiscal 1993 Results," Lipper/Heilshorn and Associates, 2 Pages (Apr. 6, 1994).
Press Release, "Parkervision, Inc. Announces the Appointment of Michael Baker to the New Position of National Sales Manager," Lippert/Heilshorn and Associates, 1 Page (Apr. 7, 1994).
Press Release, "Parkervision's Cameraman Well-Received By Distance Learning Market," Lippert/Heilshorn and Associates, 2 Pages (Apr. 8, 1994).
Press Release, "Parkervision, Inc. Announces First Quarter Financial Results," Lippert/Heilshorn and Associates, 2 Pages (Apr. 26, 1994).
Press Release, "Parkervision, Inc. Announces The Retirement of William H. Fletcher, Chief Financial Officer," Lippert/Heilshorn and Associates, 1 Page (May 11, 1994).
Press Release, "Parkervision, Inc. Announces New Cameraman System II™ At Infocomm Trade Show," Lippert/Heilshorn and Associates, 3 Pages (Jun. 9, 1994).
Press Release, "Parkervision, Inc. Announces Appointments to its National Sales Force," Lippert/Heilshorn and Associates, 2 Pages (Jun. 17, 1994).
Press Release, "Parkervision, Inc. Announces Second Quarter and Six Months Financial Results," Lippert/Heilshorn and Associates, 3 Pages (Aug. 9, 1994).
Press Release, "Parkervision, Inc. Announces Third Quarter and Nine Months Financial Results," Lippert/Heilshorn and Associates, 3 Pages (Oct. 28, 1994).
Press Release, "Parkervision, Inc. Announces First Significant Dealer Sale of Its Cameraman@ System II," Lippert/Heilshorn and Associates, 2 Pages (Nov. 7, 1994).
Press Release, "Parkervision, Inc. Announces Fourth Quarter and Year End Results," Lippert/Heilshorn and Associates, 2 Pages (Mar. 1, 1995).
Press Release, "Parkervision, Inc. Announces Joint Product Developments With VTEL," Lippert/Heilshorn and Associates, 2 Pages (Mar. 21, 1995).
Press Release, "Parkervision, Inc. Announces First Quarter Financial Results," Lippert/Heilshorn and Associates, 3 Pages (Apr. 28, 1995).
Press Release, "Parkervision Wins Top 100 Product Districts' Choice Award," Parkervision Marketing and Manufacturing Headquarters, 1 Page (Jun. 29, 1995).
Press Release, "Parkervision National Sales Manager Next President of USDLA," Parkervision Marketing and Manufacturing Headquarters, 1 Page (Jul. 6, 1995).
Press Release, "Parkervision Granted New Patent," Parkervision Marketing and Manufacturing Headquarters, 1 Page (Jul. 21, 1995).
Press Release, "Parkervision, Inc. Announces Second Quarter and Six Months Financial Results," Parkervision Marketing and Manufacturing Headquarters, 2 Pages (Jul. 31, 1995).
Press Release, "Parkervision, Inc. Expands Its Cameraman System II Product Line," Parkervision Marketing and Manufacturing Headquarters, 2 Pages (Sep. 22, 1995).
Press Release, "Parkervision Announces New Camera Control Technology," Parkervision Marketing and Manufacturing Headquarters, 2 Pages (Oct. 25, 1995).
Press Release, "Parkervision, Inc. Announces Completion of VTEL/Parkervision Joint Product Line," Parkervision Marketing and Manufacturing Headquarters, 2 Pages (Oct. 30, 1995).
Press Release, "Parkervision, Inc. Announces Third Quarter and Nine Months Financial Results," Parkervision Marketing and Manufacturing Headquarters, 2 Pages (Oct. 30, 1995).
Press Release, "Parkervision's Cameraman Personal Locator Camera System Wins Telecon XV Award," Parkervision Marketing and Manufacturing Headquarters, 2 Pages (Nov. 1, 1995).
Press Release, "Parkervision, Inc. Announces Purchase Commitment From VTEL Corporation," Parkervision Marketing and Manufacturing Headquarters, 1 Page (Feb. 26, 1996).
Press Release, "ParkerVision, Inc. Announces Fourth Quarter and Year End Results," Parkervision Marketing and Manufacturing Headquarters, 2 Pages (Feb. 27, 1996).
Press Release, "ParkerVision, Inc. Expands its Product Line," Parkervision Marketing and Manufacturing Headquarters, 2 Pages (Mar. 7, 1996).
Press Release, "ParkerVision Files Patents for its Research of Wireless Technology," Parkervision Marketing and Manufacturing Headquarters, 1 Page (Mar. 28, 1996).
Press Release, "Parkervision, Inc. Announces First Significant Sale of Its Cameraman® Three-Chip System," Parkervision Marketing and Manufacturing Headquarters, 2 Pages (Apr. 12, 1996).
Press Release, "Parkervision, Inc. Introduces New Product Line For Studio Production Market," Parkervision Marketing and Manufacturing Headquarters, 2 Pages (Apr. 15, 1996).
Press Release, "Parkervision, Inc. Announces Private Placement of 800,000 Shares," Parkervision Marketing and Manufacturing Headquarters, 1 Page (Apr. 15, 1996).
Press Release, "Parkervision, Inc. Announces First Quarter Financial Results," Parkervision Marketing and Manufacturing Headquarters, 3 Pages (Apr. 30, 1996).
Press Release, "ParkerVision's New Studio Product Wins Award," Parkervision Marketing and Manufacturing Headquarters, 2 Pages (Jun. 5, 1996).
Press Release, "Parkervision, Inc. Announces Second Quarter and Six Months Financial Results," Parkervision Marketing and Manufacturing Headquarters, 3 Pages (Aug. 1, 1996).
Press Release, "Parkervision, Inc. Announces Third Quarter and Nine Months Financial Results," Parkervision Marketing and Manufacturing Headquarters, 2 Pages (Oct. 29, 1996).
Press Release, "PictureTel and ParkerVision Sign Reseller Agreement," Parkervision Marketing and Manufacturing Headquarters, 2 Pages (Oct. 30, 1996).
Press Release, "CLI and ParkerVision Bring Enhanced Ease-of-Use to Videoconferencing," CLI/Parkervision, 2 Pages (Jan. 20, 1997).
Press Release, "Parkervision, Inc. Announces Fourth Quarter and Year End Results," Parkervision Marketing and Manufacturing Headquarters, 3 Pages (Feb. 27, 1997).
Press Release, "Parkervision, Inc. Announces First Quarter Financial Results," Parkervision Marketing and Manufacturing Headquarters, 3 Pages (Apr. 29, 1997).
Press Release, "NEC and Parkervision Make Distance Learning Closer," NEC America, 2 Pages (Jun. 18, 1997).
Press Release, "Parkervision Supplies JPL with Robotic Cameras, Cameraman Shot Director for Mars Mission," Parkervision Marketing and Manufacturing Headquarters, 2 Pages (Jul. 8, 1997).
Press Release, "ParkerVision and IBM Join Forces to Create Wireless Computer Peripherals," Parkervision Marketing and Manufacturing Headquarters, 2 Pages (Jul. 23, 1997).
Press Release, "ParkerVision, Inc. Announces Second Quarter and Six Months Financial Results," Parkervision Marketing and Manufacturing Headquarters, 3 Pages (Jul. 31, 1997).
Press Release, "Parkervision, Inc. Announces Private Placement of 990,000 Shares," Parkervision Marketing and Manufacturing Headquarters, 2 Pages (Sep. 8, 1997).
Press Release, "Wal-Mart Chooses Parkervision for Broadcast Production," Parkervision Marketing and Manufacturing Headquarters, 2 Pages (Oct. 24, 1997).
Press Release, "Parkervision, Inc. Announces Third Quarter Financial Results," Parkervision Marketing and Manufacturing Headquarters, 3 Pages (Oct. 30, 1997).
Press Release, "ParkerVision Announces Breakthrough in Wireless Radio Frequency Technology," Parkervision Marketing and Manufacturing Headquarters, 3 Pages (Dec. 10, 1997).
Press Release, "Parkervision, Inc. Announces the Appointment of Joseph F. Skovron to the Position of Vice President, Licensing—Wireless Technologies," Parkervision Marketing and Manufacturing Headquarters, 2 Pages (Jan. 9, 1998).
Press Release, "Parkervision Announces Existing Agreement with IBM Terminates—Company Continues with Strategic Focus Announced in December," Parkervision Marketing and Manufacturing Headquarters, 2 Pages (Jan. 27, 1998).
Press Release, "Laboratory Tests Verify Parkervision Wireless Technology," Parkervision Marketing and Manufacturing Headquarters, 2 Pages (Mar. 3, 1998).

Press Release, "Parkervision, Inc. Announces Fourth Quarter and Year End Financial Results," Parkervision Marketing and Manufacturing Headquarters, 3 Pages (Mar. 5, 1998).
Press Release, "Parkervision Awarded Editors' Pick of Show for NAB 98," Parkervision Marketing and Manufacturing Headquarters, 2 Pages (Apr. 15, 1998).
Press Release, "Parkervision Announces First Quarter Financial Results," Parkervision Marketing and Manufacturing Headquarters, 3 Pages (May 4, 1998).
Press Release, "Parkervision 'DIRECT2DATA' Introduced in Response to Market Demand," Parkervision Marketing and Manufacturing Headquarters, 3 Pages (Jul. 9, 1998).
Press Release, "Parkervision Expands Senior Management Team," Parkervision Marketing and Manufacturing Headquarters, 2 Pages (Jul. 29, 1998).
Press Release, "Parkervision Announces Second Quarter and Six Month Financial Results," Parkervision Marketing and Manufacturing Headquarters, 4 Pages (Jul. 30, 1998).
Press Release, "Parkervision Announces Third Quarter and Nine Month Financial Results," Parkervision Marketing and Manufacturing Headquarters, 3 Pages (Oct. 30, 1998).
Press Release, "Questar Infocomm, Inc. Invests $5 Million in Parkervision Common Stock," Parkervision Marketing and Manufacturing Headquarters, 3 Pages (Dec. 2, 1998).
Press Release, "Parkervision Adds Two New Directors," Parkervision Marketing and Manufacturing Headquarters, 2 Pages (Mar. 5, 1999).
Press Release, "Parkervision Announces Fourth Quarter and Year End Financial Results," Parkervision Marketing and Manufacturing Headquarters, 3 Pages (Mar. 5, 1999).
Press Release, "Joint Marketing Agreement Offers New Automated Production Solution," Parkervision Marketing and Manufacturing Headquarters, 2 Pages (Apr. 13, 1999).
"Project COST 205: Scintillations in Earth-satellite links," *Alta Frequenza: Scientific Review in Electronics*, AEI, vol. LIV, No. 3, pp. 209-211 (May-Jun., 1985).
Razavi, B., *RF Microelectronics*, Prentice-Hall, pp. 147-149 (1998).
Reeves, R.J.D., "The Recording and Collocation of Waveforms (Part 1)," *Electronic Engineering*, Morgan Brothers Limited, vol. 31, No. 373, pp. 130-137 (Mar. 1959).
Reeves, R.J.D., "The Recording and Collocation of Waveforms (Part 2)," *Electronic Engineering*, Morgan Brothers Limited, vol. 31, No. 374, pp. 204-212 (Apr. 1959).
Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).
Riad, S.M. and Nahman, N.S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).
Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).
Rowe, H.E., *Signals and Noise in Communication Systems*, D. Van Nostrand Company, Inc., Princeton, New Jersey, including, for example, Chapter V, Pulse Modulation Systems (1965).
Rücker, F. and Dintelmann, F., "Effect of Antenna Size on OTS Signal Scintillations and Their Seasonal Dependence," *Electronics Letters*, IEE, vol. 19, No. 24, pp. 1032-1034 (Nov. 24, 1983).
Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).
Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218-223 (Oct. 16-18, 1990).
Salous, S., "IF digital generation of FMCW waveforms for wideband channel characterization," *IEE Proceedings-I*, IEE, Vol. 139, No. 3, pp. 281-288 (Jun. 1992).
"Sampling Loops Lock Sources to 23 Ghz," *Microwaves & RF*, Penton Publishing, p. 212 (Sep. 1990).
Sasikumar, M. et al., "Active Compensation in the Switched-Capacitor Biquad," *Proceedings of the IEEE*, IEEE, vol. 71, No. 8, pp. 1008-1009 (Aug. 1983).
Saul, P.H., "A GaAs MESFET Sample and Hold Switch," *Fifth European Solid State Circuits Conference—ESSCIRC 79*, IEE, pp. 5-7 (1979).
Shen, D.H. et al., "A 900-MHZ RF Front-End with Integrated Discrete-Time Filtering," *IEEE Journal of Solid-State Circuits*, IEEE Solid-State Circuits Council, vol. 31, No. 12, pp. 1945-1954 (Dec. 1996).
Shen, X.D. and Vilar, E., "Anomalous transhorizon propagation and meteorological processes of a multilink path," *Radio Science*, American Geophysical Union, vol. 30, No. 5, pp. 1467-1479 (Sep.-Oct. 1995).
Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).
Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).
Shen, X. and Vilar, E., "Path loss statistics and mechanisms of transhorizon propagation over a sea path," *Electronics Letters*, IEE, vol. 32, No. 3, pp. 259-261 (Feb. 1, 1996).
Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).
Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).
Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).
Staruk, W. Jr. et al., "Pushing HF Data Rates," *Defense Electronics*, EW Communications, vol. 17, No. 5, pp. 211, 213, 215, 217, 220 and 222 (May 1985).
Stephenson, A.G., "Digitizing multiple RF signals requires an optimum sampling rate," *Electronics*, McGraw-Hill, pp. 106-110 (Mar. 27, 1972).
Sugarman, R., "Sampling Oscilloscope for Statistically Varying Pulses," *The Review of Scientific Instruments*, American Institute of Physics, vol. 28, No. 11, pp. 933-938 (Nov. 1957).
Sylvain, M., "Experimental probing of multipath microwave channels," *Radio Science*, American Geophysical Union, vol. 24, No. 2, pp. 160-178 (Mar.-Apr. 1989).
Takano, T., "Novel GaAs Pet Phase Detector Operable to Ka Band," *IEEE MT-S Digest*, IEEE, pp. 381-383 (1984).
Tan, M.A. "Biquadratic Transconductance Switched-Capacitor Filters," *IEEE Transactions on Circuits and Systems- I: Fundamental Theory and Applications*, IEEE Circuits and Systems Society, vol. 40, No. 4, pp. 272-275 (Apr. 1993).
Tanaka, K. et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).
Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).
Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335-339 (Mar. 30-Apr. 2, 1993).
Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).
Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).
Tawfik, A.N. And Vilar, E., "X-Band Transhorizon Measurements of CW Transmissions Over the Sea- Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).
Temes, G.C. and Tsividis, T., "The Special Section on Switched-Capacitor Circuits," *Proceedings of the IEEE*, IEEE, vol. 71, No. 8, pp. 915-916 (Aug. 1983).
Thomas, G.B., *Calculus and Analytic Geometry*, Third Edition, Addison-Wesley Publishing, pp. 119-133 (1960).
Tomassetti, Q., "An Unusual Microwave Mixer," *16th European Microwave Conference*, Microwave Exhibitions and Publishers, pp. 754-759 (Sep. 8-12, 1986).
Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1-3 (Jan. 1984).
Tsividis, Y. and Antognetti, P. (Ed.), *Design of MOS VLSI Circuits for Telecommunications*, Prentice-Hall, p. 304 (1985).
Tsividis, Y., "Principles of Operation and Analysis of Switched-Capacitor Circuits," *Proceedings of the IEEE*, IEEE, vol. 71, No. 8, pp. 926-940 (Aug. 1983).
Tsurumi, H. and Maeda, T., "Design Study on a Direct Conversion Receiver Front-End for 280 MHZ, 900 MHZ, and 2.6 Ghz Band Radio Communication Systems," *41st IEEE Vehicular Technology Conference*, IEEE Vehicular Technology Society, pp. 457-462 (May 19-22, 1991).
Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).
van de Kamp, M.M.J.L., "Asymmetric signal level distribution due to tropospheric scintillation," *Electronics Letters*, IEE, vol. 34, No. 11, pp. 1145-1146 (May 28, 1998).
Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).
Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).
Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).
Vilar, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).
Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8-1-8-16 (Oct. 4-7, 1983).
Vilar, E. and Smith, H., "A Theoretical and Experimental Study of Angular Scintillations in Earth Space Paths," *IEEE Transactions on Antennas and Propagation*, IEEE, vol. AP-34, No. 1, pp. 2-10 (Jan. 1986).
Vilar, E. et al., "A Wide Band Transhorizon Experiment at 11.6 Ghz," *Eighth International Conference on Antennas and Propagation*, Electronics Division of the IEE, pp. 441-445 (Mar. 30- Apr. 2, 1993).
Vilar, E. and Matthews, P.A., "Amplitude Dependence of Frequency in Oscillators," *Electronics Letters*, IEE, vol. 8, No. 20, pp. 509-511 (Oct. 5, 1972).
Vilar, E. et al., "An experimental mm-wave receiver system for measuring phase noise due to atmospheric turbulence," *Proceedings of the 25th European Microwave Conference*, Nexus House, pp. 114-119 (1995).
Vilar, E. and Burgueño, A., "Analysis and Modeling of Time Intervals Between Rain Rate Exceedances in the Context of Fade Dynamics," *IEEE Transactions on Communications*, IEEE Communications Society, vol. 39, No. 9, pp. 1306-1312 (Sep. 1991).
Vilar, E. et al., "Angle of Arrival Fluctuations in High and Low Elevation Earth Space Paths," *Fourth International Conference on Antennas and Propagation (ICAP 85)*, Electronics Division of the IEE, pp. 83-88 (Apr. 16-19, 1985).
Vilar, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).
Vilar, E. et al., "CERS. Millimetre-Wave Beacon Package and Related Payload Doppler Correction Strategies," *Electronics Division Colloquium on CERS-Communications Engineering Research Satellite*, IEE, pp. 10/1-10/10 (Apr. 10, 1984).
Vilar, E. and Moulsley, T.J., "Comment and Reply: Probability Density Function of Amplitude Scintillations," *Electronics Letters*, IEE, vol. 21, No. 14, pp. 620-622 (Jul. 4, 1985).
Vilar, E. et al., "Comparison of Rainfall Rate Duration Distributions for ILE-IFE and Barcelona," *Electronics Letters*, IEE, vol. 28, No. 20, pp. 1922-1924 (Sep. 24, 1992).
Vilar, E., "Depolarization and Field Transmittances in Indoor Communications," *Electronics Letters*, IEE, vol. 27, No. 9, pp. 732-733 (Apr. 25, 1991).
Vilar, E. and Larsen, J.R., "Elevation Dependence of Amplitude Scintillations on Low Elevation Earth Space Paths," *Sixth International Conference on Antennas and Propagation (ICAP 89) Part 2: Propagation*, IEE, pp. 150-154 (Apr. 4-7, 1989).
Vilar, E. et al., "Experimental System and Measurements of Transhorizon Signal Levels at 11 Ghz," *18th European Microwave Conference*, Microwave Exhibitions and Publishers Ltd., pp. 429-435 (Sep. 12-15, 1988).
Vilar, E. and Matthews, P.A., "Importance of Amplitude Scintillations in Millimetric Radio Links," *Proceedings of the 4th European Microwave Conference, Microwave Exhibitions and Publishers*, pp. 202-206 (Sep. 10-13, 1974).
Vilar, E. and Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).
Vilar, E. and Matthews, P.A., "Measurement of Phase Fluctuations on Millimetric Radiowave Propagation," *Electronics Letters*, IEE, vol. 7, No. 18, pp. 566-568 (Sep. 9, 1971).
Vilar, E. and Wan, K.W., "Narrow and Wide Band Estimates of Field Strength for Indoor Communications in the Millimetre Band," *Electronics Division Colloquium on Radiocommunications in the Range 30-60 Ghz*, IEE, pp. 5/1-5/8 (Jan. 17, 1991).
Vilar, E. and Faulkner, N.D., "Phase Noise and Frequency Stability Measurements. Numerical Techniques and Limitations," *Electronics Division Colloquium on Low Noise Oscillators and Synthesizer*, IEE, 5 pages (Jan. 23, 1986).
Vilar, E. and Senin, S., "Propagation phase noise identified using 40 Ghz satellite downlink," *Electronics Letters*, IEE, vol. 33, No. 22, pp. 1901-1902 (Oct. 23, 1997).
Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230-2.233 (Apr. 14-17, 1997).
Vilar, E. and Haddon, J., "Scintillation Modeling and Measurement—A Tool for Remote-Sensing Slant Paths," *AGARD Conference Proceedings No. 332: Propagation Aspects of Frequency Sharing, Interference And System Diversity*, AGARD, pp. 27-1-27-13 (Oct. 18-22, 1982).
Vilar, E., "Some Limitations on Digital Transmission Through Turbulent Atmosphere," *International Conference on Satellite Communication Systems Technology*, Electronics Division of the IEE, pp. 169-187 (Apr. 7-10, 1975).
Vilar, E. and Matthews, P.A., "Summary of Scintillation Observations in a 36 Ghz Link Across London," *International Conference on Antennas and Propagation Part 2: Propagation*, IEE, pp. 36-40 (Nov. 28-30, 1978).
Vilar, E. et al., "Wideband Characterization of Scattering Channels," *Tenth International Conference on Antennas and Propagation*, Electronics Division of the IEE, pp. 2.353-2.358 (Apr. 14-17, 1997).
Vollmer, A., "Complete GPS Receiver Fits on Two Chips," *Electronic Design*, Penton Publishing, pp. 50, 52, 54 and 56 (Jul. 6, 1998).
*Voltage and Time Resolution in Digitizing Oscilloscopes: Application Note 348*, Hewlett Packard, pp. 1-11 (Nov. 1986).

Wan, K.W. et al., "A Novel Approach to the Simultaneous Measurement of Phase and Amplitude Noises in Oscillator," *Proceedings of the 19th European Microwave Conference*, Microwave Exhibitions and Publishers Ltd., pp. 809-813 (Sep. 4-7, 1989).
Wan, K.W. et al., "Extended Variances and Autoregressive/Moving Average Algorithm for the Measurement and Synthesis of Oscillator Phase Noise," *Proceedings Of the 43rd Annual Symposium on Frequency Control*, IEEE, pp. 331-335 (1989).
Wan, K.W. et al., "Wideband Transhorizon Channel Sounder at 11 Ghz," *Electronics Division Colloquium on High Bit Rate UHF/SHF Channel Sounders—Technology and Measurement*, IEE, pp. 3/1-3/5 (Dec. 3, 1993).
Wang, H., "A 1-V Multigigahertz RF Mixer Core in 0.5—μm CMOS," *IEEE Journal of Solid-State Circuits*, IEEE Solid-State Circuits Society, vol. 33, No. 12, pp. 2265-2267 (Dec. 1998).
Watson, A.W.D. et al., "Digital Conversion and Signal Processing for High Performance Communications Receivers," *Digital Processing of Signals in Communications*, Institution of Electronic and Radio Engineers, pp. 367-373 (Apr. 22-26, 1985).
Weast, R.C. et al. (Ed.), *Handbook of Mathematical Tables*, Second Edition, The Chemical Rubber Co., pp. 480-485 (1964).
Wiley, R.G., "Approximate FM Demodulation Using Zero Crossings," *IEEE Transactions on Communications*, IEEE, vol. COM-29, No. 7, pp. 1061-1065 (Jul. 1981).
Worthman, W., "Convergence . . . Again," *RF Design*, Primedia, p. 102 (Mar. 1999).
Young, I.A. and Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).
Translation of Specification and Claims of FR Patent No. 2245130, 3 pages (Apr. 18, 1975—Date of publication of application).
Fest, Jean-Pierre, "Le Convertisseur A/N Revolutionne Le Recepteur Radio," *Electronique*, JMJ (Publisher), No. 54, pp. 40-42 (Dec. 1995).
Translation of DE Patent No. 35 41 031 A1, 22 pages (May 22, 1986—Date of publication of application).
Translation of EP Patent No. 0 732 803 Al, 9 pages (Sep. 18, 1996—Date of publication of application).
Fest, Jean-Pierre, "The A/D Converter Revolutionizes the Radio Receiver," *Electronique*, JMJ (Publisher), No. 54, 3 pages (Dec. 1995). (Translation of Doc. AQ50).
Translation of German Patent No. DE 197 35 798 C1, 8 pages (Jul. 16, 1998—Date of publication of application).
Miki, S. and Nagahama, R., *Modulation System II*, Common Edition 7, Kyoritsu Publishing Co., Ltd., pp. 146-154 (Apr. 30, 1956).
Miki, S. and Nagahama, R., *Modulation System II*, Common Edition 7, Kyoritsu Publishing Co., Ltd., pp. 146-149 (Apr. 30, 1956). (Partial Translation of Doc. AQ51).
Rabiner, L.R. and Gold, B., *Theory And Application Of Digital Signal Processing*, Prentice-Hall, Inc., pp. v-xii and 40-46 (1975).
English-language Abstract of Japanese Patent Publication No. 08-032556, from http://www1.ipdl.jpo.go.jp, 2 Pages (Feb. 2, 1996—Date of publication of application).
English-language Abstract of Japanese Patent Publication No. 08-139524, from http://www1.ipdl.jpo.go.jp, 2 Pages (May 31, 1996—Date of publication of application).
English-language Abstract of Japanese Patent Publication No. 59-144249, from http://www1.ipdl.jpo.go.jp, 2 Pages (Aug. 18, 1984—Date of publication of application).
English-language Abstract of Japanese Patent Publication No. 63-054002, from http://www1.ipdl.jpo.go.jp, 2 Pages (Mar. 8, 1988—Date of publication of application).
English-language Abstract of Japanese Patent Publication No. 06-237276, from http://www1.ipdl.jpo.go.jp, 2 Pages (Aug. 23, 1994—Date of publication of application).
English-language Abstract of Japanese Patent Publication No. 08-023359, from http://www1.ipdl.jpo.go.jp, 2 Pages (Jan. 23, 1996—Date of publication of application).
Translation of Japanese Patent Publication No. 47-2314, 7 pages (Feb. 4, 1972—Date of publication of application).
Partial Translation of Japanese Patent Publication No. 58-7903, 3 pages (Jan. 17, 1983—Date of publication of application).
English-language Abstract of Japanese Patent Publication No. 58-133004, from http://www1.ipdl.jpo.go.jp, 2 Pages (Aug. 8, 1993—Date of publication of application).
English-language Abstract of Japanese Patent Publication No. 60-058705, from http://www1.ipdl.jpo.go.jp, 2 Pages (Apr. 4, 1985—Date of publication of application).
English-language Abstract of Japanese Patent Publication No. 04-123614, from http://www1.ipdl.jpo.go.jp, 2 Pages (Apr. 23, 1992—Date of publication of application).
English-language Abstract of Japanese Patent Publication No. 04-127601, from http://www1.ipdl.jpo.go.jp, 2 Pages (Apr. 28, 1992—Date of publication of application).
English-language Abstract of Japanese Patent Publication No. 05-175730, from http://www1.ipdl.jpo.go.jp, 2 Pages (Jul. 13, 1993—Date of publication of application).
English-language Abstract of Japanese Patent Publication No. 05-175734, from http://www1.ipdl.jpo.go.jp; 2 Pages (Jul. 13, 1993—Date of publication of application).
English-language Abstract of Japanese Patent Publication No. 07-154344, from http://www1.ipdl.jpo.go.jp, 2 Pages (Jun. 16, 1995—Date of publication of application).
English-language Abstract of Japanese Patent Publication No. 07-307620, from http://www1.ipdl.jpo.go.jp, 2 Pages (Nov. 21, 1995—Date of publication of application).
Oppenheim, A.V. and Schafer, R.W., *Digital Signal Processing*, Prentice-Hall, pp. vii-x, 6-35, 45-78, 87-121 and 136-165 (1975).
English-language Abstract of Japanese Patent Publication No. 55-066057, from http://www1.ipdl.jpo.go.jp, 2 Pages (May 19, 1980—Date of publication of application).
English-language Abstract of Japanese Patent Publication No. 63-065587, from http://www1.ipdl.jpo.go.jp, 2 Pages (Mar. 24, 1988—Date of publication of application).
English-language Abstract of Japanese Patent Publication No. 63-153691, from http://wwwl.ipdljpo.go.jp, 2 Pages (Jun. 27, 1988—Date of publication of application).
Translation of Japanese Patent Publication No. 60-130203, 3 pages (Jul. 11, 1985—Date of publication of application).
Razavi, B., "A 900-MHz/1.8-Ghz CMOS Transmitter for Dual-Band Applications," *Symposium on VLSI Circuits Digest of Technical Papers*, IEEE, pp. 128-131 (1998).
Ritter, G.M., "SDA, A New Solution for Transceivers," *16th European Microwave Conference*, Microwave Exhibitions and Publishers, pp. 729-733 (Sep. 8, 1986).
Dialog File 351 (Derwent WPI) English Language Patent Abstract for FR 2 669 787, 1 page (May 29, 1992—Date of publication of application).
Akos, D.M. et al., "Direct Bandpass Sampling of Multiple Distinct RF Signals," *IEEE Transactions on Communications*, IEEE, vol. 47, No. 7, pp. 983-988 (Jul. 1999).
Patel, M. et al., "Bandpass Sampling for Software Radio Receivers, and the Effect of Oversampling on Aperture Jitter," *VTC 2002*, IEEE, pp. 1901-1905 (2002).
English-language Abstract of Japanese Patent Publication No. 61-030821, from http://www1.ipdl.jpo.go.jp, 2 Pages (Feb. 13, 1986—Date of publication of application).
English-language Abstract of Japanese Patent Publication No. 05-327356, from http://www1.ipdl.jpo.go.jp, 2 Pages (Dec. 10, 1993—Date of publication of application).
Tayloe, D., "A Low-noise, High-performance Zero IF Quadrature Detector/Preamplifier," *RF Design*, Primedia Business Magazines & Media, Inc., pp. 58, 60, 62 and 69 (Mar. 2003).
Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).
Simoni, A. et al., "A Digital Camera for Machine Vision," *20th International Conference on Industrial Electronics, Control and Instrumentation*, IEEE, pp. 879-883 (Sep. 1994).
Stewart, R.W. and Pfann, E., "Oversampling and sigma-delta strategies for data conversion," *Electronics & Communication Engineering Journal*, IEEE, pp. 37-47 (Feb. 1998).

Rudell, J.C. et al., "A 1.9-Ghz Wide-Band If Double Conversion CMOS Receiver for Cordless Telephone Applications," *IEEE Journal of Solid-State Circuits*, IEEE, vol. 32, No. 12, pp. 2071-2088 (Dec. 1997).
English-language Abstract of Japanese Patent Publication No. 09-036664, from http://www1.ipdl.jpo.go.jp, 2 Pages (Feb. 7, 1997—Date of publication of application).
Simoni, A. et al., "A Single-Chip Optical Sensor with Analog Memory for Motion Detection," *IEEE Journal of Solid-State Circtuits*, IEEE, vol. 30, No. 7, pp. 800-806 (Jul. 1995).
English Translation of German Patent Publication No. DE 196 48 915 A1, 10 pages.
Deboo, Gordon J., *Integrated Circuits and Semiconductor Devices*, 2nd Edition, McGraw-Hill, Inc., pp. 41-45 (1977).
Hellwarth, G.A. and Jones, G.D, "Automatic Conditioning of Speech Signals," *IEEE Transactions on Audio and Electroacoustics*, vol. AU-16, No. 2, pp. 169-179 (Jun. 1968).
English Abstract for German Patent No. DE 692 21 098 T2, 1 page, data supplied from the espacenet.
Gaudiosi, J., "Retailers will bundle Microsoft's Xbox with games and peripherals," *Video Store Magazine*, vol. 23, Issue 36, p. 8, 2 pages (Sep. 2-8, 2001).
English-language Translation of German Patent Publication No. DT 1936252, translation provided by Transperfect Translations, 12 pages (Jan. 28, 1971—Date of publication of application).
English-language Abstract of Japanese Patent Publication No. JP 62-12381, data supplied by the espacenet, 1 page (Jan. 21, 1987—Date of publication of application).
English-language Abstract of Japanese Patent Publication No. JP 4-154227, data supplied by the espacenet, 1 page (May 27, 1992—Date of publication of application).
English-language Abstract of Japanese Patent Publication No. JP 6-284038, data supplied by the espacenet, 1 page (Oct. 7, 1994—Date of publication of application).
English-language Abstract of Japanese Patent Publication No. JP 10-96778, data supplied by the espacenet, 1 page (Apr. 14, 1998—Date of publication of application).
English-language Abstract of Japanese Patent Publication No. JP 11-98205, data supplied by the espacenet, 1 page (Apr. 9, 1999—Date of publication of application).

* cited by examiner

1802

| TIME / NODE | t−1 (RISING EDGE OF $\phi_1$) | t−1 (RISING EDGE OF $\phi_2$) | t (RISING EDGE OF $\phi_1$) | t (RISING EDGE OF $\phi_2$) | t+1 (RISING EDGE OF $\phi_1$) |
|---|---|---|---|---|---|
| 1902 | $VI_{t-1}$ 1804 | $VI_{t-1}$ 1808 | $VI_t$ 1816 | $VI_t$ 1826 | $VI_{t+1}$ 1838 |
| 1904 | — | $VI_{t-1}$ 1810 | $VI_{t-1}$ 1818 | $VI_t$ 1828 | $VI_t$ 1840 |
| 1906 | $VO_{t-1}$ 1806 | $VO_{t-1}$ 1812 | $VO_t$ 1820 | $VO_t$ 1830 | $VO_{t+1}$ 1842 |
| 1908 | — | $VO_{t-1}$ 1814 | $VO_{t-1}$ 1822 | $VO_t$ 1832 | $VO_t$ 1844 |
| 1910 | — 1807 | — | $VO_{t-1}$ 1824 | $VO_{t-1}$ 1834 | $VO_t$ 1846 |
| 1912 | — | — 1815 | — | $VO_{t-1}$ 1836 | $VO_{t-1}$ 1848 |
| 1918 | — | — | — | — | $VI_t - 0.1*VO_t - 0.8*VO_{t-1}$ 1850 |

FIG. 18

FIG.26B
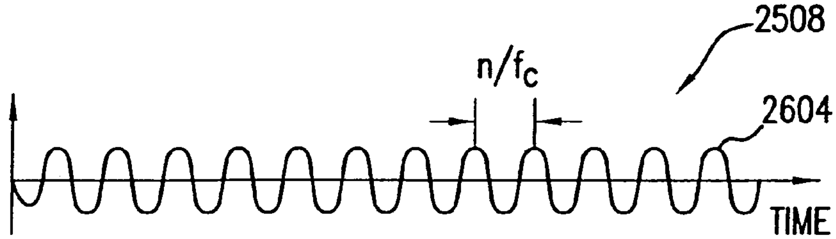
FIG.26C
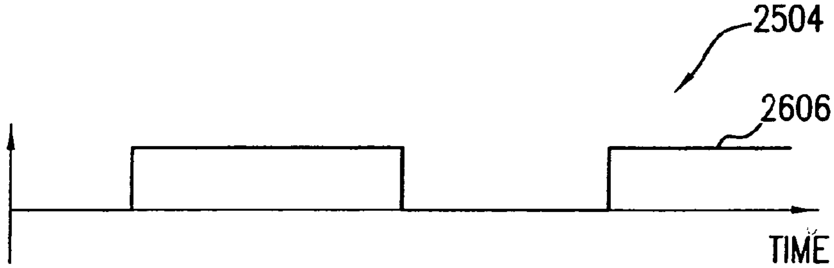
FIG.26D
FIG.26E
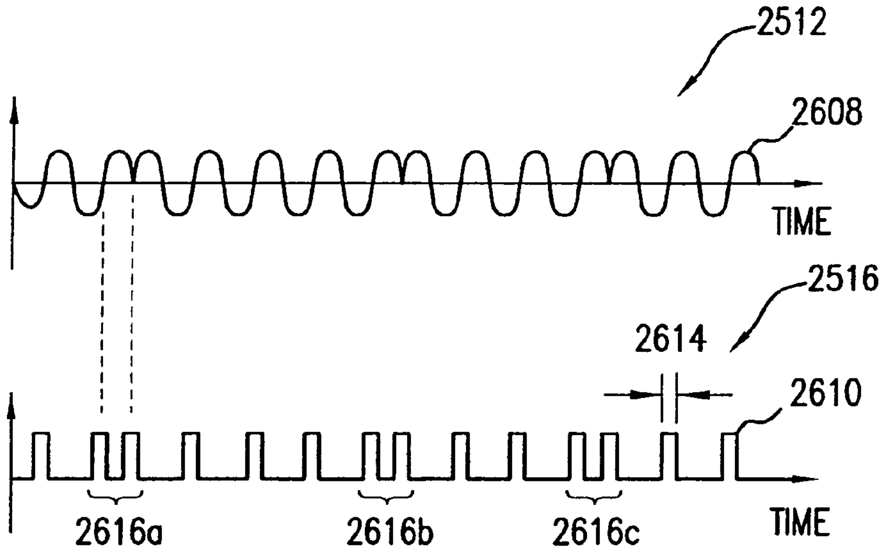
FIG.26F
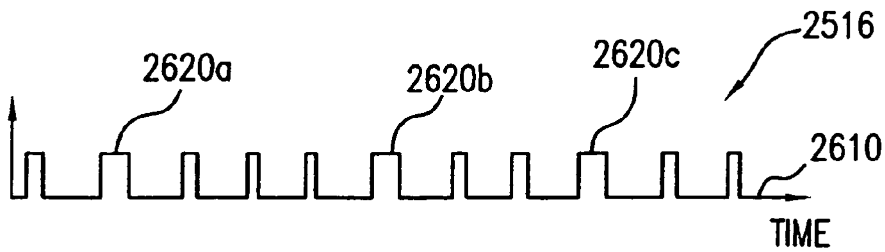

CDMA TRANSMITTER

4802

BASE STATION

| | |
|---|---|
| RHO | 0.9970 |
| EVM | 5.51% |
| PHASE ERROR | 1.80° |
| MAGNITUDE ERROR | 4.53% |
| CARRIER INSERTION | -37.91 dB |
| PA POWER OUT | 28.06 dBm |

FIG.48

FREQUENCY (MHz) (MOBILE STATION)

4902

| | LOW | MIDDLE | HIGH |
|---|---|---|---|
| RHO | 0.9892 | 0.9969 | 0.9892 |
| EVM | 10.39% | 5.54% | 10.39% |
| PHASE ERROR | 4.47° | 2.24° | 4.08° |
| MAGNITUDE ERROR | 6.84% | 4.21% | 8.27% |
| CARRIER INSERTION | -40.15 dB | -44.58 dB | -35.27 dB |
| PA POWER OUT | 27.36 dBm | 28.11 dBm | 27.55 dBm |

FIG.49

BASE STATION CONSTELLATION FOR PILOT CHANNEL TEST

BASE STATION SAMPLED CONSTELLATION

MOBILE STATION CONSTELLATION FOR ACCESS CHANNEL TEST

MOBILE STATION SAMPLED CONSTELLATION

BASE STATION CONSTELLATION USING ONLY H/P TEST EQUIPMENT

MOBILE CONSTELLATION USING ONLY H/P TEST EQUIPMENT

BASE STATION SPECTRAL RESPONSE WITH MASK

MOBILE STATION SPECTRAL RESPONSE WITH MASK

CDMA CROSSTALK

| QUANTITY | DESCRIPTION | VOLTAGE | TOTAL CURRENT | POWER |
|---|---|---|---|---|
| 2 | D2D CORES | 3.3 | 4mA | 13.2mW |
| 2 | BASEBAND INTERFACE CIRCUITS WITH/BW LIMIT | 3.3 | 6mA | 21.8mW |
| 1 | CLOCK CIRCUIT | 3.3 | 5mA | 20.0mW |
| | | | SUB TOTAL | 54.0mW |

FIG.60Z

RISING EDGE PULSE GENERATOR

FALLING-EDGE PULSE GENERATOR

7800

A. RISING EDGE PULSE GENERATOR

B. FALLING-EDGE PULSE GENERATOR

IMPEDANCE MATCHED ALIASING MODULE

ALIASING MODULE

STATE MACHINE FLOWCHART

ENERGY TRANSFER SIGNAL MODULE 8302

FIG. 107A

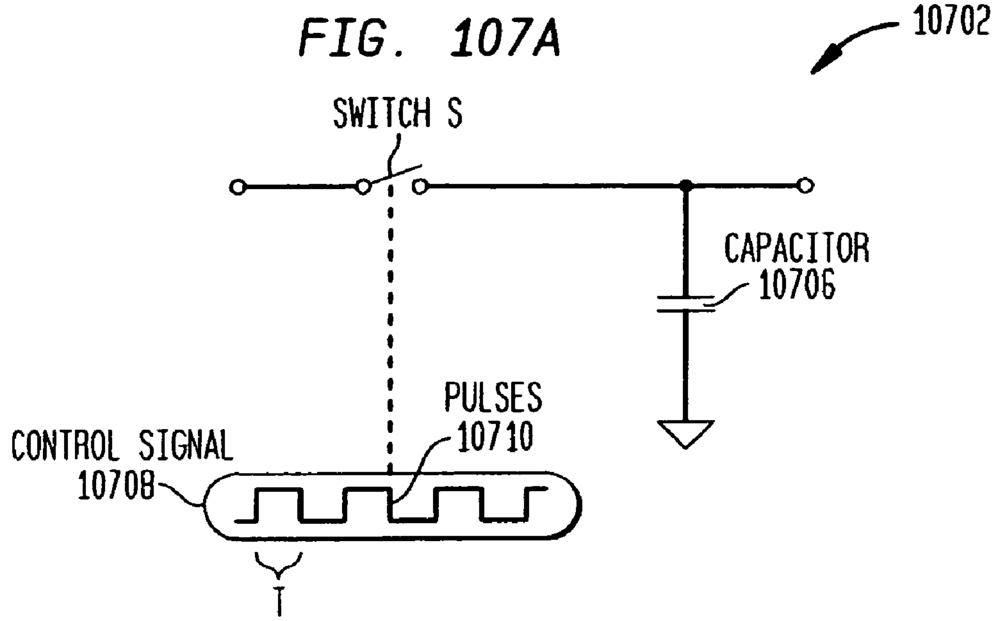

FIG. 107B $$q = C \cdot V \quad \text{EQ. 10}$$

$$V = A \cdot \sin(t) \quad \text{EQ. 11}$$

$$q(t) = C \cdot A \cdot \sin(t) \quad \text{EQ. 12}$$

$$\Delta q(t) = C \cdot A \cdot \sin(t) - C \cdot A \cdot \sin(t-T) \quad \text{EQ. 13}$$

$$\Delta q(t) = C \cdot A \cdot (\sin(t) - \sin(t-T)) \quad \text{EQ. 14}$$

$$\sin(\alpha) - \sin(\beta) = 2 \cdot \sin\left(\frac{\alpha-\beta}{2}\right) \cdot \cos\left(\frac{\alpha+\beta}{2}\right) \quad \text{EQ. 15}$$

$$\Delta q(t) = 2 \cdot C \cdot A \cdot \sin\left[\frac{t-(t-T)}{2}\right] \cdot \cos\left[\frac{t+(t-T)}{2}\right] \quad \text{EQ. 16}$$

$$\Delta q(t) = 2 \cdot C \cdot A \cdot \sin\left(\frac{1}{2} \cdot T\right) \cdot \cos\left(t - \frac{1}{2} \cdot T\right) \quad \text{EQ. 17}$$

$$q(t) = \int C \cdot A \cdot (\sin(t) - \sin(t-T))\,dt \quad \text{EQ. 18}$$

$$q(t) = -\cos(t) \cdot C \cdot A + \cos(t-T) \cdot C \cdot A \quad \text{EQ. 19}$$

$$q(t) = C \cdot A \cdot (\cos(t-T) - \cos(t)) \quad \text{EQ. 20}$$

FIG. 107C
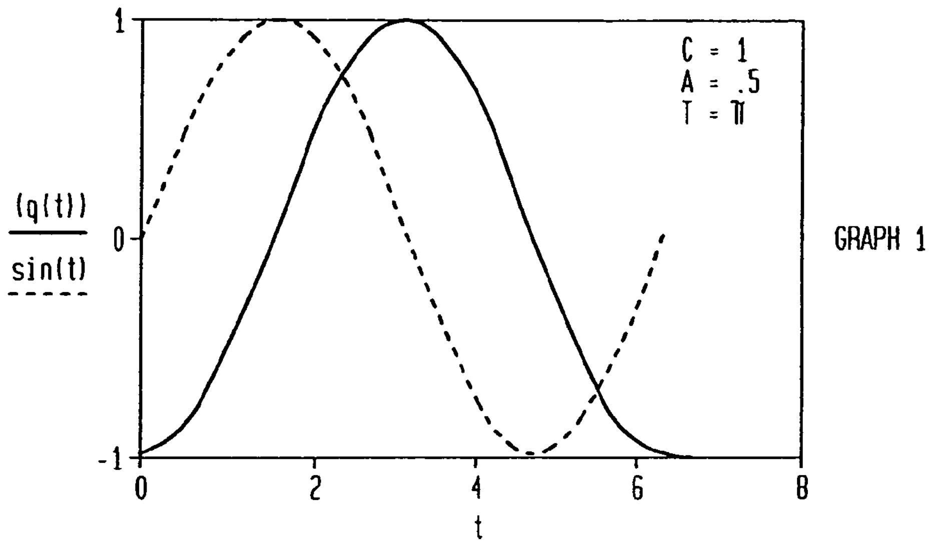
FIG. 107D
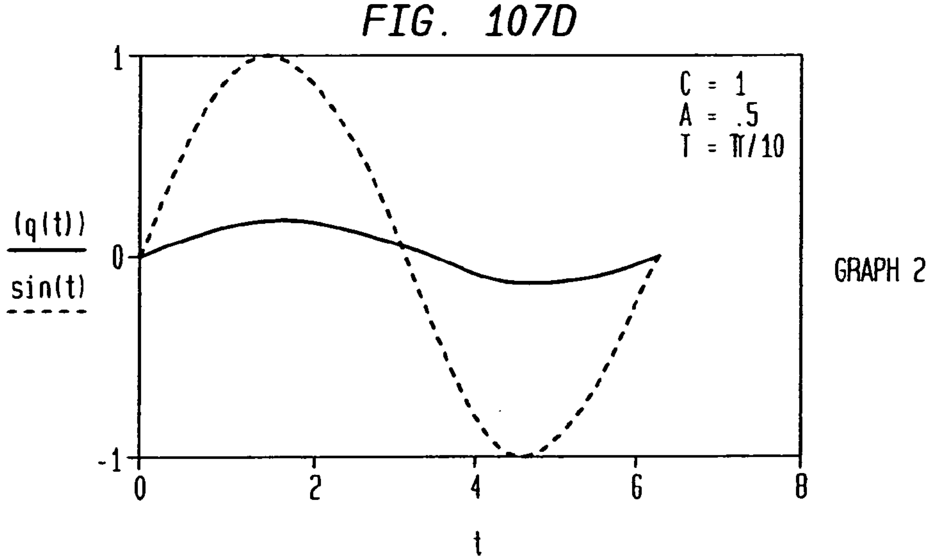
FIG. 107E
POWER-CHARGE RELATIONSHIP
| | |
|---|---|
| $q=C\cdot V$ | EQ. 21 |
| $V=q/C$ | EQ. 22 |
| $V=J/C$ | EQ. 23 |
| $J=q^2/C$ | EQ. 24 |
| $P=J/S$ | EQ. 25 |
| $P=\frac{q^2}{C\cdot S}$ | EQ. 26 |
FIG. 107F
INSERTION LOSS
INSERTION LOSS IN dB IS EXPRESSED BY:
$$ILdB=10\cdot\log\left(\frac{Pin}{Pout}\right) \text{ or}$$
$$ILdB=10\cdot\log\left[\frac{\left(\frac{Vin^2}{Rin}\right)}{\left(\frac{Vout^2}{Rout}\right)}\right]$$

SPREAD SPECTRUM APPLICATIONS OF UNIVERSAL FREQUENCY TRANSLATION

This application is a continuation of U.S. patent application Ser. No. 09/525,185, filed on Mar. 14, 2000, now U.S. Pat. No. 7,110,435 which claims the benefit of following: U.S. Provisional Application No. 60/124,376, filed on Mar. 15, 1999; U.S. Provisional Application No. 60/177,381, filed on Jan. 24, 2000; U.S. Provisional Application No. 60/171,502, filed Dec. 22, 1999; U.S. Provisional Application No. 60/177,705, filed on Jan. 24, 2000; U.S. Provisional Application No. 60/129,839, filed on Apr. 16, 1999; U.S. Provisional Application No. 60/158,047, filed on Oct. 7, 1999; U.S. Provisional Application No. 60/171,349, filed on Dec. 21, 1999; U.S. Provisional Application No. 60/177,702, filed on Jan. 24, 2000; U.S. Provisional Application No. 60/180,667, filed on Feb. 7, 2000; and U.S. Provisional Application No. 60/171,496, filed on Dec. 22, 1999.

CROSS-REFERENCE TO OTHER APPLICATIONS

The following applications of common assignee are related to the present application, and are herein incorporated by reference in their entireties:

"Method and System for Down-Converting Electromagnetic Signals," Ser. No. 09/176,022, filed Oct. 21, 1998;

"Method and System for Frequency Up-Conversion," Ser. No. 09/176,154, filed Oct. 21, 1998;

"Method and System for Ensuring Reception of a Communications Signal," Ser. No. 09/176,415, filed Oct. 21, 1998;

"Integrated Frequency Translation And Selectivity," Ser. No. 09/175,966, filed Oct. 21, 1998;

"Universal Frequency Translation, and Applications of Same," Ser. No. 09/176,027, filed Oct. 21, 1998;

"Applications of Universal Frequency Translation," Ser. No. 09/261,129, filed Mar. 3, 1999;

"Method, System, and Apparatus for Balanced Frequency Up-Conversion of a Baseband Signal," Ser. No. 09/525,615, filed March 14, 2000; and "Matched Filter Characterization and Implementation of Universal Frequency Translation Method and Apparatus," Ser. No. 09/521,878, filed March 9, 2000.

BACKGROUND OF THE INVENTION

1. Field of the Invention

The present invention is generally related to down-conversion and de-spreading of a spread spectrum signal, and applications of the same. The present invention is also related to frequency up-conversion and spreading of a baseband signal, and applications of the same.

2. Related Art

Various communication components exist for performing frequency down-conversion and frequency up-conversion of electromagnetic signals. Also, schemes exist for spreading a baseband signal, and for de-spreading a received spread spectrum signal.

SUMMARY OF THE INVENTION

The present invention is related to frequency translation of spread spectrum signals. More specifically, the present invention is related to down-converting and de-spreading a spread spectrum signal in a unified and integrated manner, and applications of the same. Additionally, the present invention is related to up-converting and spreading a baseband signal in a unified and integrated manner to generate a spread spectrum signal for transmission, and applications of the same.

During down-conversion, a received spread spectrum signal is sampled according to a control signal that carries a corresponding spreading code, resulting in a down-converted and de-spread baseband signal. In embodiments, the control signal includes a plurality of pulses having apertures (or pulse widths) that are established to improve energy transfer to the down-converted baseband signal. In embodiments, the frequency (or aliasing rate) of the control signal can be a harmonic or sub-harmonic of the received spread spectrum signal. In alternate embodiments, the aliasing rate of the control signal is offset from a harmonic or sub-harmonic of the received spread spectrum signal. Applications of the invention include IQ receivers, rake receivers, and early/late receivers that incorporate the down-conversion and de-spreading technique described herein.

During up-conversion, a baseband signal is sampled according to a control signal that carries a corresponding spreading code, resulting in a harmonically rich signal. The harmonically rich signal contains harmonic images that repeat at harmonics of the sampling frequency. Each harmonic image is a spread spectrum signal and contains the necessary amplitude, frequency, and phase information to reconstruct the baseband signal. A desired harmonic can be selected for transmission using filtering techniques. In embodiments, the control signal includes a plurality of pulses having apertures (or pulse widths) that operate to improve transfer energy to a desired harmonic image. Applications of the invention include IQ transmitters, and configurations that limit unwanted spectral growth in the resulting spread spectrum signal.

An advantage of the present invention is that down-conversion and de-spreading of a received spread spectrum signal is performed in a unified and integrated manner. Likewise, in the up-conversion embodiment, up-conversion and spreading are performed in a unified and integrated manner. This occurs because the control signal that controls the sampling process during down-conversion and up-conversion carries the spreading code. Additionally, in embodiments, the present invention incorporates matched filters concepts during the sampling process to improve energy transfer during frequency translation and spreading/de-spreading.

Further features and advantages of the invention, as well as the structure and operation of various embodiments of the invention, are described in detail below with reference to the accompanying drawings. The drawing in which an element first appears is typically indicated by the leftmost character(s) and/or digit(s) in the corresponding reference number.

BRIEF DESCRIPTION OF THE FIGURES

The present invention will be described with reference to the accompanying drawings, wherein:

FIG. 18 is a table of example values at nodes in the UDF module of FIG. 17;

FIGS. 26A-26E illustrate example signal diagrams associated with UDD modules in FIGS. 25A-25G according to embodiments of the present invention;

FIGS. 48-60Z illustrate various example test results from testing the modulator 3710 in the test set 4700;

Figure 64A:
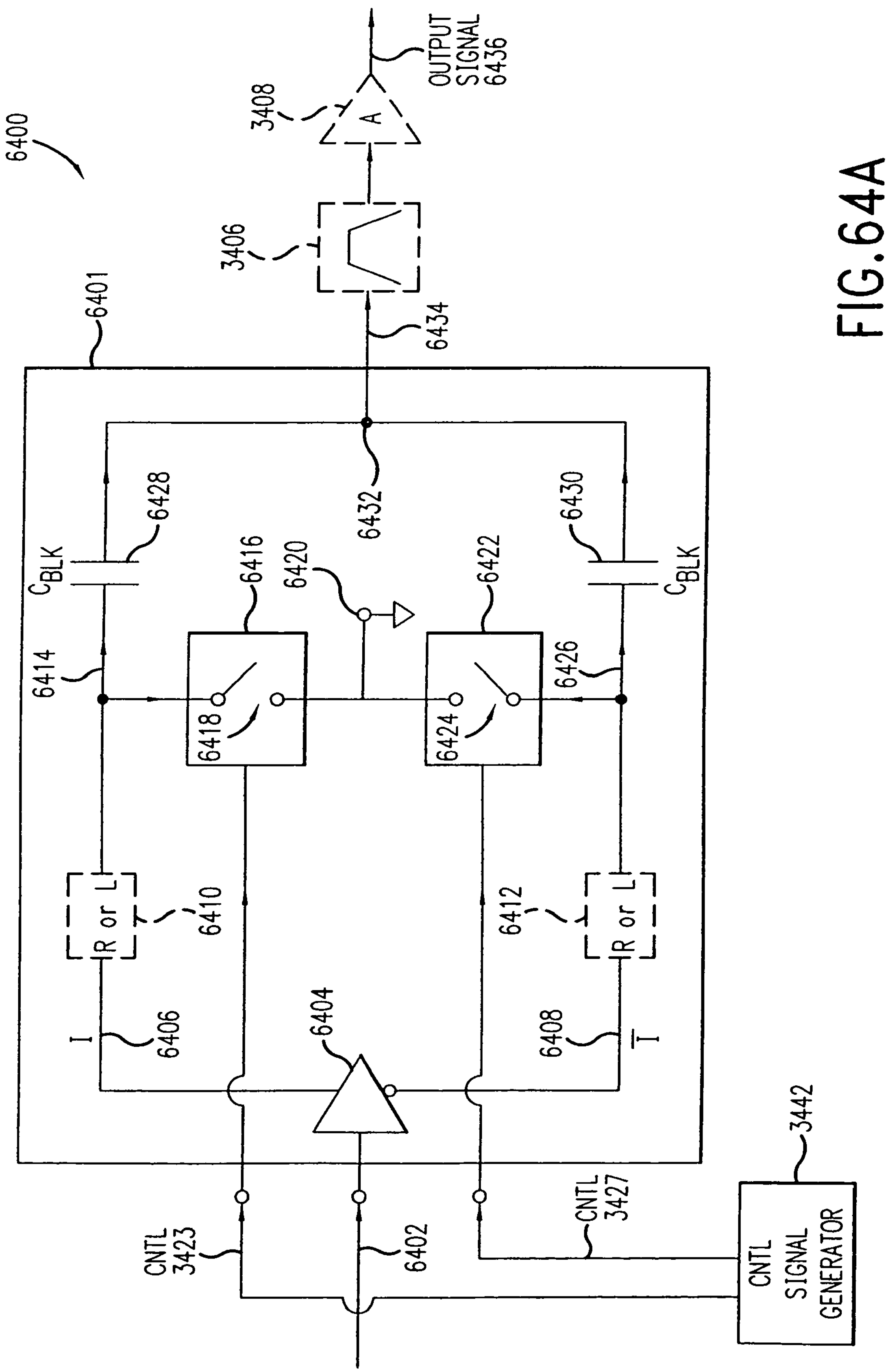
Figure 64B:
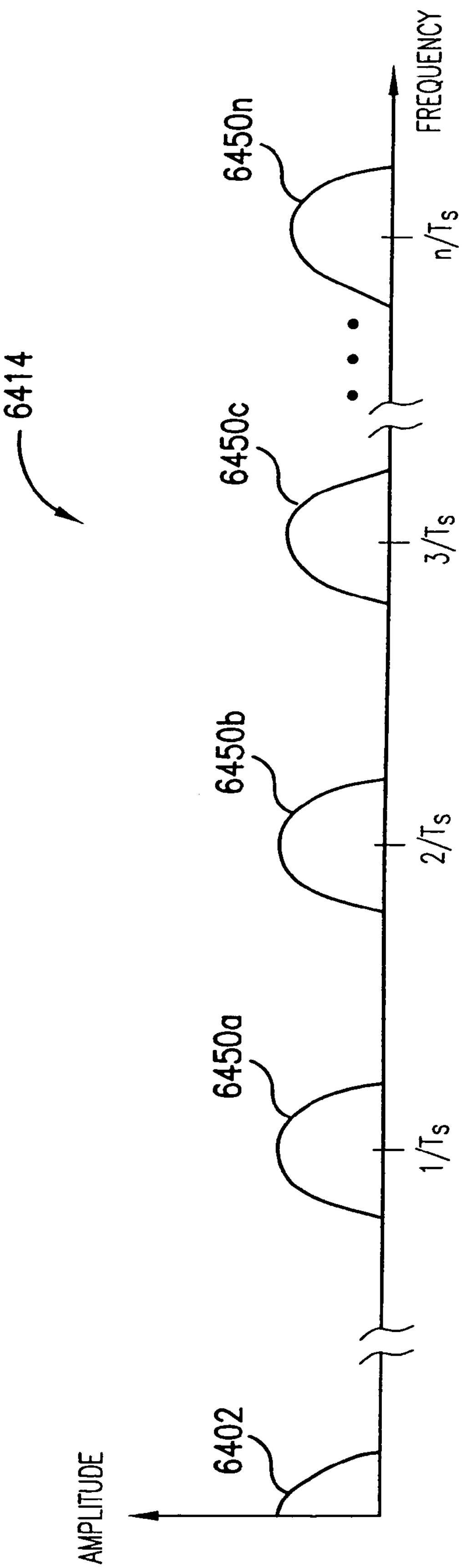
Figure 64C:
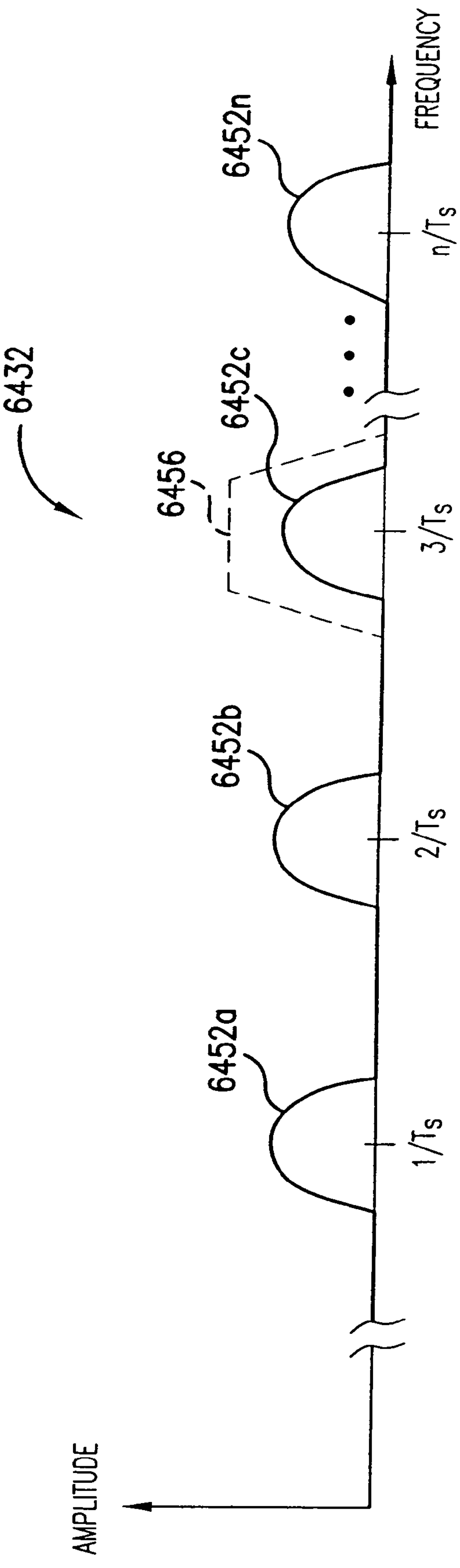
Figure 64D:
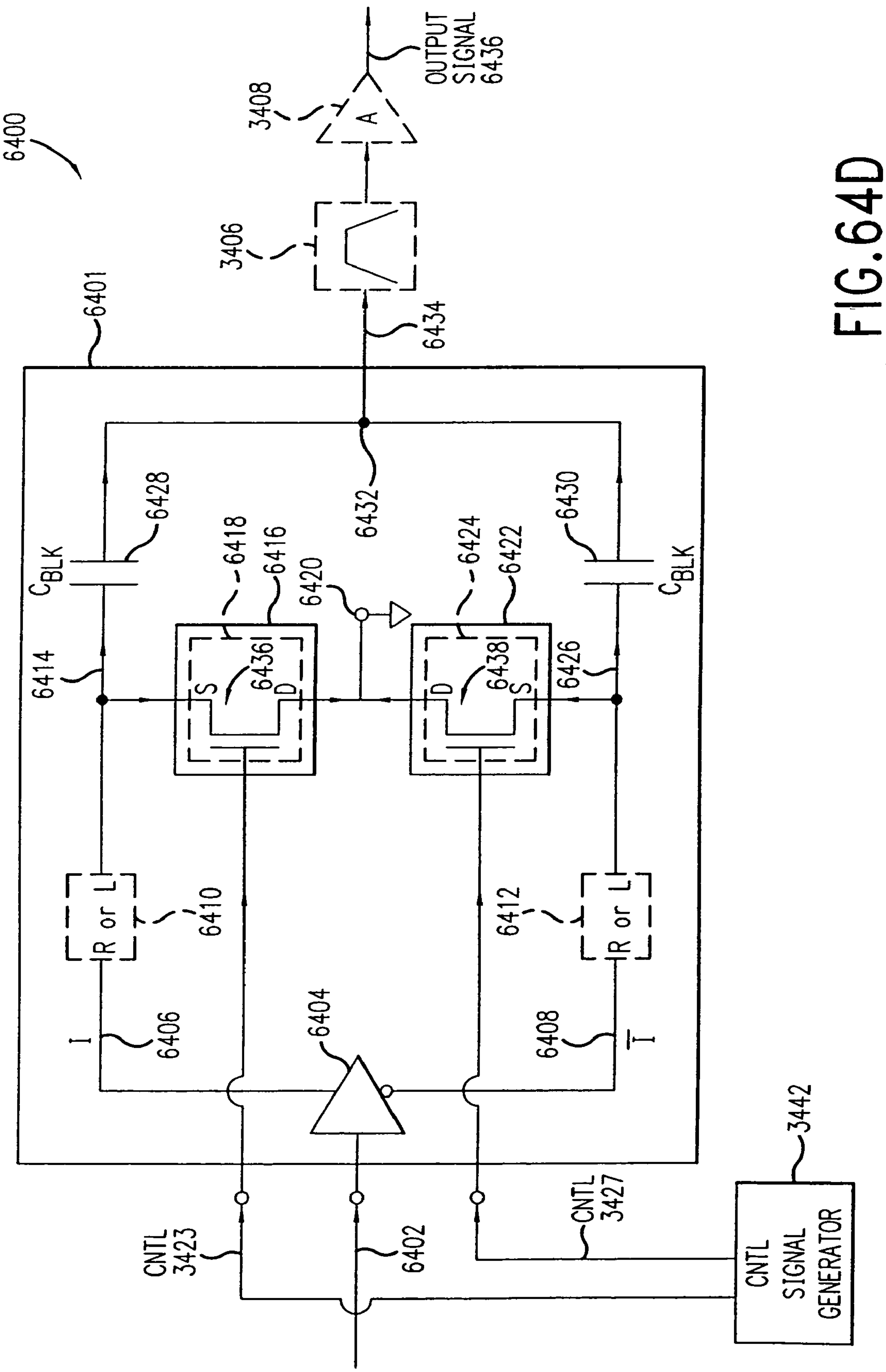
Figure 65:
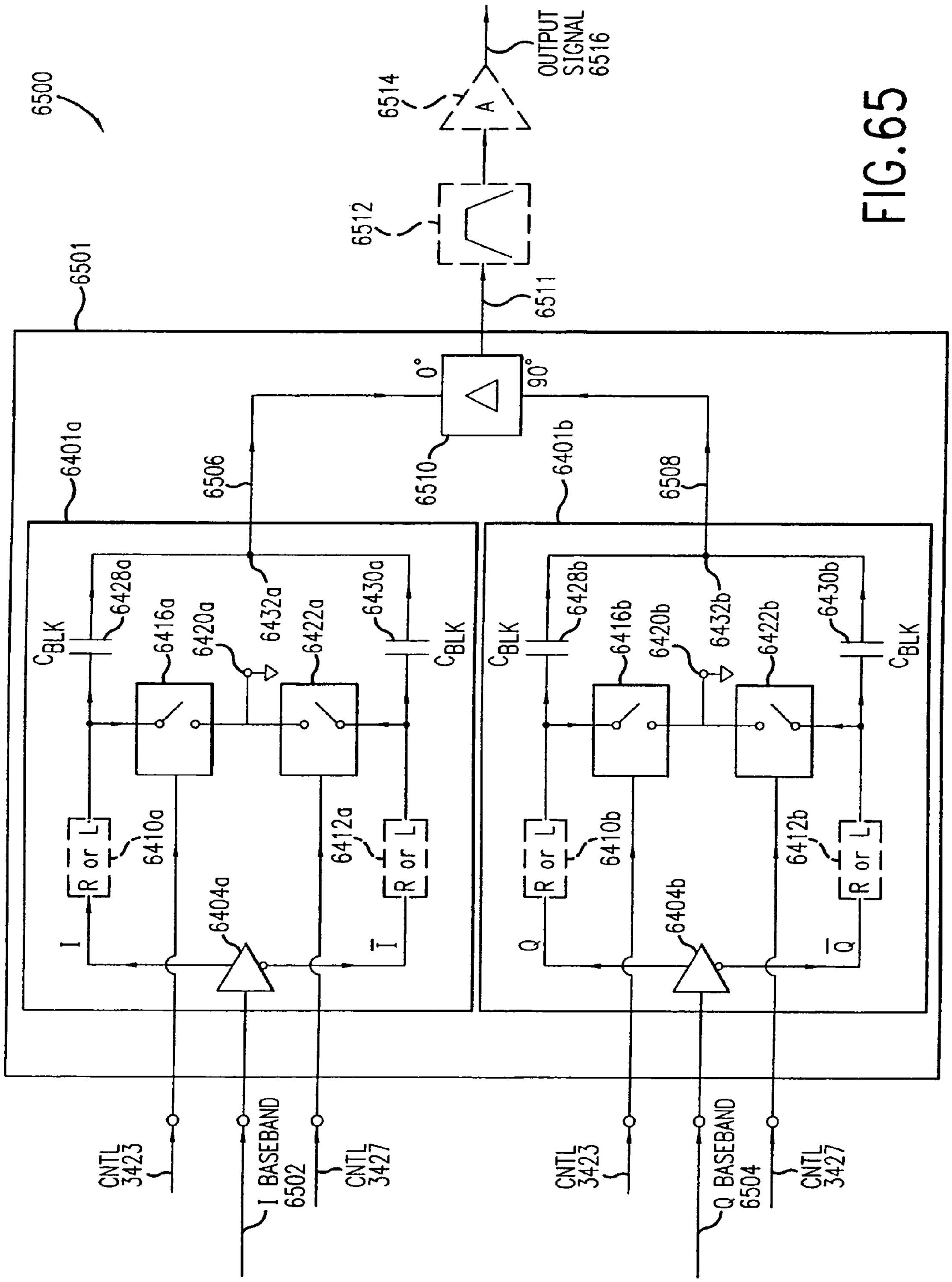
Figure 66A:
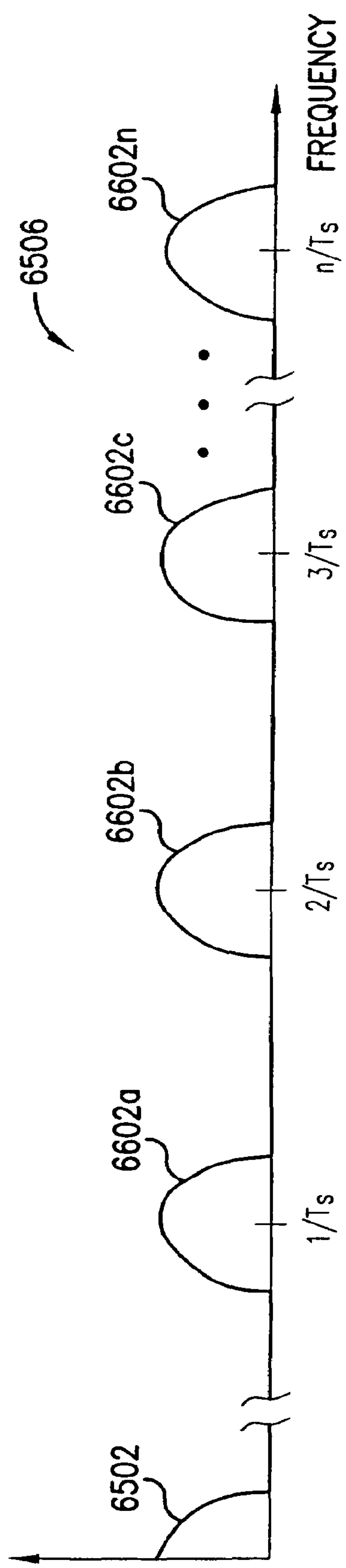
Figure 66B:
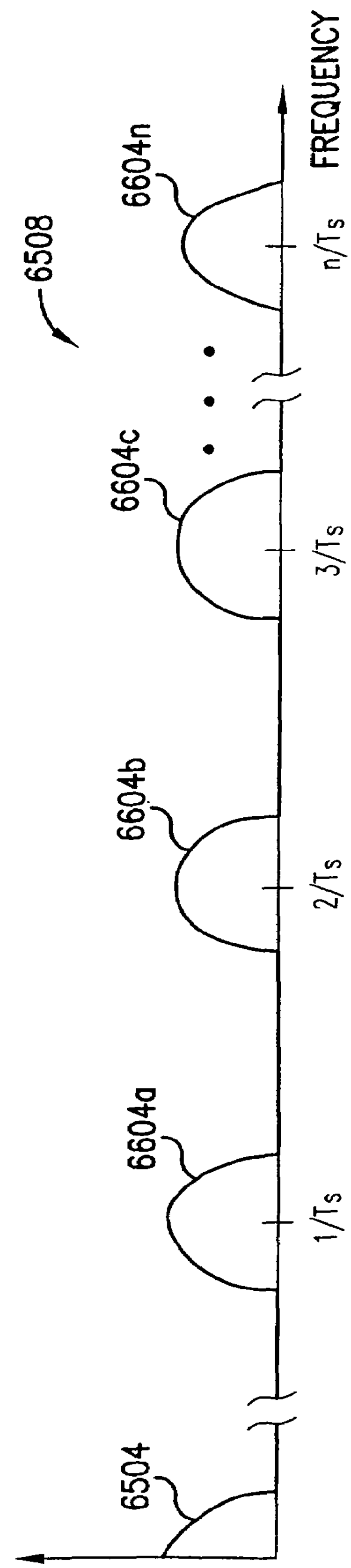
Figure 66C:
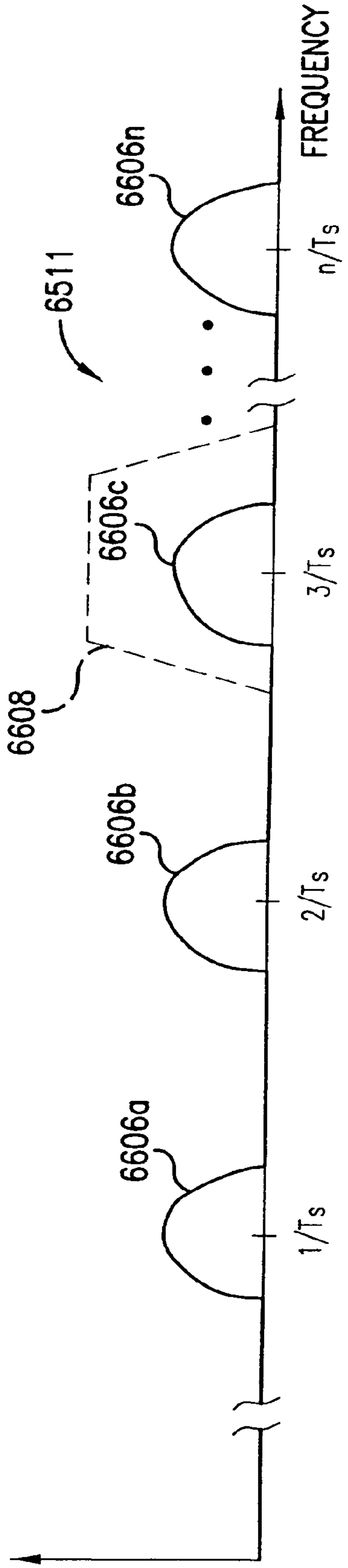
Figure 67:
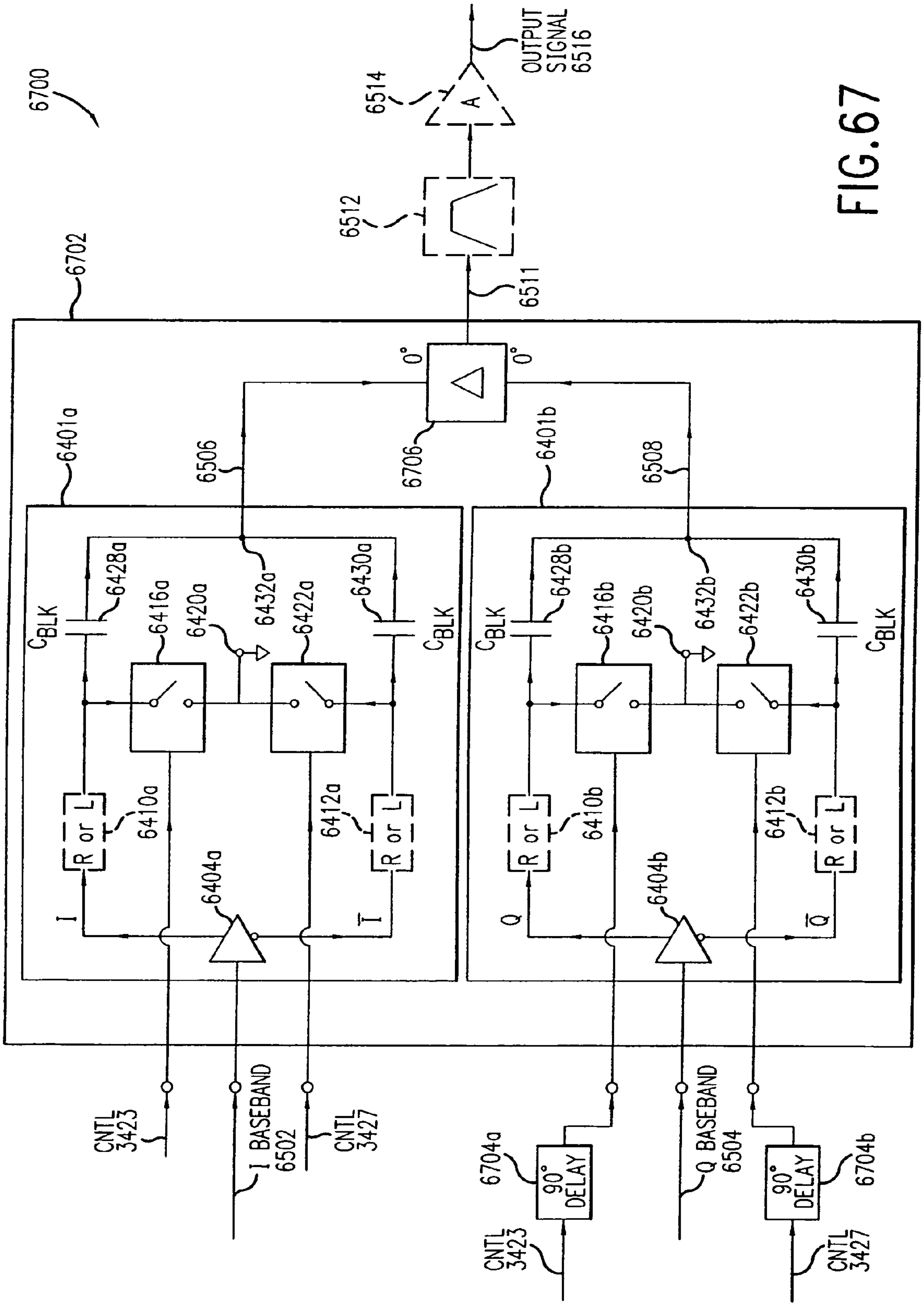
Figure 68:
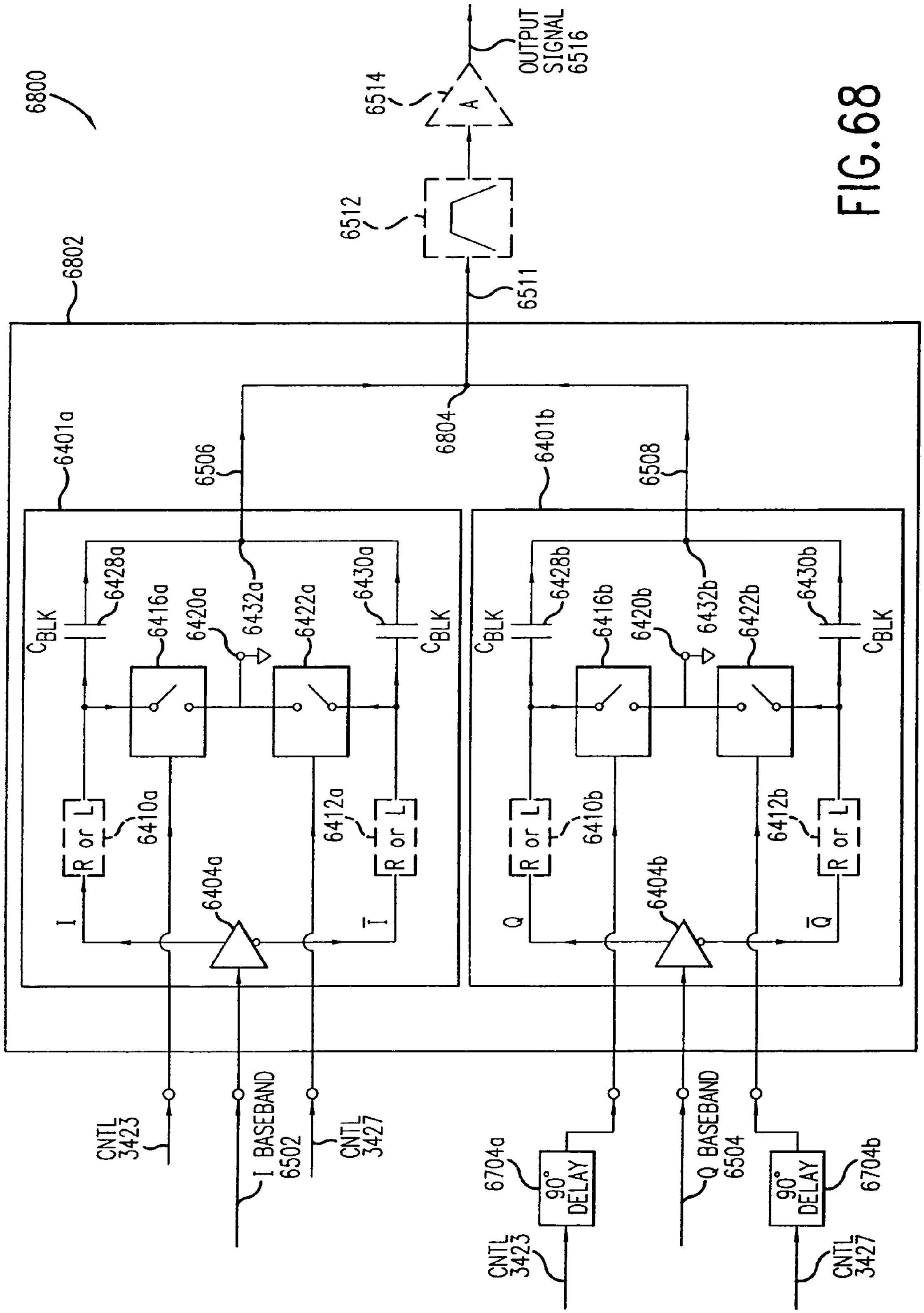
Figure 69:
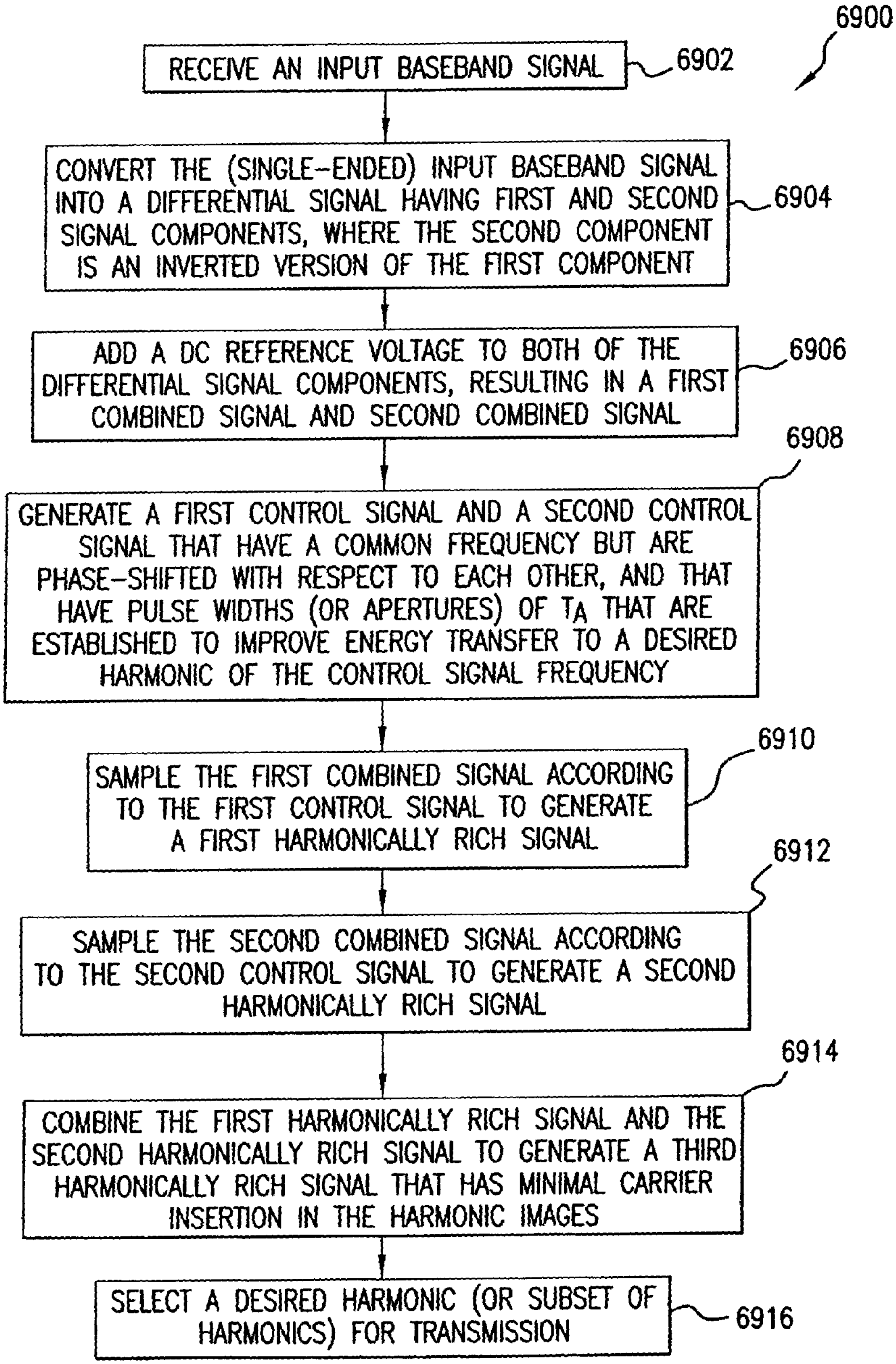
Figure 70:
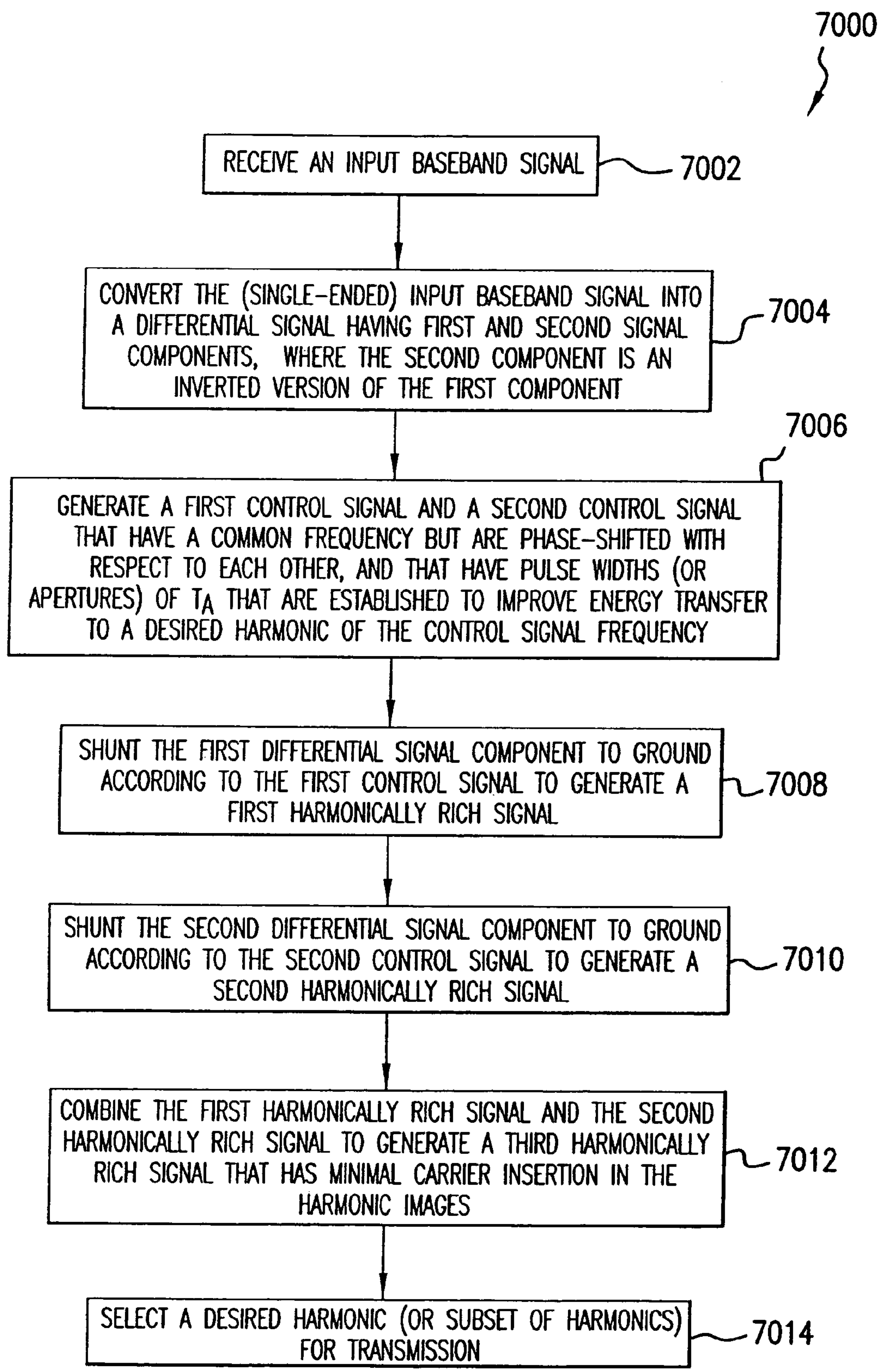
Figure 71A:
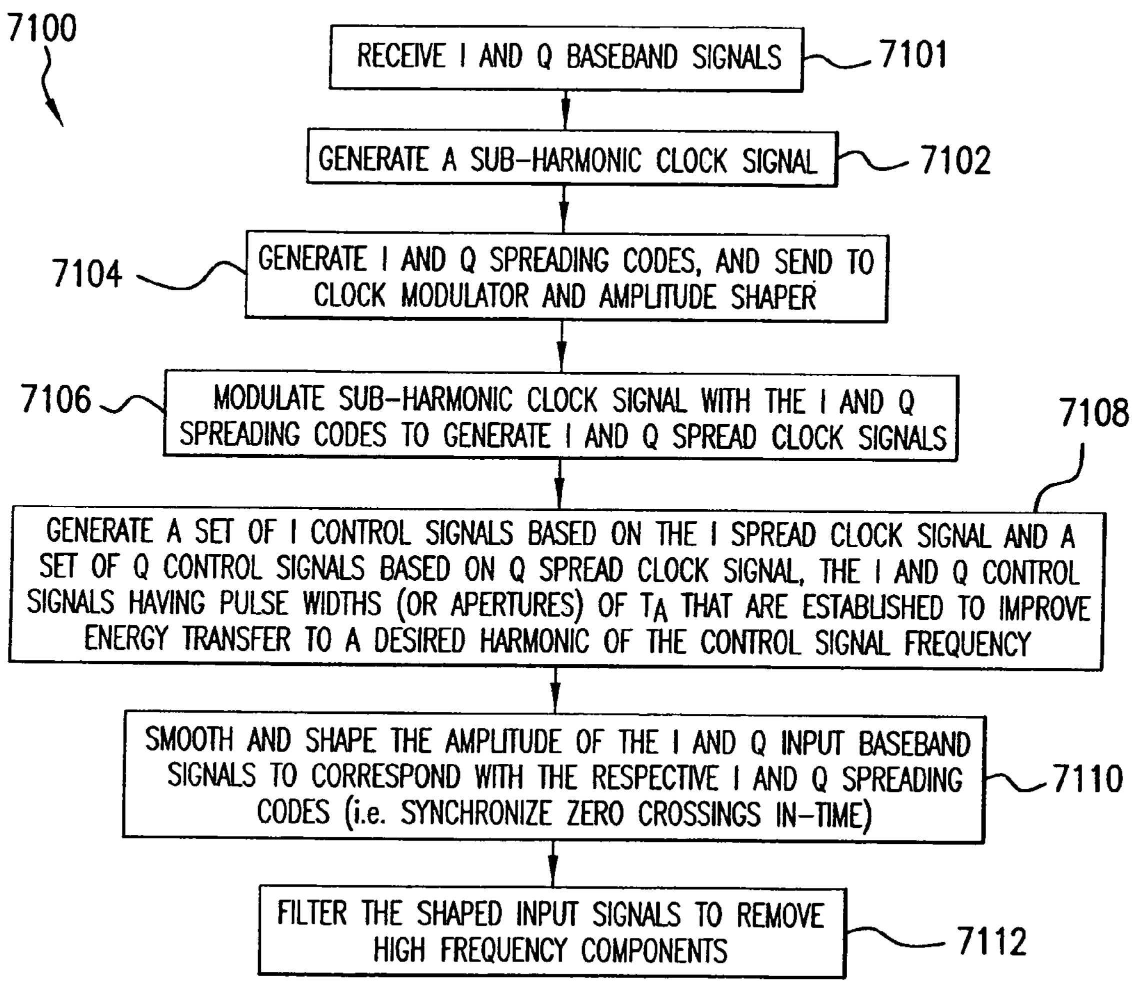
Figure 71B:
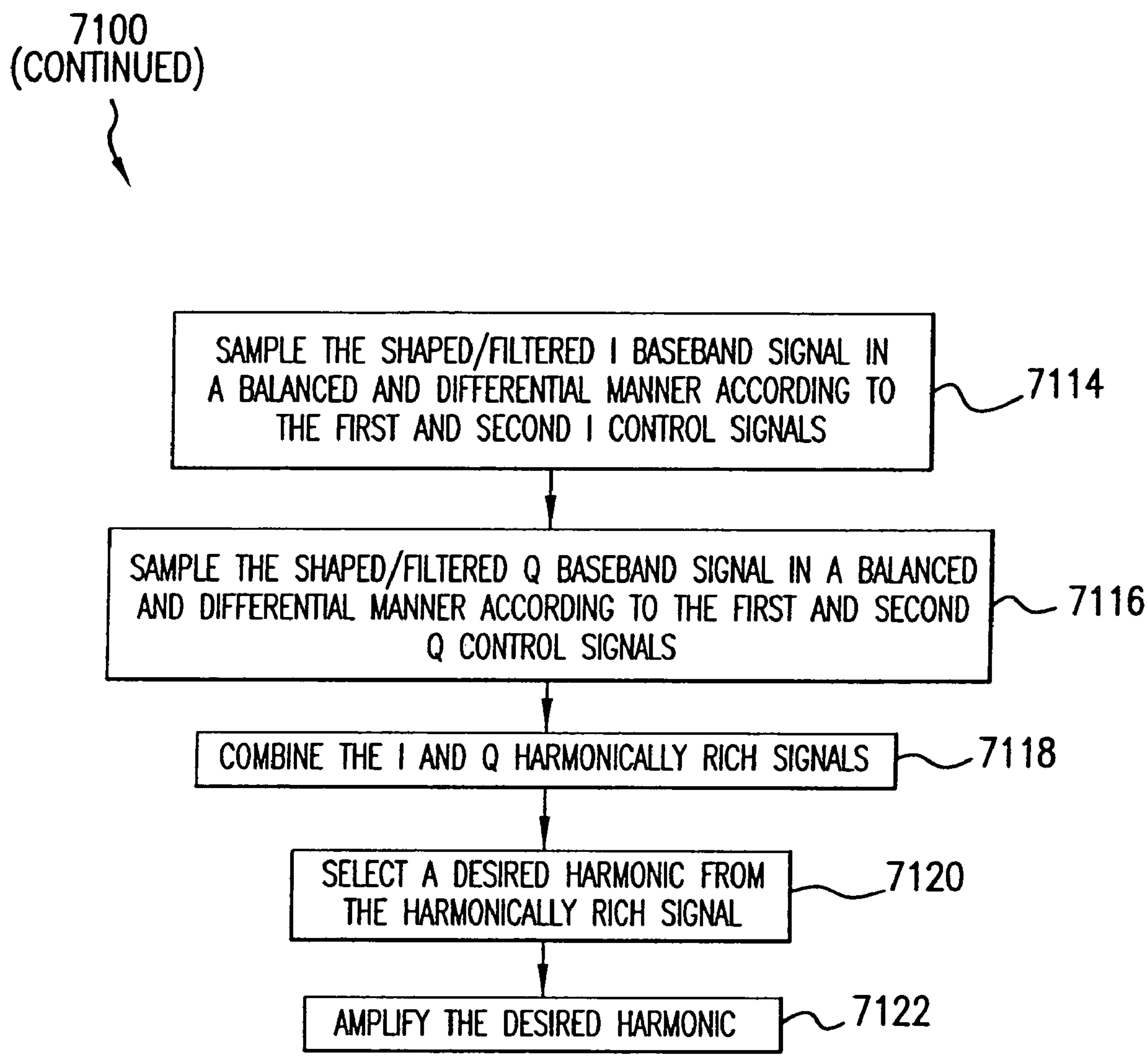
Figure 72A:
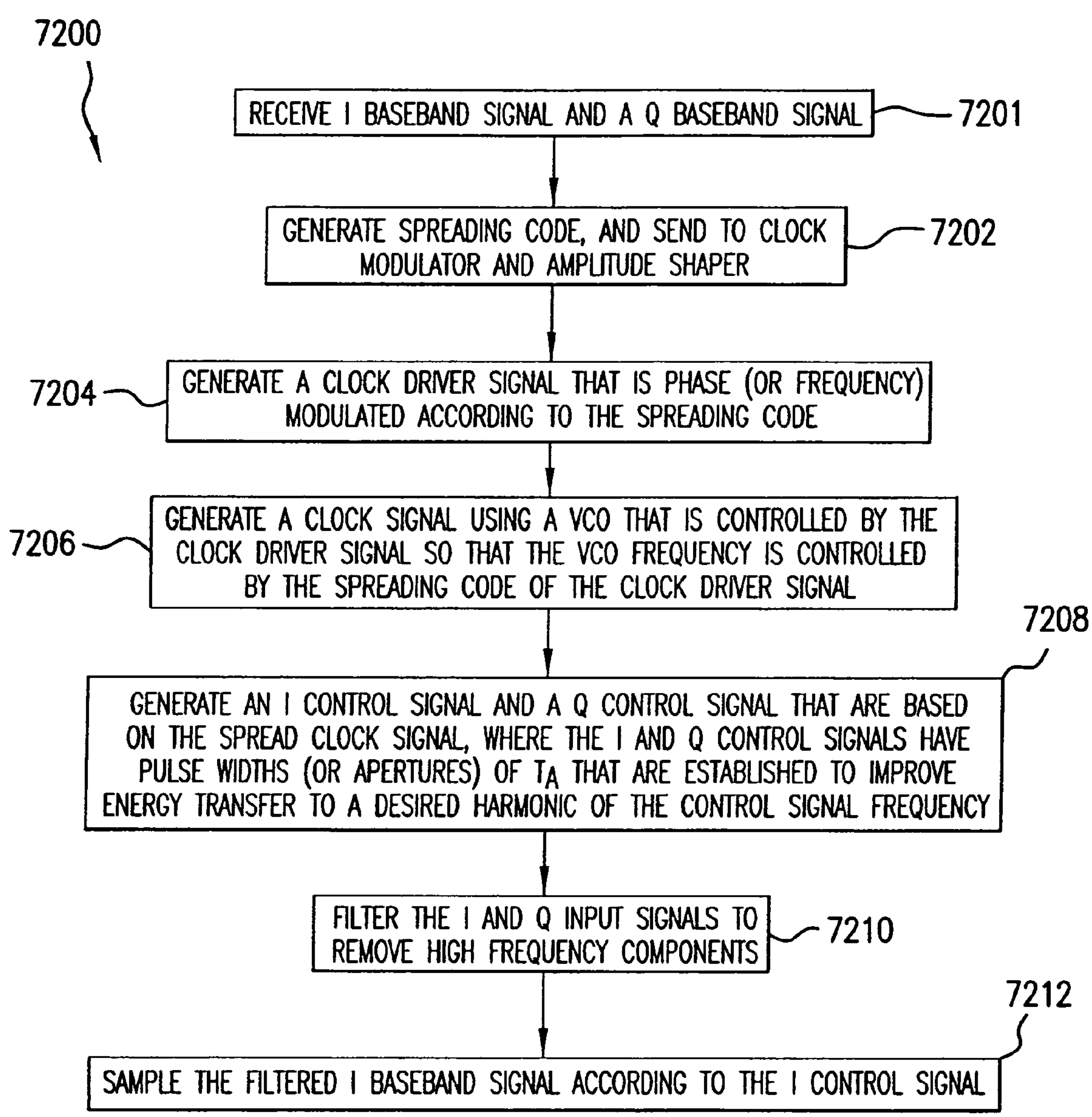
Figure 72B:
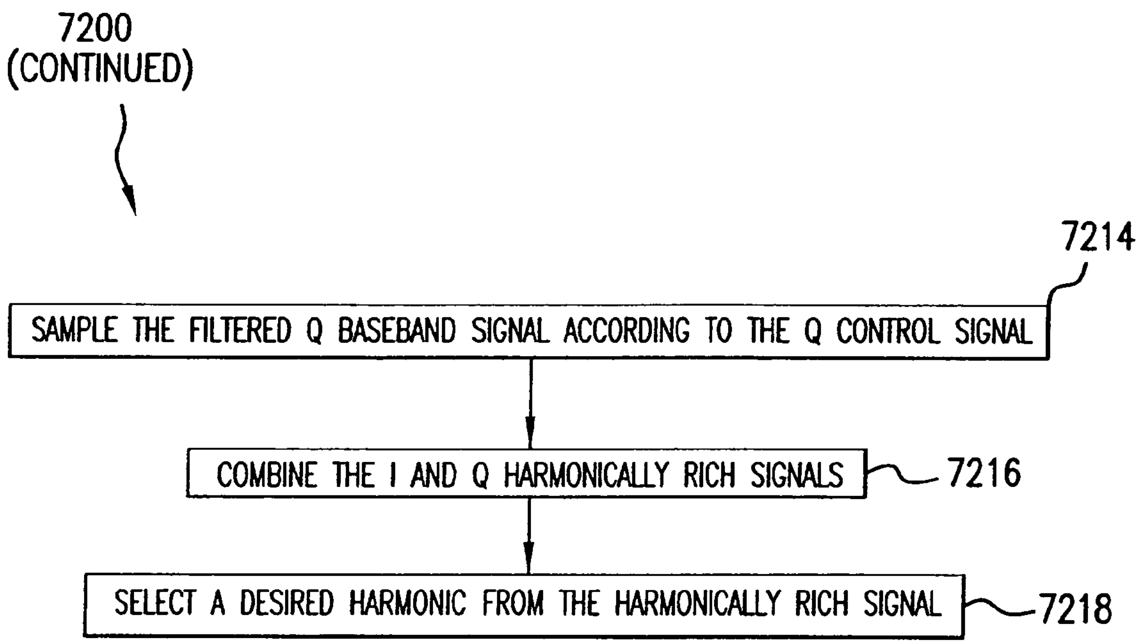
Figure 73A:
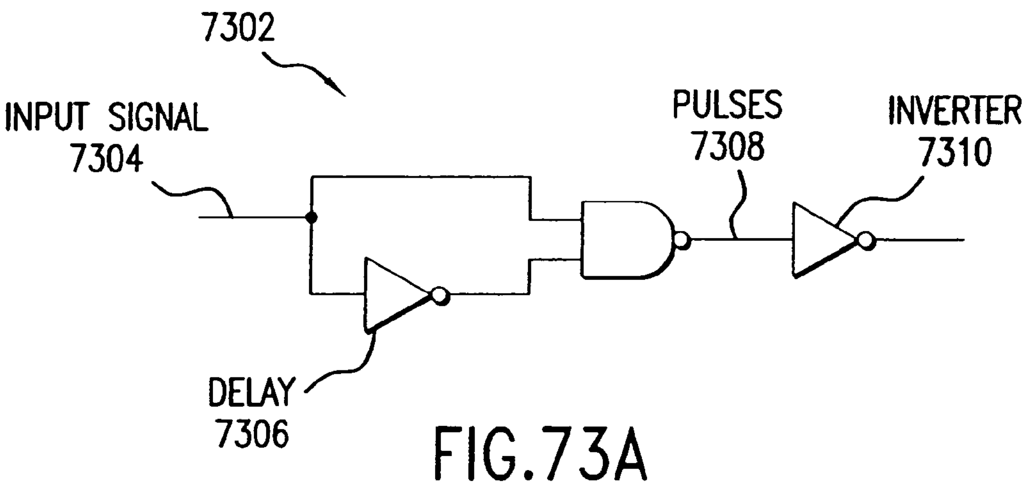
Figure 73B:
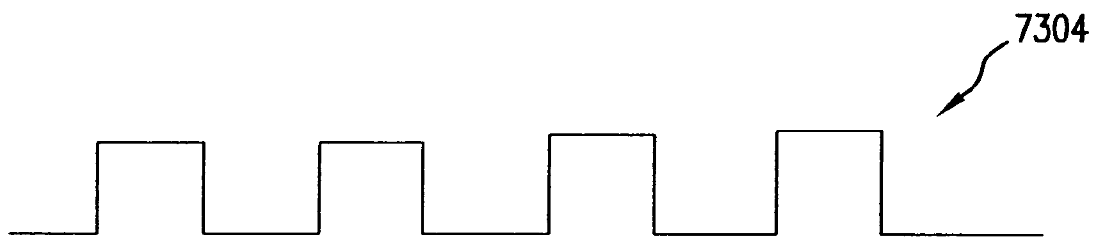
Figure 73C:
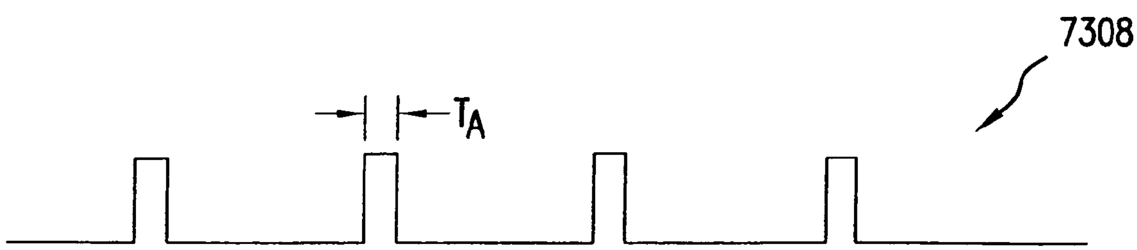
Figure 73D:
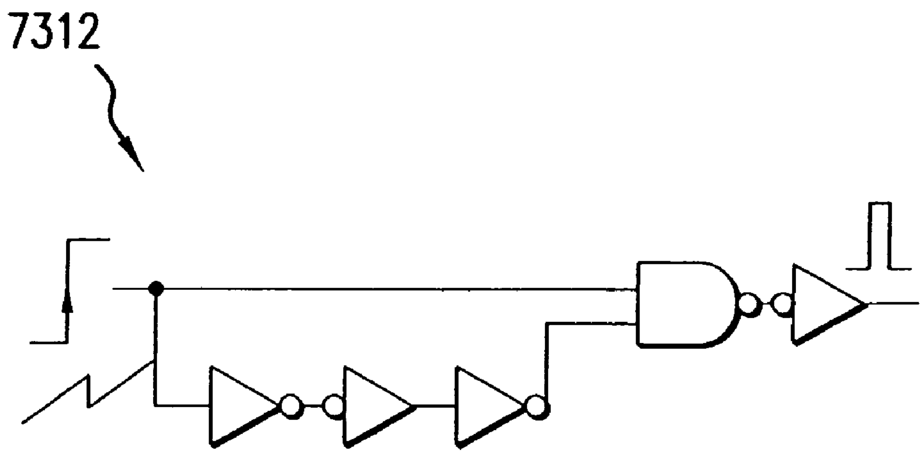
Figure 73E:
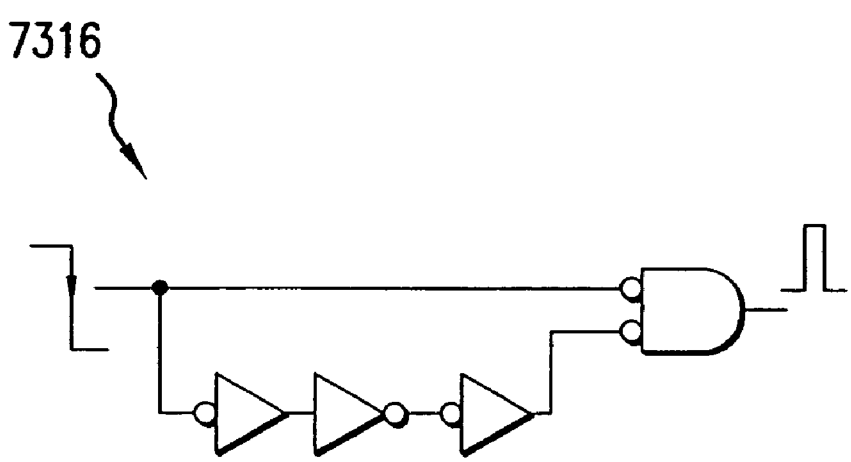
Figure 74A:
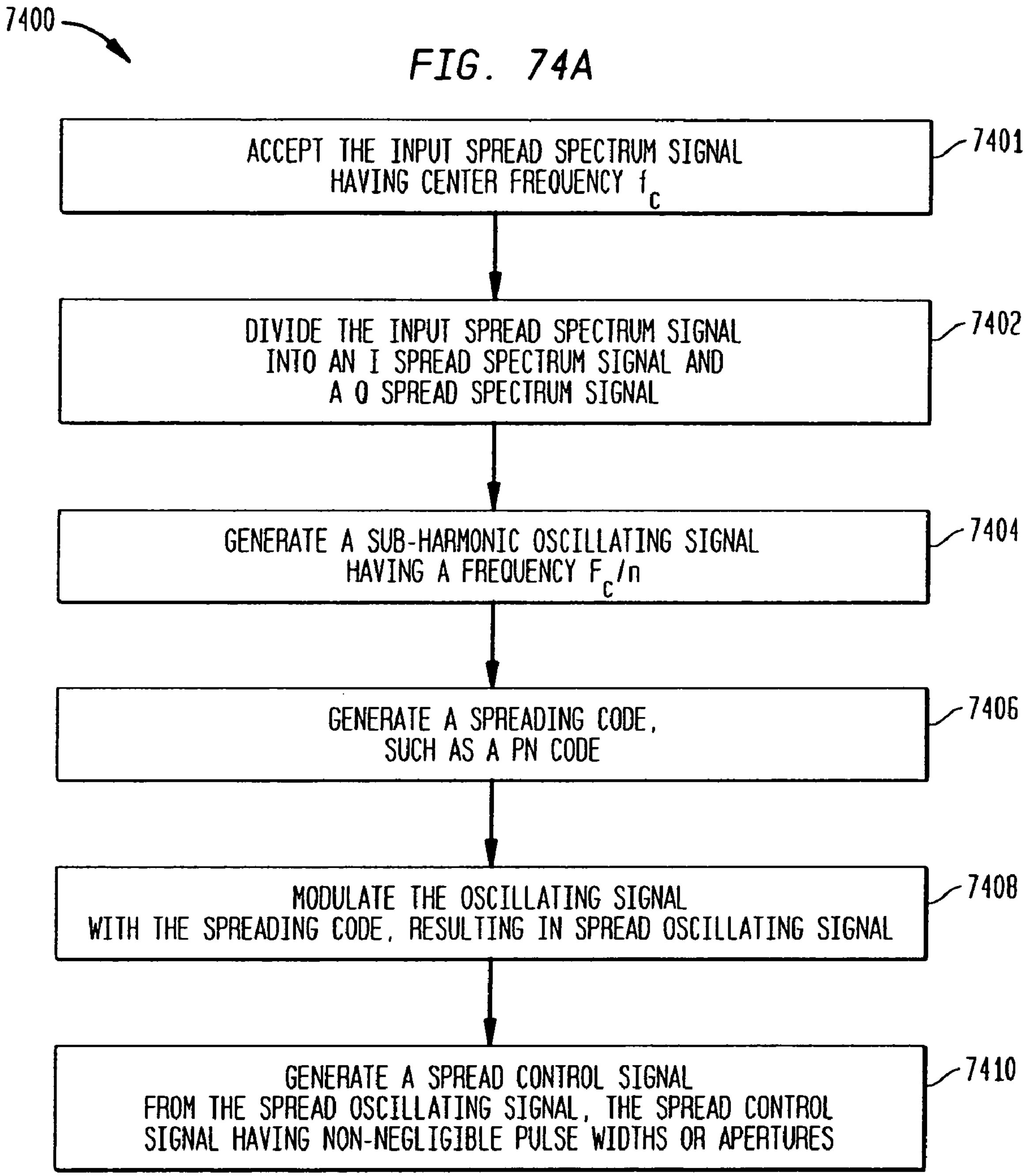
Figure 74B:
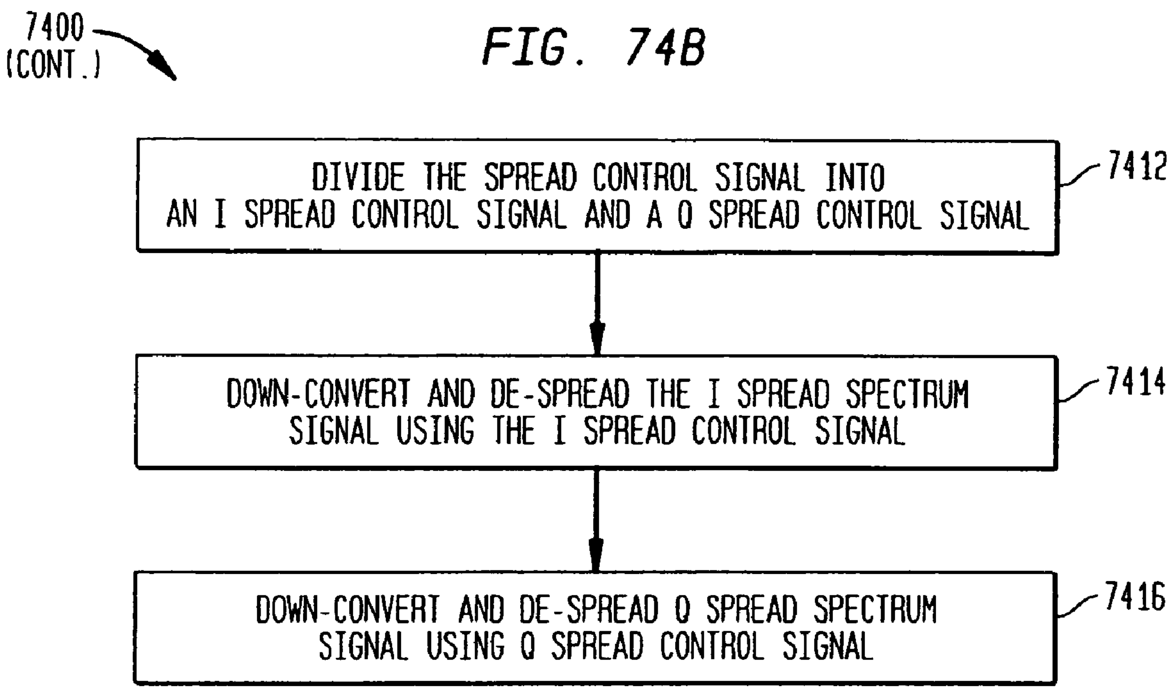
Figure 75:
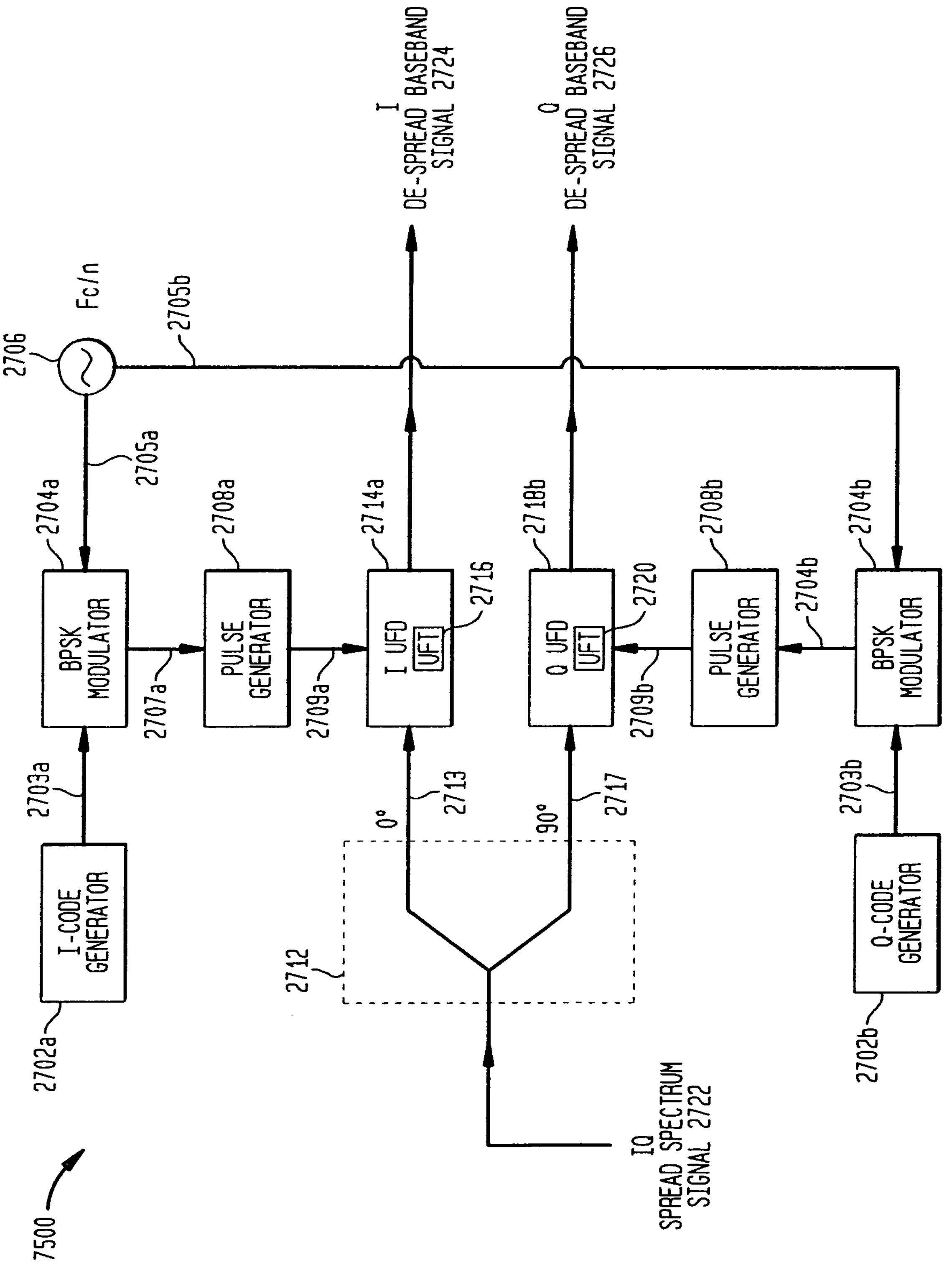
Figure 76:
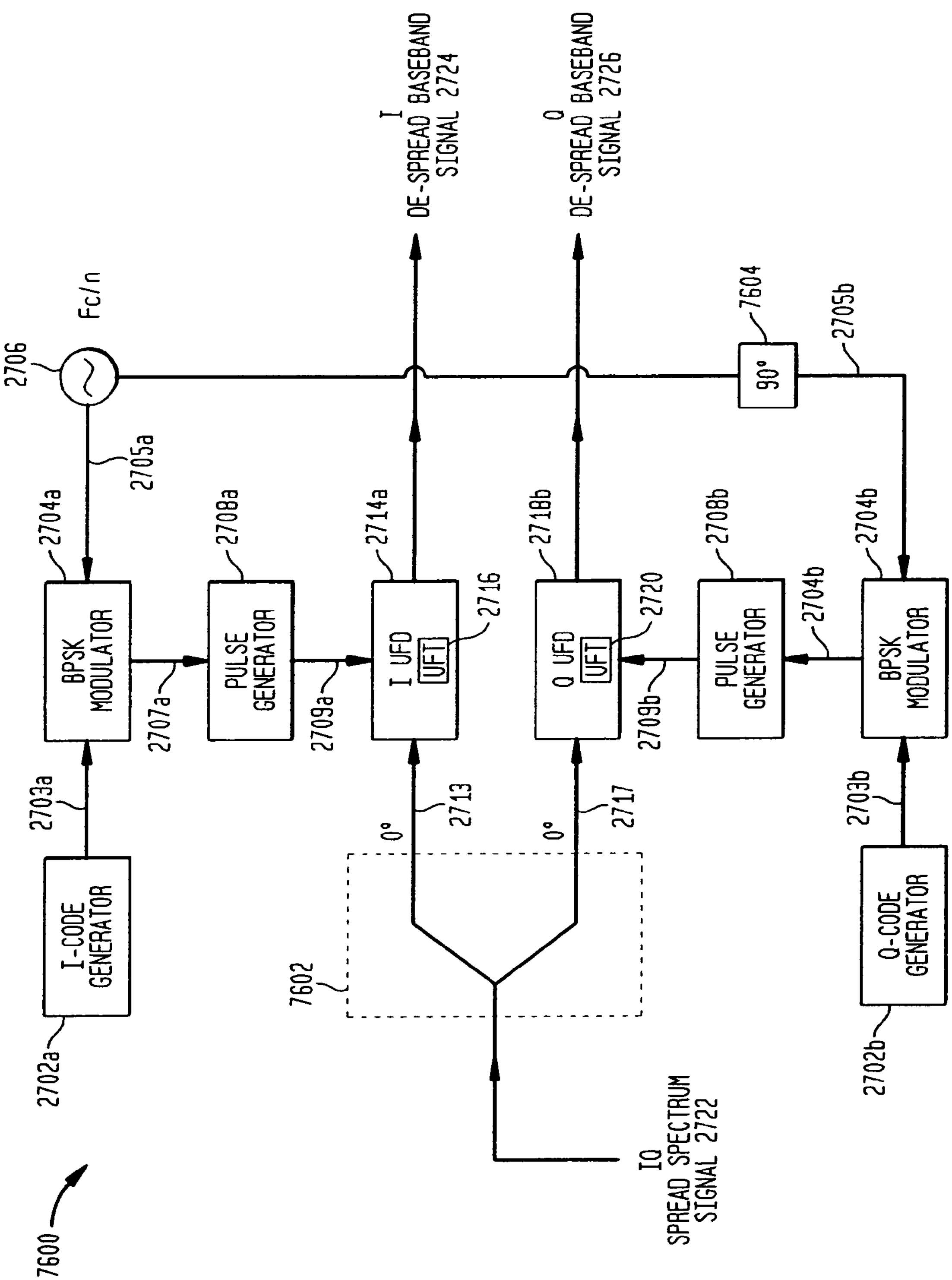
Figure 77:
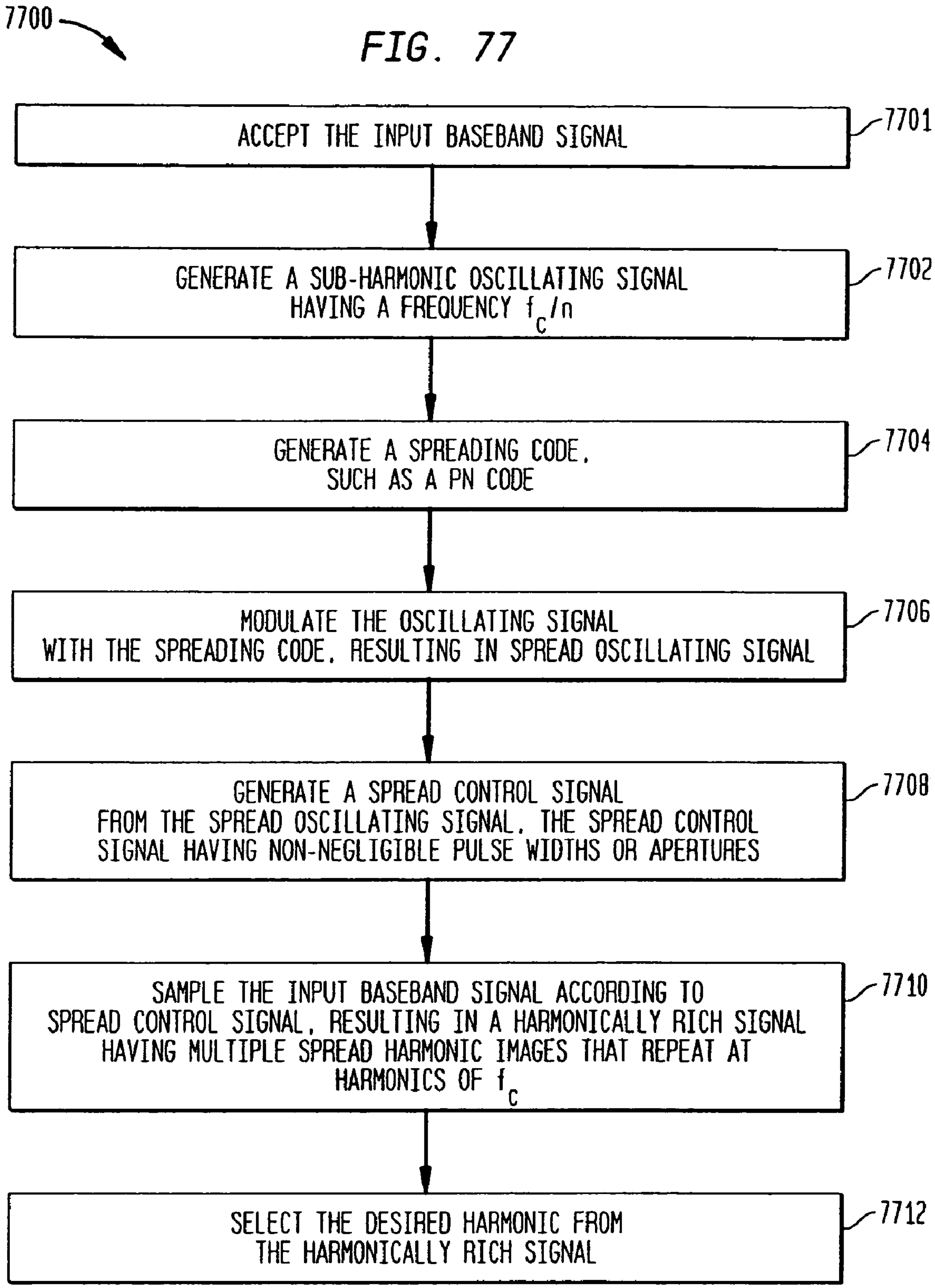
Figure 78A:
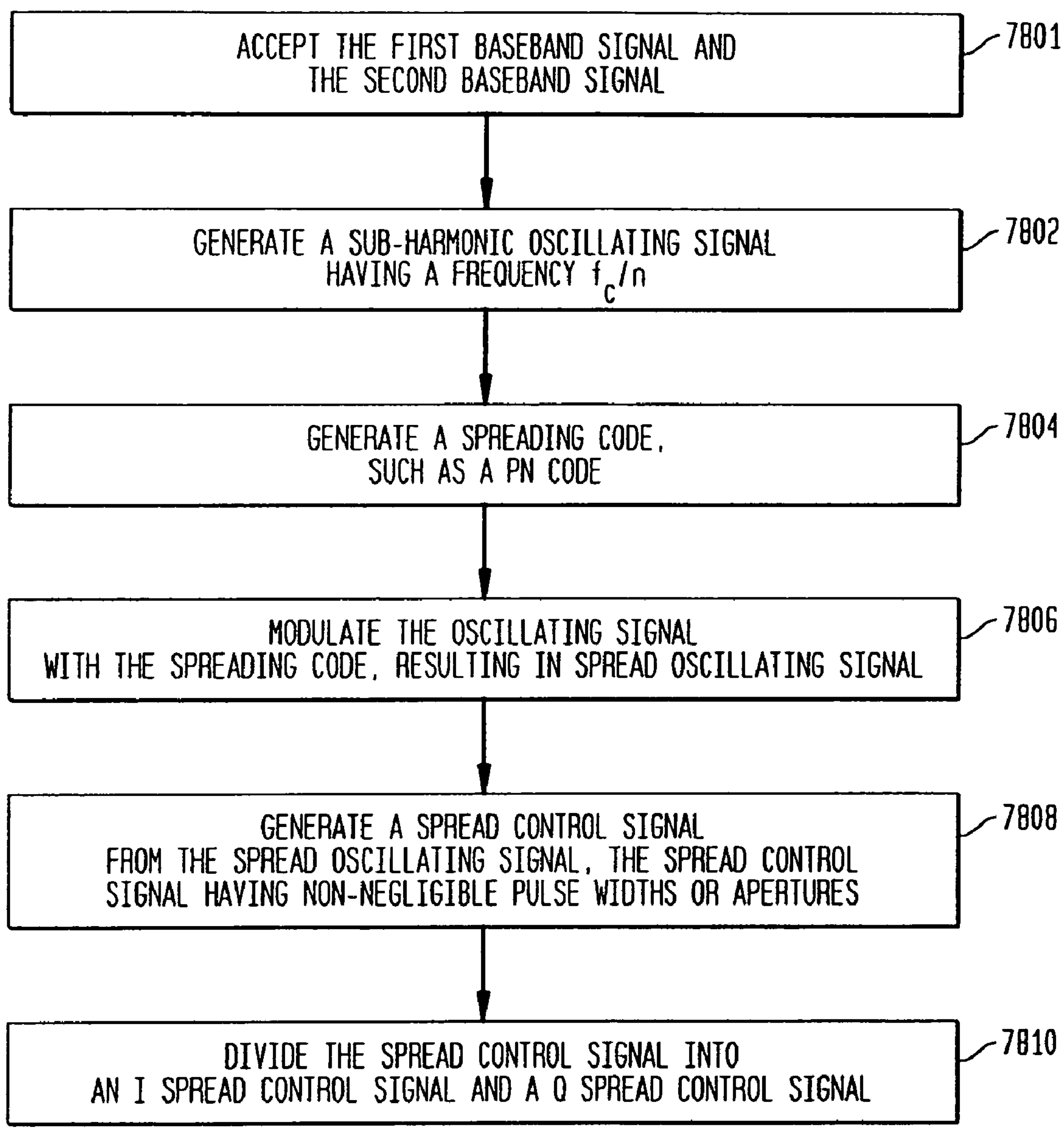
Figure 78B:
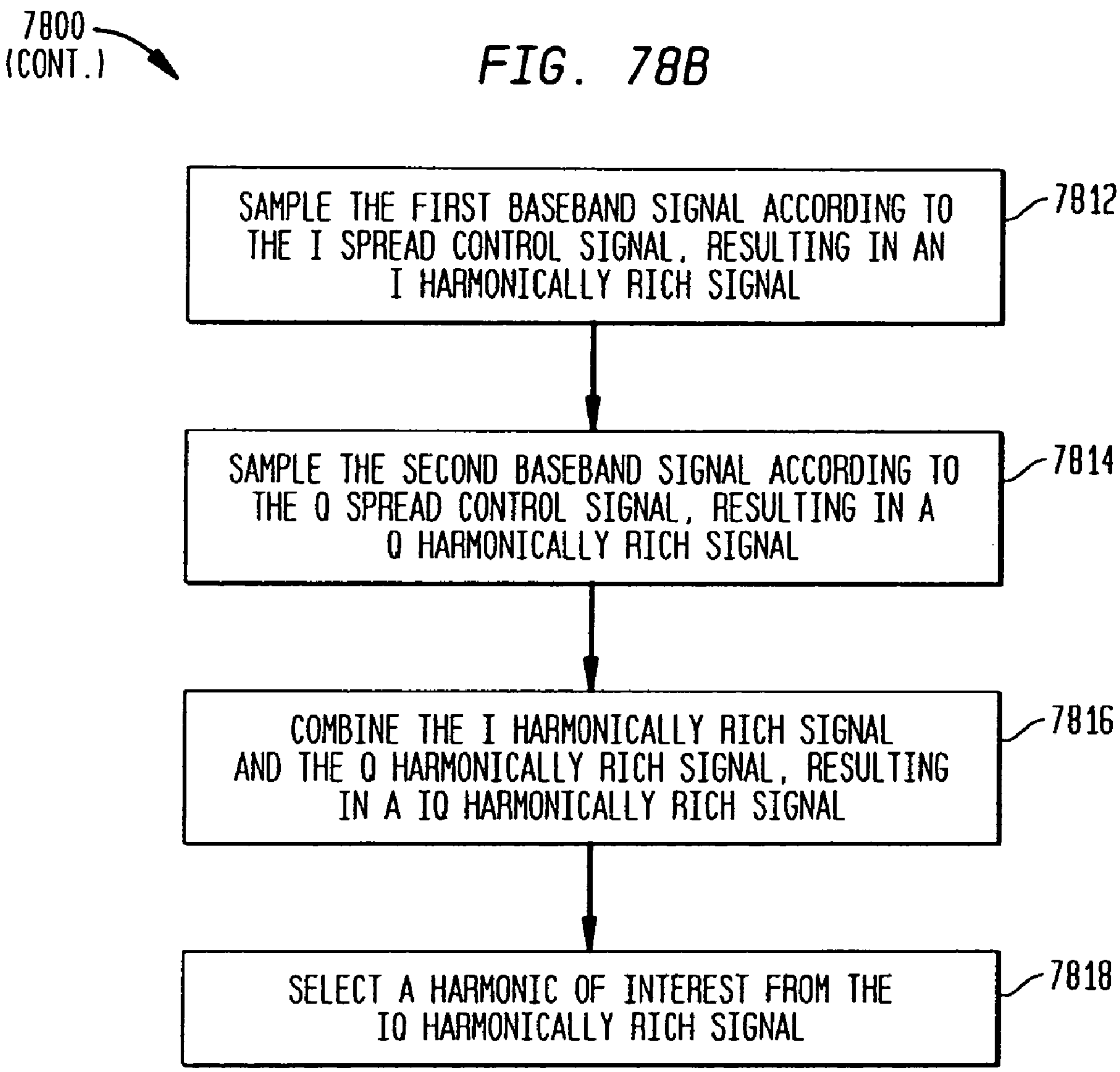
Figure 79:
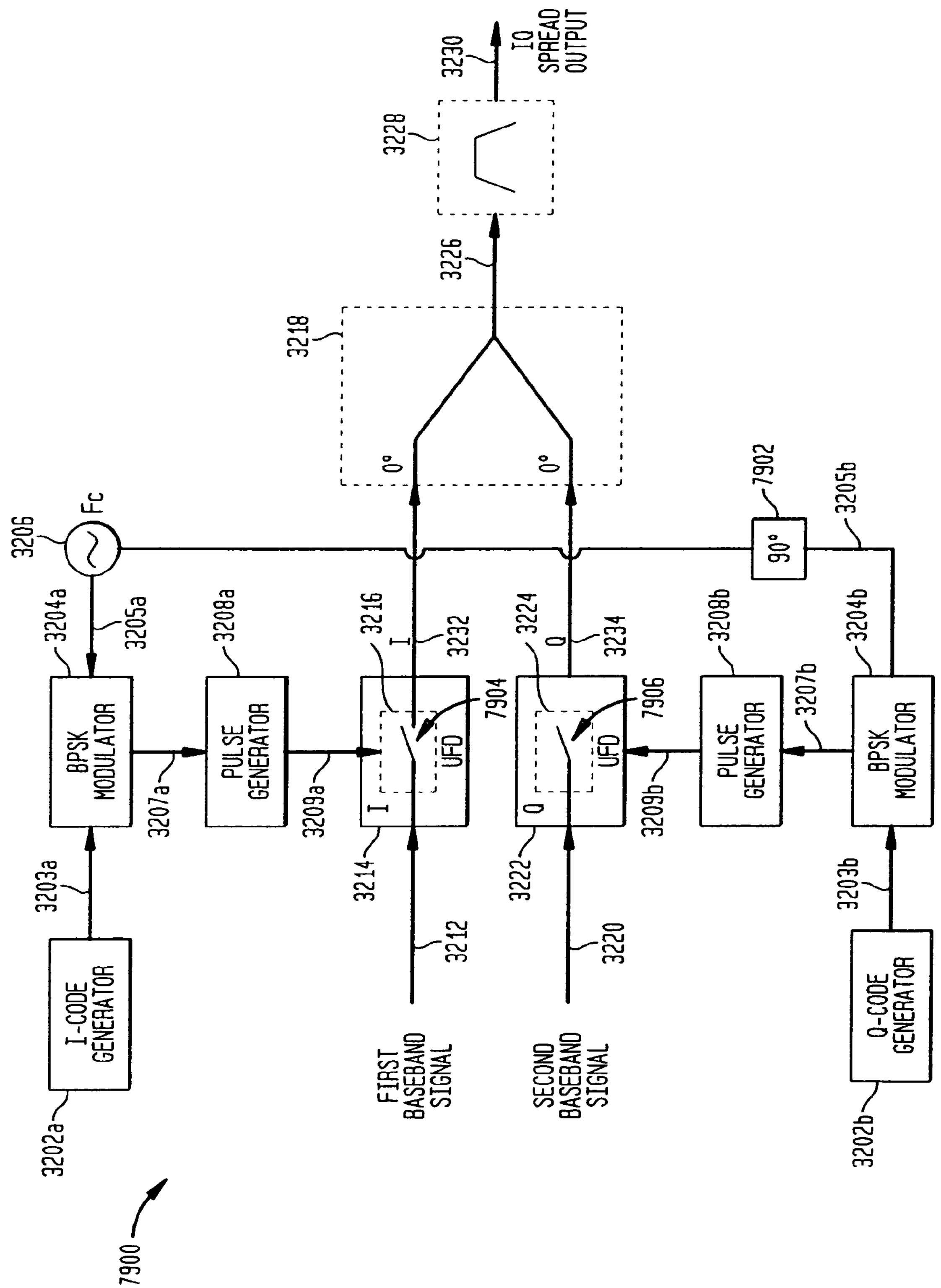
Figure 80:
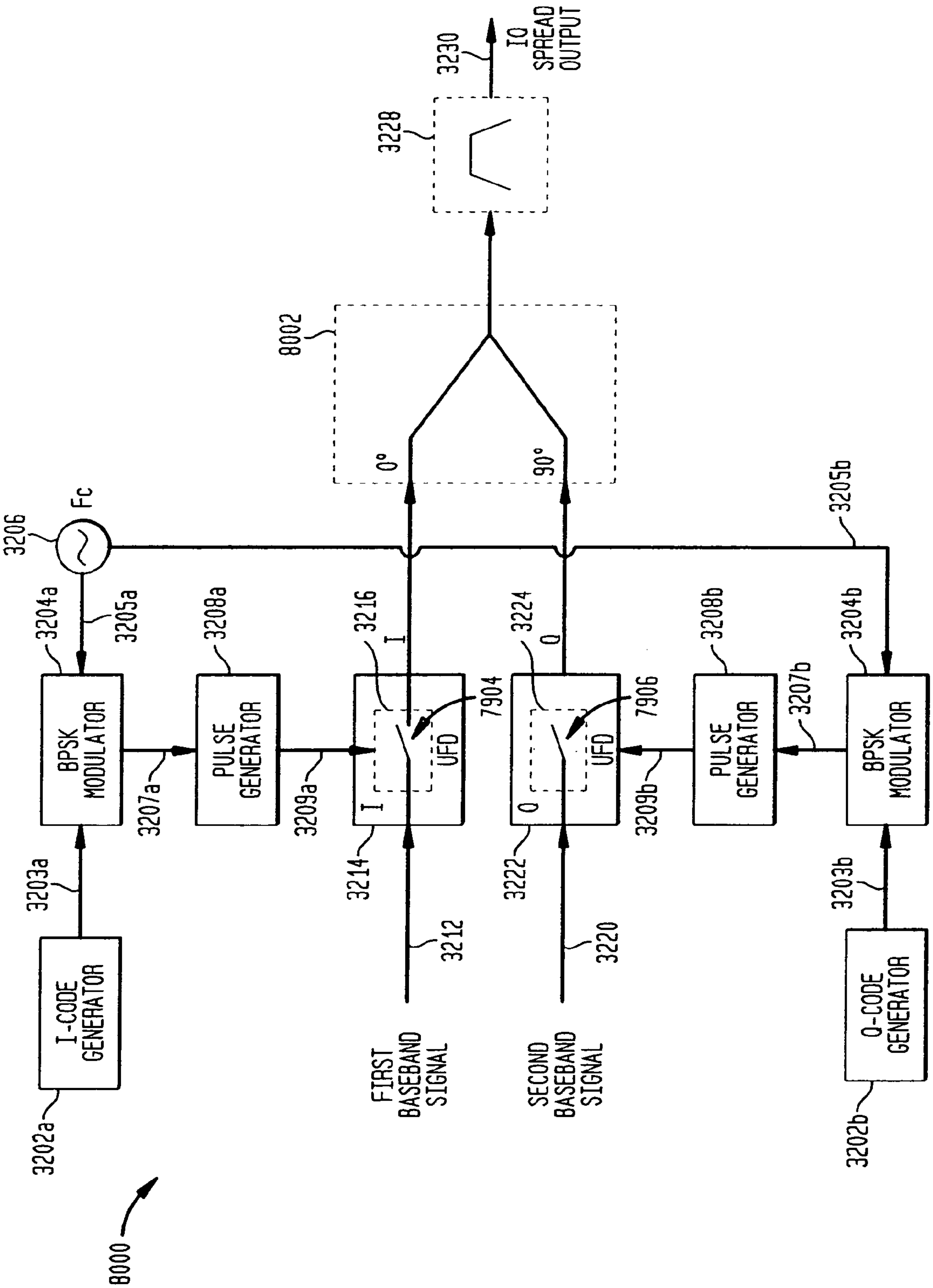
Figure 83:
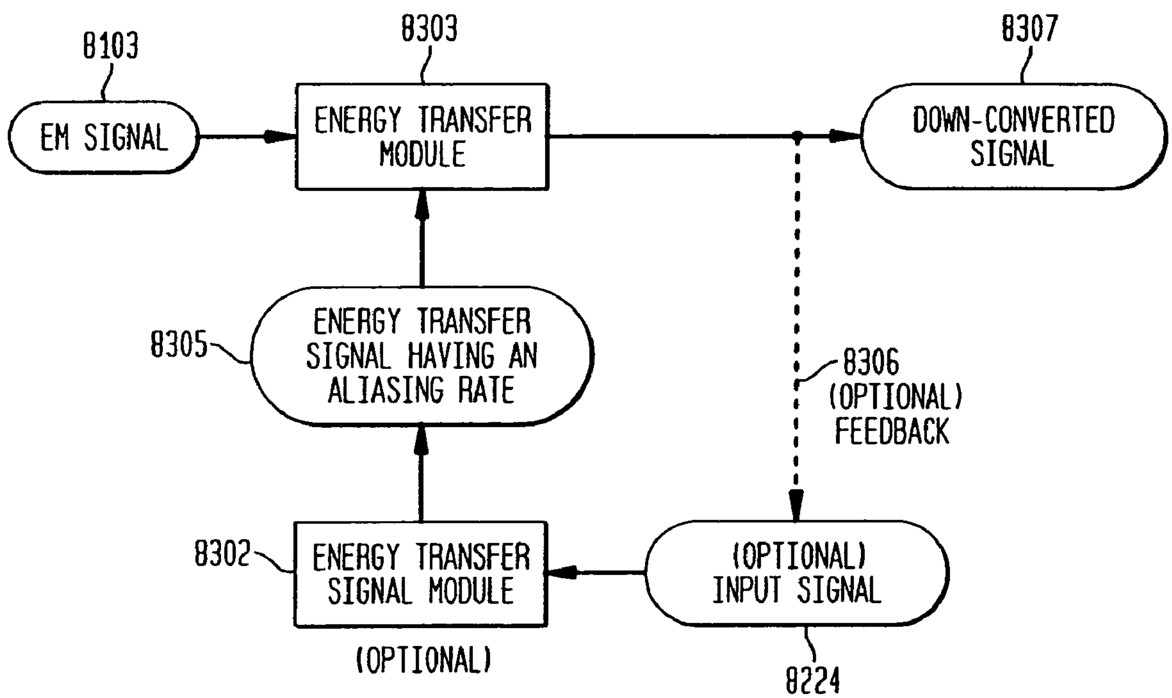
Figure 84:
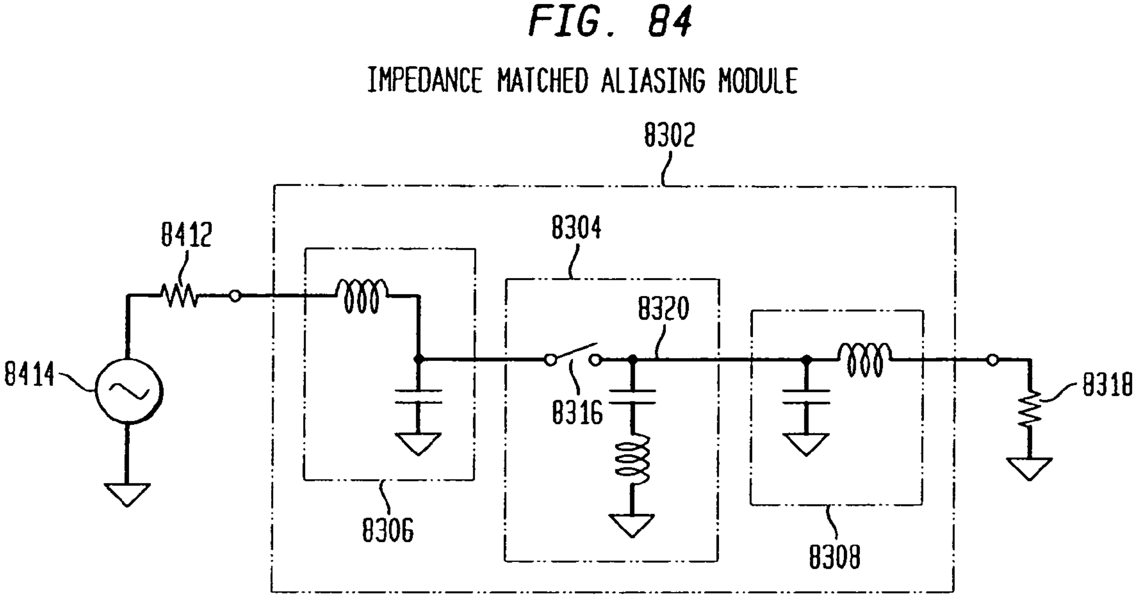
Figure 85A:
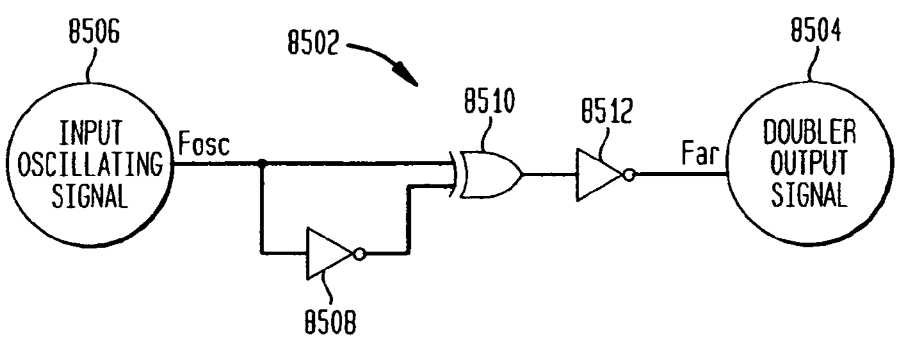
Figure 85B:
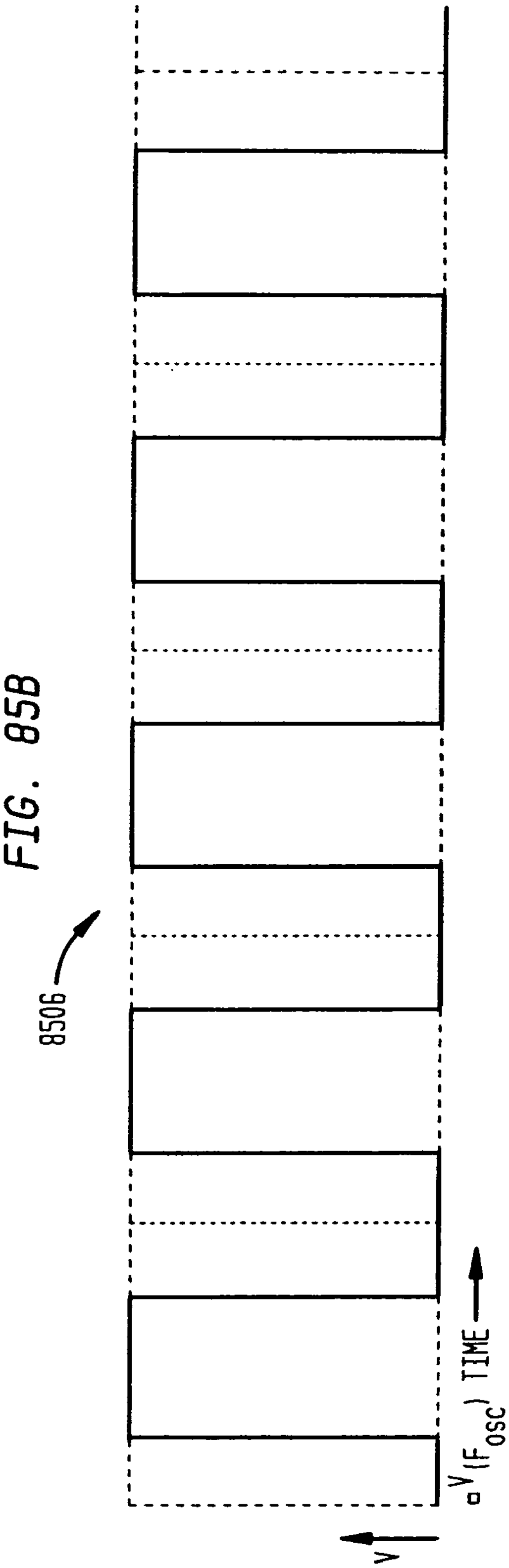
Figure 86:
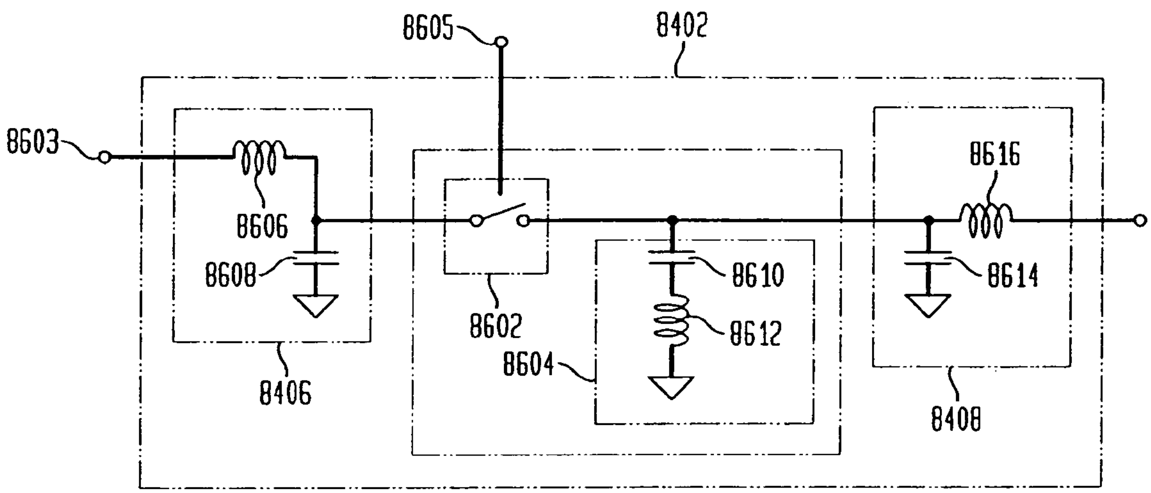
Figure 87A:
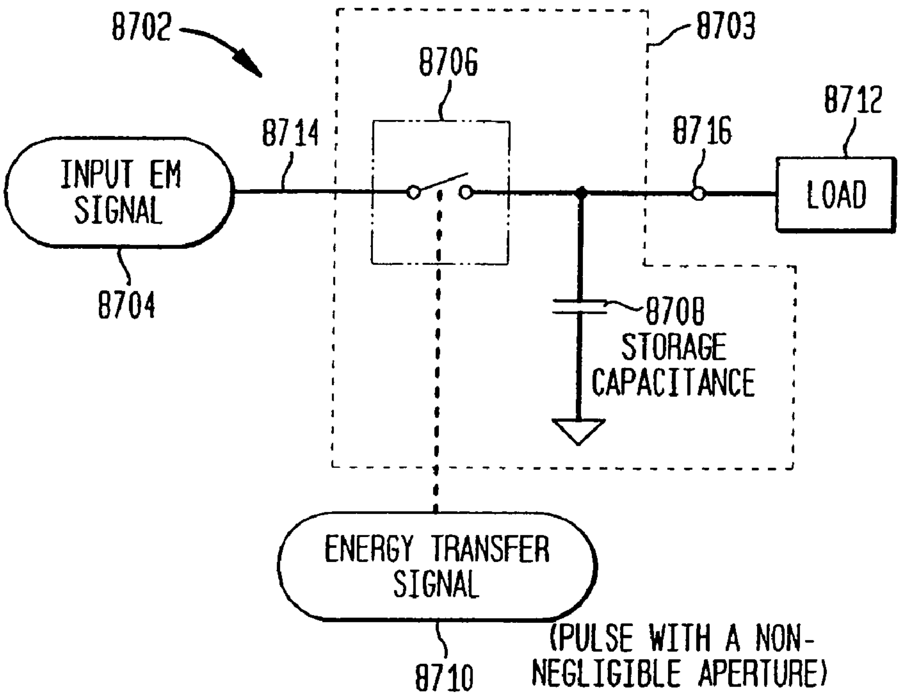
Figure 87B:
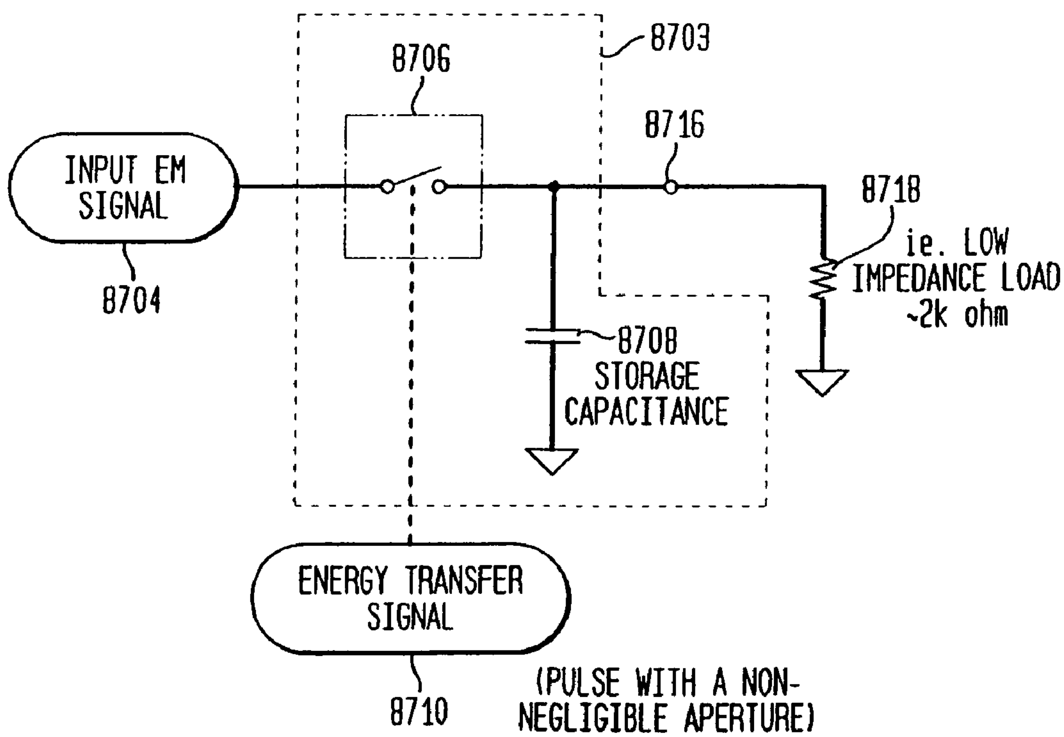
Figure 88A:
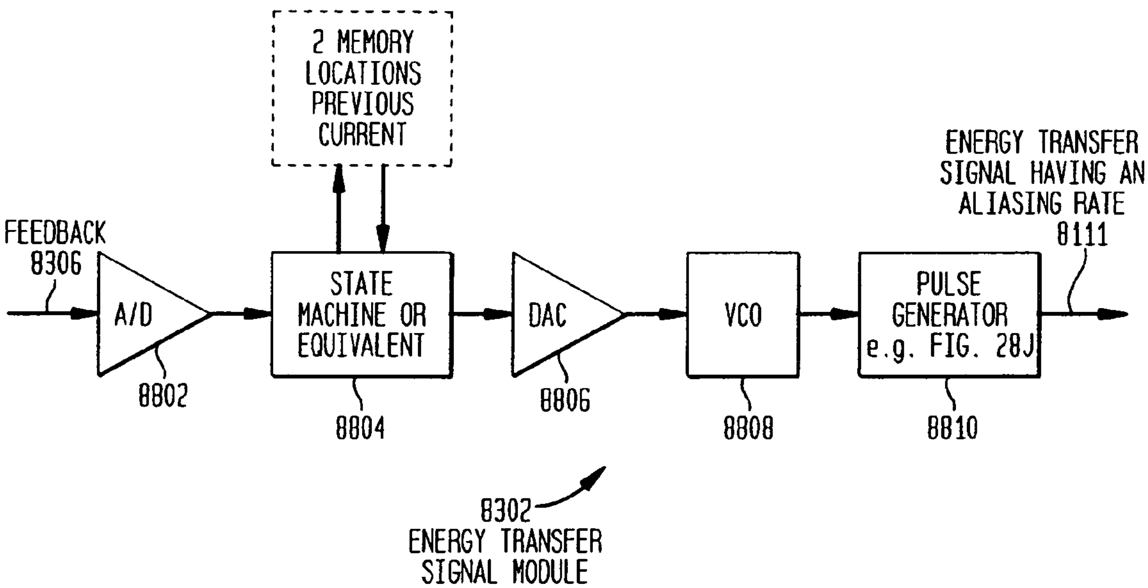
Figure 88B:
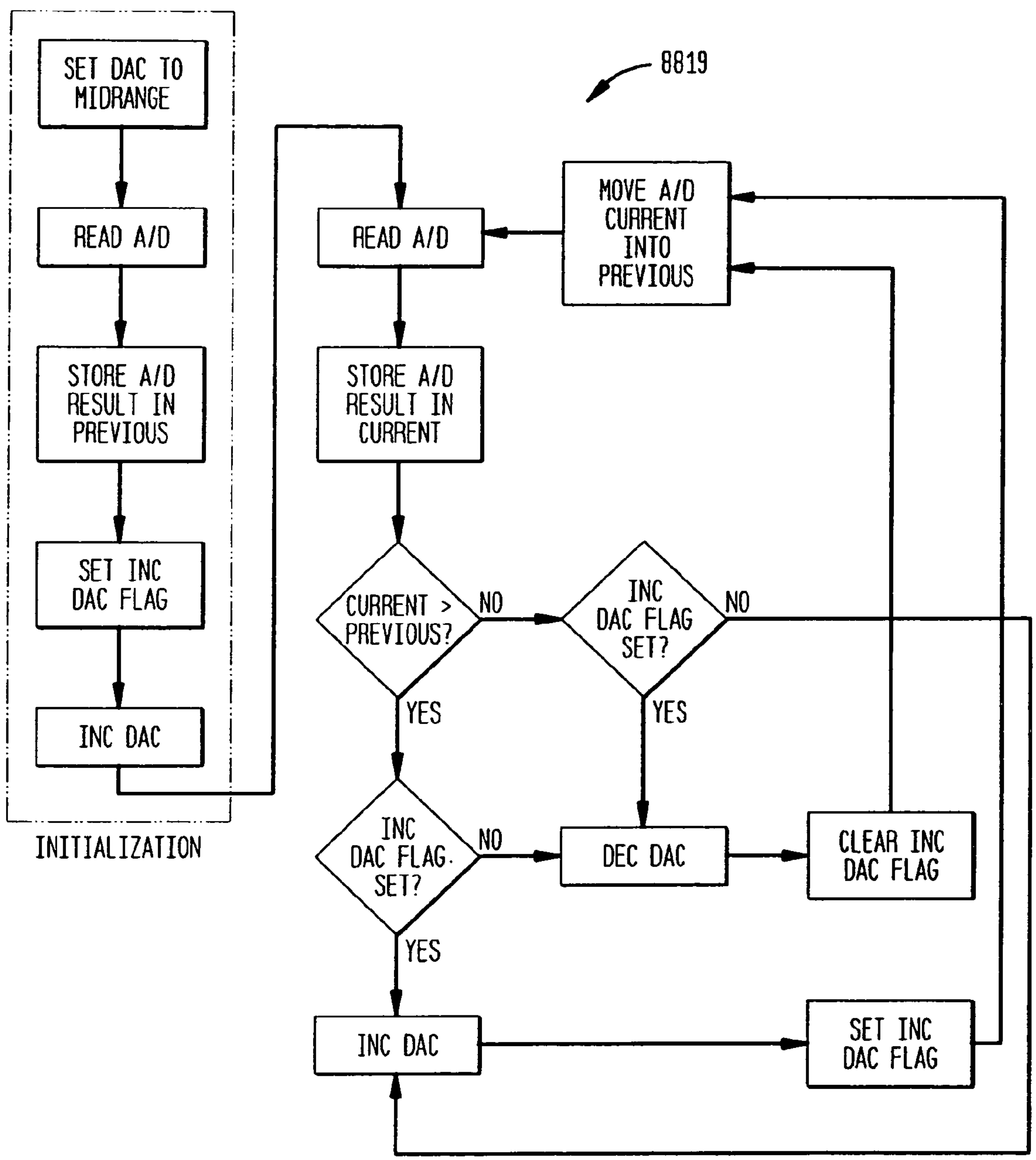
Figure 88C:
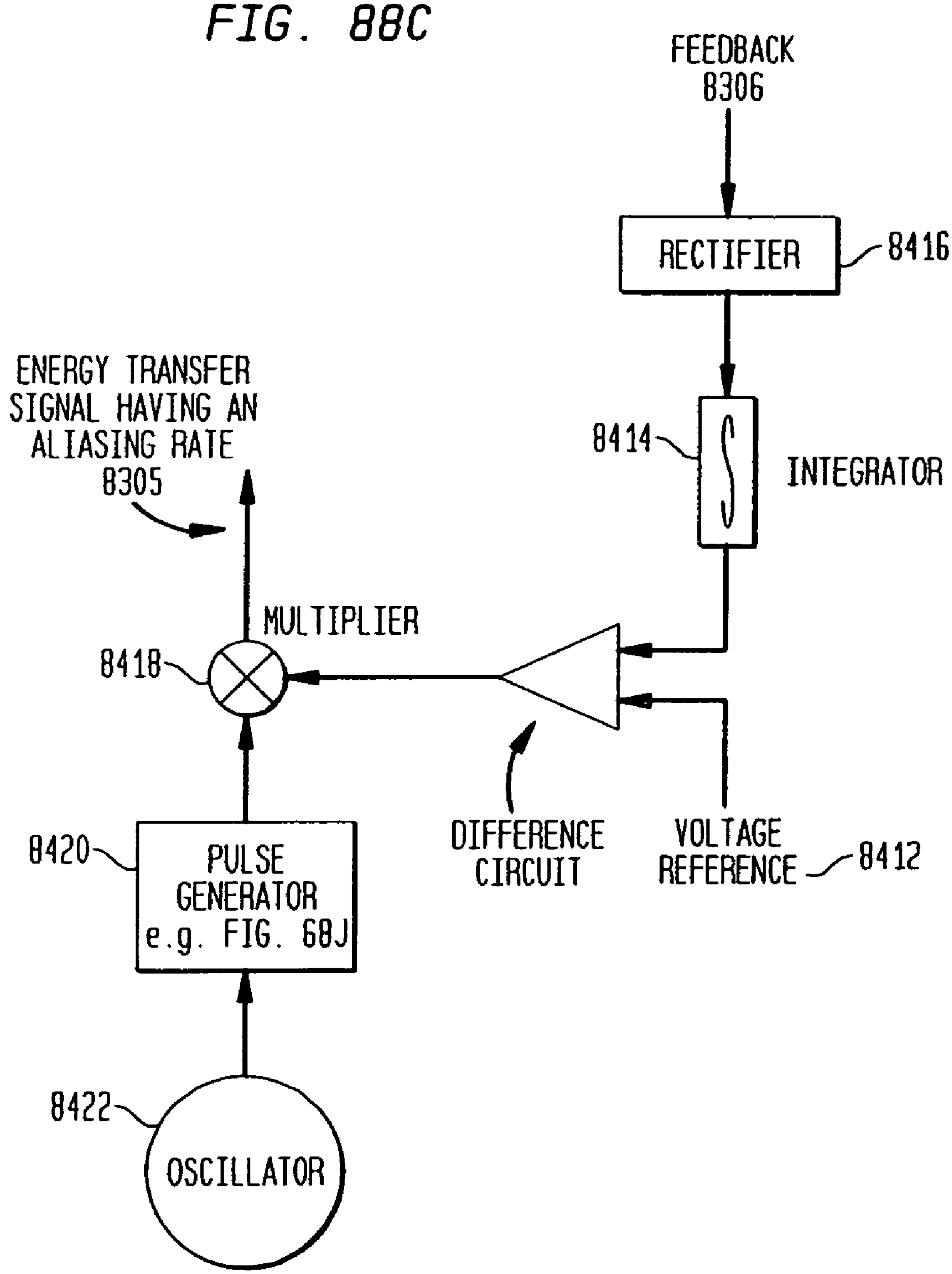
Figure 89:
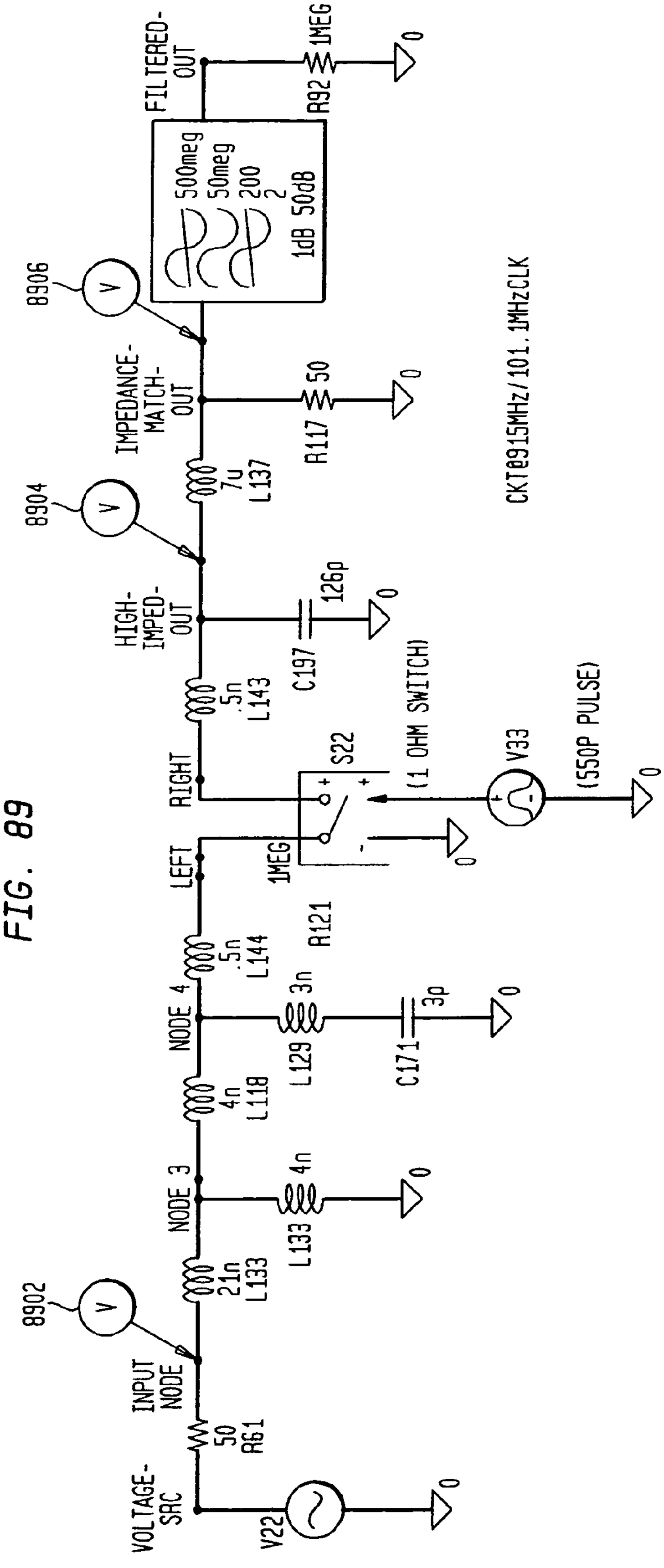
Figure 90:
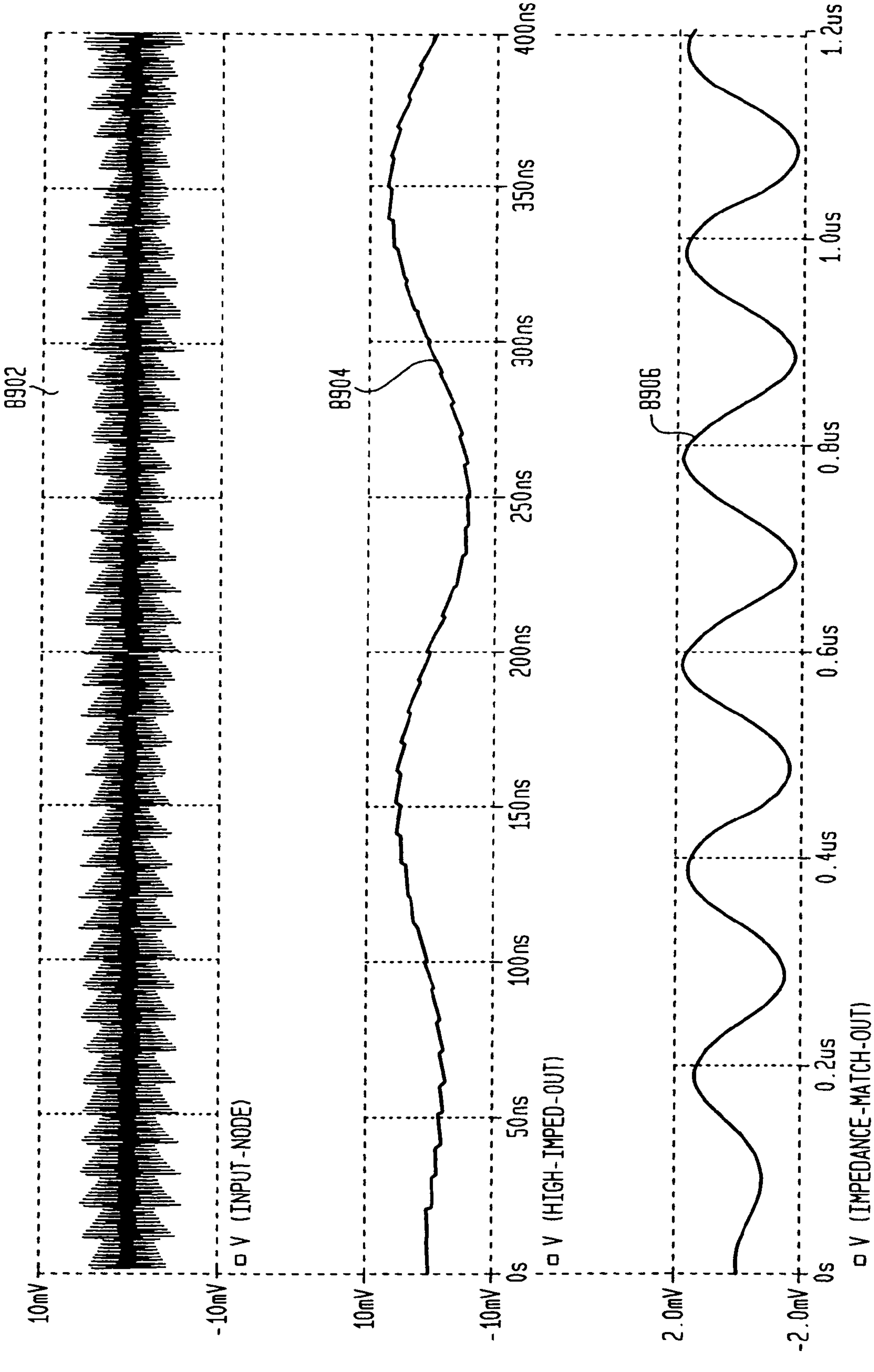
Figure 91:
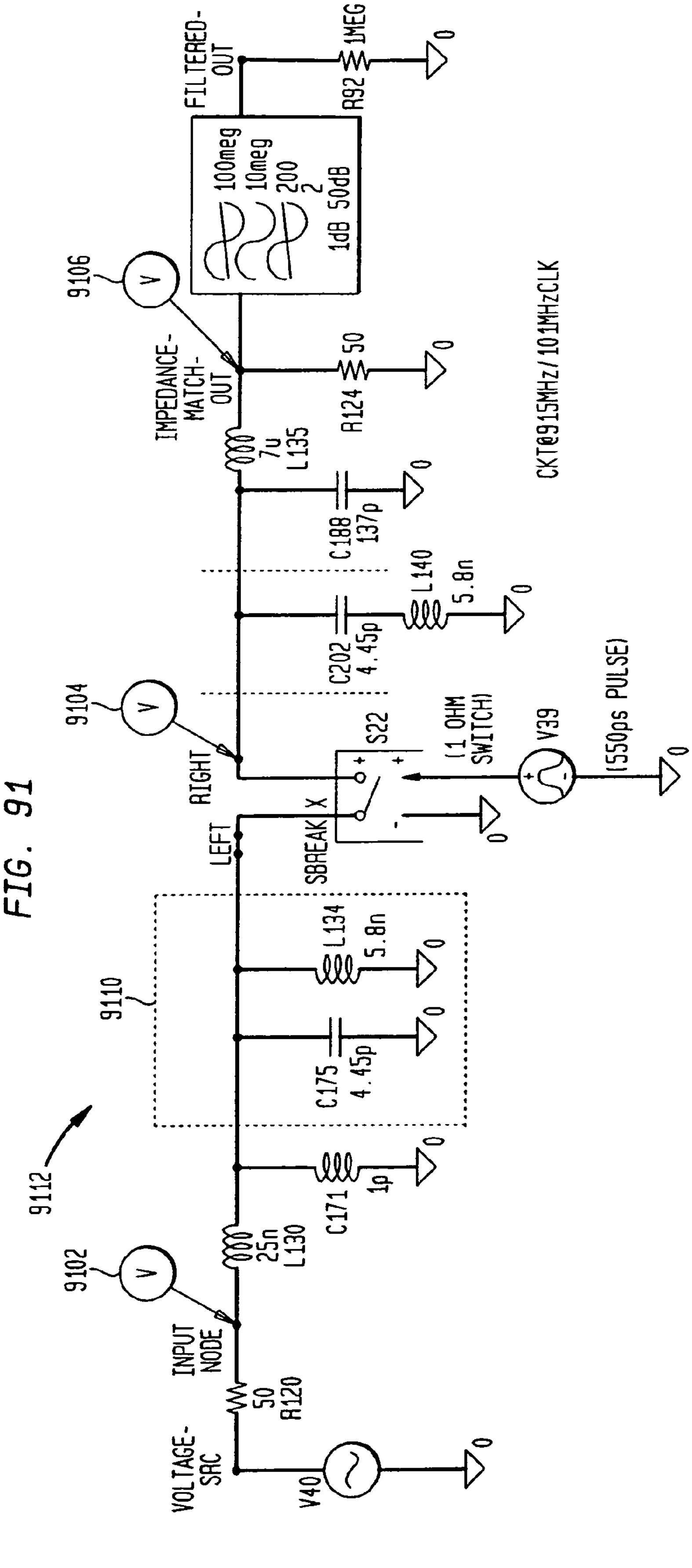
Figure 92:
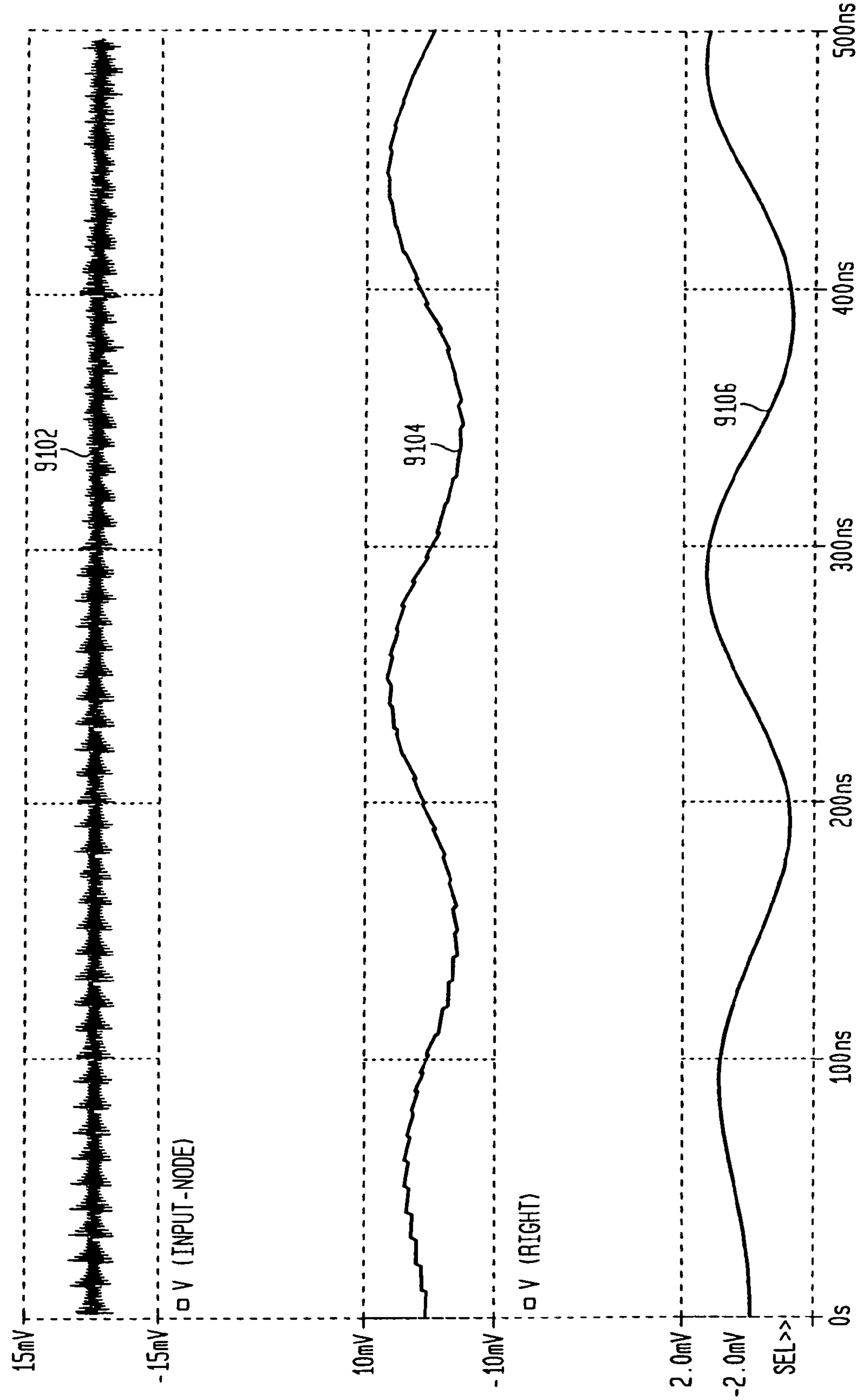
Figure 93:
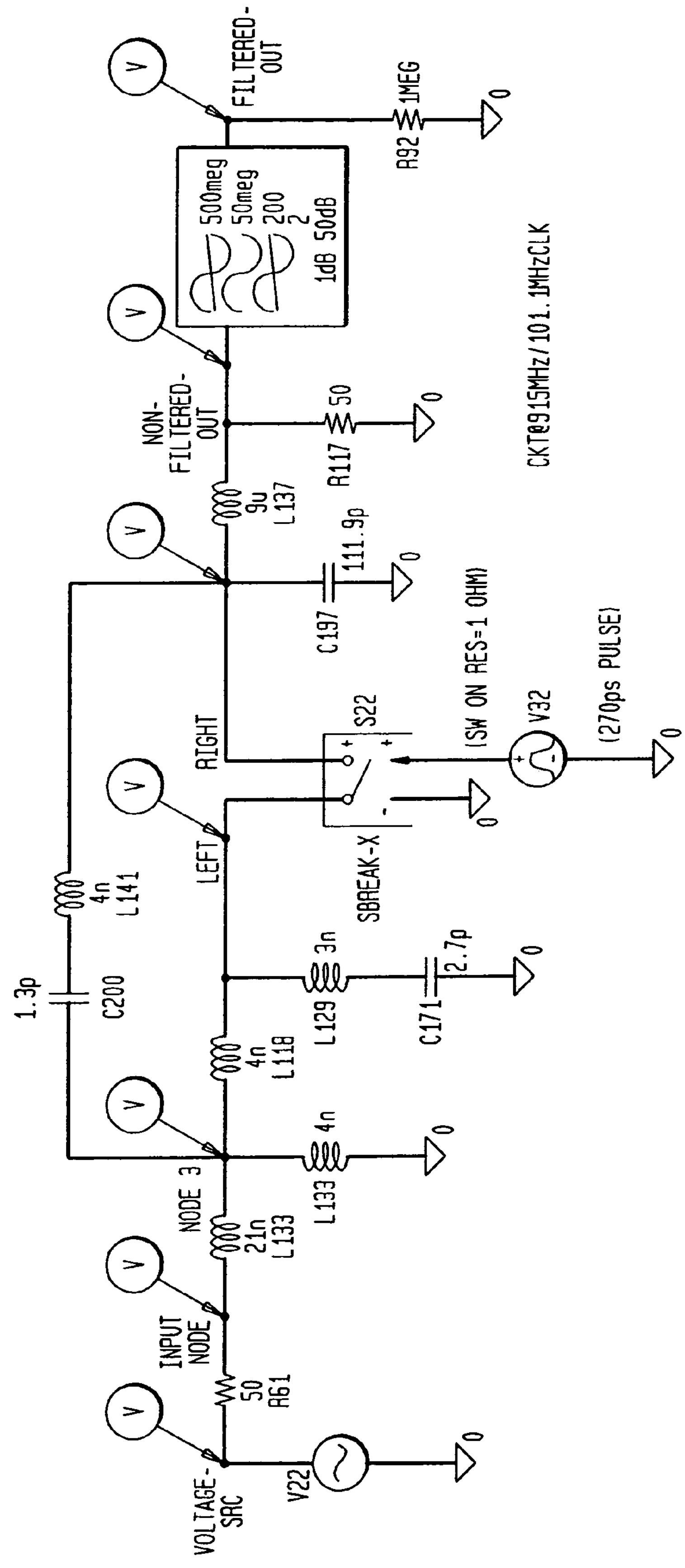
Figure 94:
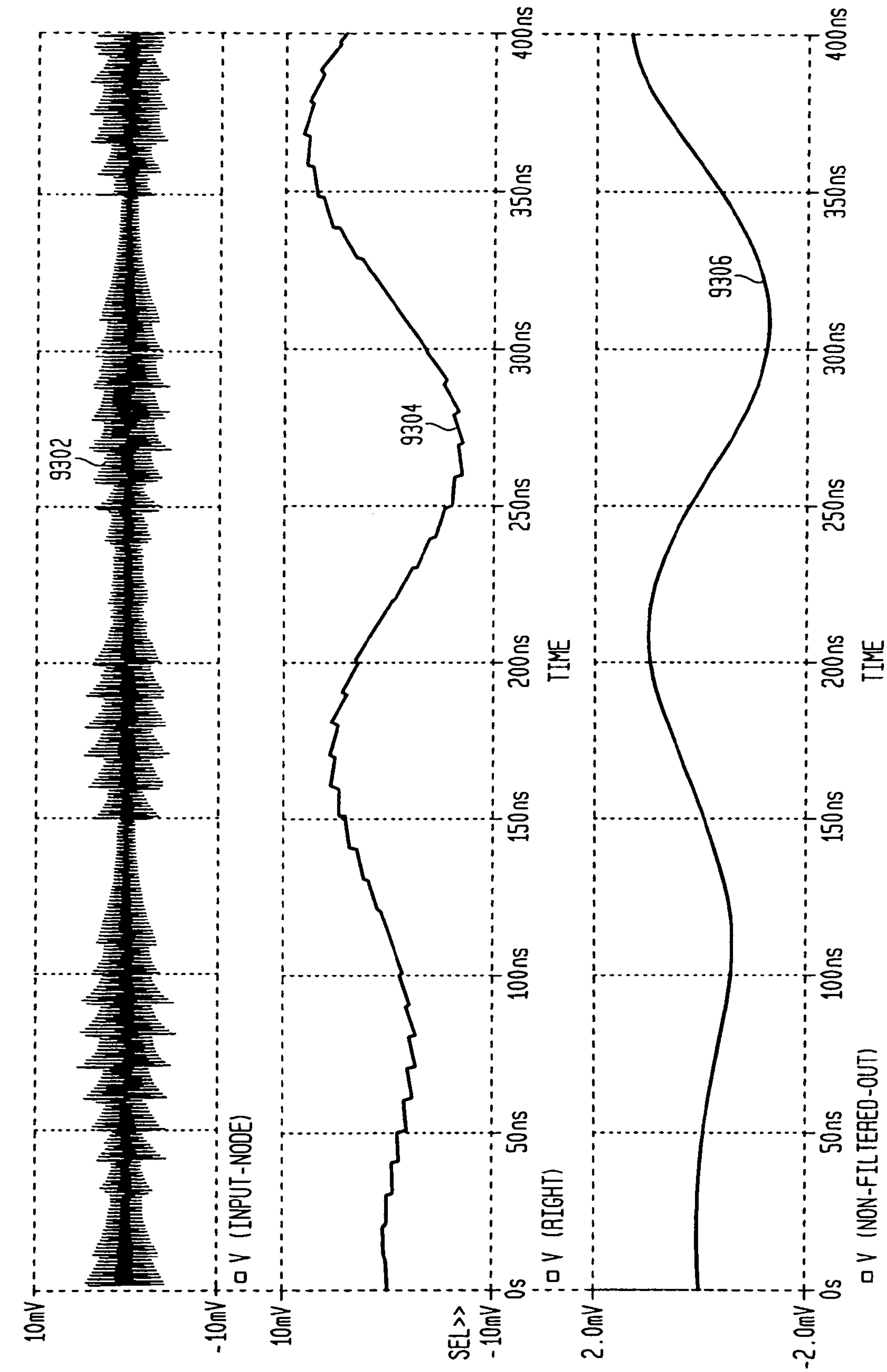
Figure 95:
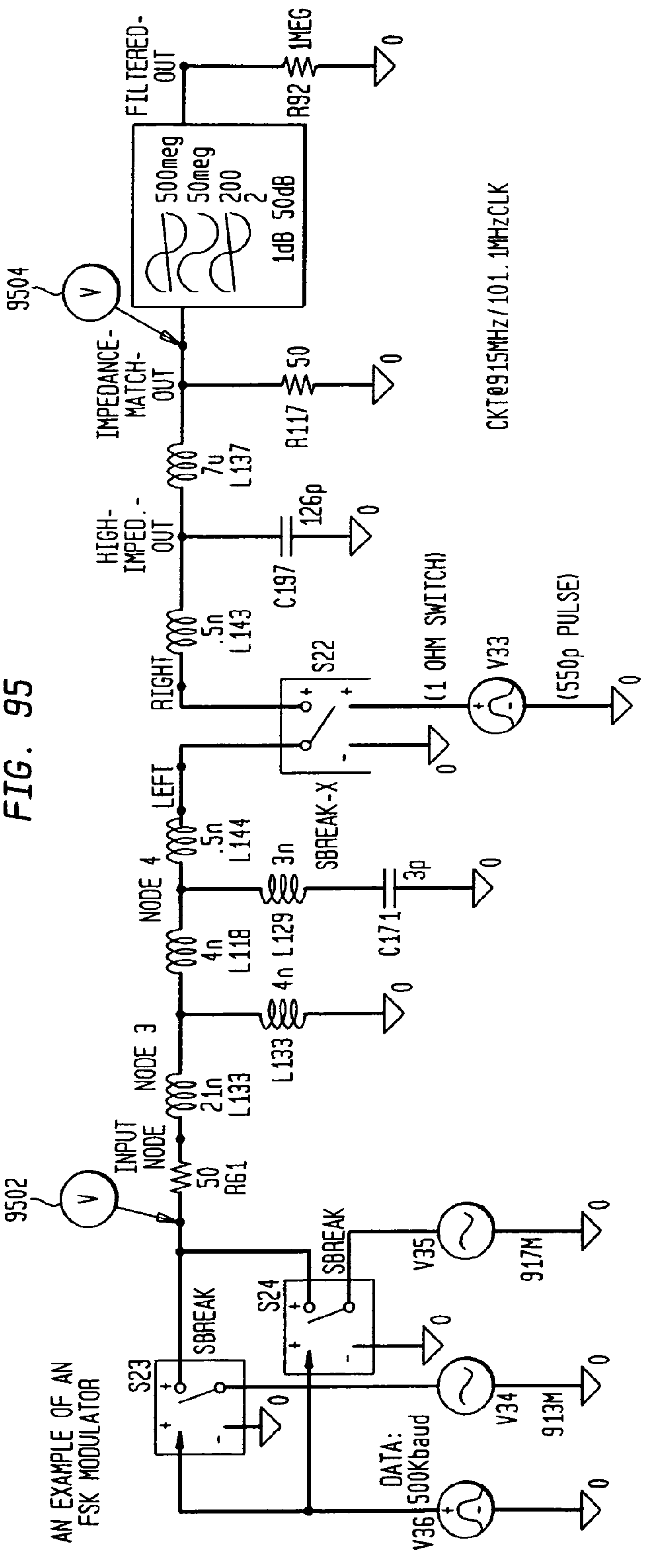
Figure 96A:
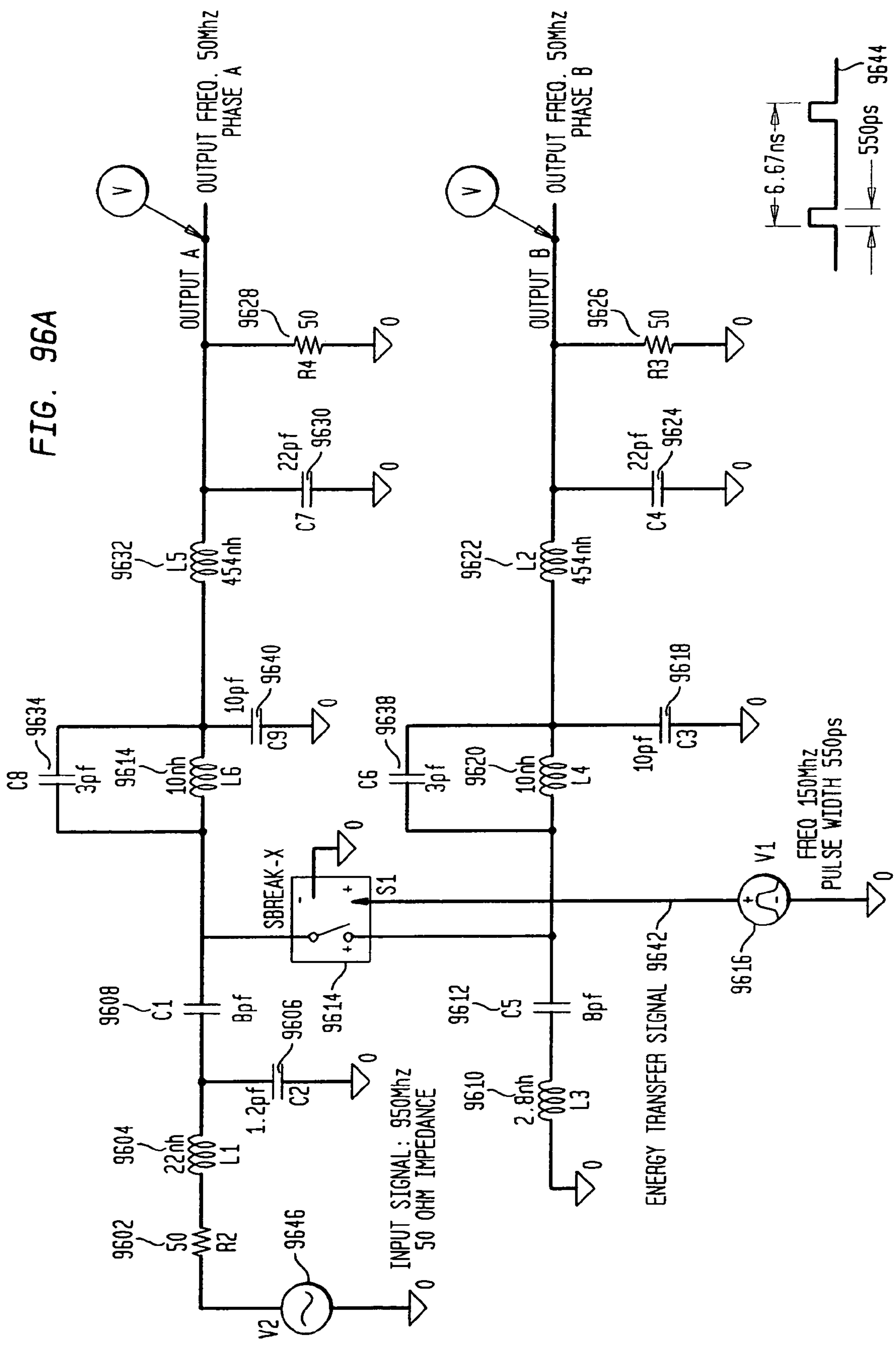
Figure 96B:
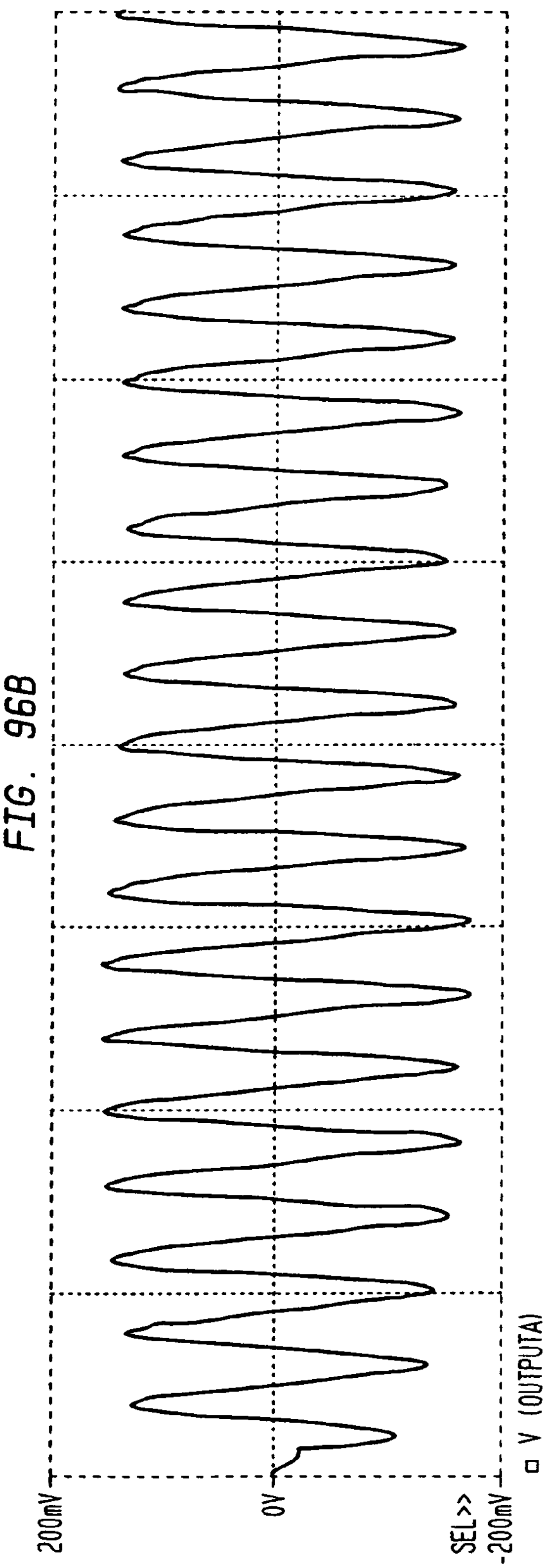
Figure 96C:
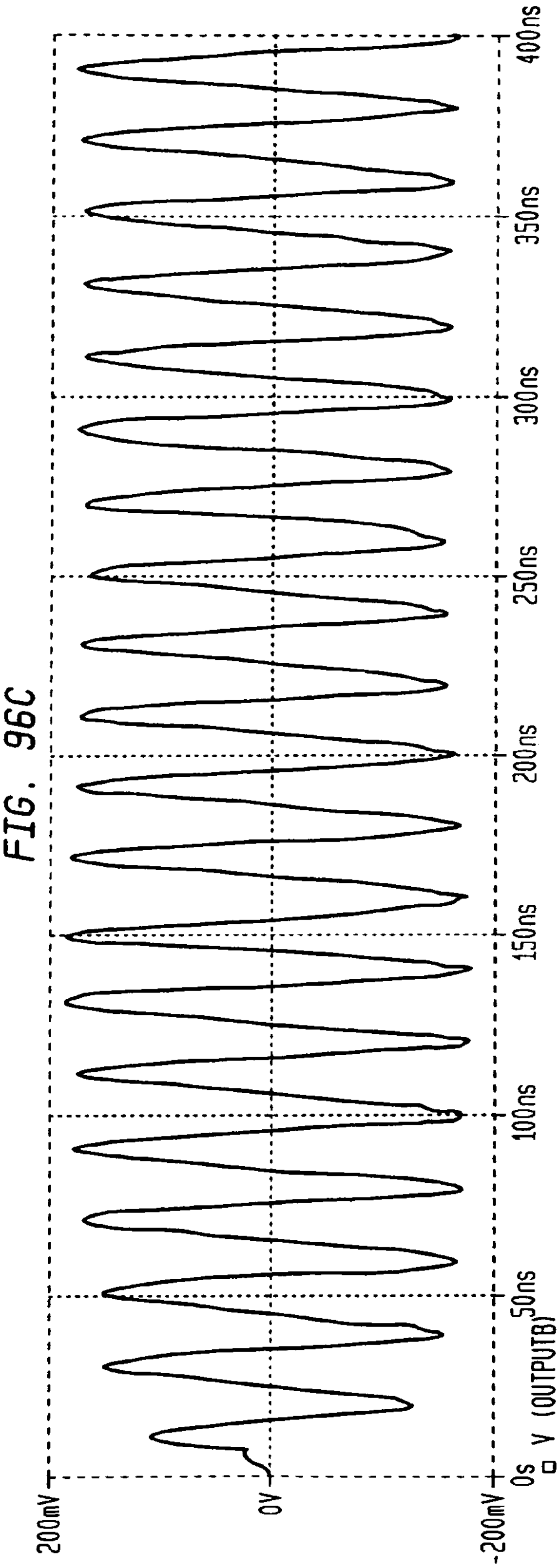
Figure 97:
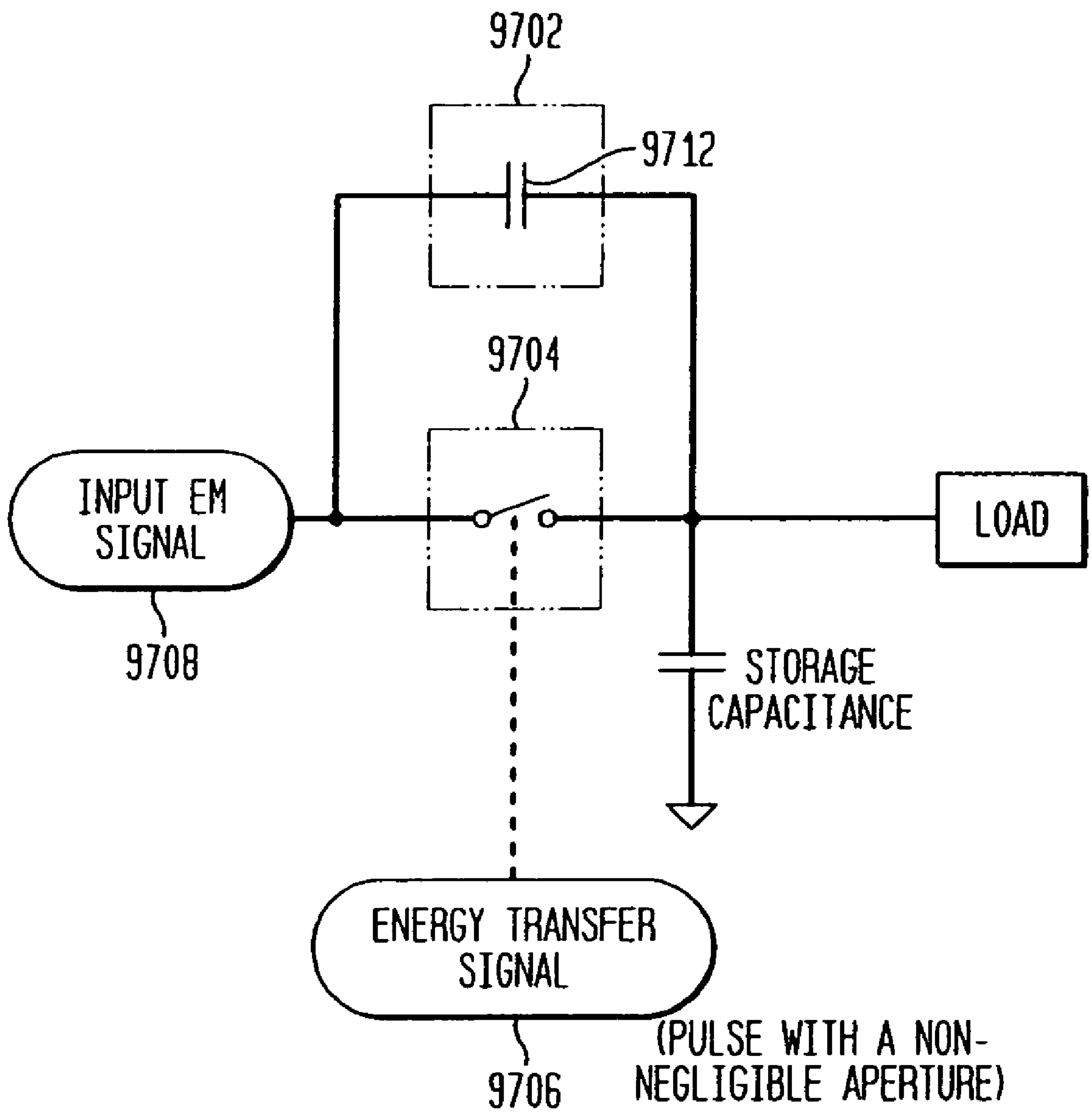
Figure 98:
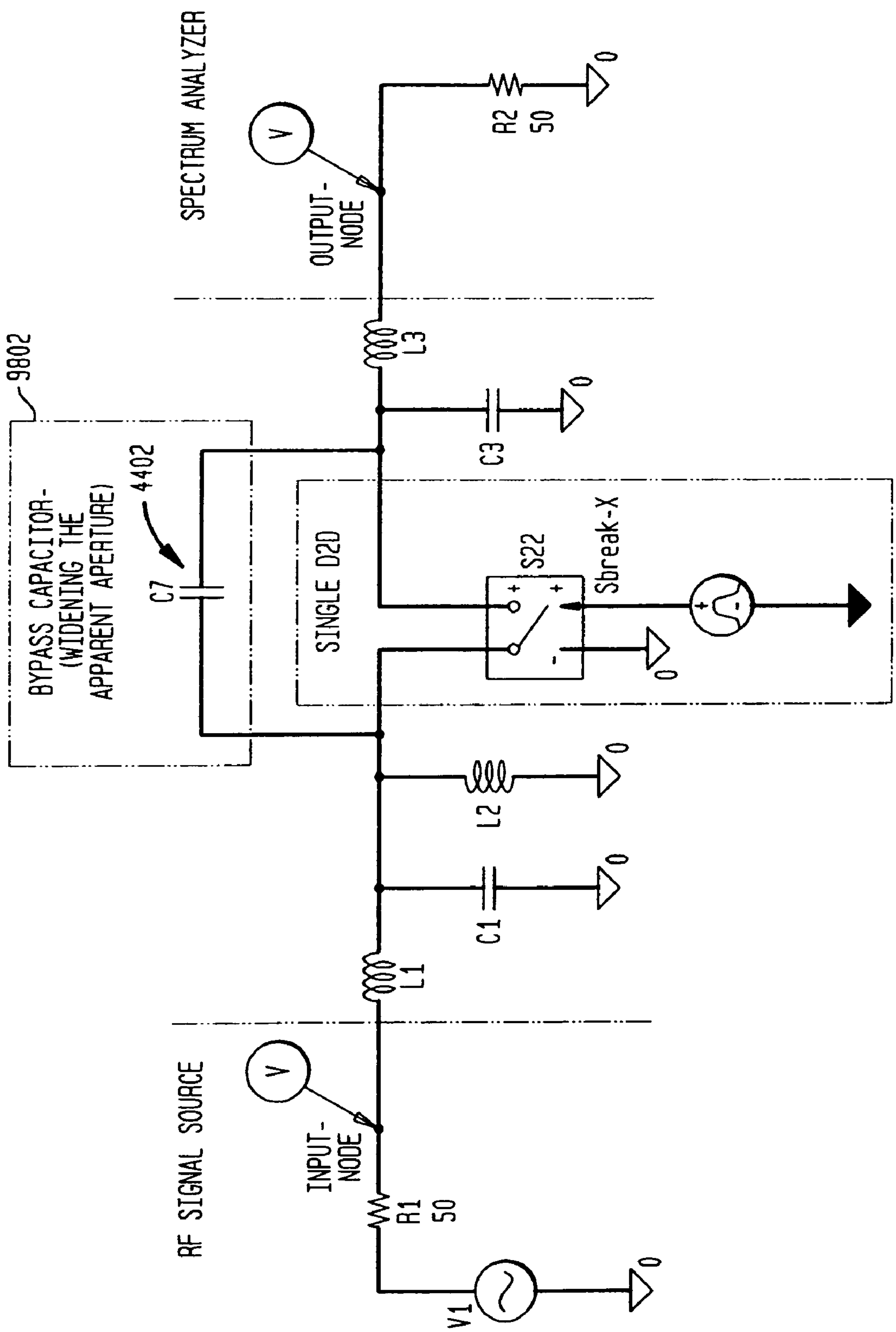
Figure 99:
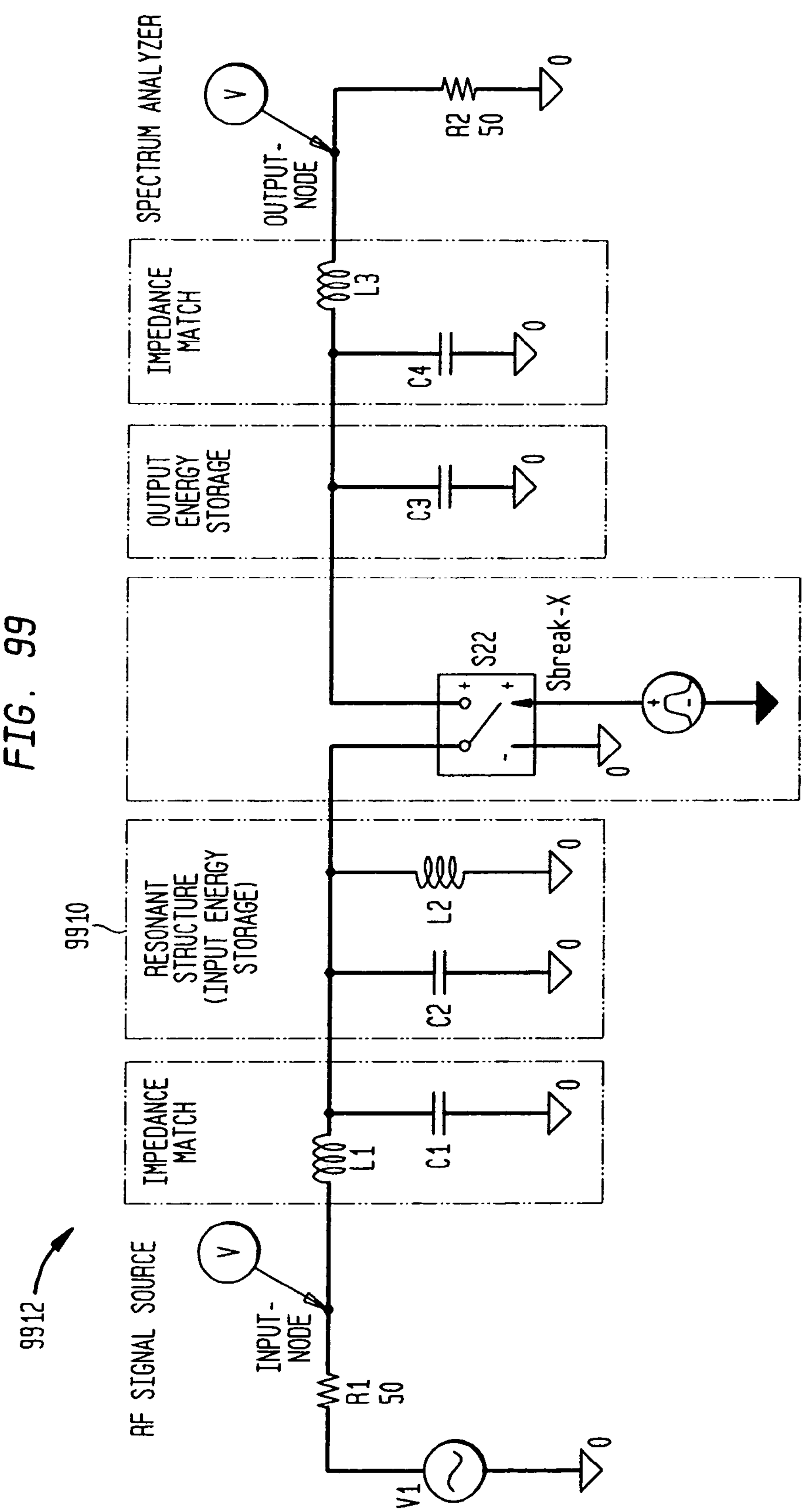
Figure 100A:
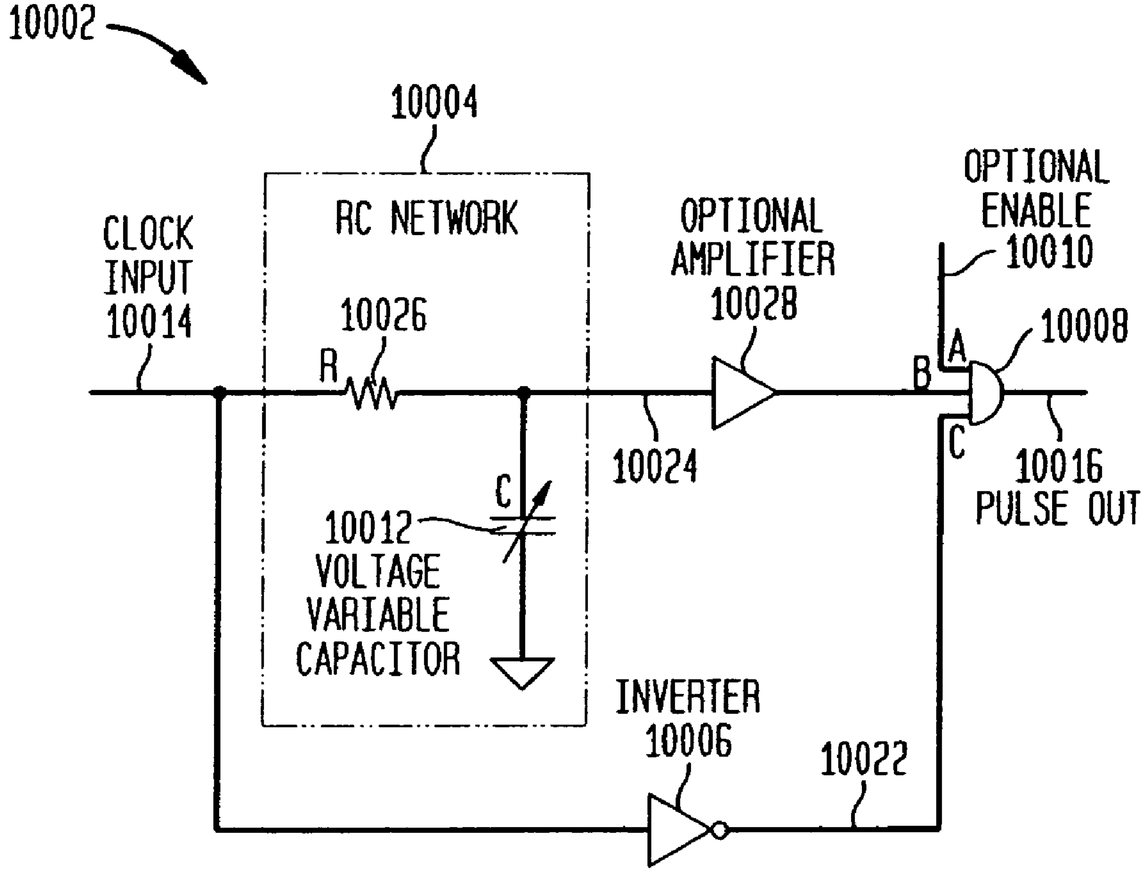
Figures 100B, 100C, 100D, 100E, 100F:
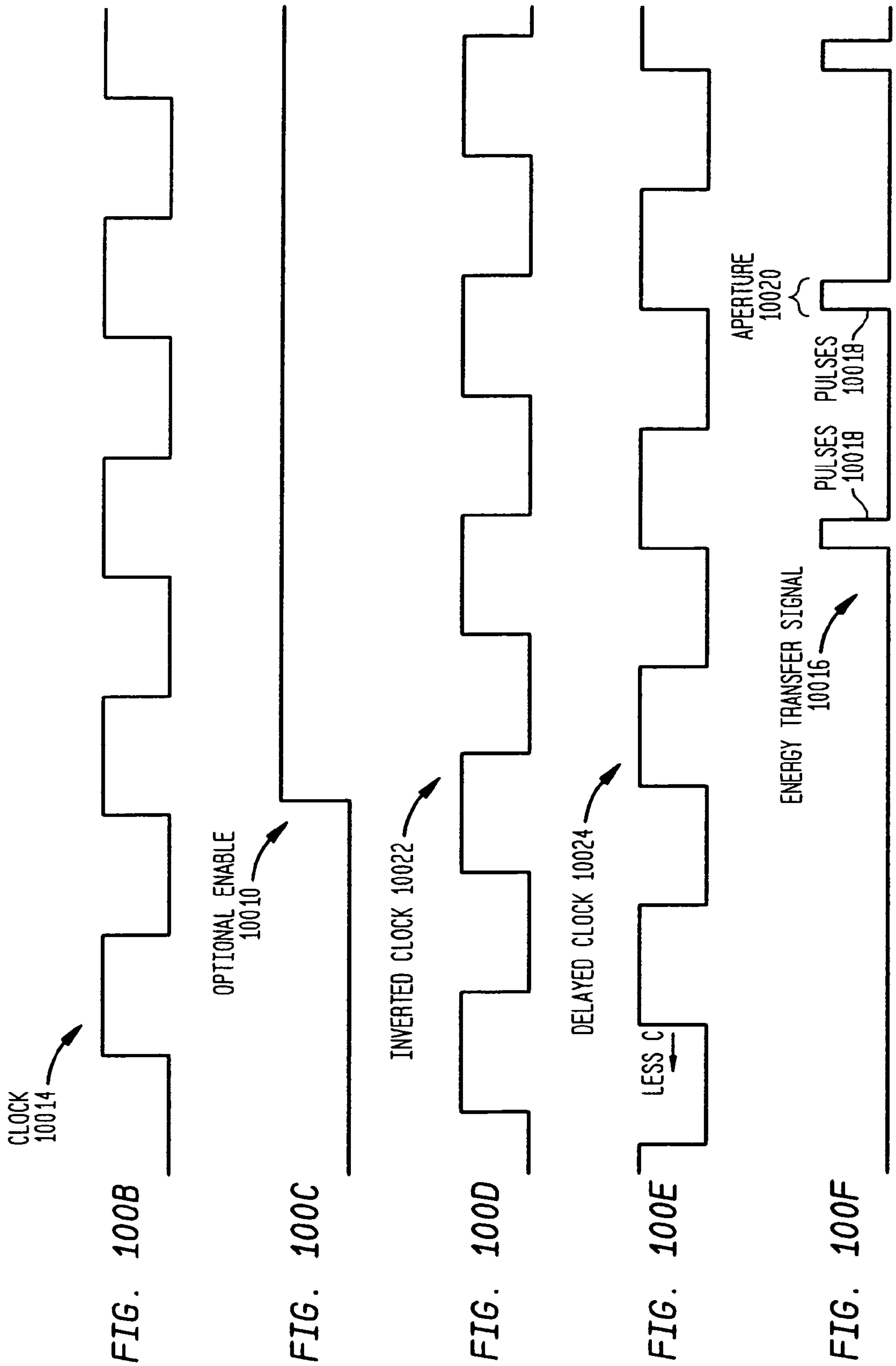
Figure 101:
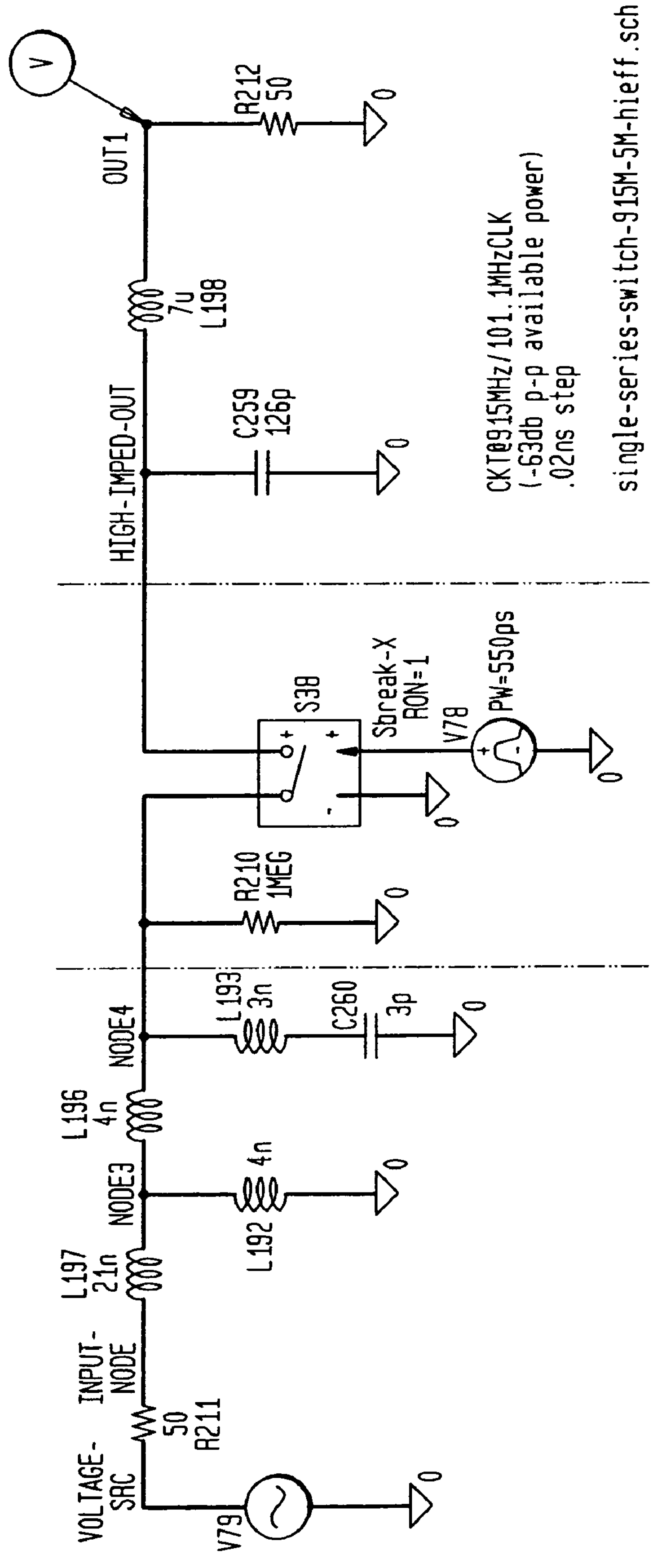
Figure 102:
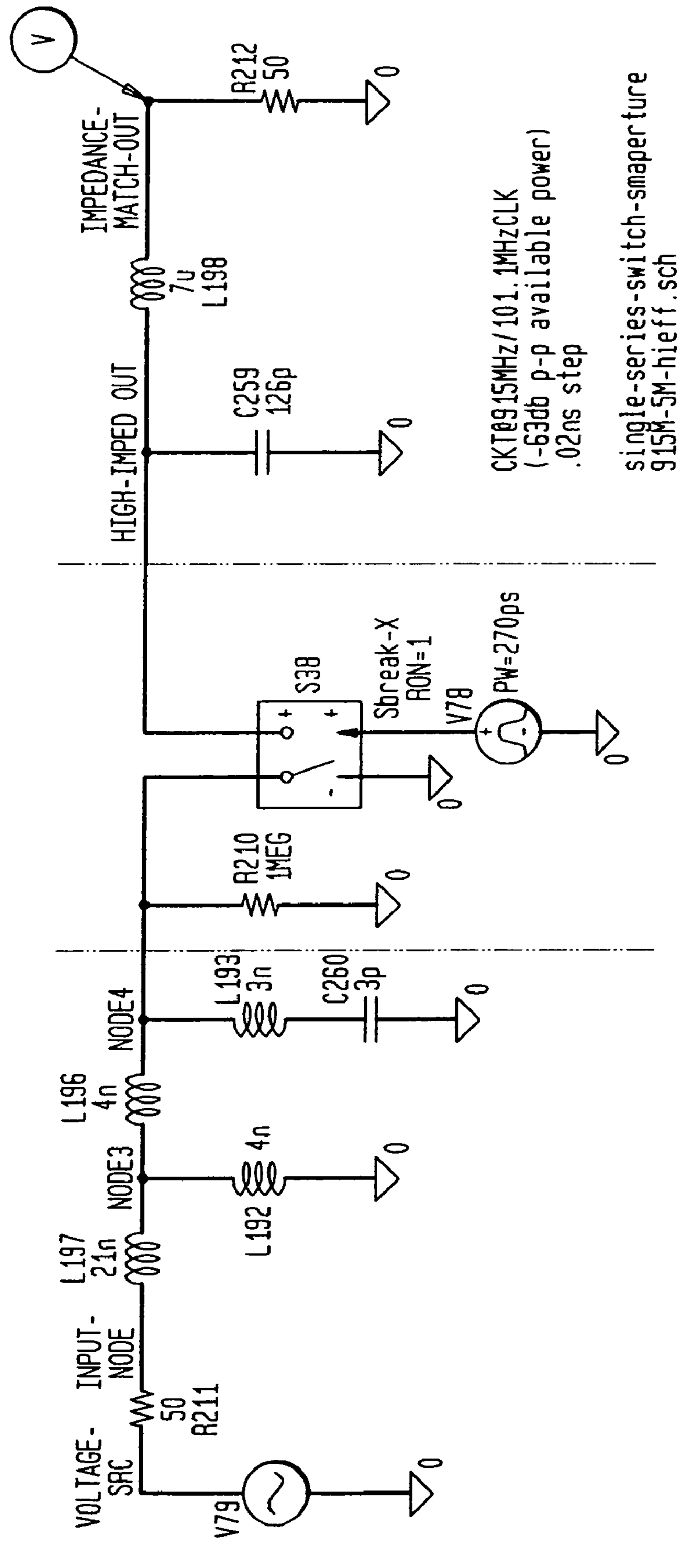
Figure 103:
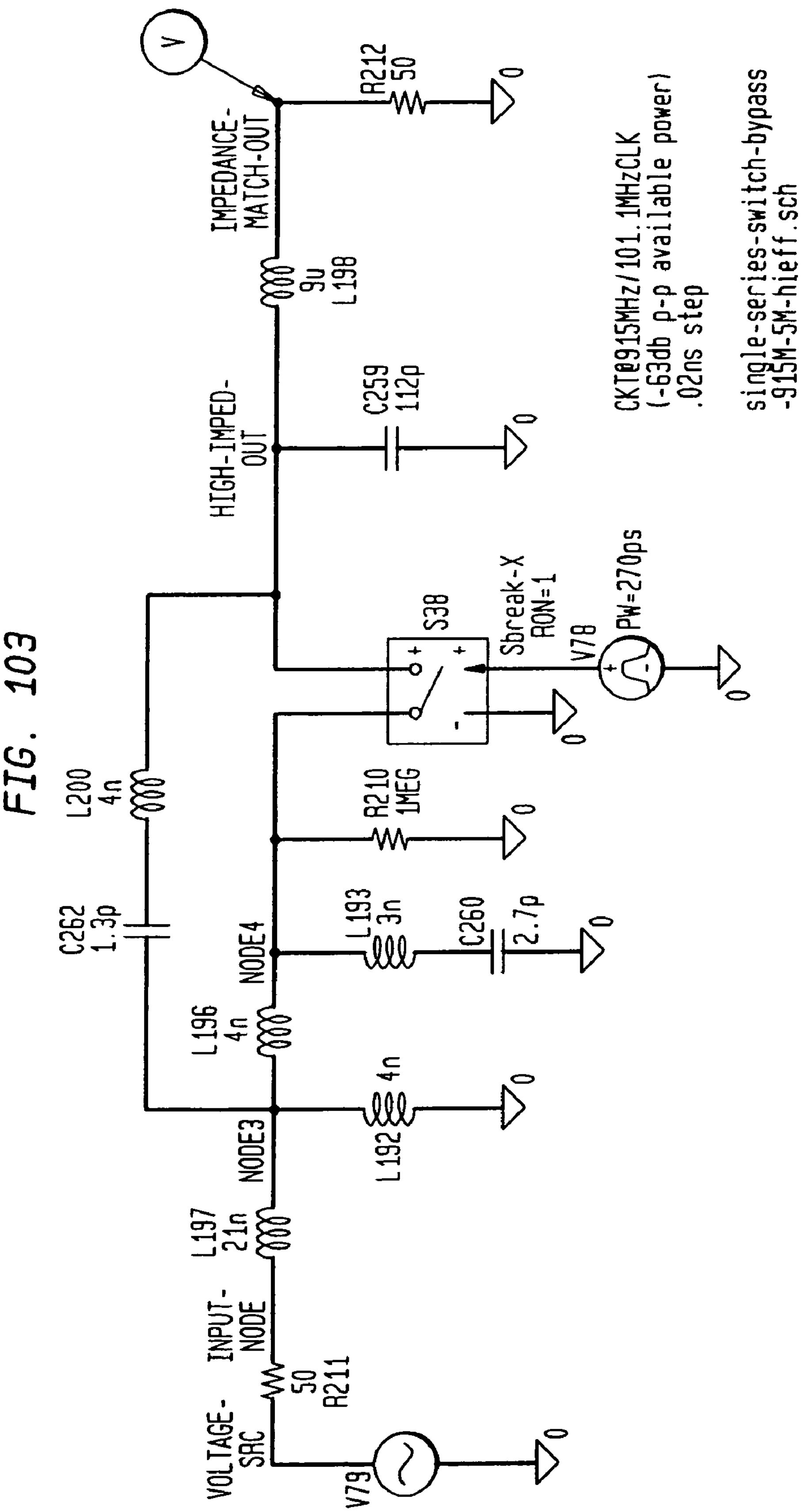
Figure 104:
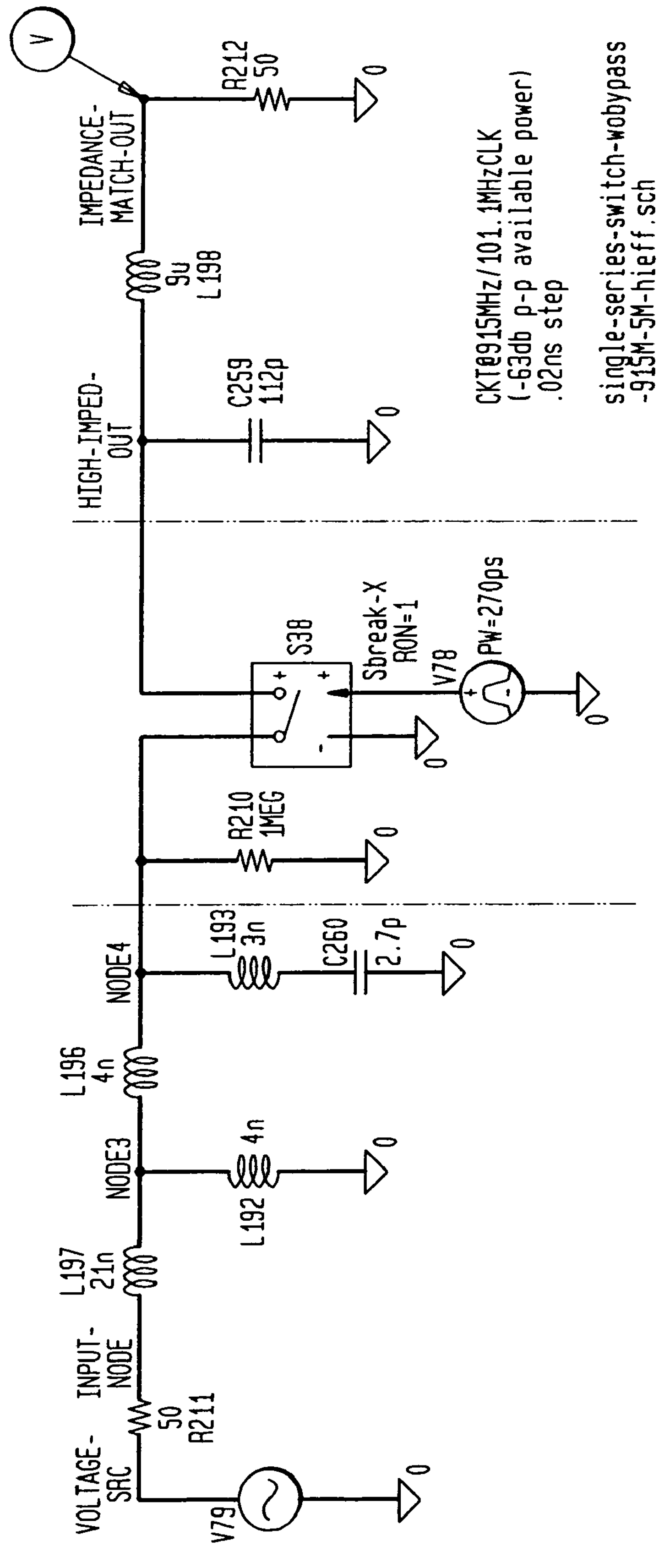
Figure 105A:
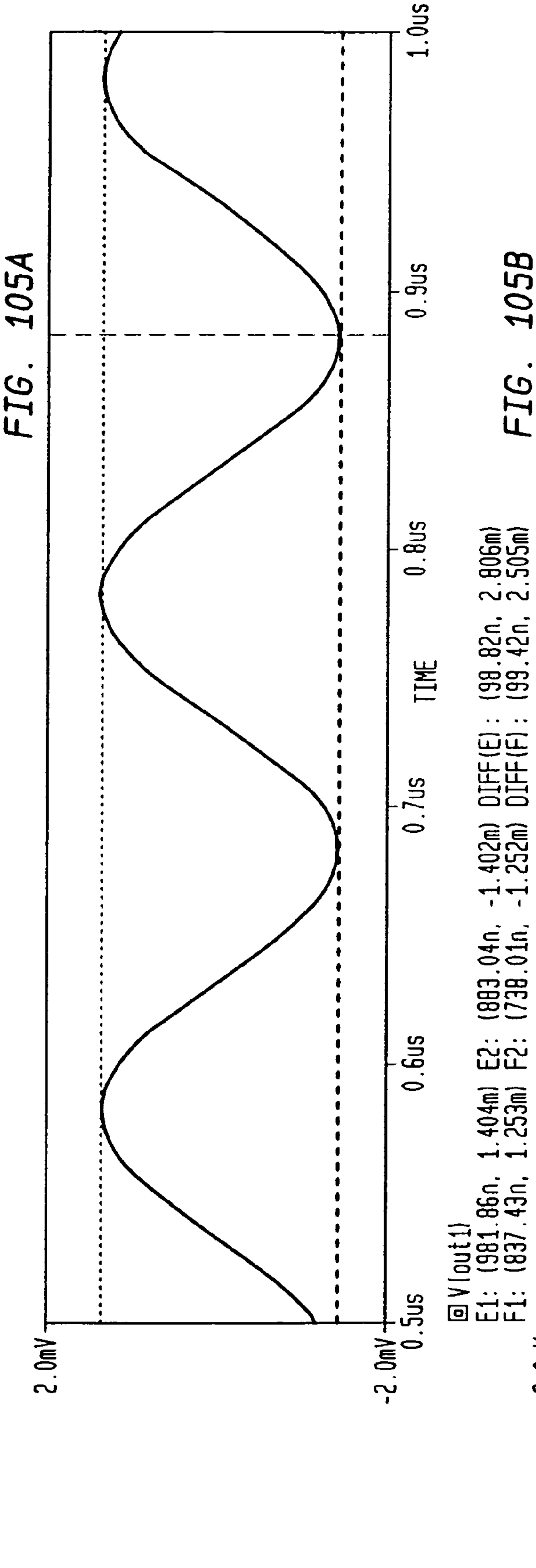
Figure 105B:
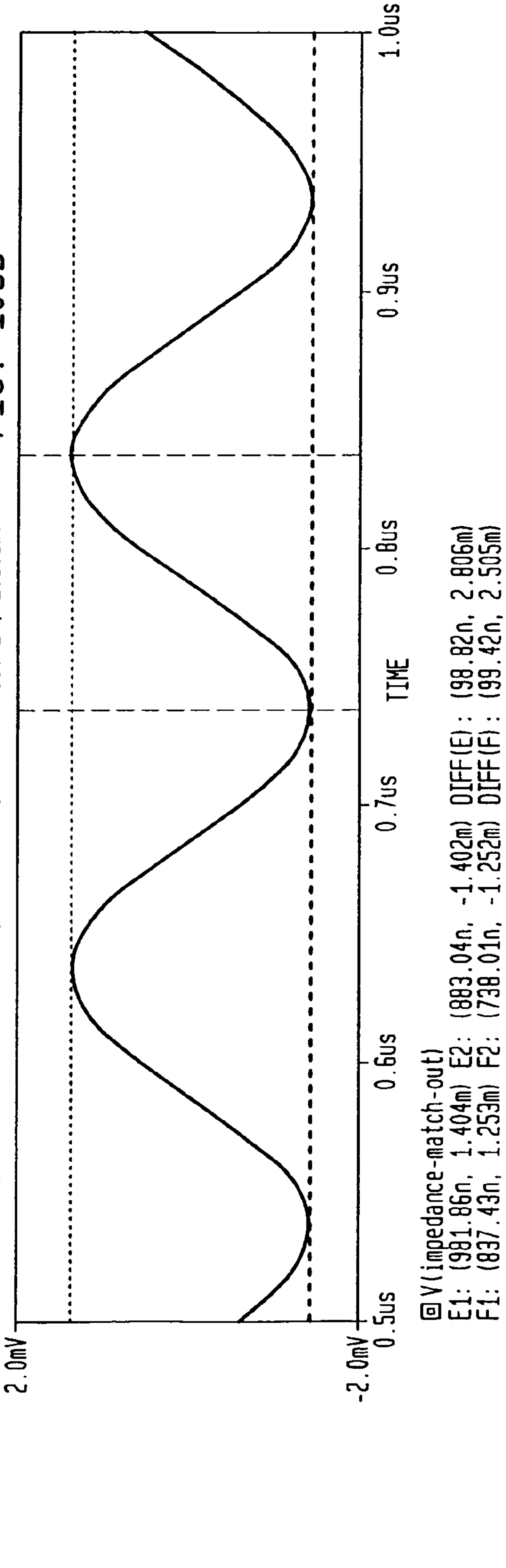
Figure 106A:
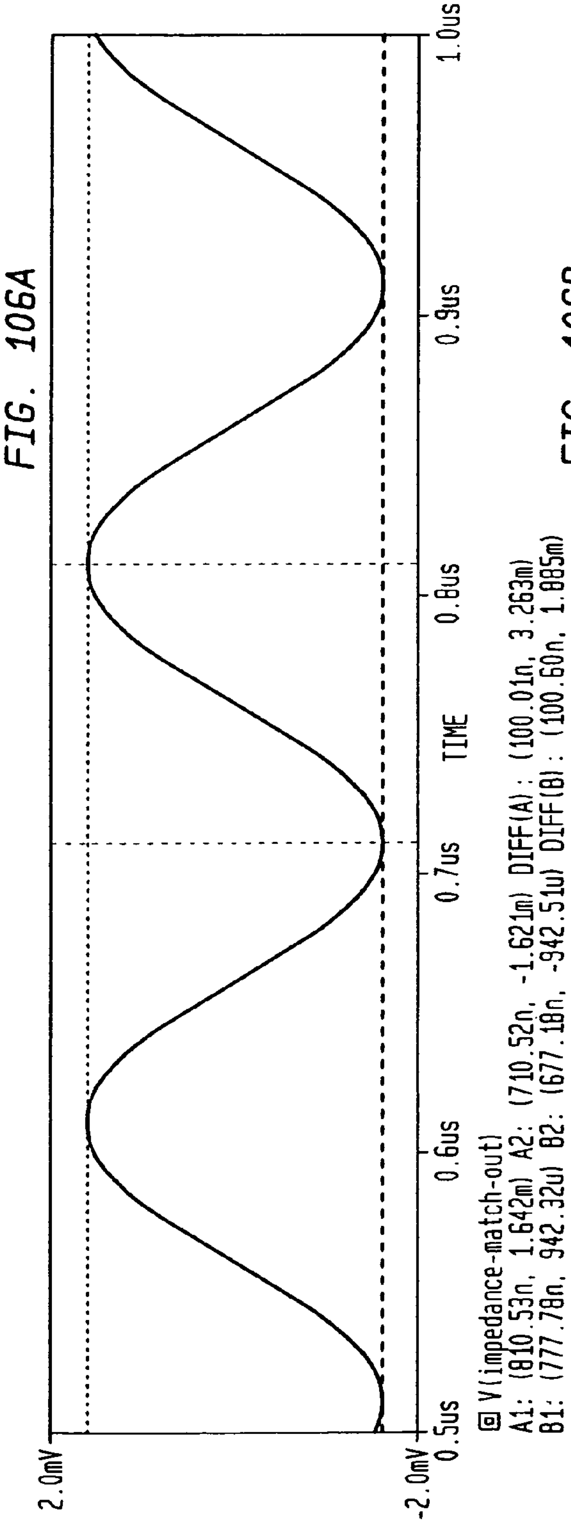
Figure 106B:
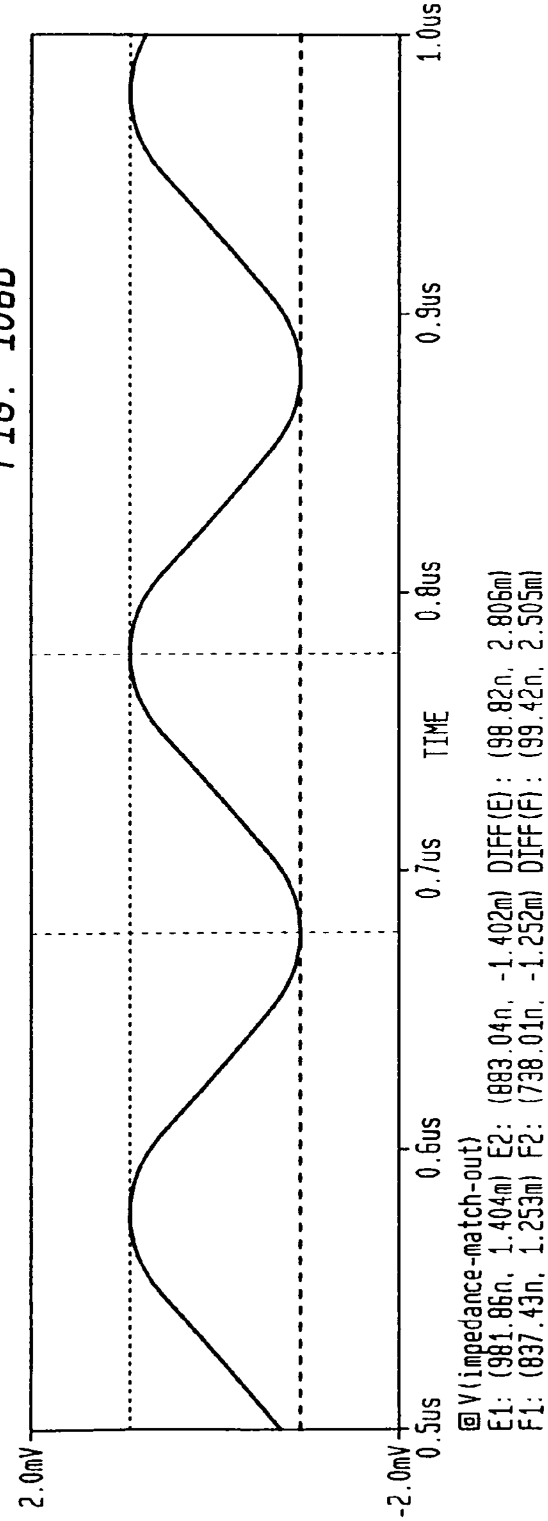

FIG*s*. 63A, 63B (which consists of 63B-1, 63B-2, 63B-3, and 63B-4), 63C (which consists of 63C-1, 63C-2, and 63C-3), and 63D illustrate various implementation circuits for the modulator 3710 according to embodiments of the present invention;

FIG. 64A illustrate a balanced shunt transmitter 6400 according to embodiments of the present invention;

FIGS. 64B-C illustrate various frequency spectrums that are associated with the transmitter 6400 according to embodiments of the present invention;

FIG. 64D illustrate a FET configuration of the transmitter 6400 according to embodiments of the present invention;

FIG. 65 illustrates an IQ transmitter 6500 according to embodiments of the present invention;

FIGS. 66A-C illustrate various frequency spectrums that are associated with the IQ transmitter 6500;

FIG. 67 illustrates an IQ transmitter 6700 according to embodiments of the present invention;

FIG. 68 illustrates an IQ transmitter 6800 according to embodiments of the present invention;

FIG. 69 illustrates a flowchart 6900 according to embodiments of the present invention;

FIG. 70 illustrates a flowchart 7000 according to embodiments of the present invention;

FIGS. 71A and 71B illustrate a flowchart 7100 according to embodiments of the present invention;

FIGS. 72A and 72B illustrate a flowchart 7200 according to embodiments of the present invention;

FIG. 73A illustrate a pulse generator according to embodiments of the present invention;

FIGS. 73B-C illustrates various signal diagrams that are associated with the pulse generator 7302 according to embodiments of the invention;

FIGS. 73D-E illustrate pulse generators 7312 and 7316 according to embodiments of the present invention;

FIGS. 74A-B illustrates a flowchart 7400 according to embodiments of the invention;

FIG. 75 illustrates a UDDIQ module 7500 according to embodiments of the present invention;

FIG. 76 illustrates a UDDIQ module 7600 according to embodiments of the present invention;

FIG. 77 illustrates a flowchart 7700 according to embodiments of the present invention;

FIGS. 78A-B illustrates a flowchart 7800 according to embodiments of the present invention;

FIG. 79 illustrates a UUSIQ module 7900 according to embodiments of the present invention;

FIG. 80 illustrates a UUSIQ module 8000 according to embodiments of the present invention;

FIGS. 81A-D illustrate example implementations of a switch module according to embodiments of the invention;

FIGS. 82A-E illustrate example aperture generators;

FIG. 83 illustrates an energy transfer system with an optional energy transfer signal module according to an embodiment of the invention;

FIG. 84 illustrates an aliasing module with input and output impedance match according to an embodiment of the invention;

FIG. 85A illustrates an example pulse generator;

FIGS. 85B and C illustrate example waveforms related to the pulse generator of FIG. 71A;

FIG. 86 illustrates an example energy transfer module with a switch module and a reactive storage module according to an embodiment of the invention;

FIGS. 87A-B illustrate example energy transfer systems according to embodiments of the invention;

FIG. 88A illustrates an example energy transfer signal module according to an embodiment of the present invention;

FIG. 88B illustrates a flowchart of state machine operation according to an embodiment of the present invention;

FIG. 88C is an example energy transfer signal module;

FIG. 89 is a schematic diagram of a circuit to down-convert a 915 MHZ signal to a 5 MHZ signal using a 101.1 MHZ clock according to an embodiment of the present invention;

FIG. 90 shows simulation waveforms for the circuit of FIG. 86 according to embodiments of the present invention;

FIG. 91 is a schematic diagram of a circuit to down-convert a 915 MHZ signal to a 5 MHZ signal using a 101 MHZ clock according to an embodiment of the present invention;

FIG. 92 shows simulation waveforms for the circuit of FIG. 88 according to embodiments of the present invention;

FIG. 93 is a schematic diagram of a circuit to down-convert a 915 MHZ signal to a 5 MHZ signal using a 101.1 MHZ clock according to an embodiment of the present invention;

FIG. 94 shows simulation waveforms for the circuit of FIG. 90 according to an embodiment of the present invention;

FIG. 95 shows a schematic of the circuit in FIG. 86 connected to an FSK source that alternates between 913 and 917 MHZ at a baud rate of 500 Kbaud according to an embodiment of the present invention;

FIG. 96A illustrates an example energy transfer system according to an embodiment of the invention;

FIGS. 96B-C illustrate example timing diagrams for the example system of FIG. 94A;

FIG. 97 illustrates an example bypass network according to an embodiment of the invention;

FIG. 98 illustrates an example bypass network according to an embodiment of the invention;

FIG. 99 illustrates an example embodiment of the invention;

FIG. 100A illustrates an example real time aperture control circuit according to an embodiment of the invention;

FIG. 100B illustrates a timing diagram of an example clock signal for real time aperture control, according to an embodiment of the invention;

FIG. 100C illustrates a timing diagram of an example optional enable signal for real time aperture control, according to an embodiment of the invention;

FIG. 100D illustrates a timing diagram of an inverted clock signal for real time aperture control, according to an embodiment of the invention;

FIG. 100E illustrates a timing diagram of an example delayed clock signal for real time aperture control, according to an embodiment of the invention;

FIG. 100F illustrates a timing diagram of an example energy transfer including pulses having apertures that are controlled in real time, according to an embodiment of the invention;

FIG. 101 illustrates an example embodiment of the invention;

FIG. 102 illustrates an example embodiment of the invention;

FIG. 103 illustrates an example embodiment of the invention;

FIG. 104 illustrates an example embodiment of the invention;

FIG. 105A is a timing diagram for the example embodiment of FIG. 103;

FIG. 105B is a timing diagram for the example embodiment of FIG. 104;

FIG. 106A is a timing diagram for the example embodiment of FIG. 105;

FIG. 106B is a timing diagram for the example embodiment of FIG. 106;

FIG. 107A illustrates and example embodiment of the invention;

FIG. 107B illustrates equations for determining charge transfer, in accordance with the present invention;

FIG. 107C illustrates relationships between capacitor charging and aperture, in accordance with the present invention;

FIG. 107D illustrates relationships between capacitor charging and aperture, in accordance with the present invention;

FIG. 107E illustrates power-charge relationship equations, in accordance with the present invention; and FIG. 107F illustrates insertion loss equations, in accordance with the present invention.

DETAILED DESCRIPTION OF THE PREFERRED EMBODIMENTS

Table of Contents

1. Universal Frequency Translation
2. Frequency Down-conversion
  2.1 Optional Energy Transfer Signal Module
  2.2 Smoothing the Down-Converted Signal
  2.3 Impedance Matching
  2.4 Tanks ad Resonant Structures
  2.5 Charge and Power Transfer Concepts
  2.6 Optimizing and Adjusting the Non-Negligible Aperture Width/Duration
  2.7 Adding a Bypass Network
  2.8 Modifying the Energy Transfer Signal Utilizing Feedback
  2.9 Other Implementations
  2.10 Example Energy Transfer Down-Converters
3. Frequency Up-conversion
4. Enhanced Signal Reception
5. Unified Down-conversion and Filtering
6. Other Example Application Embodiments of the Invention
7. Universal Transmitter
  7.1 Universal Transmitter Having 2 UFT Modules
    7.1.1 Balanced Modulator Detailed Description
    7.1.2. Balanced Modulator Example Signal Diagrams and Mathematical Description
    7.1.3 Balanced Modulator Having a Shunt Configuration
    7.1.4 Balanced Modulator FET Configurations
    7.1.5 Universal Transmitter Configured for Carrier Insertion
  7.2 Universal Transmitter in an IQ Configuration
    7.2.1 IQ Transmitter Using Series-Type Balanced Modulator
    7.2.2 IQ Transmitter Using Shunt-Type Balanced Modulator
    7.2.3 IQ Transmitters Configured for Carrier Insertion
  7.3 Universal Transmitter and CDMA
    7.3.1 IS-95 CDMA Specifications
    7.3.2 Conventional CDMA Transmitter
    7.3.3. CDMA Transmitter Using the Present Invention
    7.3.4 CDMA Transmitter Measured Test Results
8.0 Integrated Frequency Translation and Spreading/De-spreading of a Spread Spectrum Signal
  8.1 Integrated Down-Conversion and De-spreading of a Spread Spectrum Signal
  8.2 Integrated Down-Conversion and De-spreading of an IQ Spread Spectrum Signal
  8.3 RAKE Receivers 8.3.1 Introduction: Rake Receivers in Spread Spectrum Systems
8.3.2 Rake Receivers Utilizing a Universal Frequency Down-Conversion (UFD) Module
8.4 Early/Late Spread Spectrum Receiver
8.5 Integrated Up-Conversion and Spreading of a Spread Spectrum Signal
8.6 Integrated Up-Conversion and Spreading of Two Baseband signals to Generate an IQ Spread Spectrum Signal
8.6.1 Integrated Up-conversion and Spreading Using an Amplitude Shaper
8.6.2 Integrated Up-conversion and Spreading Using a Smoothly Varying Clock Signal
9.0 Conclusion 1. Universal Frequency Translation The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
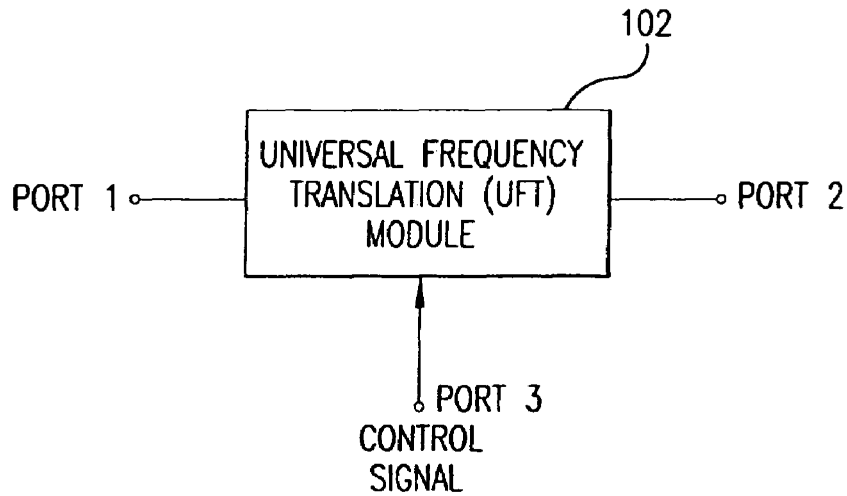
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
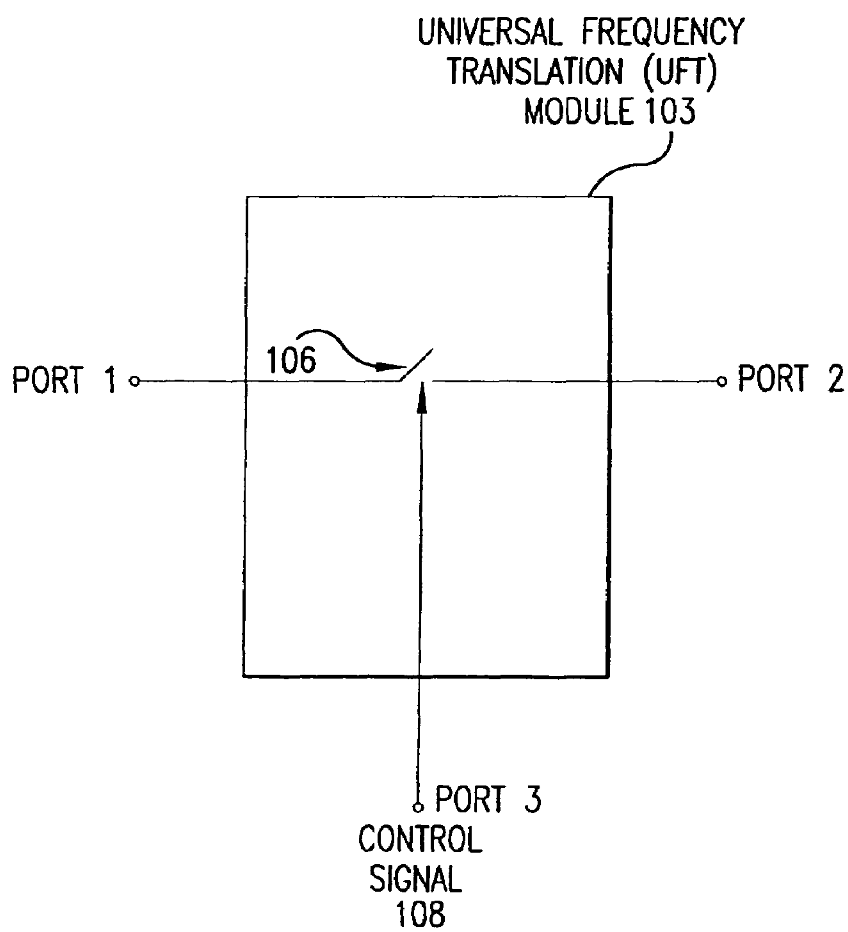
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2A:
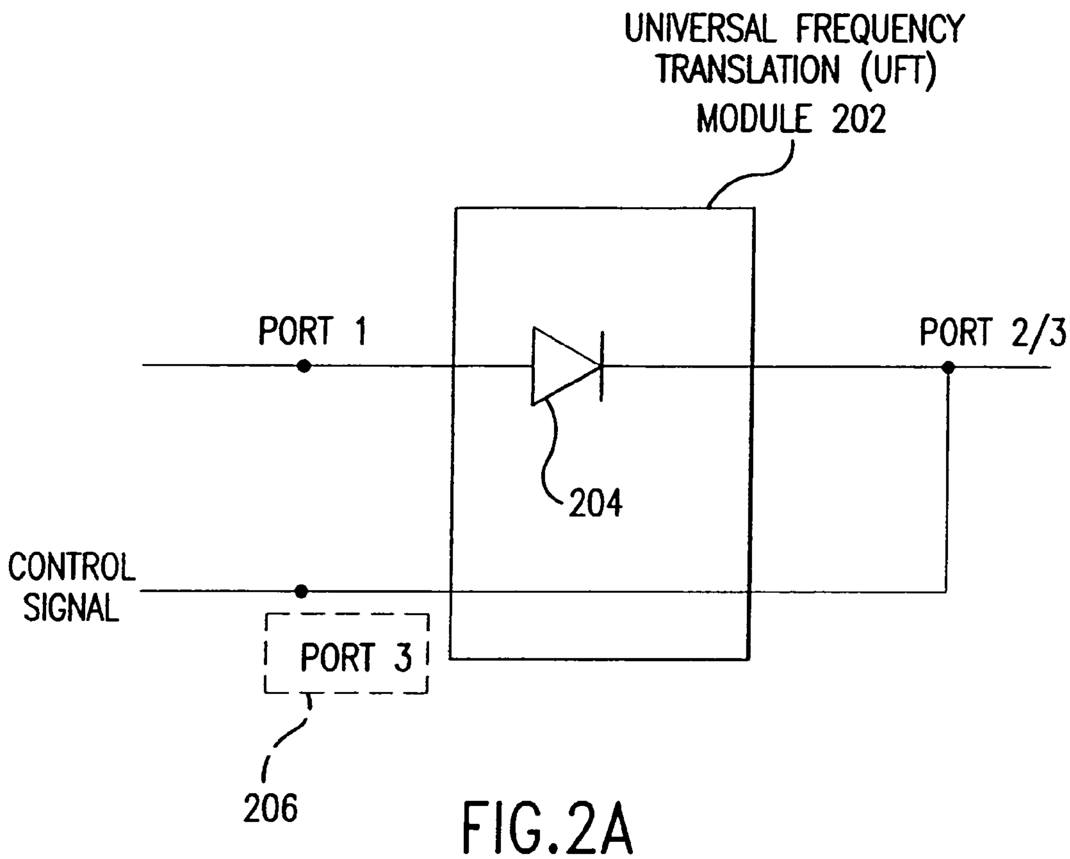
FIG. 2A is a block diagram of a universal frequency translation (UFT) module according to embodiments of the invention.
Figure 2B:
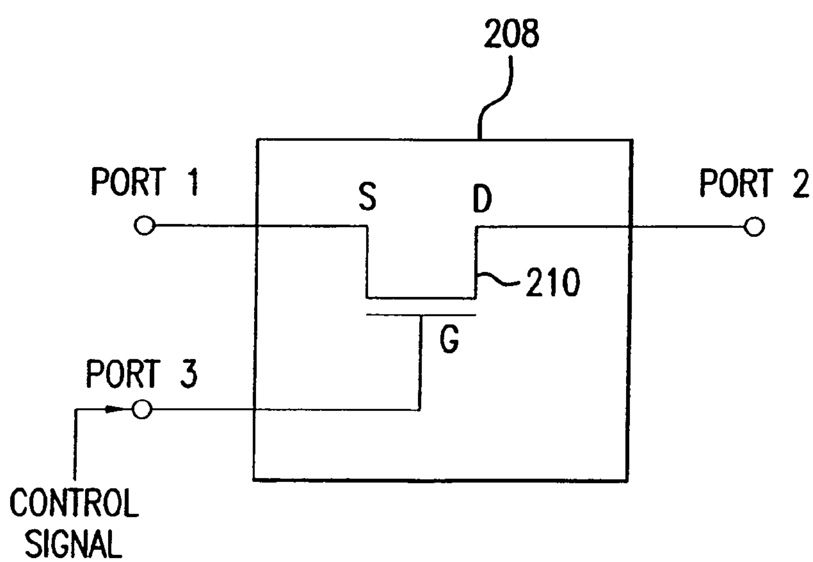
FIG. 2B is a block diagram of a universal frequency translation (UFT) module according to embodiments of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label. FIG. 2B illustrates a second example UFT module 208 having a FET 210 whose gate is controlled by the control signal.

The UFT module is a very powerful and flexible device. Its flexibility is illustrated, in part, by the wide range of applications in which it can be used. Its power is illustrated, in part, by the usefulness and performance of such applications.

Figure 1C:
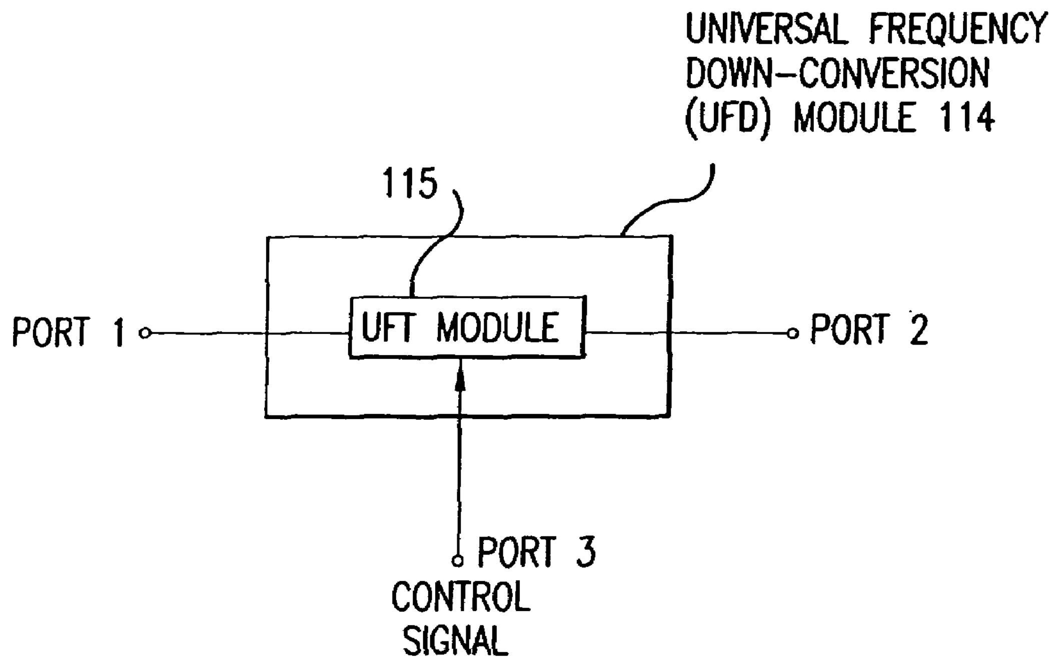
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
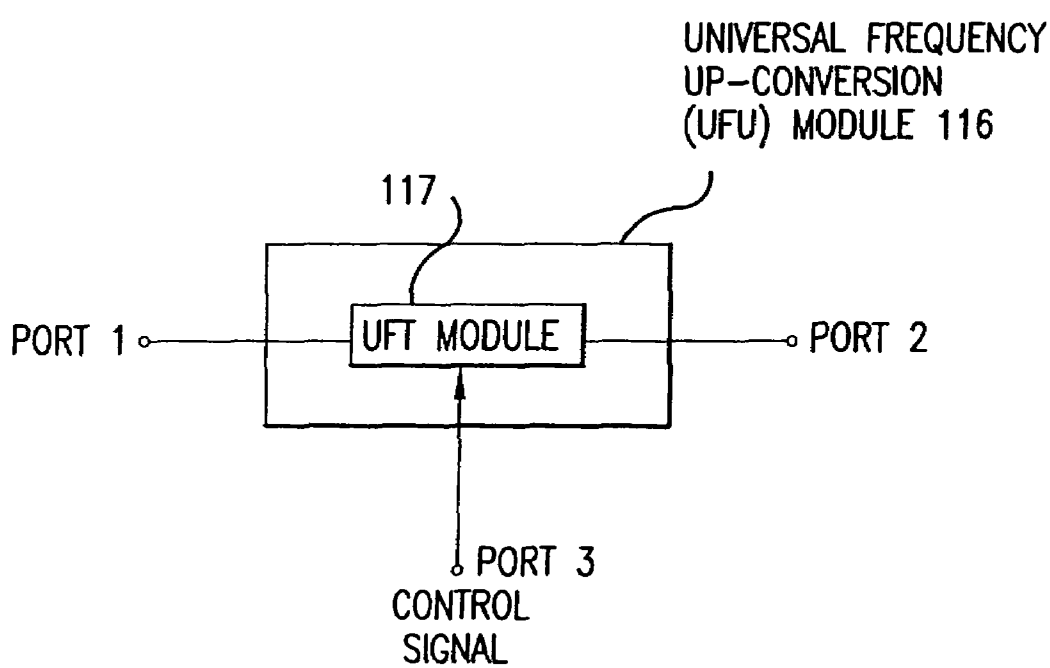
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2. Frequency Down-conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in co-pending U.S. patent application entitled "Method and System for Down-Converting Electromagnetic Signals," Ser. No. 09/176,022, filed Oct. 21, 1998, the full disclosure of which is incorporated herein by reference. A relevant portion of the above mentioned patent application is summarized below to describe down-converting an input signal to produce a down-converted signal that exists at a lower frequency or a baseband signal.

Figure 20A:
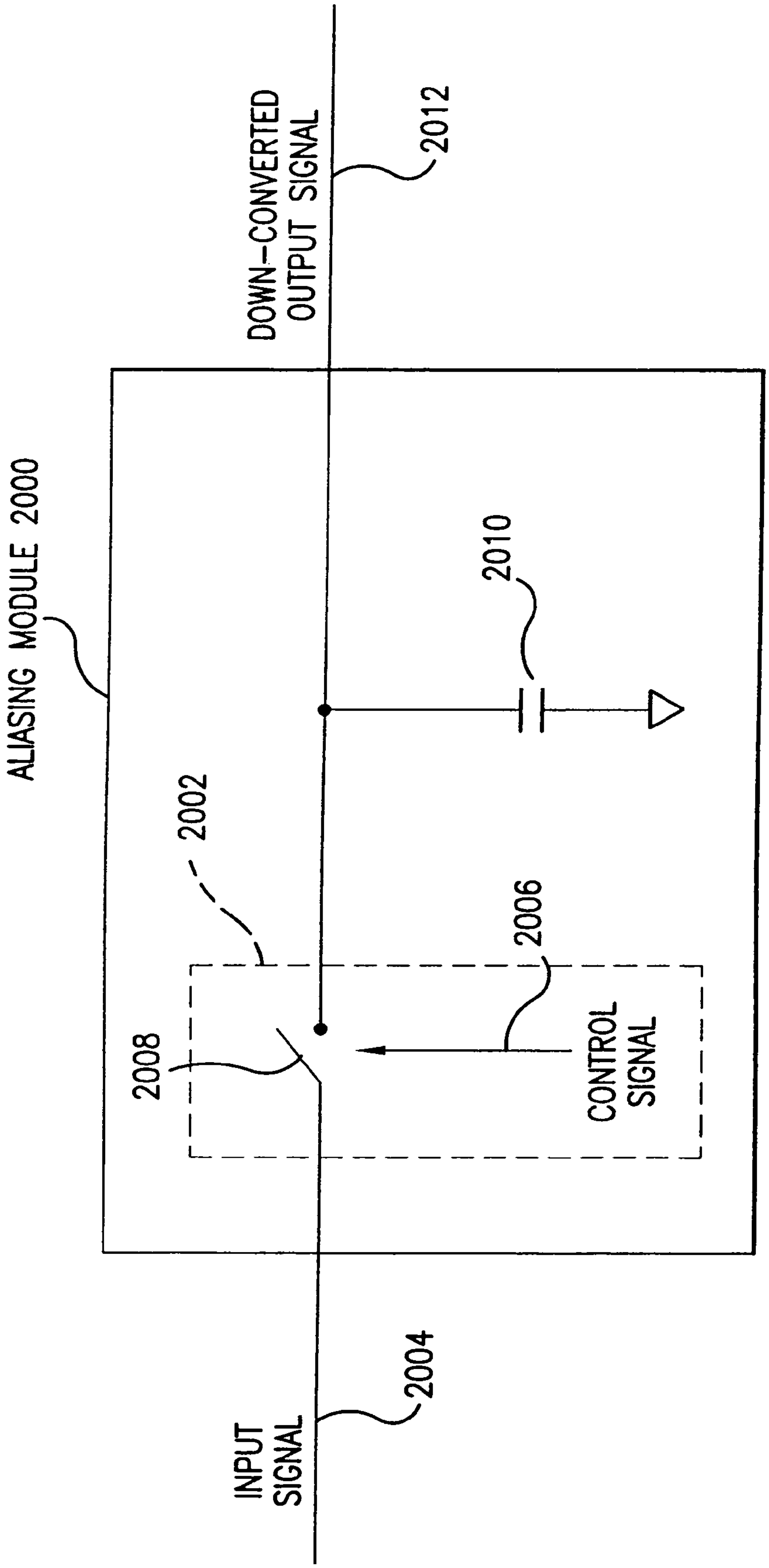
FIGS. 20A and 20A-1 are example aliasing modules according to embodiments of the invention.
Figures 1, 20A:
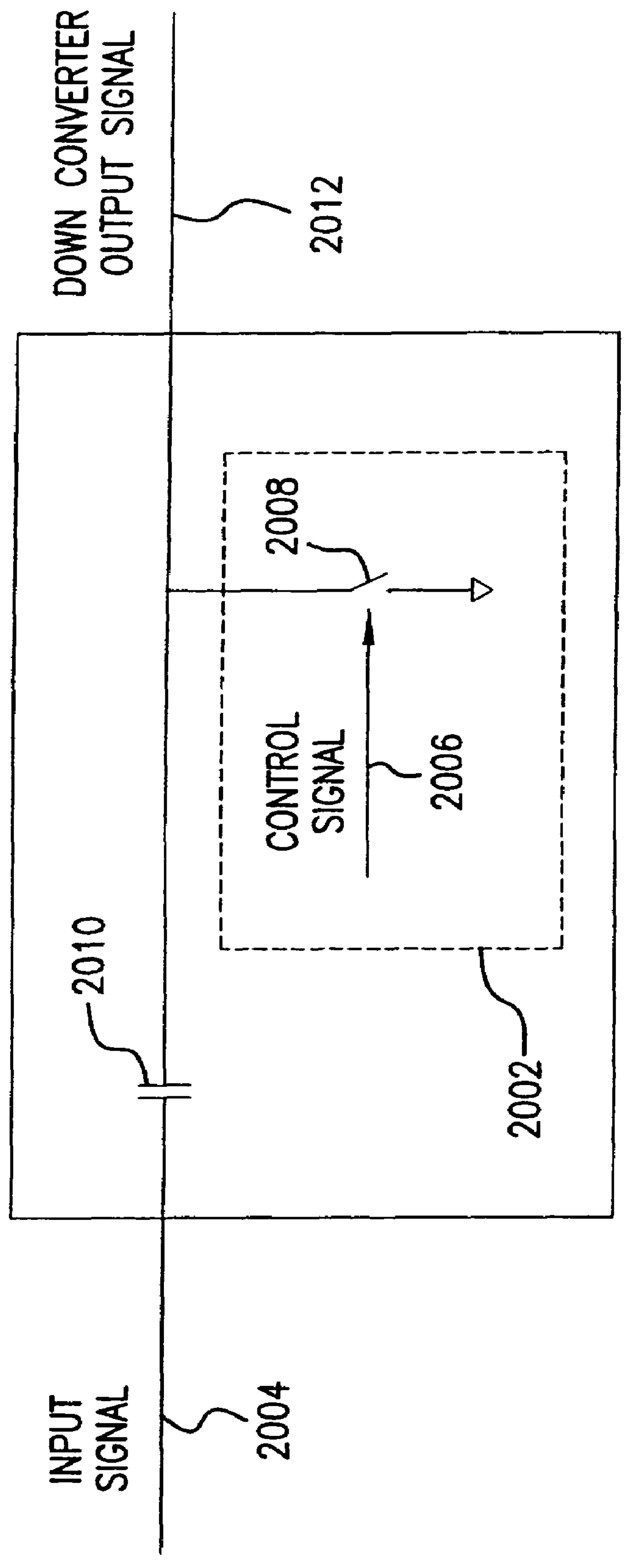

FIG. 20A illustrates an aliasing module 2000 (one embodiment of a UFD module) for down-conversion using a universal frequency translation (UFT) module 2002, which down-converts an EM input signal 2004. In particular embodiments, aliasing module 2000 includes a switch 2008 and a capacitor 2010. The electronic alignment of the circuit components is flexible. That is, in one implementation, the switch 2008 is in series with input signal 2004 and capacitor 2010 is shunted to ground (although it may be other than ground in configurations such as differential mode). In a second implementation (see FIG. 20A-1), the capacitor 2010 is in series with the input signal 2004 and the switch 2008 is shunted to ground (although it may be other than ground in configurations such as differential mode). Aliasing module 2000 with UFT module 2002 can be easily tailored to down-convert a wide variety of electromagnetic signals using aliasing frequencies that are well below the frequencies of the EM input signal 2004.

In one implementation, aliasing module 2000 down-converts the input signal 2004 to an intermediate frequency (IF) signal. In another implementation, the aliasing module 2000 down-converts the input signal 2004 to a demodulated baseband signal. In yet another implementation, the input signal 2004 is a frequency modulated (FM) signal, and the aliasing module 2000 down-converts it to a non-FM signal, such as a phase modulated (PM) signal or an amplitude modulated (AM) signal. Each of the above implementations is described below.

In an embodiment, the control signal 2006 includes a train of pulses that repeat at an aliasing rate that is equal to, or less than, twice the frequency of the input signal 2004. In this embodiment, the control signal 2006 is referred to herein as an aliasing signal because it is below the Nyquist rate for the frequency of the input signal 2004. Preferably, the frequency of control signal 2006 is much less than the input signal 2004.

Figure 20B:
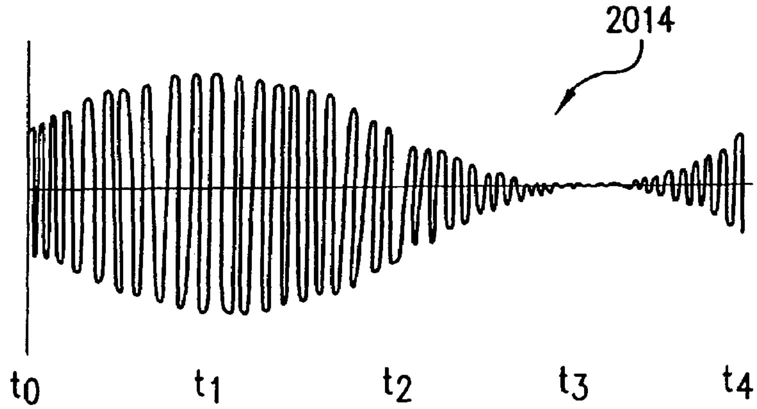
FIGS. 20B-20F are example waveforms used to describe the operation of the aliasing modules of FIGS. 20A and 20A-1.
Figure 20C:
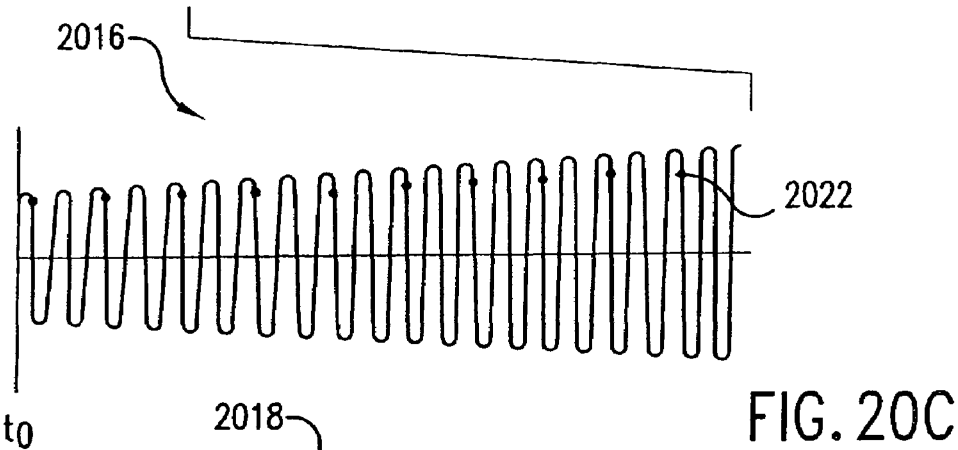
Figure 20D:
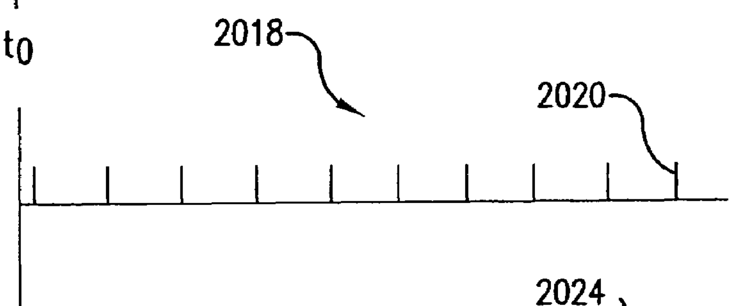
Figure 20E:
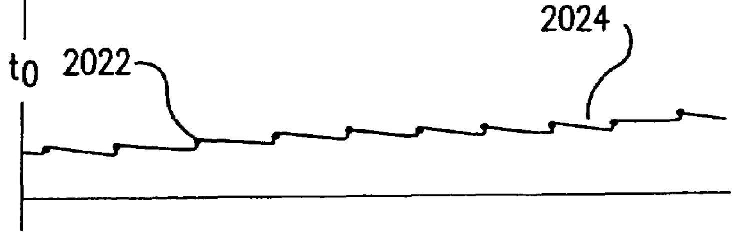

A train of pulses 2018 as shown in FIG. 20D controls the switch 2008 to alias the input signal 2004 with the control signal 2006 to generate a down-converted output signal 2012. More specifically, in an embodiment, switch 2008 closes on a first edge of each pulse 2020 of FIG. 20D and opens on a second edge of each pulse. When the switch 2008 is closed, the input signal 2004 is coupled to the capacitor 2010, and charge is transferred from the input signal to the capacitor 2010. The charge stored during successive pulses forms down-converted output signal 2012.

Exemplary waveforms are shown in FIGS. 20B-20F.

FIG. 20B illustrates an analog amplitude modulated (AM) carrier signal 2014 that is an example of input signal 2004.

For illustrative purposes, in FIG. 20C, an analog AM carrier signal portion 2016 illustrates a portion of the analog AM carrier signal 2014 on an expanded time scale. The analog AM carrier signal portion 2016 illustrates the analog AM carrier signal 2014 from time $t_0$ to time $t_1$.

FIG. 20D illustrates an exemplary aliasing signal 2018 that is an example of control signal 2006. Aliasing signal 2018 is on approximately the same time scale as the analog AM carrier signal portion 2016. In the example shown in FIG. 20D, the aliasing signal 2018 includes a train of pulses 2020 having negligible apertures that tend towards zero (the invention is not limited to this embodiment, as discussed below). The pulse aperture may also be referred to as the pulse width as will be understood by those skilled in the art(s). The pulses 2020 repeat at an aliasing rate, or pulse repetition rate of aliasing signal 2018. The aliasing rate is determined as described below, and further described in co-pending U.S. patent application entitled "Method and System for Down-converting Electromagnetic Signals," application Ser. No. 09/176,022.

Figure 20F:
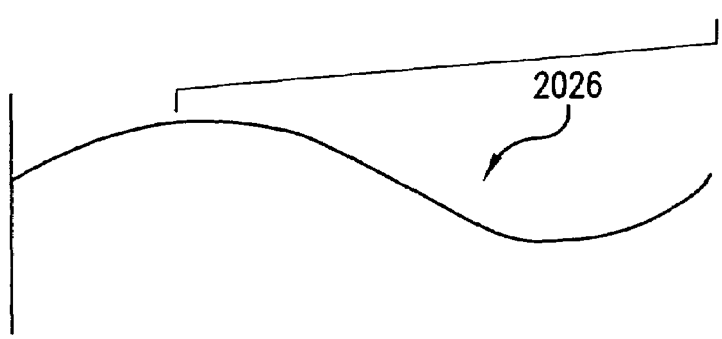

As noted above, the train of pulses 2020 (i.e., control signal 2006) control the switch 2008 to alias the analog AM carrier signal 2016 (i.e., input signal 2004) at the aliasing rate of the aliasing signal 2018. Specifically, in this embodiment, the switch 2008 closes on a first edge of each pulse and opens on a second edge of each pulse. When the switch 2008 is closed, input signal 2004 is coupled to the capacitor 2010, and charge is transferred from the input signal 2004 to the capacitor 2010. The charge transferred during a pulse is referred to herein as an under-sample. Exemplary under-samples 2022 form down-converted signal portion 2024 (FIG. 20E) that corresponds to the analog AM carrier signal portion 2016 (FIG. 20C) and the train of pulses 2020 (FIG. 20D). The charge stored during successive under-samples of AM carrier signal 2014 form the down-converted signal 2024 (FIG. 20E) that is an example of down-converted output signal 2012 (FIG. 20A). In FIG. 20F, a demodulated baseband signal 2026 represents the demodulated baseband signal 2024 after filtering on a compressed time scale. As illustrated, down-converted signal 2026 has substantially the same "amplitude envelope" as AM carrier signal 2014. Therefore, FIGS. 20B-20F illustrate down-conversion of AM carrier signal 2014.

The waveforms shown in FIGS. 20B-20F are discussed herein for illustrative purposes only, and are not limiting. Additional exemplary time domain and frequency domain drawings, and exemplary methods and systems of the invention relating thereto, are disclosed in co-pending U.S. patent application entitled "Method and System for Down-converting Electromagnetic Signals," application Ser. No. 09/176,022.

The aliasing rate of control signal 2006 determines whether the input signal 2004 is down-converted to an IF signal, down-converted to a demodulated baseband signal, or down-converted from an FM signal to a PM or an AM signal. Generally, relationships between the input signal 2004, the aliasing rate of the control signal 2006, and the down-converted output signal 2012 are illustrated below:

$$\text{(Freq. of input signal 2004)} = n \cdot \text{(Freq. of control signal 2006)} \pm \text{(Freq. of down-converted output signal 2012)}$$

For the examples contained herein, only the "+" condition will be discussed. The value of n represents a harmonic or sub-harmonic of input signal 2004 (e.g., n=0.5, 1, 2, 3, . . . ).

When the aliasing rate of control signal 2006 is off-set from the frequency of input signal 2004, or off-set from a harmonic or sub-harmonic thereof, input signal 2004 is down-converted to an IF signal. This is because the under-sampling pulses occur at different phases of subsequent cycles of input signal 2004. As a result, the under-samples form a lower frequency oscillating pattern. If the input signal 2004 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 2006 would be calculated as follows:

$$(\text{Freq}_{input} - \text{Freq}_{IF})/n = \text{Freq}_{control}$$

$$(901\ \text{MHZ} - 1\ \text{MHZ})/n = 900/n$$

For n=0.5, 1, 2, 3, 4, etc., the frequency of the control signal 2006 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in co-pending U.S. patent application entitled "Method and System for Down-converting Electromagnetic Signals," application Ser. No. 09/176,022.

Alternatively, when the aliasing rate of the control signal 2006 is substantially equal to the frequency of the input signal 2004, or substantially equal to a harmonic or sub-harmonic thereof, input signal 2004 is directly down-converted to a demodulated baseband signal. This is because, without modulation, the under-sampling pulses occur at the same point of subsequent cycles of the input signal 2004. As a result, the under-samples form a constant output baseband signal. If the input signal 2004 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 2006 would be calculated as follows:

$$(\text{Freq}_{input} - \text{Freq}_{IF})/n = \text{Freq}_{control}$$

$$(900\ \text{MHZ} - 0\ \text{MHZ})/n = 900\ \text{MHZ}/n$$

For n=0.5, 1, 2, 3, 4, etc., the frequency of the control signal 2006 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in the co-pending U.S. patent application entitled "Method and System for Down-converting Electromagnetic Signals," application Ser. No. 09/176,022.

Alternatively, to down-convert an input FM signal to a non-FM signal, a frequency within the FM bandwidth must be down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 2006 would be calculated as follows:

$$\text{Frequency of the input} = (F_1 + F_2) \div 2 = (899\text{ MHZ} + 901\text{ MHZ}) \div 2 = 900\text{ MHZ}$$

Frequency of the down-converted signal=0 (i.e., baseband)

$$(\text{Freq}_{input} - \text{Freq}_{IF})/n = \text{Freq}_{control}$$

$$(900\text{ MHZ}-0\text{ MHZ})/n = 900\text{ MHZ}/n$$

For n=0.5, 1, 2, 3, etc., the frequency of the control signal 2006 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 2006 should be substantially equal to:

$$(900\text{ MHZ}-0\text{ MHZ})/n = 900\text{ MHZ}/n, \text{ or}$$

$$(901\text{ MHZ}-0\text{ MHZ})/n = 901\text{ MHZ}/n.$$

For the former case of 900 MHZ/n, and for n=0.5, 1, 2, 3, 4, etc., the frequency of the control signal 2006 should be substantially equal to 1.8 GHz, 900 MHZ, 450 MHZ, 300 MHZ, 225 MHZ, etc. For the latter case of 901 MHZ/n, and for n=0.5, 1, 2, 3, 4, etc., the frequency of the control signal 2006 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in the co-pending U.S. patent application entitled "Method and System for Down-converting Electromagnetic Signals," application Ser. No. 09/176,022.

In an embodiment, the pulses of the control signal 2006 have negligible apertures that tend towards zero. This makes the UFT module 2002 a high input impedance device. This configuration is useful for situations where minimal disturbance of the input signal may be desired.

In another embodiment, the pulses of the control signal 2006 have non-negligible apertures that tend away from zero. This makes the UFT module 2002 a lower input impedance device. This allows the lower input impedance of the UFT module 2002 to be substantially matched with a source impedance of the input signal 2004. This also improves the energy transfer from the input signal 2004 to the down-converted output signal 2012, and hence the efficiency and signal to noise (s/n) ratio of UFT module 2002.

Exemplary systems and methods for generating and optimizing the control signal 2006, and for otherwise improving energy transfer and s/n ratio, are disclosed in the co-pending U.S. patent application entitled "Method and System for Down-converting Electromagnetic Signals," application Ser. No. 09/176,022.

When the pulses of the control signal 2006 have non-negligible apertures, the aliasing module 2000 is referred to interchangeably herein as an energy transfer module or a gated transfer module, and the control signal 2006 is referred to as an energy transfer signal. Exemplary systems and methods for generating and optimizing the control signal 2006 and for otherwise improving energy transfer and/or signal to noise ratio in an energy transfer module are described below.

2.1 Optional Energy Transfer Signal Module

FIG. 83 illustrates an energy transfer system 8301 that includes an optional energy transfer signal module 8302, which can perform any of a variety of functions or combinations of functions including, but not limited to, generating the energy transfer signal 8305.

In an embodiment, the optional energy transfer signal module 8302 includes an aperture generator, an example of which is illustrated in FIG. 82J as an aperture generator 8220. The aperture generator 8220 generates non-negligible aperture pulses 8226 from an input signal 8224. The input signal 8224 can be any type of periodic signal, including, but not limited to, a sinusoid, a square wave, a saw-tooth wave, etc. Systems for generating the input signal 8224 are described below.

The width or aperture of the pulses 8226 is determined by delay through the branch 8222 of the aperture generator 8220. Generally, as the desired pulse width increases, the difficulty in meeting the requirements of the aperture generator 8220 decrease. In other words, to generate non-negligible aperture pulses for a given EM input frequency, the components utilized in the example aperture generator 6820 do not require as fast reaction times as those that are required in an under-sampling system operating with the same EM input frequency.

The example logic and implementation shown in the aperture generator 8220 are provided for illustrative purposes only, and are not limiting. The actual logic employed can take many forms. The example aperture generator 8220 includes an optional inverter 8228, which is shown for polarity consistency with other examples provided herein.

An example implementation of the aperture generator 8220 is illustrated in FIG. 82K. Additional examples of aperture generation logic are provided in FIGS. 82H and 821. FIG. 82H illustrates a rising edge pulse generator 8240, which generates pulses 8226 on rising edges of the input signal 8224. FIG. 821 illustrates a falling edge pulse generator 8250, which generates pulses 8226 on falling edges of the input signal 8224.

In an embodiment, the input signal 8224 is generated externally of the energy transfer signal module 8302, as illustrated in FIG. 83. Alternatively, the input signal 8224 is generated internally by the energy transfer signal module 8302. The input signal 8224 can be generated by an oscillator, as illustrated in FIG. 82L by an oscillator 6830. The oscillator 8230 can be internal to the energy transfer signal module 8302 or external to the energy transfer signal module 8302. The oscillator 8230 can be external to the energy transfer system 8301. The output of the oscillator 8230 may be any periodic waveform.

The type of down-conversion performed by the energy transfer system 8301 depends upon the aliasing rate of the energy transfer signal 8305, which is determined by the frequency of the pulses 8226. The frequency of the pulses 8226 is determined by the frequency of the input signal 8224. For example, when the frequency of the input signal 8224 is substantially equal to a harmonic or a sub-harmonic of the EM signal 8103, the EM signal 8103 is directly down-converted to baseband (e.g. when the EM signal is an AM signal or a PM signal), or converted from FM to a non-FM signal. When the frequency of the input signal 8224 is substantially equal to a harmonic or a sub-harmonic of a difference frequency, the EM signal 8103 is down-converted to an intermediate signal.

The optional energy transfer signal module 8302 can be implemented in hardware, software, firmware, or any combination thereof.

2.2 Smoothing the Down-converted Signal

Referring back to FIG. 20A, the down-converted output signal 2012 may be smoothed by filtering as desired.

2.3 Impedance Matching

The energy transfer module 2000 has input and output impedances generally defined by (1) the duty cycle of the switch module (i.e., UFT 2002), and (2) the impedance of the storage module (e.g., capacitor 2010), at the frequencies of interest (e.g. at the EM input, and intermediate/baseband frequencies).

Starting with an aperture width of approximately ½ the period of the EM signal being down-converted as a preferred embodiment, this aperture width (e.g. the "closed time") can be decreased. As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Referring to FIG. 84, a specific embodiment using an RF signal as an input, assuming that the impedance 8412 is a relatively low impedance of approximately 50 Ohms, for example, and the input impedance 8416 is approximately 300 Ohms, an initial configuration for the input impedance match module 8406 can include an inductor 8606 and a capacitor 8608, configured as shown in FIG. 86. The configuration of the inductor 8606 and the capacitor 8608 is a possible configuration when going from a low impedance to a high impedance. Inductor 8606 and the capacitor 8608 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 8614 and an inductor 8616 can be configured as shown in FIG. 86. The capacitor 8614 and the inductor 8616 constitute an L match, the calculation of the component values being well known to those skilled in the relevant arts.

The configuration of the input impedance match module 8406 and the output impedance match module 8408 are considered to be initial starting points for impedance matching, in accordance with the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria.

2.4 Tanks and Resonant Structures

Resonant tank and other resonant structures can be used to further optimize the energy transfer characteristics of the invention. For example, resonant structures, resonant about the input frequency, can be used to store energy from the input signal when the switch is open, a period during which one may conclude that the architecture would otherwise be limited in its maximum possible efficiency. Resonant tank and other resonant structures can include, but are not limited to, surface acoustic wave (SAW) filters, dielectric resonators, diplexers, capacitors, inductors, etc.

An example embodiment is shown in FIG. 96A. Two additional embodiments are shown in FIG. 91 and FIG. 99. Alternate implementations will be apparent to persons skilled in the relevant art(s) based on the teachings contained herein. Alternate implementations fall within the scope and spirit of the present invention. These implementations take advantage of properties of series and parallel (tank) resonant circuits.

FIG. 96A illustrates parallel tank circuits in a differential implementation. A first parallel resonant or tank circuit consists of a capacitor 9638 and an inductor 9620 (tank1). A second tank circuit consists of a capacitor 9634 and an inductor 9636 (tank2).

As is apparent to one skilled in the relevant art(s), parallel tank circuits provide:

low impedance to frequencies below resonance;
low impedance to frequencies above resonance; and
high impedance to frequencies at and near resonance.

In the illustrated example of FIG. 96A, the first and second tank circuits resonate at approximately 920 Mhz. At and near resonance, the impedance of these circuits is relatively high. Therefore, in the circuit configuration shown in FIG. 96A, both tank circuits appear as relatively high impedance to the input frequency of 950 Mhz, while simultaneously appearing as relatively low impedance to frequencies in the desired output range of 50 Mhz.

An energy transfer signal 9642 controls a switch 9614. When the energy transfer signal 9642 controls the switch 9614 to open and close, high frequency signal components are not allowed to pass through tank1 or tank2. However, the lower signal components (50 Mhz in this embodiment) generated by the system are allowed to pass through tank1 and tank2 with little attenuation. The effect of tank1 and tank2 is to further separate the input and output signals from the same node thereby producing a more stable input and output impedance. Capacitors 9618 and 9640 act to store the 50 Mhz output signal energy between energy transfer pulses.

Further energy transfer optimization is provided by placing an inductor 9610 in series with a storage capacitor 9612 as shown. In the illustrated example, the series resonant frequency of this circuit arrangement is approximately 1 GHz. This circuit increases the energy transfer characteristic of the system. The ratio of the impedance of inductor 9610 and the impedance of the storage capacitor 9612 is preferably kept relatively small so that the majority of the energy available will be transferred to storage capacitor 9612 during operation. Exemplary output signals A and B are illustrated in FIGS. 96B and 96C, respectively.

In FIG. 96A, circuit components 9604 and 9606 form an input impedance match. Circuit components 9632 and 9630 form an output impedance match into a 50 ohm resistor 9628. Circuit components 9622 and 9624 form a second output impedance match into a 50 ohm resistor 9626. Capacitors 9608 and 9612 act as storage capacitors for the embodiment. Voltage source 9646 and resistor 9602 generate a 950 Mhz signal with a 50 ohm output impedance, which are used as the input to the circuit. Circuit element 9616 includes a 150 Mhz oscillator and a pulse generator, which are used to generate the energy transfer signal 9642.

FIG. 91 illustrates a shunt tank circuit 9110 in a single-ended to-single-ended system 9112. Similarly, FIG. 99 illustrates a shunt tank circuit 9910 in a system 9912. The tank circuits 9110 and 9910 lower driving source impedance, which improves transient response. The tank circuits 9110 and 9910 are able store the energy from the input signal and provide a low driving source impedance to transfer that energy throughout the aperture of the closed switch. The transient nature of the switch aperture can be viewed as having a response that, in addition to including the input frequency, has large component frequencies above the input frequency, (i.e. higher frequencies than the input frequency are also able to effectively pass through the aperture). Resonant circuits or structures, for example resonant tanks 9110 or 9910, can take advantage of this by being able to transfer energy throughout the switch's transient frequency response (i.e. the capacitor in the resonant tank appears as a low driving source impedance during the transient period of the aperture).

The example tank and resonant structures described above are for illustrative purposes and are not limiting. Alternate configurations can be utilized. The various resonant tanks and structures discussed can be combined or utilized independently as is now apparent.

2.5 Charge and Power Transfer Concepts

Concepts of charge transfer are now described with reference to FIGS. 107A-F. FIG. 107A illustrates a circuit 10702, including a switch S and a capacitor 10706 having a capacitance C. The switch S is controlled by a control signal 10708, which includes pulses 10710 having apertures T.

In FIG. 107B, Equation 10 illustrates that the charge q on a capacitor having a capacitance C, such as the capacitor 10706, is proportional to the voltage V across the capacitor, where:

q=Charge in Coulombs

C=Capacitance in Farads

V=Voltage in Volts

A=Input Signal Amplitude

Where the voltage V is represented by Equation 11, Equation 10 can be rewritten as Equation 12. The change in charge Δq over time t is illustrated as in Equation 13 as Δq(t), which can be rewritten as Equation 14. Using the sum-to-product trigonometric identity of Equation 15, Equation 14 can be rewritten as Equation 16, which can be rewritten as equation 17.

Note that the sin term in Equation 11 is a function of the aperture T only. Thus, Δq(t) is at a maximum when T is equal to an odd multiple of π (i.e., π, 3π, 5π, . . . ). Therefore, the capacitor 10906 experiences the greatest change in charge when the aperture T has a value of π or a time interval representative of 180 degrees of the input sinusoid. Conversely, when T is equal to 2π, 4π, 6π, . . . , minimal charge is transferred.

Equations 18, 19, and 20 solve for q(t) by integrating Equation 10, allowing the charge on the capacitor 10706 with respect to time to be graphed on the same axis as the input sinusoid sin(t), as illustrated in the graph of FIG. 107C. As the aperture T decreases in value or tends toward an impulse, the phase between the charge on the capacitor C or q(t) and sin(t) tend toward zero. This is illustrated in the graph of FIG. 107D, which indicates that the maximum impulse charge transfer occurs near the input voltage maxima. As this graph indicates, considerably less charge is transferred as the value of T decreases.

Power/charge relationships are illustrated in Equations 21-26 of FIG. 107E, where it is shown that power is proportional to charge, and transferred charge is inversely proportional to insertion loss.

Concepts of insertion loss are illustrated in FIG. 107F. Generally, the noise figure of a lossy passive device is numerically equal to the device insertion loss. Alternatively, the noise figure for any device cannot be less that its insertion loss. Insertion loss can be expressed by Equation 27 or 28. From the above discussion, it is observed that as the aperture T increases, more charge is transferred from the input to the capacitor 10706, which increases power transfer from the input to the output. It has been observed that it is not necessary to accurately reproduce the input voltage at the output because relative modulated amplitude and phase information is retained in the transferred power.

2.6 Optimizing and Adjusting the Non-Negligible Aperture Width/Duration (i) Varying Input and Output Impedances In an embodiment of the invention, the energy transfer signal (i.e., control signal 2006 in FIG. 20A), is used to vary the input impedance seen by the EM Signal 2004 and to vary the output impedance driving a load. An example of this embodiment is described below using a gated transfer module 8703 shown in FIG. 87A. The method described below is not limited to the gated transfer module 8703.

In FIG. 87A, when switch 8706 is closed, the impedance looking into circuit 8702 is substantially the impedance of a storage module, illustrated here as a storage capacitance 8708, in parallel with the impedance of a load 8712. When the switch 8706 is open, the impedance at point 8714 approaches infinity. It follows that the average impedance at point 8714 can be varied from the impedance of the storage module illustrated in parallel with the load 8712, to the highest obtainable impedance when switch 8706 is open, by varying the ratio of the time that switch 8706 is open to the time switch 8706 is closed. The switch 8706 is controlled by an energy transfer signal 8710. Thus the impedance at point 8714 can be varied by controlling the aperture width of the energy transfer signal in conjunction with the aliasing rate.

Figure 85C:
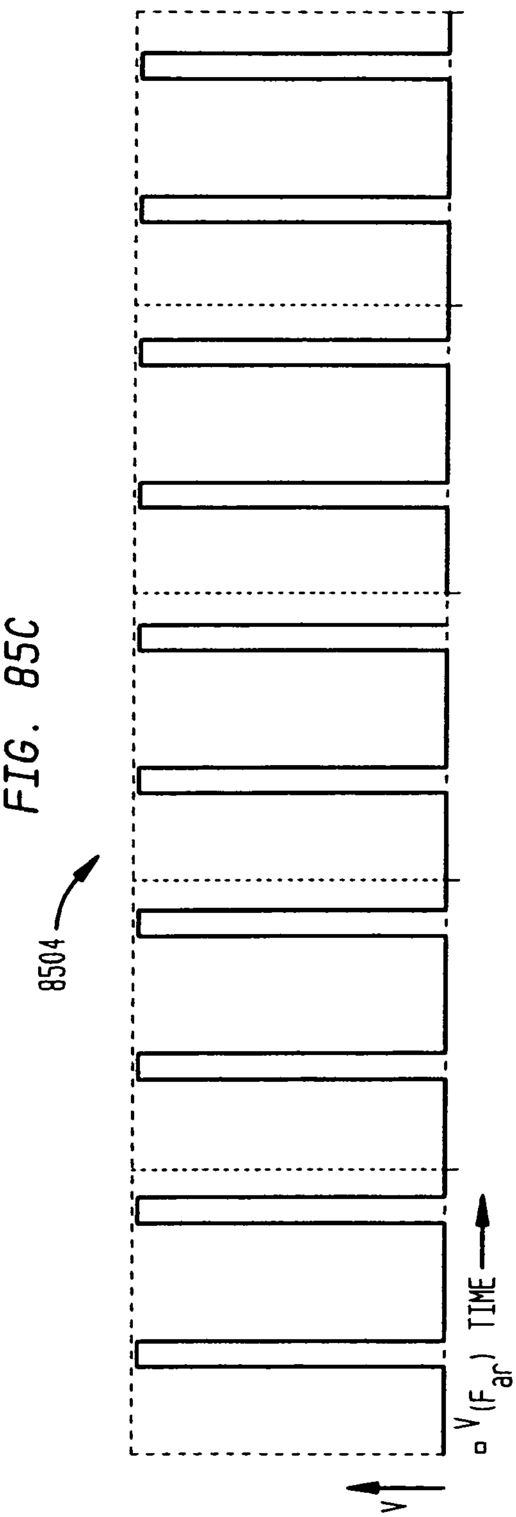

An example method of altering the energy transfer signal 8710 of FIG. 87A is now described with reference to FIG. 85A, where a circuit 8502 receives an input oscillating signal 8506 and outputs a pulse train shown as doubler output signal 8504. The circuit 8502 can be used to generate the energy transfer signal 8710. Example waveforms of 8504 are shown on FIG. 85C.

It can be shown that by varying the delay of the signal propagated by the inverter 8508, the width of the pulses in the doubler output signal 8504 can be varied. Increasing the delay of the signal propagated by inverter 8508, increases the width of the pulses. The signal propagated by inverter 8508 can be delayed by introducing a R/C low pass network in the output of inverter 8508. Other means of altering the delay of the signal propagated by inverter 8508 will be well known to those skilled in the art.

(ii) Real Time Aperture Control

In an embodiment, the aperture width/duration is adjusted in real time. For example, referring to the timing diagrams in FIGS. 100B-F, a clock signal 10014 (FIG. 100B) is utilized to generate an energy transfer signal 10016 (FIG. 100F), which includes energy transfer pluses 10018, having variable apertures 10020. In an embodiment, the clock signal 10014 is inverted as illustrated by inverted clock signal 10022 (FIG. 100D). The clock signal 10014 is also delayed, as illustrated by delayed clock signal 10024 (FIG. 100E). The inverted clock signal 10014 and the delayed clock signal 10024 are then ANDed together, generating an energy transfer signal 10016, which is active—energy transfer pulses 10018—when the delayed clock signal 10024 and the inverted clock signal 10022 are both active. The amount of delay imparted to the delayed clock signal 10024 substantially determines the width or duration of the apertures 10020. By varying the delay in real time, the apertures are adjusted in real time.

In an alternative implementation, the inverted clock signal 10022 is delayed relative to the original clock signal 10014, and then ANDed with the original clock signal 10014. Alternatively, the original clock signal 10014 is delayed then inverted, and the result ANDed with the original clock signal 10014.

FIG. 100A illustrates an exemplary real time aperture control system 10002 that can be utilized to adjust apertures in real time. The example real time aperture control system 10002 includes an RC circuit 10004, which includes a voltage variable capacitor 10012 and a resistor 10026. The real time aperture control system 10002 also includes an inverter 10006 and an AND gate 10008. The AND gate 10008 optionally includes an enable input 10010 for enabling/disabling the AND gate 10008. The RC circuit 10004. The real time aperture control system 10002 optionally includes an amplifier 10028.

Operation of the real time aperture control circuit is described with reference to the timing diagrams of FIGS. 100B-F. The real time control system 10002 receives the input clock signal 10014, which is provided to both the inverter 10006 and to the RC circuit 10004. The inverter 10006 outputs the inverted clock signal 10022 and presents it to the AND gate 10008. The RC circuit 10004 delays the clock signal 10014 and outputs the delayed clock signal 10024. The delay is determined primarily by the capacitance of the voltage variable capacitor 10012. Generally, as the capacitance decreases, the delay decreases.

The delayed clock signal 10024 is optionally amplified by the optional amplifier 10028, before being presented to the AND gate 10008. Amplification is desired, for example, where the RC constant of the RC circuit 10004 attenuates the signal below the threshold of the AND gate 10008.

The AND gate 10008 ANDs the delayed clock signal 10024, the inverted clock signal 10022, and the optional Enable signal 10010, to generate the energy transfer signal 10016. The apertures 10020 are adjusted in real time by varying the voltage to the voltage variable capacitor 10012.

In an embodiment, the apertures 9820 are controlled to optimize power transfer. For example, in an embodiment, the apertures 10020 are controlled to maximize power transfer. Alternatively, the apertures 10020 are controlled for variable gain control (e.g. automatic gain control—AGC). In this embodiment, power transfer is reduced by reducing the apertures 10020.

As can now be readily seen from this disclosure, many of the aperture circuits presented, and others, can be modified as in circuits illustrated in FIGS. 82H-K. Modification or selection of the aperture can be done at the design level to remain a fixed value in the circuit, or in an alternative embodiment, may be dynamically adjusted to compensate for, or address, various design goals such as receiving RF signals with enhanced efficiency that are in distinctively different bands of operation, e.g. RF signals at 900 MHz and 1.8 GHz.

2.7 Adding a Bypass Network

In an embodiment of the invention, a bypass network is added to improve the efficiency of the energy transfer module. Such a bypass network can be viewed as a means of synthetic aperture widening. Components for a bypass network are selected so that the bypass network appears substantially lower impedance to transients of the switch module (i.e., frequencies greater than the received EM signal) and appears as a moderate to high impedance to the input EM signal (e.g., greater that 100 Ohms at the RF frequency).

The time that the input signal is now connected to the opposite side of the switch module is lengthened due to the shaping caused by this network, which in simple realizations may be a capacitor or series resonant inductor-capacitor. A network that is series resonant above the input frequency would be a typical implementation. This shaping improves the conversion efficiency of an input signal that would otherwise, if one considered the aperture of the energy transfer signal only, be relatively low in frequency to be optimal.

For example, referring to FIG. 97 a bypass network 9702 shown in this instance as capacitor 9712), is shown bypassing switch module 9704. In this embodiment the bypass network increases the efficiency of the energy transfer module when, for example, less than optimal aperture widths were chosen for a given input frequency on the energy transfer signal 9706. The bypass network 9702 could be of different configurations than shown in FIG. 97. Such an alternate is illustrated in FIG. 93. Similarly, FIG. 98 illustrates another example bypass network 9802, including a capacitor 9804.

The following discussion will demonstrate the effects of a minimized aperture and the benefit provided by a bypassing network. Beginning with an initial circuit having a 550 ps aperture in FIG. 101, its output is seen to be 2.8 mVpp applied to a 50 ohm load in FIG. 105A. Changing the aperture to 270 ps as shown in FIG. 102 results in a diminished output of 2.5 Vpp applied to a 50 ohm load as shown in FIG. 105B. To compensate for this loss, a bypass network may be added, a specific implementation is provided in FIG. 103. The result of this addition is that 3.2 Vpp can now be applied to the 50 ohm load as shown in FIG. 106A. The circuit with the bypass network in FIG. 103 also had three values adjusted in the surrounding circuit to compensate for the impedance changes introduced by the bypass network and narrowed aperture. FIG. 104 verifies that those changes added to the circuit, but without the bypass network, did not themselves bring about the increased efficiency demonstrated by the embodiment in FIG. 103 with the bypass network. FIG. 106B shows the result of using the circuit in FIG. 104 in which only 1.88 Vpp was able to be applied to a 50 ohm load.

2.8 Modifying the Energy Transfer Signal Utilizing Feedback

FIG. 83 shows an embodiment of a system 8301 which uses down-converted signal 8307 as feedback 8306 to control various characteristics of the energy transfer module 8303 to modify the down-converted signal 8307.

Generally, the amplitude of the down-converted signal 8307 varies as a function of the frequency and phase differences between the EM signal 1304 and the energy transfer signal 6306. In an embodiment, the down-converted signal 8307 is used as the feedback 8306 to control the frequency and phase relationship between the EM signal 8103 and the energy transfer signal 8305. This can be accomplished using the example logic in FIG. 88A. The example circuit in FIG. 88A can be included in the energy transfer signal module 6902. Alternate implementations will be apparent to persons skilled in the relevant art(s) based on the teachings contained herein. Alternate implementations fall within the scope and spirit of the present invention. In this embodiment a state-machine is used as an example.

In the example of FIG. 88A, a state machine 8804 reads an analog to digital converter, A/D 8802, and controls a digital to analog converter, DAC 8806. In an embodiment, the state machine 8804 includes 2 memory locations, Previous and Current, to store and recall the results of reading A/D 8802. In an embodiment, the state machine 8804 utilizes at least one memory flag.

The DAC 8806 controls an input to a voltage controlled oscillator, VCO 8808. VCO 8808 controls a frequency input of a pulse generator 8810, which, in an embodiment, is substantially similar to the pulse generator shown in FIG. 82J. The pulse generator 8810 generates energy transfer signal 6306.

In an embodiment, the state machine 8804 operates in accordance with a state machine flowchart 8819 in FIG. 88B. The result of this operation is to modify the frequency and phase relationship between the energy transfer signal 8305 and the EM signal 8103, to substantially maintain the amplitude of the down-converted signal 8307 at an optimum level.

Figure 81A:
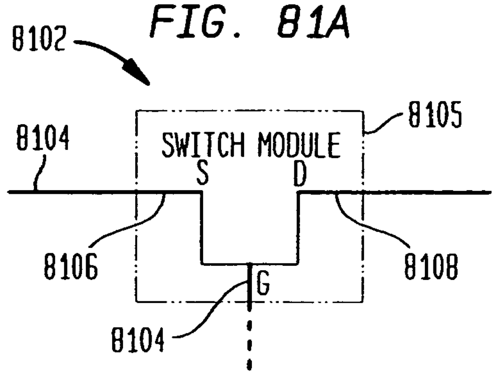
Figure 81B:
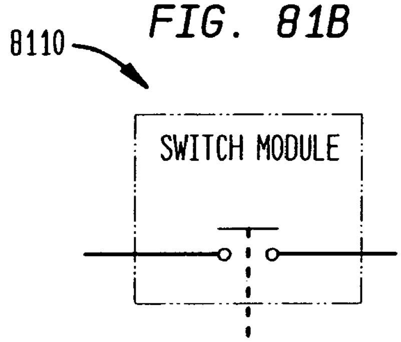
Figure 81C:
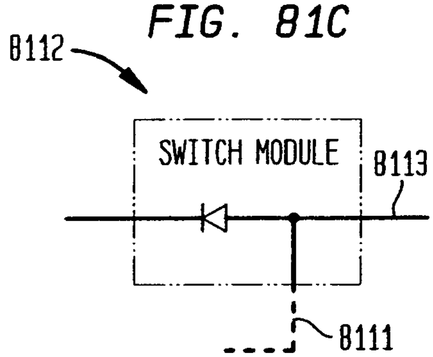
Figure 81D:
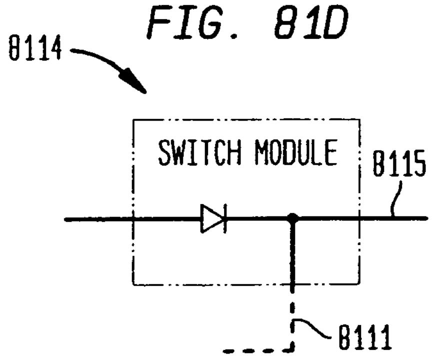
Figure 82A:
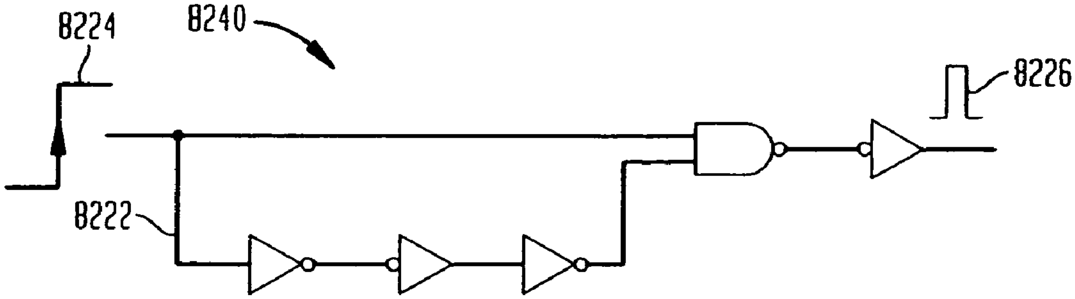
Figure 82B:
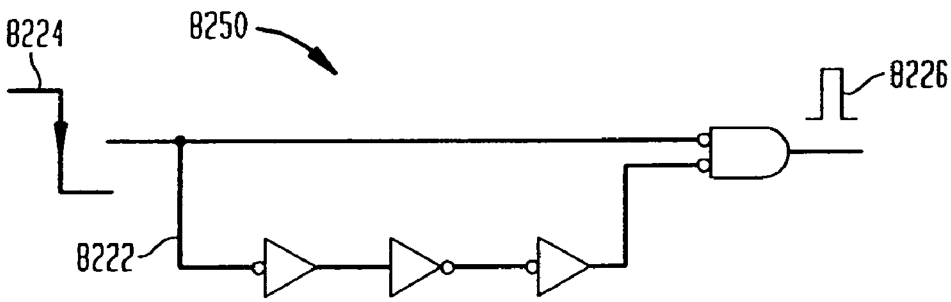
Figure 82C:
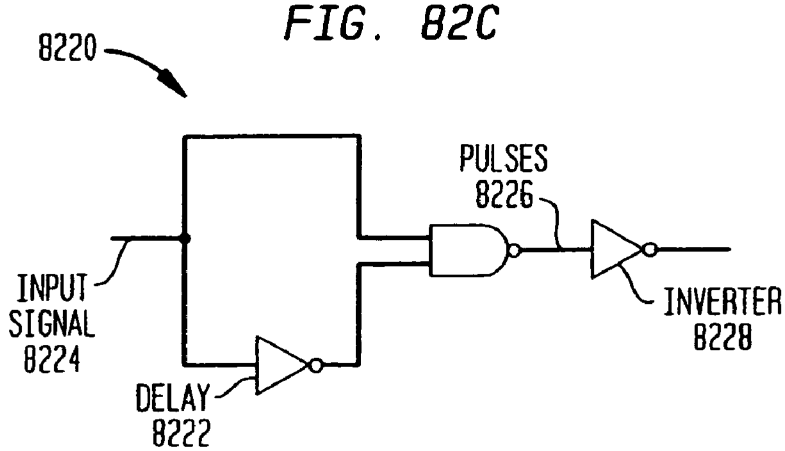
Figure 82D:
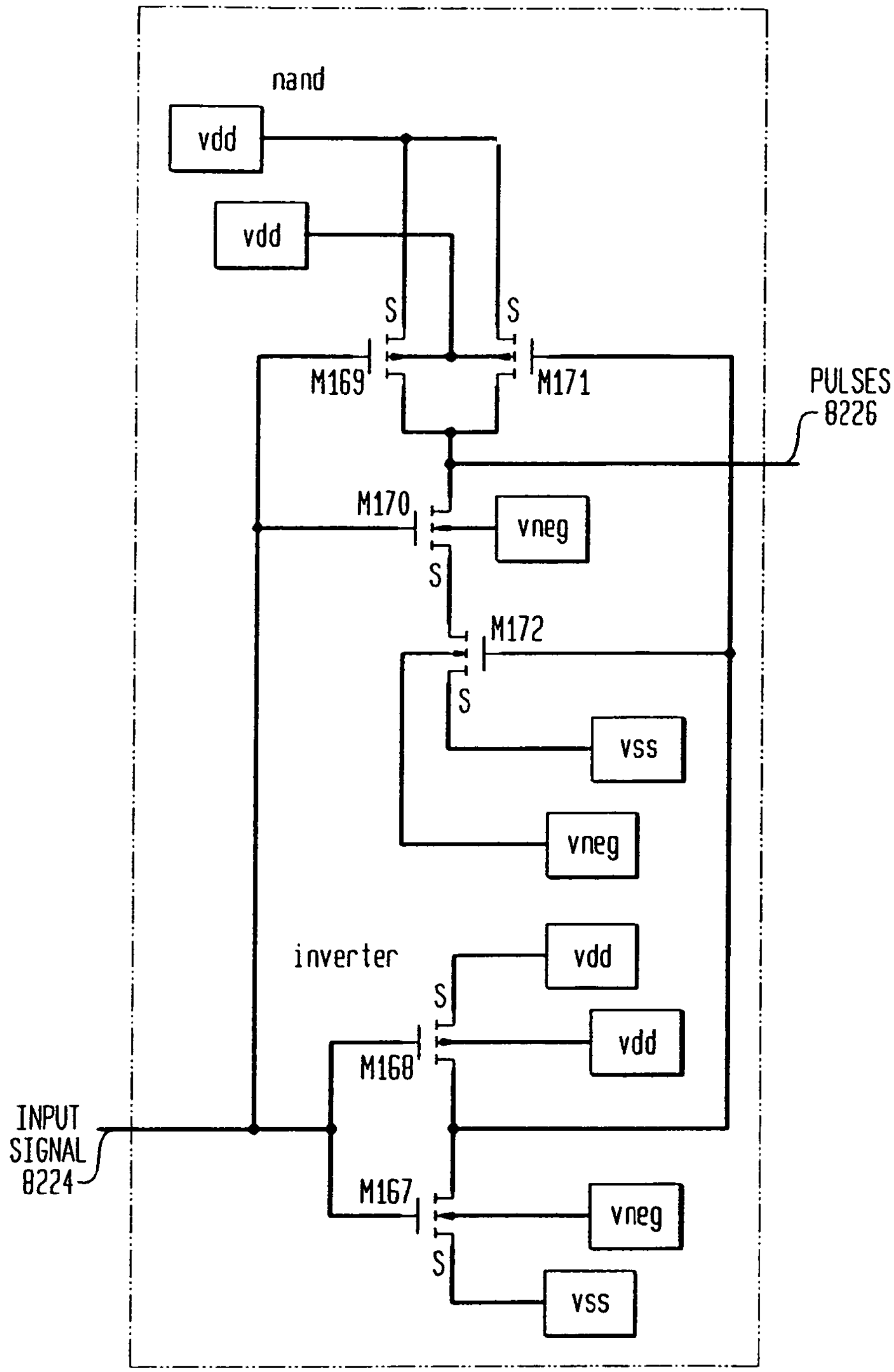
Figure 82E:
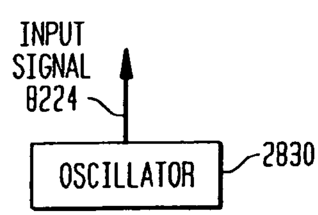

The amplitude of the down-converted signal 8307 can be made to vary with the amplitude of the energy transfer signal 8305. In an embodiment where the switch module 8105 is a FET as shown in FIG. 81A, wherein the gate 8104 receives the energy transfer signal 8111, the amplitude of the energy transfer signal 8111 can determine the "on" resistance of the FET, which affects the amplitude of the down-converted signal 8307. The energy transfer signal module 8302, as shown in FIG. 88C, can be an analog circuit that enables an automatic gain control function. Alternate implementations will be apparent to persons skilled in the relevant art(s) based on the teachings contained herein. Alternate implementations fall within the scope and spirit of the present invention.

2.9 Other Implementations

The implementations described above are provided for purposes of illustration. These implementations are not intended to limit the invention. Alternate implementations, differing slightly or substantially from those described herein, will be apparent to persons skilled in the relevant art(s) based on the teachings contained herein. Such alternate implementations fall within the scope and spirit of the present invention.

2.10 Example Energy Transfer Down-Converters

Example implementations are described below for illustrative purposes. The invention is not limited to these examples.

FIG. 89 is a schematic diagram of an exemplary circuit to down convert a 915 MHZ signal to a 5 MHZ signal using a 101.1 MHZ clock.

FIG. 90 shows example simulation waveforms for the circuit of FIG. 89. Waveform 8902 is the input to the circuit showing the distortions caused by the switch closure. Waveform 8904 is the unfiltered output at the storage unit. Waveform 8906 is the impedance matched output of the downconverter on a different time scale.

FIG. 91 is a schematic diagram of an exemplary circuit to downconvert a 915 MHZ signal to a 5 MHZ signal using a 101.1 MHZ clock. The circuit has additional tank circuitry to improve conversion efficiency.

FIG. 92 shows example simulation waveforms for the circuit of FIG. 91. Waveform 9102 is the input to the circuit showing the distortions caused by the switch closure. Waveform 9104 is the unfiltered output at the storage unit. Waveform 9106 is the output of the downconverter after the impedance match circuit.

FIG. 93 is a schematic diagram of an exemplary circuit to downconvert a 915 MHZ signal to a 5 MHZ signal using a 101.1 MHZ clock. The circuit has switch bypass circuitry to improve conversion efficiency.

FIG. 94 shows example simulation waveforms for the circuit of FIG. 93. Waveform 9302 is the input to the circuit showing the distortions caused by the switch closure. Waveform 9304 is the unfiltered output at the storage unit. Waveform 9306 is the output of the downconverter after the impedance match circuit.

FIG. 95 shows a schematic of the example circuit in FIG. 89 connected to an FSK source that alternates between 913 and 917 MHZ, at a baud rate of 500 Kbaud.

FIG. 93 shows the original FSK waveform 9202 and the downconverted waveform 9204 at the output of the load impedance match circuit.

3. Frequency Up-conversion Using Universal Frequency Translation

The present invention is directed to systems and methods of frequency up-conversion, and applications of same.

Figure 3:
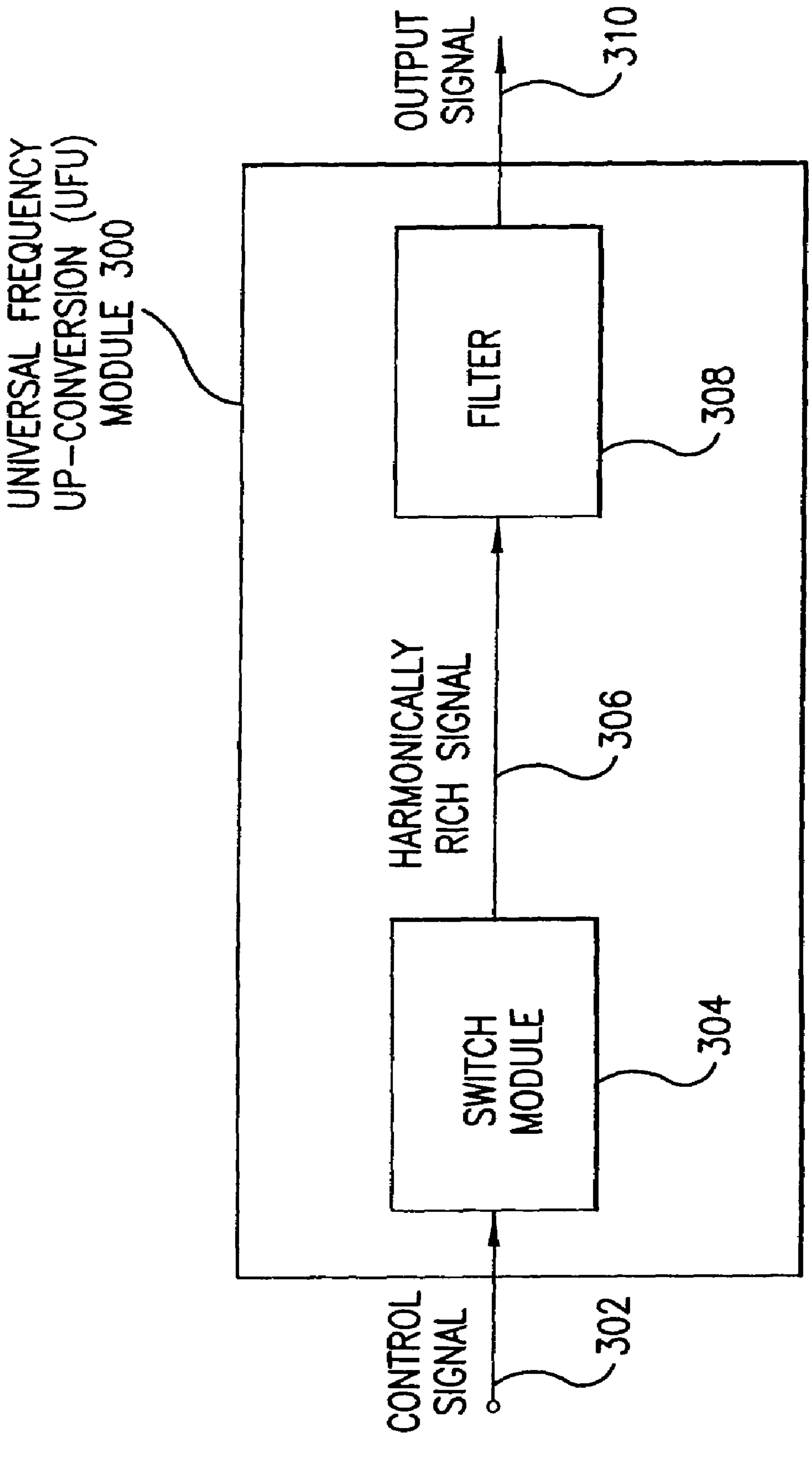
FIG. 3 is a block diagram of a universal frequency up-conversion (UFU) module according to an embodiment of the invention.

An example frequency up-conversion system 300 is illustrated in FIG. 3. The frequency up-conversion system 300 is now described.

Figures 6A, 6B, 6C, 6D:
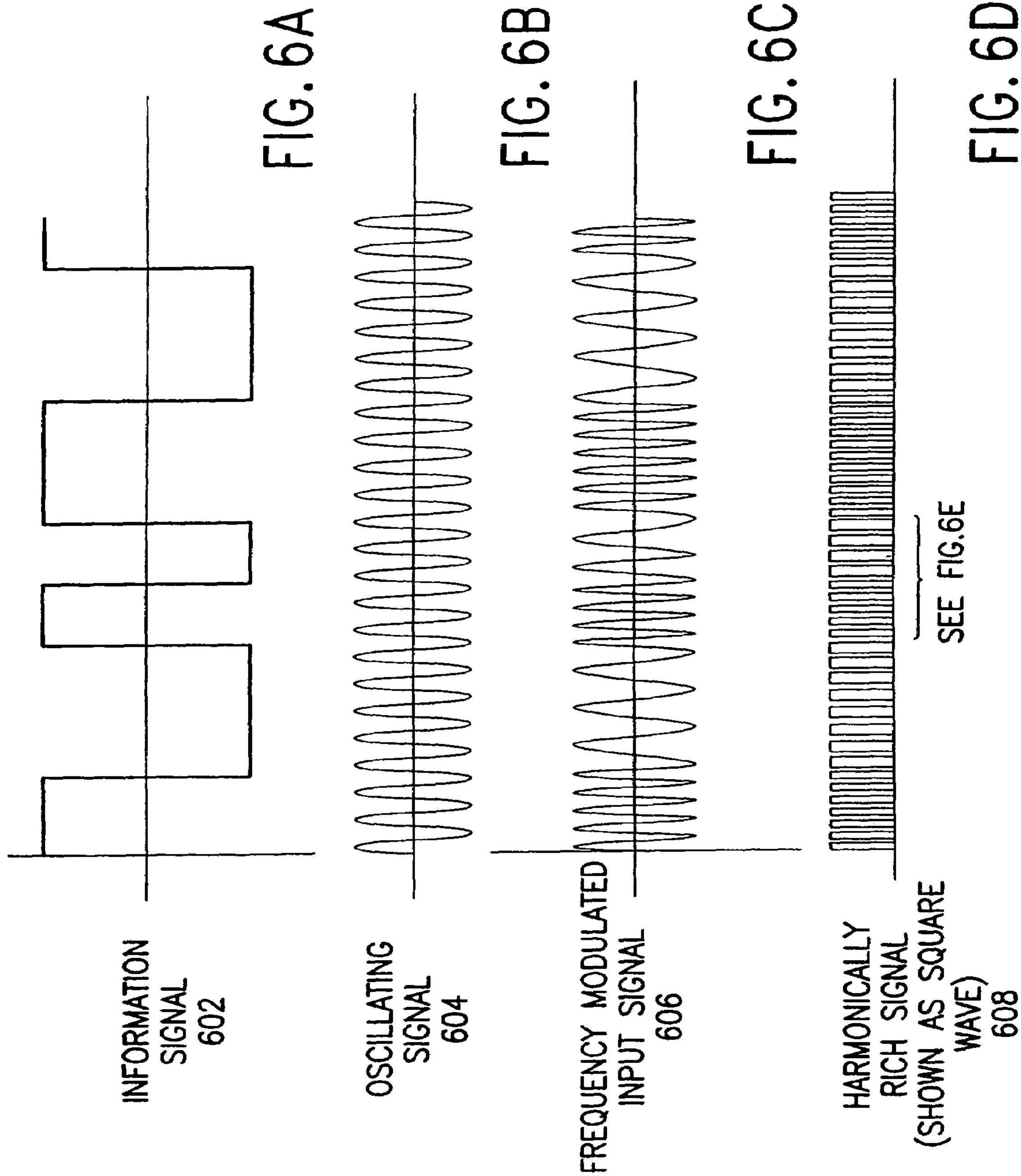
FIGS. 6A-6I illustrate example waveforms used to describe the operation of the UFU module.

An input signal 302 (designated as "Control Signal" in FIG. 3) is accepted by a switch module 304. For purposes of example only, assume that the input signal 302 is a FM input signal 606, an example of which is shown in FIG. 6C. FM input signal 606 may have been generated by modulating information signal 602 onto oscillating signal 604 (FIGS. 6A and 6B). It should be understood that the invention is not limited to this embodiment. The information signal 602 can be analog, digital, or any combination thereof, and any modulation scheme can be used.

The output of switch module 304 is a harmonically rich signal 306, shown for example in FIG. 6D as a harmonically rich signal 608. The harmonically rich signal 608 has a continuous and periodic waveform.

Figure 6E:
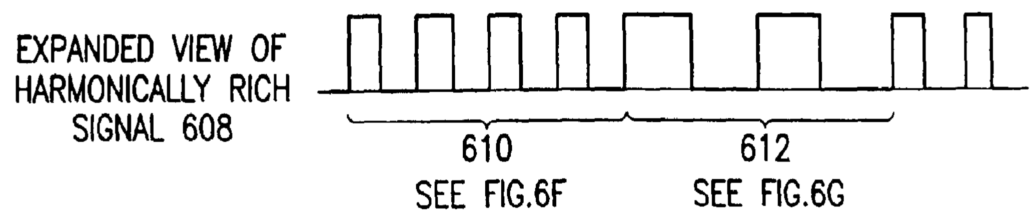

FIG. 6E is an expanded view of two sections of harmonically rich signal 608, section 610 and section 612. The harmonically rich signal 608 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 6F:
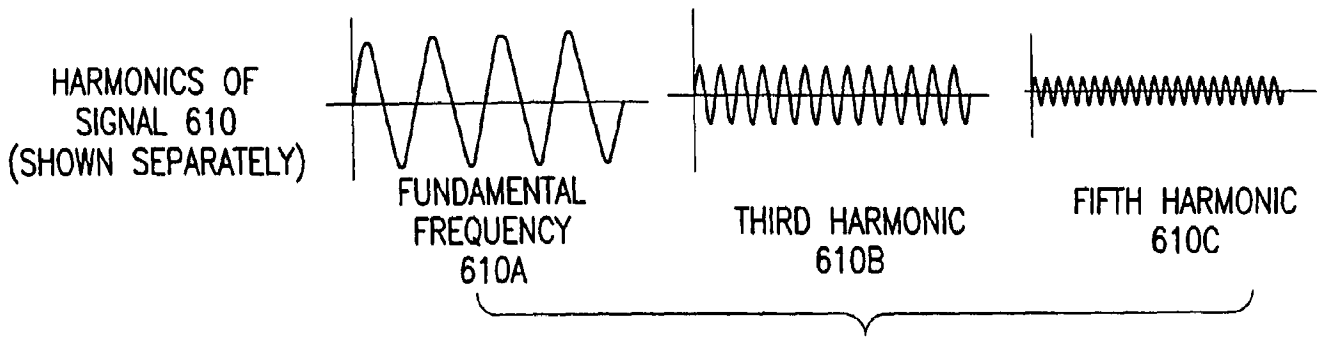
Figure 6G:
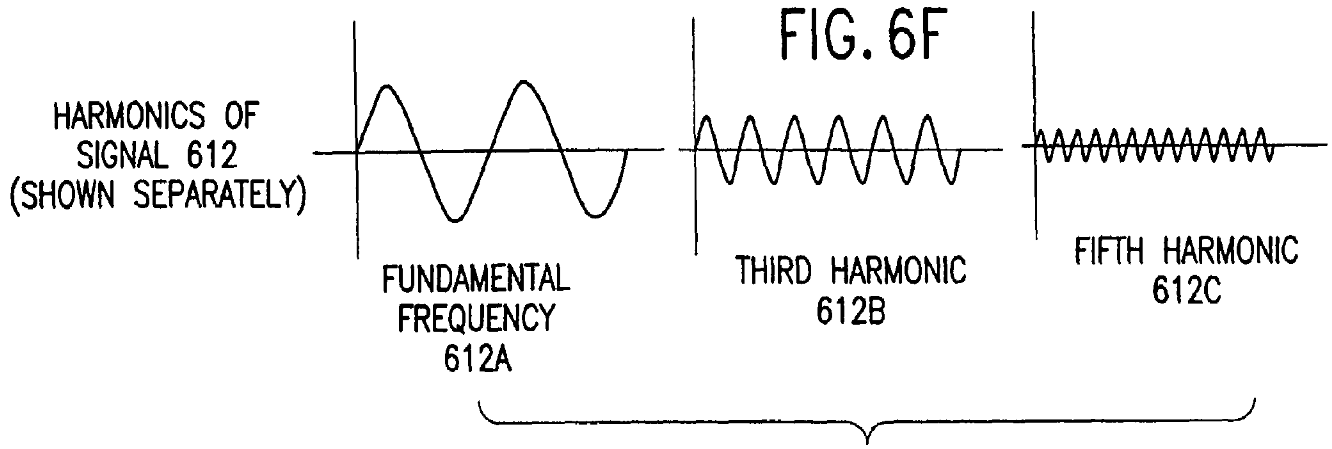
Figure 6H:
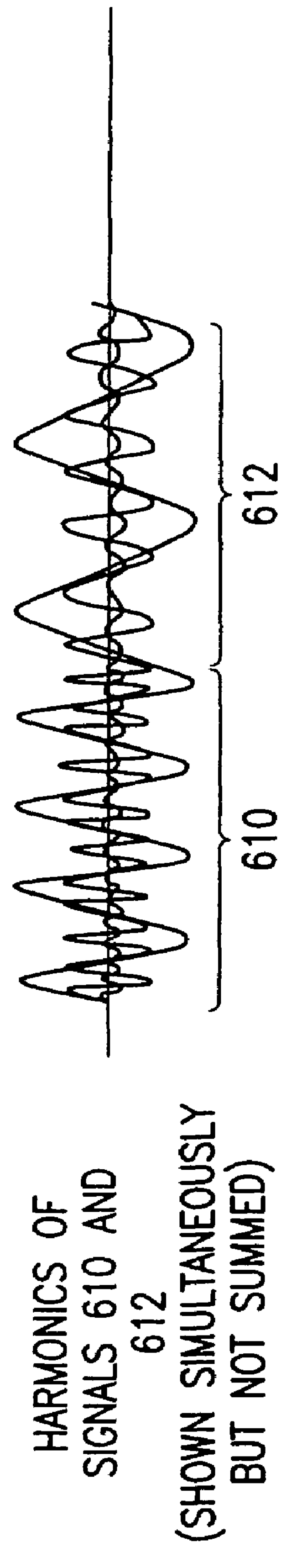

Harmonically rich signal 608 is comprised of a plurality of sinusoidal waves whose frequencies are integer multiples of the fundamental frequency of the waveform of the harmonically rich signal 608. These sinusoidal waves are referred to as the harmonics of the underlying waveform, and the fundamental frequency is referred to as the first harmonic. FIG. 6F and FIG. 6G show separately the sinusoidal components making up the first, third, and fifth harmonics of section 610 and section 612. (Note that in theory there may be an infinite number of harmonics; in this example, because harmonically rich signal 608 is shown as a square wave, there are only odd harmonics). Three harmonics are shown simultaneously (but not summed) in FIG. 6H.

The relative amplitudes of the harmonics are generally a function of the relative widths of the pulses of harmonically rich signal 306 and the period of the fundamental frequency, and can be determined by doing a Fourier analysis of harmonically rich signal 306. According to an embodiment of the invention, the input signal 606 may be shaped to ensure that the amplitude of the desired harmonic is sufficient for its intended use (e.g., transmission).

Figure 6I:
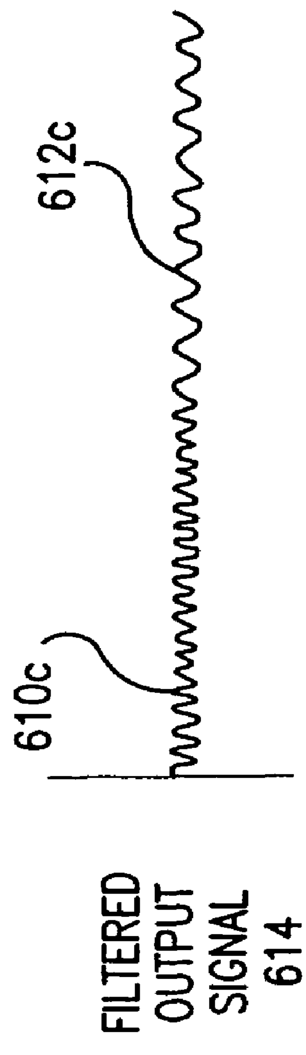

A filter 308 filters out any undesired frequencies (harmonics), and outputs an electromagnetic (EM) signal at the desired harmonic frequency or frequencies as an output signal 310, shown for example as a filtered output signal 614 in FIG. 6I.

Figure 4:
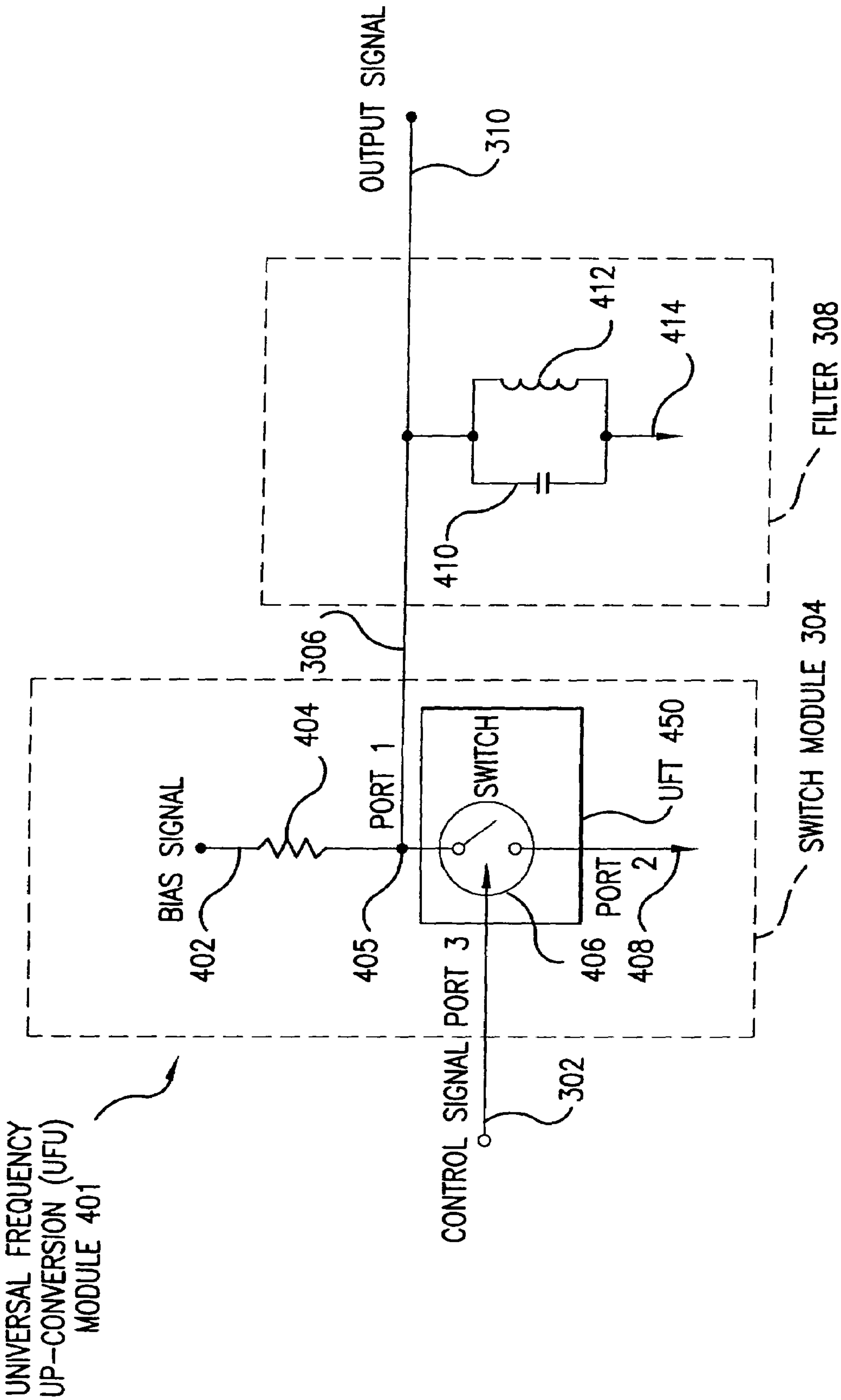
FIG. 4 is a more detailed diagram of a universal frequency up-conversion (UFU) module according to an embodiment of the invention.

FIG. 4 illustrates an example universal frequency up-conversion (UFU) module 401. The UFU module 401 includes an example switch module 304, which comprises a bias signal 402, a resistor or impedance 404, a universal frequency translator (UFT) 450, and a ground 408. The UFT 450 includes a switch 406. The input signal 302 (designated as "Control Signal" in FIG. 4) controls the switch 406 in the UFT 450, and causes it to close and open. Harmonically rich signal 306 is generated at a node 405 located between the resistor or impedance 404 and the switch 406.

Also in FIG. 4, it can be seen that an example filter 308 is comprised of a capacitor 410 and an inductor 412 shunted to a ground 414. The filter is designed to filter out the undesired harmonics of harmonically rich signal 306.

The invention is not limited to the UFU embodiment shown in FIG. 4.

Figure 5:
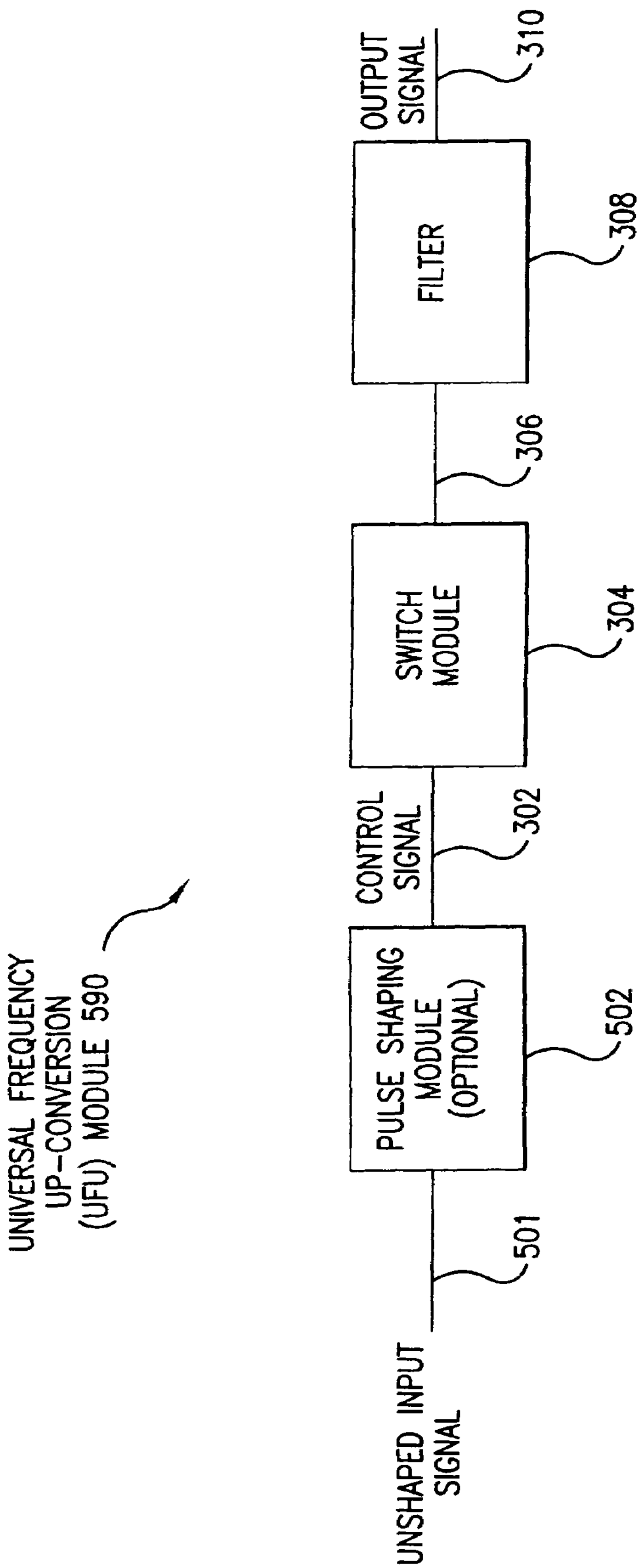
FIG. 5 is a block diagram of a universal frequency up-conversion (UFU) module according to an alternative embodiment of the invention.

For example, in an alternate embodiment shown in FIG. 5, an unshaped input signal 501 is routed to a pulse shaping module 502. The pulse shaping module 502 modifies the unshaped input signal 501 to generate a (modified) input signal 302 (designated as the "Control Signal" in FIG. 5). The input signal 302 is routed to the switch module 304, which operates in the manner described above. Also, the filter 308 of FIG. 5 operates in the manner described above.

The purpose of the pulse shaping module 502 is to define the pulse width of the input signal 302. Recall that the input signal 302 controls the opening and closing of the switch 406 in switch module 304. During such operation, the pulse width of the input signal 302 establishes the pulse width of the harmonically rich signal 306. As stated above, the relative amplitudes of the harmonics of the harmonically rich signal 306 are a function of at least the pulse width of the harmonically rich signal 306. As such, the pulse width of the input signal 302 contributes to setting the relative amplitudes of the harmonics of harmonically rich signal 306.

Further details of up-conversion as described in this section are presented in pending U.S. application "Method and System for Frequency Up-Conversion," Ser. No. 09/176,154, filed Oct. 21, 1998, incorporated herein by reference in its entirety.

4. Enhanced Signal Reception

The present invention is directed to systems and methods of enhanced signal reception (ESR), and applications of same.

Figure 21:
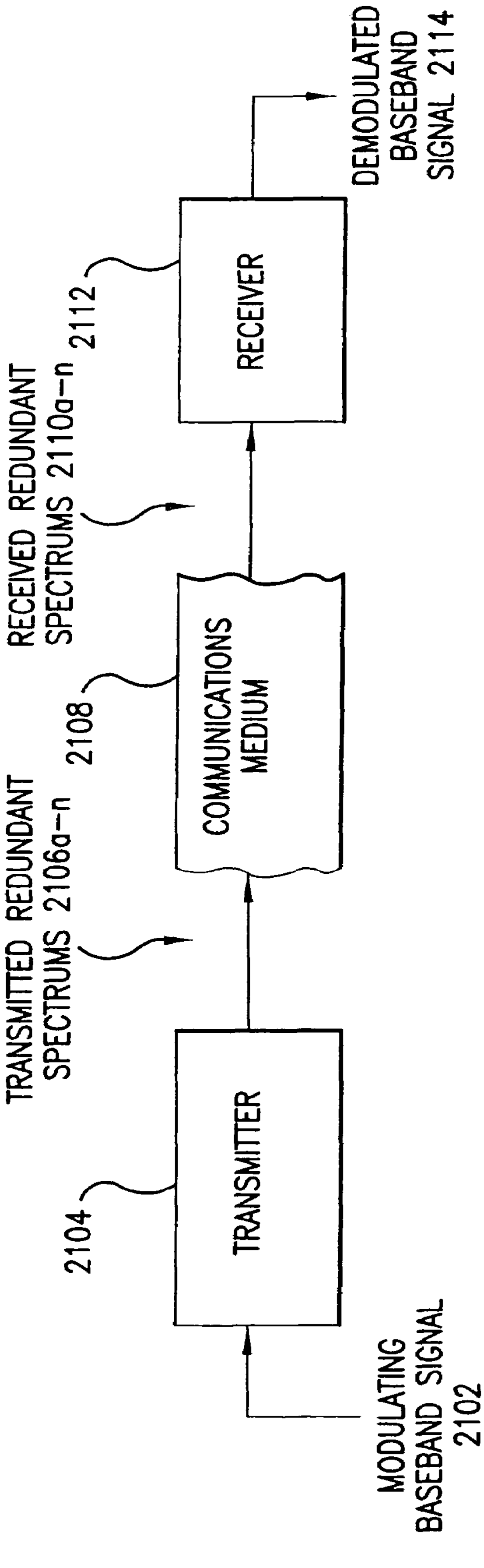
FIG. 21 illustrates an enhanced signal reception system according to an embodiment of the invention.

Referring to FIG. 21, transmitter 2104 accepts a modulating baseband signal 2102 and generates (transmitted) redundant spectrums 2106*a-n*, which are sent over communications medium 2108. Receiver 2112 recovers a demodulated baseband signal 2114 from (received) redundant spectrums 2110*a-n*. Demodulated baseband signal 2114 is representative of the modulating baseband signal 2102, where the level of similarity between the modulating baseband signal 2114 and the modulating baseband signal 2102 is application dependent.

Figure 22B:
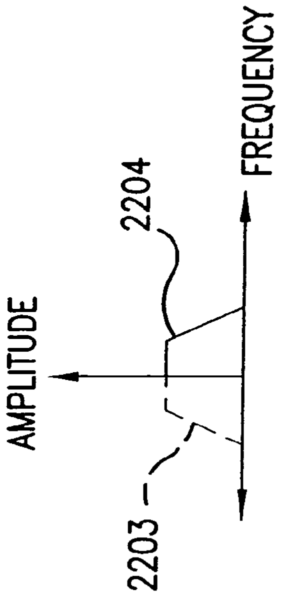
FIGS. 22A-22F are example waveforms used to describe the system of FIG. 21.
Figure 22A:
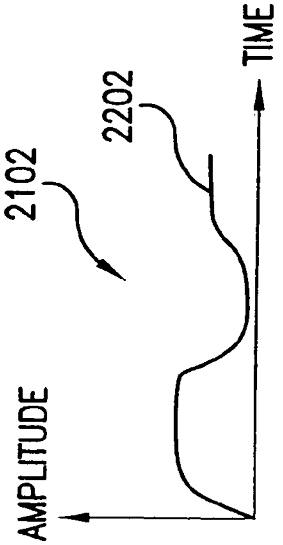

Modulating baseband signal 2102 is preferably any information signal desired for transmission and/or reception. An example modulating baseband signal 2202 is illustrated in FIG. 22A, and has an associated modulating baseband spectrum 2204 and image spectrum 2203 that are illustrated in FIG. 22B. Modulating baseband signal 2202 is illustrated as an analog signal in FIG. 22*a*, but could also be a digital signal, or combination thereof. Modulating baseband signal 2202 could be a voltage (or current) characterization of any number of real world occurrences, including for example and without limitation, the voltage (or current) representation for a voice signal.

Each transmitted redundant spectrum 2106*a-n* contains the necessary information to substantially reconstruct the modulating baseband signal 2102. In other words, each redundant spectrum 2106*a-n* contains the necessary amplitude, phase, and frequency information to reconstruct the modulating baseband signal 2102.

Figure 22C:
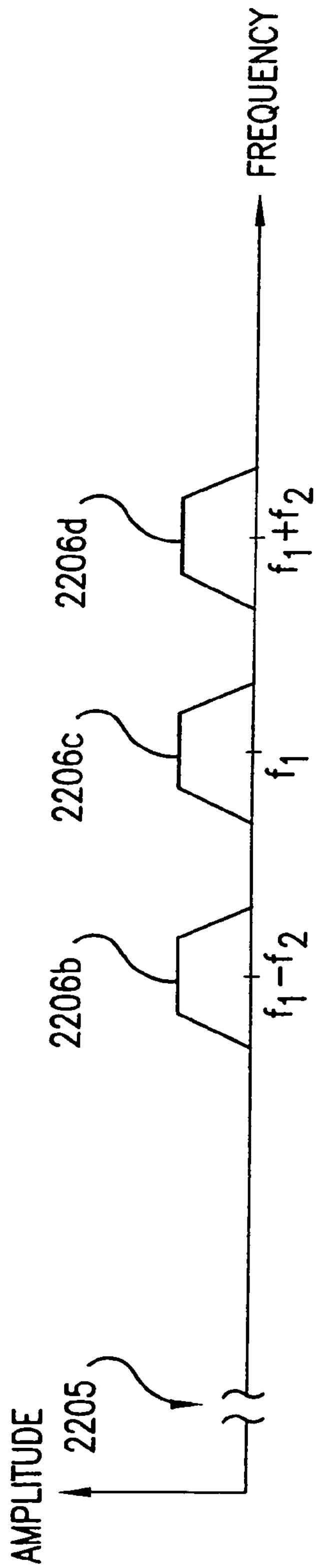

FIG. 22C illustrates example transmitted redundant spectrums 2206*b-d*. Transmitted redundant spectrums 2206*b-d* are illustrated to contain three redundant spectrums for illustration purposes only. Any number of redundant spectrums could be generated and transmitted as will be explained in following discussions.

Figure 22D:
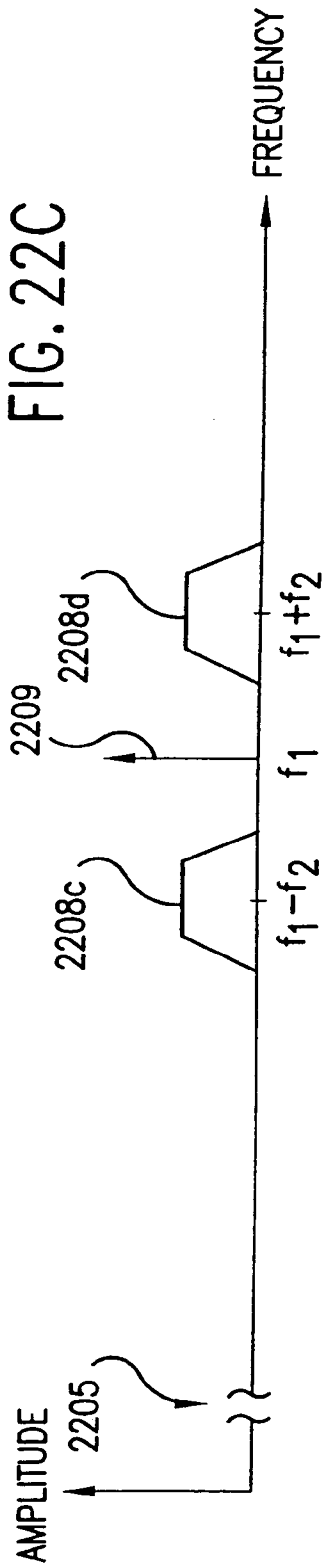

Transmitted redundant spectrums 2206*b-d* are centered at $f_1$, with a frequency spacing $f_2$ between adjacent spectrums. Frequencies $f_1$ and $f_2$ are dynamically adjustable in real-time as will be shown below. FIG. 22D illustrates an alternate embodiment, where redundant spectrums 2208*c,d* are centered on unmodulated oscillating signal 2209 at $f_1$ (Hz). Oscillating signal 2209 may be suppressed if desired using, for example, phasing techniques or filtering techniques. Transmitted redundant spectrums are preferably above baseband frequencies as is represented by break 2205 in the frequency axis of FIGS. 22C and 22D.

Figure 22E:
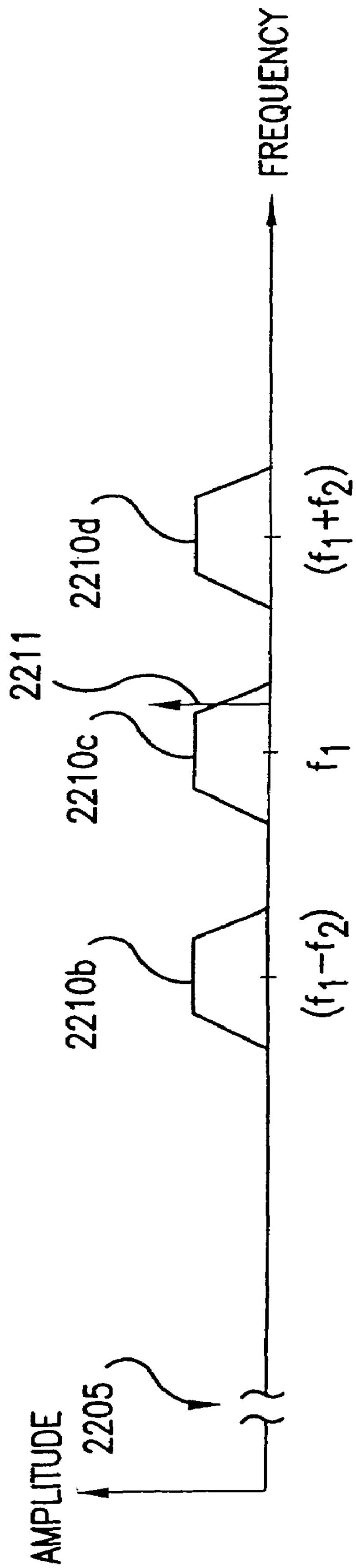

Received redundant spectrums 2110*a-n* are substantially similar to transmitted redundant spectrums 2106*a-n*, except for the changes introduced by the communications medium 2108. Such changes can include but are not limited to signal attenuation, and signal interference. FIG. 22E illustrates example received redundant spectrums 2210*b-d*. Received redundant spectrums 2210*b-d* are substantially similar to transmitted redundant spectrums 2206*b-d*, except that redundant spectrum 2210*c* includes an undesired jamming signal spectrum 2211 in order to illustrate some advantages of the present invention. Jamming signal spectrum 2211 is a frequency spectrum associated with a jamming signal. For purposes of this invention, a "jamming signal" refers to any unwanted signal, regardless of origin, that may interfere with the proper reception and reconstruction of an intended signal. Furthermore, the jamming signal is not limited to tones as depicted by spectrum 2211, and can have any spectral shape, as will be understood by those skilled in the art(s).

Figure 22F:
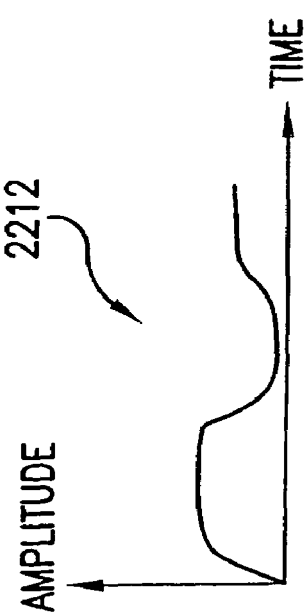

As stated above, demodulated baseband signal 2114 is extracted from one or more of received redundant spectrums 2210*b-d*. FIG. 22F illustrates example demodulated baseband signal 2212 that is, in this example, substantially similar to modulating baseband signal 2202 (FIG. 22A); where in practice, the degree of similarity is application dependent.

An advantage of the present invention should now be apparent. The recovery of modulating baseband signal 2202 can be accomplished by receiver 2112 in spite of the fact that high strength jamming signal(s) (e.g. jamming signal spectrum 2211) exist on the communications medium. The intended baseband signal can be recovered because multiple redundant spectrums are transmitted, where each redundant spectrum carries the necessary information to reconstruct the baseband signal. At the destination, the redundant spectrums are isolated from each other so that the baseband signal can be recovered even if one or more of the redundant spectrums are corrupted by a jamming signal.

Figure 23A:
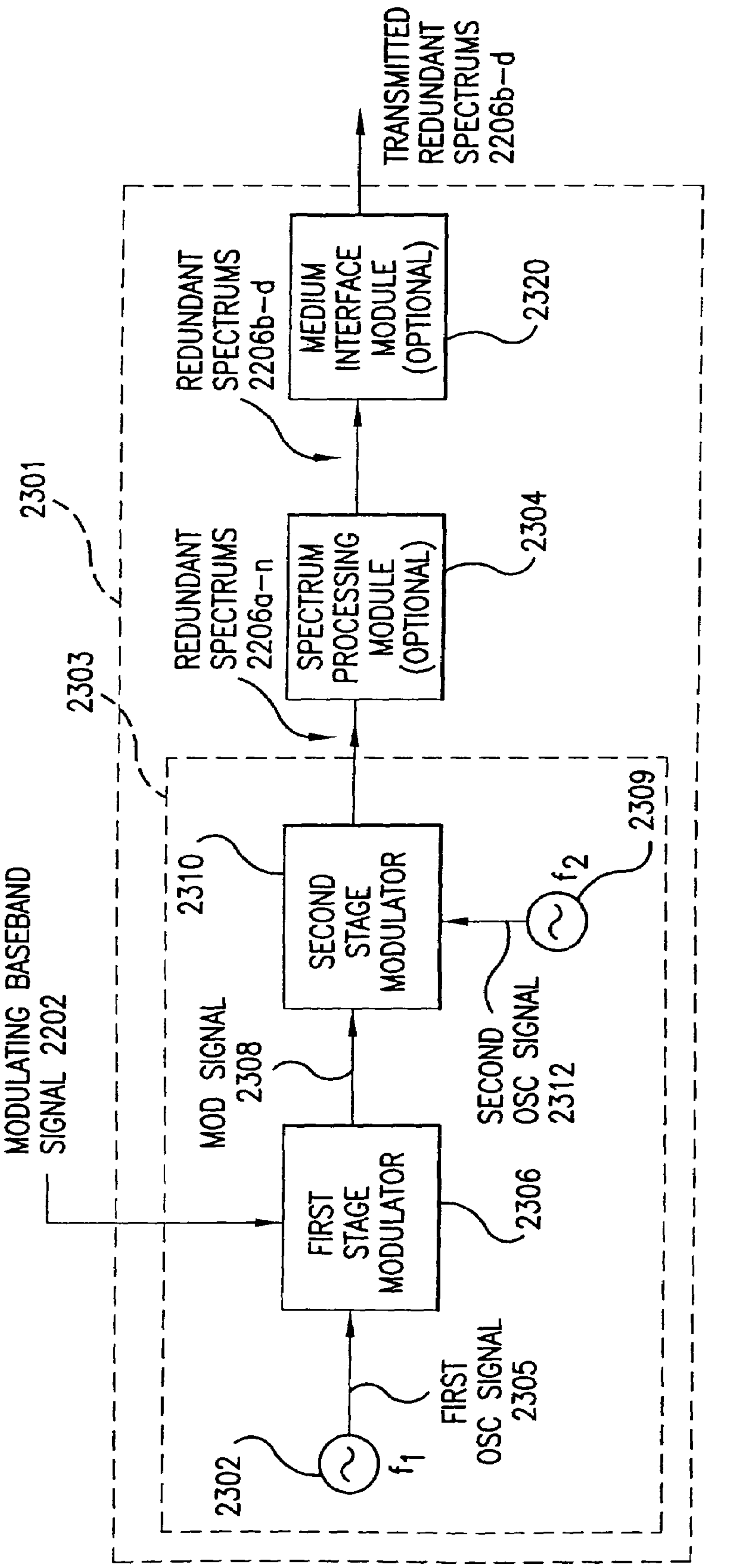
FIG. 23A illustrates an example transmitter in an enhanced signal reception system according to an embodiment of the invention.

Transmitter 2104 will now be explored in greater detail. FIG. 23A illustrates transmitter 2301, which is one embodiment of transmitter 2104 that generates redundant spectrums configured similar to redundant spectrums 2206*b-d*. Transmitter 2301 includes generator 2303, optional spectrum processing module 2304, and optional medium interface module 2320. Generator 2303 includes: first oscillator 2302, second oscillator 2309, first stage modulator 2306, and second stage modulator 2310.

Figure 23B:
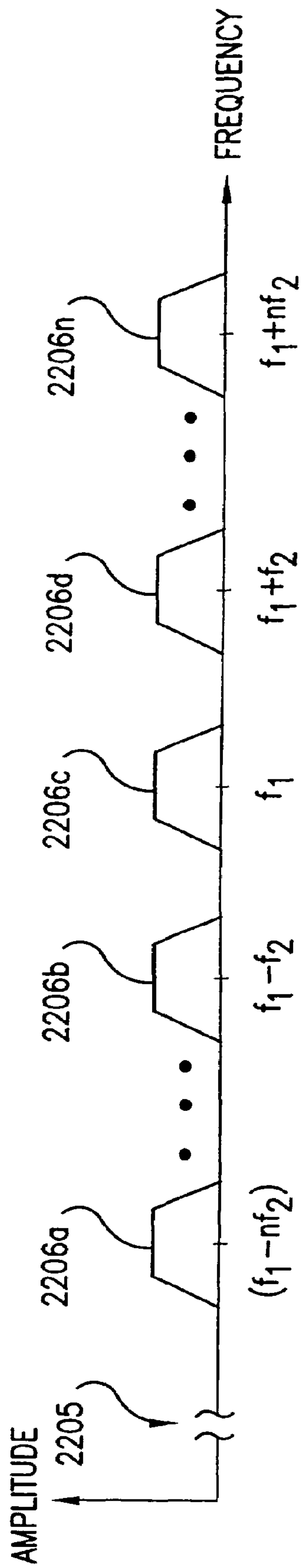
FIGS. 23B and 23C are example waveforms used to further describe the enhanced signal reception system according to an embodiment of the invention.

Transmitter 2301 operates as follows. First oscillator 2302 and second oscillator 2309 generate a first oscillating signal 2305 and second oscillating signal 2312, respectively. First stage modulator 2306 modulates first oscillating signal 2305 with modulating baseband signal 2202, resulting in modulated signal 2308. First stage modulator 2306 may implement any type of modulation including but not limited to: amplitude modulation, frequency modulation, phase modulation, combinations thereof, or any other type of modulation. Second stage modulator 2310 modulates modulated signal 2308 with second oscillating signal 2312, resulting in multiple redundant spectrums 2206*a-n* shown in FIG. 23B. Second stage modulator 2310 is preferably a phase modulator, or a frequency modulator, although other types of modulation may be implemented including but not limited to amplitude modulation. Each redundant spectrum 2206*a-n* contains the necessary amplitude, phase, and frequency information to substantially reconstruct the modulating baseband signal 2202.

Redundant spectrums 2206*a-n* are substantially centered around $f_1$, which is the characteristic frequency of first oscillating signal 2305. Also, each redundant spectrum 2206*a-n* (except for 2206*c*) is offset from $f_1$ by approximately a multiple of $f_2$ (Hz), where $f_2$ is the frequency of the second oscillating signal 2312. Thus, each redundant spectrum 2206*a-n* is offset from an adjacent redundant spectrum by $f_2$ (Hz). This allows the spacing between adjacent redundant spectrums to be adjusted (or tuned) by changing $f_2$ that is associated with second oscillator 2309. Adjusting the spacing between adjacent redundant spectrums allows for dynamic real-time tuning of the bandwidth occupied by redundant spectrums 2206*a-n*.

In one embodiment, the number of redundant spectrums 2206*a-n* generated by transmitter 2301 is arbitrary and may be unlimited as indicated by the "a-n" designation for redundant spectrums 2206*a-n*. However, a typical communications medium will have a physical and/or administrative limitations (i.e. FCC regulations) that restrict the number of redundant spectrums that can be practically transmitted over the communications medium. Also, there may be other reasons to limit the number of redundant spectrums transmitted. Therefore, preferably, the transmitter 2301 will include an optional spectrum processing module 2304 to process the redundant spectrums 2206*a-n* prior to transmission over communications medium 2108.

Figure 23C:
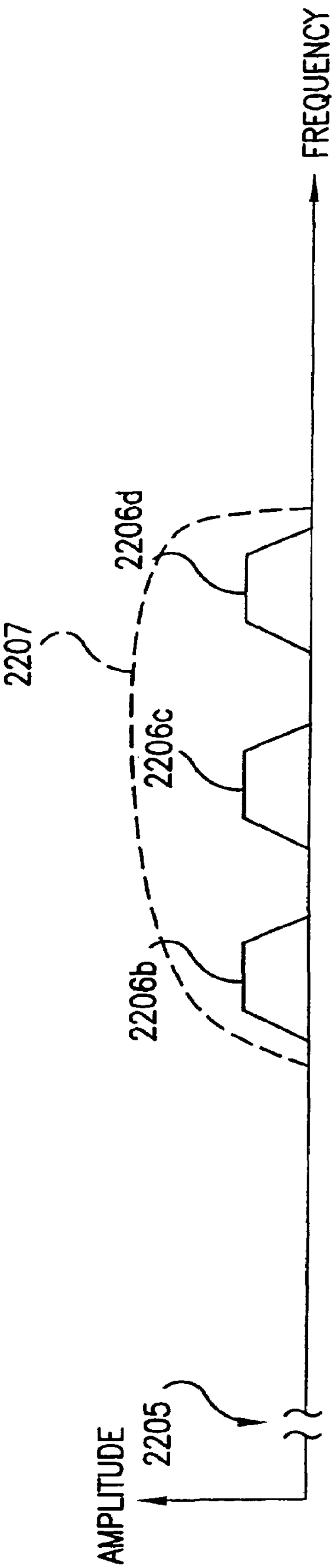

In one embodiment, spectrum processing module 2304 includes a filter with a passband 2207 (FIG. 23C) to select redundant spectrums 2206*b-d* for transmission. This will substantially limit the frequency bandwidth occupied by the redundant spectrums to the passband 2207. In one embodiment, spectrum processing module 2304 also up converts redundant spectrums and/or amplifies redundant spectrums prior to transmission over the communications medium 2108. Finally, medium interface module 2320 transmits redundant spectrums over the communications medium 2108. In one embodiment, communications medium 2108 is an over-the-air link and medium interface module 2320 is an antenna. Other embodiments for communications medium 2108 and medium interface module 2320 will be understood based on the teachings contained herein.

Figure 23D:
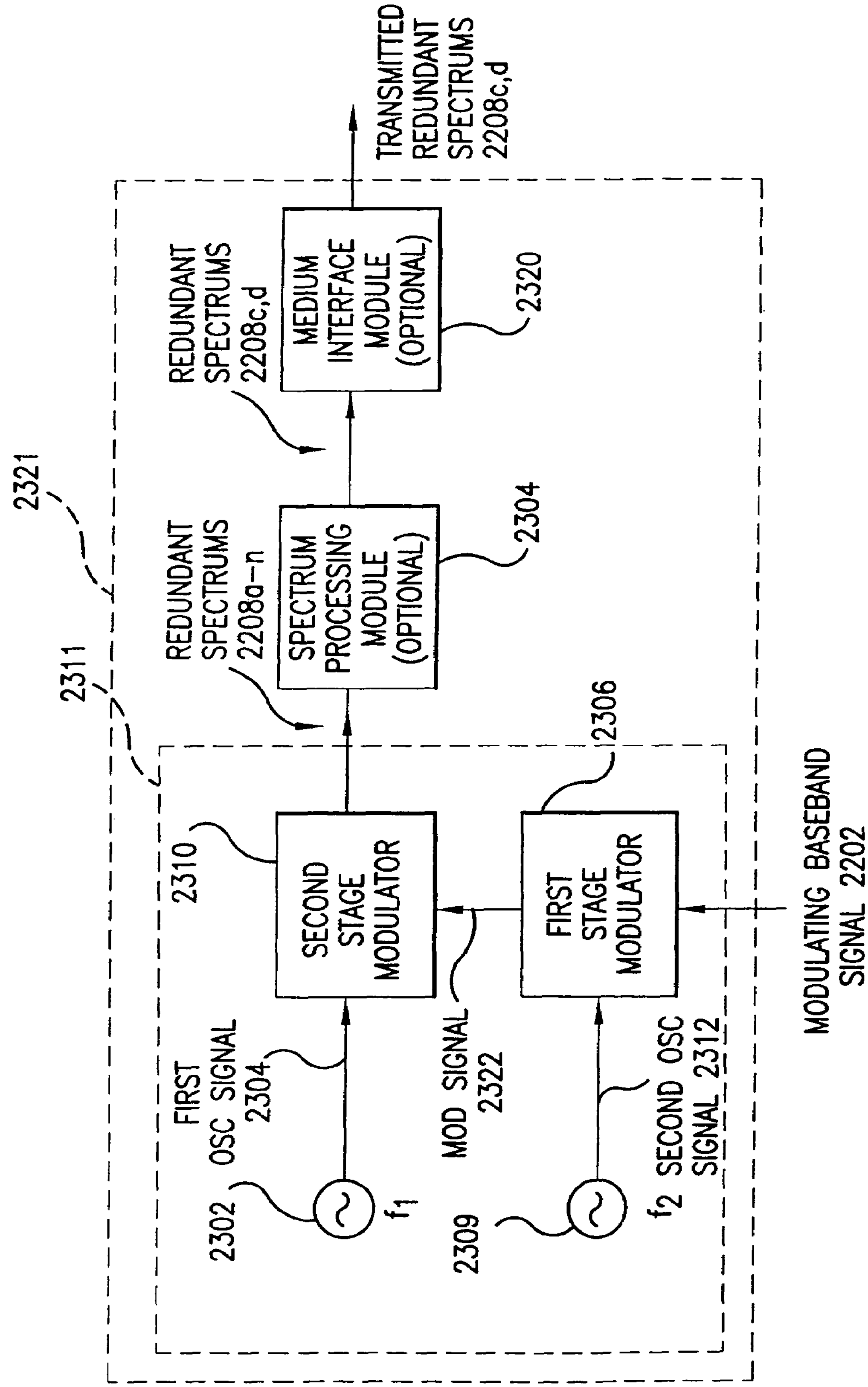
FIG. 23D illustrates another example transmitter in an enhanced signal reception system according to an embodiment of the invention.

FIG. 23D illustrates transmitter 2321, which is one embodiment of transmitter 2104 that generates redundant spectrums configured similar to redundant spectrums 2208*c-d* and unmodulated spectrum 2209. Transmitter 2321 includes generator 2311, spectrum processing module 2304, and (optional) medium interface module 2320. Generator 2311 includes: first oscillator 2302, second oscillator 2309, first stage modulator 2306, and second stage modulator 2310.

Figure 23E:
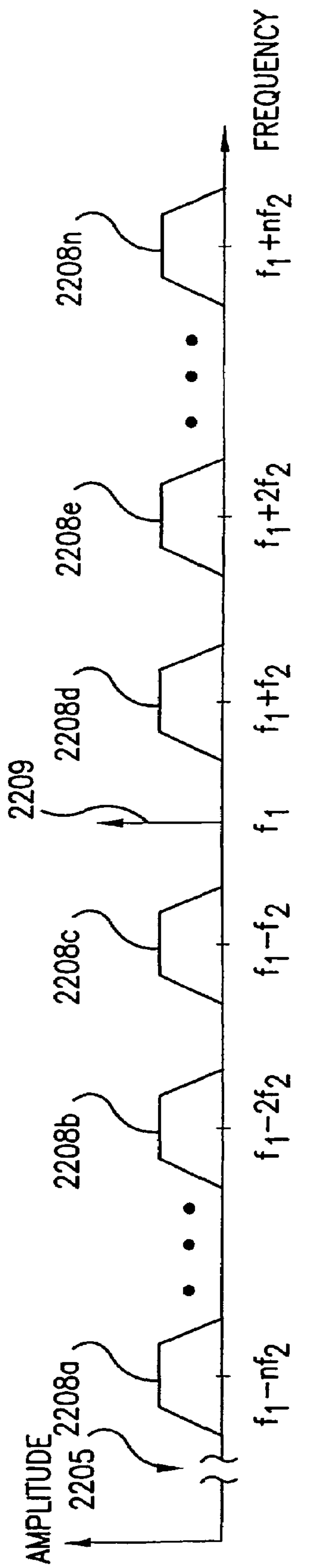
FIGS. 23E and 23F are example waveforms used to further describe the enhanced signal reception system according to an embodiment of the invention.
Figure 23F:
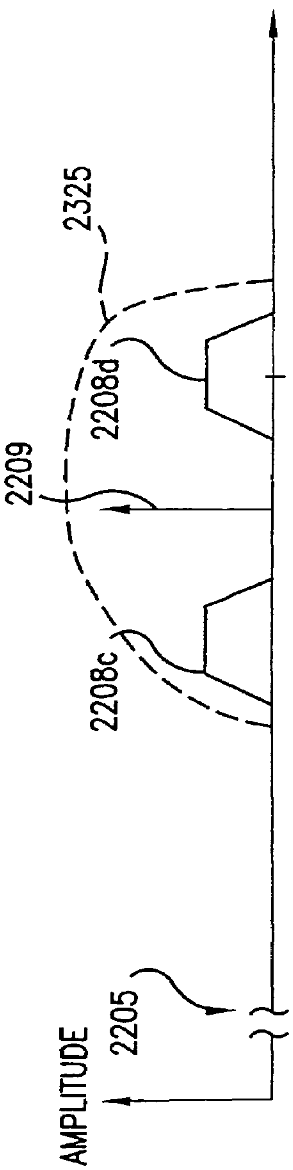

As shown in FIG. 23D, many of the components in transmitter 2321 are similar to those in transmitter 2301. However, in this embodiment, modulating baseband signal 2202 modulates second oscillating signal 2312. Transmitter 2321 operates as follows. First stage modulator 2306 modulates second oscillating signal 2312 with modulating baseband signal 2202, resulting in modulated signal 2322. As described earlier, first stage modulator 2306 can effect any type of modulation including but not limited to: amplitude modulation frequency modulation, combinations thereof, or any other type of modulation. Second stage modulator 2310 modulates first oscillating signal 2304 with modulated signal 2322, resulting in redundant spectrums 2208*a-n*, as shown in FIG. 23E. Second stage modulator 2310 is preferably a phase or frequency modulator, although other modulators could used including but not limited to an amplitude modulator.

Redundant spectrums 2208*a-n* are centered on unmodulated spectrum 2209 (at $f_1$ Hz), and adjacent spectrums are separated by $f_2$ Hz. The number of redundant spectrums 2208*a-n* generated by generator 2311 is arbitrary and unlimited, similar to spectrums 2206*a-n* discussed above. Therefore, optional spectrum processing module 2304 may also include a filter with passband 2325 to select, for example, spectrums 2208*c,d* for transmission over communications medium 2108. In addition, optional spectrum processing module 2304 may also include a filter (such as a bandstop filter) to attenuate unmodulated spectrum 2209. Alternatively, unmodulated spectrum 2209 may be attenuated by using phasing techniques during redundant spectrum generation. Finally, (optional) medium interface module 2320 transmits redundant spectrums 2208*c,d* over communications medium 2108.

Figure 24A:
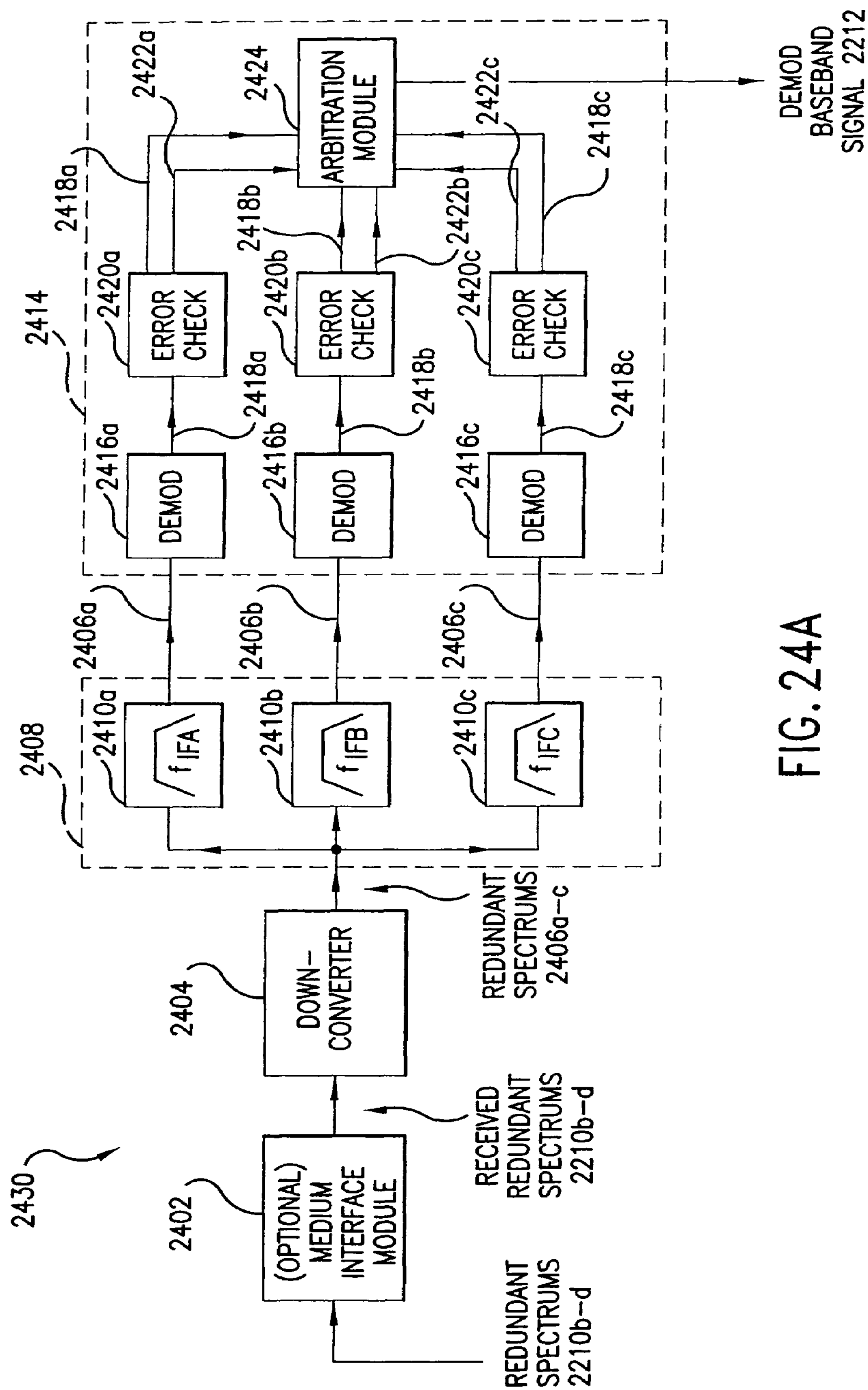
FIG. 24A illustrates an example receiver in an enhanced signal reception system according to an embodiment of the invention.

Receiver 2112 will now be explored in greater detail to illustrate recovery of a demodulated baseband signal from received redundant spectrums. FIG. 24A illustrates receiver 2430, which is one embodiment of receiver 2112. Receiver 2430 includes optional medium interface module 2402, down-converter 2404, spectrum isolation module 2408, and data extraction module 2414. Spectrum isolation module 2408 includes filters 2410*a-c*. Data extraction module 2414 includes demodulators 2416*a-c*, error check modules 2420*a-c*, and arbitration module 2424. Receiver 2430 will be discussed in relation to the signal diagrams in FIGS. 24B-24J.

Figure 24B:
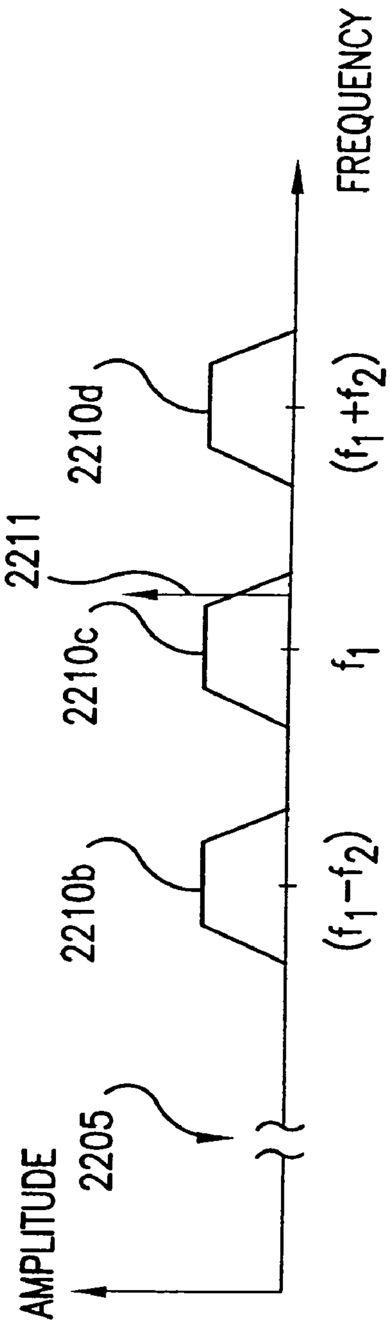
FIGS. 24B-24J are example waveforms used to further describe the enhanced signal reception system according to an embodiment of the invention.
Figure 24C:
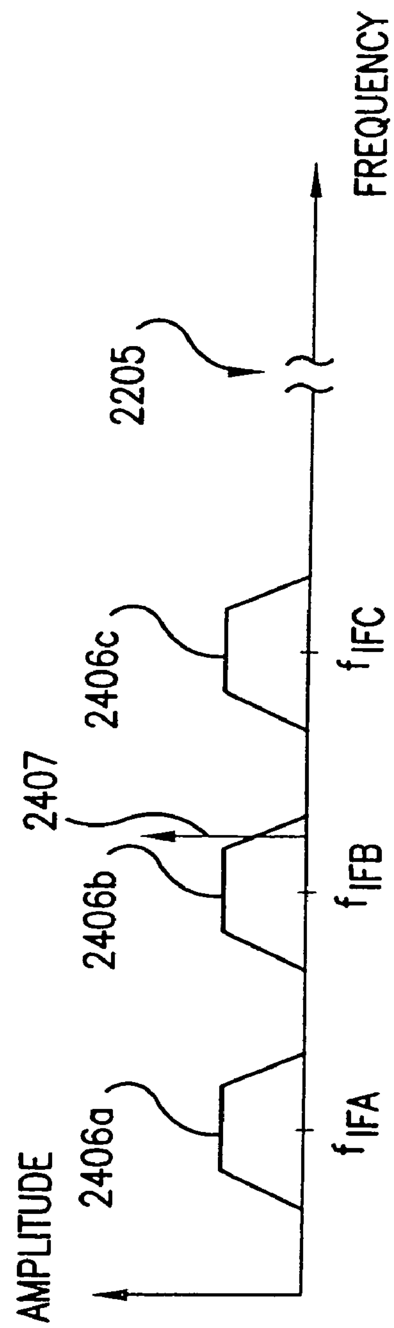
Figures 24D, 24E, 24F, 24G, 24H, 24I:
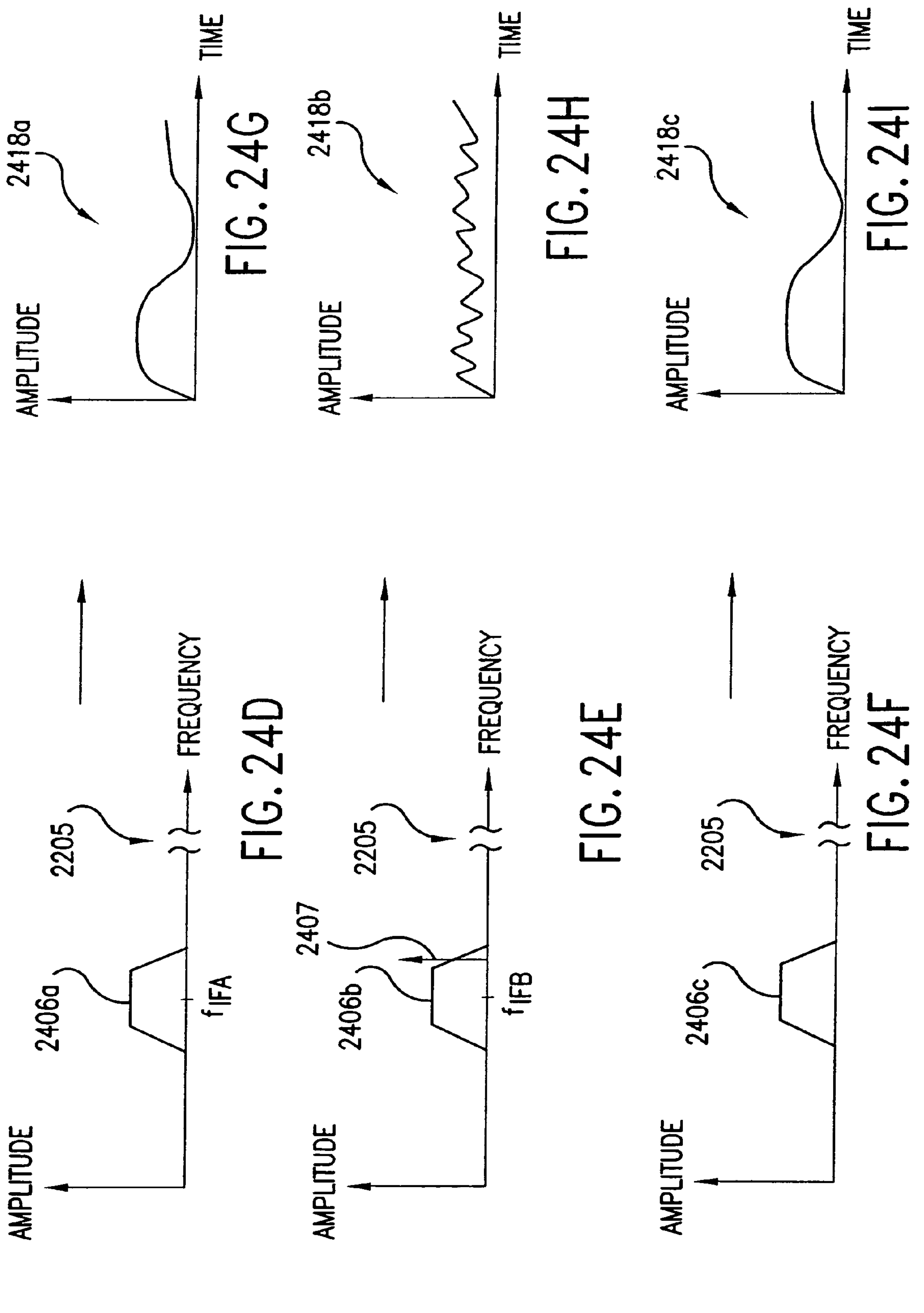
Figure 24J:
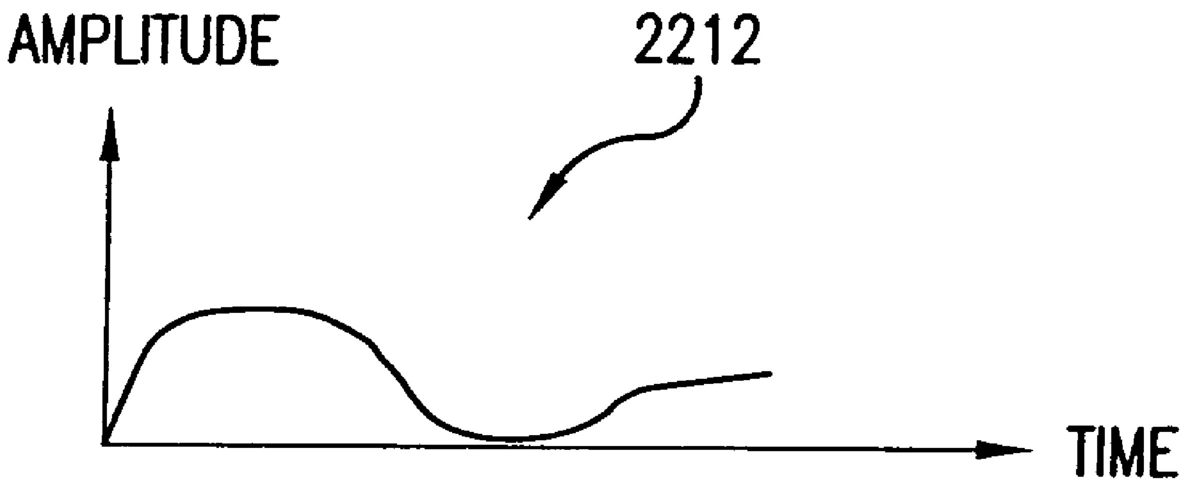

In one embodiment, optional medium interface module 2402 receives redundant spectrums 2210*b-d* (FIG. 22E, and FIG. 24B). Each redundant spectrum 2210*b-d* includes the necessary amplitude, phase, and frequency information to substantially reconstruct the modulating baseband signal used to generated the redundant spectrums. However, in the present example, spectrum 2210*c* also contains jamming signal 2211, which may interfere with the recovery of a baseband signal from spectrum 2210*c*. Down-converter 2404 down-converts received redundant spectrums 2210*b-d* to lower intermediate frequencies, resulting in redundant spectrums 2406*a-c* (FIG. 24C). Jamming signal 2211 is also down-converted to jamming signal 2407, as it is contained within redundant spectrum 2406*b*. Spectrum isolation module 2408 includes filters 2410*a-c* that isolate redundant spectrums 2406*a-c* from each other (FIGS. 24D-24F, respectively). Demodulators 2416*a-c* independently demodulate spectrums 2406*a-c*, resulting in demodulated baseband signals 2418*a-c*, respectively (FIGS. 24G-24I). Error check modules 2420*a-c* analyze demodulate baseband signal 2418*a-c* to detect any errors. In one embodiment, each error check module 2420*a-c* sets an error flag 2422*a-c* whenever an error is detected in a demodulated baseband signal. Arbitration module 2424 accepts the demodulated baseband signals and associated error flags, and selects a substantially error-free demodulated baseband signal (FIG. 24J). In one embodiment, the substantially error-free demodulated baseband signal will be substantially similar to the modulating baseband signal used to generate the received redundant spectrums, where the degree of similarity is application dependent.

Referring to FIGS. 24G-I, arbitration module 2424 will select either demodulated baseband signal 2418*a* or 2418*c*, because error check module 2420*b* will set the error flag 2422*b* that is associated with demodulated baseband signal 2418*b*.

The error detection schemes implemented by the error detection modules include but are not limited to: cyclic redundancy check (CRC) and parity check for digital signals, and various error detections schemes for analog signal.

Further details of enhanced signal reception as described in this section are presented in pending U.S. application "Method and System for Ensuring Reception of a Communications Signal," Ser. No. 09/176,415, filed Oct. 21, 1998, incorporated herein by reference in its entirety.

5. Unified Down-conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

Figure 17:
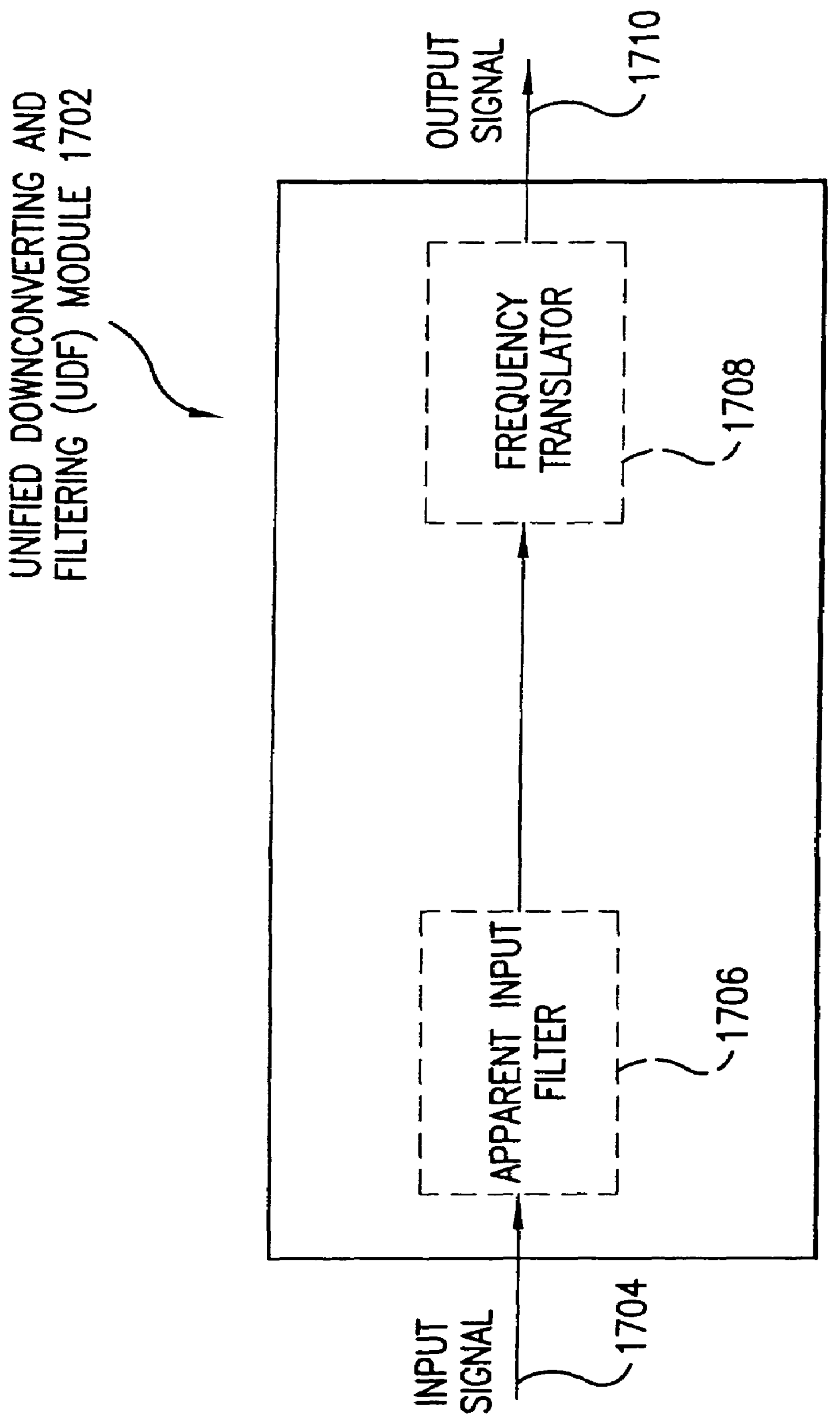
FIG. 17 illustrates a unified down-converting and filtering (UDF) module according to an embodiment of the invention.

FIG. 17 is a conceptual block diagram of a UDF module 1702 according to an embodiment of the present invention. The UDF module 1702 performs at least frequency translation and frequency selectivity.

The effect achieved by the UDF module 1702 is to perform the frequency selectivity operation prior to the performance of the frequency translation operation. Thus, the UDF module 1702 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1704 received by the UDF module 1702 are at radio frequencies. The UDF module 1702 effectively operates to input filter these RF input signals 1704. Specifically, in these embodiments, the UDF module 1702 effectively performs input, channel select filtering of the RF input signal 1704. Accordingly, the invention achieves high selectivity at high frequencies.

The UDF module 1702 effectively performs various types of filtering, including but not limited to bandpass filtering, low pass filtering, high pass filtering, notch filtering, all pass filtering, band stop filtering, etc., and combinations thereof.

Conceptually, the UDF module 1702 includes a frequency translator 1708. The frequency translator 1708 conceptually represents that portion of the UDF module 1702 that performs frequency translation (down conversion).

The UDF module 1702 also conceptually includes an apparent input filter 1706 (also sometimes called an input filtering emulator). Conceptually, the apparent input filter 1706 represents that portion of the UDF module 1702 that performs input filtering.

In practice, the input filtering operation performed by the UDF module 1702 is integrated with the frequency translation operation. The input filtering operation can be viewed as being performed concurrently with the frequency translation operation. This is a reason why the input filter 1706 is herein referred to as an "apparent" input filter 1706.

The UDF module 1702 of the present invention includes a number of advantages. For example, high selectivity at high frequencies is realizable using the UDF module 1702. This feature of the invention is evident by the high Q factors that are attainable. For example, and without limitation, the UDF module 1702 can be designed with a filter center frequency $f_C$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_C$ of the UDF module 1702 can be electrically adjusted, either statically or dynamically.

Also, the UDF module 1702 can be designed to amplify input signals.

Further, the UDF module 1702 can be implemented without large resistors, capacitors, or inductors. Also, the UDF module 1702 does not require that tight tolerances be maintained on the values of its individual components, i.e., its resistors, capacitors, inductors, etc. As a result, the architecture of the UDF module 1702 is friendly to integrated circuit design techniques and processes.

The features and advantages exhibited by the UDF module 1702 are achieved at least in part by adopting a new technological paradigm with respect to frequency selectivity and translation. Specifically, according to the present invention, the UDF module 1702 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module preferably performs input filtering and frequency down-conversion in a unified manner.

Figure 19:
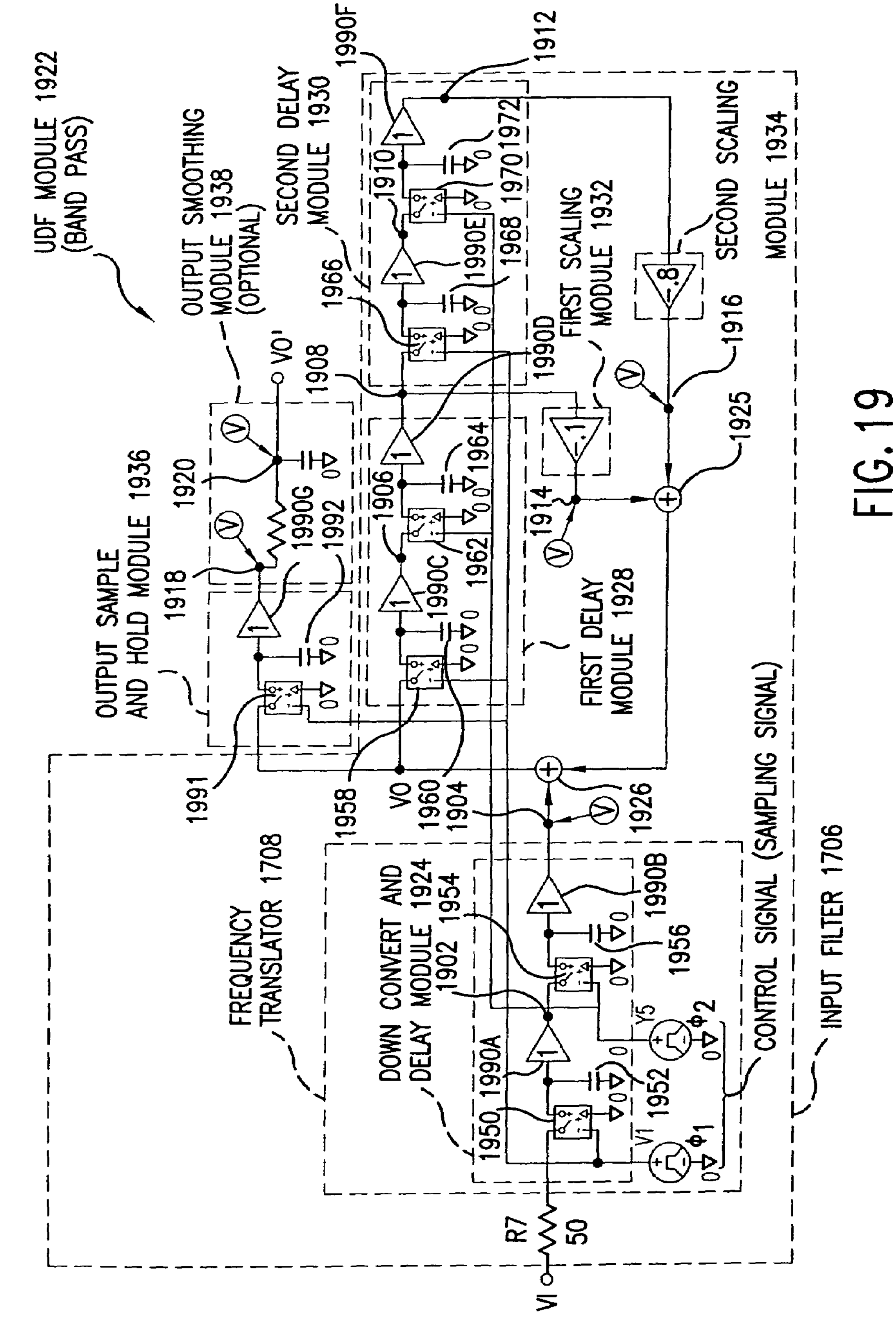
FIG. 19 is a detailed diagram of an example UDF module according to an embodiment of the invention.

FIG. 19 illustrates an example implementation of the unified down-converting and filtering (UDF) module 1922. The UDF module 1922 performs the frequency translation operation and the frequency selectivity operation in an integrated, unified manner as described above, and as further described below.

In the example of FIG. 19, the frequency selectivity operation performed by the UDF module 1922 comprises a band-pass filtering operation according to EQ. 1, below, which is an example representation of a band-pass filtering transfer function.

$$VO=\alpha_1 z^{-1} VI-\beta_1 z^{-1} VO-\beta_0 z^{-2} VO \qquad \text{EQ. 1}$$

It should be noted, however, that the invention is not limited to band-pass filtering. Instead, the invention effectively performs various types of filtering, including but not limited to bandpass filtering, low pass filtering, high pass filtering, notch filtering, all pass filtering, band stop filtering, etc., and combinations thereof. As will be appreciated, there are many representations of any given filter type. The invention is applicable to these filter representations. Thus, EQ. 1 is referred to herein for illustrative purposes only, and is not limiting.

The UDF module 1922 includes a down-convert and delay module 1924, first and second delay modules 1928 and 1930, first and second scaling modules 1932 and 1934, an output sample and hold module 1936, and an (optional) output smoothing module 1938. Other embodiments of the UDF module will have these components in different configurations, and/or a subset of these components, and/or additional components. For example, and without limitation, in the configuration shown in FIG. 19, the output smoothing module 1938 is optional.

As further described below, in the example of FIG. 19, the down-convert and delay module 1924 and the first and second delay modules 1928 and 1930 include switches that are controlled by a clock having two phases, $\phi_1$ and $\phi_2$. $\phi_1$ and $\phi_2$ preferably have the same frequency, and are non-overlapping (alternatively, a plurality such as two clock signals having these characteristics could be used). As used herein, the term "non-overlapping" is defined as two or more signals where only one of the signals is active at any given time. In some embodiments, signals are "active" when they are high. In other embodiments, signals are active when they are low.

Preferably, each of these switches closes on a rising edge of $\phi_1$ or $\phi_2$, and opens on the next corresponding falling edge of $\phi_1$ or $\phi_2$. However, the invention is not limited to this example. As will be apparent to persons skilled in the relevant art(s), other clock conventions can be used to control the switches.

In the example of FIG. 19, it is assumed that $\alpha_1$ is equal to one. Thus, the output of the down-convert and delay module 1924 is not scaled. As evident from the embodiments described above, however, the invention is not limited to this example.

The example UDF module 1922 has a filter center frequency of 900.2 MHZ and a filter bandwidth of 570 KHz. The pass band of the UDF module 1922 is on the order of 899.915 MHZ to 900.485 MHZ. The Q factor of the UDF module 1922 is approximately 1879 (i.e., 900.2 MHZ divided by 570 KHz).

The operation of the UDF module 1922 shall now be described with reference to a Table 1802 (FIG. 18) that indicates example values at nodes in the UDF module 1922 at a number of consecutive time increments. It is assumed in Table 1802 that the UDF module 1922 begins operating at time t−1. As indicated below, the UDF module 1922 reaches steady state a few time units after operation begins. The number of time units necessary for a given UDF module to reach steady state depends on the configuration of the UDF module, and will be apparent to persons skilled in the relevant art(s) based on the teachings contained herein.

At the rising edge of $\phi_1$ at time t−1, a switch 1950 in the down-convert and delay module 1924 closes. This allows a capacitor 1952 to charge to the current value of an input signal, $VI_{t-1}$, such that node 1902 is at $VI_{t-1}$. This is indicated by cell 1804 in FIG. 18. In effect, the combination of the switch 1950 and the capacitor 1952 in the down-convert and delay module 1924 operates to translate the frequency of the input signal VI to a desired lower frequency, such as IF or baseband. Thus, the value stored in the capacitor 1952 represents an instance of a down-converted image of the input signal VI.

The manner in which the down-convert and delay module 1924 performs frequency down-conversion is further described elsewhere in this application, and is additionally described in pending U.S. application "Method and System for Down-Converting Electromagnetic Signals," Ser. No. 09/176,022, filed Oct. 21, 1998, which is herein incorporated by reference in its entirety.

Also at the rising edge of $\phi_1$ at time t−1, a switch 1958 in the first delay module 1928 closes, allowing a capacitor 1960 to charge to $VO_{t-1}$, such that node 1906 is at $VO_{t-1}$. This is indicated by cell 1806 in Table 1802. (In practice, $VO_{t-1}$ is undefined at this point. However, for ease of understanding, $VO_{t-1}$ shall continue to be used for purposes of explanation.)

Also at the rising edge of $\phi_1$ at time t−1, a switch 1966 in the second delay module 1930 closes, allowing a capacitor 1968 to charge to a value stored in a capacitor 1964. At this time, however, the value in capacitor 1964 is undefined, so the value in capacitor 1968 is undefined. This is indicated by cell 1807 in table 1802.

At the rising edge of $\phi_2$ at time t−1, a switch 1954 in the down-convert and delay module 1924 closes, allowing a capacitor 1956 to charge to the level of the capacitor 1952. Accordingly, the capacitor 1956 charges to $VI_{t-1}$, such that node 1904 is at $VI_{t-1}$. This is indicated by cell 1810 in Table 1802.

The UDF module 1922 may optionally include a unity gain module 1990A between capacitors 1952 and 1956. The unity gain module 1990A operates as a current source to enable capacitor 1956 to charge without draining the charge from capacitor 1952. For a similar reason, the UDF module 1922 may include other unity gain modules 1990B-1990G. It should be understood that, for many embodiments and applications of the invention, these unity gain modules 1990A-1990G are optional. The structure and operation of the unity gain modules 1990 will be apparent to persons skilled in the relevant art(s).

Also at the rising edge of $\phi_2$ at time t−1, a switch 1962 in the first delay module 1928 closes, allowing a capacitor 1964 to charge to the level of the capacitor 1960. Accordingly, the capacitor 1964 charges to $VO_{t-1}$, such that node 1908 is at $VO_{t-1}$. This is indicated by cell 1814 in Table 1802.

Also at the rising edge of $\phi_2$ at time t−1, a switch 1970 in the second delay module 1930 closes, allowing a capacitor 1972 to charge to a value stored in a capacitor 1968. At this time, however, the value in capacitor 1968 is undefined, so the value in capacitor 1972 is undefined. This is indicated by cell 1815 in table 1802.

At time t, at the rising edge of $\phi_1$, the switch 1950 in the down-convert and delay module 1924 closes. This allows the capacitor 1952 to charge to $VI_t$, such that node 1902 is at $VI_t$. This is indicated in cell 1816 of Table 1802.

Also at the rising edge of $\phi_1$ at time t, the switch 1958 in the first delay module 1928 closes, thereby allowing the capacitor 1960 to charge to $VO_t$. Accordingly, node 1906 is at $VO_t$. This is indicated in cell 1820 in Table 1802.

Further at the rising edge of $\phi_1$ at time t, the switch 1966 in the second delay module 1930 closes, allowing a capacitor 1968 to charge to the level of the capacitor 1964. Therefore, the capacitor 1968 charges to $VO_{t-1}$, such that node 1910 is at $VO_{t-1}$. This is indicated by cell 1824 in Table 1802.

At the rising edge of $\phi_2$ at time t, the switch 1954 in the down-convert and delay module 1924 closes, allowing the capacitor 1956 to charge to the level of the capacitor 1952. Accordingly, the capacitor 1956 charges to $VI_t$, such that node 1904 is at $VI_t$. This is indicated by cell 1828 in Table 1802.

Also at the rising edge of $\phi_2$ at time t, the switch 1962 in the first delay module 1928 closes, allowing the capacitor 1964 to charge to the level in the capacitor 1960. Therefore, the capacitor 1964 charges to $VO_t$, such that node 1908 is at $VO_t$. This is indicated by cell 1832 in Table 1802.

Further at the rising edge of $\phi_2$ at time t, the switch 1970 in the second delay module 1930 closes, allowing the capacitor 1972 in the second delay module 1930 to charge to the level of the capacitor 1968 in the second delay module 1930. Therefore, the capacitor 1972 charges to $VO_{t-1}$, such that node 1912 is at $VO_{t-1}$. This is indicated in cell 1836 of FIG. 18.

At time t+1, at the rising edge of $\phi_1$, the switch 1950 in the down-convert and delay module 1924 closes, allowing the capacitor 1952 to charge to $VI_{t+1}$. Therefore, node 1902 is at $VI_{t+1}$, as indicated by cell 1838 of Table 1802.

Also at the rising edge of $\phi_1$ at time t+1, the switch 1958 in the first delay module 1928 closes, allowing the capacitor 1960 to charge to $VO_{t+1}$. Accordingly, node 1906 is at $VO_{t+1}$, as indicated by cell 1842 in Table 1802.

Further at the rising edge of $\phi_1$ at time t+1, the switch 1966 in the second delay module 1930 closes, allowing the capacitor 1968 to charge to the level of the capacitor 1964. Accordingly, the capacitor 1968 charges to $VO_t$, as indicated by cell 1846 of Table 1802.

In the example of FIG. 19, the first scaling module 1932 scales the value at node 1908 (i.e., the output of the first delay module 1928) by a scaling factor of −0.1. Accordingly, the value present at node 1914 at time t+1 is $-0.1{*}VO_t$. Similarly, the second scaling module 1934 scales the value present at node 1912 (i.e., the output of the second scaling module 1930) by a scaling factor of −0.8. Accordingly, the value present at node 1916 is $-0.8{*}VO_{t-1}$ at time t+1.

At time t+1, the values at the inputs of the summer 1926 are: $VI_t$ at node 1904, $-0.1{*}VO_t$ at node 1914, and $-0.8{*}VO_{t-1}$ at node 1916 (in the example of FIG. 19, the values at nodes 1914 and 1916 are summed by a second summer 1925, and this sum is presented to the summer 1926). Accordingly, at time t+1, the summer generates a signal equal to $VI_t-0.1{*}VO_t-0.8{*}VO_{t-1}$.

At the rising edge of $\phi_1$ at time t+1, a switch 1991 in the output sample and hold module 1936 closes, thereby allowing a capacitor 1992 to charge to $VO_{t+1}$. Accordingly, the capacitor 1992 charges to $VO_{t+1}$, which is equal to the sum generated by the adder 1926. As just noted, this value is equal to: $VI_t-0.1{*}VO_t-0.8{*}VO_{t-1}$. This is indicated in cell 1850 of Table 1802. This value is presented to the optional output smoothing module 1938, which smooths the signal to thereby generate the instance of the output signal $VO_{t+1}$. It is apparent from inspection that this value of $VO_{t+1}$ is consistent with the band pass filter transfer function of EQ. 1.

Further details of unified down-conversion and filtering as described in this section are presented in pending U.S. application "Integrated Frequency Translation And Selectivity," Ser. No. 09/175,966, filed Oct. 21, 1998, incorporated herein by reference in its entirety.

6.0 Example Application Embodiments of the Invention

As noted above, the UFT module of the present invention is a very powerful and flexible device. Its flexibility is illustrated, in part, by the wide range of applications in which it can be used. Its power is illustrated, in part, by the usefulness and performance of such applications.

Example applications of the UFT module were described above. In particular, frequency down-conversion, frequency up-conversion, enhanced signal reception, and unified down-conversion and filtering applications of the UFT module were summarized above, and are further described below. These applications of the UFT module are discussed herein for illustrative purposes. The invention is not limited to these example applications. Additional applications of the UFT module will be apparent to persons skilled in the relevant art(s), based on the teachings contained herein.

Figure 7:
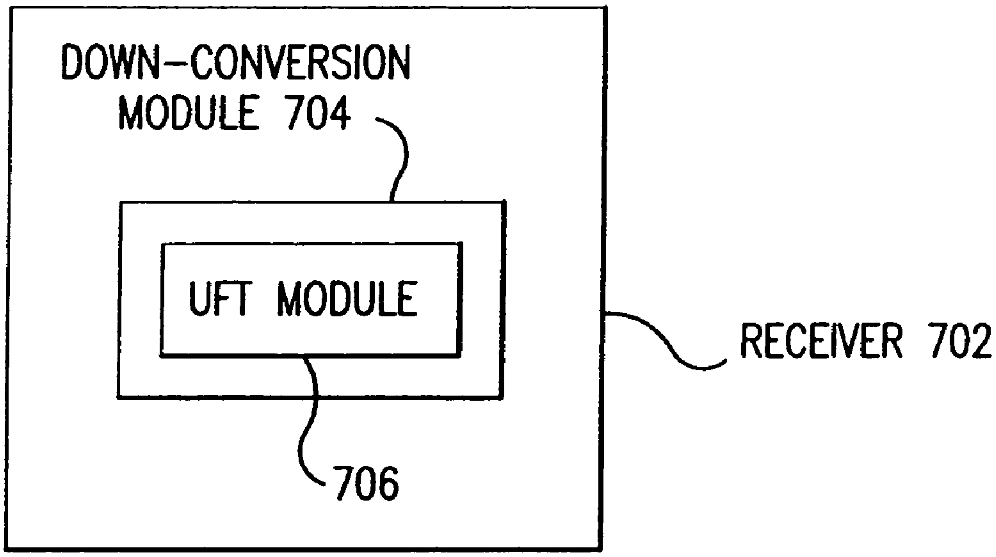
FIG. 7 illustrates a UFT module used in a receiver according to an embodiment of the invention.

For example, the present invention can be used in applications that involve frequency down-conversion. This is shown in FIG. 1C, for example, where an example UFT module 115 is used in a down-conversion module 114. In this capacity, the UFT module 115 frequency down-converts an input signal to an output signal. This is also shown in FIG. 7, for example, where an example UFT module 706 is part of a down-conversion module 704, which is part of a receiver 702.

Figure 8:
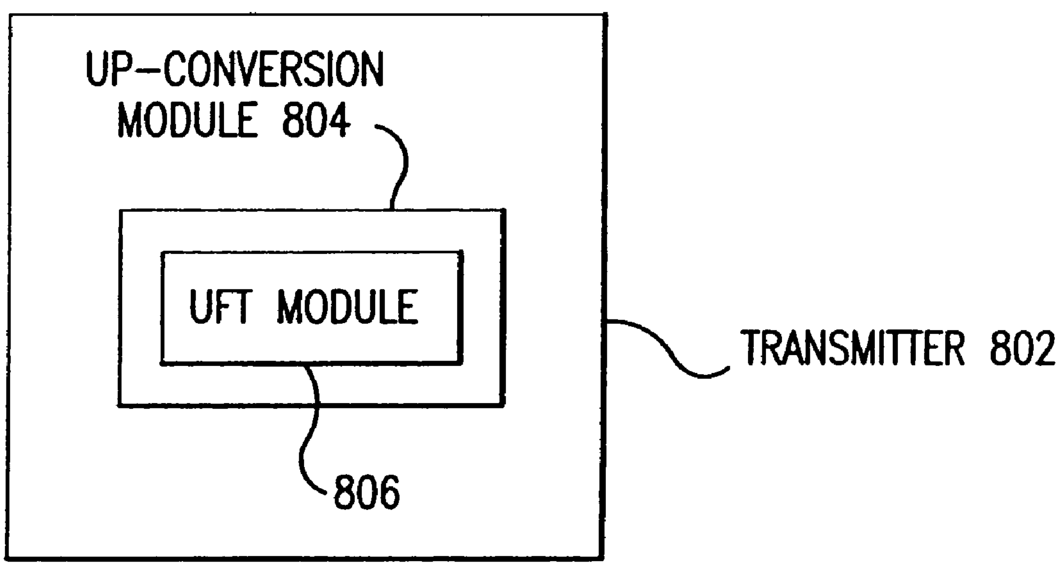
FIG. 8 illustrates a UFT module used in a transmitter according to an embodiment of the invention.

The present invention can be used in applications that involve frequency up-conversion. This is shown in FIG. 1D, for example, where an example UFT module 117 is used in a frequency up-conversion module 116. In this capacity, the UFT module 117 frequency up-converts an input signal to an output signal. This is also shown in FIG. 8, for example, where an example UFT module 806 is part of up-conversion module 804, which is part of a transmitter 802.

Figure 9:
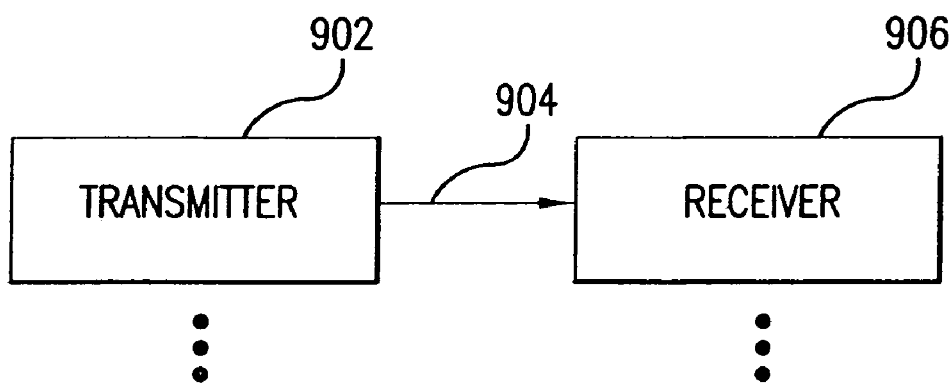
FIG. 9 illustrates an environment comprising a transmitter and a receiver, each of which may be implemented using a UFT module of the invention.

The present invention can be used in environments having one or more transmitters 902 and one or more receivers 906, as illustrated in FIG. 9. In such environments, one or more of the transmitters 902 may be implemented using a UFT module, as shown for example in FIG. 8. Also, one or more of the receivers 906 may be implemented using a UFT module, as shown for example in FIG. 7.

Figure 10:
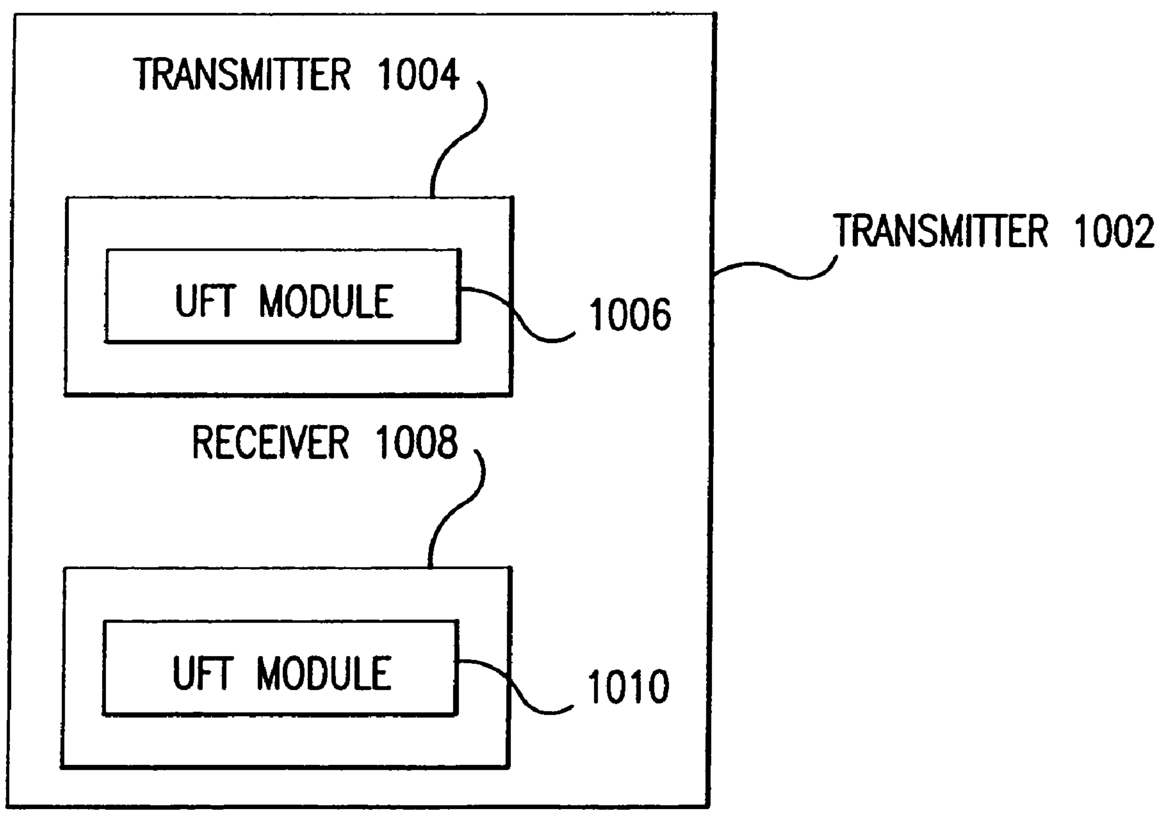
FIG. 10 illustrates a transceiver according to an embodiment of the invention.

The invention can be used to implement a transceiver. An example transceiver 1002 is illustrated in FIG. 10. The transceiver 1002 includes a transmitter 1004 and a receiver 1008. Either the transmitter 1004 or the receiver 1008 can be implemented using a UFT module. Alternatively, the transmitter 1004 can be implemented using a UFT module 1006, and the receiver 1008 can be implemented using a UFT module 1010. This embodiment is shown in FIG. 10.

Figure 11:
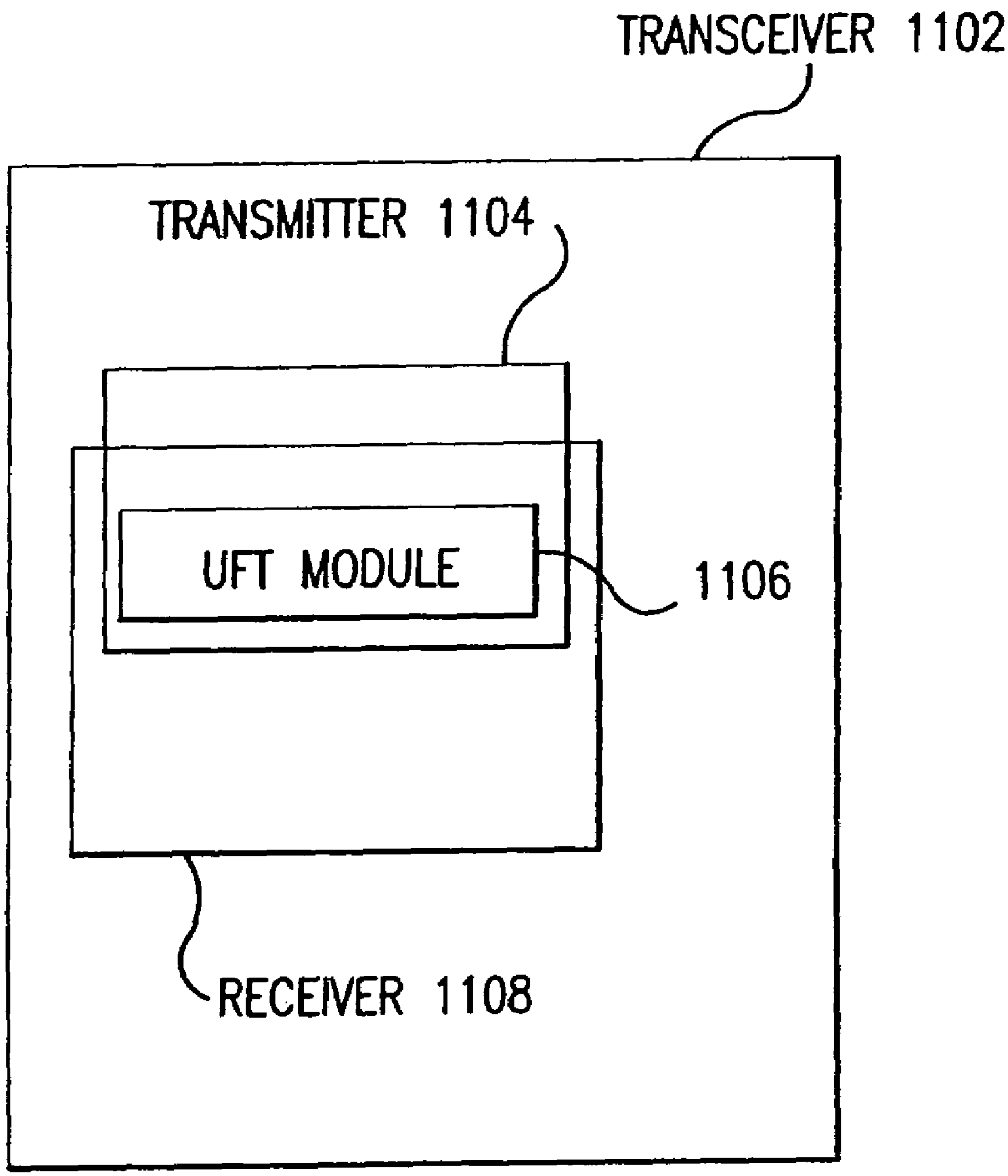
FIG. 11 illustrates a transceiver according to an alternative embodiment of the invention.

Another transceiver embodiment according to the invention is shown in FIG. 11. In this transceiver 1102, the transmitter 1104 and the receiver 1108 are implemented using a single UFT module 1106. In other words, the transmitter 1104 and the receiver 1108 share a UFT module 1106.

Figure 12:
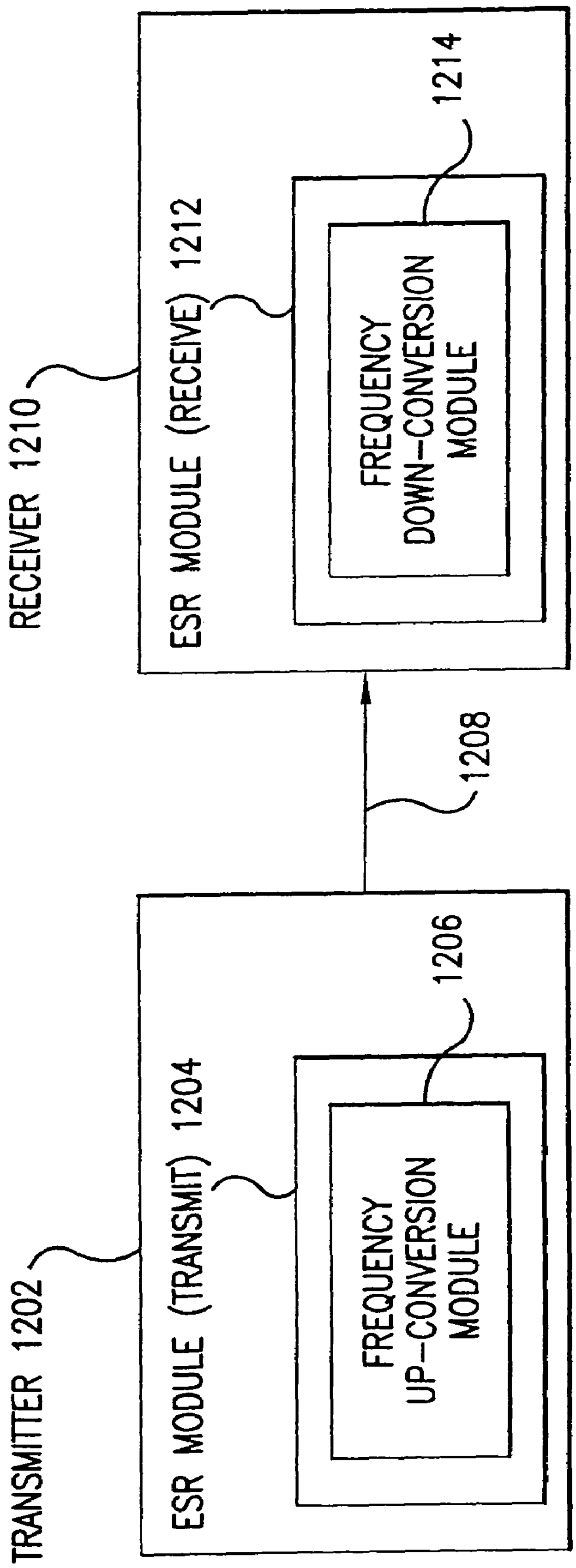
FIG. 12 illustrates an environment comprising a transmitter and a receiver, each of which may be implemented using enhanced signal reception (ESR) components of the invention.

As described elsewhere in this application, the invention is directed to methods and systems for enhanced signal reception (ESR). Various ESR embodiments include an ESR module (transmit) in a transmitter 1202, and an ESR module (receive) in a receiver 1210. An example ESR embodiment configured in this manner is illustrated in FIG. 12.

The ESR module (transmit) 1204 includes a frequency up-conversion module 1206. Some embodiments of this frequency up-conversion module 1206 may be implemented using a UFT module, such as that shown in FIG. 1D.

The ESR module (receive) 1212 includes a frequency down-conversion module 1214. Some embodiments of this frequency down-conversion module 1214 may be implemented using a UFT module, such as that shown in FIG. 1C.

Figure 13:
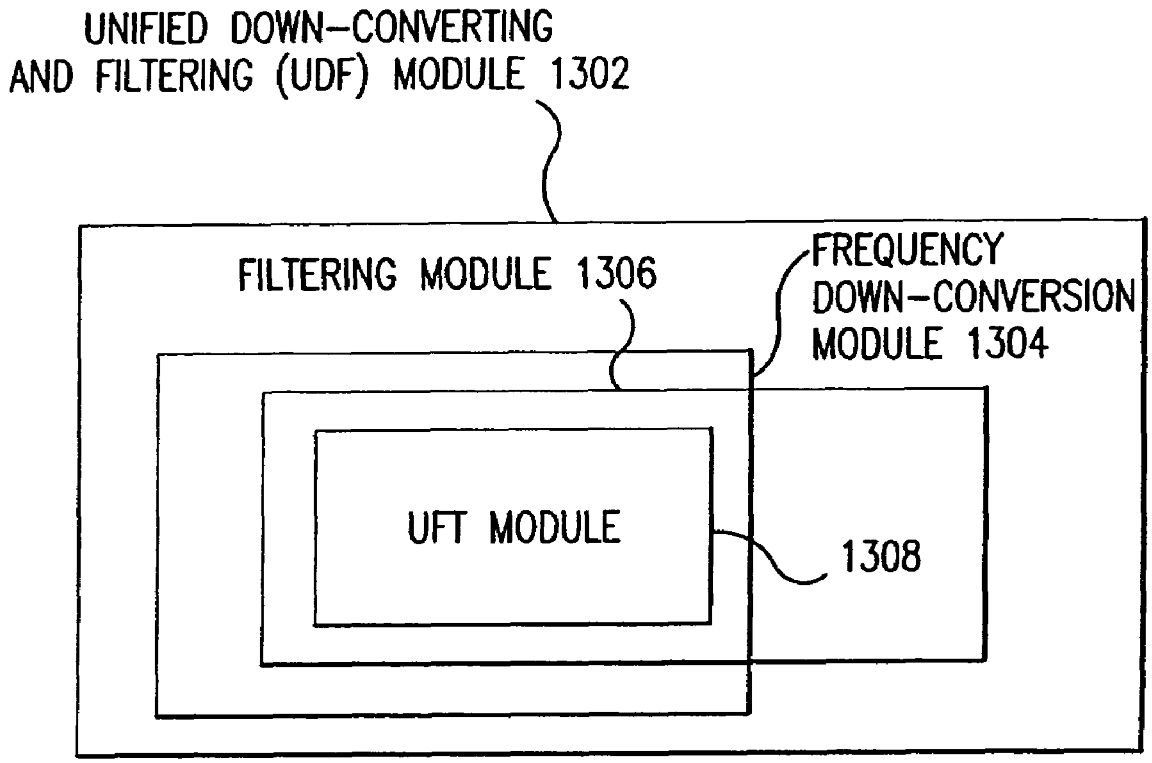
FIG. 13 illustrates a UFT module used in a unified down-conversion and filtering (UDF) module according to an embodiment of the invention.

As described elsewhere in this application, the invention is directed to methods and systems for unified down-conversion and filtering (UDF). An example unified down-conversion and filtering module 1302 is illustrated in FIG. 13. The unified down-conversion and filtering module 1302 includes a frequency down-conversion module 1304 and a filtering module 1306. According to the invention, the frequency down-conversion module 1304 and the filtering module 1306 are implemented using a UFT module 1308, as indicated in FIG. 13.

Figure 15A:
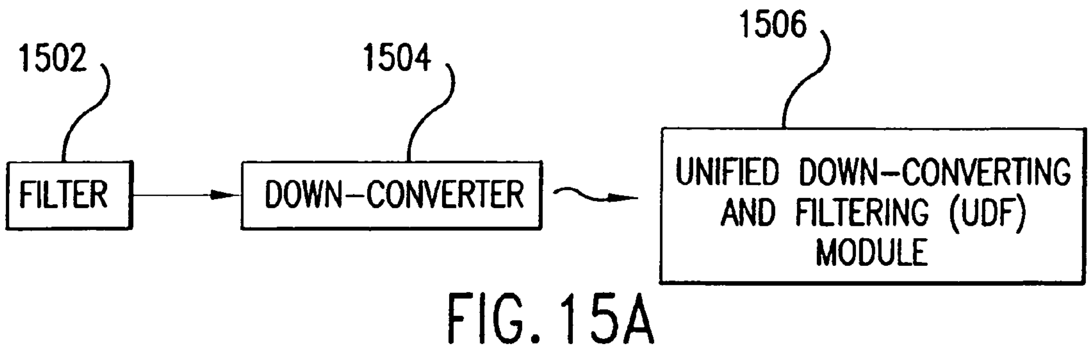
FIGS. 15A-15F illustrate example applications of the UDF module according to embodiments of the invention.
Figure 15B:
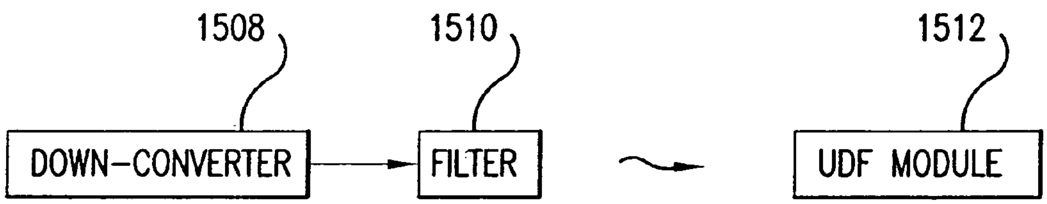
Figure 15C:
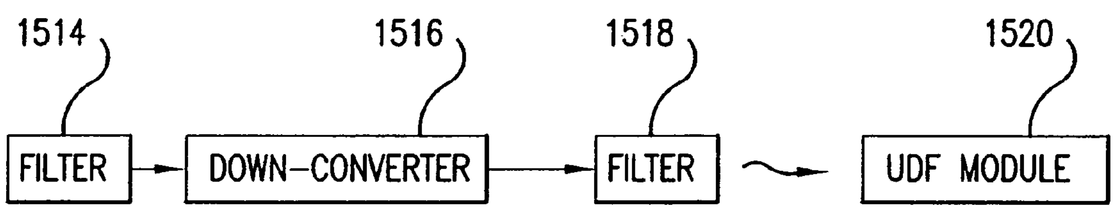
Figure 15D:
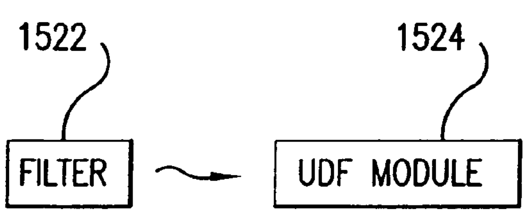
Figure 15E:
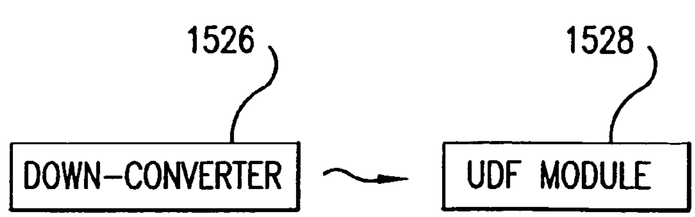
Figure 15F:
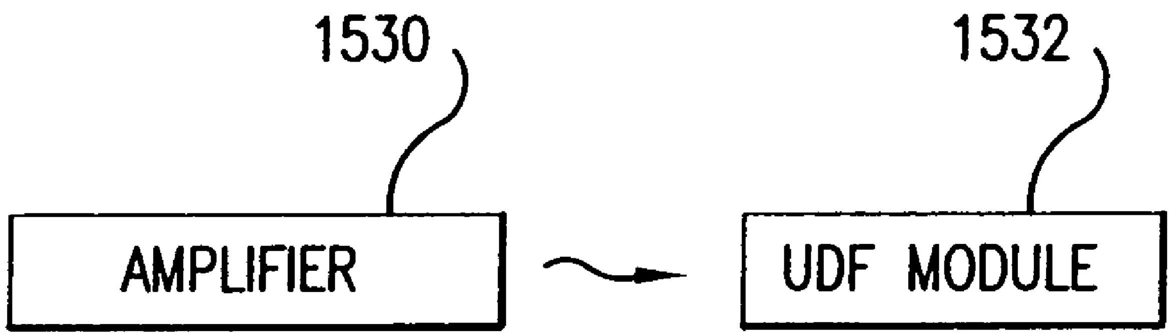

Unified down-conversion and filtering according to the invention is useful in applications involving filtering and/or frequency down-conversion. This is depicted, for example, in FIGS. 15A-15F. FIGS. 15A-15C indicate that unified down-conversion and filtering according to the invention is useful in applications where filtering precedes, follows, or both precedes and follows frequency down-conversion. FIG. 15D indicates that a unified down-conversion and filtering module 1524 according to the invention can be utilized as a filter 1522 (i.e., where the extent of frequency down-conversion by the down-converter in the unified down-conversion and filtering module 1524 is minimized). FIG. 15E indicates that a unified down-conversion and filtering module 1528 according to the invention can be utilized as a down-converter 1526 (i.e., where the filter in the unified down-conversion and filtering module 1528 passes substantially all frequencies). FIG. 15F illustrates that the unified down-conversion and filtering module 1532 can be used as an amplifier. It is noted that one or more UDF modules can be used in applications that involve at least one or more of filtering, frequency translation, and amplification.

Figure 14:
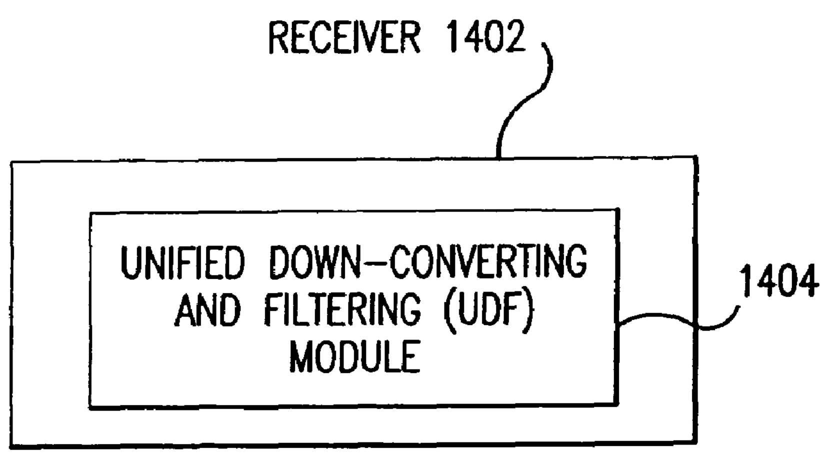
FIG. 14 illustrates an example receiver implemented using a UDF module according to an embodiment of the invention.

For example, receivers, which typically perform filtering, down-conversion, and filtering operations, can be implemented using one or more unified down-conversion and filtering modules. This is illustrated, for example, in FIG. 14.

Figure 16:
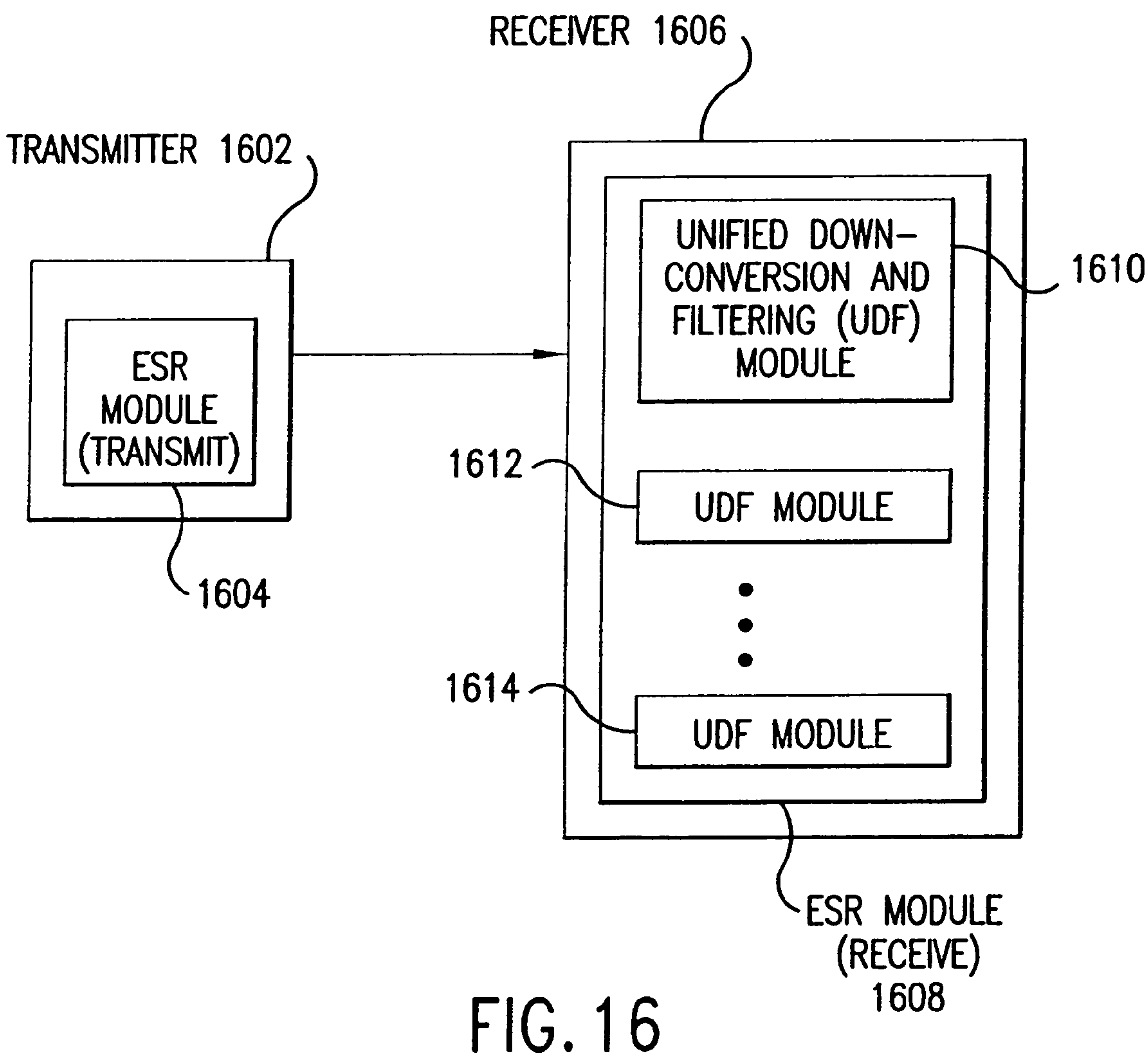
FIG. 16 illustrates an environment comprising a transmitter and a receiver, each of which may be implemented using enhanced signal reception (ESR) components of the invention, wherein the receiver may be further implemented using one or more UFD modules of the invention.

The methods and systems of unified down-conversion and filtering of the invention have many other applications. For example, as discussed herein, the enhanced signal reception (ESR) module (receive) operates to down-convert a signal containing a plurality of spectrums. The ESR module (receive) also operates to isolate the spectrums in the down-converted signal, where such isolation is implemented via filtering in some embodiments. According to embodiments of the invention, the ESR module (receive) is implemented using one or more unified down-conversion and filtering (UDF) modules. This is illustrated, for example, in FIG. 16. In the example of FIG. 16, one or more of the UDF modules 1610, 1612, 1614 operates to down-convert a received signal. The UDF modules 1610, 1612, 1614 also operate to filter the down-converted signal so as to isolate the spectrum(s) contained therein. As noted above, the UDF modules 1610, 1612, 1614 are implemented using the universal frequency translation (UFT) modules of the invention.

The invention is not limited to the applications of the UFT module described above. For example, and without limitation, subsets of the applications (methods and/or structures) described herein (and others that would be apparent to persons skilled in the relevant art(s) based on the herein teachings) can be associated to form useful combinations.

For example, transmitters and receivers are two applications of the UFT module. FIG. 10 illustrates a transceiver 1002 that is formed by combining these two applications of the UFT module, i.e., by combining a transmitter 1004 with a receiver 1008.

Also, ESR (enhanced signal reception) and unified down-conversion and filtering are two other applications of the UFT module. FIG. 16 illustrates an example where ESR and unified down-conversion and filtering are combined to form a modified enhanced signal reception system.

The invention is not limited to the example applications of the UFT module discussed herein. Also, the invention is not limited to the example combinations of applications of the UFT module discussed herein. These examples were provided for illustrative purposes only, and are not limiting. Other applications and combinations of such applications will be apparent to persons skilled in the relevant art(s) based on the teachings contained herein. Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals.

Additional example applications are described below.

7. Universal Transmitter

The present invention is directed at a universal transmitter using two or more UFT modules in a balanced vector modulator configuration. The universal transmitter can be used to create virtually every known and useful waveform used in analog and digital communications applications in wired and wireless markets. By appropriately selecting the inputs to the universal transmitter, a host of signals can be synthesized including AM, FM, BPSK, QPSK, MSK, QAM, ODFM, multi-tone, and spread-spectrum signals (including CDMA and frequency hopping). As will be shown, the universal transmitter can up-convert these waveforms using less components than that seen with conventional super-hetrodyne approaches. In other words, the universal transmitter does not require multiple IF stages (having intermediate filtering) to up-convert complex waveforms that have demanding spectral growth requirements. The elimination of intermediate IF stages reduces part count in the transmitter and therefore leads to cost savings. As will be shown, the present invention achieves these savings without sacrificing performance.

Figure 33A:
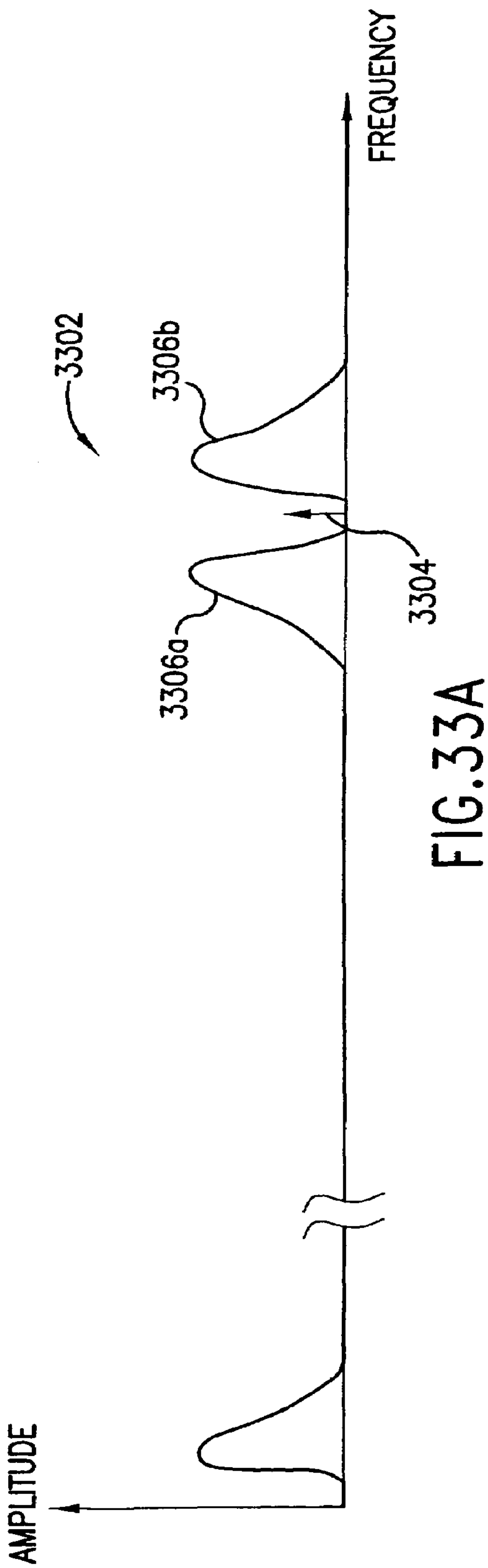
FIGS. 33A-B illustrate carrier insertion.
Figure 33B:
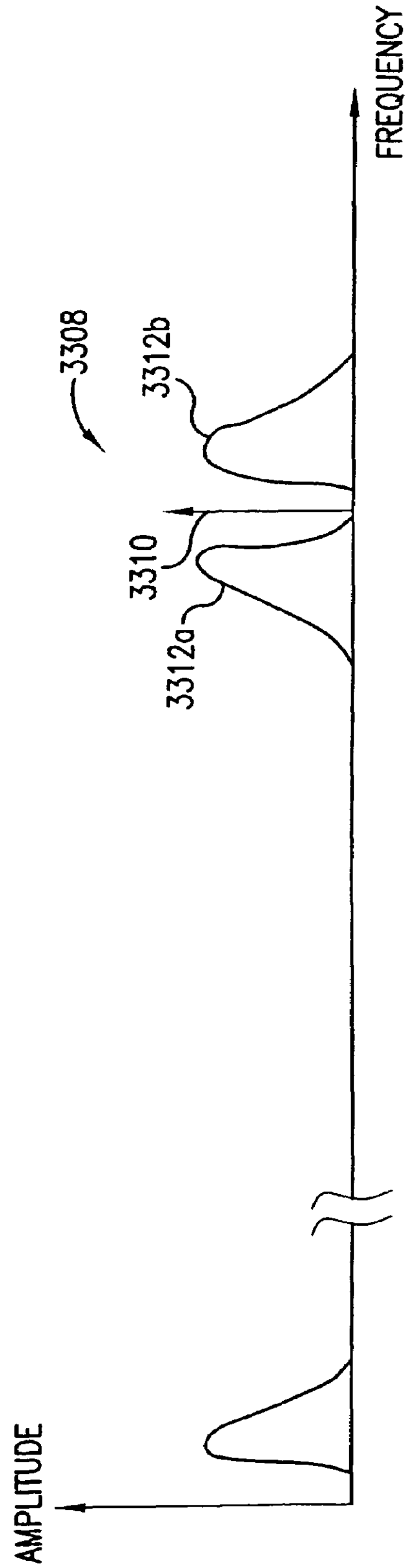

Furthermore, the use of a balanced configuration means that carrier insertion can be attenuated or controlled during up-conversion of a baseband signal. Carrier insertion is caused by the variation of transmitter components (e.g. resistors, capacitors, etc.), which produces DC offset voltages throughout the transmitter. Any DC offset voltage gets up-converted, along with the baseband signal, and generates spectral energy (or carrier insertion) at the carrier frequency $f_C$. In many transmit applications, it is highly desirable to minimize the carrier insertion in an up-converted signal because the sideband(s) carry the information and any carrier insertion is wasted energy that reduces efficiency. FIG. 33A further illustrates carrier insertion and depicts up-converted signal 3302 having minimal carrier energy 3304 when compared to sidebands 3306*a* and 3306*b*. In these applications, the present invention can be configured to minimize carrier insertion by limiting the relative DC offset voltage that is present in the transmitter. Alternatively, some transmit applications require sufficient carrier insertion for coherent demodulation of the transmitted signal at the receiver. This illustrated by FIG. 33B, which shows up-converted signal 3308 having carrier energy 3310 that is somewhat larger than sidebands 3312*a* and 3312*b*. In these applications, the present invention can be configured to introduce a DC offset that generates the desired carrier insertion.

7.1 Universal Transmitter Having 2 UFT Modules

Figure 34A:
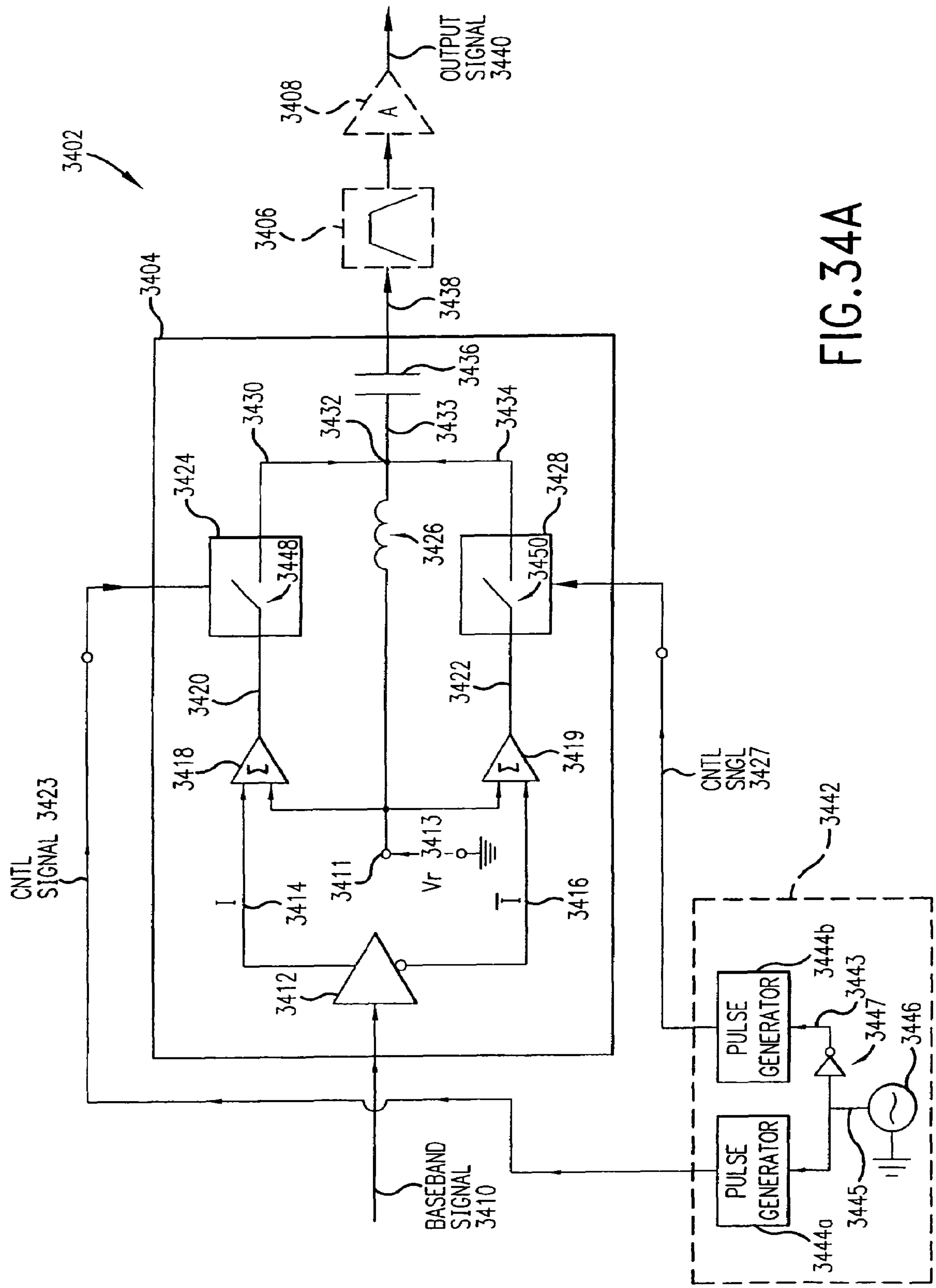
FIGS. 34A-C illustrate a balanced transmitter 3402 according to the present invention and associated example signal diagrams.

FIG. 34A illustrates a transmitter 3402 according to embodiments of the present invention. Transmitter 3402 includes a balanced modulator/up-converter 3404, a control signal generator 3442, an optional filter 3406, and an optional amplifier 3408. Transmitter 3402 up-converts a baseband signal 3410 to produce an output signal 3440 that is conditioned for wireless or wire line transmission. In doing so, the balanced modulator 3404 receives the baseband signal 3410 and samples the baseband signal in a differential and balanced fashion to generate a harmonically rich signal 3438. The harmonically rich signal 3438 includes multiple harmonic images, where each image contains the baseband information in the baseband signal 3410. The optional bandpass filter 3406 may be included to select a harmonic of interest (or a subset of harmonics) in the signal 3438 for transmission. The optional amplifier 3408 may be included to amplify the selected harmonic prior to transmission.

7.1.1 Balanced Modulator Detailed Description

The balanced modulator 3404 includes the following components: a buffer/inverter 3412; summer amplifiers 3418, 3419; UFT modules 3424 and 3428 having controlled switches 3448 and 3450, respectively; an inductor 3426; a blocking capacitor 3436; and a DC terminal 3411. As stated above, the balanced modulator 3404 samples the baseband signal to generate a harmonically rich signal 3438. More specifically, the UFT modules 3424 and 3428 sample the baseband signal in differential fashion according to control signals 3423 and 3427, respectively. A DC reference voltage 3413 is applied to terminal 3411 and is uniformly distributed to the UFT modules 3424 and 3428. The distributed DC voltage 3413 prevents any DC offset voltages from developing between the UFT modules that can lead to carrier insertion in the harmonically rich signal 3438. The operation of the balanced modulator 3404 is described in greater detail in reference to the flowchart 6900 as follows.

In step 6902, the modulator 3404 receives the input baseband signal 3410. More specifically, the buffer/inverter 3412 receives the input baseband signal.

In step 6904, the buffer/inverter 3412 generates input signal 3414 and inverted input signal 3416. Input signal 3414 is substantially similar to signal 3410, and inverted signal 3416 is an inverted version of signal 3414. As such, the buffer/inverter 3412 converts the (single-ended) baseband signal 3410 into differential signals 3414 and 3416 that will be sampled by the UFT modules. Buffer/inverter 3412 can be implemented using known operational amplifier (op amp) circuits, as will be understood by those skilled in the arts.

In step 6906, the summer amplifier 3418 sums the DC reference voltage 3413 applied to terminal 3411 with the input signal 3414, to generate a combined signal 3420. Likewise, the summer amplifier 3419 sums the DC reference voltage 3413 with the inverted input signal 3416 to generate a combined signal 3422. Summer amplifiers 3418 and 3419 can be implemented using known op amp summer circuits, which can be designed to have a specified gain or attenuation, including unity gain. The DC reference voltage 3413 is also distributed to the outputs of both UFT modules 3424 and 3428 through the inductor 3426 as is shown.

Figure 35A:
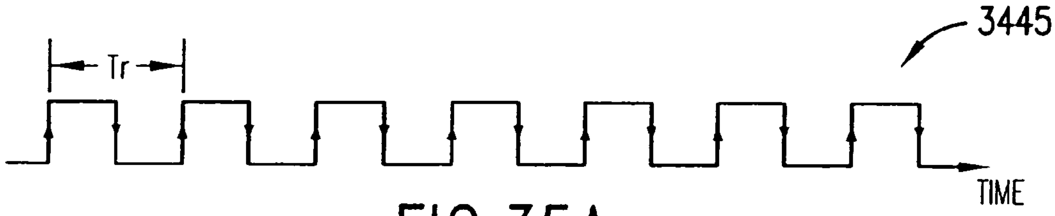
FIG. 35A-I illustrate various timing diagrams associated with the transmitter 3402 according to embodiments of the present invention.
Figure 35B:
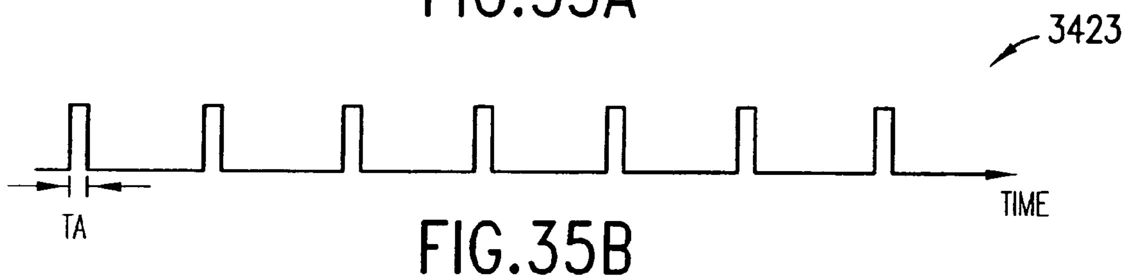
Figure 35C:

In step 6908, control signal generator 3442 generates control signals 3423 and 3427 that are shown in FIG. 35B and FIG. 35C, respectively. As illustrated, both control signals 3423 and 3427 have the same period $T_S$ as a master clock signal 3445 (FIG. 35A), but have a pulse width (or aperture) of $T_A$. Control signal 3423 triggers on the rising pulse edge of the master clock signal 3445, and control signal 3427 triggers on the falling pulse edge of the master clock signal 3445. Therefore, control signals 3423 and 3427 are shifted in time by 180 degrees relative to each other.

In one embodiment, the control signal generator 3442 includes an oscillator 3446, pulse generators 3444*a* and 3444*b*, and an inverter 3447 as shown. In operation, the oscillator 3446 generates the master clock signal 3445, which is illustrated in FIG. 35A as a periodic square wave having pulses with a period of $T_S$. Other clock signals could be used including sinusoidal waves, as will be understood by those skilled in the arts. Control signal generator 3444*a* receives the master clock signal 3445 and triggers on the rising pulse edge, to generate the control signal 3423. Inverter 3447 inverts the clock signal 3445 to generate an inverted clock signal 3443. The control signal generator 3444*b* receives the inverted clock signal 3443 and triggers on the rising pulse edge (which is the falling edge of clock signal 3445), to generate the control signal 3427.

Figure 34B:
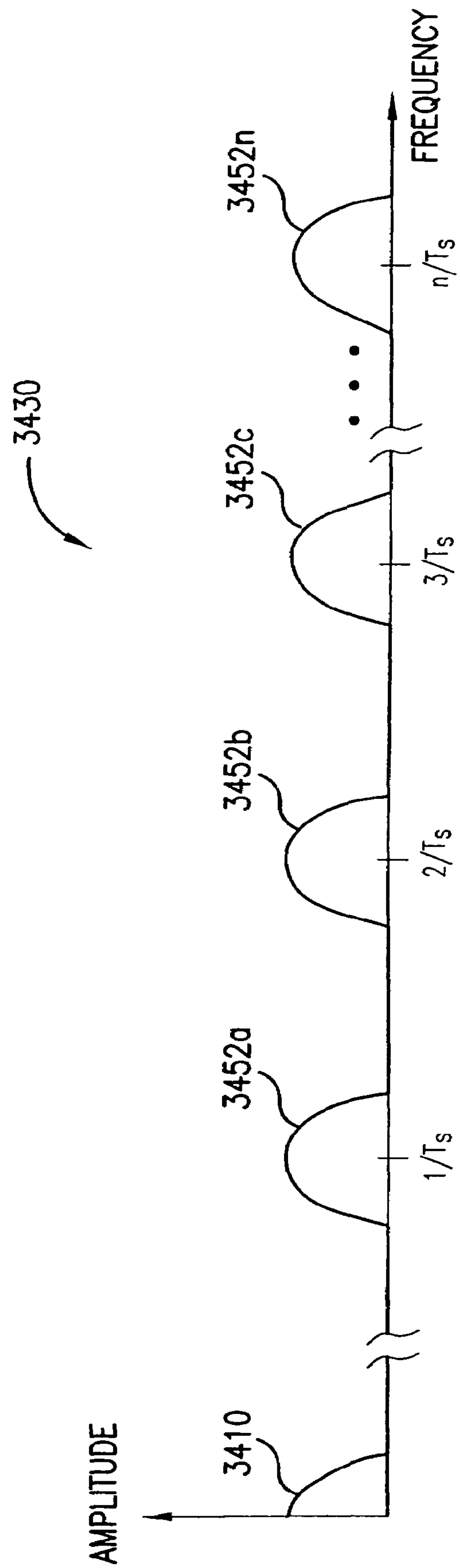

In step 6910, the UFT module 3424 samples the combined signal 3420 according to the control signal 3423 to generate harmonically rich signal 3430. More specifically, the switch 3448 closes during the pulse widths $T_A$ of the control signal 3423 to sample the combined signal 3420 and generate harmonically rich signal 3430. FIG. 34B illustrates an exemplary frequency spectrum for the harmonically rich signal 3430 having harmonic images 3452*a-n*. The images 3452 repeat at harmonics of the sampling frequency $1/T_S$, at infinitum, where each image 3452 contains the necessary amplitude and frequency information to reconstruct the baseband signal 3410. As discussed further below, the relative amplitude of the frequency images is generally a function of the harmonic number and the pulse width $T_A$. As such, the relative amplitude of a particular harmonic 3452 can be increased (or decreased) by adjusting the pulse width $T_A$ of the control signal 3423. In general, shorter pulse widths of $T_A$ shift more energy into the higher frequency harmonics, and longer pulse widths of $T_A$ shift energy into the lower frequency harmonics. The generation of harmonically rich signals by sampling an input signal according to a controlled aperture have been described earlier in this application in the section titled, "Frequency Up-conversion Using Universal Frequency Translation", and is illustrated by FIGS. 3-6. A more detailed discussion of frequency up-conversion using a switch with a controlled sampling aperture is discussed in the co-pending patent application titled, "Method and System for Frequency Up-Conversion," Ser. No. 09/176,154, field on Oct. 21, 1998, and incorporated herein by reference.

In step 6912, the UFT module 3428 samples the combined signal 3422 according to the control signal 3427 to generate harmonically rich signal 3434. More specifically, the switch 3450 closes during the pulse widths $T_A$ of the control signal 3427 to sample the combined signal 3422 to generate the harmonically rich signal 3434. The harmonically rich signal 3434 includes multiple frequency images of baseband signal 3410 that repeat at harmonics of the sampling frequency ($1/T_S$), similar to that for the harmonically rich signal 3430. However, the images in the signal 3434 are phase-shifted compared to those in signal 3430 because of the inversion of signal 3416 compared to signal 3414, and because of the relative phase shift between the control signals 3423 and 3427.

Figure 34C:
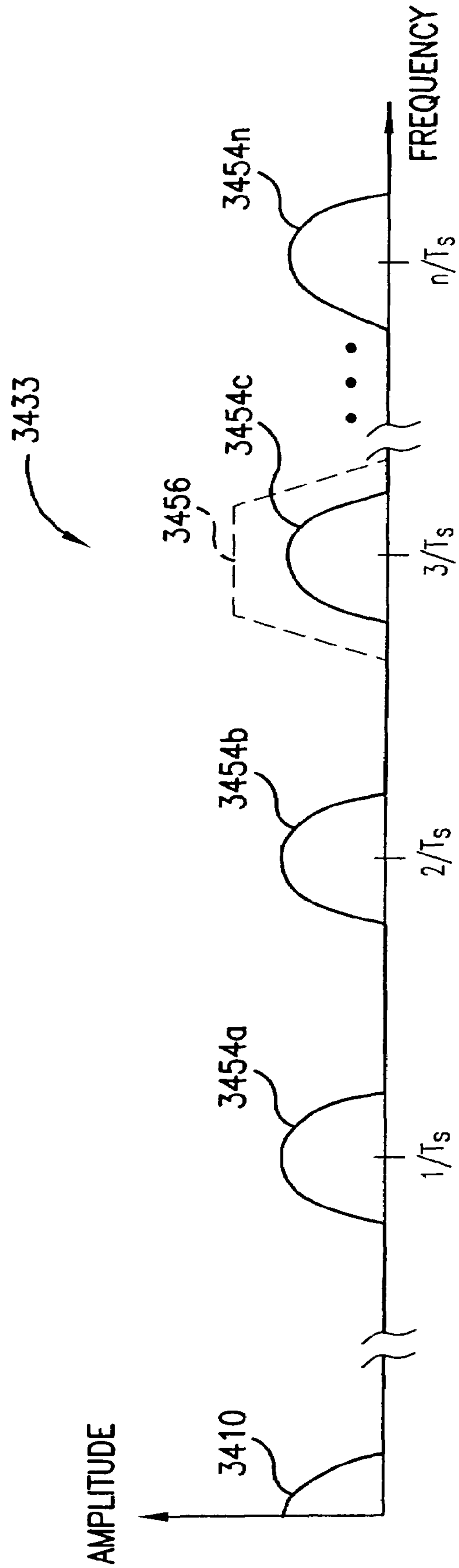

In step 6914, the node 3432 sums the harmonically rich signals 3432 and 3434 to generate harmonically rich signal 3433. FIG. 34C illustrates an exemplary frequency spectrum for the harmonically rich signal 3433 that has multiple images 3454*a-n* that repeat at harmonics of the sampling frequency $1/T_S$. Each image 3454 includes the necessary amplitude and frequency information to reconstruct the baseband signal 3410.

In step 6916, the optional filter 3406 can be used to select a desired harmonic image for transmission. This is represented by a passband 3456 that selects the harmonic image 3456*c* for transmission.

An advantage of the modulator 3404 is that it is fully balanced, which substantially minimizes (or eliminates) any DC voltage offset between the two UFT modules 3424 and 3428. DC offset is minimized because the reference voltage 3413 contributes a consistent DC component to the input signals 3420 and 3422 through the summing amplifiers 3418 and 3419, respectively. Furthermore, the reference voltage 3413 is also directly coupled to the outputs of the UFT modules 3424 and 3428 through the inductor 3426 and the node 3432. The result of controlling the DC offset between the UFT modules is that carrier insertion is minimized in the harmonic images of the harmonically rich signal 3438. As discussed above, carrier insertion is substantially wasted energy because the information for a modulated signal is carried in the sidebands of the modulated signal and not in the carrier. Therefore, it is often desirable to minimize the energy at the carrier frequency by controlling the relative DC offset.

7.1.2 Balanced Modulator Example Signal Diagrams and Mathematical Description

Figure 35D:
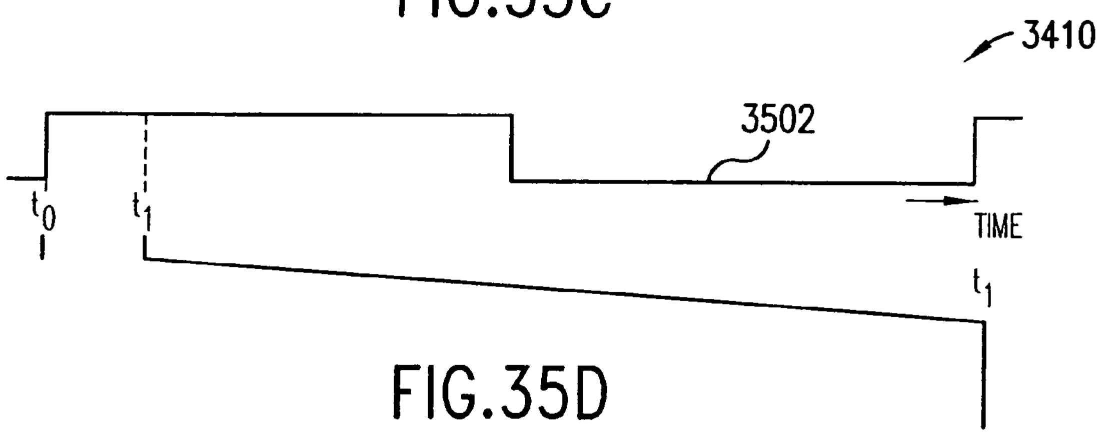
Figure 35E:
Figure 35F:
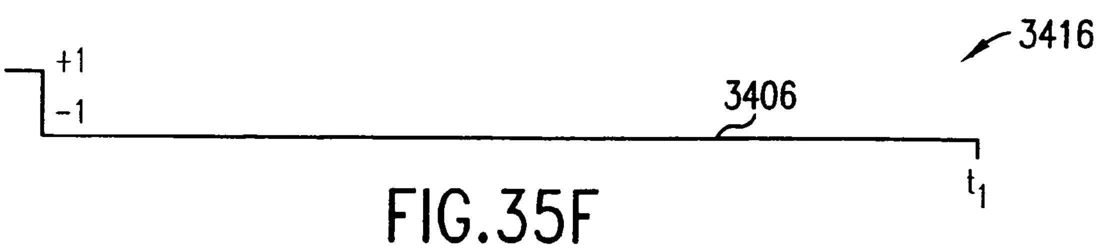

In order to further describe the invention, FIGS. 35D-35I illustrate various example signal diagrams (vs. time) that are representative of the invention. These signal diagrams are meant for example purposes only and are not meant to be limiting. FIG. 35D illustrates a signal 3502 that is representative of the input baseband signal 3410 (FIG. 34A). (Note: the invention can up-convert both digital and analog input signals) FIG. 35E illustrates a step function 3504 that is an expanded portion of the signal 3502 from time $t_0$ to $t_1$, and represents signal 3414 at the output of the buffer/inverter 3412. Similarly, FIG. 35F illustrates a signal 3506 that is an inverted version of the signal 3504, and represents the signal 3416 at the inverted output of buffer/inverter 3412. For analysis purposes, a step function is a good approximation for a portion of a single bit of data (for the baseband signal 3410) because the clock rates of the control signals 3423 and 3427 are significantly higher than the data rates of the baseband signal 3410. For example, if the data rate is in the KHz frequency range, then the clock rate will preferably be in MHZ frequency range in order to generate an output signal in the Ghz frequency range.

Figure 35G:
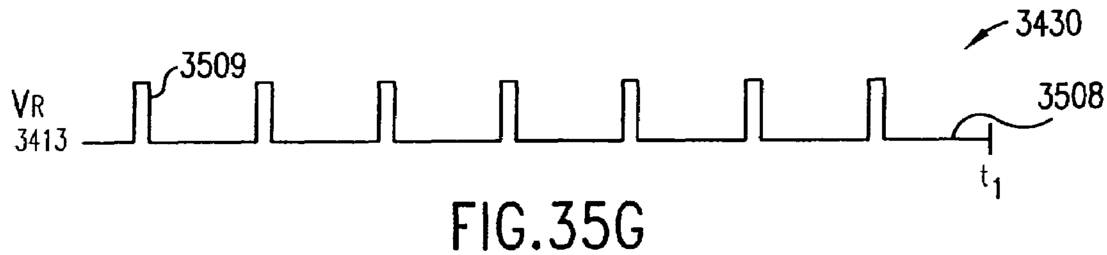
Figure 35H:
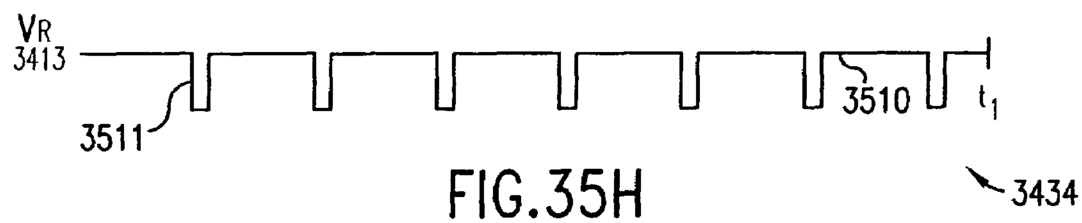
Figure 35I:
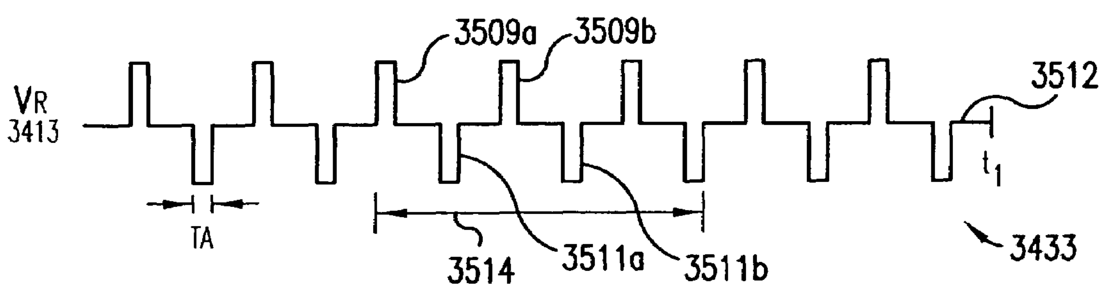

Still referring to FIGS. 35D-I, the FIG. 35G illustrates a signal 3508 that an example of the harmonically rich signal 3430 when the step function 3504 is sampled according to the control signal 3423 in FIG. 35B. The signal 3508 includes positive pulses 3509 referenced to the DC voltage 3413. Likewise, FIG. 35H illustrates a signal 3510 that is an example of the harmonically rich signal 3434 when the step function 3506 is sampled according to the control signal 3427. The signal 3510 includes negative pulses 3511 referenced to the DC voltage 3413, that are time-shifted relative the positive pulses 3509 in signal 3508. FIG. 35I illustrates a signal 3512 that is the combination of signal 3508 (FIG. 35G) and the signal 3510 (FIG. 35H), and is an example of the harmonically rich signal 3433 at the output of the summing node 3432.

Referring to FIG. 35I, the signal 3512 spends approximately as much time above the DC reference voltage 3413 as below the DC reference voltage 3413 over a limited time period. For example, over a time period 3514, the energy in the positive pulses 3509*a-b* is canceled out by the energy in the negative pulses 3511*a-b*. This is indicative of minimal (or zero) DC offset between the UFT modules 3424 and 3428, which results in minimal carrier insertion during the sampling process.

Still referring to FIG. 35I, the time axis of the signal 3512 can be phased in such a manner to represent the waveform as an odd function. For such an arrangement, the Fourier series is readily calculated to obtain:

$$I_c(t) = \sum_{n=1}^{\infty} \left( \frac{4\sin\left(\frac{n\pi T_A}{T_s}\right) \cdot \sin\left(\frac{n\pi}{2}\right)}{n\pi} \right) \cdot \sin\left(\frac{2n\pi t}{T_s}\right). \qquad \text{Equation 1}$$

where:

$T_S$=period of the master clock 3445

$T_A$=pulse width of the control signals 3423 and 3427 n=harmonic number

As shown by Equation 1, the relative amplitude of the frequency images is generally a function of the harmonic number n, and the ratio of $T_A/T_S$. As indicated, the $T_A/T_S$ ratio represents the ratio of the pulse width of the control signals relative to the period of the sub-harmonic master clock. The $T_A/T_S$ ratio can be optimized in order to maximize the amplitude of the frequency image at a given harmonic. For example, if a passband waveform is desired to be created at 5× the frequency of the sub-harmonic clock, then a baseline power for that harmonic extraction may be calculated for the fifth harmonic (n=5) as:

$$I_C(t) = \left(\frac{4\sin\left(\frac{5\pi T_A}{T_s}\right)}{5\pi}\right)\cdot\sin(5\omega_s t). \quad \text{Equation 2}$$

As shown by Equation 2, Ic(t) for the fifth harmonic is a sinusoidal function having an amplitude that is proportional to the $\sin(5\pi T_A/T_S)$. The signal amplitude can be maximized by setting $T_A=(1/10\cdot T_S)$ so that $\sin(5\pi T_A/T_S)=\sin(\pi/2)=1$. Doing so results in the equation:

$$I_c(t)\Big|_{n=5} = \frac{4}{5\pi}(\sin(5\omega_s t)). \quad \text{Equation 3}$$

This component is a carrier frequency at 5× of the sampling frequency of sub-harmonic clock, and can be extracted from the Fourier series via a bandpass filter (such as bandpass filter 3406) that is centered around 5 $f_S$. The extracted frequency component can then be optionally amplified by the amplifier 3408 prior to transmission on a wireless or wire-line communications channel or channels.

Equation 3 can be extended to reflect the inclusion of a message signal as illustrated by equation 4 below:

$$m(t)\cdot I_c(t)\,|_{\substack{n=5\\ \theta=\theta(t)}} = \frac{4\cdot m(t)}{5\pi}(\sin(5\omega_s t + 5\theta(t))). \quad \text{Equation 4}$$

Equation 4 illustrates that a message signal can be carried in harmonically rich signals 3433 such that both amplitude and phase can be modulated. In other words, m(t) is modulated for amplitude and θ(t) is modulated for phase. In such cases, it should be noted that θ(t) is augmented modulo n while the amplitude modulation m(t) is simply scaled. Therefore, complex waveforms may be reconstructed from their Fourier series with multiple aperture UFT combinations.

As discussed above, the signal amplitude for the 5th harmonic was maximized by setting the sampling aperture width $T_A=1/10\,T_S$, where $T_S$ is the period of the master clock signal. This can be restated and generalized as setting $T_A=1/2$ the period (or π radians) at the harmonic of interest. In other words, the signal amplitude of any harmonic n can be maximized by sampling the input waveform with a sampling aperture of $T_A=1/2$ the period of the harmonic of interest (n). Based on this discussion, it is apparent that varying the aperture changes the harmonic and amplitude content of the output waveform. For example, if the sub-harmonic clock has a frequency of 200 MHZ, then the fifth harmonic is at 1 Ghz. The amplitude of the fifth harmonic is maximized by setting the aperture width $T_A=500$ picoseconds, which equates to ½ the period (or π radians) at 1 Ghz.

Figure 35J:
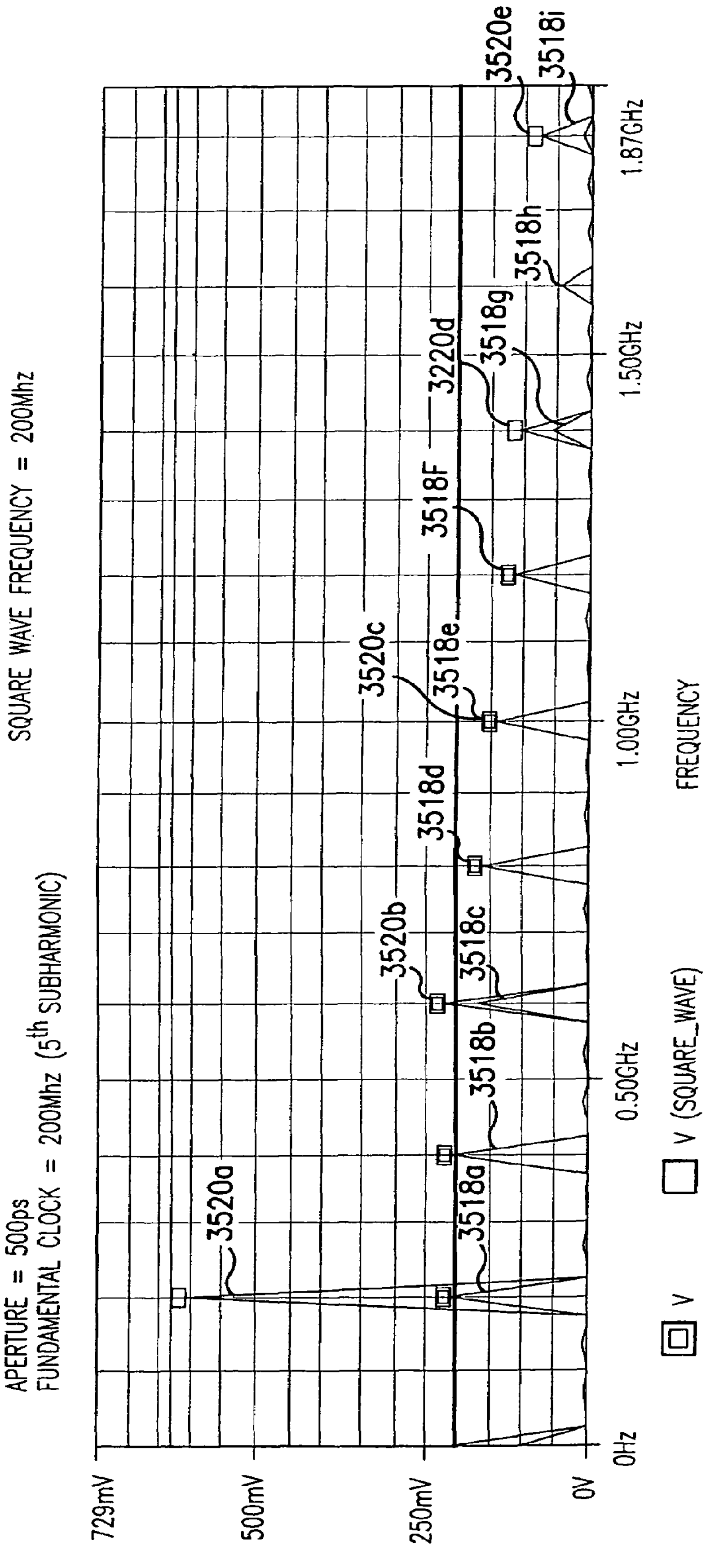
FIG. 35J illustrates a frequency spectrum plot associated with transmitter 3402 according to embodiments of the invention.

FIG. 35J depicts a frequency plot 3516 that graphically illustrates the effect of varying the sampling aperture of the control signals on the harmonically rich signal 3433 given a 200 MHZ harmonic clock. The frequency plot 3516 compares two frequency spectrums 3518 and 3520 for different control signal apertures given a 200 MHZ clock. More specifically, the frequency spectrum 3518 is an example spectrum for signal 3533 given the 200 MHZ clock with the aperture $T_A=500$ psec (where 500 psec is π radians at the 5th harmonic of 1 GHz). Similarly, the frequency spectrum 3520 is an example spectrum for signal 3433 given a 200 MHZ clock that is a square wave (so $T_A=5000$ psec). The spectrum 3518 includes multiple harmonics 3518*a-i*, and the frequency spectrum 3520 includes multiple harmonics 3520*a-e*. [It is noted that spectrum 3520 includes only the odd harmonics as predicted by Fourier analysis for a square wave.] At 1 Ghz (which is the 5th harmonic), the signal amplitude of the two frequency spectrums 3518*e* and 3520*c* are approximately equal. However, at 200 MHZ, the frequency spectrum 3518*b* has a much lower amplitude than the frequency spectrum 3520*a*, and therefore the frequency spectrum 3518 is more efficient than the frequency spectrum 3520, assuming the desired harmonic is the 5th harmonic. In other words, assuming 1 Ghz is the desired harmonic, the frequency spectrum 3518 wastes less energy at the 200 MHZ fundamental than does the frequency spectrum 3518.

7.1.3 Balanced Modulator Having a Shunt Configuration

FIG. 64A illustrates a universal transmitter 6400 that is a second embodiment of a universal transmitter having two balanced UFT modules in a shunt configuration. (In contrast, the balanced modulator 3404 can be described as having a series configuration based on the orientation of the UFT modules.) Transmitter 6400 includes a balanced modulator 6401, the control signal generator 3442, the optional bandpass filter 3406, and the optional amplifier 3408. The transmitter 6400 up-converts a baseband signal 6402 to produce an output signal 6436 that is conditioned for wireless or wire line transmission. In doing so, the balanced modulator 6401 receives the baseband signal 6402 and shunts the baseband signal to ground in a differential and balanced fashion to generate a harmonically rich signal 6434. The harmonically rich signal 6434 includes multiple harmonic images, where each image contains the baseband information in the baseband signal 6402. In other words, each harmonic image includes the necessary amplitude, frequency, and phase information to reconstruct the baseband signal 6402. The optional bandpass filter 3406 may be included to select a harmonic of interest (or a subset of harmonics) in the signal 6434 for transmission. The optional amplifier 3408 may be included to amplify the selected harmonic prior to transmission, resulting in the output signal 6436.

The balanced modulator 6401 includes the following components: a buffer/inverter 6404; optional impedances 6410, 6412; UFT modules 6416 and 6422 having controlled switches 6418 and 6424, respectively; blocking capacitors 6428 and 6430; and a terminal 6420 that is tied to ground. As stated above, the balanced modulator 6401 differentially shunts the baseband signal 6402 to ground, resulting in a harmonically rich signal 6434. More specifically, the UFT modules 6416 and 6422 alternately shunts the baseband signal to terminal 6420 according to control signals 3423 and 3427, respectively. Terminal 6420 is tied to ground and prevents any DC offset voltages from developing between the UFT modules 6416 and 6422. As described above, a DC offset voltage can lead to undesired carrier insertion. The operation of the balanced modulator 6401 is described in greater detail according to the flowchart 7000 (FIG. 70) as follows.

In step 7002, the modulator 3404 receives the input baseband signal 3410. More specifically, the buffer/inverter 3412 receives the input baseband signal.

In step 7004, the buffer/inverter 6404 receives the input baseband signal 6402 and generates I signal 6406 and inverted I signal 6408. I signal 6406 is substantially similar to the baseband signal 6402, and the inverted I signal 6408 is an inverted version of signal 6402. As such, the buffer/inverter 6404 converts the (single-ended) baseband signal 6402 into differential signals 6406 and 6408 that are sampled by the UFT modules. Buffer/inverter 6404 can be implemented using known operational amplifier (op amp) circuits, as will be understood by those skilled in the arts.

In step 7006, the control signal generator 3442 generates control signals 3423 and 3427 from the master clock signal 3445. Examples of the master clock signal 3445, control signal 3423, and control signal 3427 are shown in FIGS. 35A-C, respectively. As illustrated, both control signals 3423 and 3427 have the same period $T_S$ as a master clock signal 3445, but have a pulse width (or aperture) of $T_A$. Control signal 3423 triggers on the rising pulse edge of the master clock signal 3445, and control signal 3427 triggers on the falling pulse edge of the master clock signal 3445. Therefore, control signals 3423 and 3427 are shifted in time by 180 degrees relative to each other. A specific embodiment of the control signal generator 3442 is illustrated in FIG. 34A, and was discussed in detail above.

In step 7008, the UFT module 6416 shunts the signal 6406 to ground according to the control signal 3423, to generate a harmonically rich signal 6414. More specifically, the switch 6418 closes and shorts the signal 6406 to ground (at terminal 6420) during the aperture width $T_A$ of the control signal 3423, to generate the harmonically rich signal 6414. FIG. 64B illustrates an exemplary frequency spectrum for the harmonically rich signal 6418 having harmonic images 6450*a-n*. The images 6450 repeat at harmonics of the sampling frequency $1/T_S$, at infinitum, where each image 6450 contains the necessary amplitude, frequency, and phase information to reconstruct the baseband signal 6402. The generation of harmonically rich signals by sampling an input signal according to a controlled aperture have been described earlier in this application in the section titled, "Frequency Up-conversion Using Universal Frequency Translation", and is illustrated by FIGS. 3-6. A more detailed discussion of frequency up-conversion using a switch with a controlled sampling aperture is discussed in the co-pending patent application titled, "Method and System for Frequency Up-Conversion," Ser. No. 09/176,154, field on Oct. 21, 1998, and incorporated herein by reference.

The relative amplitude of the frequency images 6450 is generally a function of the harmonic number and the pulse width $T_A$. As such, the relative amplitude of a particular harmonic 6450 can be increased (or decreased) by adjusting the pulse width $T_A$ of the control signal 3423. In general, shorter pulse widths of $T_A$ shift more energy into the higher frequency harmonics, and longer pulse widths of $T_A$ shift energy into the lower frequency harmonics. Additionally, the relative amplitude of a particular harmonic 6450 can also be adjusted by adding/tunning an impedance 6410. Impedance 6410 operates as a filter that emphasizes a particular harmonic in the harmonically rich signal 6414.

In step 7010, the UFT module 6422 shunts the inverted signal 6408 to ground according to the control signal 3427, to generate a harmonically rich signal 6426. More specifically, the switch 6424 closes during the pulse widths $T_A$ and shorts the inverted I signal 6408 to ground (at terminal 6420), to generate the harmonically rich signal 6426. At any given time, only one of input signals 6406 or 6408 is shorted to ground because the pulses in the control signals 3423 and 3427 are phase shifted with respect to each other, as shown in FIGS. 34B and 34C.

The harmonically rich signal 6426 includes multiple frequency images of baseband signal 6402 that repeat at harmonics of the sampling frequency ($1/T_S$), similar to that for the harmonically rich signal 6414. However, the images in the signal 6426 are phase-shifted compared to those in signal 6414 because of the inversion of the signal 6408 compared to the signal 6406, and because of the relative phase shift between the control signals 3423 and 3427. The optional impedance 6412 can be included to emphasis a particular harmonic of interest, and is similar to the impedance 6410 above.

In step 7012, the node 6432 sums the harmonically rich signals 6414 and 6426 to generate the harmonically rich signal 6434. The capacitors 6428 and 6430 operate as blocking capacitors that substantially pass the respective harmonically rich signals 6414 and 6426 to the node 6432. (The capacitor values may be chosen to substantially block baseband frequency components as well.) FIG. 64C illustrates an exemplary frequency spectrum for the harmonically rich signal 6434 that has multiple images 6452*a-n* that repeat at harmonics of the sampling frequency $1/T_S$. Each image 6452 includes the necessary amplitude, frequency, and phase information to reconstruct the baseband signal 6402. The optional filter 3406 can be used to select the harmonic image of interest for transmission. This is represented by a passband 6456 that selects the harmonic image 6432*c* for transmission.

An advantage of the modulator 6401 is that it is fully balanced, which substantially minimizes (or eliminates) any DC voltage offset between the two UFT modules 6412 and 6414. DC offset is minimized because the UFT modules 6416 and 6422 are both connected to ground at terminal 6420. The result of controlling the DC offset between the UFT modules is that carrier insertion is minimized in the harmonic images of the harmonically rich signal 6434. As discussed above, carrier insertion is substantially wasted energy because the information for a modulated signal is carried in the sidebands of the modulated signal and not in the carrier. Therefore, it is often desirable to minimize the energy at the carrier frequency by controlling the relative DC offset.

7.1.4 Balanced Modulator FET Configurations

Figure 34D:
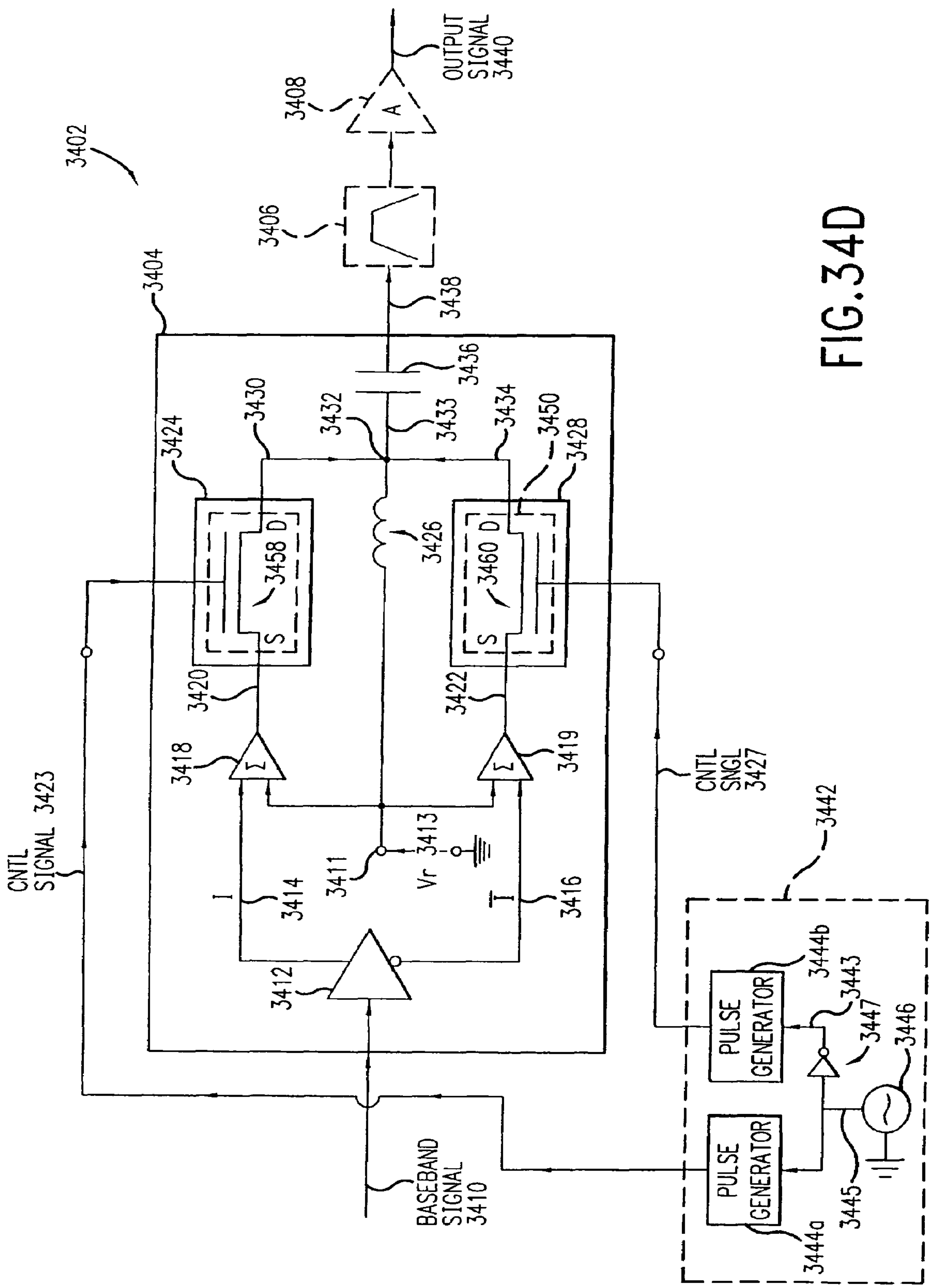
FIG. 34D illustrates a FET configuration of the balanced transmitter 3402 according to embodiments of the present invention.

As described above, the balanced modulators 3404 and 6401 utilize two balanced UFT modules to sample the input baseband signals to generate harmonically rich signals that contain the up-converted baseband information. More specifically, the UFT modules include controlled switches that sample the baseband signal in a balanced and differential fashion. FIGS. 34D and 64D illustrate embodiments of the controlled switch in the UFT module.

FIG. 34D illustrates an embodiment of the modulator 3404 (FIG. 34B) where the controlled switches in the UFT modules are field effect transistors (FET). More specifically, the controlled switches 3448 and 3428 are embodied as FET 3458 and FET 3460, respectively. The FET 3458 and 3460 are oriented so that their gates are controlled by the control signals 3423 and 3427, so that the control signals control the FET conductance. For the FET 3458, the combined baseband signal 3420 is received at the source of the FET 3458 and is sampled according to the control signal 3423 to produce the harmonically rich signal 3430 at the drain of the FET 3458. Likewise, the combined baseband signal 3422 is received at the source of the FET 3460 and is sampled according to the control signal 3427 to produce the harmonically rich signal 3434 at the drain of FET 3460. The source and drain orientation that is illustrated is not limiting, as the source and drains can be switched for most FETs. In other words, the combined baseband signal can be received at the drain of the FETs, and the harmonically rich signals can be taken from the source of the FETs, as will be understood by those skilled in the relevant arts.

FIG. 64D illustrates an embodiment of the modulator 6400 (FIG. 64) where the controlled switches in the UFT modules are field effect transistors (FET). More specifically, the controlled switches 6418 and 6424 are embodied as FET 6436 and FET 6438, respectively. The FETs 6436 and 6438 are oriented so that their gates are controlled by the control signals 3423 and 3427, respectively, so that the control signals determine FET conductance. For the FET 6436, the baseband signal 6406 is received at the source of the FET 6436 and shunted to ground according to the control signal 3423, to produce the harmonically rich signal 6414. Likewise, the baseband signal 6408 is received at the source of the FET 6438 and is shunted to grounding according to the control signal 3427, to produce the harmonically rich signal 6426. The source and drain orientation that is illustrated is not limiting, as the source and drains can be switched for most FETs, as will be understood by those skilled in the relevant arts.

7.1.5 Universal Transmitter Configured for Carrier Insertion:

As discussed above, the transmitters 3402 and 6400 have a balanced configuration that substantially eliminates any DC offset and results in minimal carrier insertion in the output signal 3340. Minimal carrier insertion is generally desired for most applications because the carrier signal carries no information and reduces the overall transmitter efficiency. However, some applications require the received signal to have sufficient carrier energy for the receiver to extract the carrier for coherent demodulation. In support thereof, the present invention can be configured to provide the necessary carrier insertion by implementing a DC offset between the two sampling UFT modules.

Figure 36A:
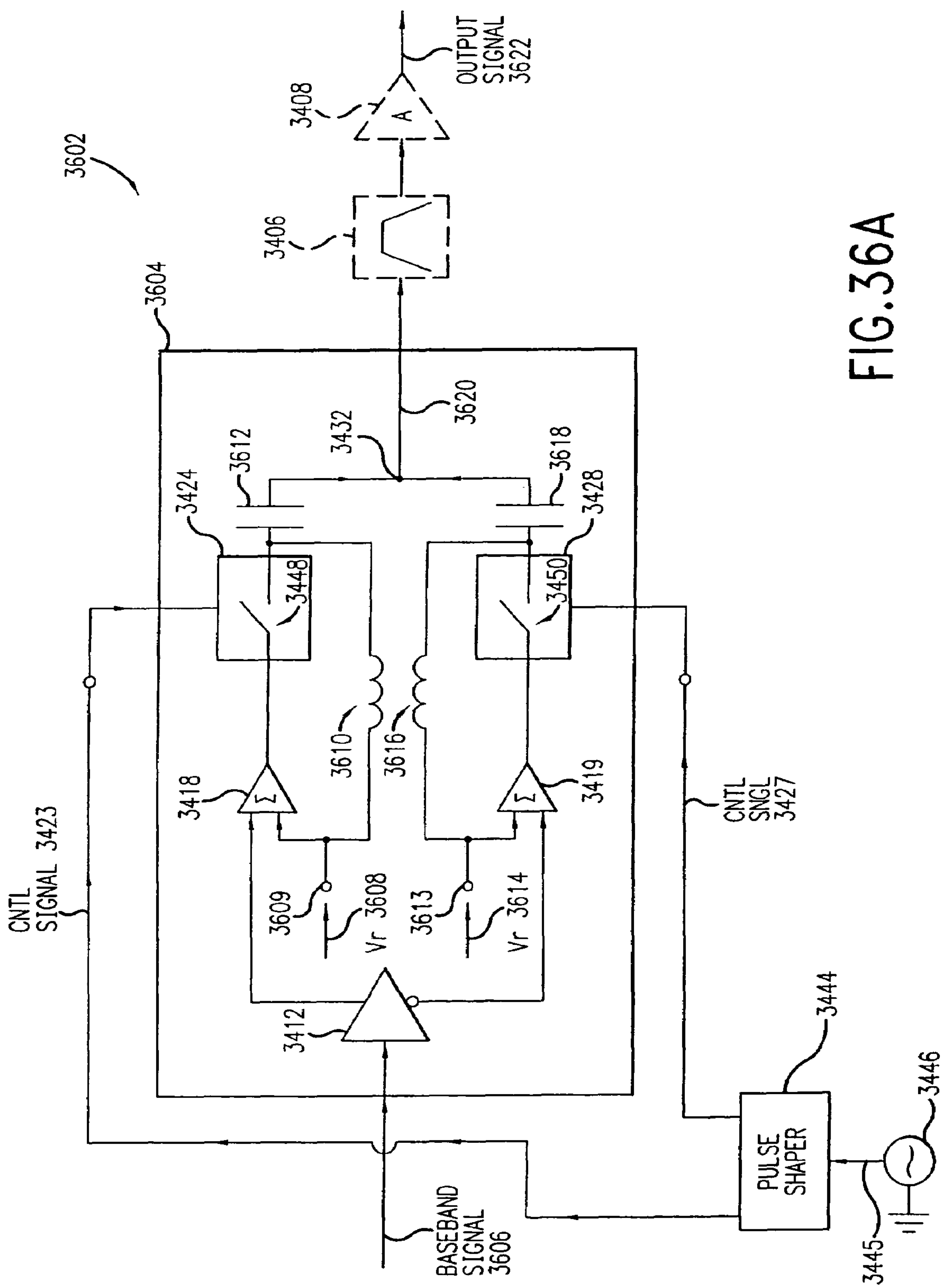
FIGS. 36A-B illustrate a balanced transmitter 3602 configured for carrier insertion according to embodiments of the invention and an example signal diagram.

FIG. 36 illustrates a transmitter 3602 that up-converts a baseband signal 3606 to an output signal 3622 having carrier insertion. As is shown, the transmitter 3602 is similar to the transmitter 3402 (FIG. 34A) with the exception that the up-converter/modulator 3604 is configured to accept two DC references voltages. In contrast, modulator 3404 was configured to accept only one DC reference voltage. More specifically, modulator 3604 includes a terminal 3609 to accept a DC reference voltage 3608, and a terminal 3613 to accept a DC reference voltage 3614. Vr 3608 appears at the UFT module 3424 though summer amplifier 3418 and the inductor 3610. Vr 3614 appears at UFT module 3428 through the summer amplifier 3419 and the inductor 3616. Capacitors 3612 and 3618 operate as blocking capacitors. If Vr 3608 is different from Vr 3614 then a DC offset voltage will be exist between UFT module 3424 and UFT module 3428, which will be up-converted as carrier frequency in the harmonically rich signal 3620. More specifically, each harmonic image in the harmonically rich signal 3620 will include a carrier signal as shown in FIG. 36 below.

Figure 36B:
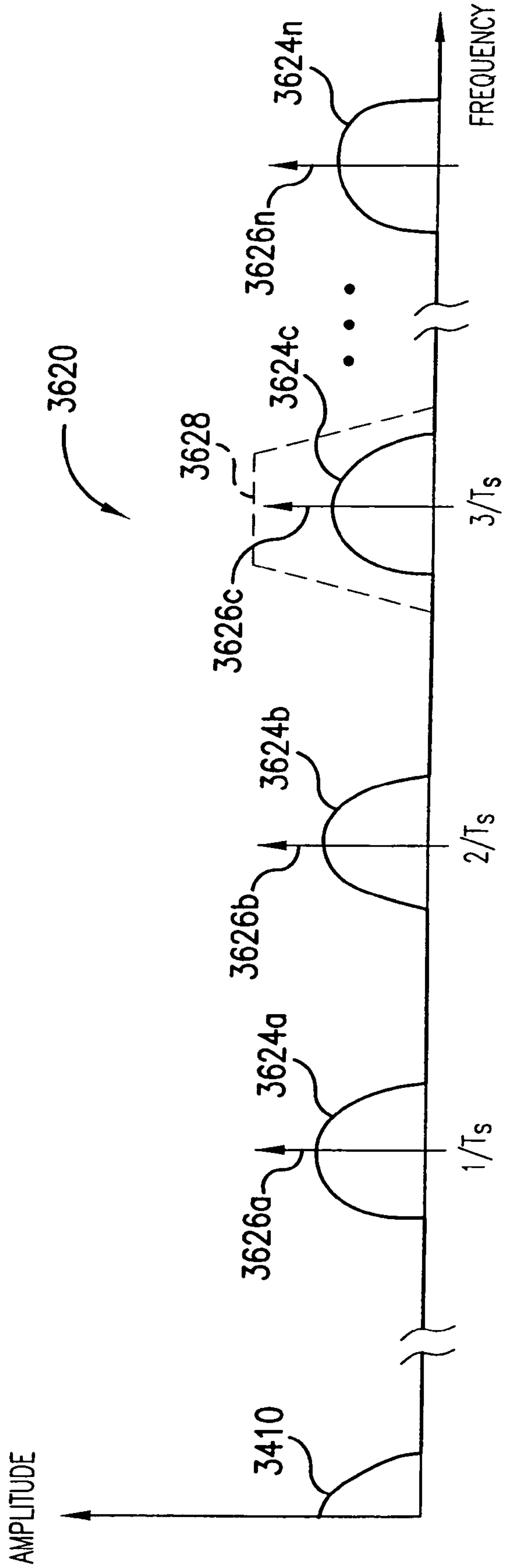

FIG. 36B illustrates an exemplary frequency spectrum for the harmonically rich signal 3620 that has multiple harmonic images 3624*a*-*n*. In addition to carrying the baseband information in the sidebands, each harmonic image 3624 also includes a carrier signal 3626 that exists at respective harmonic of the sampling frequency $1/T_S$. The amplitude of the carrier signal increases with increasing DC offset voltage. Therefore, as the difference between Vr 3608 and Vr 3614 widens, the amplitude of each carrier signal 3626 increases. Likewise, as the difference between Vr 3608 and Vr 3614 shrinks, the amplitude of each carrier signal 3626 shrinks.

As with transmitter 3602, the optional bandpass filter 3406 can be included to select a desired harmonic image for transmission. This is represented by passband 3628 selecting the harmonic 3624*c* in FIG. 36B.

7.2 Universal Transmitter In IQ Configuration:

As described above, the balanced modulators 3404 and 6401 up-convert a baseband signal to a harmonically rich signal having multiple harmonic images of the baseband information. By combining two balanced modulators, IQ configurations can be formed for up-converting I and Q baseband signals. In doing so, either the (series type) balanced modulator 3404 or the (shunt type) balanced modulator 6401 can be utilized. IQ modulators having both series and shunt configurations are described below.

7.2.1 IQ Transmitter Using Series-Type Balanced Modulator

Figure 37:
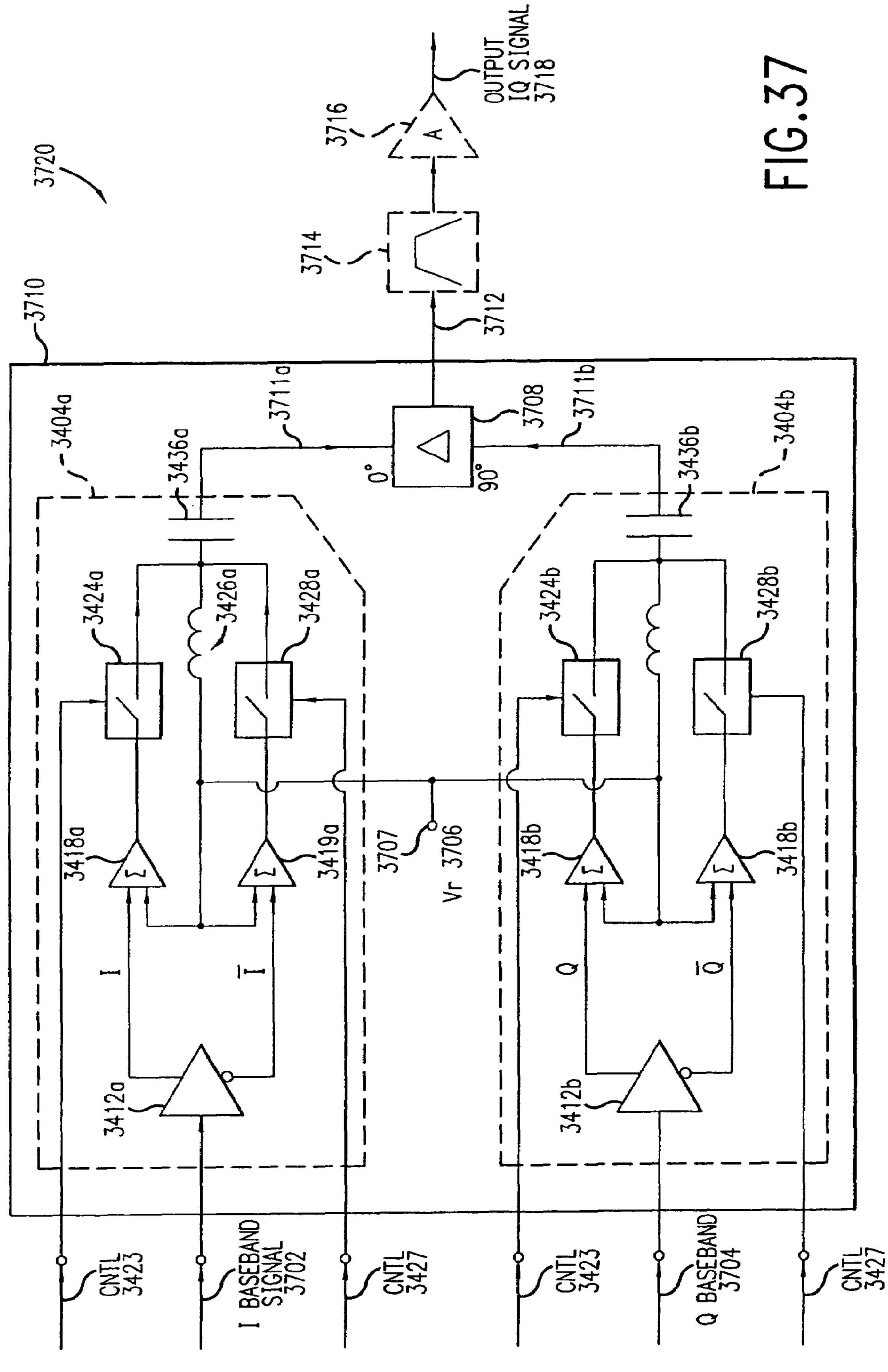
FIG. 37 illustrates an I Q balanced transmitter 3720 according to embodiments of the present invention.

FIG. 37 illustrates an IQ transmitter 3720 with an in-phase (I) and quadrature (Q) configuration according to embodiments of the invention. The transmitter 3720 includes an IQ balanced modulator 3710, an optional filter 3714, and an optional amplifier 3716. The transmitter 3720 is useful for transmitting complex I Q waveforms and does so in a balanced manner to control DC offset and carrier insertion. In doing so, the modulator 3710 receives an I baseband signal 3702 and a Q baseband signal 3704 and up-converts these signals to generate a combined harmonically rich signal 3712. The harmonically rich signal 3712 includes multiple harmonics images, where each image contains the baseband information in the I signal 3702 and the Q signal 3704. The optional bandpass filter 3714 may be included to select a harmonic of interest (or subset of harmonics) from the signal 3712 for transmission. The optional amplifier 3716 may be included to amplify the selected harmonic prior to transmission, to generate the IQ output signal 3718.

As stated above, the balanced IQ modulator 3710 up-converts the I baseband signal 3702 and the Q baseband signal 3704 in a balanced manner to generate the combined harmonically rich signal 3712 that carriers the I and Q baseband information. To do so, the modulator 3710 utilizes two balanced modulators 3404 from FIG. 34A, a signal combiner 3708, and a DC terminal 3707. The operation of the balanced modulator 3710 is described as follows.

The balanced modulator 3404*a* samples the I baseband signal 3702 in a differential fashion using the control signals 3423 and 3427 to generate a harmonically rich signal 3711*a*. The harmonically rich signal 3711*a* contains multiple harmonic images of the I baseband information, similar to the harmonically rich signal 3430 in FIG. 34B. Likewise, the balanced modulator 3404*b* samples the Q baseband signal 3704 in a differential fashion using control signals 3423 and 3427 to generate harmonically rich signal 3711*b*, where the harmonically rich signal 3711*b* contains multiple harmonic images of the Q baseband signal 3704. The operation of the balanced modulator 3404 and the generation of harmonically rich signals was fully described above and illustrated in FIGS. 34A-35J, to which the reader is referred for further details. The DC terminal 3707 receives a DC voltage 3706 that is distributed to both modulators 3404*a* and 3404*b*. The DC voltage 3706 is distributed to both the input and output of both UFT modules 3424 and 3428 in each modulator 3404. This minimizes (or prevents) DC offset voltages from developing between the four UFT modules, and thereby minimizes or prevents any carrier insertion during the sampling process.

Figure 38A:
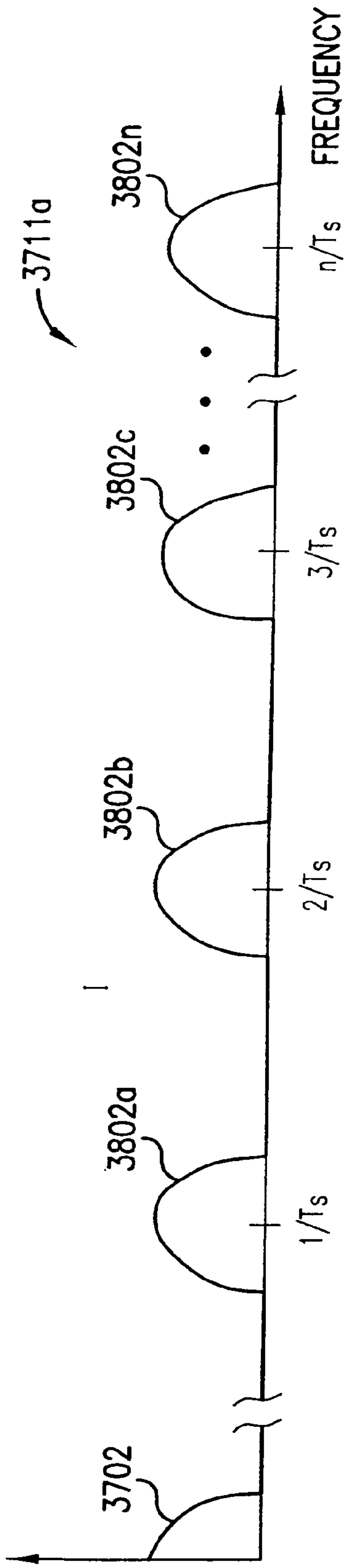
FIGS. 38A-C illustrate various signal diagrams associated with the balanced transmitter 3720 in FIG. 37.
Figure 38B:
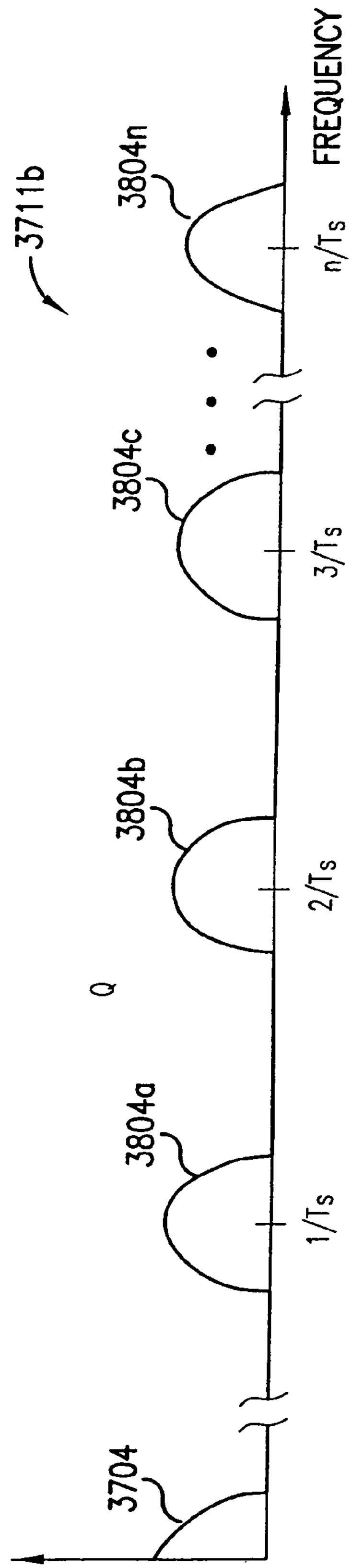
Figure 38C:
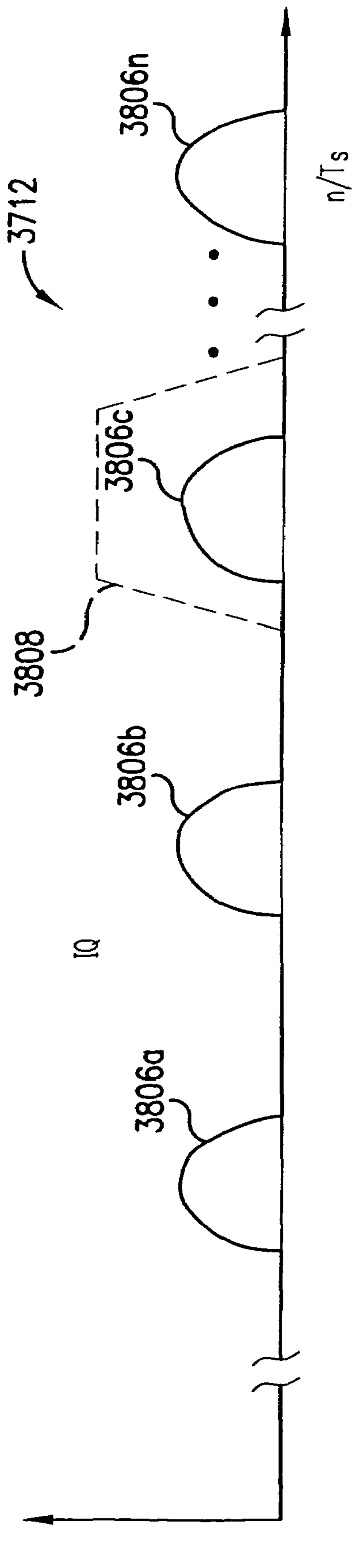

Still referring to FIG. 37, the 90 degree signal combiner 3708 combines the harmonically rich signals 3711*a* and 3711*b* to generate IQ harmonically rich signal 3712. This is further illustrated in FIGS. 38A-C. FIG. 38A depicts an exemplary frequency spectrum for the harmonically rich signal 3711*a* having harmonic images 3802*a*-*n*. The images 3802 repeat at harmonics of the sampling frequency $1/T_S$, where each image 3802 contains the necessary amplitude and frequency information to reconstruct the I baseband signal 3702. Likewise, FIG. 38B depicts an exemplary frequency spectrum for the harmonically rich signal 3711*b* having harmonic images 3804*a-n*. The harmonic images 3804*a-n* also repeat at harmonics of the sampling frequency $1/T_S$, where each image 3804 contains the necessary amplitude and frequency information to reconstruct the Q baseband signal 3704. FIG. 38C illustrates an exemplary frequency spectrum for the combined harmonically rich signal 3712 having images 3806. Each image 3806 carries the I baseband information and the Q baseband information from the corresponding images 3802 and 3804, respectively, without substantially increasing the frequency bandwidth occupied by each harmonic 3806. This can occur because the signal combiner 3708 phase shifts the Q signal 3711*b* by 90 degrees relative to the I signal 3711*a*. The result is that the images 3802*a-n* and 3804*a-n* effectively share the signal bandwidth do to their orthogonal relationship. For example, the images 3802*a* and 3804*a* effectively share the frequency spectrum that is represented by the image 3806*a*. The optional filter 3714 may be included to select a harmonic of interest, as represented by the passband 3808 selecting the image 3806*c* in FIG. 38*c*.

Figure 39A:
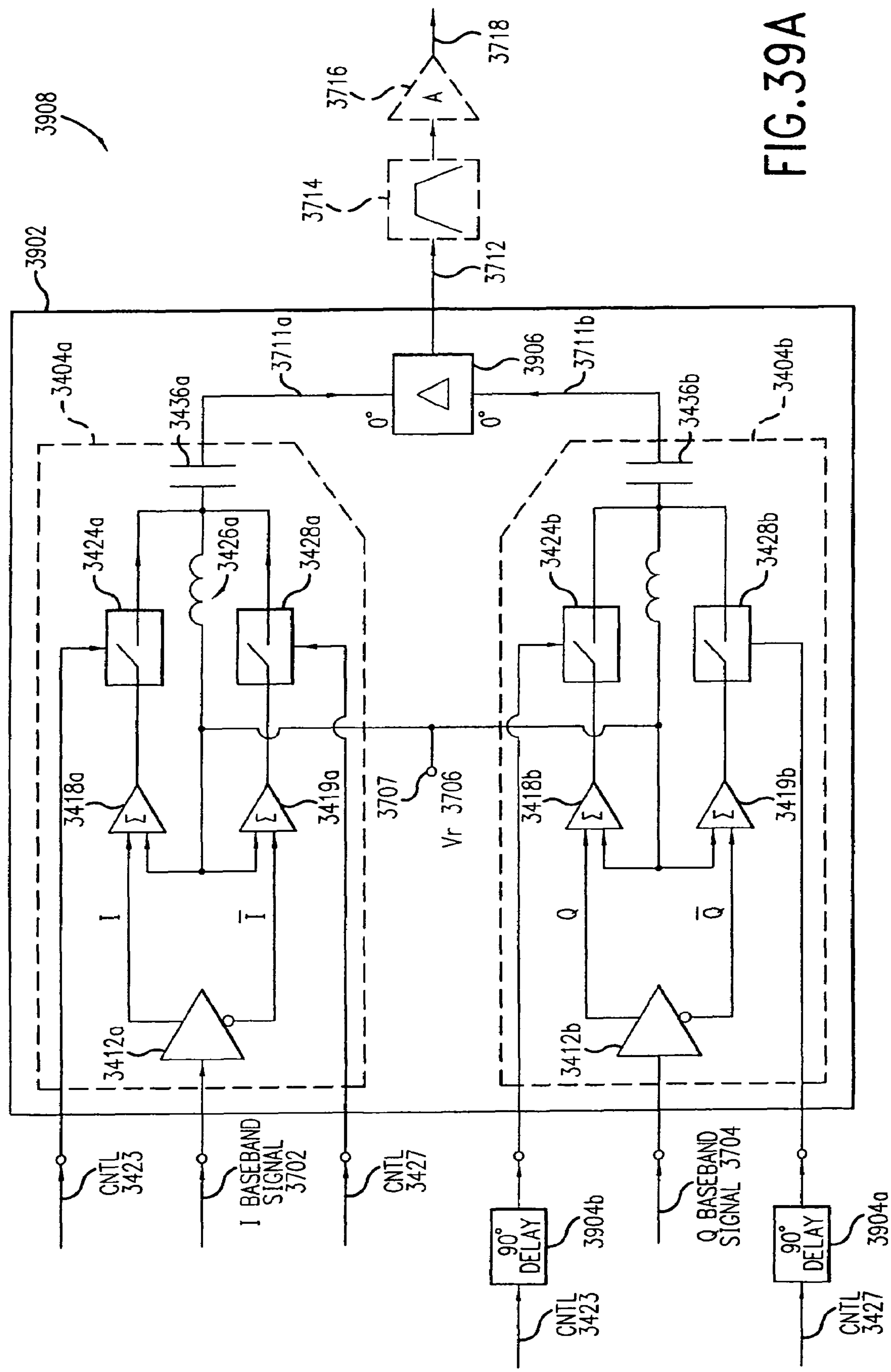
FIG. 39A illustrates an IQ balanced transmitter 3908 according to embodiments of the invention.

FIG. 39A illustrates a transmitter 3908 that is a second embodiment for an I Q transmitter having a balanced configuration. Transmitter 3908 is similar to the transmitter 3720 except that the 90 degree phase shift between the I and Q channels is achieved by phase shifting the control signals instead of using a 90 degree signal combiner to combine the harmonically rich signals. More specifically, delays 3904*a* and 3904*b* delay the control signals 3423 and 3427 for the Q channel modulator 3404*b* by 90 degrees relative the control signals for the I channel modulator 3404*a*. As a result, the Q modulator 3404*b* samples the Q baseband signal 3704 with 90 degree delay relative to the sampling of the I baseband signal 3702 by the I channel modulator 3404*a*. Therefore, the Q harmonically rich signal 3711*b* is phase shifted by 90 degrees relative to the I harmonically rich signal. Since the phase shift is achieved using the control signals, an in-phase signal combiner 3906 combines the harmonically rich signals 3711*a* and 3711*b*, to generate the harmonically rich signal 3712.

Figure 39B:
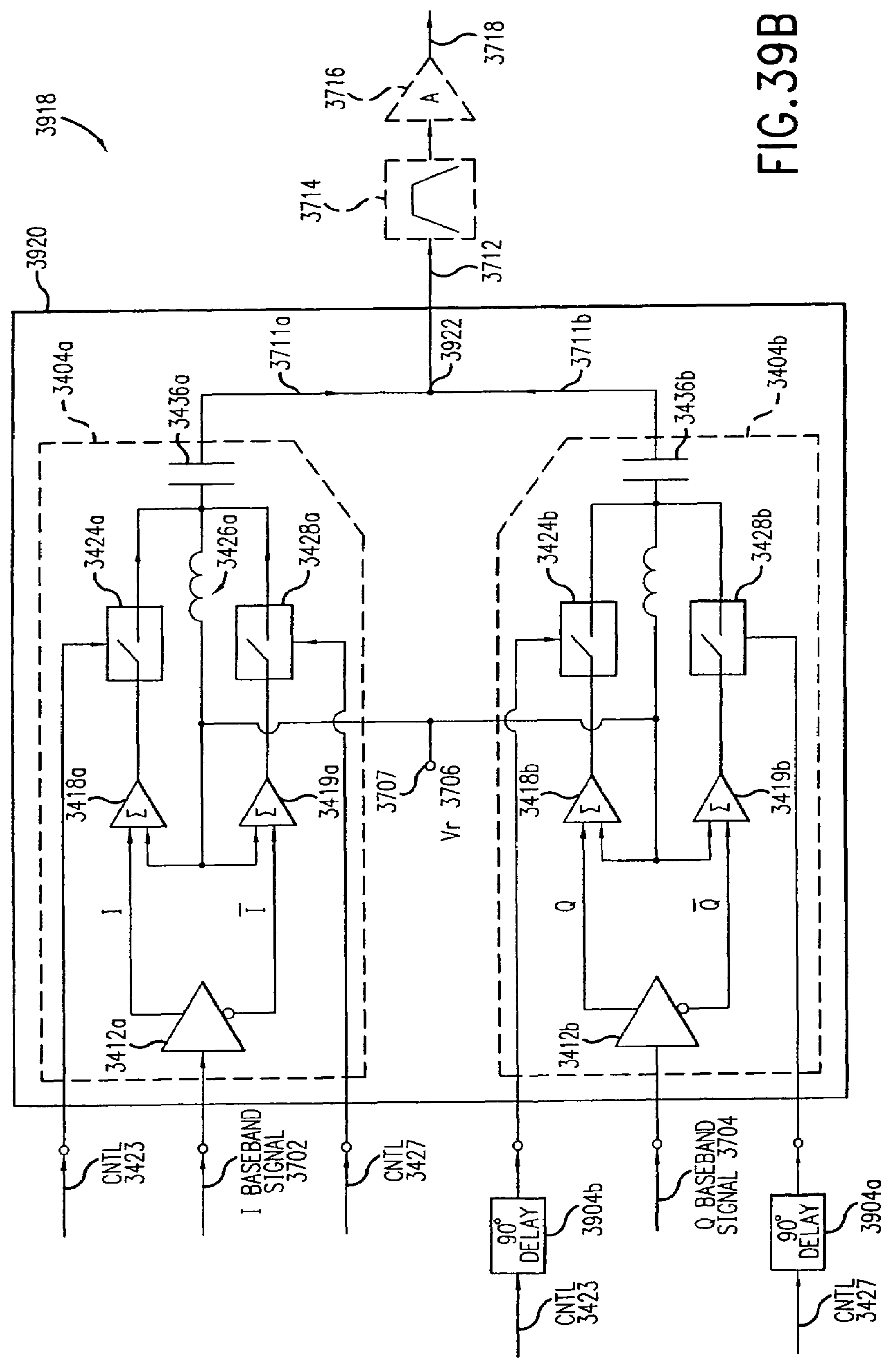
FIG. 39B illustrates an IQ balanced transmitter 3918 according to embodiments of the invention.

FIG. 39B illustrates a transmitter 3918 that is similar to transmitter 3908 in FIG. 39A. The difference being that the transmitter 3918 has a modulator 3920 that utilizes a summing node 3922 to sum the signals 3711*a* and 3711*b* instead of the in-phase signal combiner 3906 that is used in modulator 3902 of transmitter 3908.

FIG. 63A-63D illustrate various circuit implementations of the transmitter 3720. These circuit implementations are meant for example purposes only, and are not meant to be limiting.

Figure 63A:
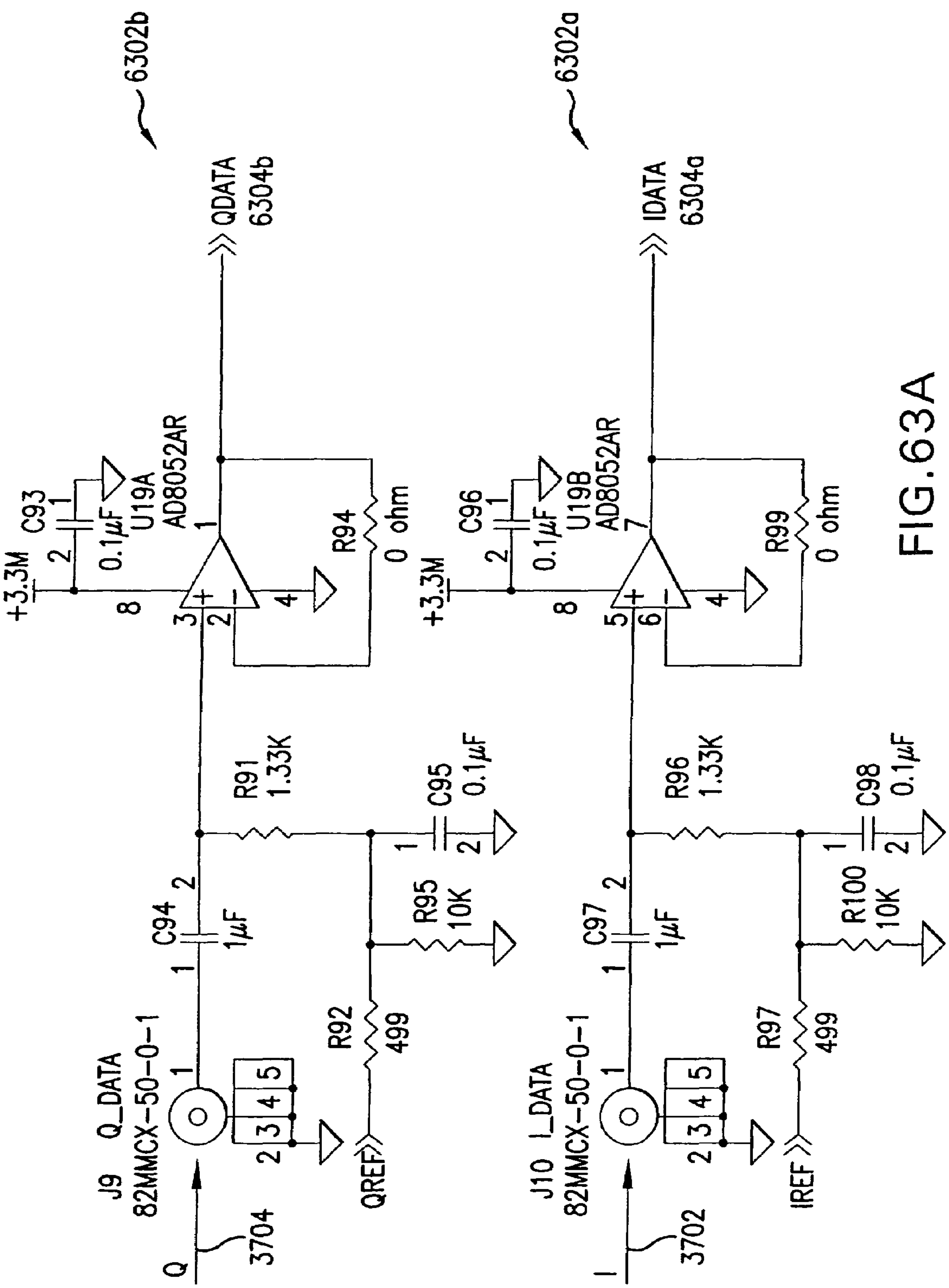

FIG. 63A illustrates the I and Q input circuits 6302*a* and 6302*b* that receive the I and Q input signals.

Figure 63B:
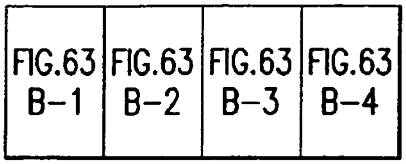
Figures 1, 63B:
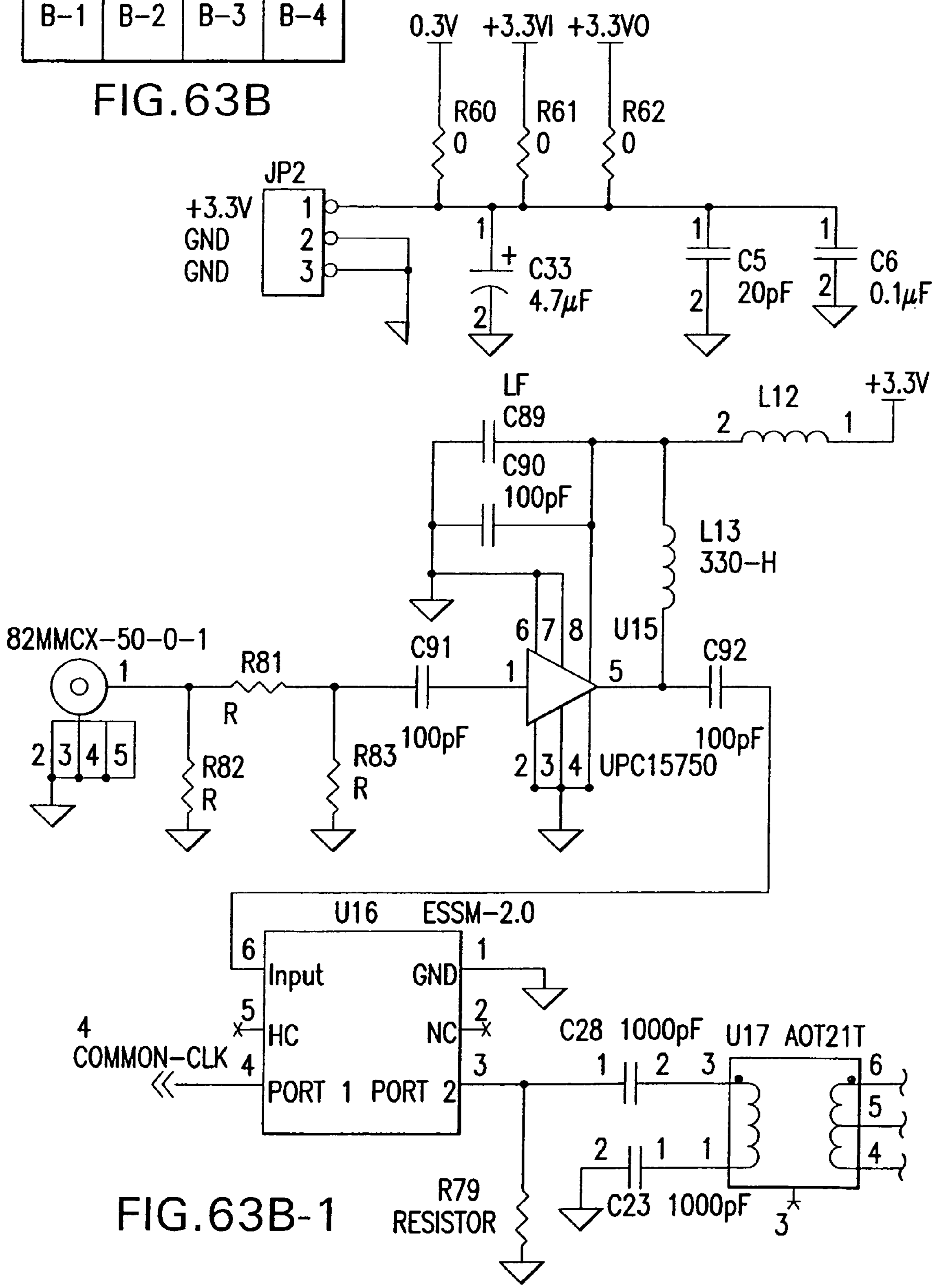
Figures 2, 63B:
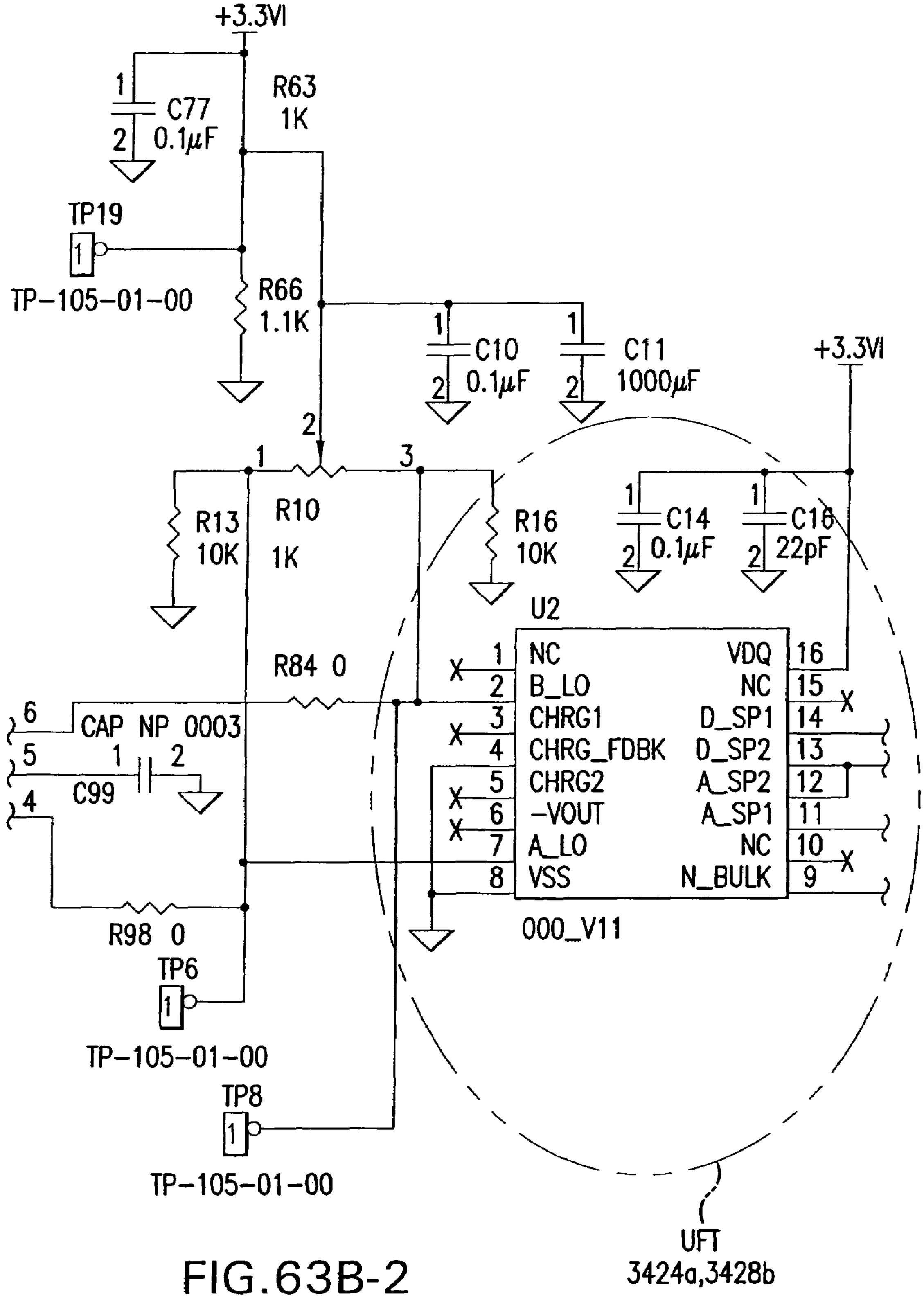
Figures 3, 63B:
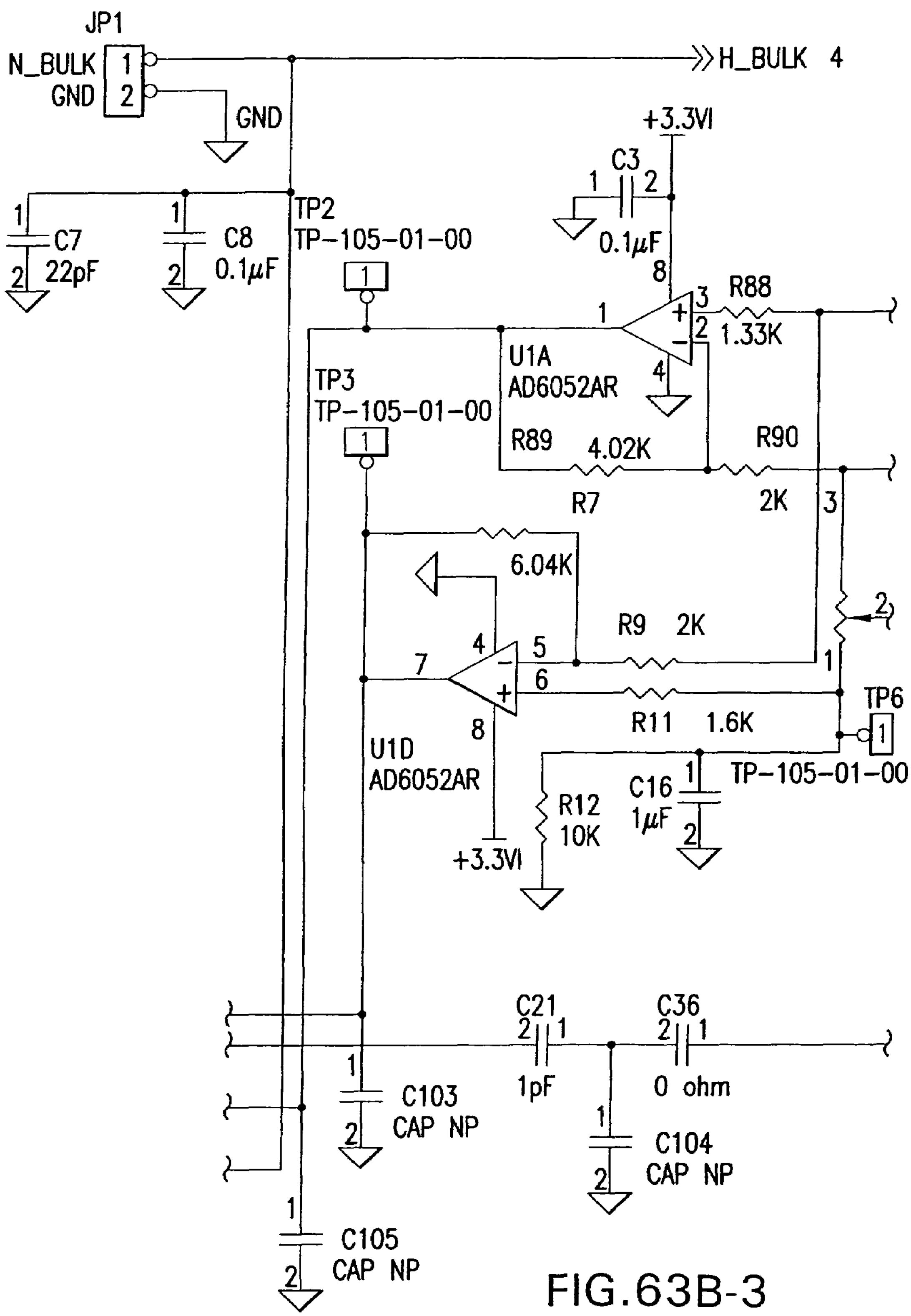
Figures 4, 63B:
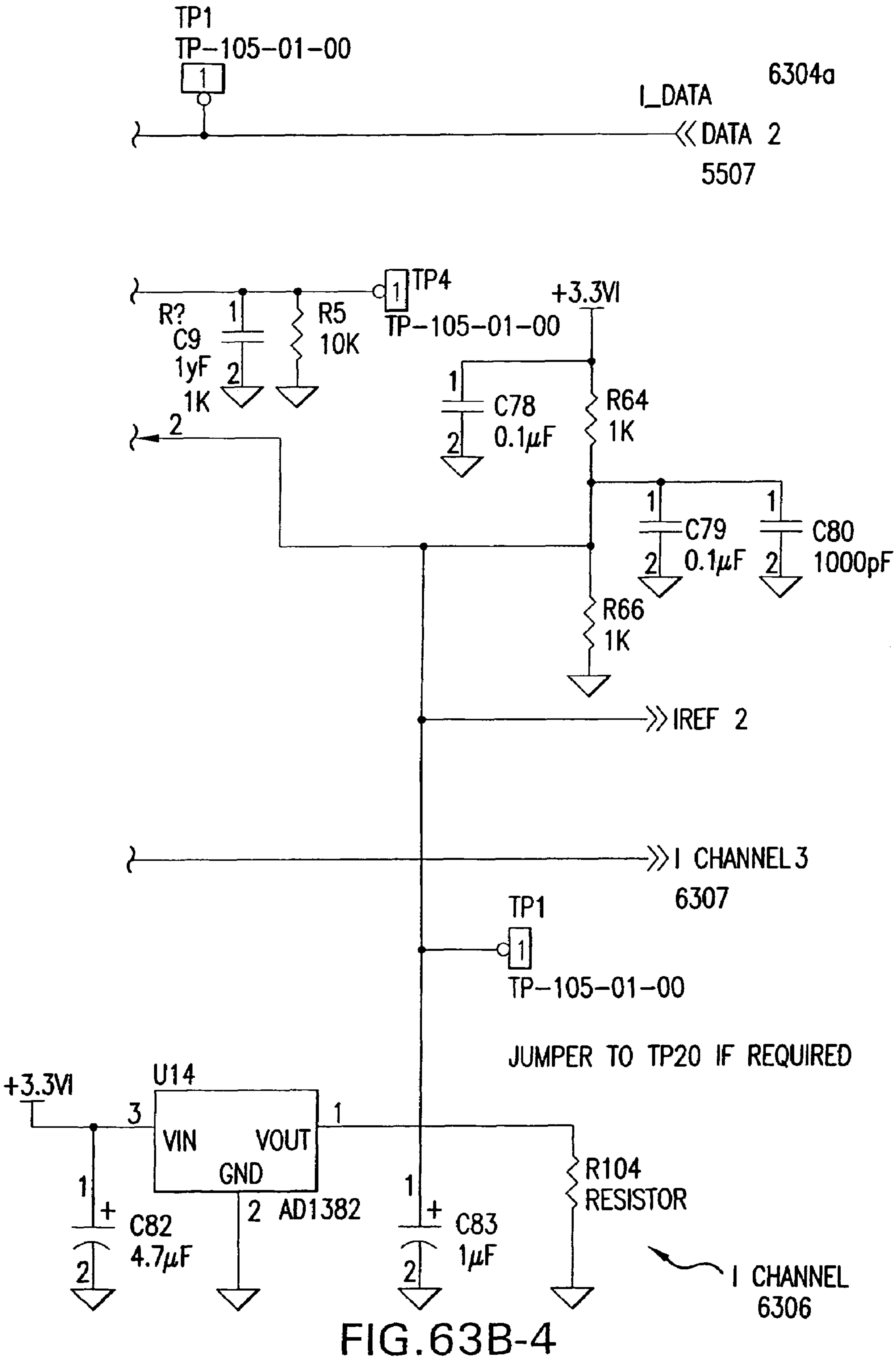

FIG. 63B (which consists of FIGS. 63B-1. 63B-2, 63B-3, and 63B-4) illustrates the I channel 6306 that processes the I data 6304*a* from the I input circuit 6302*a*.

Figures 1, 63C:
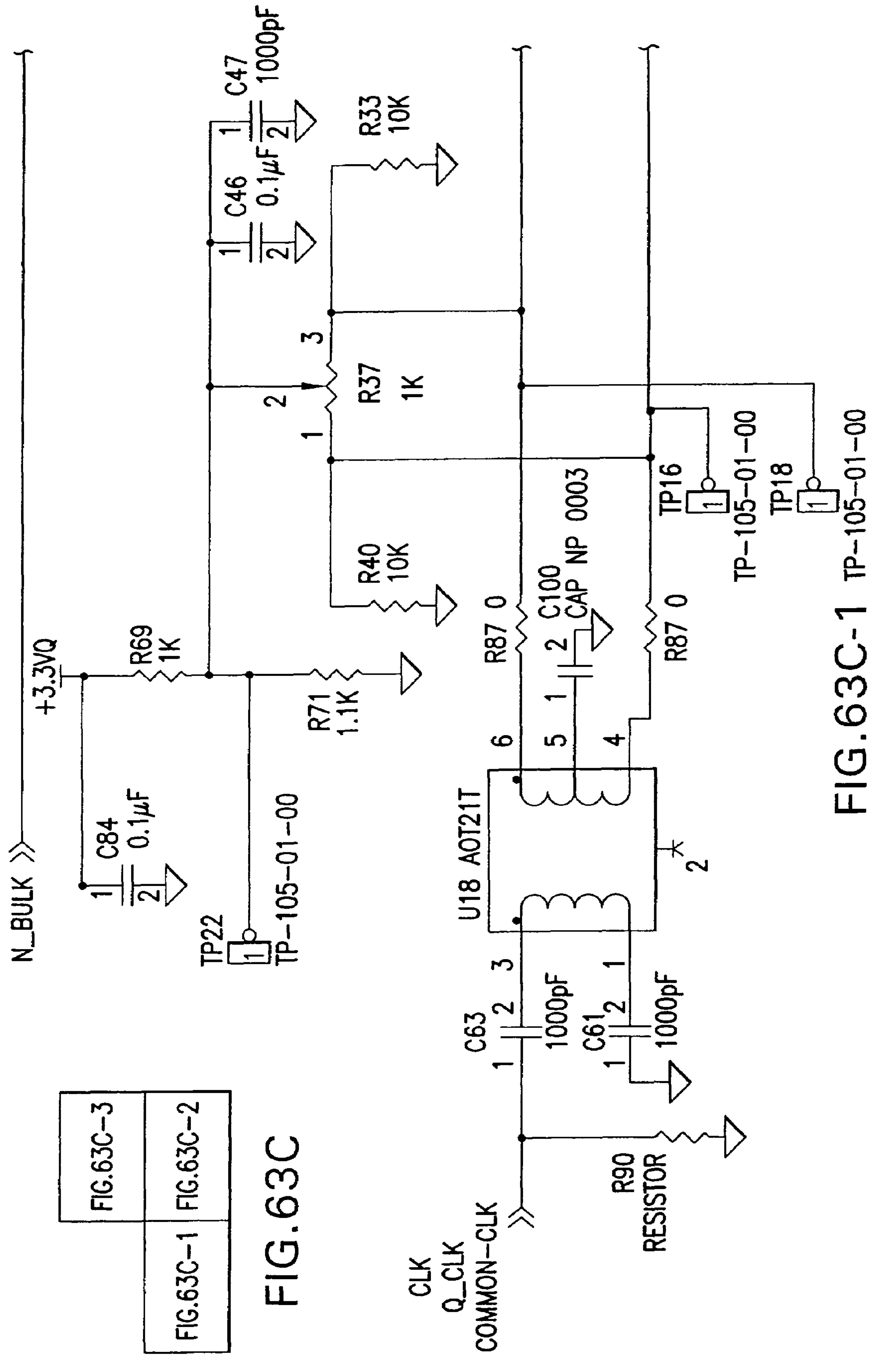
Figures 2, 63C:
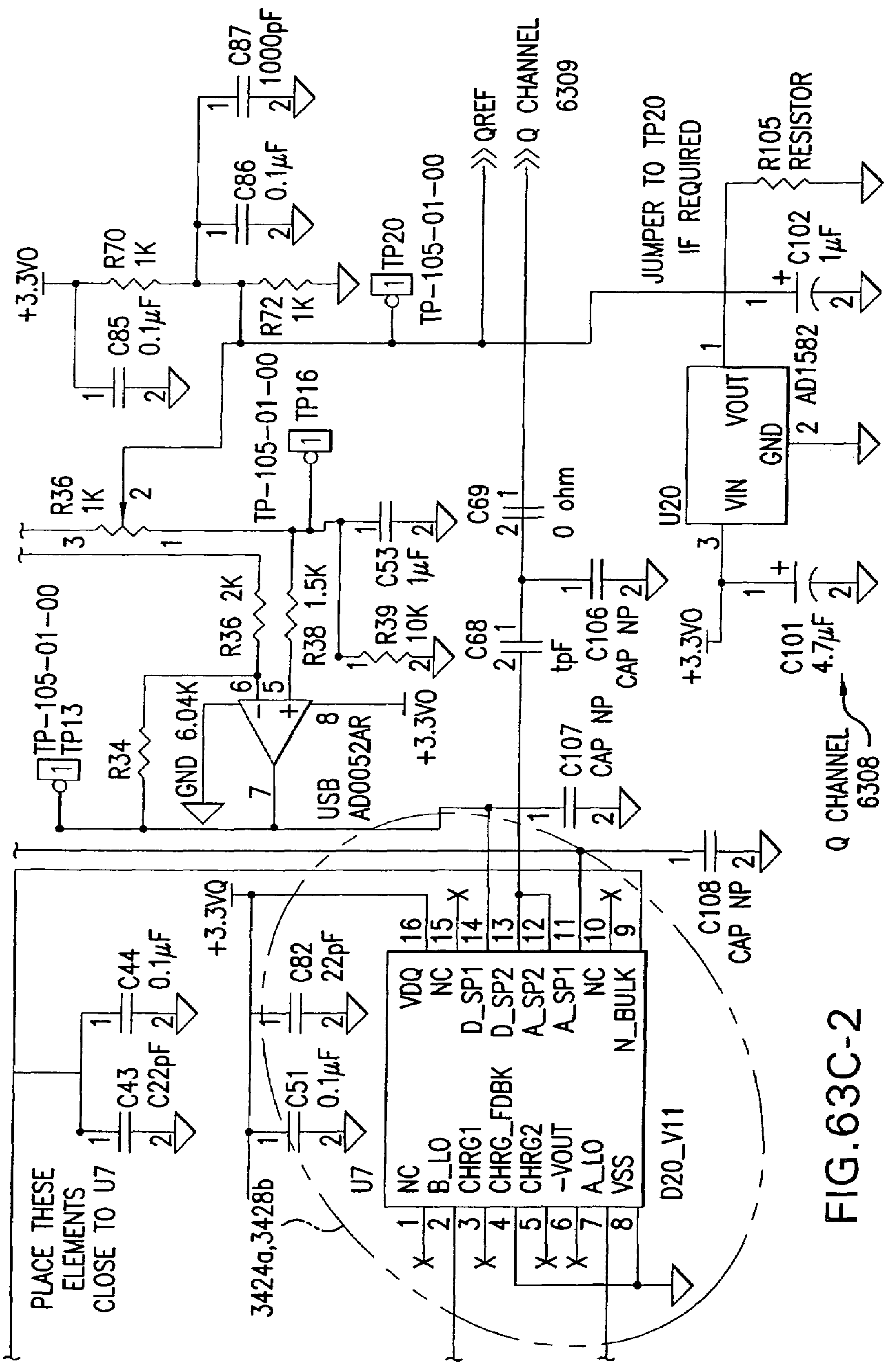
Figures 3, 63C:
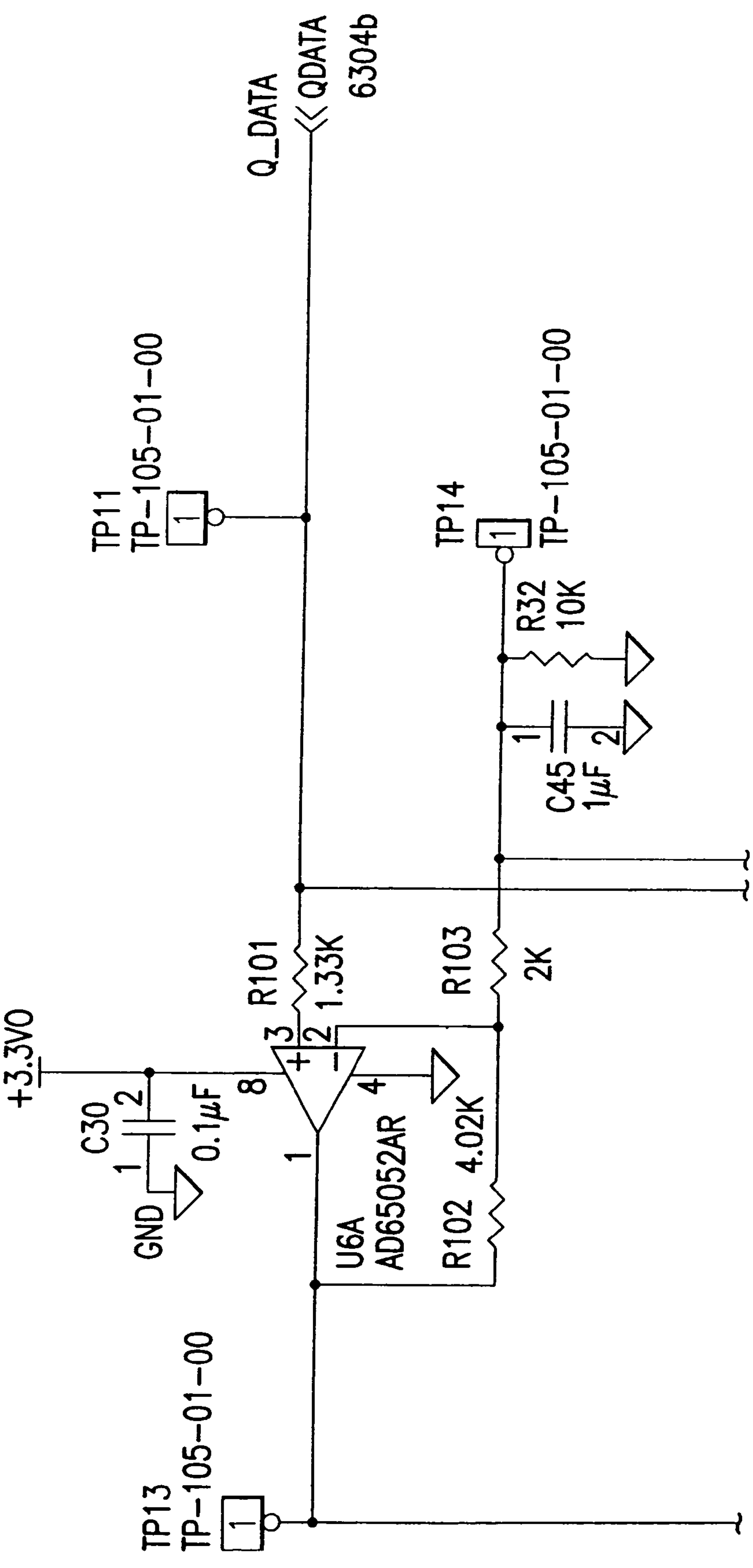

FIG. 63C (which consists of FIGS. 63C-1. 63C-2, and 63C-3) illustrates the Q channel 6308 that processes the Q data 6304*b* from the Q input circuit 6306*b*.

Figure 63D:
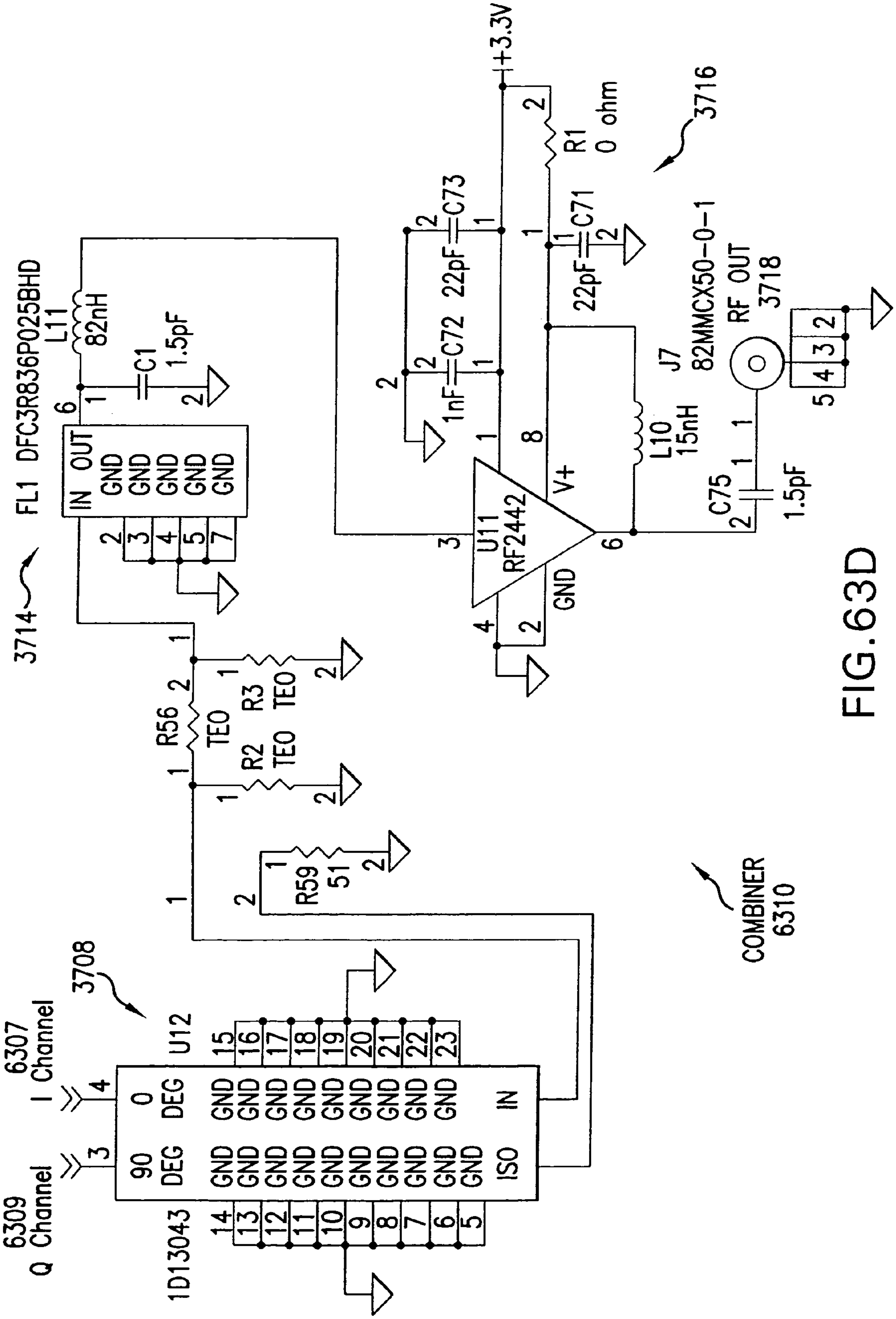

FIG. 63D illustrates the output combiner circuit 6310 that combines the I channel data 6307 and the Q channel data 6309 to generate the RF output 3718.

7.2.2 IQ Transmitter Using Shunt-Type Balanced Modulator

FIG. 65 illustrates an IQ transmitter 6500 that is another IQ transmitter embodiment according to the present invention. The transmitter 6500 includes an IQ balanced modulator 6501, an optional filter 6512, and an optional amplifier 6514. During operation, the modulator 6501 up-converts an I baseband signal 6502 and a Q baseband signal 6504 to generate a combined harmonically rich signal 6511. The harmonically rich signal 6511 includes multiple harmonics images, where each image contains the baseband information in the I signal 6502 and the Q signal 6504. The optional bandpass filter 6512 may be included to select a harmonic of interest (or subset of harmonics) from the harmonically rich signal 6511 for transmission. The optional amplifier 6514 may be included to amplify the selected harmonic prior to transmission, to generate the IQ output signal 6516.

The IQ modulator 6501 includes two balanced modulators 6401 from FIG. 64, and a 90 degree signal combiner 6510 as shown. In operation, the balanced modulator 6401*a* differentially shunts the I baseband signal 6502 to ground according the control signals 3423 and 3427, to generate a harmonically rich signal 6506. The harmonically rich signal 6501 contains multiple harmonic images of the I baseband information. Likewise, the balanced modulator 6401*b* differentially shunts the Q baseband signal 6504 according to the control signals 3423 and 3427, to generate harmonically rich signal 6508. The harmonically rich signal 6508 contains multiple harmonic images of the Q baseband information. The operation of the balanced modulator 6401 and the generation of harmonically rich signals was fully described above and illustrated in FIGS. 64A-C, to which the reader is referred for further details.

Still referring to FIG. 65, the 90 degree signal combiner 6510 combines the harmonically rich signals 6506 and 6508 to generate IQ harmonically rich signal 6511. This is further illustrated in FIGS. 66A-C. FIG. 66A depicts an exemplary frequency spectrum for the harmonically rich signal 6506 having harmonic images 6602*a-n*. The harmonic images 6602 repeat at harmonics of the sampling frequency $1/T_S$, where each image 6602 contains the necessary amplitude and frequency information to reconstruct the I baseband signal 6502. Likewise, FIG. 66B depicts an exemplary frequency spectrum for the harmonically rich signal 6508 having harmonic images 6604*a-n*. The harmonic images 6604*a-n* also repeat at harmonics of the sampling frequency $1/T_S$, where each image 6604 contains the necessary amplitude and frequency information to reconstruct the Q baseband signal 6504. FIG. 66C illustrates an exemplary frequency spectrum for the IQ harmonically rich signal 6511 having images 6606*a-n*. Each image 6606 carries the I baseband information and the Q baseband information from the corresponding images 6602 and 6604, respectively, without substantially increasing the frequency bandwidth occupied by each image 6606. This can occur because the signal combiner 6510 phase shifts the Q signal 6508 by 90 degrees relative to the I signal 6506. The optional filter 6512 may be included to select a harmonic of interest, as represented by the passband 6608 selecting the image 6606*c* in FIG. 66C. The optional amplifier 6514 can be included to amplify the selected harmonic image 6606 prior to transmission.

FIG. 67 illustrates a transmitter 6700 that is another embodiment for an I Q transmitter having a balanced configuration. Transmitter 6700 is similar to the transmitter 6500 except that the 90 degree phase shift between the I and Q channels is achieved by phase shifting the control signals instead of using a 90 degree signal combiner to combine the harmonically rich signals. More specifically, delays 6704*a* and 6704*b* delay the control signals 3423 and 3427 for the Q channel modulator 6401*b* by 90 degrees relative the control signals for the I channel modulator 6401*a*. As a result, the Q modulator 6401*b* samples the Q baseband signal 6504 with a 90 degree delay relative to the sampling of the I baseband signal 6502 by the I channel modulator 6401*a*. Therefore, the Q harmonically rich signal 6508 is phase shifted by 90 degrees relative to the I harmonically rich signal 6506. Since the phase shift is achieved using the control signals, an in-phase signal combiner 6706 combines the harmonically rich signals 6506 and 6508, to generate the harmonically rich signal 6511.

FIG. 68 illustrates a transmitter 6800 that is similar to transmitter 6700 in FIG. 67. The difference being that the transmitter 6800 has a balanced modulator 6802 that utilizes a summing node 6804 to sum the I harmonically rich signal 6506 and the Q harmonically rich signal 6508 instead of the in-phase signal combiner 6706 that is used in the modulator 6702 of transmitter 6700. The 90 degree phase shift between the I and Q channels in implemented by delaying the Q clock signals using 90 degree delays 6704, as shown.

Figure 40:
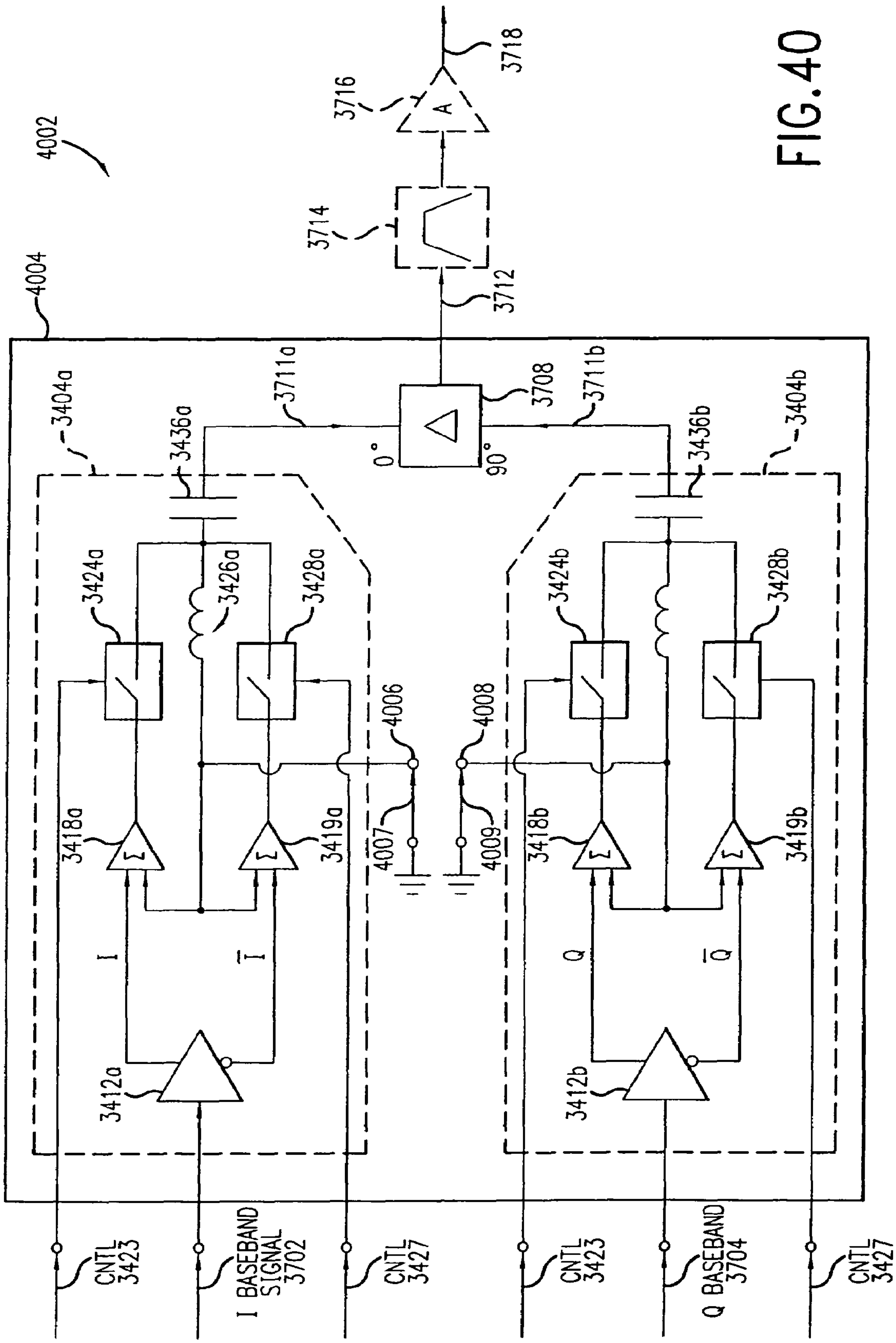
FIG. 40 illustrates an I Q balanced transmitter 4002 configured for carrier insertion according to embodiments of the invention.

7.2.3 IQ Transmitters Configured for Carrier Insertion:

The transmitters 3720 and 3908 have a balanced configuration that substantially eliminates any DC offset and results in minimal carrier insertion in the IQ output signal 3718. Minimal carrier insertion is generally desired for most applications because the carrier signal carries no information and reduces the overall transmitter efficiency. However, some applications require the received signal to have sufficient carrier energy for the receiver to extract the carrier for coherent demodulation. In support thereof, FIG. 40 illustrates a transmitter 4002 that provides any necessary carrier insertion by implementing a DC offset between the two sets of sampling UFT modules.

Transmitter 4002 is similar to the transmitter 3720 with the exception that a modulator 4004 in transmitter 4002 is configured to accept two DC reference voltages so that the I channel modulator 3404*a* can be biased separately from the Q channel modulator 3404*b*. More specifically, modulator 4004 includes a terminal 4006 to accept a DC voltage reference 4007, and a terminal 4008 to accept a DC voltage reference 4009. Voltage 4007 biases the UFT modules 3424*a* and 3428*a* in the I channel modulator 3404*a*. Likewise, voltage 4009 biases the UFT modules 3424*b* and 3428*b* in the Q channel modulator 3404*b*. When voltage 4007 is different from voltage 4009, then a DC offset will appear between the I channel modulator 3404*a* and the Q channel modulator 3404*b*, which results in carrier insertion in the IQ harmonically rich signal 3712. The relative amplitude of the carrier frequency energy increases in proportion to the amount of DC offset.

Figure 41:
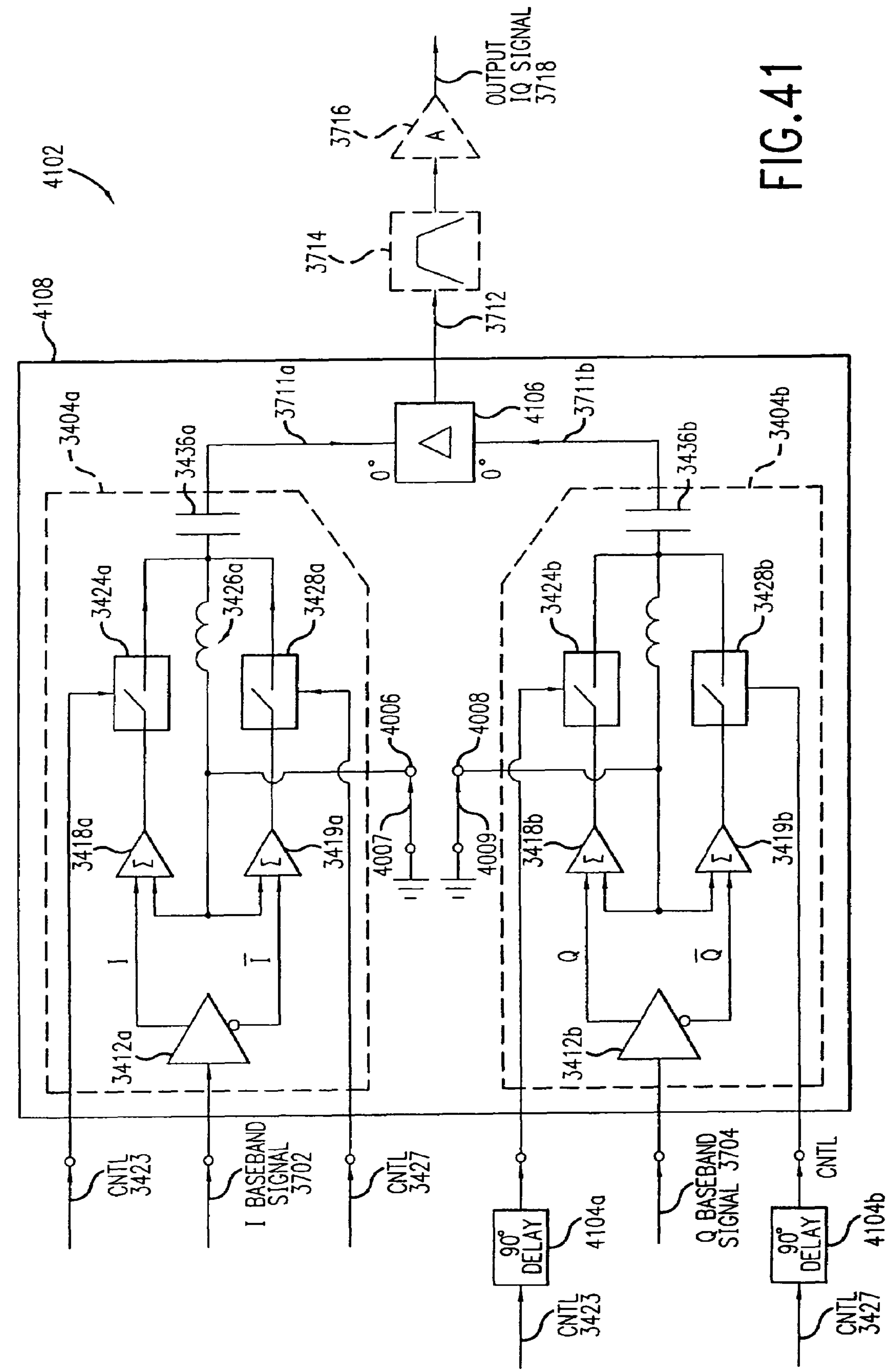
FIG. 41 illustrates an IQ balanced transmitter 4102 configured for carrier insertion according to embodiments of the invention.

FIG. 41 illustrates a transmitter 4102 that is a second embodiment of an IQ transmitter having two DC terminals to cause DC offset, and therefore carrier insertion. Transmitter 4102 is similar to transmitter 4002 except that the 90 degree phase shift between the I and Q channels is achieved by phase shifting the control signals, similar to that done in transmitter 3908. More specifically, delays 4104*a* and 4104*b* phase shift the control signals 3423 and 3427 for the Q channel modulator 3404*b* relative to those of the I channel modulator 3404*a*. As a result, the Q modulator 3404*b* samples the Q baseband signal 3704 with 90 degree delay relative to the sampling of the I baseband signal 3702 by the I channel modulator 3404*a*. Therefore, the Q harmonically rich signal 3711*b* is phase shifted by 90 degrees relative to the I harmonically rich signal, which is then combined by the in-phase combiner 4106.

7.3 Universal Transmitter and CDMA

Figure 42A:
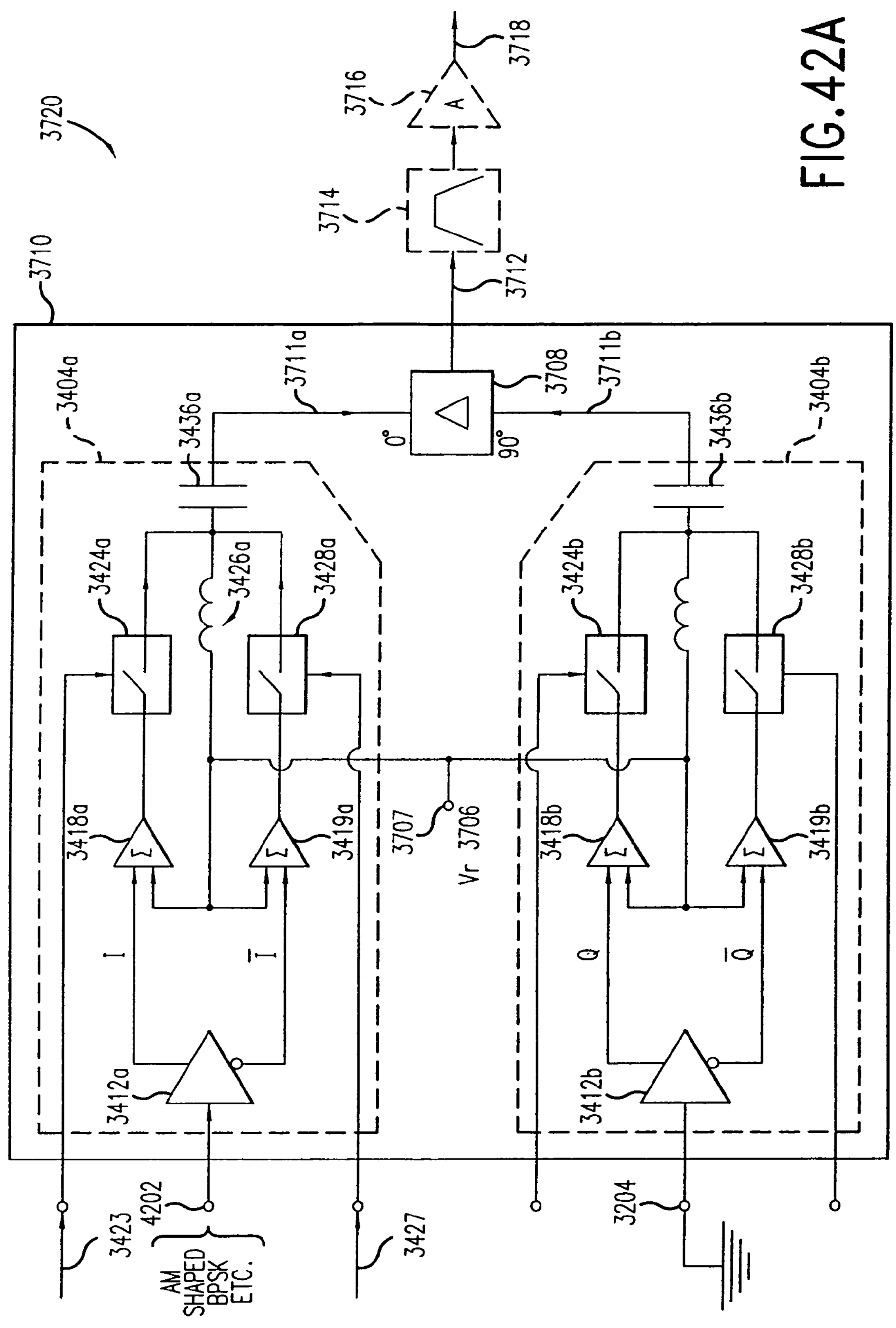
FIGS. 42A-B illustrate various input configuration for the balanced transmitter 3710 according to embodiments of the present invention.
Figure 42B:
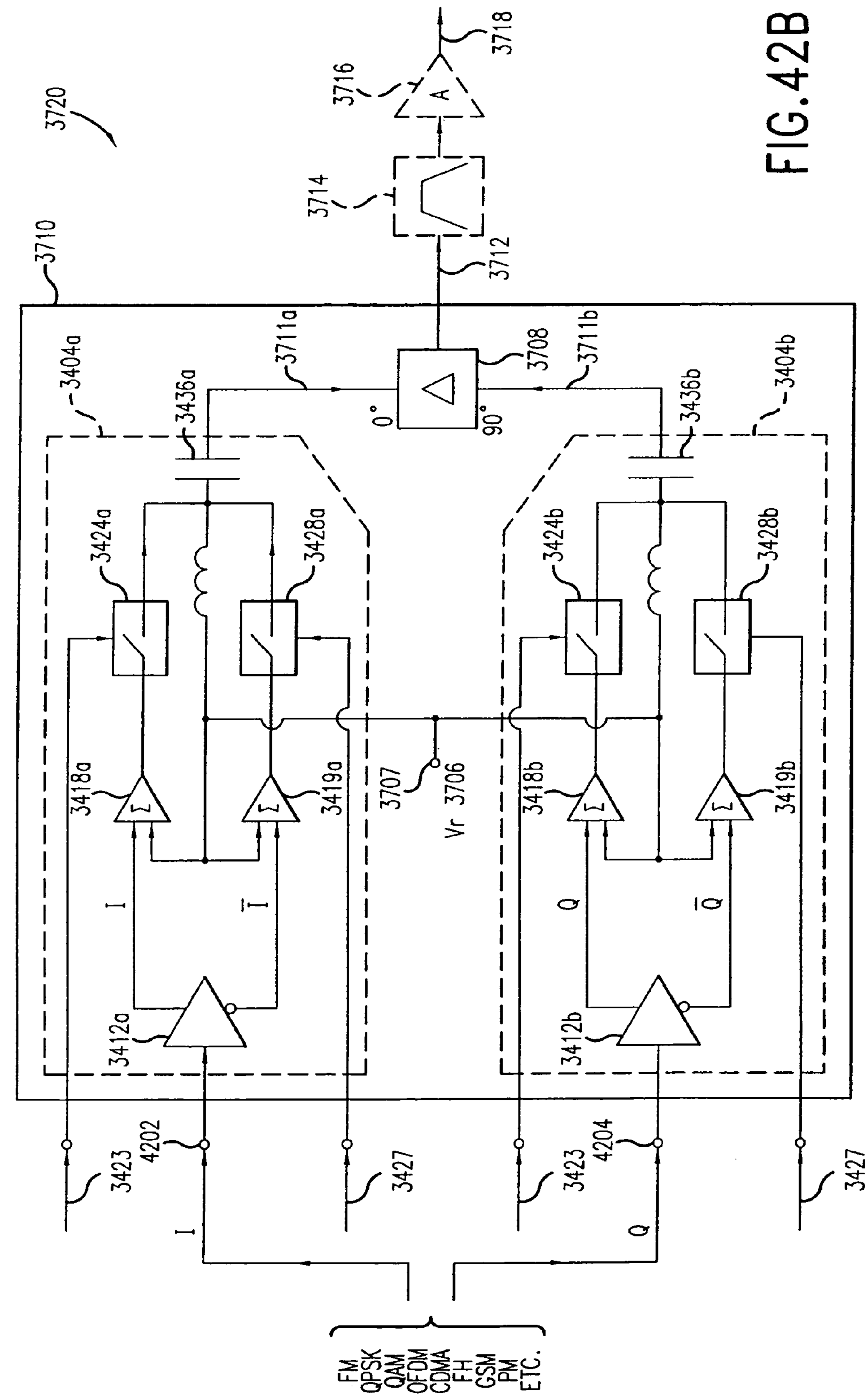

The universal transmitter 3720 (in FIG. 37) and the universal transmitter 6500 can be used to up-convert every known useful analog and digital baseband waveform including but not limited to: AM, FM, PM, BPSK, QPSK, MSK, QAM, ODFM, multi-tone, and spread spectrum signals. For further illustration, FIG. 42A and FIG. 42B depict the transmitter 3720 configured to up-convert the mentioned modulation waveforms. FIG. 42A illustrates transmitter 3720 configured to up-convert non-complex waveform including AM and shaped BPSK. In FIG. 42A, these non-complex (and non-IQ) waveforms are received on the I input 4202, and the Q input 4204 is grounded since only a single channel is needed. FIG. 42B illustrates a transmitter 3720 that configured to receive both I and Q inputs so that complex waveforms can be up-converted including, but not limited to: QPSK, QAM, OFDM, GSM, and spread spectrum waveforms including (CDMA and frequency hopping).

CDMA is an input waveform that is of particular interest for communications applications. CDMA is the fastest growing digital cellular communications standard in many regions, and now is widely accepted as the foundation for the competing third generation (3G) wireless standard. CDMA is considered to be the among the most demanding of the current digital cellular standards in terms of RF performance requirements.

7.3.1 IS-95 CDMA Specifications

Figure 43A:
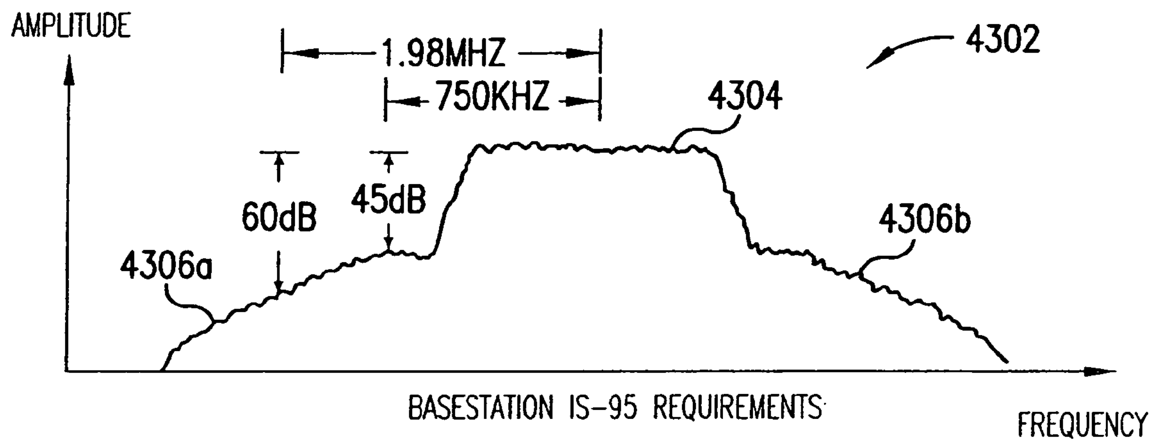
FIGS. 43A-B illustrate sidelobe for the CDMA IS-95 specification.
Figure 43B:
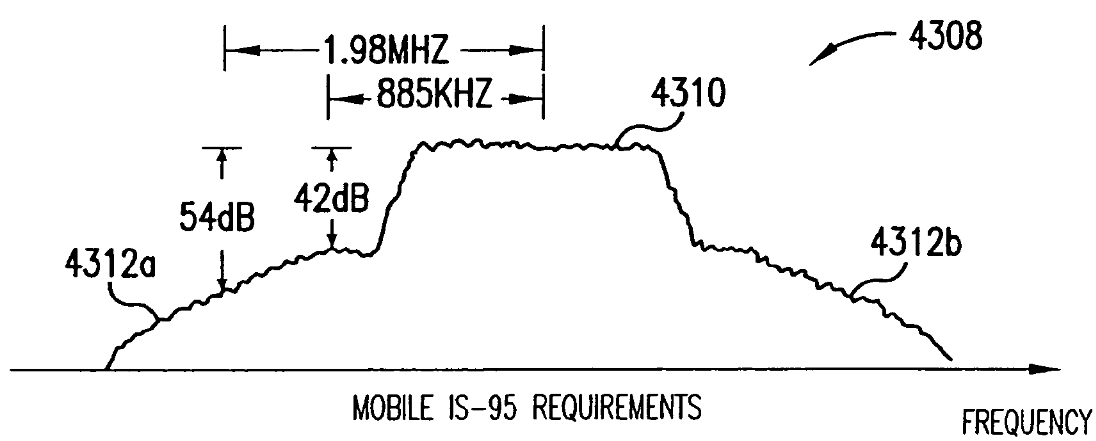

FIG. 43A and FIG. 43B illustrate the CDMA specifications for base station and mobile transmitters as required by the IS-95 standard. FIG. 43A illustrates a base station CDMA signal 4302*a* having a main lobe 4304 and sidelobes 4306*a* and 4306*b*. For base station transmissions, IS-95 requires that the sidelobes 4306*a,b* are at least 45 dB below the mainlobe 4304 (or 45 dbc) at an offset frequency of 750 kHz, and 60 dBc at an offset frequency of 1.98 MHZ. FIG. 43B illustrates similar requirements for a mobile CDMA signal 4308 having a main lobe 4310 and sidelobes 4312*a* and 4312*b*. For mobile transmissions, CDMA requires that the sidelobes 4312*a,b* are at least 42 dBc at a frequency offset of 885 kHz, and 54 dBc at a frequency offset 1.98 MHZ.

Rho is another well known performance parameter for CDMA. Rho is a figure-of-merit that measures the amplitude and phase distortion of a CDMA signal that has been processed in some manner (e.g. amplified, up-converted, filtered, etc.) The maximum theoretical value for Rho is 1.0, which indicates no distortion during the processing of the CDMA signal. The IS-95 requirement for the baseband-to-RF interface is Rho=0.9912. As will be shown by the test results below, the transmitter 3720 (in FIG. 37) can up-convert a CDMA baseband signal and achieve Rho values of approximately Rho=0.9967. Furthermore, the modulator 3710 in the transmitter 3720 achieves these results in standard CMOS, without doing multiple up-conversions and IF filtering that is associated with conventional super-heterodyne configurations.

7.3.2 Conventional CDMA Transmitter

Figure 44:
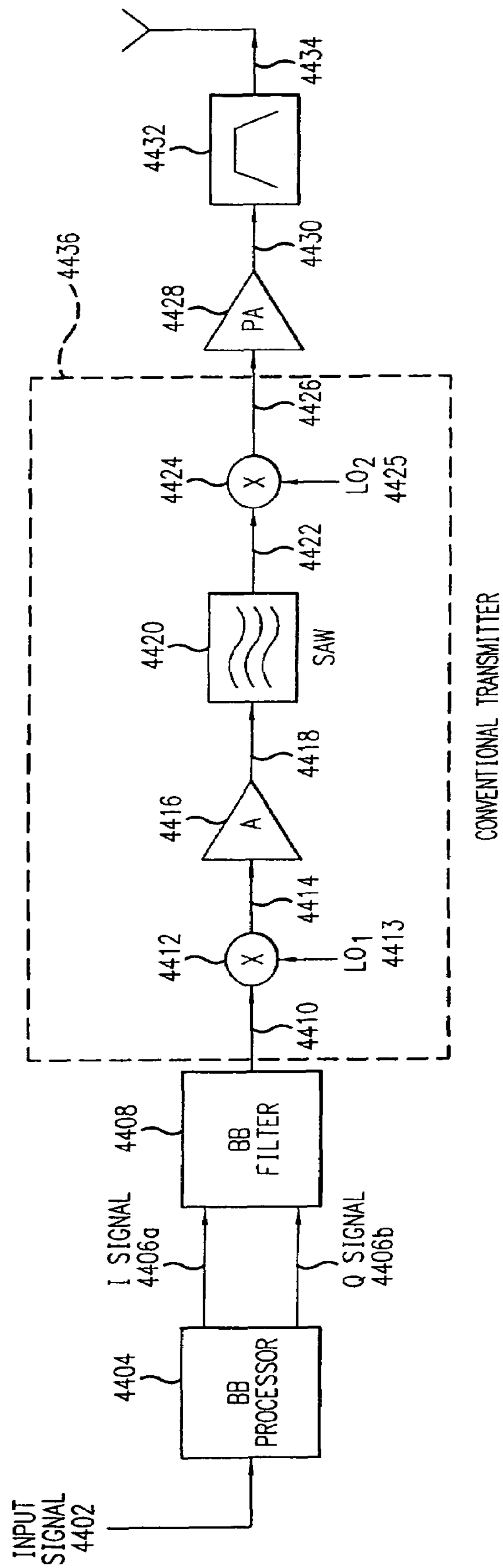
FIG. 44 illustrates a conventional CDMA transmitter.

Before describing the CDMA implementation of transmitter 3720, it is useful to describe a conventional super-heterodyne approach that is used to meet the IS-95 specifications. FIG. 44 illustrates a conventional CDMA transmitter 4400 that up-converts an input signal 4402 to an output CDMA signal 4434. The conventional CDMA transmitter 4400 includes: a baseband processor 4404, a baseband filter 4408, a first mixer 4412, an amplifier 4416, a SAW filter 4420, a second mixer 4424, a power amplifier 4428, and a band-select filter 4432. The conventional CDMA transmitter operates as follows.

The baseband processor 4404 spreads the input signal 4402 with I and Q spreading codes to generate I signal 4406*a* and Q signal 4406*b*, which are consistent with CDMA IS-95 standards. The baseband filter 4408 filters the signals 4406 with the aim of reducing the sidelobes so as to meet the sidelobe specification that was discussed in FIG. 43. Mixer 4412 up-converts the signal 4410 using a first LO signal 4413 to generate an IF signal 4414. IF amplifier 4416 amplifies the IF signal 4414 to generate IF signal 4418. SAW filter 4420 has a bandpass response that filters the IF signal 4418 to suppress any sidelobes caused by the non-linear operations of the mixer 4414. As is understood by those skilled in the arts, SAW filters provide significant signal suppression outside the passband, but are relatively expensive and large compared to other transmitter components. Furthermore, SAW filters are typically built on specialized materials that cannot be integrated onto a standard CMOS chip. Mixer 4424 up-converts the signal 4422 using a second LO signal 4425 to generate RF signal 4426. Power amplifier 4428 amplifies RF signal 4426 to generate signal 4430. Band-select filter 4432 bandpass filters RF signal 4430 to suppress any unwanted harmonics in output signal 4434.

It is noted that transmitter 4402 up-converts the input signal 4402 using an IF chain 4436 that includes the first mixer 4412, the amplifier 4416, the SAW filter 4420, and the second mixer 4424. The IF chain 4436 up-converts the input signal to an IF frequency and does IF amplification and SAW filtering in order to meet the IS-95 sidelobe and figure-of-merit specifications. This is done because conventional wisdom teaches that a CDMA baseband signal cannot be up-converted directly from baseband to RF, and still meet that the IS-95 linearity requirements.

7.3.3 CDMA Transmitter Using the Present Invention

Figure 45A:
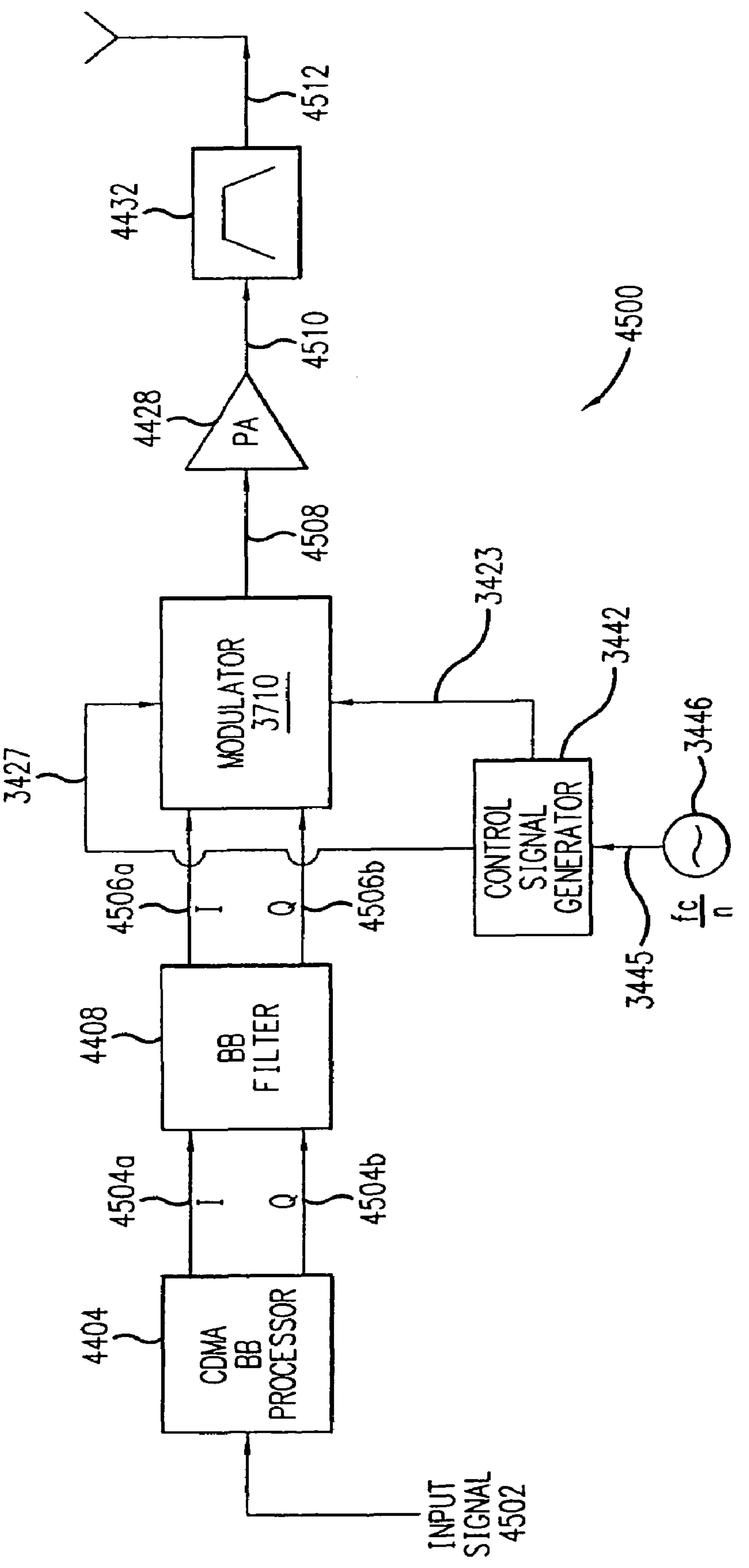
FIG. 45A illustrates a CDMA transmitter according to embodiments of the present invention.

For comparison, FIG. 45A illustrates a CDMA transmitter 4500 according to embodiments of the present invention. The CDMA transmitter 4500 includes: the baseband processor 4404; the baseband filter 4408; the IQ modulator 3710 (from FIG. 37), the control signal generator 3442, the sub-harmonic oscillator 3446, the power amplifier 4428, and the filter 4432. The baseband processor 4404, baseband filter 4408, amplifier 4428, and band-select filter 4432 are the same as that used in the conventional transmitter 4402 in FIG. 44. The difference is that the I Q modulator 3710 in transmitter 4502 completely replaces the IF chain 4436 in the conventional transmitter 4402. The operation of the CDMA transmitter 4502 is described in detail as follows.

The CDMA baseband processor 4404 receives an input signal 4502 and spreads the input signal using I and Q spreading codes, to generate an I signal 4504*a* and a Q signal 4504*b*. As will be understood, the I spreading code and Q spreading code can be different to improve isolation between the I and Q channels.

The baseband filter 4408 bandpass filters the I signal 4504*a* and the Q signal 4504*b* to generate filtered I signal 4506*a* and filtered Q signal 4506*b*. As mentioned above, baseband filtering is done to improve sidelobe suppression in the CDMA output signal.

Figure 45B:
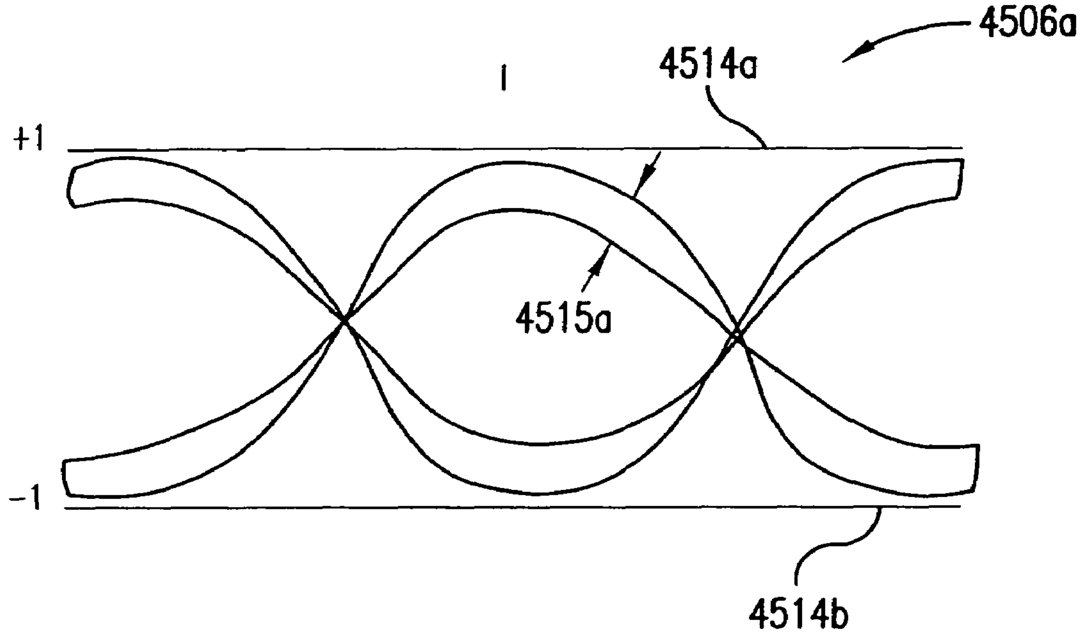
FIGS. 45B-E illustrate various signal diagrams associated with the CDMA transmitter 4500 according to embodiments of the present invention.
Figure 45C:
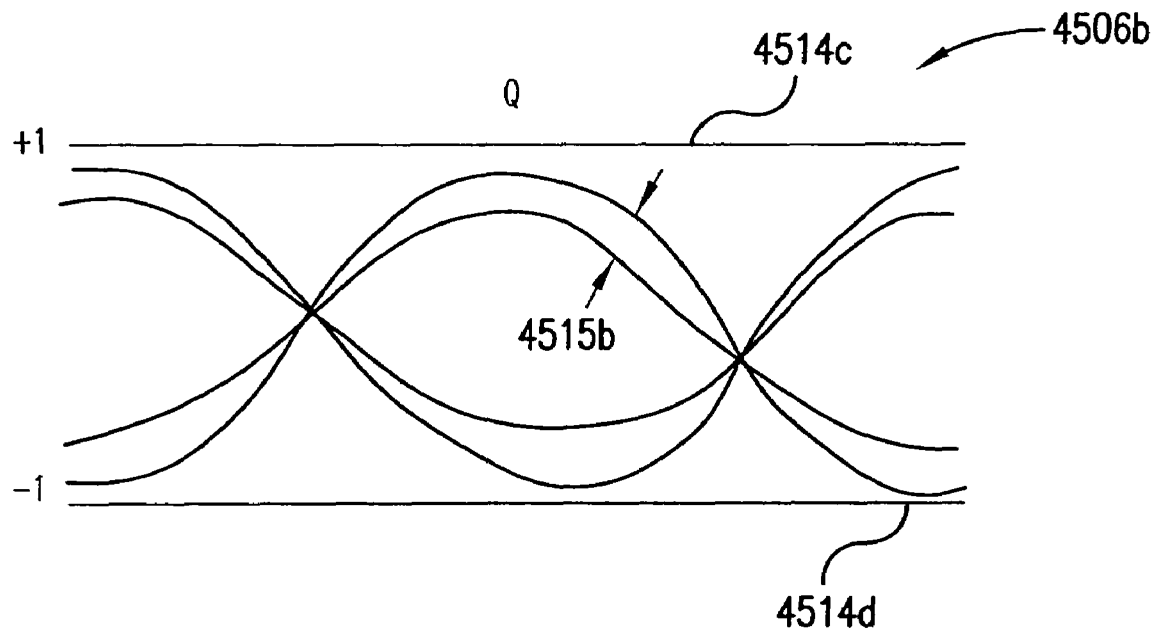
Figure 45D:
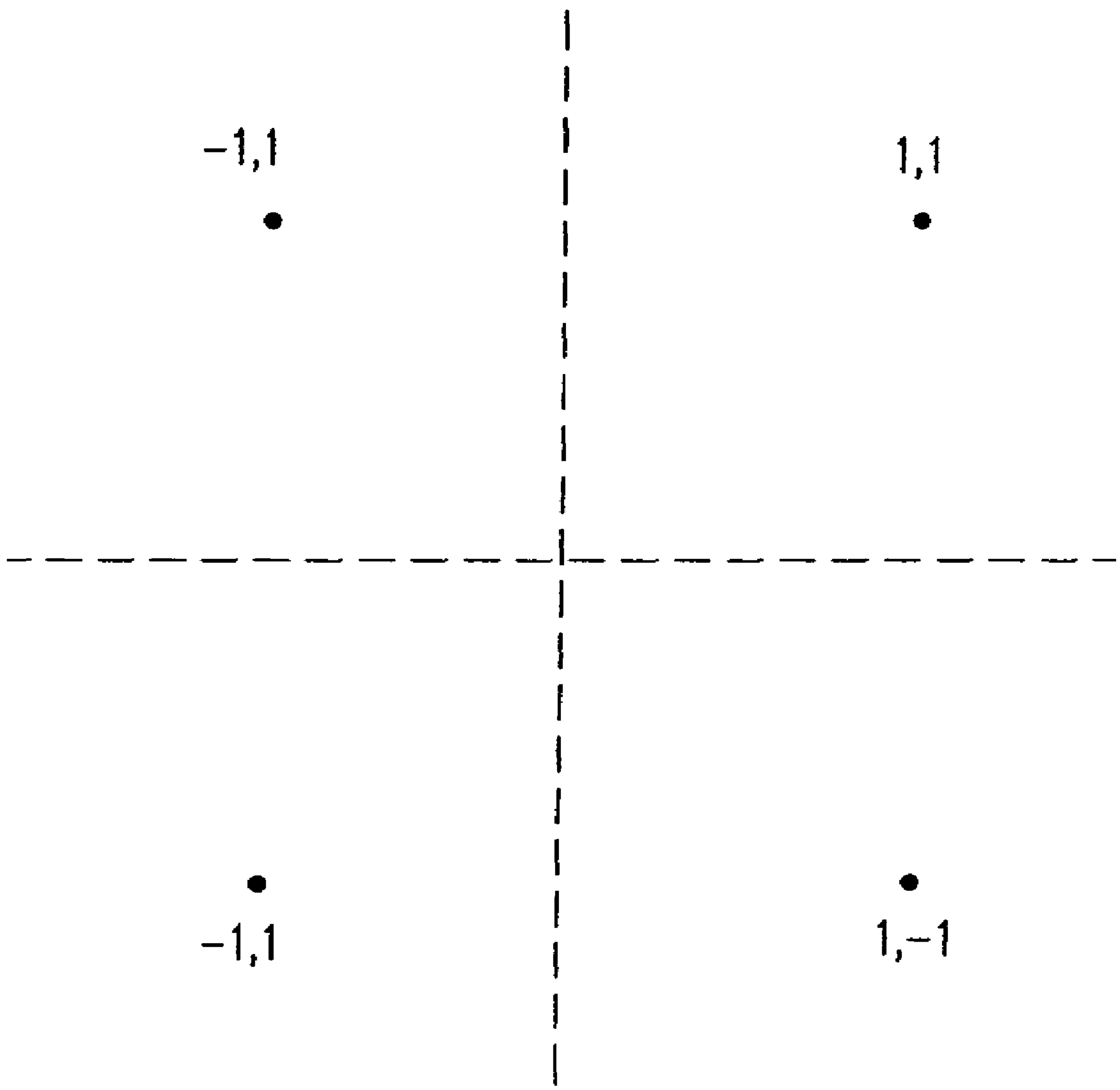

FIGS. 45B-45D illustrate the effect of the baseband filter 4408 on the I an Q inputs signals. FIG. 45B depicts multiple signal traces (over time) for the filtered I signal 4406*a*, and FIG. 45C depicts multiple signal traces for the filtered Q signal 4406*b*. As shown, the signals 4506*a,b* can be described as having an "eyelid" shape having a thickness 4515. The thickness 4515 reflects the steepness of passband roll off of the baseband filter 4408. In other words, a relatively thick eyelid in the time domain reflects a steep passband roll off in the frequency domain, and results in lower sidelobes for the output CDMA signal. However, there is a tradeoff, because as the eyelids become thicker, then there is a higher probability that channel noise will cause a logic error during decoding at the receiver. The voltage rails 4514 represent the +1/−1 logic states for the I and Q signals 4506, and correspond to the logic states in complex signal space as shown in FIG. 45D.

Figure 45E:
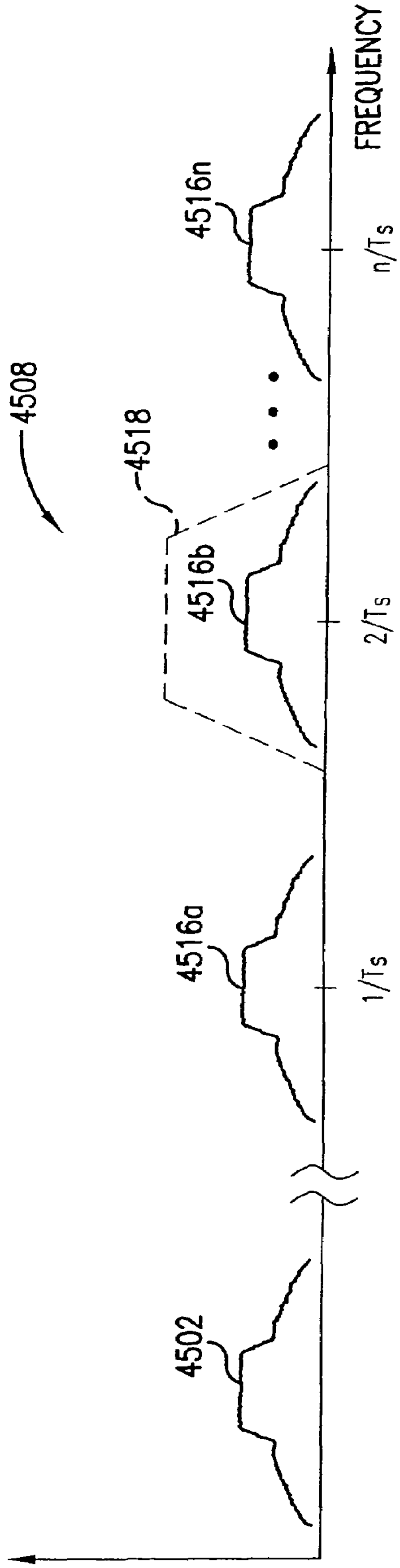

The IQ modulator 3710 samples I and Q input signals in a differential and balanced fashion according to sub-harmonic clock signals 3423 and 3427, to generate a harmonically rich signal 4508. FIG. 45E illustrates the harmonically rich signal 4508 that includes multiple harmonic images 4516*a-n* that repeat at harmonics of the sampling frequency $1/T_S$. Each image 4516*a-n* is a spread spectrum signal that contains the necessary amplitude and frequency information to reconstruct the input baseband signal 4502.

The amplifier 4428 amplifies the harmonically rich signal 4508 to generate an amplified harmonically rich signal 4510.

Finally, the band-select filter 4432 selects the harmonic of interest from signal 4510, to generate an CDMA output signal 4512 that meets IS-95 CDMA specifications. This is represented by passband 4518 selecting harmonic image 4516*b* in FIG. 45E.

Figure 46:
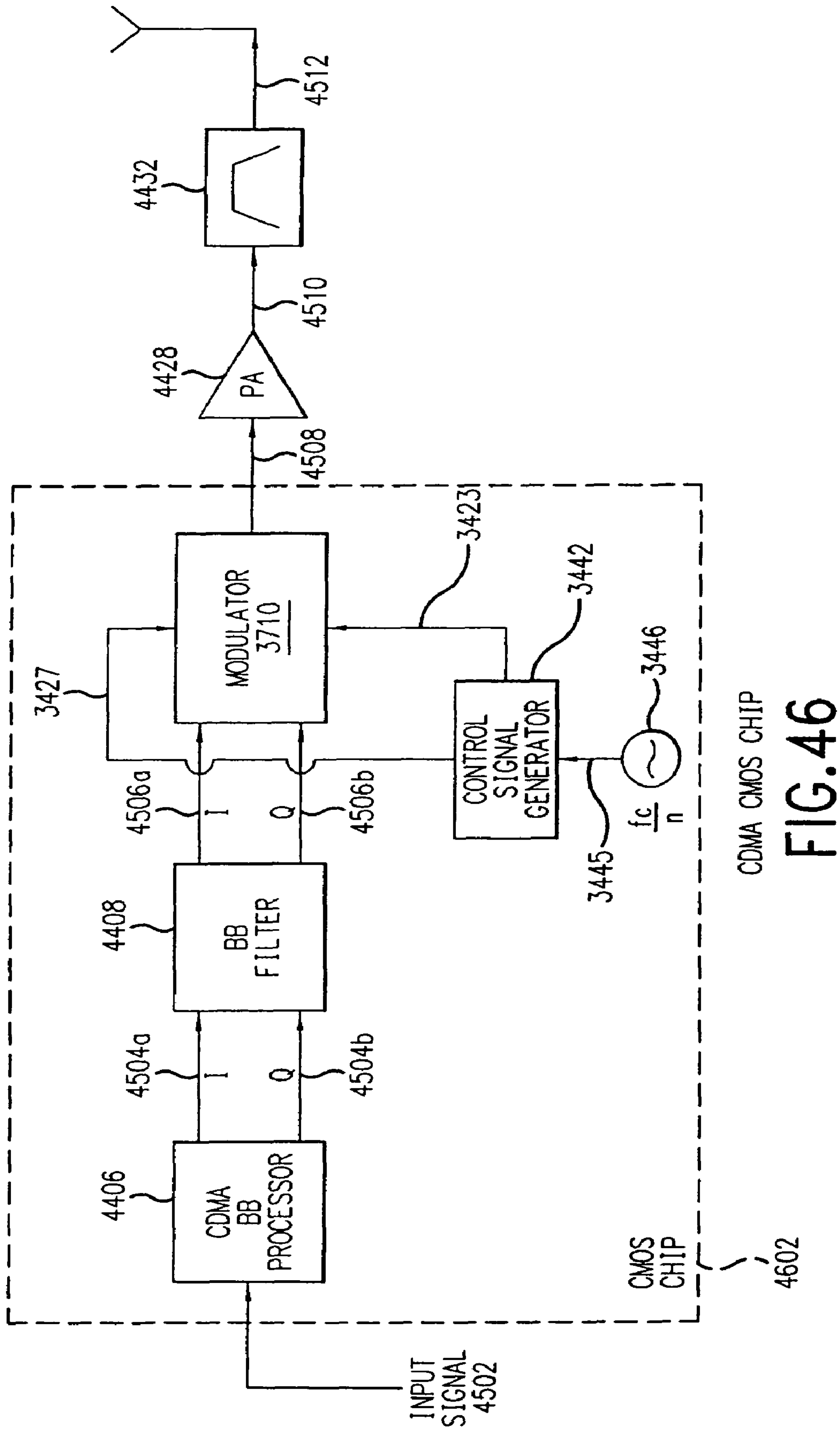
FIG. 46 illustrates a CDMA transmitter on a CMOS chip according to embodiments of the present invention.

An advantage of the CDMA transmitter 4500 in that the modulator 3710 up-converts a CDMA input signal directly from baseband to RF without any IF processing, and still meets the IS-95 sidelobe and figure-of-merit specifications. In other words, the modulator 3710 is sufficiently linear and efficient during the up-conversion process that no IF filtering or amplification is required to meet the IS-95 requirements. Therefore, the entire IF chain 4436 can be replaced by the modulator 3710, including the expensive SAW filter 4420. Since the SAW filter is eliminated, substantial portions of the transmitter 4502 can be integrated onto a single CMOS chip that uses a standard CMOS process. More specifically, the baseband processor 4404, the baseband filter 4408, modulator 3710, oscillator 3446, and control signal generator 3442 can be integrated on a single CMOS chip, as illustrated by CMOS chip 4602 in FIG. 46. Additionally, it is noted that the CDMA transmitter only utilizes one LO clock, whereas conventional CDMA transmitter 4400 utilizes two LO clocks.

Figure 45F:
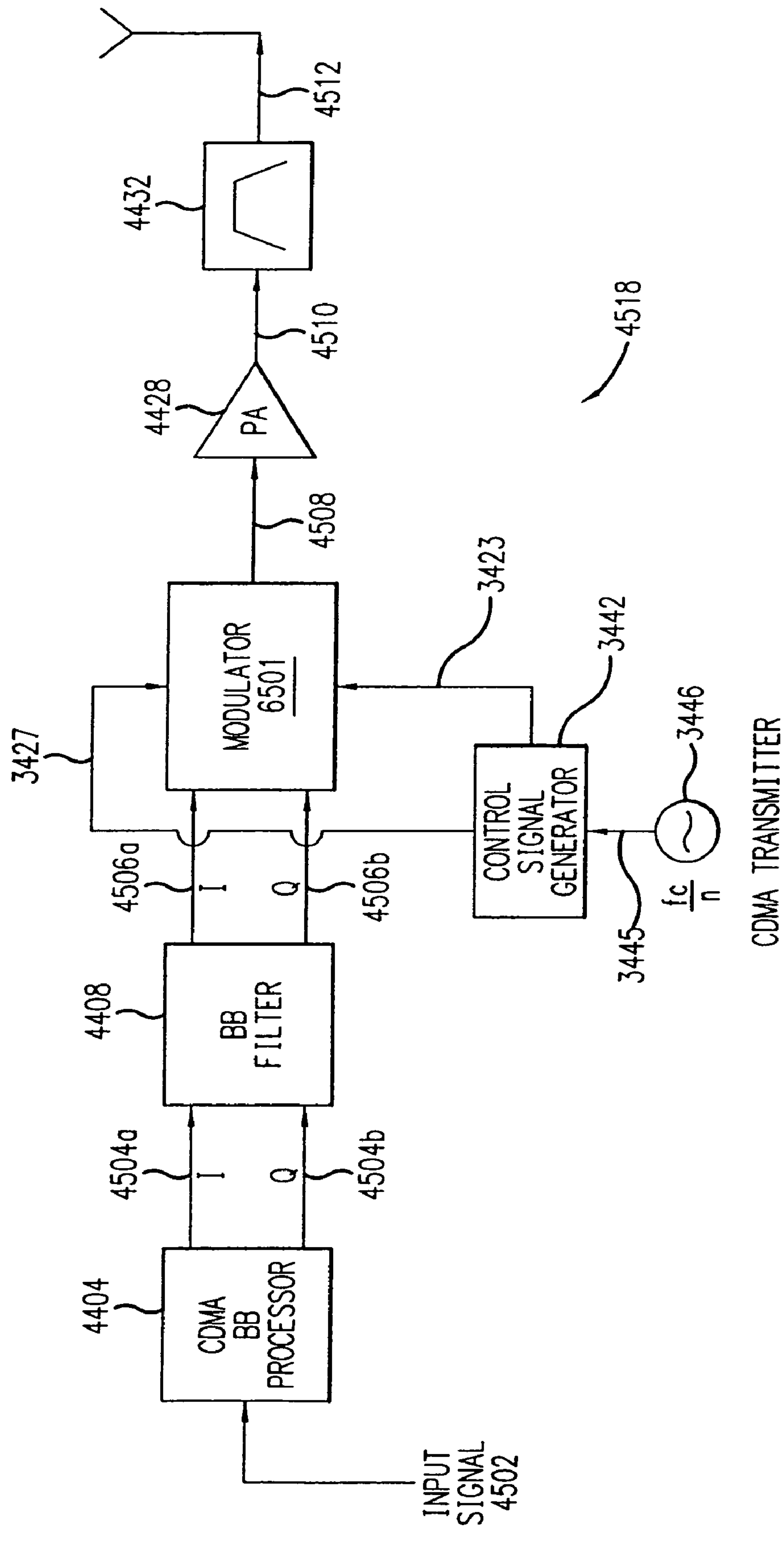
FIG. 45F illustrates a CDMA transmitter 4518 according to embodiments of the present invention.

FIG. 45F illustrates a transmitter 4518 that is similar to transmitter 4500 (FIG. 45A) except that modulator 6501 replaces the modulator 3710. Transmitter 4500 operates similar to the transmitter 4500 and has all the same advantages of the transmitter 4500.

7.3.4 CDMA Transmitter Measured Test Results

As discussed above, the UFT-based modulator 3710 directly up-converts baseband CDMA signals to RF without any IF filtering, while maintaining the required figures-of-merit for IS-95. The modulator 3710 has been extensively tested in order to specifically determine the performance parameters when up-converting CDMA signals. The test system and measurement results are discussed as follows. The following test and measurements results are presented for illustration only, and are not limiting.

Figure 47:
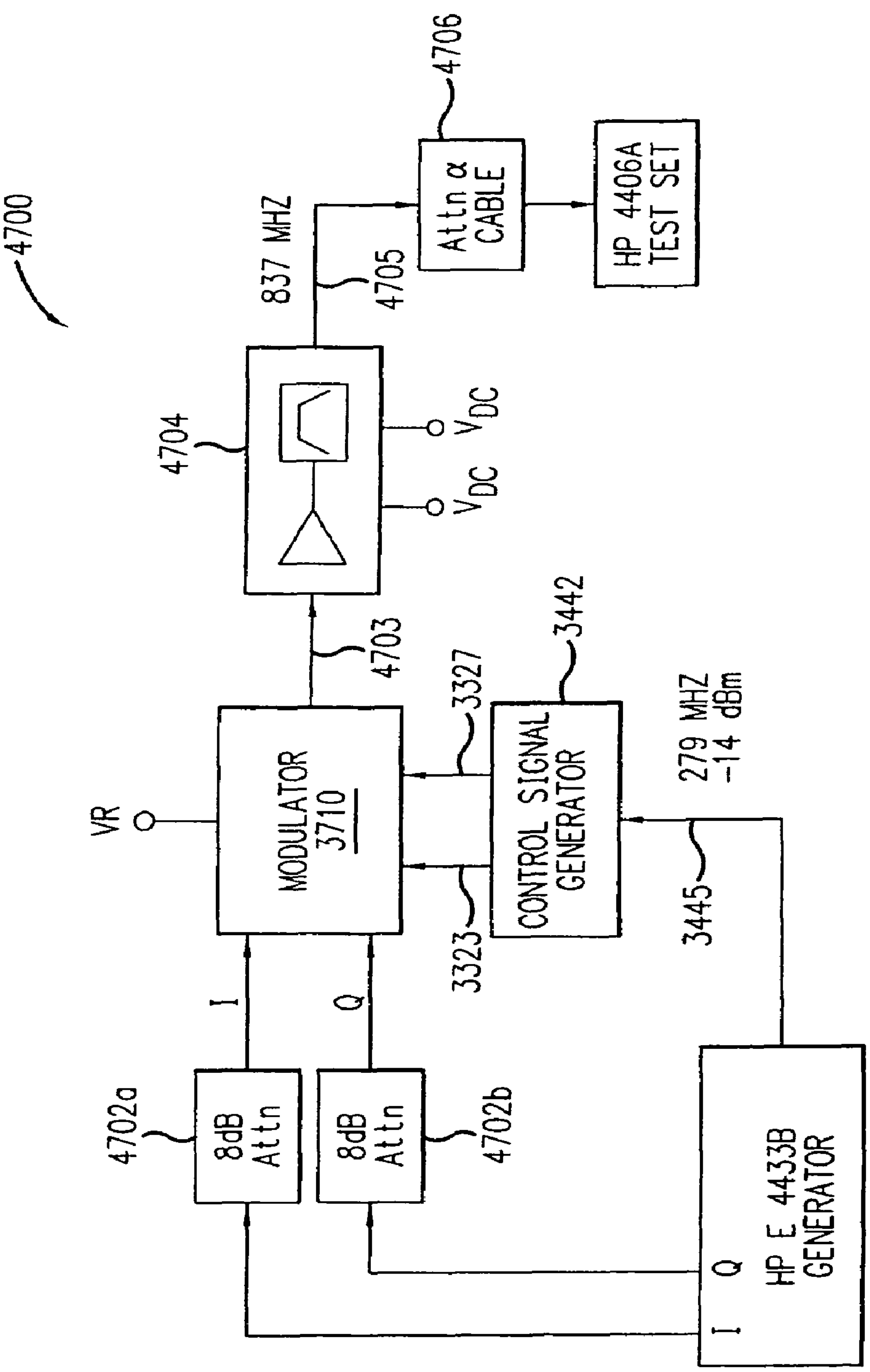
FIG. 47 illustrates an example test set 4700.

FIG. 47 illustrates an example test system 4700 that measures the performance of the modulator 3710 when up-converting CDMA baseband signals. The test system 4700 includes: a Hewlett Packerd (HP) generator E4433B, attenuators 4702*a* and 4702*b*, control signal generator 3442, UFT-based modulator 3710, amplifier/filter module 4704, cable/attenuator 4706, and HP 4406A test set. The HP generator E4433B generates I and Q CDMA baseband waveforms that meet the IS-95 test specifications. The waveforms are routed to the UFT-based modulator 3710 through the 8-dB attenuators 4702*a* and 4702*b*. The HP generator E4433B also generates the sub-harmonic clock signal 3445 that triggers the control signal generator 3442, where the sub-harmonic clock 3445 has a frequency of 279 MHZ. The modulator 3710 up-converts the I and Q baseband signals to generate harmonic rich signal 4703 having multiple harmonic images that represent the input baseband signal and repeat at the sampling frequency. The amplifier/filter module 4704 selects and amplifies the 3rd harmonic (of the 279 MHZ clock signal) in the signal 4703 to generate the signal 4705 at 837 MHZ. The HP 4406A test set accepts the signal 4705 for analysis through the cable/attenuator 4706. The HP 4406A measures CDMA modulation attributes including: Rho, EVM, phase error, amplitude error, output power, carrier insertion, and ACPR. In addition, the signal is demodulated and Walsh code correlation parameters are analyzed. Both forward and reverse links have been characterized using pilot, access, and traffic channels. For further illustration, FIGS. 48-60 display the measurement results for the RF spectrum 4705 based on various base station and mobile waveforms that are generated by the HP E443B generator.

FIGS. 48-49 summarize the performance parameters of the modulator 3710 as measured by the test set 4700 for base station and mobile station input waveforms. For the base station, table 4802 includes lists performance parameters that were measured at a base station middle frequency and includes: Rho, EVM, phase error, magnitude error, carrier insertion, and output power. It is noted that Rho=0.997 for the base station middle frequency and exceeds the IS-95 requirement of Rho=0.912. For the mobile station, FIG. 49 illustrates a table 4902 that lists performance parameters that were measured at low, middle, and high frequencies. It is noted that the Rho exceeds the IS-95 requirement (0.912) for each of the low, middle, high frequencies of the measured waveform.

Figure 50:
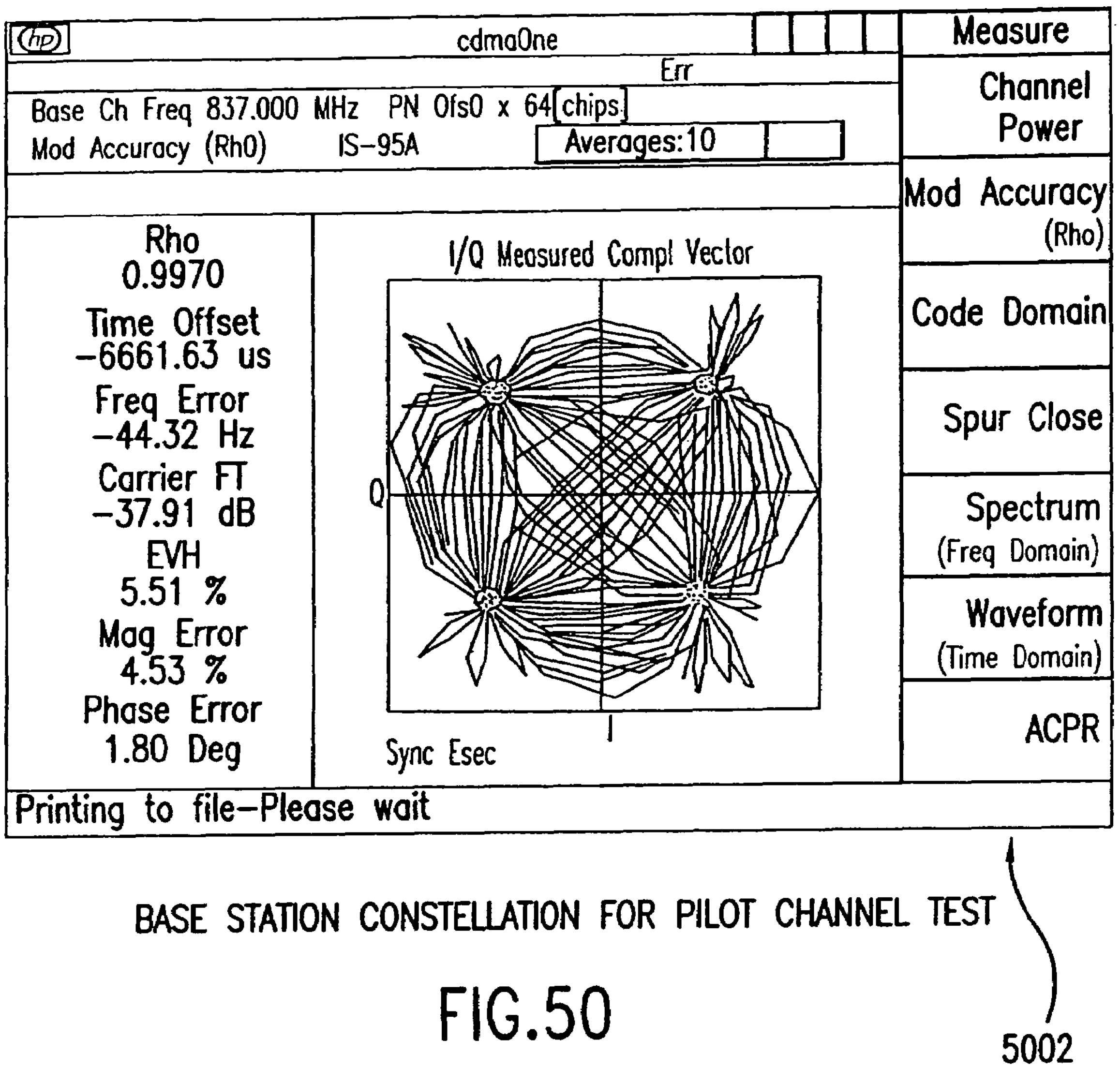

FIG. 50 illustrates a base station constellation 5002 measured during a pilot channel test. A signal constellation plots the various logic combinations for the I and Q signals in complex signal space, and is the raw data for determining the performance parameters (including Rho) that are listed in Table 48. The performance parameters (in table 48) are also indicated beside the constellation measurement 5002 for convenience. Again, it is noted that Rho=0.997 for this test. A value of 1 is perfect, and 0.912 is required by the IS-95 CDMA specification, although most manufactures strive for values greater than 0.94. This is a remarkable result since the modulator 3710 up-converts directly from baseband-to-RF without any IF filtering.

Figure 51:
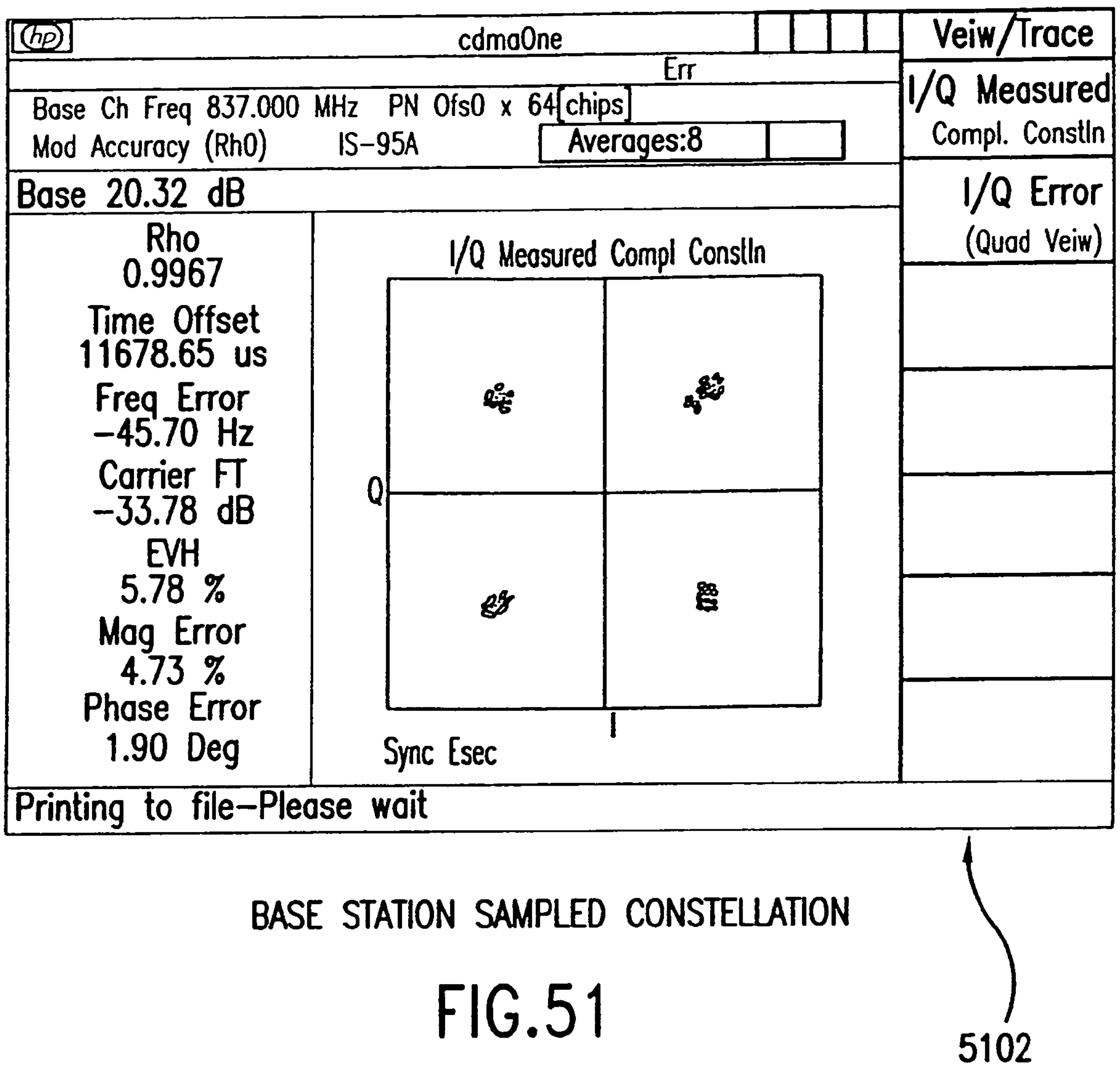

FIG. 51 illustrates a base station sampled constellation 5102, and depicts the tight constellation samples that are associated with FIG. 50. The symmetry and sample scatter compactness are illustrative of the superior performance of the modulator 3710.

Figure 52:
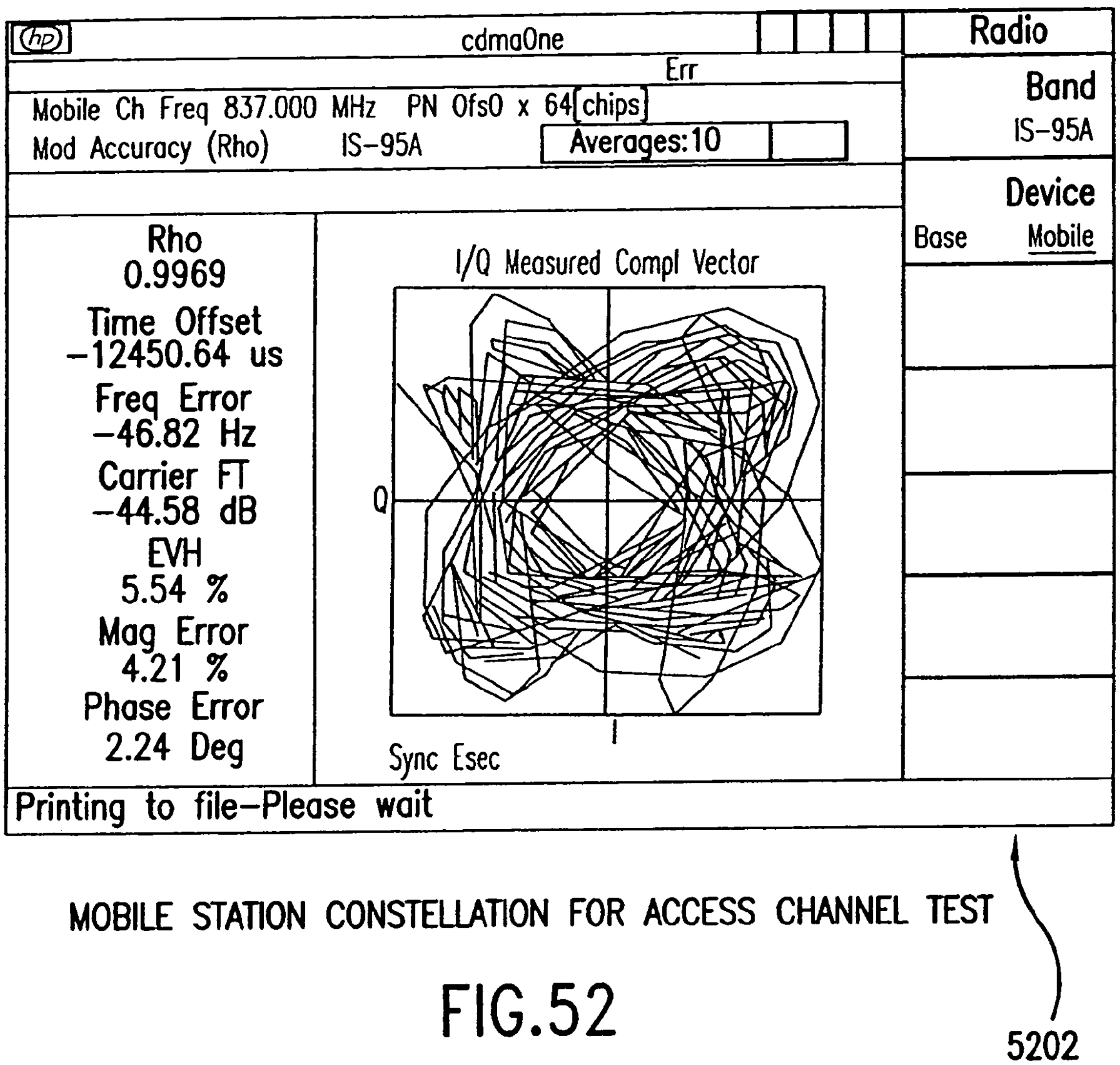

FIG. 52 illustrates a mobile station constellation 5202 measured during an access channel test. As shown, Rho=0.997 for the mobile station waveforms. Therefore, the modulator 3710 operates very well with conventional and offset shaped QPSK modulation schemes.

Figure 53:
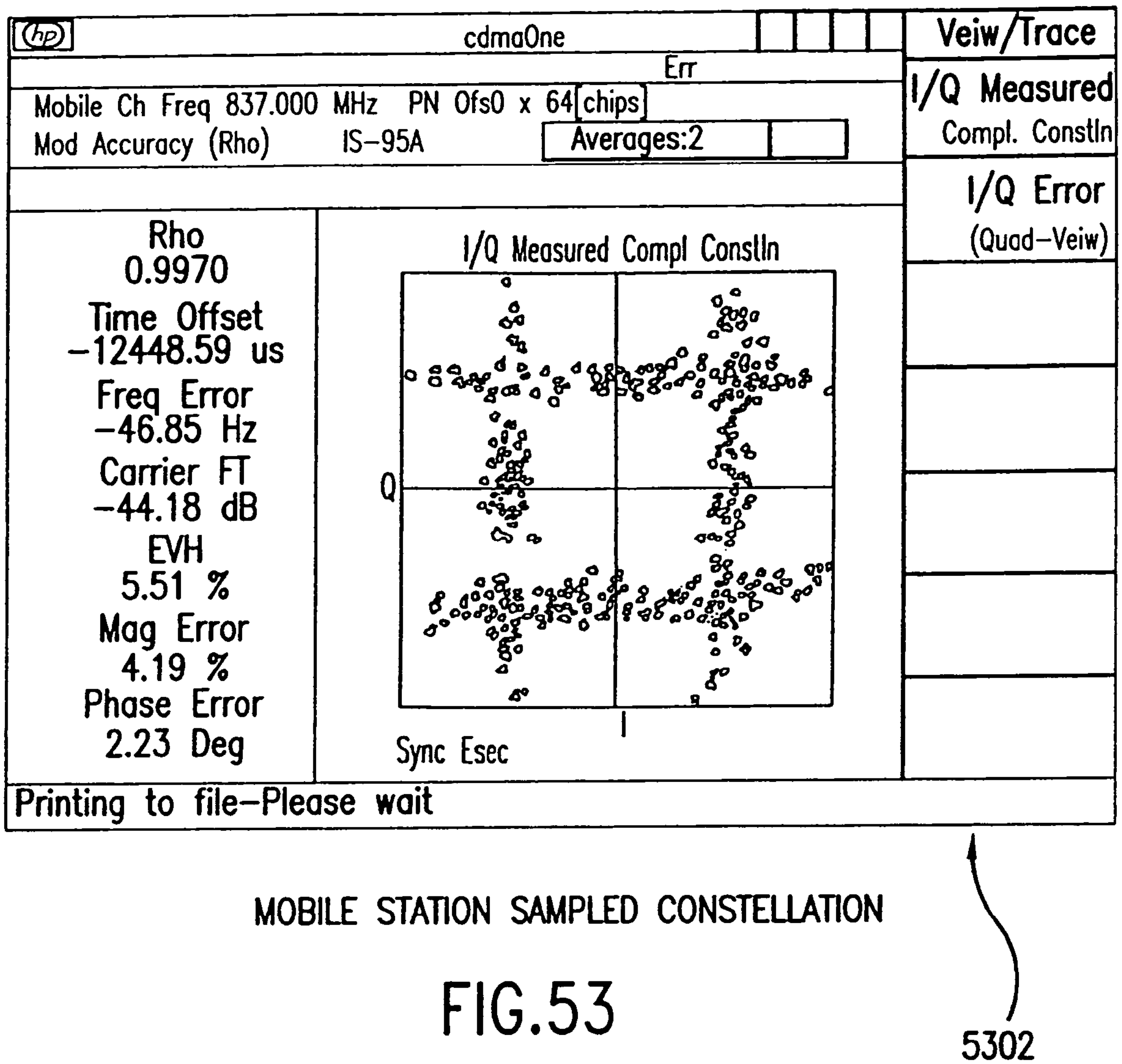

FIG. 53 illustrates a mobile station sampled constellation 5302. Constellation 5302 illustrates excellent symmetry for the constellation sample scatter diagram.

Figure 54:
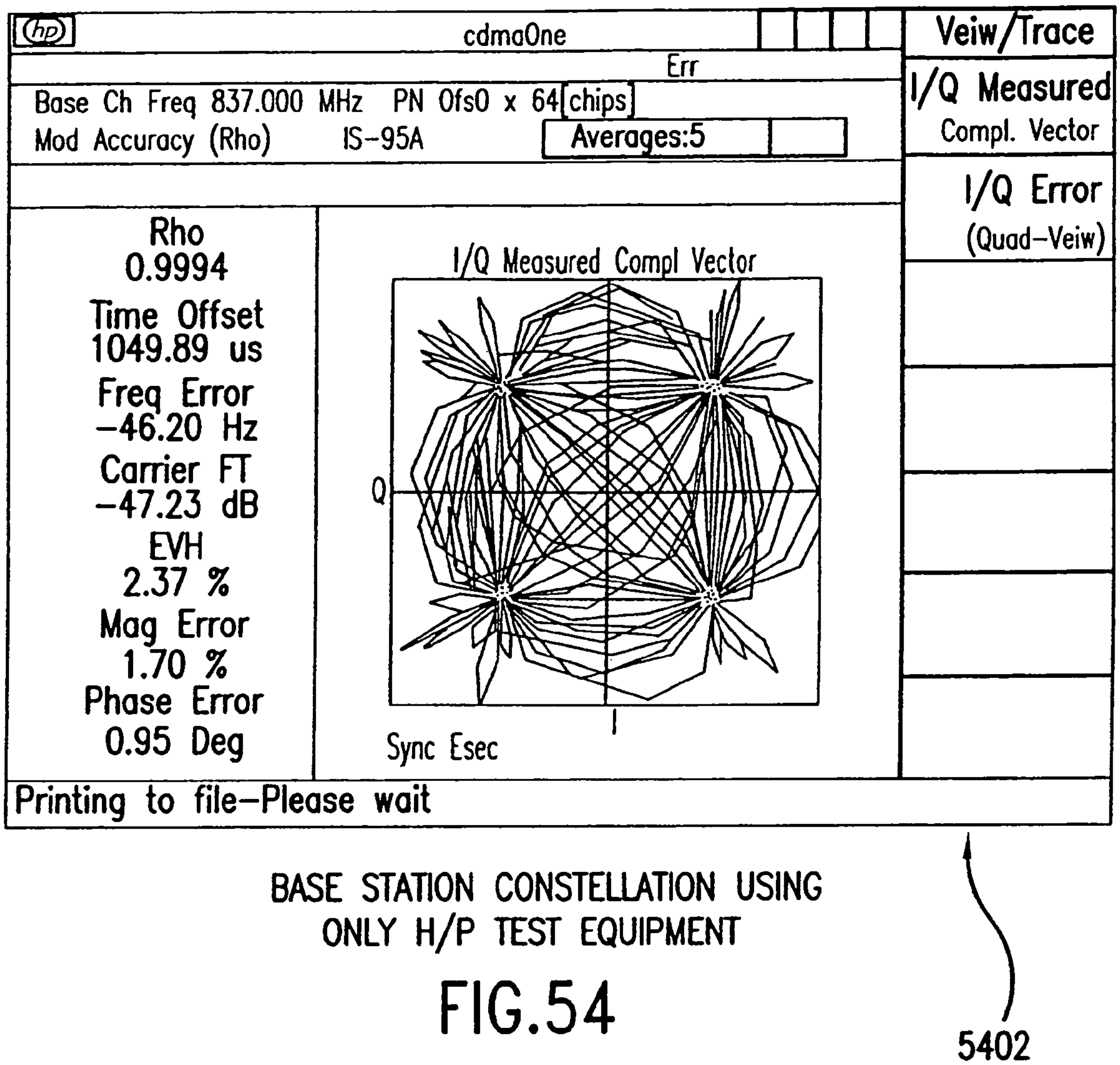

FIG. 54 illustrates a base station constellation 5402 using only the HP test equipment. The modulator 3710 has been removed so that the base station signal travels only through the cables that connect the HP signal generator E4433B to the HP 4406A test set. Therefore, constellation 5402 measures signal distortion caused by the test set components (including the cables and the attenuators). It is noted that Rho=0.9994 for this measurement using base station waveforms. Therefore, at least part of the minimal signal distortion that is indicated in FIGS. 50 and 51 is caused by the test set components, as would be expected by those skilled in the relevant arts.

Figure 55:
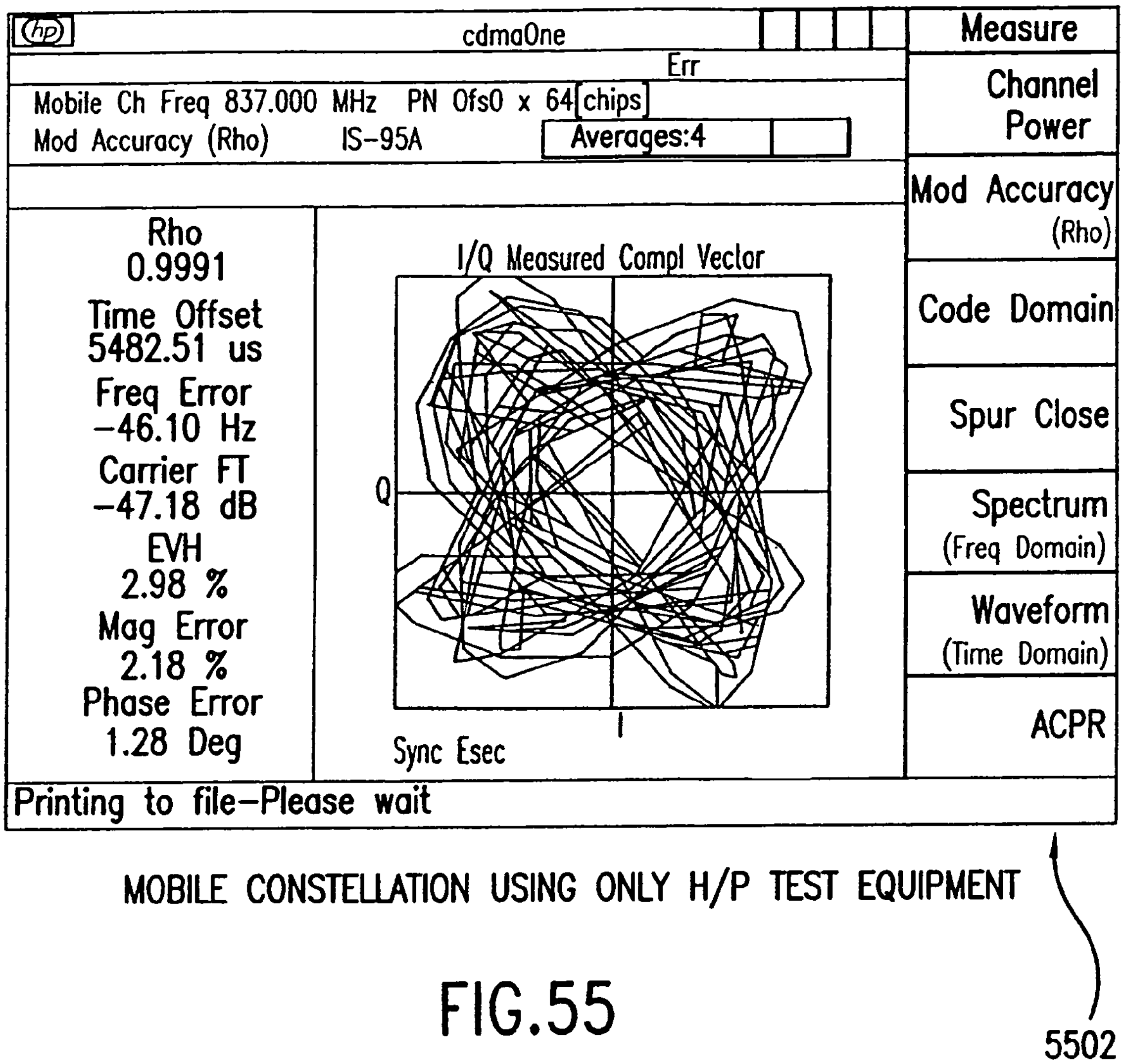

FIG. 55 illustrates a mobile station constellation 5502 using only the HP test equipment. As in FIG. 54, the modulator 3710 has been removed so that the mobile station signal travels only through the cables that connect the HP signal generator E4433B to the HP 4406A test set. Therefore, constellation 5402 measures signal distortion caused by the test set components (including the cables and the attenuators). It is noted that Rho=0.9991 for this measurement using mobile station waveforms. Therefore, at least part of the signal distortion indicated in FIGS. 52 and 53 is caused by the test set components, as would be expected.

Figure 56:
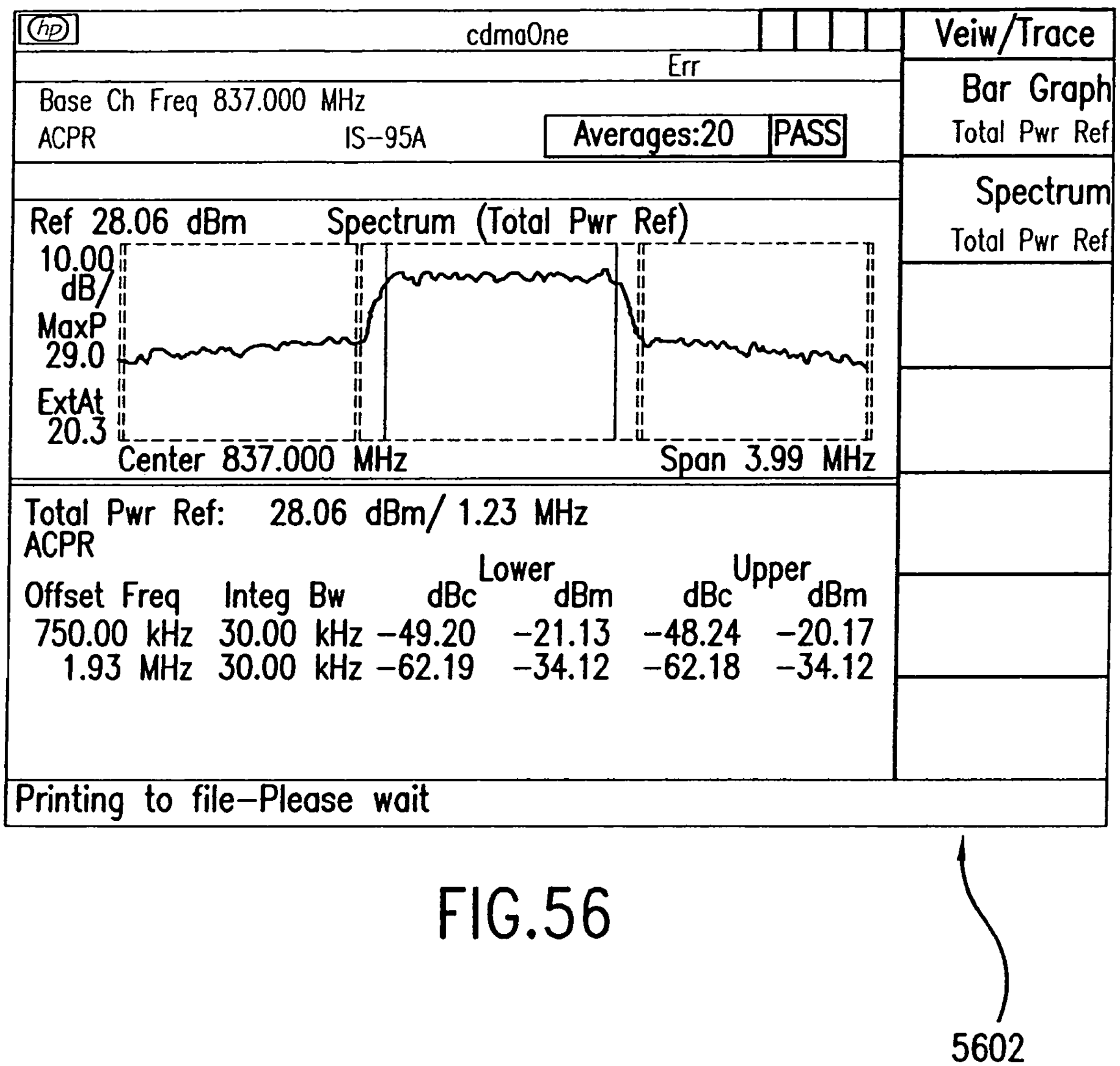

FIG. 56 illustrates a frequency spectrum 5602 of the signal 4705 with a base station input waveform. The frequency spectrum 5602 has a main lobe and two sidelobes, as expected for a CDMA spread spectrum signal. The adjacent channel power ratio (ACPR) measures the spectral energy at a particular frequency of the side lobes relative to the main lobe. As shown, the frequency spectrum 5602 has an ACPR=−48.24 dBc and −62.18 dBc at offset frequencies of 750 KHz and 1.98 MHZ, respectively. The IS-95 ACPR requirement for a base station waveform is −45 dBc and −60 dBc maximum, at the offset frequencies of 750 kHz and 1.98 MHZ, respectively. Therefore, the modulator 3710 has more than 3 dB and 2 dB of margin over the IS-95 requirements for the 750 kHz and 1.98 MHZ offsets, respectively.

Figure 57:
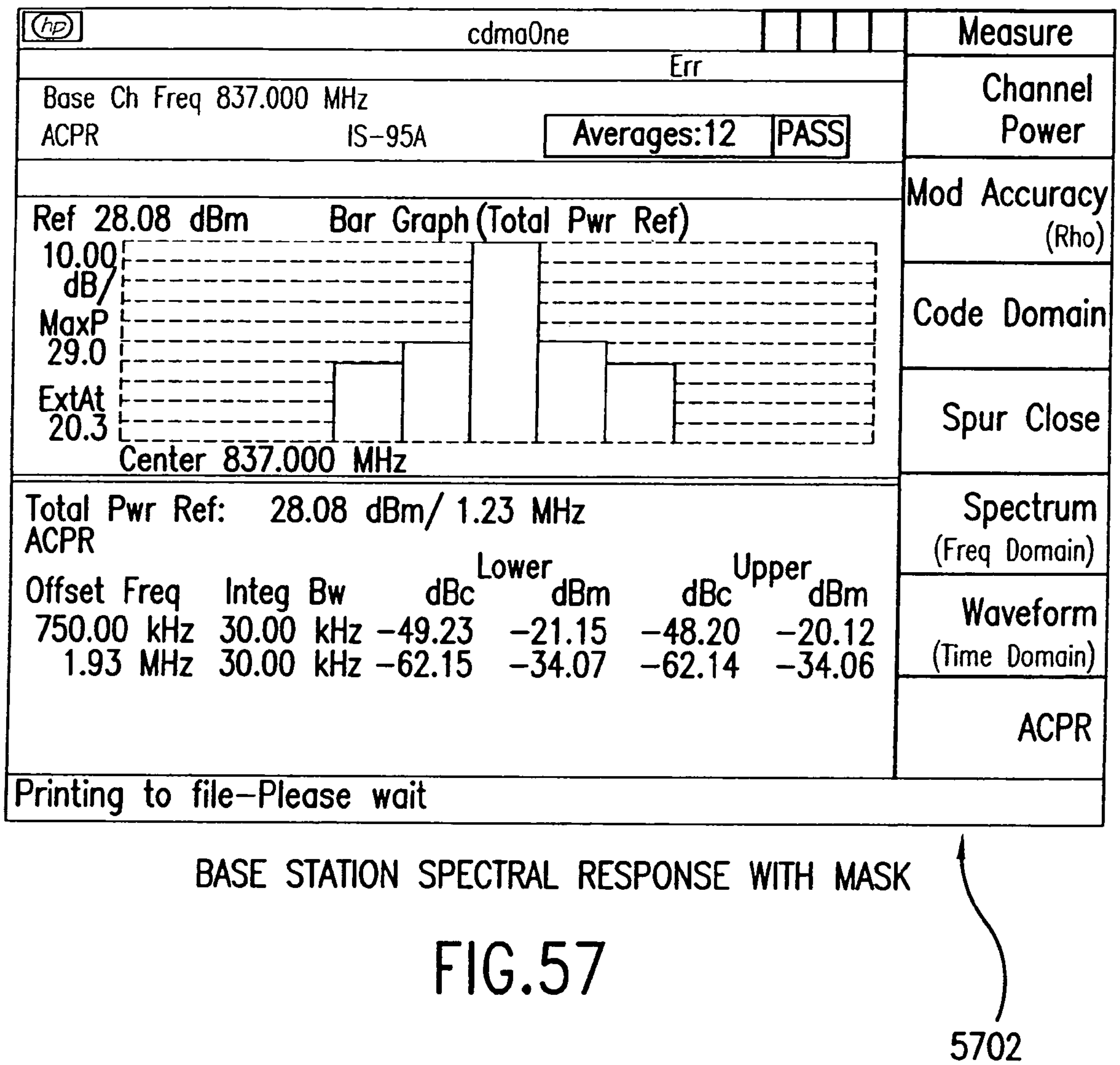

FIG. 57 illustrates a histogram 5702 that corresponds to the spectrum plot in FIG. 56. The histogram 5702 illustrates the distribution of the spectral energy in the signal 4705 for a base station waveform.

Figure 58:
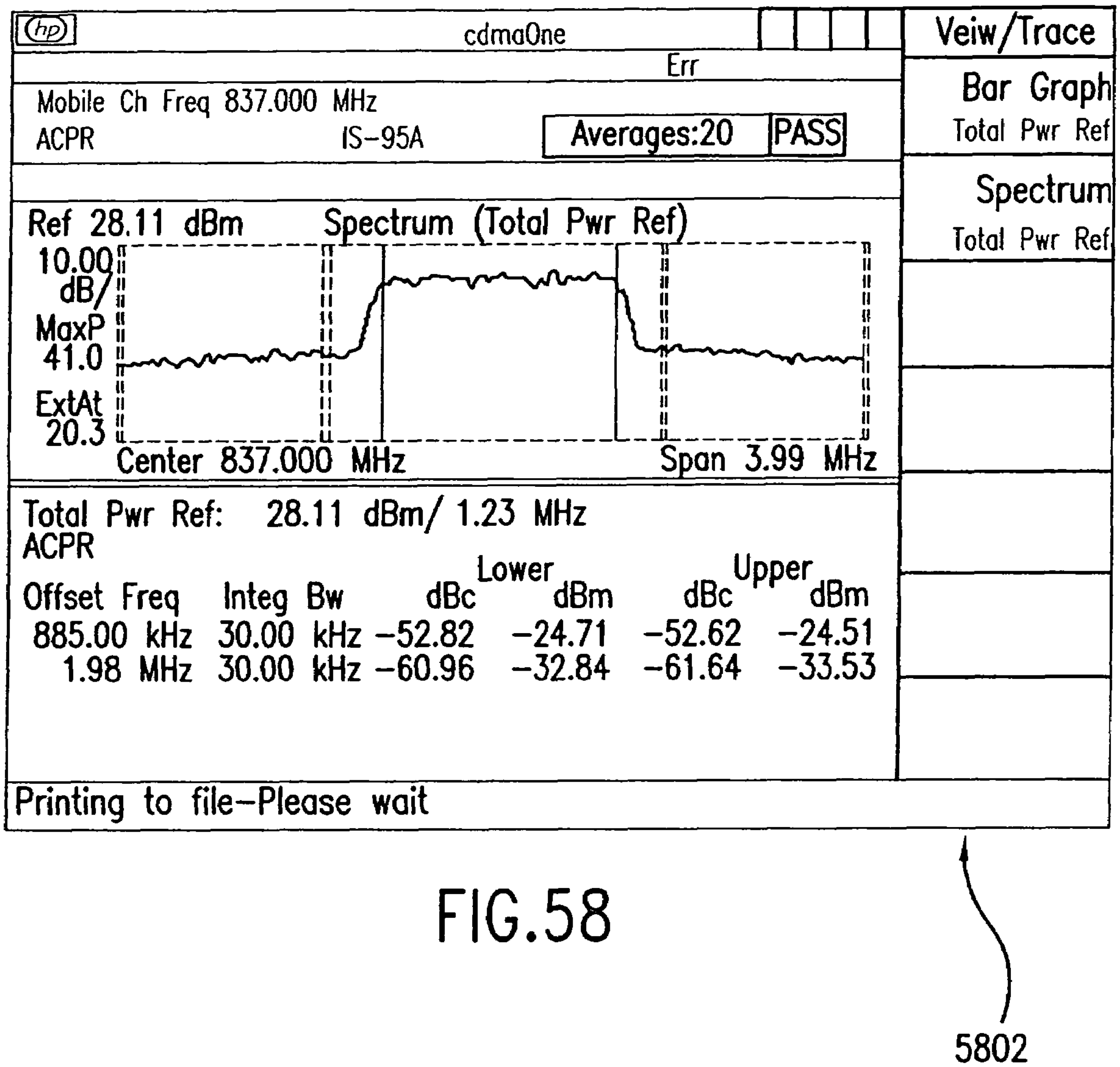

FIG. 58 illustrates a frequency spectrum 5802 of the signal 4705 with a mobile station input waveform. As shown, the ACPR measurement is −52.62 dBc and −60.96 dBc for frequency offsets of 885 kHz and 1.98 MHZ, respectively. The IS-95 ACPR requirement for a mobile station waveform is approximately −42 dBc and −54 dBc, respectively. Therefore, the modulator 3710 has over 10 dB and 6 dB of margin above the IS-95 requirements for the 885 kHz and 1.98 MHZ frequency offsets, respectively.

Figure 59:
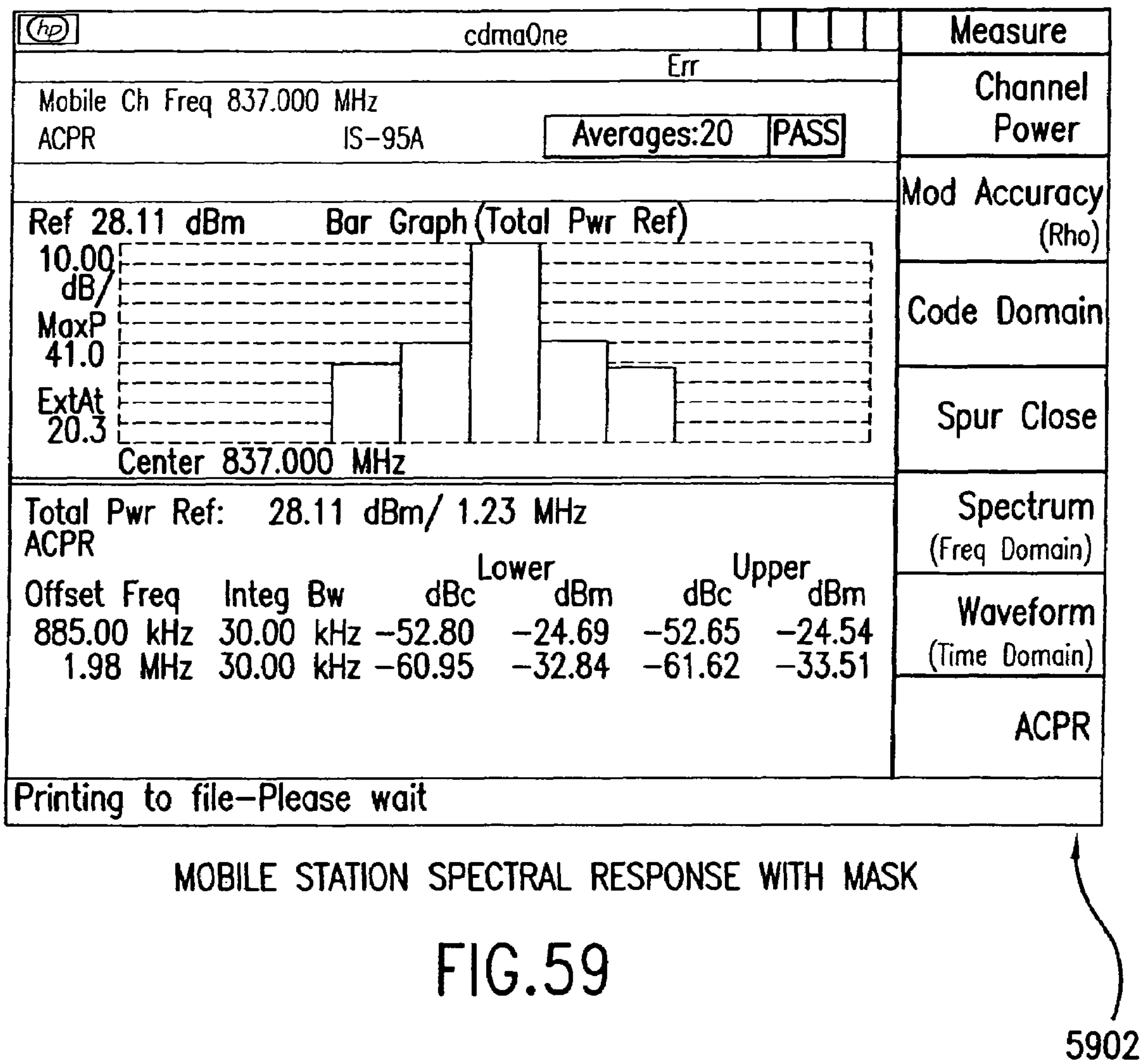

FIG. 59 illustrates a histogram 5902 that corresponds to the mobile station spectrum plot in FIG. 58. The histogram 5902 illustrates the distribution of the spectral energy in the signal 4705 for a mobile station waveform.

Figure 60A:
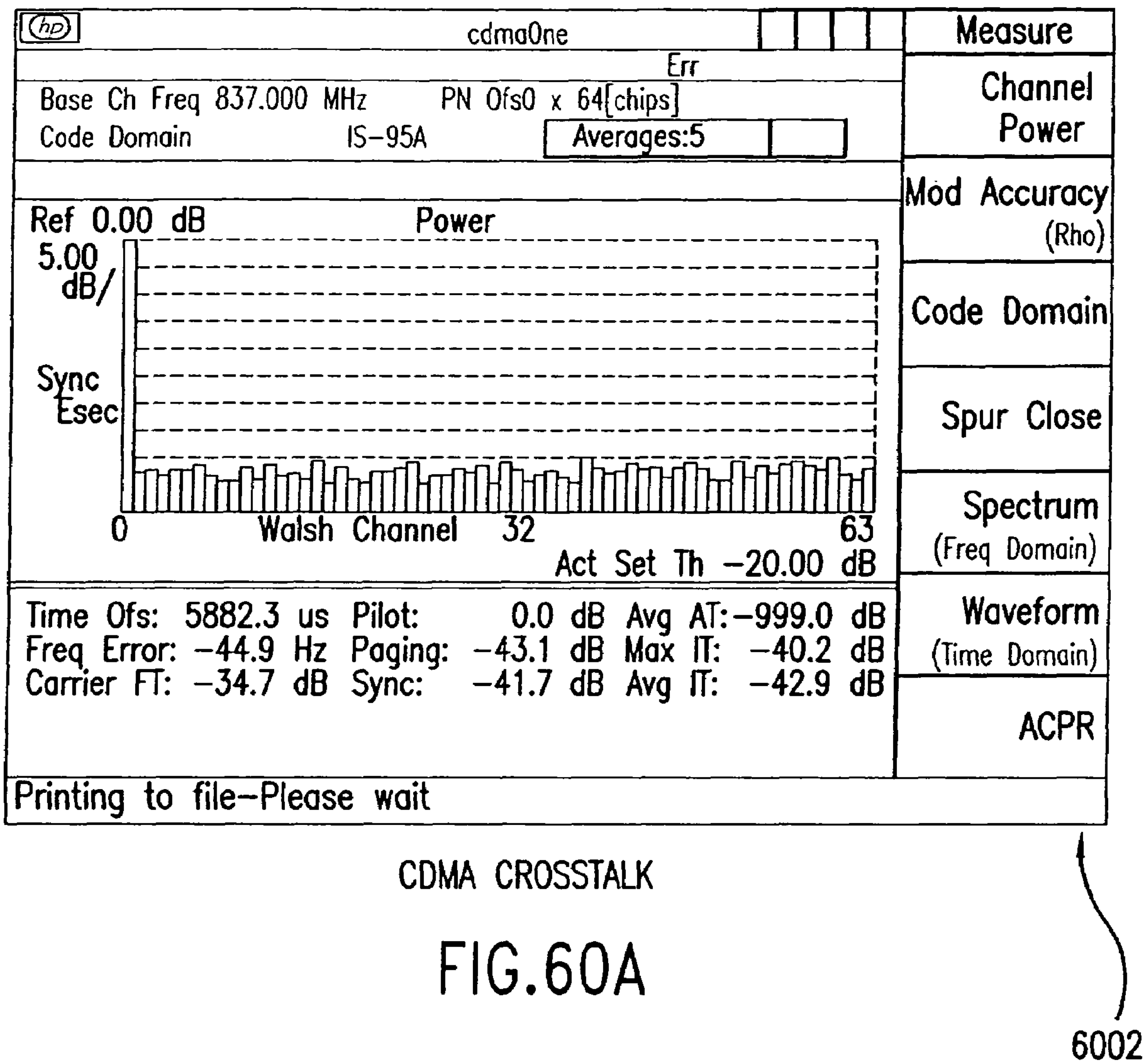

FIG. 60A illustrates a histogram 6002 for crosstalk vs. CDMA channel with a base station input waveform. More specifically, the HP E4406A was utilized as a receiver to analyze the orthogonality of codes superimposed on the base station modulated spectrum. The HP E4406A demodulated the signal provided by the modulator/transmitter and determined the crosstalk to non-active CDMA channels. The pilot channel is in slot '0' and is the active code for this test. All non-active codes are suppressed in the demodulation process by greater than 40 dB. The IS-95 requirement is 27 dB of suppression so that there is over 13 dB of margin. This implies that the modulator 3710 has excellent phase and amplitude linearity.

In additions to the measurements described above, measurements were also conducted to obtain the timing and phase delays associated with a base station transmit signal composed of pilot and active channels. Delta measurements were extracted with the pilot signal as a reference. The delay and phase are −5.7 ns (absolute) and 7.5 milli radians, worst case. The standard requires less than 50 ns (absolute) and 50 milli radians, which the modulator 3710 exceeded with a large margin.

Figure 60B:
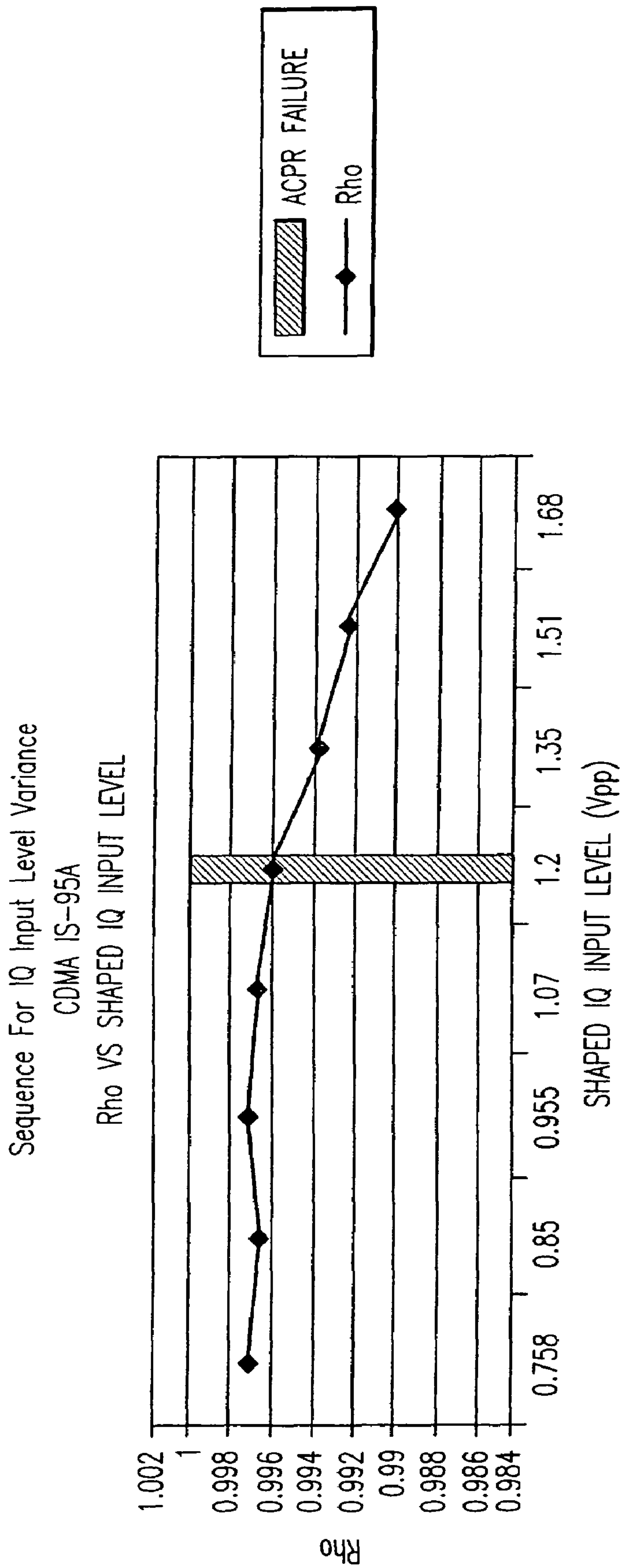

The performance sensitivity of modulator 3710 was also measured over multiple parameter variations. More specifically, the performance sensitivity was measured vs. IQ input signal level variation and LO signal level variation, for both base station and mobile station modulation schemes. (LO signal level is the signal level of the subharmonic clock 3445 in FIG. 47.) FIGS. 60B-O depict performance sensitivity of the modulator 3710 using the base station modulation scheme, and FIGS. 60P-Z depict performance sensitivity using the mobile station modulation scheme. These plots reveal that the modulator 3710 is expected to enable good production yields since there is a large acceptable operating performance range for I/Q and LO peak to peak voltage inputs. The plots are described further as follows.

FIG. 60B illustrates Rho vs. shaped IQ input signal level using base station modulation.

Figure 60C:
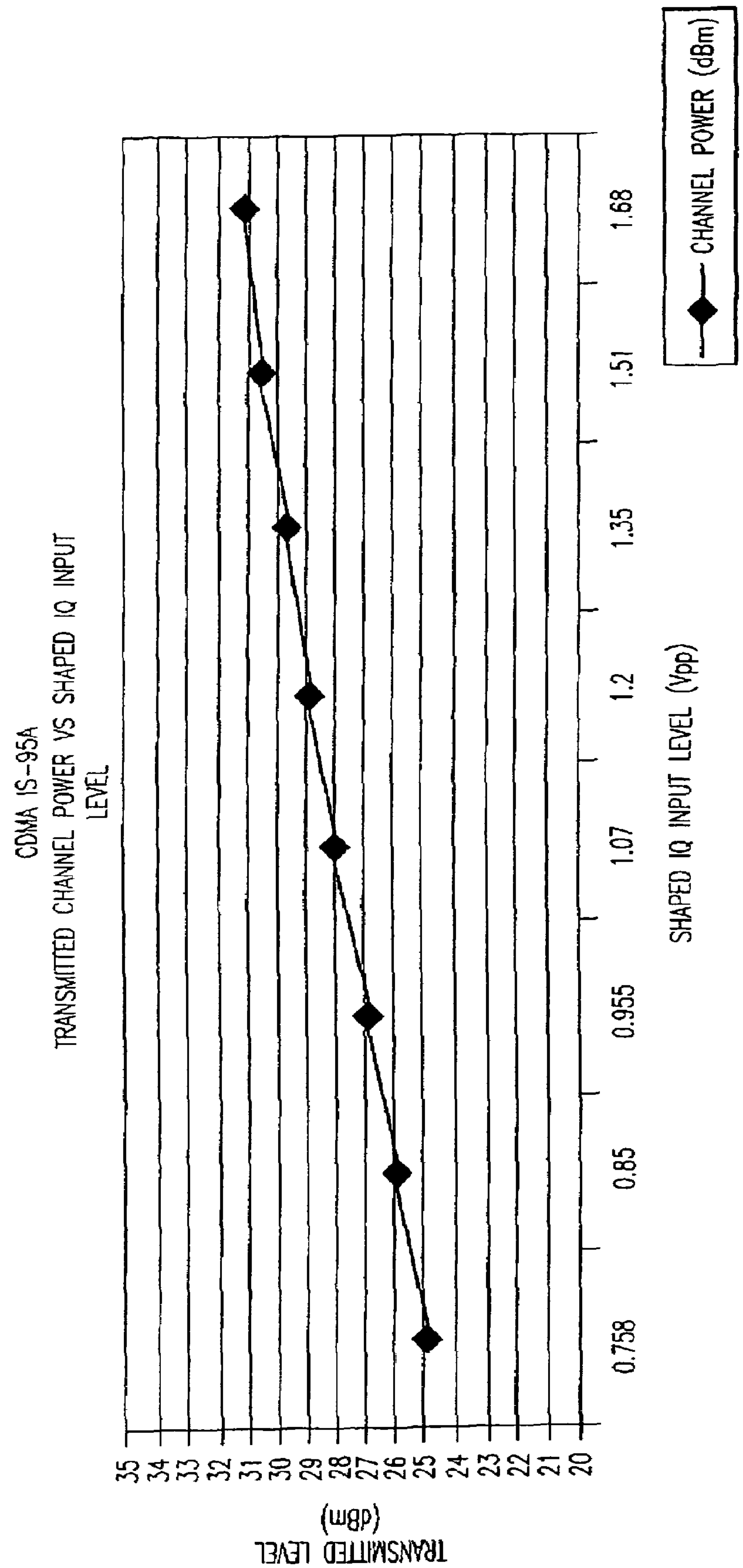

FIG. 60C illustrates transmitted channel power vs. shaped IQ input signal level using base station modulation.

Figure 60D:
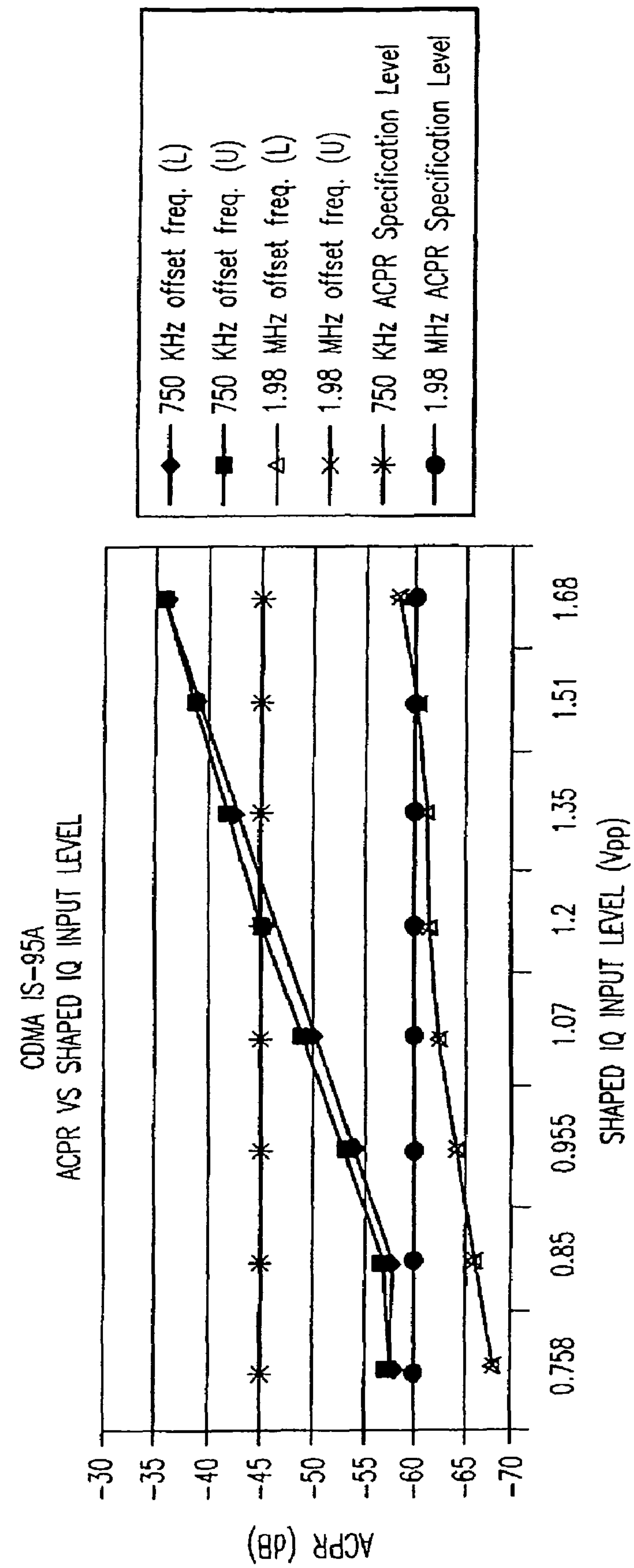

FIG. 60D illustrates ACPR vs. shaped IQ Input signal level using base station modulation.

Figure 60E:
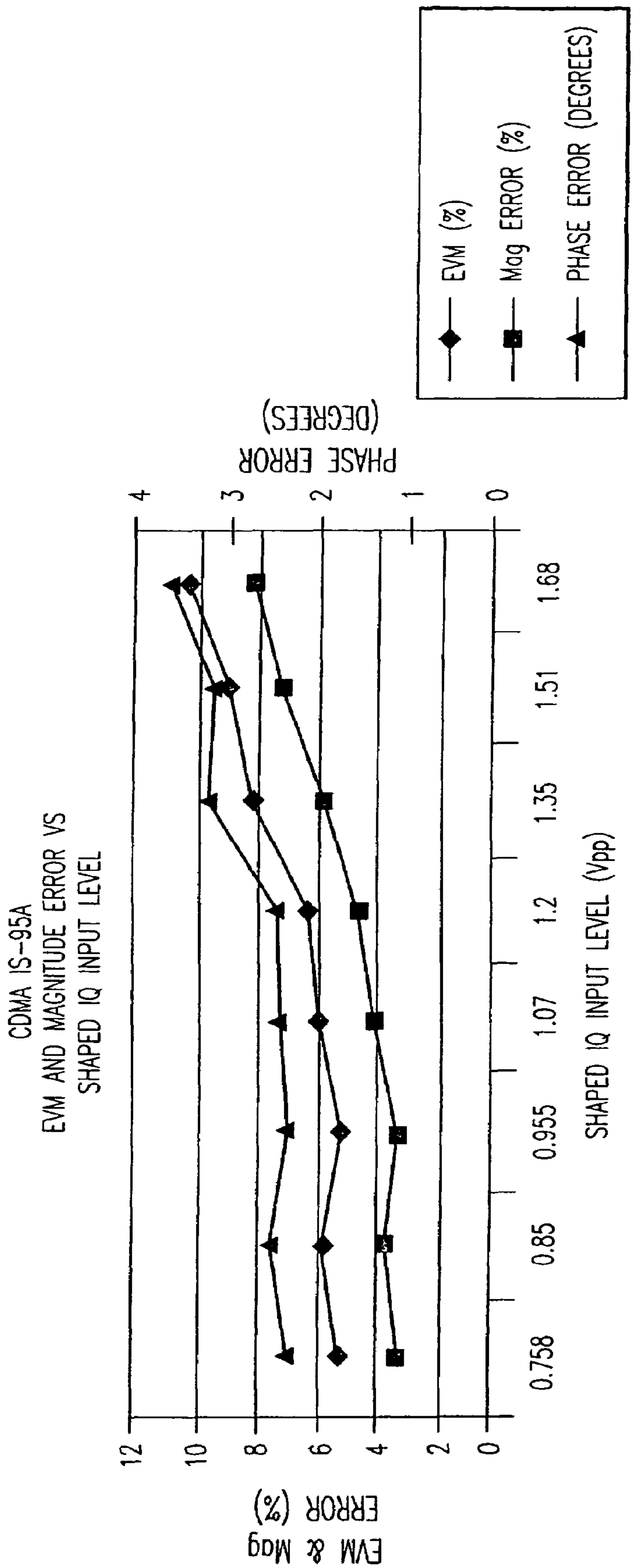

FIG. 60E illustrates EVM and Magnitude error vs shaped IQ input level using base station modulation.

Figure 60F:
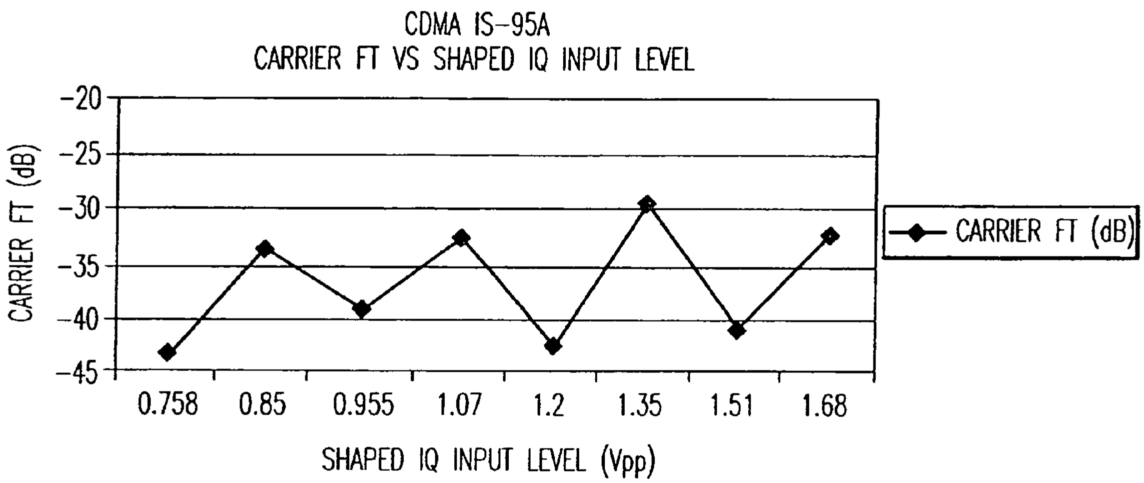

FIG. 60F illustrates carrier feed thru vs. shaped IQ input signal level using base station modulation.

Figure 60G:
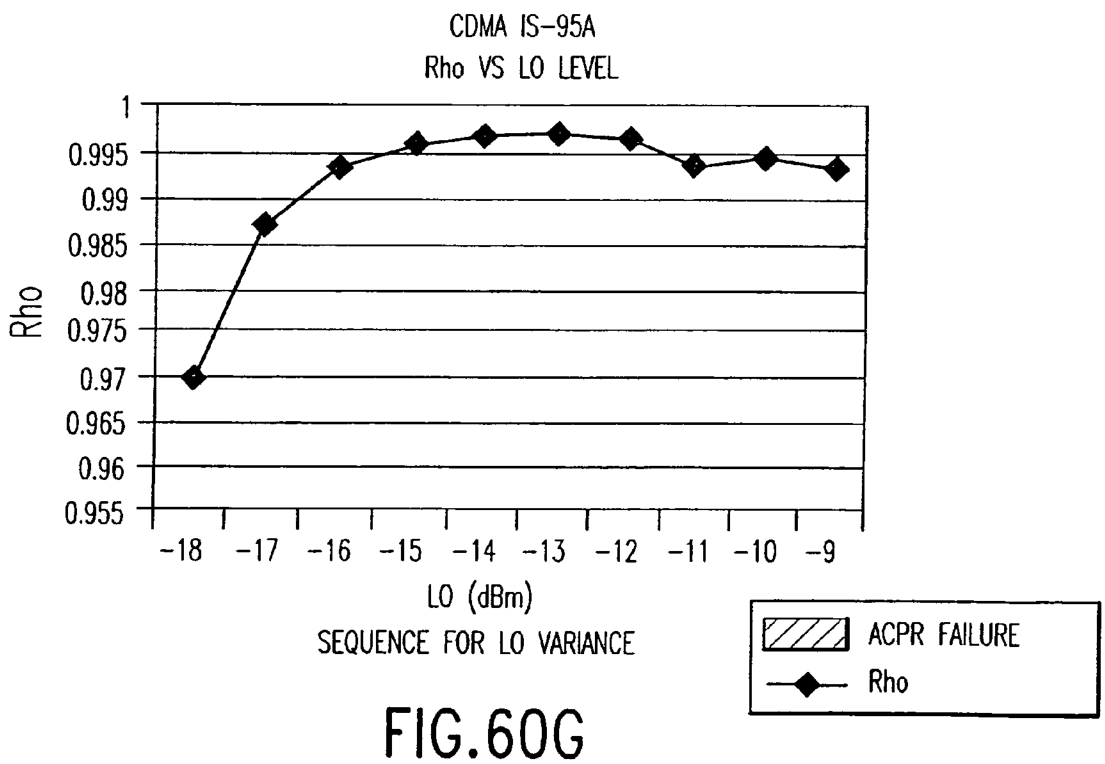

FIG. 60G illustrates Rho vs. LO signal level using base station modulation.

Figure 60H:
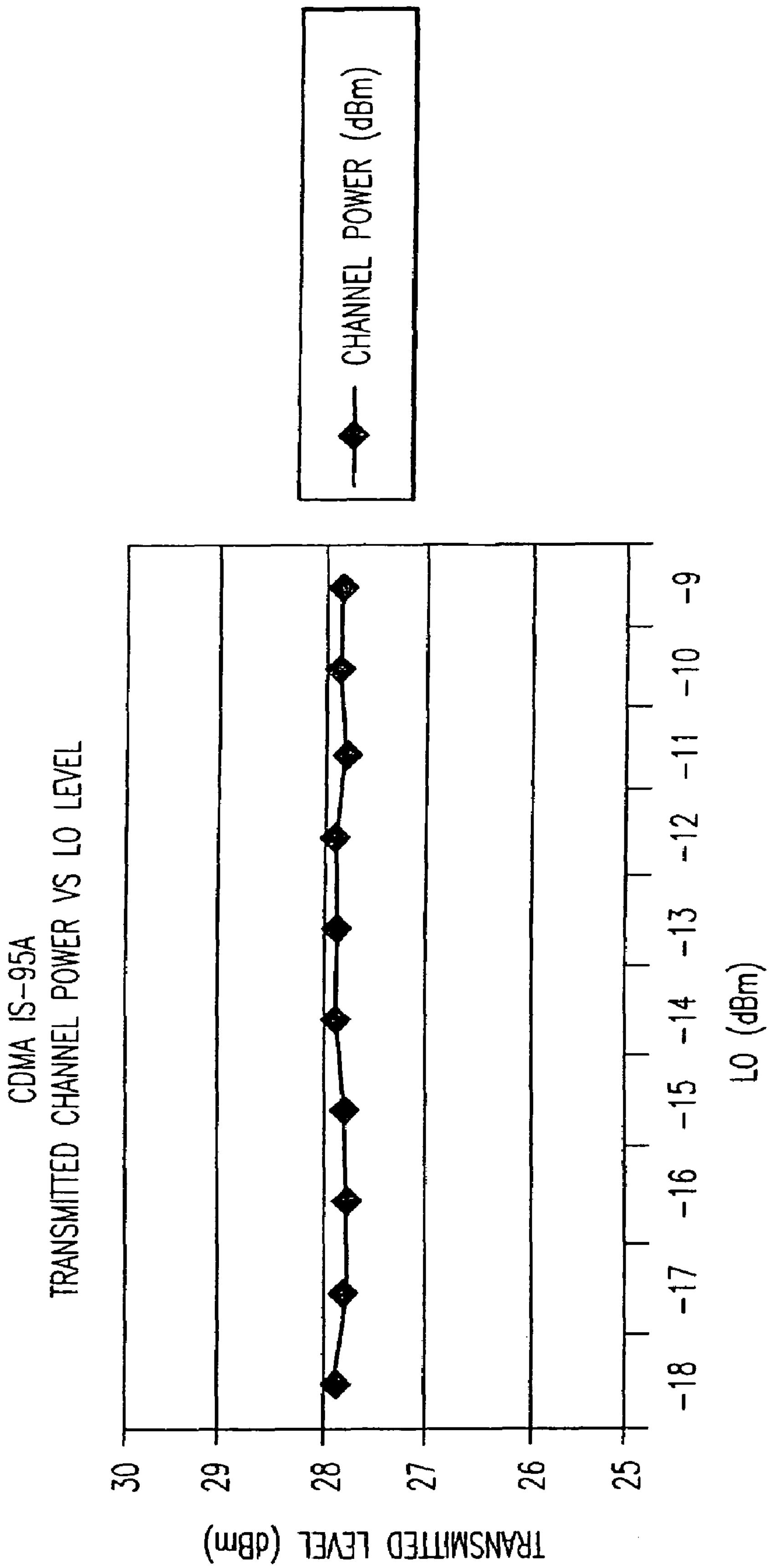

FIG. 60H illustrates transmitted channel power vs. LO signal level using base station modulation.

Figure 60I:
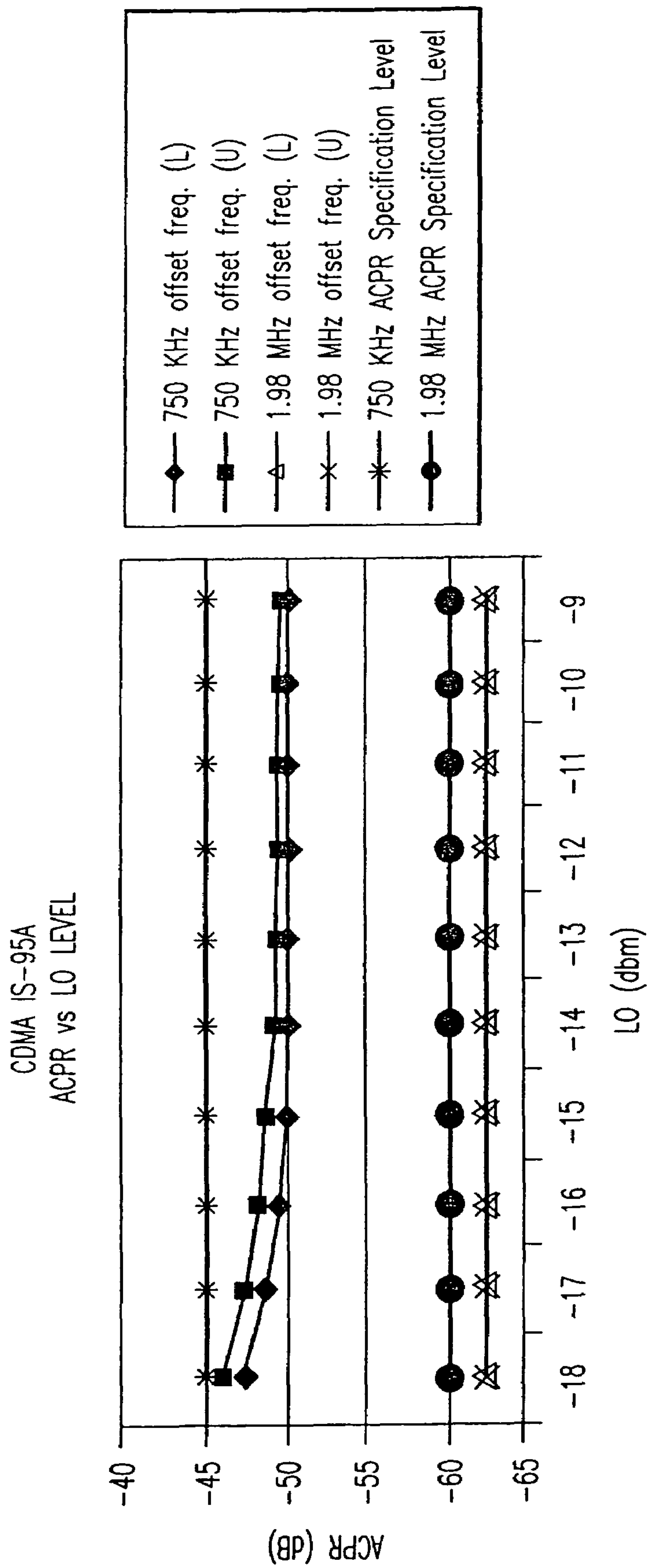

FIG. 60I illustrates ACPR vs. LO signal level using base station modulation.

Figure 60J:
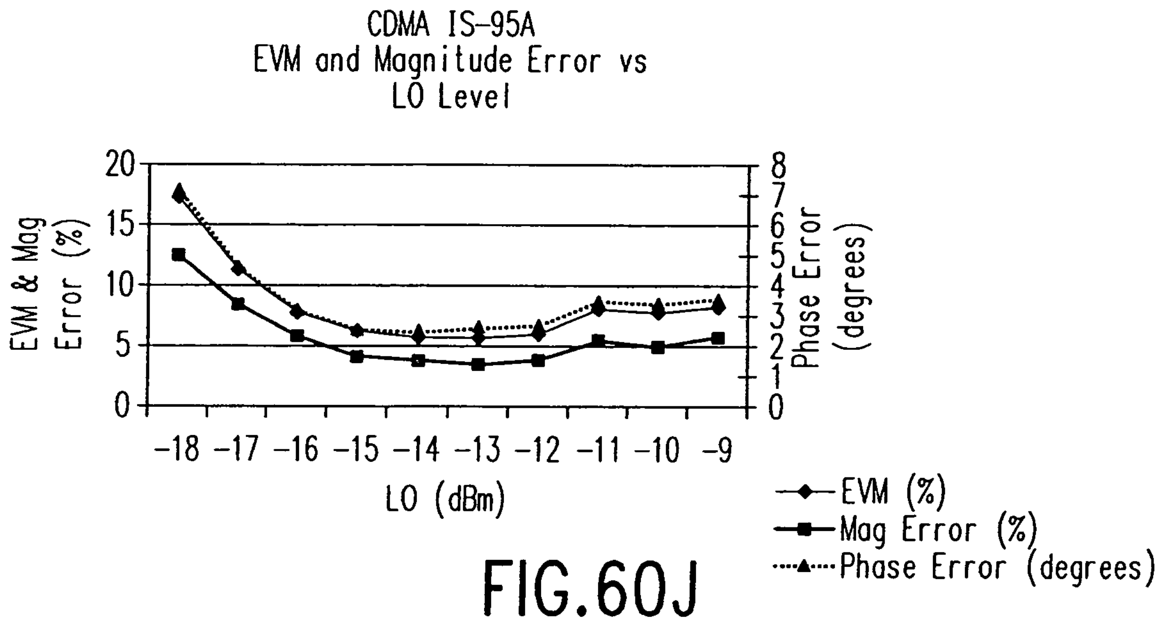

FIG. 60J illustrates EVM and magnitude error vs LO signal level using base station modulation.

Figure 60K:
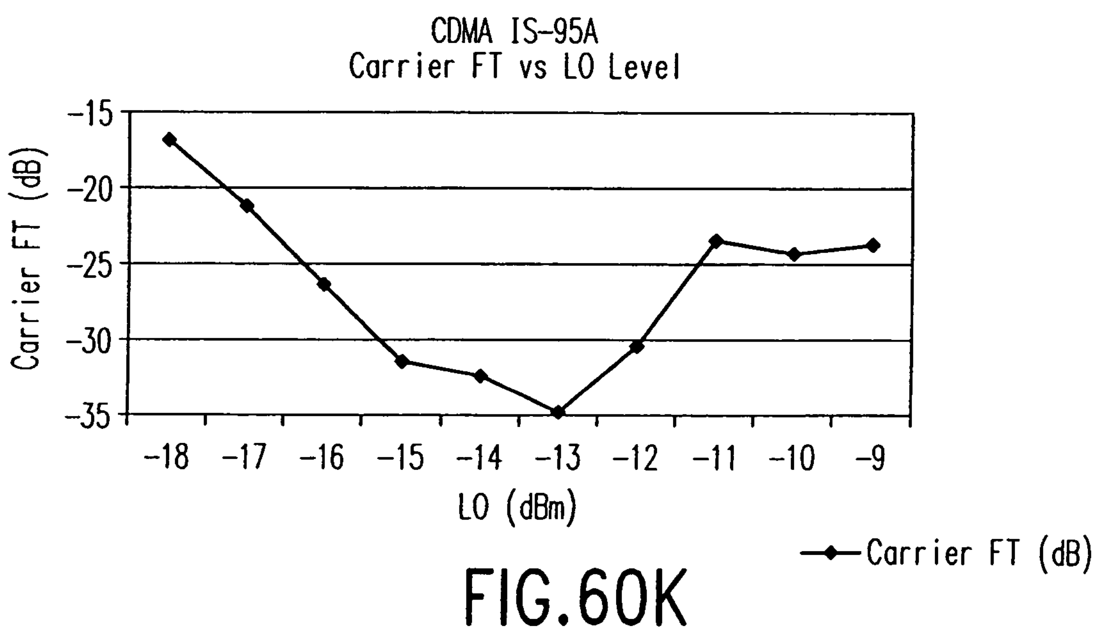

FIG. 60K illustrates carrier feed thru vs. LO signal level using base station modulation.

Figure 60L:
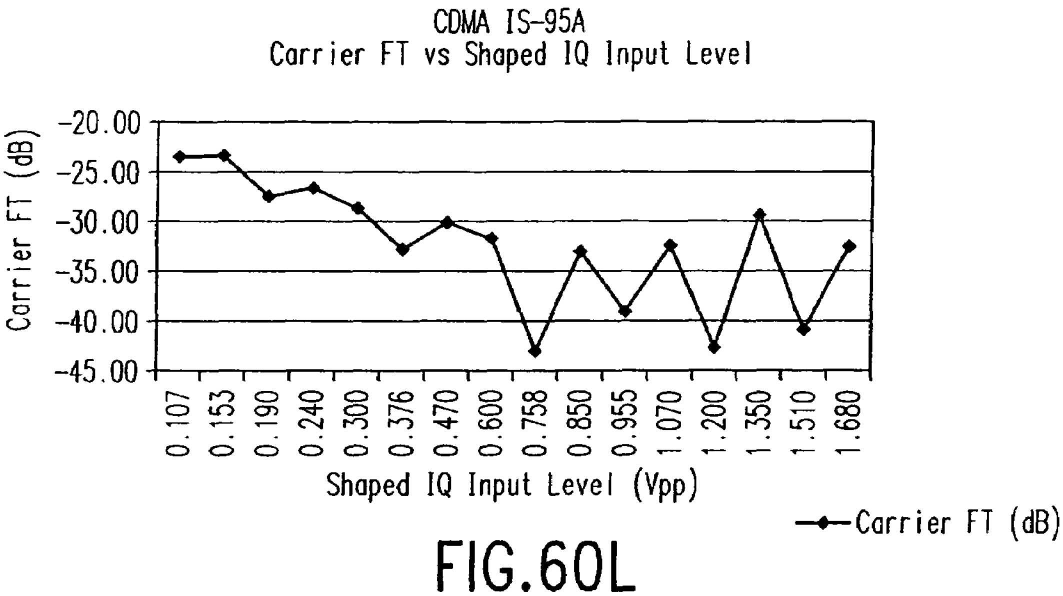

FIG. 60L illustrates carrier feed thru vs IQ input level over a wide range using base station modulation.

Figure 60M:
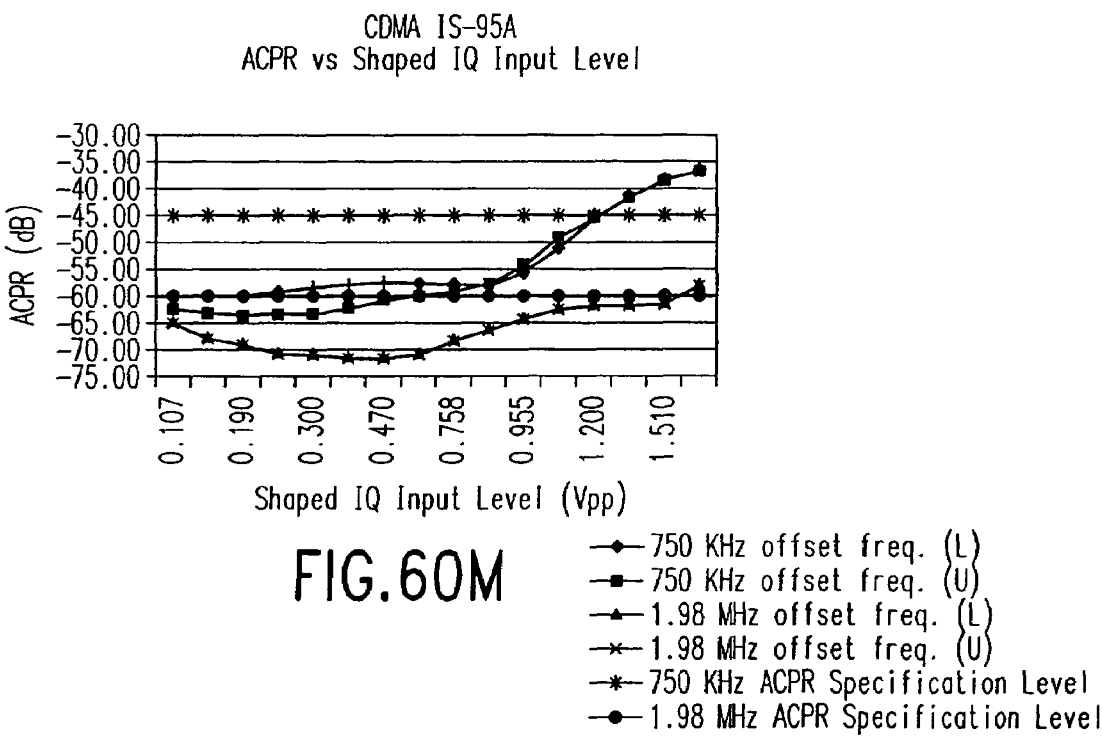

FIG. 60M illustrates ACPR vs. shaped IQ input signal level using base station modulation.

Figure 60N:
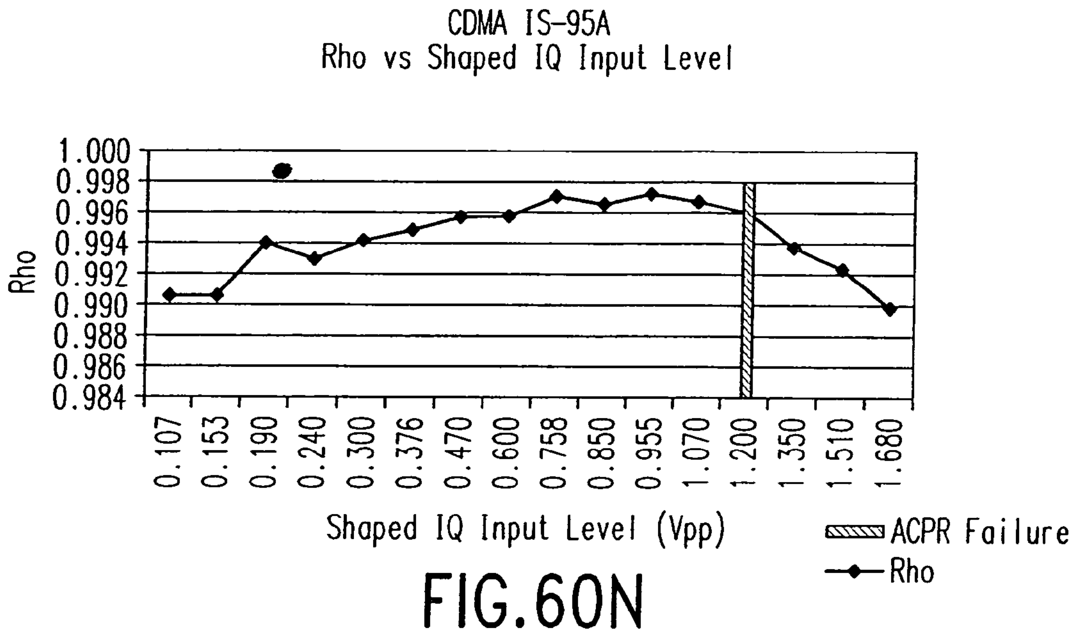
Figure 60O:
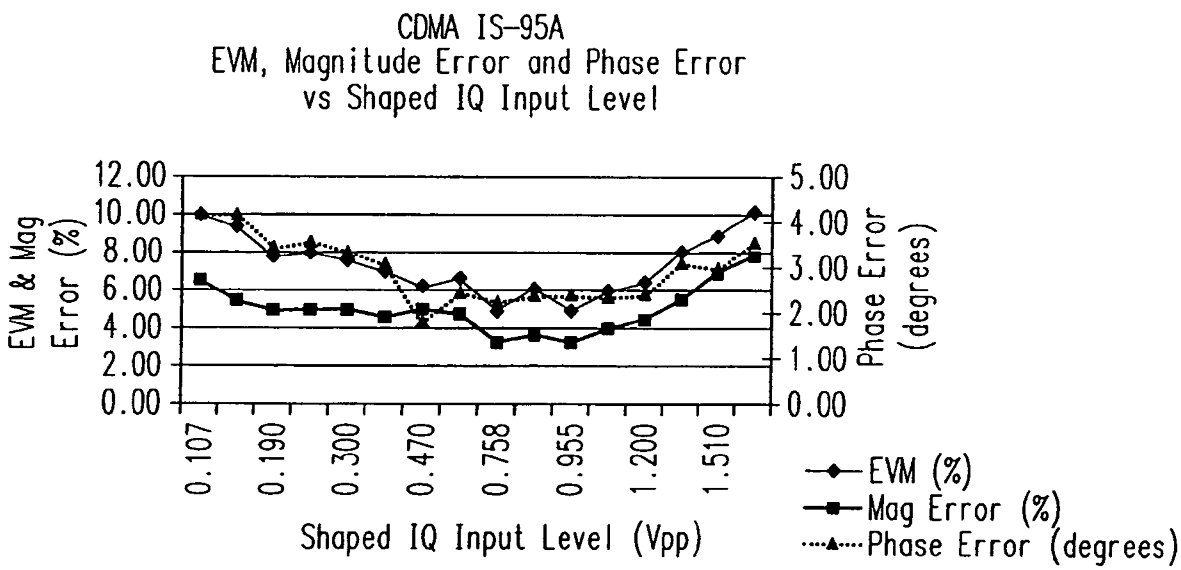

FIG. 60N illustrates Rho vs. shaped IQ input signal level using base station modulation.

FIG. 60O illustrates EVM, magnitude error, and phase error vs. shaped IQ input signal level using base station modulation.

Figure 60P:
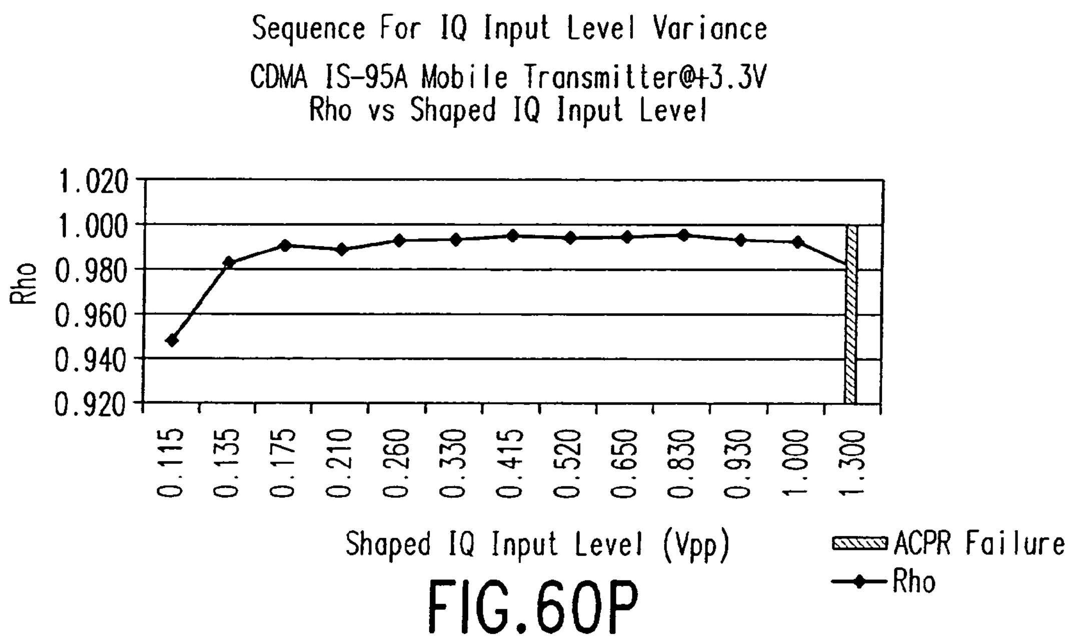

FIG. 60P illustrates Rho vs. shaped IQ input signal level using mobile station modulation.

Figure 60Q:
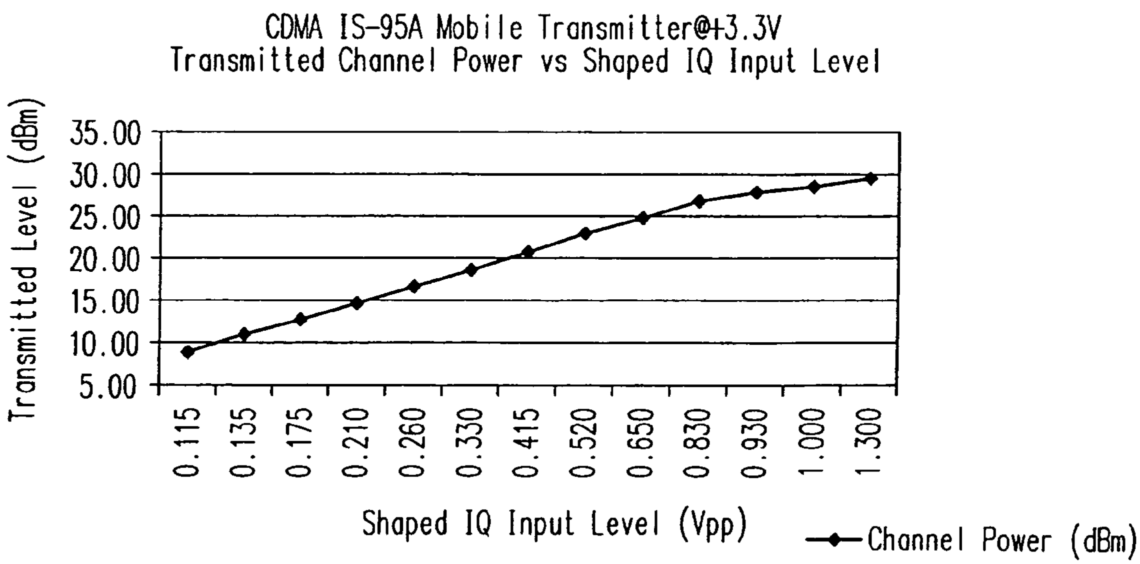

FIG. 60Q illustrates transmitted channel power vs. shaped IQ input signal level using mobile station modulation.

Figure 60R:
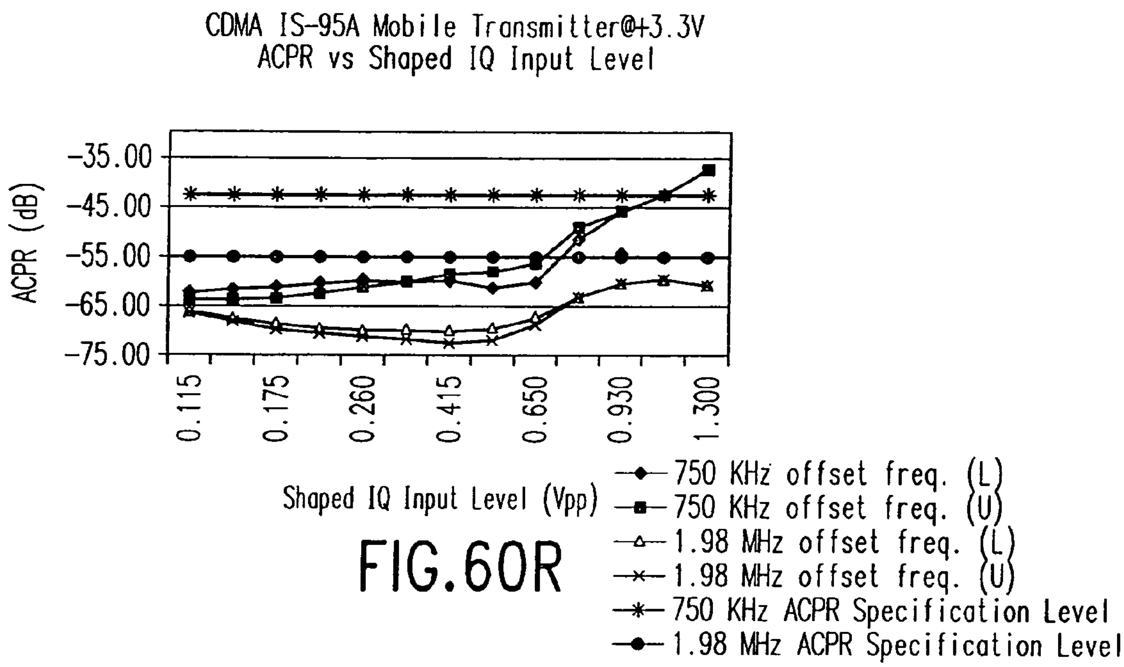

FIG. 60R illustrates ACPR vs. shaped IQ Input signal level using mobile station modulation.

Figure 60S:
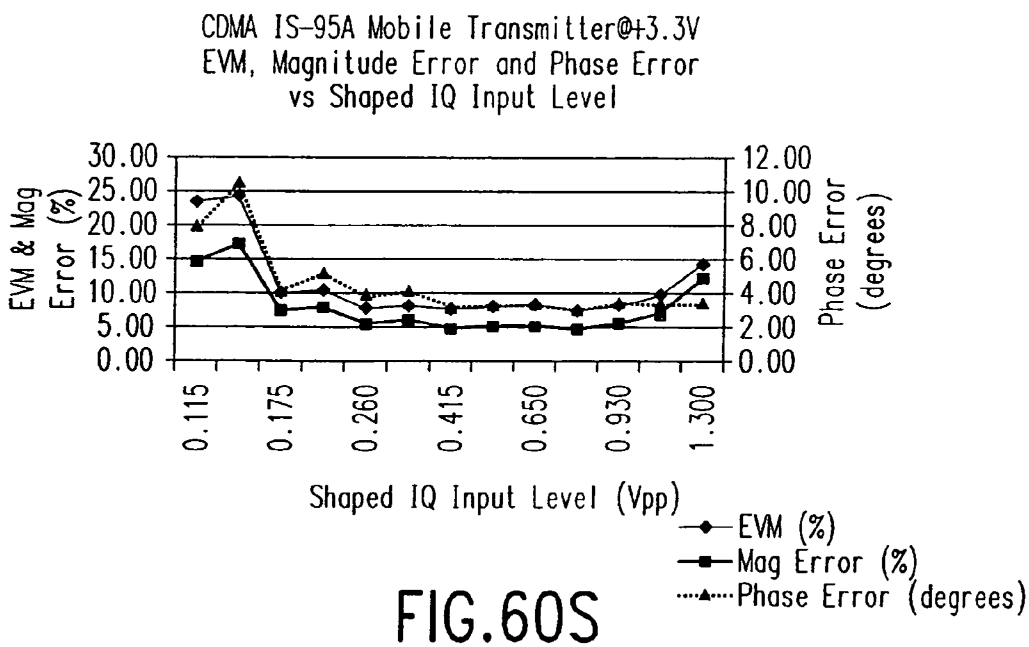

FIG. 60S illustrates EVM, magnitude error, and phase error vs. shaped IQ input level using mobile station modulation.

Figure 60T:
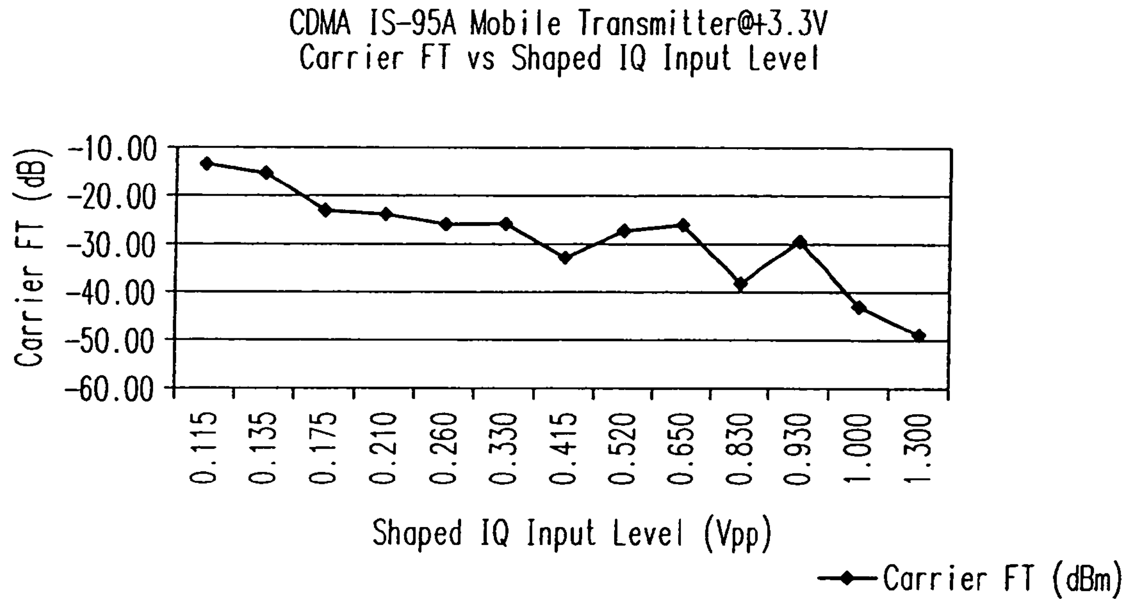

FIG. 60T illustrates carrier feed thru vs. shaped I Q input signal level using mobile station modulation.

Figure 60U:
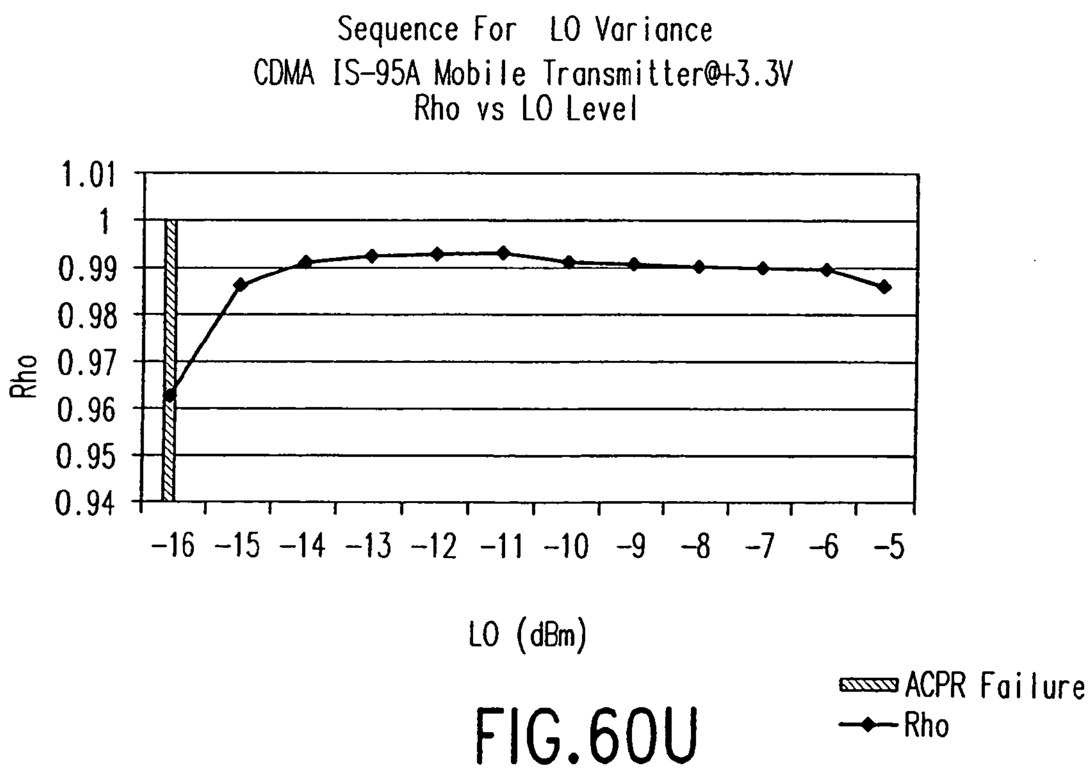

FIG. 60U illustrates Rho vs. LO signal level using mobile station modulation.

Figure 60V:
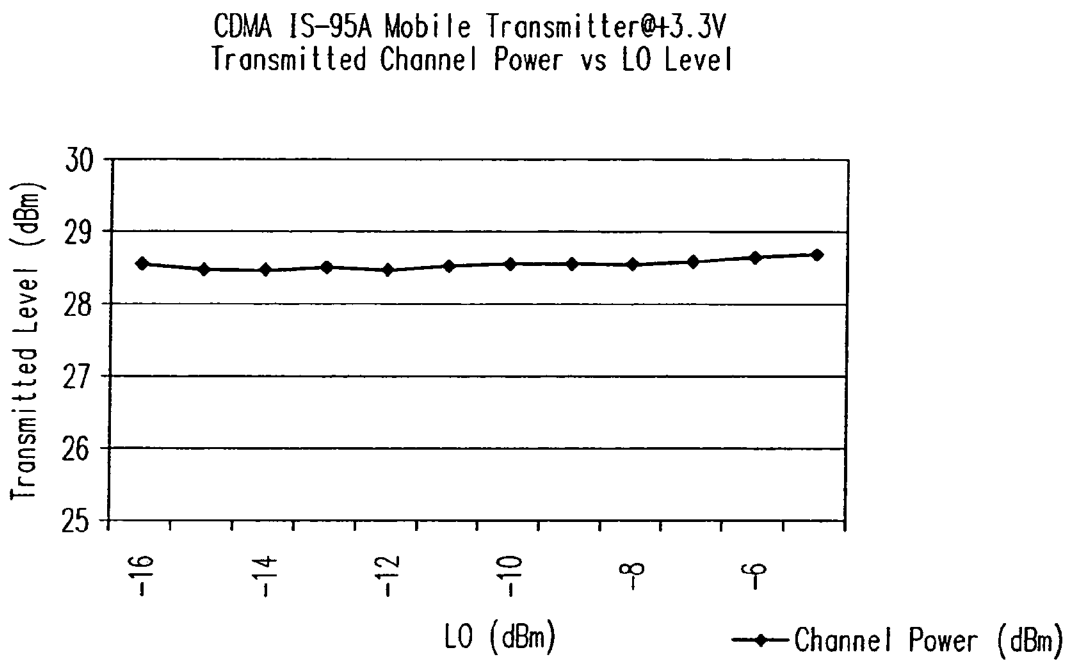

FIG. 60V illustrates transmitted channel power vs. LO signal level using mobile station modulation.

Figure 60W:
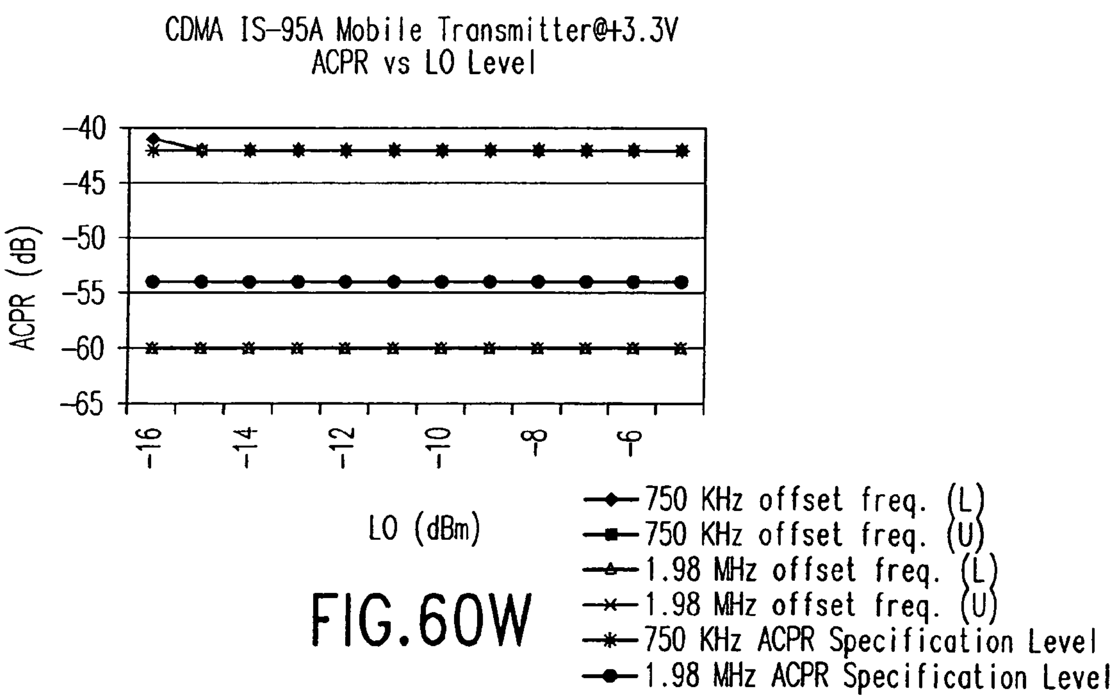

FIG. 60W illustrates ACPR vs. LO signal level using mobile station modulation.

Figure 60X:
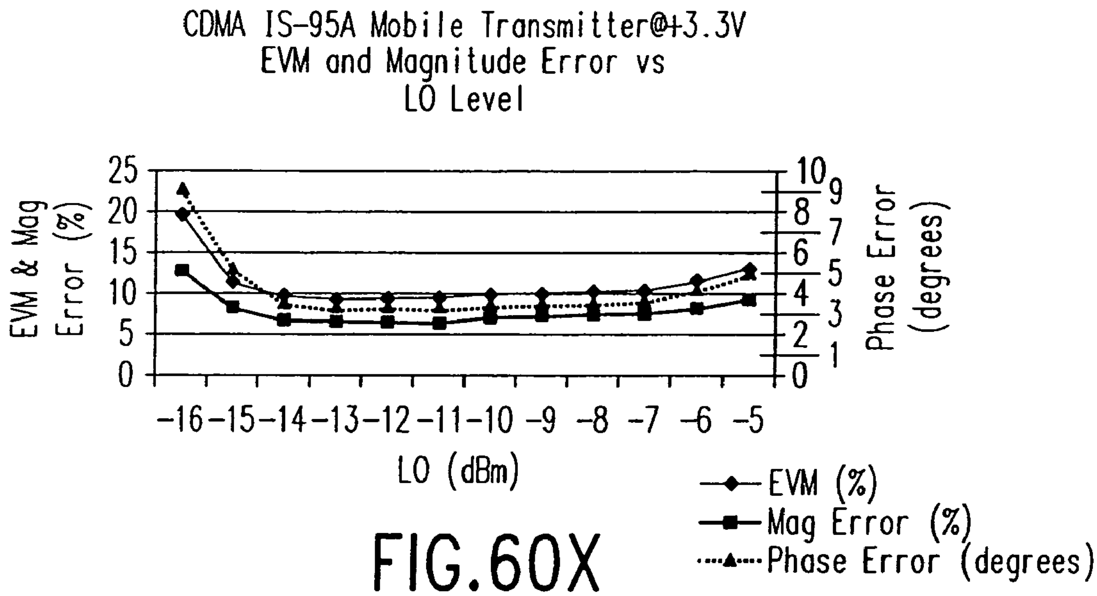

FIG. 60X illustrates EVM and magnitude error vs. LO signal level using mobile station modulation.

Figure 60Y:
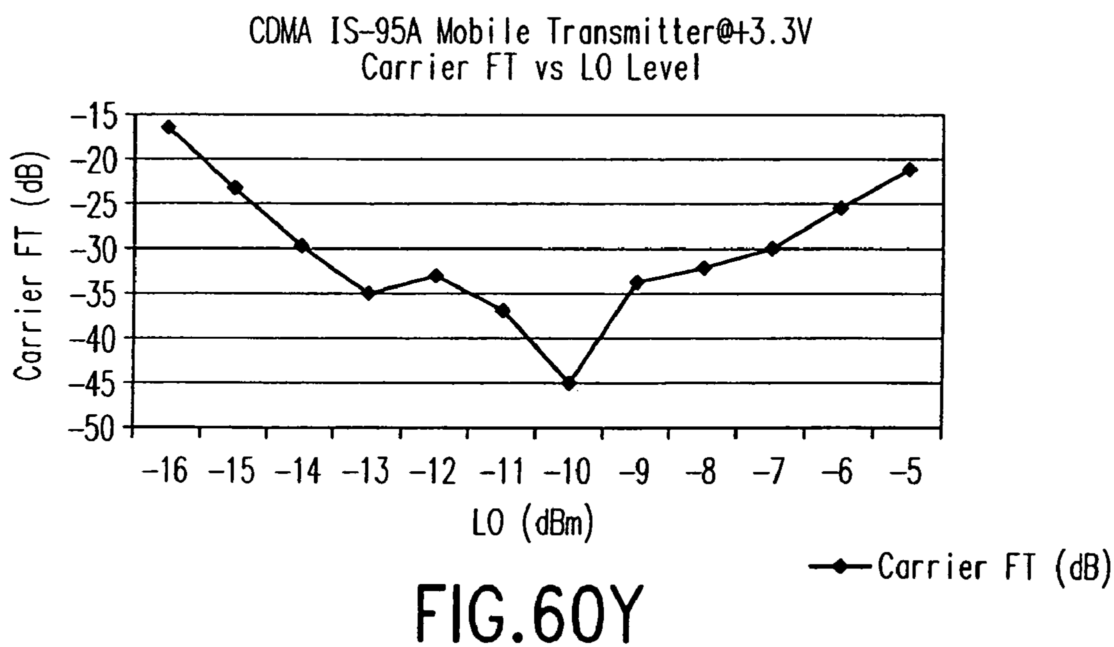

FIG. 60Y illustrates carrier feed thru vs. LO signal level using mobile station modulation.

FIG. 60Z illustrates an approximate power budget for a CDMA modulator based on the modulator 3710.

FIGS. 60B-Z illustrates that the UFT-based complex modulator 3710 comfortably exceeds the IS-95 transmitter performance requirements for both mobile and base station modulation schemes. Power, parts, size, and cost of a CDMA transmitter can all be reduced since the modulator 3710 is a true zero IF architecture.

Testing indicates that Rho as well as carrier feed through and ACPR are not overly sensitive to variations in I/Q levels and LO levels. Estimated power consumption for the modulator 3710 is lower than equivalent two-state superheterodyne architecture. This means that a practical UFT based CDMA transmitter can be implemented in bulk CMOS and efficiently produced in volume.

The UFT architecture achieves the highest linearity per milliwatt of power consumed of any radio technology of which the inventors are aware. This efficiency comes without a performance penalty, and due to the inherent linearity of the UFT technology, several important performance parameters may actually be improved when compared to traditional transmitter techniques.

Since the UFT technology can be implemented in standard CMOS, new system partitioning options are available that have not existed before. As an example, since the entire UFT-based modulator can be implemented in CMOS, it is plausible that the modulator and other transmitter functions can be integrated with the digital baseband processor, leaving only a few external components such as the final bandpass filter and the power amplifier. In addition to the UFT delivering the required linearity and dynamic range performance, the technology also has a high level of immunity to digital noise that would be found on the same substrate when integrated with other digital circuitry. This is a significant step towards enabling a complete wireless system-on-chip solution.

8.0 Integrated Frequency Translation and Spreading/De-Spreading of a Spread Spectrum Signal The previous section focused on up-converting a spread spectrum signal directly from baseband-to-RF, without preforming any IF processing. In other words, the baseband signal was already spread prior to up-conversion. The following discussion focuses on embodiments for performing the spreading function and the frequency translation function in a simultaneous and integrated manner. This includes simultaneous down-conversion and de-spreading of an RF spread spectrum signal, and also simultaneous up-conversion and spreading of a baseband signal.

8.1 Integrated Down-Conversion and De-Spreading of a Spread Spectrum Signal

The present invention is directed to systems and methods of down-conversion and de-spreading of a spread spectrum signal, and applications of the same. One type of spread spectrum system is Code Division Multiple Access (CDMA). The present invention can be implemented in CDMA, and other spread spectrum systems as will be understood by those skilled in the arts based on the teachings herein.

In particular, the present invention includes a unified down-converting and de-spreading (UDD) module that preforms down-conversion and de-spreading of a spread spectrum signal in a unified (i.e. integrated) manner to generate a down-conversion/de-spread baseband signal. In one embodiment, the present invention can be operated to improve energy transfer to the de-spread baseband signal, resulting in overall savings in power consumption and component count. Additional advantages of the present invention when compared to conventional spread spectrum systems include: (1) reduction (or elimination) of RF (front-end) gain prior to de-spreading without sacrificing signal sensitivity specifications; (2) the elimination of the IF circuitry; (3) the simplification of the de-spreading circuitry; and (4) lower power consumption that results from advantages (1)-(3). Further benefits are realized throughout the entire system by the ability to implement a lower clock speed for many baseband components including the analog-to-digital converter (A/D) and the digital signal processor (DSP). Furthermore, isolation and shielding requirements are reduced (or eliminated) because multiple local oscillators and gain stages are eliminated.

The present invention can be implemented in a CMOS Integrated Circuit (IC) architecture that is compatible with IS-95. The wideband capability of the CMOS IC coupled with a single low frequency, low power clock, allows for single or multi-band operation making it an excellent solution for spread spectrum applications using 900 MHZ, 1.9 Ghz, and/or 2.5 Ghz operation, for example.

Figure 24K:
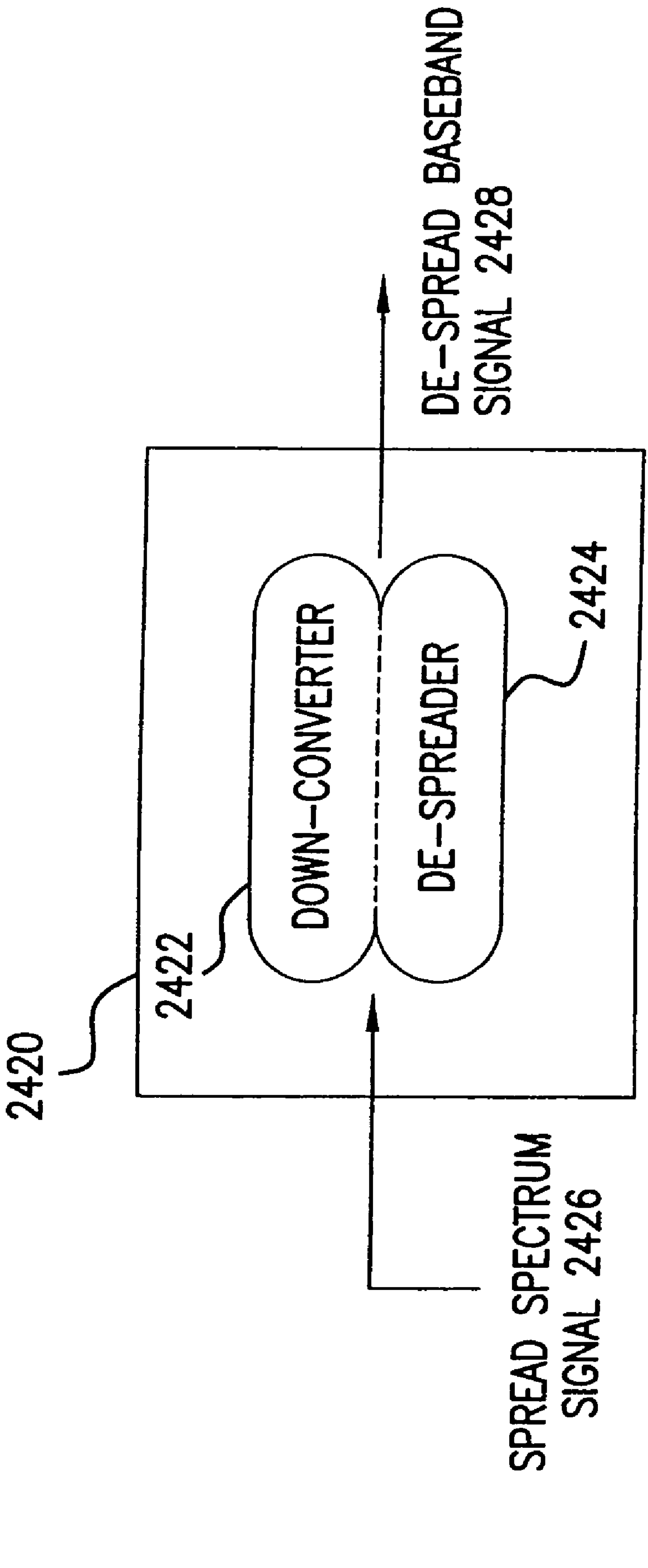
FIG. 24K illustrates an example block diagram of a unified down-conversion and de-spreading (UDD) module according to embodiments of the present invention.

FIG. 24K is a conceptual block diagram of a UDD module 2420 according to embodiments of the present invention. Conceptually, the UDD module 2420 includes a down-converter 2422 and de-spreader 2424 that operate in an integrated manner so that spread spectrum signal 2426 is simultaneously down-converted and de-spread, resulting in a de-spread baseband signal 2428.

Figure 25A:
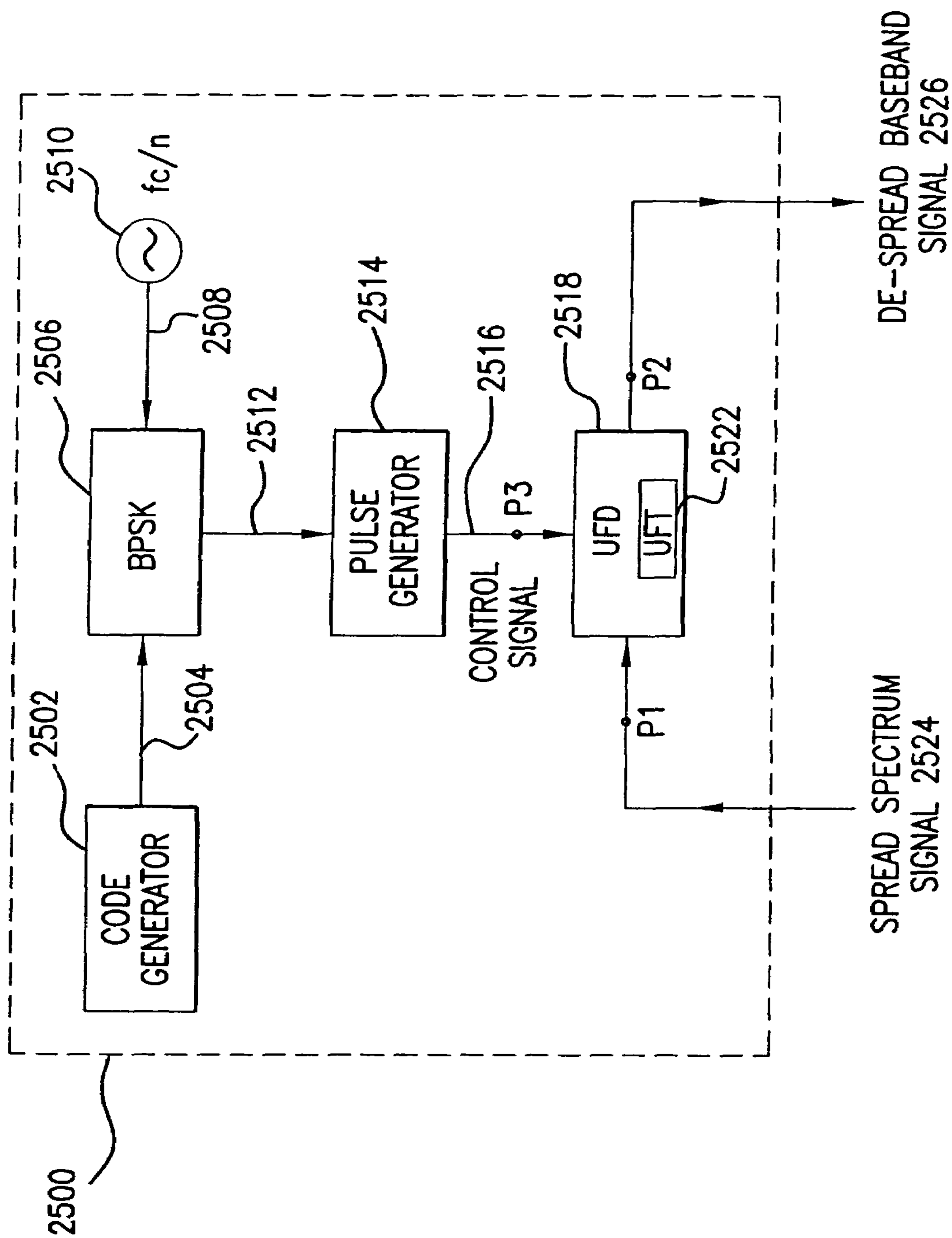
FIG. 25A illustrates a UDD module for down-converting and de-spreading a spread spectrum signal in an integrated manner according to embodiments of the present invention.

FIG. 25A illustrates a down-conversion and de-spreading (UDD) module 2500 according to an embodiment of the present invention. UDD module 2500 includes: code generator 2502; Binary Phase Shift Keying (BPSK) modulator 2506; oscillator 2510; pulse generator 2514; and universal frequency down-conversion (UFD) module 2518, where UFD module 2518 includes UFT module 2522. UDD module 2500 down-converts and de-spreads spread spectrum signal 2524 in a unified manner, resulting in a de-spread baseband signal 2526.

The UDD module 2500 will be described using flowchart 2540 in FIG. 25C, and the signal diagrams shown in FIGS. 26A-F. The signal diagrams shown in FIGS. 26A-F are meant for example purposes only and are not meant to limit the invention in any way. Furthermore, the sequence of steps in flowchart 2540 are not meant to limit the invention in any way, as those skilled in the art will recognize that some steps can be done simultaneously, and in a different order. UDD module 2500 operates as follows.

Figure 26A:
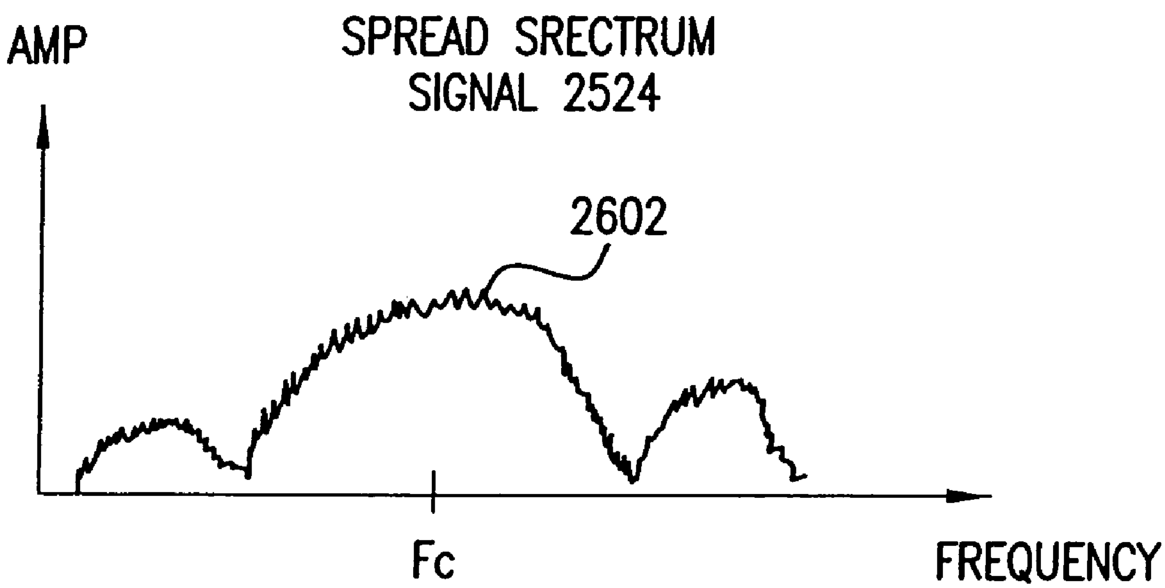

In step 2542, UDD module 2500 accepts spread spectrum signal 2524. In embodiments, the spread spectrum signal 2524 is received over a communications medium, and carries baseband information to be processed. FIG. 26A illustrates an example spread spectrum signal 2602, which is an example of spread spectrum signal 2524. Spread spectrum signal 2602 has an approximate center frequency of $f_C$, as illustrated.

In step 2544, oscillator 2510 generates an oscillating signal 2508 with a frequency approximately equal to $f_C/n$; where, $f_C$ is the approximate center frequency of the spread spectrum signal 2524, and n represents a harmonic or subharmonic (n=0.5, 1, 2, 3 . . . ) of the input spread spectrum signal 2524. FIG. 26B illustrates an oscillating signal 2604, which is an example of oscillating signal 2508. Oscillating signal 2604 has a characteristic frequency $f_C$, where $f_C$ is the approximate center frequency of the spread spectrum signal 2602 as shown in FIG. 26A. For n>1, n represents a sub-harmonic of the approximate center frequency of spread spectrum signal 2602. In other words, for n>1, example oscillating signal 2604 is a sub-harmonic of the example spread spectrum input signal 2602.

In step 2546, the code generator 2502 generates a spreading code 2504. The spreading code 2504 can be any type spreading code including but not limited to: a PN code, a Walsh code, and a Gold code. Preferably, the spreading code corresponds to that carried by the spread spectrum signal 2524 so that the spread signal 2524 can be properly de-spread. Additionally, the "chip" rate of the spreading code 2504 is preferably substantially less than the characteristic frequency of the oscillating signal 3508. Alternatively, the chip rate is higher than the frequency of the oscillating signal 2508. For illustration and not limitation, FIG. 26C illustrates as a spreading code 2606, which is an example of a portion of the spreading code 2504. (For ease of illustration, FIG. 26C does not completely reflect relative frequency difference between spreading code 2606 and oscillating signal 2604.)

In step 2548, BPSK modulator 2506 modulates oscillating signal 2508 with the spreading code 2504 to generate spread oscillating signal 2512. Therefore, spread oscillating signal 2512 carries the spreading code 2504. BPSK modulators are well known and available from multiple sources. Furthermore, other modulation schemes could be used to practice the present invention in a spread spectrum environment, as will be understood by those skilled in the relevant arts based on the teachings given herein. In other words, other modulation schemes could be used to modulate the oscillating signal with the spreading code. These other modulation schemes are within the scope and spirit of the present invention.

FIG. 26D illustrates a spread oscillating signal 2608, which is an example of the spread oscillating signal 2512. Spread oscillating signal 2608 depicts the BPSK modulation of the oscillating signal 2604 by the spreading code 2606, where a phase change occurs in the spread oscillating signal 2608 to correspond with the transitions in the example spreading code 2606.

In step 2550, pulse generator 2514 generates a control signal 2516 using the spread oscillating signal 2512. Control signal 2516 comprises a plurality of pulses that carry the spreading code 2504, and will be used by the UFD module 2518 to control the UFT module 2522. The control signal 2516 has a frequency (or aliasing rate) determined by that of oscillating signal 2508, and is a harmonic or sub-harmonic of the input spread spectrum signal as stated above. In one embodiment, the control signal 2516 comprises a plurality of pulses having non-negligible apertures that are established to improve energy transfer to the de-spread baseband signal 2526. In an alternate embodiment, the pulse apertures are negligible. The pulse generator 2514 will be described in further detail in a following discussion.

FIG. 26E illustrates a control signal 2610, which is an example of control signal 2516. Control signal 2610 includes a plurality of pulses with a frequency determined by the example oscillating signal 2604. As illustrated, the pulses trigger on the rising edge of the example spread oscillating signal 2608. (However, a falling edge pulse generator could also be used.) The effect of the spreading code modulation on the control signal 2610 is to phase shift the pulses 2610 according to the spreading code 2606, as represented by the pulses 2616*a*, 2616*b*, and 2616*c*. In other words, transitions in the spreading code 2606, cause the pulse generator 2514 to trigger earlier (or later) in time than it normally would without the spreading code, and therefore cause a phase shift in the example control signal 2610. Alternatively, the effect of the spreading code transitions on the control signal is to increase the pulse width of the pulses in the control signal, as illustrated by pulses 2620*a-c* in FIG. 26F.

Still referring to FIG. 26E, the pulses in example control signal 2610 have non-negligible apertures that are established to improve energy transfer to the de-spread baseband signal 2526, as represented by the pulse width (also called an aperture) 2614. In embodiments, the aperture 2614 is fraction of a period associated with the input signal 2524. For example, in embodiments, the aperture 2614 is ½ of a period associated with the approximate center frequency $f_C$ of the input signal 2602. In an alternate embodiment, the aperture 2614 is negligible.

In step 2552, UFD module 2518 down-converts and de-spreads the spread spectrum signal 2524 by controlling UFT module 2522 with the control signal 2516, to generate de-spread baseband signal 2526. The down-conversion of an input signal using a UFD module and a control signal (also called an aliasing signal) was described earlier in the "frequency down-conversion" section of the application, and is described in co-pending U.S. patent application entitled "Method and System for Down-Converting Electromagnetic Signals," Serial Number, Ser. No. 09/176,022. UFD module 2518 de-spreads, as well as down-converts the input spread spectrum signal 2524, because the control signal 2516 includes the appropriate spreading code information for effective de-spreading.

Figure 25B:
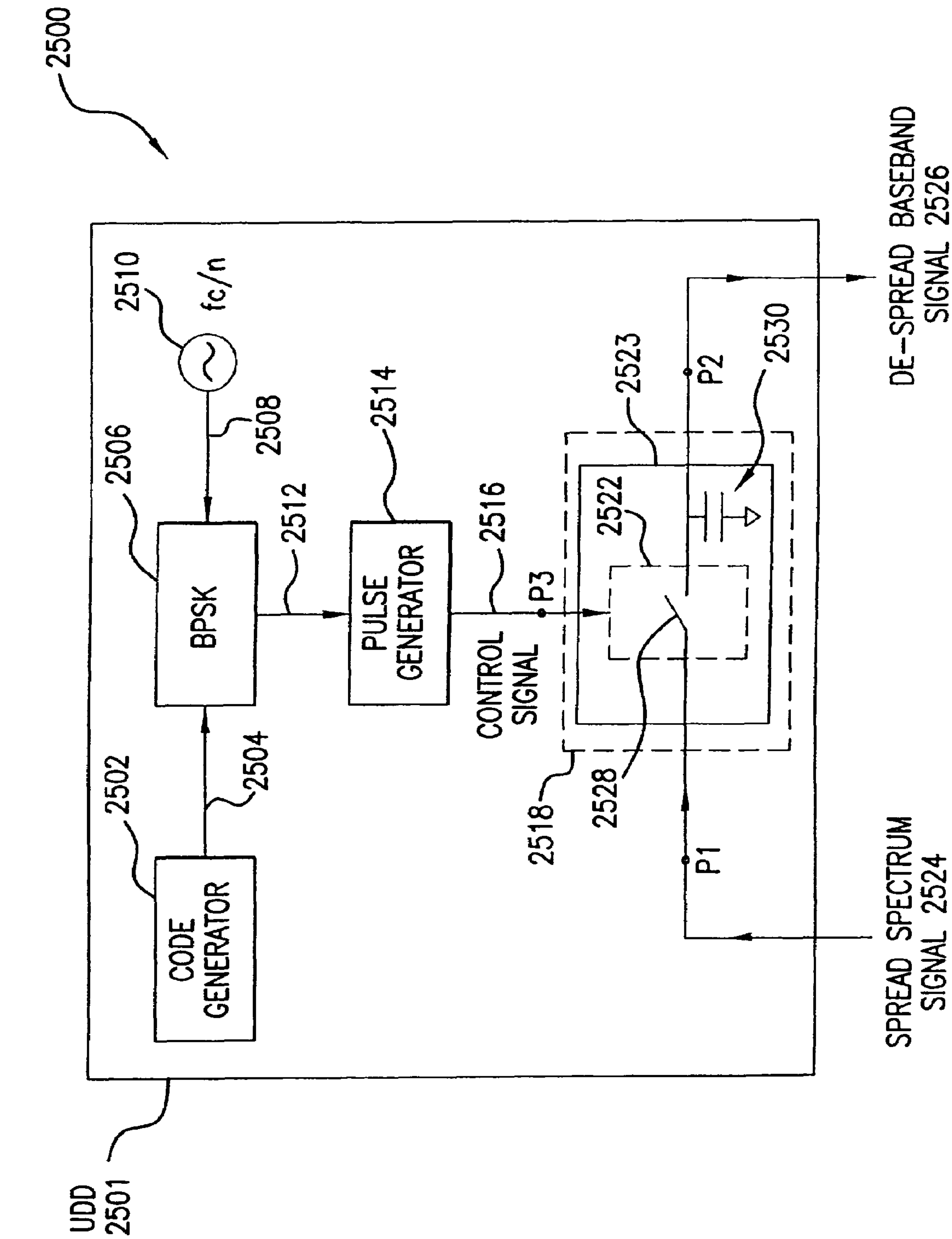
FIG. 25B illustrates a UDD module using a controlled switch and capacitor implementation for the UFT module according to embodiments of the present invention.
Figure 25C:
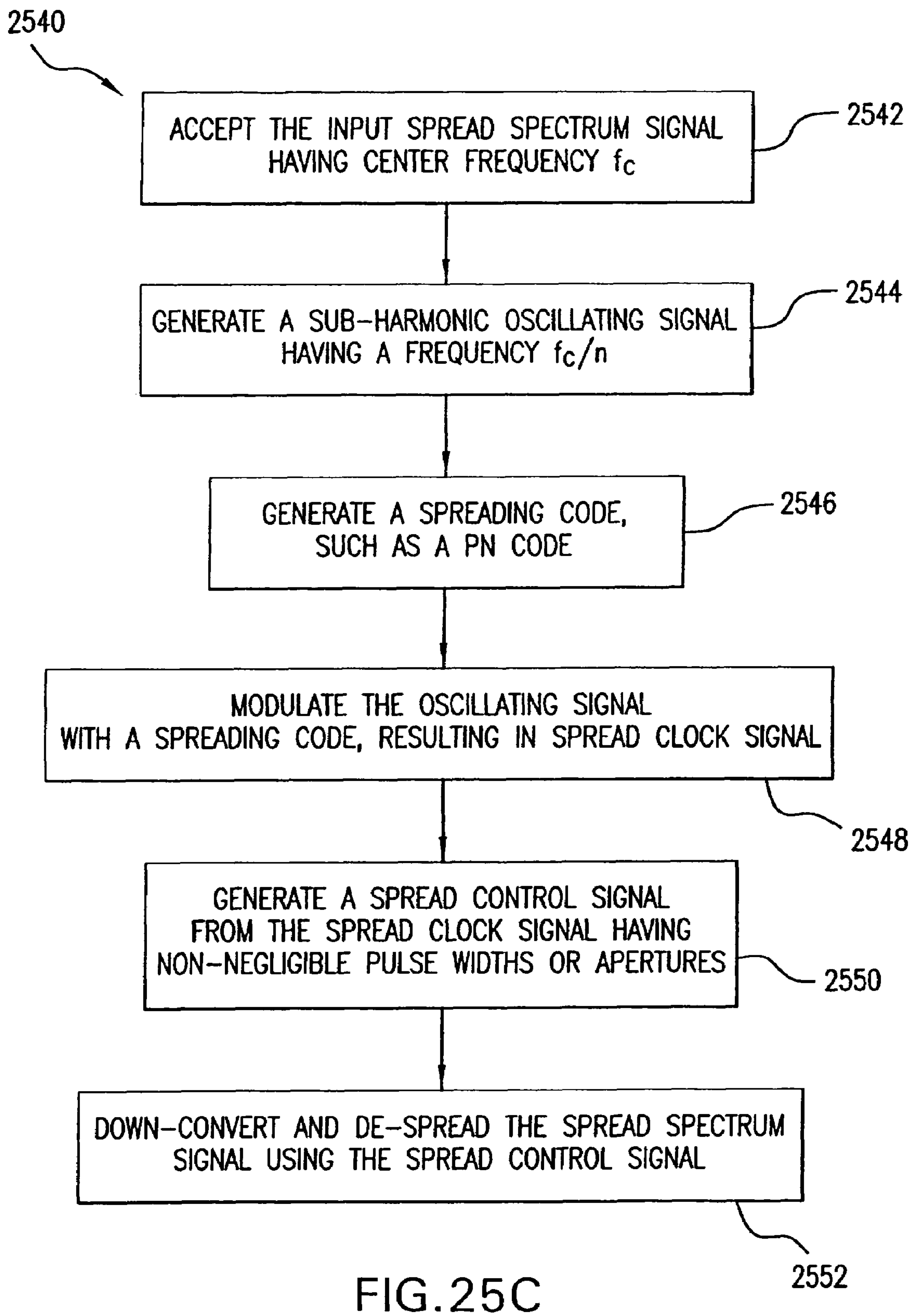
FIG. 25C is a flowchart representing an example operation of the UDD Module of FIG. 25A.

Down-conversion and de-spreading using a UFD module is further illustrated in FIG. 25B, using UDD module 2501. UDD module 2501 is one embodiment of UDD module 2500, where the UFD module 2518 includes an aliasing module 2523. Aliasing module 2523 preferably includes UFT module 2522 and capacitor 2530. UFT module 2522 preferably includes a switch 2528 that is controlled by control signal 2516. The down-conversion of an input signal using an aliasing module that utilizes a controlled switch and a storage element (i.e. a capacitor) was described earlier in the "frequency down-conversion" section of this application, and is described in co-pending U.S. patent application entitled "Method and System for Down-Converting Electromagnetic Signals," Serial Number, Ser. No. 09/176,022, a summary of which follows.

As described in application Ser. No. 09/176,022, an aliasing module down-converts an input signal by undersampling the input signal at an aliasing rate of the control signal, where the charge transferred from the input signal is referred to as an undersample. The undersamples that result are stored in a storage element (such as a capacitor), and successive undersamples form a down-converted output signal. The aliasing rate of the control signal defines the frequency of the pulses in the control signal, and ultimately determines the sampling rate of the input signal. In embodiments of the invention, the aliasing rate is substantially equal to the frequency of the input signal, or substantially equal to a harmonic or subharmonic of the input signal. By operating at a sub-harmonic of the input signal, RF shielding requirements between the control signal and the input signal are reduced, as will be understood by those skilled the arts.

Figure 25D:
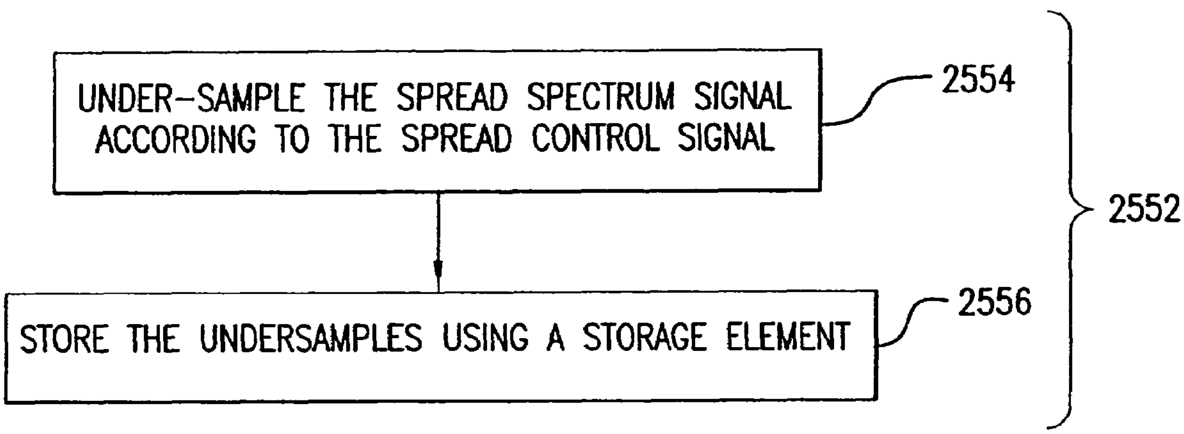
FIG. 25D is a flowchart illustrating an example operation of a portion of the flowchart illustrated in FIG. 25C.

Aliasing module 2523 in the UDD module 2501 de-spreads, as well as, down-converts input spread spectrum signal 2524 because the control signal 2516 (that controls switch 2528) has been modulated with the necessary spreading code to de-spread the spread spectrum signal 2524. In other words, the spreading code-enabled control signal 2516 controls the switch 2528 such that the spread spectrum signal 2524 is sampled at occurrences of data. As such, step 2552 is illustrated in greater detail by steps 2554 and 2556 of FIG. 25D. In step 2554, the switch 2528 undersamples the spread spectrum input signal 2524 using the spreading-code enabled control signal 2516. In step 2556, a storage element (capacitor 2530) stores the resulting undersamples, where successive undersamples form de-spread baseband signal 2526. Therefore, the aliasing module 2523 de-spreads and down-converts an input spread spectrum signal in a simultaneous and unified manner.

In an embodiment, the pulses in control signal 2516 have non-negligible apertures that are established to improve energy transfer to the de-spread baseband signal. This occurs because the aperture width (or pulse width) determines how long the switch 2528 is closed during undersampling, which affects the amount of energy transferred from the input spread spectrum signal 2524 to the de-spread baseband signal 2526. In other words, non-negligible amounts of energy are transferred from the spread spectrum signal to the de-spread baseband signal during the undersampling. In one embodiment, the pulse apertures are non-negligible and less than ½ the period associated with the approximate center frequency $f_C$ of the input spread spectrum signal. In a second embodiment, the pulse apertures are between ¼ and ½ the period associated with approximate center frequency $f_C$ of the input spread spectrum signal 2534. The pulse apertures can be any fraction of a period associated with the center frequency $f_C$ of the input baseband signal. In a third embodiment, the pulses in the control signal 2516 are approximately ½ of a period associated with input spread spectrum signal 2524. In a fourth embodiment, the pulses in the control signal 2516 incorporate matched filter concepts that are further described in co-pending U.S. patent application entitled, "Matched Filter Characteristics and Implementations of Universal Frequency Translation Method and Apparatus," Ser. No. 09/521,878, filed Mar. 9, 2000. In other words, the pulses of the control signal 2516 can be shaped according to matched filter concepts in order to improve or maximize energy transfer to the baseband signal, as described in the above mentioned patent application.

Figure 25E:
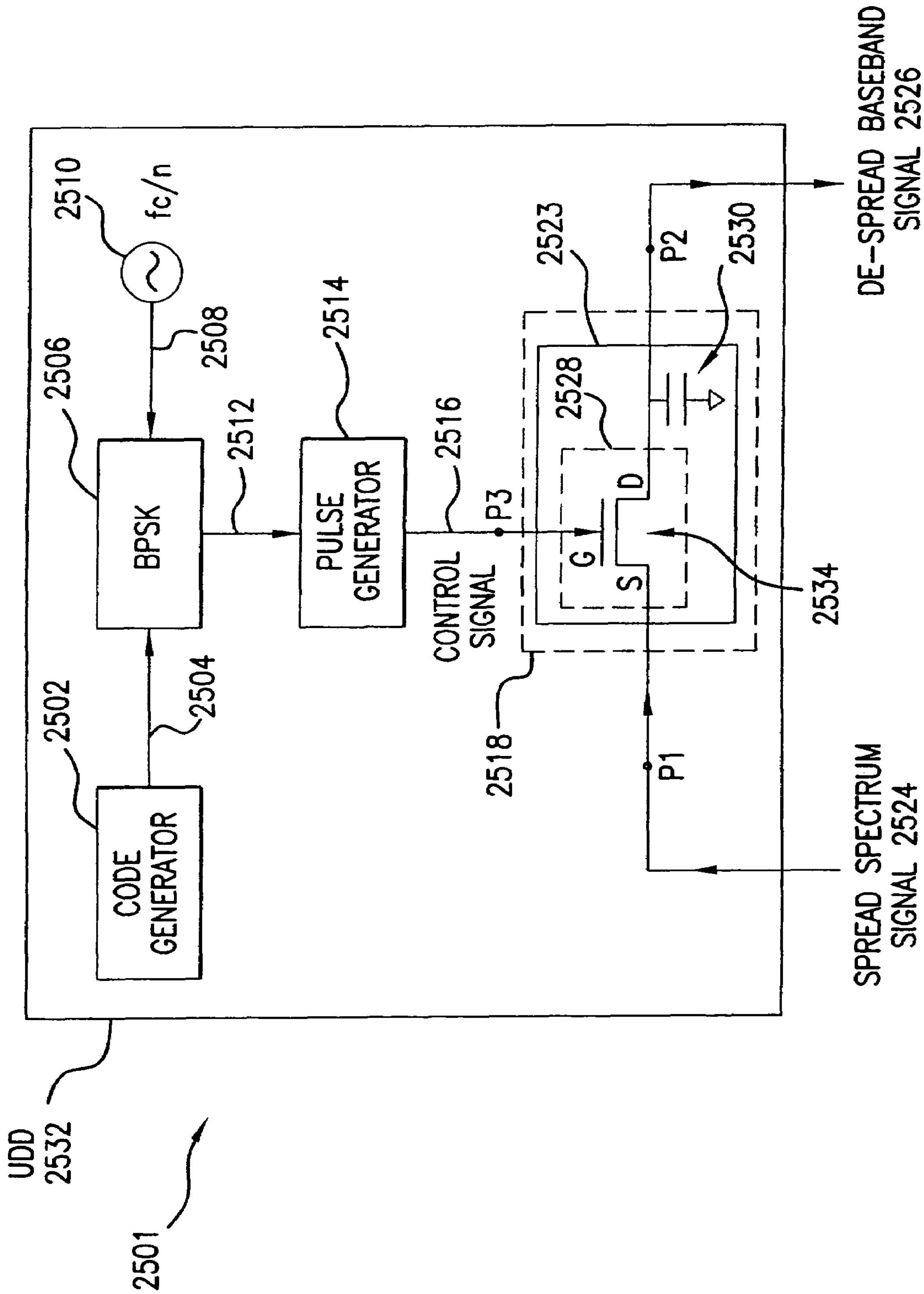
FIG. 25E illustrates a UDD module in a FET configuration according to embodiments of the invention.
Figure 25F:
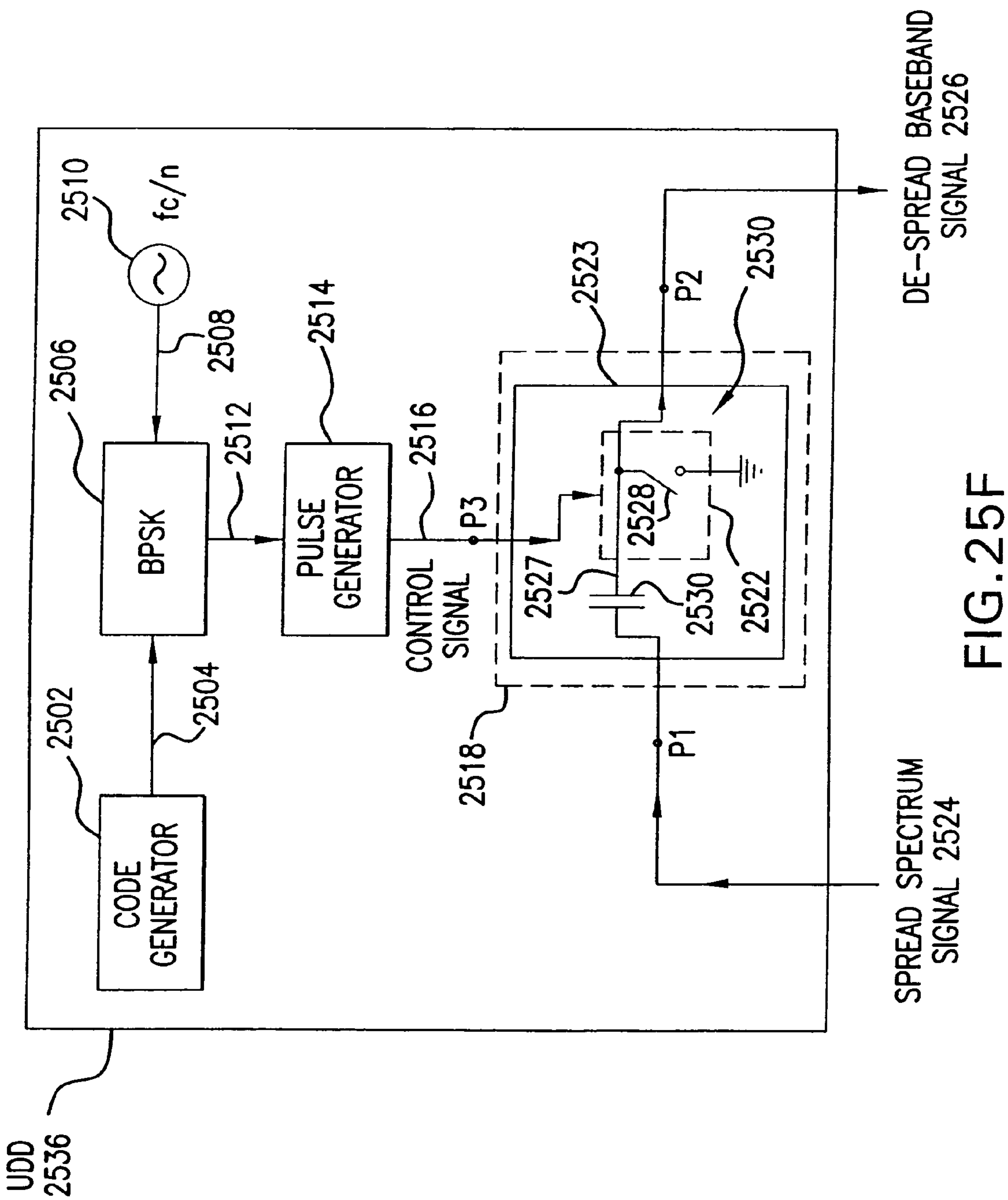
FIG. 25F illustrates a UDD module in a shunt sampling configuration according to embodiments of the present invention.
Figure 25G:
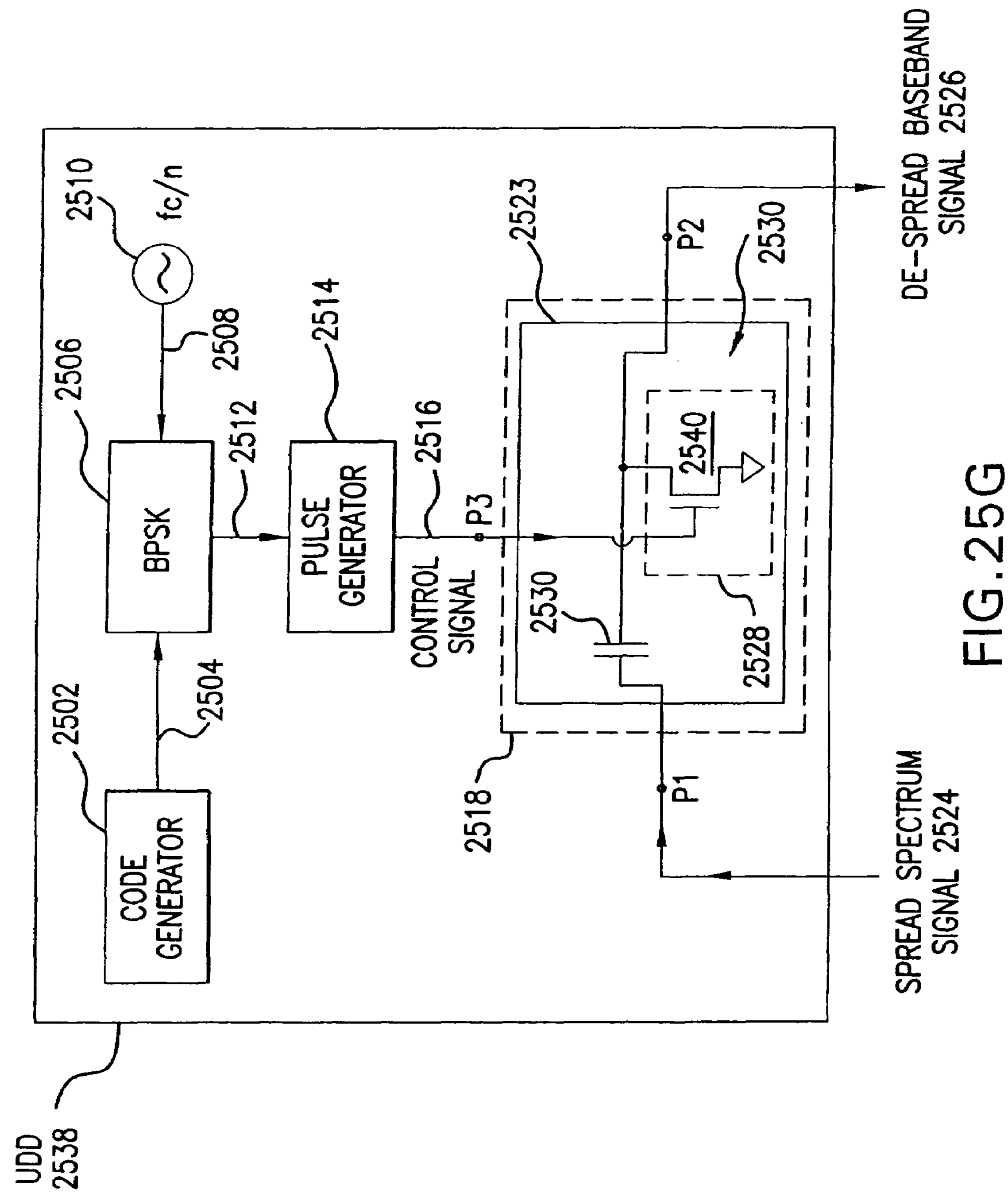
FIG. 25G illustrates a UDD module having a FET sampling module in a shunt sampling according to embodiments of the present invention.
Figure 25H:
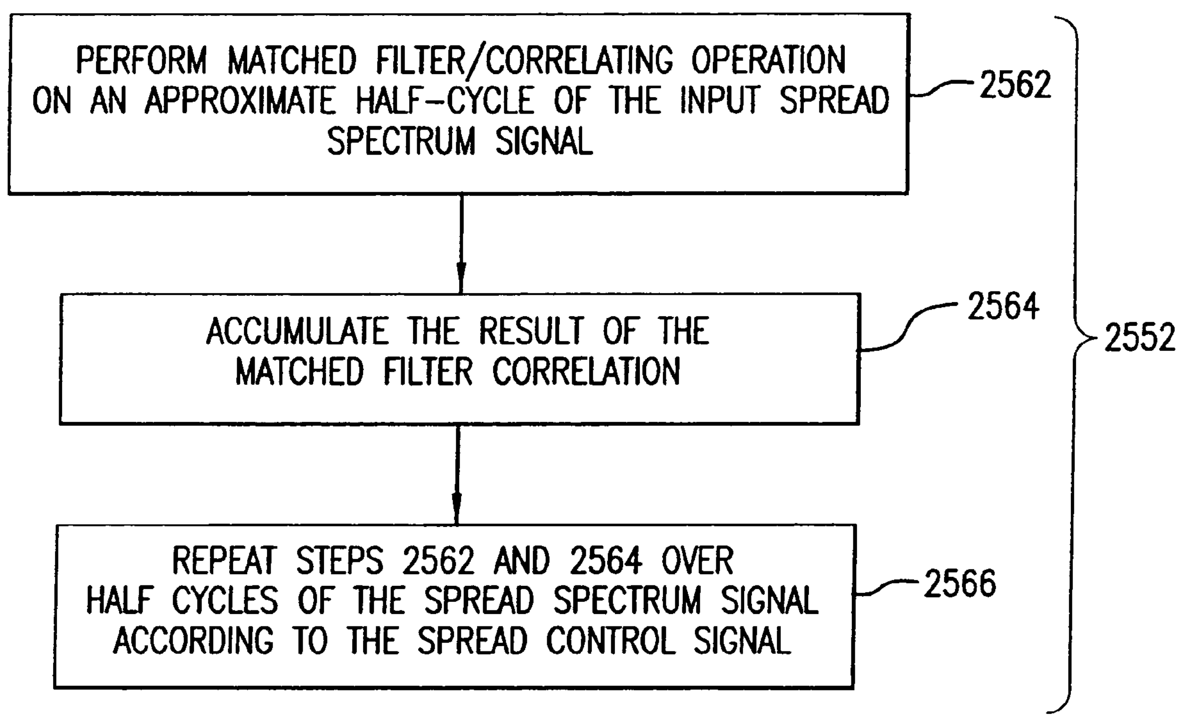
FIG. 25H-J illustrate various matched filter concepts according to embodiments of the invention.

Based on the discussion above regarding energy transfer, step 2552 can be further described by steps 2558-2560 in FIG. 25H. In step 2558, the switch 2558 transfers non-negligible amounts of energy from the received spread spectrum signal, according to the spread control signal. In step 2660, the storage module 2530 integrates the non-negligible amounts of energy over multiple half cycles of the input spread spectrum signal according to the spread control signal, resulting in the de-spread baseband signal. In an embodiment, the energy transfer and storage is done over a half cycles associated with the received spread spectrum signal according to the spread control.

Figure 25I:
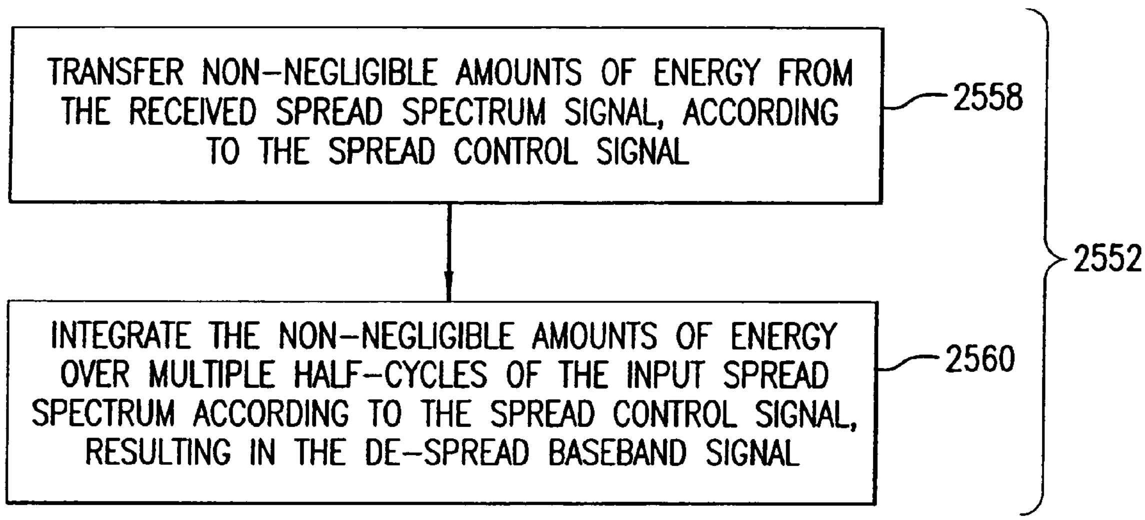

Additionally step 2552 can be described in terms of matched filter concepts as illustrated by steps 2562-2566 in FIG. 25I. In step 2562, the matched filter/correlating operation is performed on an approximate half-cycle of the input spread spectrum signal. In step 2564, the result of the matched filter correlation is accumulated. In steps 2566, steps 2562 and 2564 are repeated over additional half cycles of the input spread spectrum signal.

Figure 25J:
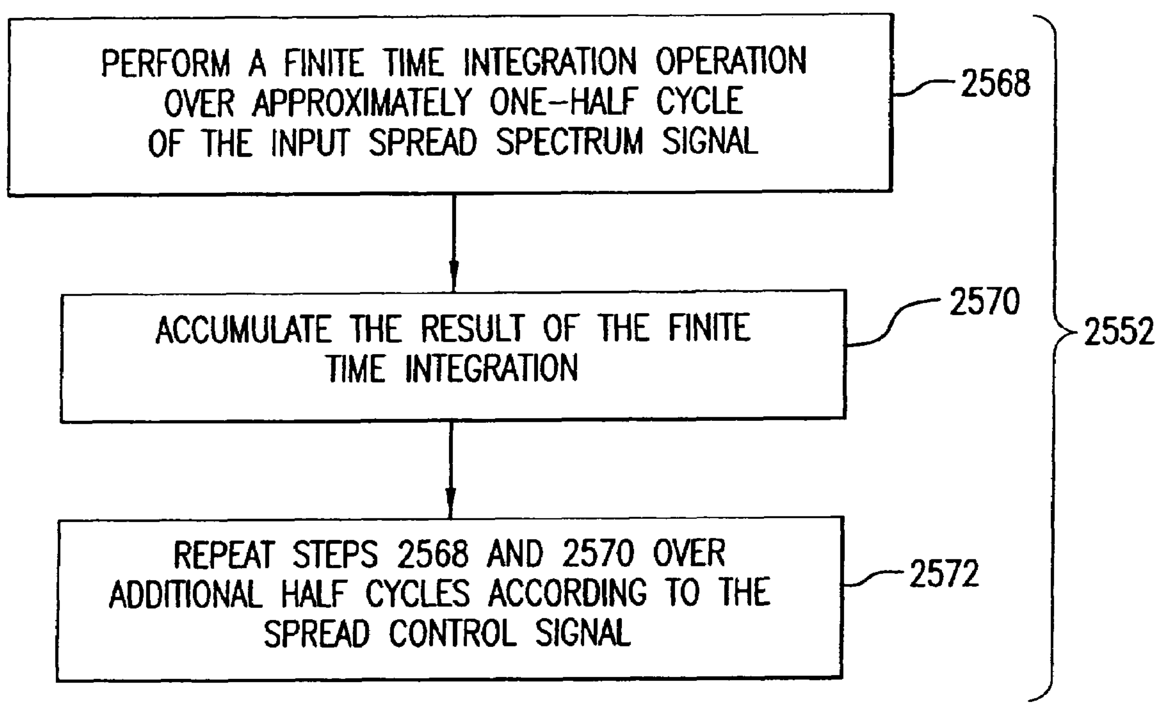

Additionally, step 2552 can be described terms of step 2568-2572 in FIG. 25J. In step 2568, finite time integration operation is performed on the spread spectrum signal on an approximate half-cycle of the spread spectrums signal. In step 2570, the result of step 2568 is accumulated. In step 2572, the steps 2570 and 2572 are repeated over half cycles of the input spread spectrum signal.

The embodiments discussed above in FIG. 25H-J are further described in co-pending U.S. patent application titled, "Matched Filter Characterization and Implementation of Universal Frequency Translation Method and Apparatus," Ser. No. 09/521,878, filed Mar. 9, 2000.

The present invention has multiple advantages over conventional spread spectrum de-spreading schemes. First, de-spreading and down-conversion are done simultaneously in an integrated manner such that front-end mixers that are used in conventional systems are eliminated. Second, the resulting de-spread signal exists at baseband, which eliminates the need for IF circuitry that is used in conventional systems. In other words, the input RF signal is directly down-converted to baseband without any IF processing. Third, the use of a control signal with non-negligible apertures improves the energy transfer to the de-spread baseband signal, which reduces or eliminates the need for any front-end RF amplification. Preferably, the apertures are approximately ½ a period associated with the input spread spectrum signal. Fourth, the control signal may be operated at a frequency that is a sub-harmonic of the spread spectrum signal, reducing RF shielding requirements between the control signal and the input spread spectrum signal. Finally, the component count and power requirements are reduced when compared with conventional systems because the advantages listed above, which will lead to longer battery life in portable spread spectrum devices.

De-spread baseband signal 2526 may be a modulated signal or an unmodulated signal. If it is a modulated signal, then preferably it is de-modulated to recover the useful voice/data that is carried, as will be understood by those skilled in the relevant arts. For example, in embodiments, a transmitter modulates user voice/data using QPSK, and then spreads the QPSK data signal using BPSK modulation. In this case, the de-spread baseband signal is preferably QPSK de-modulated to recover useful voice/data after it is de-spread, as will be understood by those skilled in the arts. The present invention can used with any number of modulation layers, and any type of modulation, including but not limited to AM, ASK, FM, FSK, PM, PSK, BPSK, QPSK, QAM, etc.

Pulse generator 2514 will now be described in more detail. (Pulse generators may also be referred to as aperture generators, or pulse shapers) As discussed earlier, pulse generator 2514 receives spread oscillating signal 2512 and generates a control signal 2516 having a plurality of pulses that operate the switch in the UFD module 2518.

FIG. 73A-E illustrate example embodiments and signal diagrams for the pulse generator 2514. FIG. 73A illustrates a pulse generator 7302. The pulse generator 7302 generates pulses 7308 having a pulse width $T_A$ from an input signal 7304. Example input signal 7304 and pulses 7308 are depicted in FIGS. 73B and 73C, respectively. The input signal 7304 can be any type of periodic signal, including, but not limited to, a sinusoid, a square wave, a saw-tooth wave etc. The pulse width (or aperture) $T_A$ of the pulses 7308 is determined by the delay of the inverter 7306. The pulse generator 7302 also includes an optional inverter 7310, which is optionally added for polarity considerations as understood by those skilled in the arts. The example logic and implementation shown for the pulse generator 7302 is provided for illustrative purposes only, and is not limiting. The actual logic employed can take many forms. Additional examples of pulse generation logic are shown in FIGS. 73D and 73E. FIG. 73D illustrates a rising edge pulse generator 7312 that triggers on the rising edge of input signal 7304. FIG. 73E illustrates a falling edge pulse generator 7316 that triggers on the falling edge of the input signal 7304.

FIG. 25E illustrates a UDD module 2532, which is an example embodiment of the UDD module 2501 (FIG. 25B), where the controlled switch 2528 in the UFT module is a field effect transistor (FET). More specifically, the controlled switch 2528 is embodied as a FET 2534. The FET 2534 is oriented so that the gate is controlled by the control signal 2516, and thereby the control signal 2516 controls the FET conductance. The spread spectrum signal 2524 is received at the source of the FET 2534 and is sampled according to the spread control signal 2516, to produce the de-spread baseband signal 2526 at the drain of the FET 2534. The source and drain orientation that is illustrated is not limiting, as the source and drains can be switched for most FETs. In other words, the spread spectrum signal 2524 can be received at the drain of the FET 2534, and the de-spread baseband signal 2526 can be taken from the source of the FET 2534, as will be understood by those skilled in the relevant arts.

FIG. 25F illustrates an UDD module 2536, which is another example embodiment of the UDD module 2500. In UDD module 2536, the order of the controlled switch 2528 and the capacitor 2530 is reversed when compared to UDD module 2501. As, shown the controlled switch 2528 is in shunt configuration, and periodically shunts the signal 2527 to ground according to the control signal 2516. FIG. 25G illustrates the FET configuration of the UDD module 2536, where the controlled switch 2528 is configured as a FET 2540.

8.2 Integrated Down-conversion and De-spreading of an IQ Spread Spectrum Signal

Figure 27:
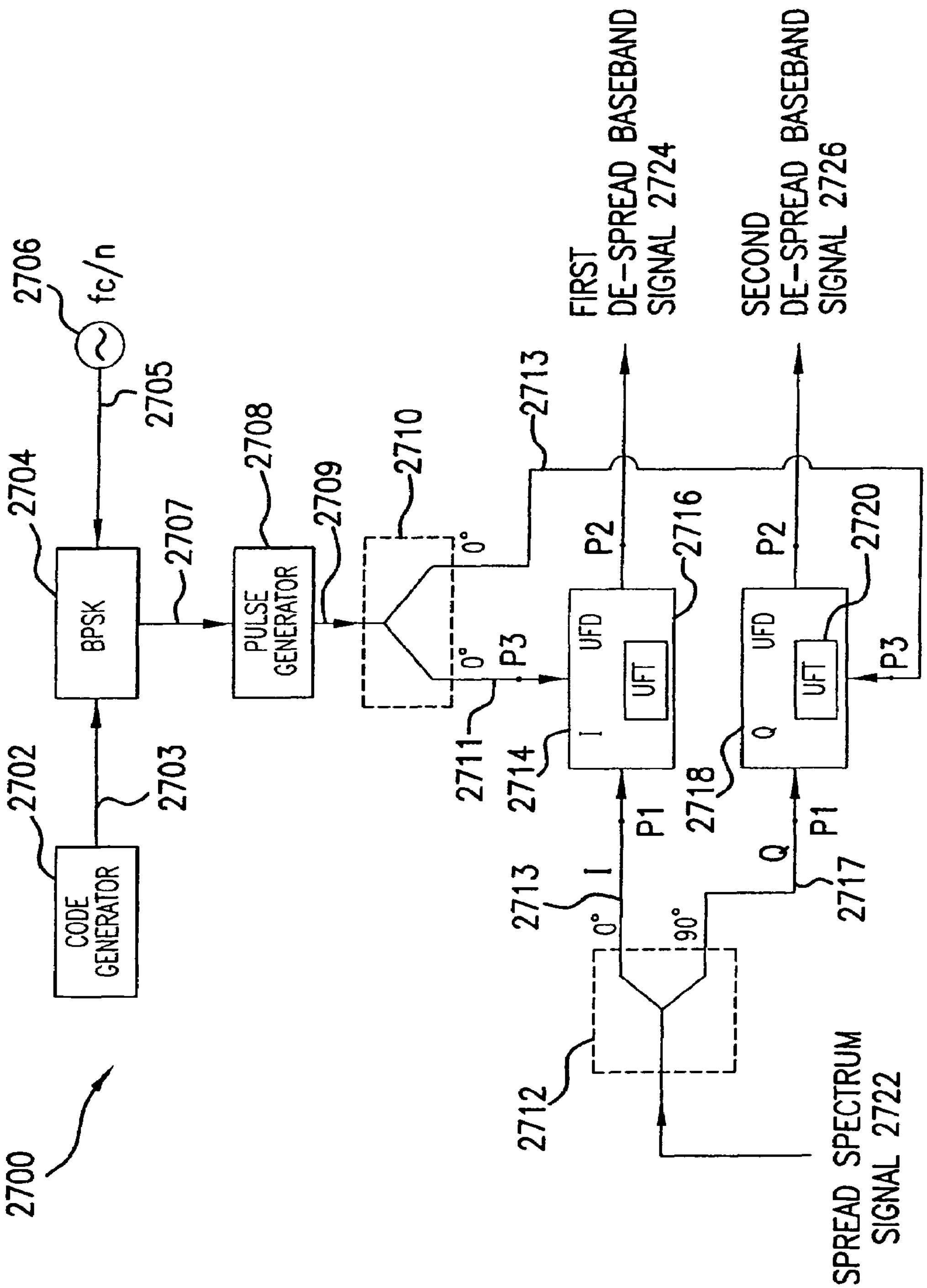
FIG. 27 illustrates a UDD module in an IQ configuration according to embodiments of the present invention.

Spread spectrum signals are often transmitted in an in-phase (I) and quadrature (O) format that represents two signals combined with a 90 degree phase-shift. FIG. 27 illustrates a unified down-conversion and de-spreading IQ module (UDDIQ) 2700 for an IQ spread spectrum signal. UDDIQ 2700 down-converts and de-spreads an IQ spread spectrum signal 2722 in a unified (integrated) manner, to generate a first de-spread baseband signal 2724 and a second de-spread baseband signal 2726. UDDIQ 2700 includes the following: Code generator 2702, BPSK modulator 2704, oscillator 2706, pulse generator 2708, power divider 2710, quadrature power dividers 2712, UFD modules 2714 and 2718. UFD module 2714 includes UFT module 2716, and UFD module 2718 includes UFT module 2720. UDDIQ 2700 is described in reference to flowchart 7400 in FIG. 74A and FIG. 74B, and operates as follows. The order of the steps in the flowchart 7400 is not limiting, as will be understood by those skilled in the arts.

In step 7401, the UDDIQ modulator 2700 receives the spread spectrum signal 2722.

In step 7402, the quadrature power divider 2712 divides the spread spectrum signal 2722 into an in-phase (I) spread spectrum signal 2713 and a quadrature (O) spread spectrum signal 2717. The Q spread spectrum signal 2717 is 90 degrees out-of-phase relative to I spread spectrum signal 2713, as will be understood by those skilled in the arts.

In step 7404, the oscillator 2706 generates an oscillating signal 2705 that has a characteristic frequency $f_C/n$; where $f_C$ is the approximately the center frequency of the spread spectrum signal 2722, and n represents a harmonic or subharmonic of spread spectrum signal 2722 (i.e. n=0.5, 1, 2, 3).

In step 7406, the code generator 2702 generates a spreading code 2703 that is appropriate for the spread spectrum signal 2722. In other words, the spreading code 2703 corresponds to the spreading code used to generate the spread spectrum signal 2722. The present invention will work with any type of spreading code, including but not limited to, PN codes, Walsh codes, and gold codes.

In step 7408, the BPSK modulator 2704 modulates the oscillating signal 2705 with the spreading code 2703 to generate a spread oscillating signal 2707. Other modulation schemes could be use to modulate the oscillating signal with the spreading code, as will be understood by those skilled in the arts based on the discussion herein.

In step 7410, the pulse generator 2708 generates a spread control signal 2709 which includes a plurality of pulses (pulse train) from the spread oscillating signal 2707, which together includes the necessary spreading code information to de-spread the signal 2722. Various pulse generator embodiments where discussed in reference to FIGS. 73A-E, to which the reader is referred for more detail. In one embodiment, the pulses in the spread control signal 2709 have non-negligible apertures that are established to improve energy transfer to the de-spread baseband signals. In other embodiments, the apertures are negligible.

In step 7412, the power divider 2710 divides the spread control signal 2709 into an (I) spread control signal 2711 and a Q spread control signal 2713. In this embodiment, the I and Q spread control signals 2713 are in-phase, and any necessary quadrature phase-shift between the I and Q channels is achieved with the quadrature power divider 2712, as will be understood by those skilled in the relevant arts. Alternatively, the Q spread control signal 2713 could be phase-shifted by 90 degrees relative to the I spread control signal 2711 to implement the quadrature phase shift between the I and Q channels, as will be understood by those skilled in the arts.

In step 7414, the UFD module 2714 down-converts and de-spreads I spread spectrum signal 2713 using the UFT module 2716, to generate a first de-spread baseband signal 2724. The down-conversion and de-spreading of the I spread spectrum signal by the UFD modules 2714 is similar to that described for the UDD 2500, to which the reader is referred for further details.

In step 7416, the UFD module 2718 down-converts and de-spreads the Q spread spectrum signal 2717 using the UFT module 2720, to generate a second de-spread baseband signal 2726. The down-conversion and de-spreading of the Q spread spectrum signal by the UFD module 2718 is similar to that of described for the UDD 2500, to which the reader is referred for further details.

In embodiments, the first and second de-spread baseband signals 2724 and 2726 are distinct baseband signals that are communicated over the same spectrum bandwidth by using the IQ modulation format. In a mobile phone environment, one signal can carry user information (e.g. voice or data) and the other signal can carry system control information (e.g. cell-to-cell handoff, frequency allocations, etc.). Alternatively, the two baseband signals can be time-multiplexed to effectively double the system data rate as will be understood by those skilled in the relevant arts. Thus, the UDDIQ module 2700 has all the advantages of the UDD module 2500, with the additional advantage of being able to send two information signals over the same spread spectrum bandwidth, which improves spectral efficiency.

FIG. 75 illustrates a UDDIQ module 7500 according to embodiments of the invention. The UDDIQ 7500 is similar to UDDIQ 2700, with the exception that the I and Q channels have separate spreading code generators 2702*a* and 2702*b*. As such, the I spreading code 2703*a* and the Q spreading code 2703*b* can be different from each other, and therefore the isolation between the I and Q channels can be improved when compared to a system that utilizes a single spreading code system. As discussed above, the I spreading code 2703*a* and the Q spreading code 2703*b* can be any type spreading code including but not limited to: a PN code, a Walsh code, and a Gold code.

FIG. 76 illustrates a UDDIQ 7600 according to embodiments of the invention. The UDDIQ 7600 is similar to the UDDIQ 7500 with the exception that the quadrature power divider 2712 is replaced with an in-phase power divider 7602. The necessary 90 degree phase shift between the I and Q channels is achieved by phase shifting the oscillating signal 2705*b* using the 90 degree phase shifter 7604. As, such the control signal 2709*b* implements the 90 degree phase shift of the Q channel relative to the I channel during the sampling by the UFT module 2720.

8.3 RAKE Receivers

The present invention is directed at RAKE receivers to address multipath concerns in a spread spectrum environment. In particular, the present invention is directed at a RAKE receiver that utilizes a universal frequency down-conversion module (UFD) to down-convert and de-spread a spread spectrum signal in a unified (i.e. integrated) manner, where the UFD modulator contains a universal frequency translation (UFT) module.

8.3.1 Introduction: Rake Receivers in Spread Spectrum Systems

Spread spectrum systems often utilize RAKE receivers to compensate for multipath delay or dispersion, as described in, for example U.S. Pat. Nos. 5,305,349, 5,648,983, and 5,237,586, which are incorporated herein by reference in their entireties.

In mobile communication systems, signals transmitted between base and mobile stations typically suffer from echo distortion or time dispersion, caused by, for example, by signal reflections from large buildings or nearby mountain ranges. Multipath dispersion occurs when a signal proceeds to the receiver along not one, but many paths, so that the receiver hears many echoes having different and random varying delays and amplitudes. Thus, when multipath time dispersion is present in spread spectrum system, the receiver receives a composite signal of multiple versions of the transmitted symbol that have propagated along different paths (referred to as "rays"), some of which may have relative time delays of less than one symbol period.

Each distinguishable "ray" has a certain relative time of arrival k $T_c$ seconds and spans N of the I and Q chip samples, since each signal image is an N-chip sequence in a traditional spread spectrum system. As a result of the multipath time dispersion, the correlator outputs several smaller spikes rather than one large spike. Each ray that is received after the symbol period (i.e., if the time delay caused by a reflection exceeds one symbol period) appears as an uncorrelated interfering signal that reduces the total capacity of the communication system. To direct optimally the transmitted symbols (bits), the spikes received must be combined in an appropriate way.

Typically, this can be done by a RAKE receiver, which is so named because it "rakes" all the multipath contributions together. Various aspects of RAKE receivers are described in Price, R., et al., "A Communication Technique for Multipath Channels," Proc. IRE 46:555-570 (March 1958); Turin, G., "Introduction to Spread-Spectrum Anti-multipath Techniques and Their Application to Urban Digital Radio," Proc. IEEE 68:328-353 (March 1980); and Proakis, J., *Digital Communications,* 2nd ed., McGraw Hill, Inc. (1989), pp. 729-739.

A RAKE receiver uses a form of diversity combining to collect the signal energy from the various received signal paths, i.e., the various signal rays. Diversity provides redundant communication channels so that when some channels fade, communication is still possible over non-fading channels. A spread spectrum RAKE receiver combats fading by detecting the echo signals individually using a correlation method and adding them algebraically (with the same sign). Further, to avoid intersymbol interference, appropriate time delays are inserted between the respective detected echoes so that they fall into step again.

Figure 28A:
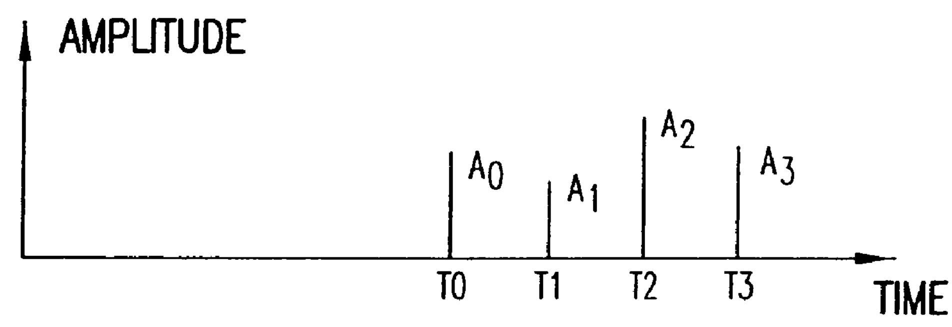
FIG. 28A illustrates an example multipath profile.

An example of a multipath profile of a received composite signal is illustrated in FIG. 28A. The ray that propagates along the shortest path arrives at a time $T_0$ with an amplitude $A_0$, and rays propagating along longer paths arrive at times $T_1$, $T_2$, $T_3$ with amplitudes $A_1$, $A_2$, $A_3$, respectively. For simplicity, some typical RAKE receivers assume that the time delays between the rays are a constant, i.e., $T_1=T_0+dT$, $T_2=T_0+2dT$, and $T_3=T_0+3dT$ for the profile shown; the time delays (and amplitudes) are usually estimated from the received composite signal history.

In one form of a RAKE receiver, correlations values of the signature sequence with the received signals at different time delays are passed through a delay line that is tapped at the expected time delay (dt), i.e., the expected time between receiving echoes. The outputs at the RAKE taps are then combined with appropriate weights. Such a receiver searches for the earliest ray by placing a tap at $T_0$, and for a ray delayed by dt by placing a tap at $T_0$+dt, and so forth. The RAKE tap outputs having significant energy are appropriately weighted and combined to maximize the received signal-to-noise-and-interference ratio. Thus, the total time delay of the delay line determines the amount of arrival time delay that can be searched. In one spread spectrum system, up to 128 microseconds (μsec) can be searched, corresponding to thirty-two chips, and the total time delay of the taps that can be combined is thirty-two μsec, corresponding to an eight-chip window movable within the thirty-two-chip total delay. See FIG. 28H, for example, which is described in U.S. Pat. No. 5,648,983.

Figure 28B:
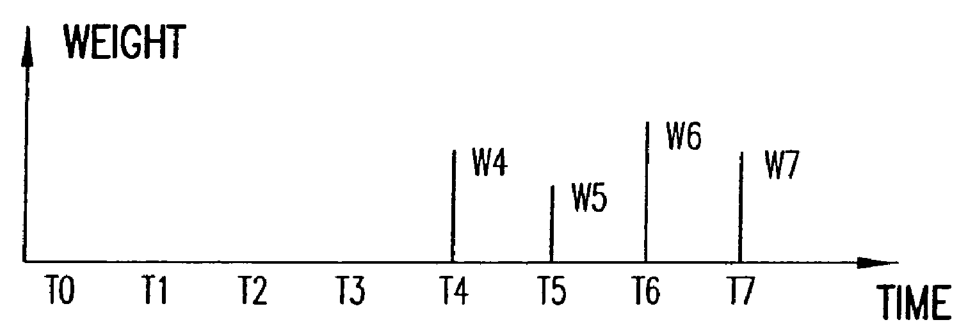
FIG. 28B illustrates example weights given to taps of an example RAKE receiver.
Figure 28C:
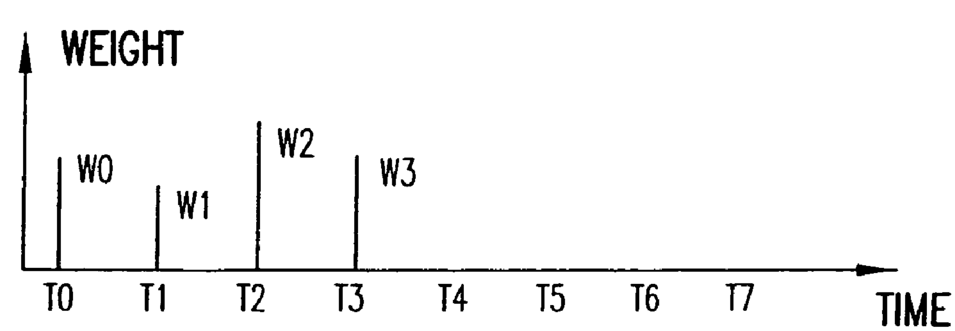
FIG. 28C illustrates example weights given to eight taps of an example RAKE receiver.

FIGS. 28B and 28C illustrate how manipulating the RAKE taps adapts the RAKE receiver to signals that have different delays. In FIG. 28B, eight taps, which are identified by the arrival times $T_0$-$T_7$, are provided, of which only the outputs of taps $T_4$-$T_7$ are given non-zero weights $W_4$-$W_7$, respectively. In FIG. 28C, only the outputs of taps $T_0$-$T_3$ are given non-zero weights $W_0$-$W_3$, respectively. When the weights $W_0$-$W_3$ are respectively the same as the weights $W_4$-$W_7$, the receiver is adapted to the same signal, but for a time of arrival $T_0$ rather than $T_4$. In a "digital" RAKE, or DRAKE, receiver, the weights are either 0 or 1, as described in the paper by Turin cited above.

Figure 28D:
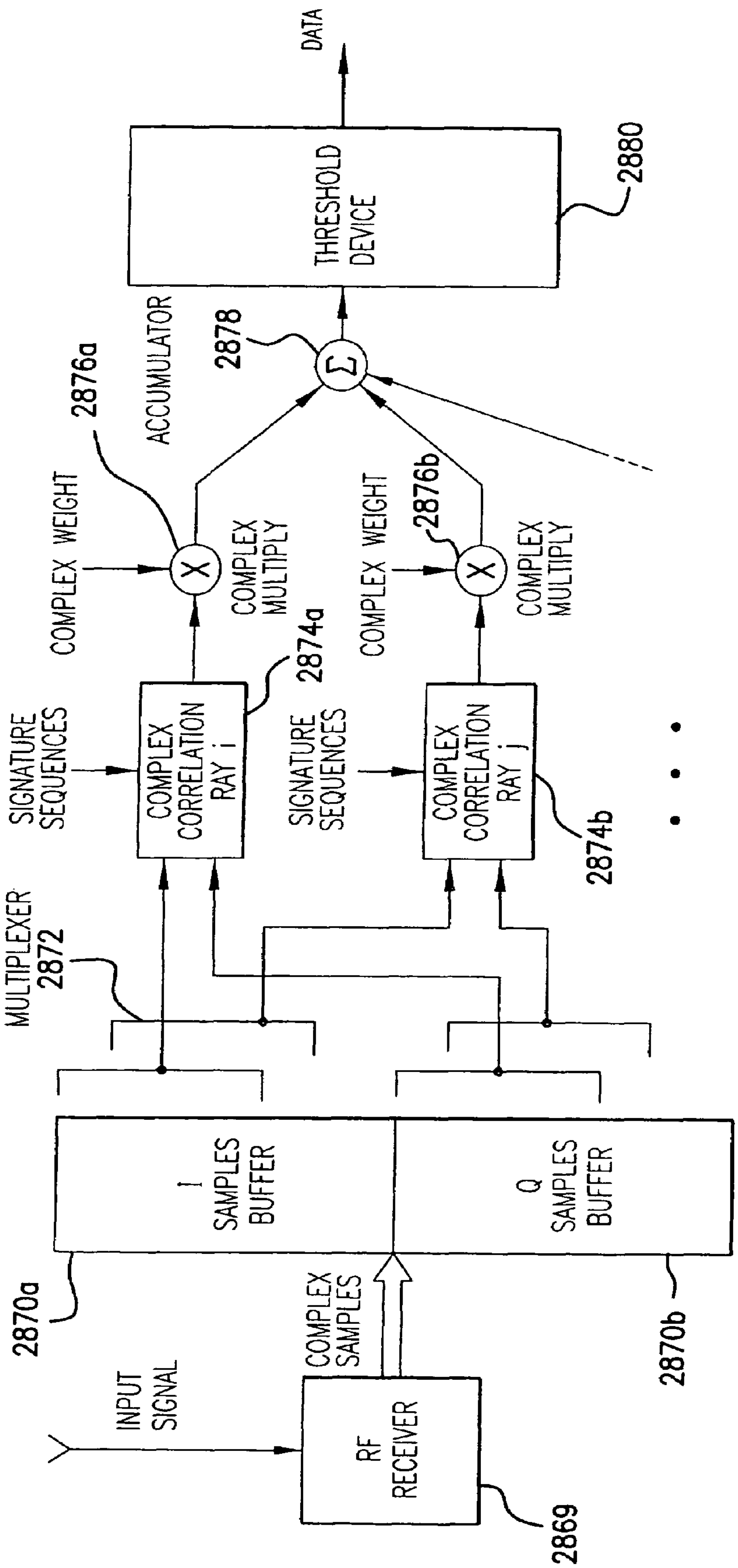
FIG. 28D illustrates conventional RAKE receiver using post-correlator, coherent combining of different rays.

A diagram of a conventional RAKE receiver using post-correlator, coherent combining of different rays is shown in FIG. 28D. A received radio signal is demodulated by, for example, mixing it with cosine and sine waveforms and filtering the signal in an RF receiver 2869, yielding I and Q chip samples. These chip samples are collected in a buffer memory that is composed of two buffers, 2870*a*, 2870*b* for the I, Q samples, respectively. As illustrated in FIG. 28D, the bottom of each buffer 2870*a*, 2870*b* contains the most recent received chip samples.

A multiplexer 2872 receives the buffered chip samples, and sends a range of I chip samples and the corresponding range of Q chip samples to complex correlators 2874*a*, 2874*b*. The range selected includes N samples corresponding to the N-chip sequence arriving at a certain time. For example, if the buffers 2870*a*, 2870*b* each contain 159 chip samples (numbered 0-158) and N is 128, then the multiplexer 2872 would send chip samples numbered i through (i+127) from the I buffer 2870*a*, and chip samples numbered i through (i+127) from the Q buffer 2870*b* to the correlator 2874*a*, where i is the discrete time index of the signal rays from when the buffers were first filled. Two different sets of chip samples, i.e., two different received sample ranges and hence a different signal ray, are provided by the multiplexer 2872*a* to the correlator 2874*b*. A complex correlation value is formed by each correlator 2874*a*, 2874*b* that correlates its two sets of signal samples I, Q to the known signature sequence, or spreading code. Of course, the multiplexer 2872 can provide the received samples either serially or in parallel.

In general, a complex correlator correlates a complex input stream (I+jQ samples) to a complex known sequence, producing a complex correlation value. If the signature sequence is not complex, each complex correlator can be implemented in two scalar correlators in parallel, which may be defined as a "half-complex" correlator. If the signature sequence is complex, the complex correlators correlate a complex input to a complex sequence, giving rise to "full-complex" correlations. It is to be understood that the term "complex correlator" will be used hereinafter to refer to both of the aforementioned scenarios.

Following correlation, the complex correlation values are transmitted to complex multipliers 2876*a*, 2876*b* that multiply the correlation values by the complex weights that each consist of a real part and an imaginary part. Typically, only the real parts of the products of the complex correlation values and weights are sent to an accumulator 2878, which sums the weighted correlations for all the signal rays processed. The accumulated result is sent to a threshold device 2880, which detects a binary "0" if the input is greater than a threshold, or a binary "1" if the input is less than the threshold.

Figure 28E:
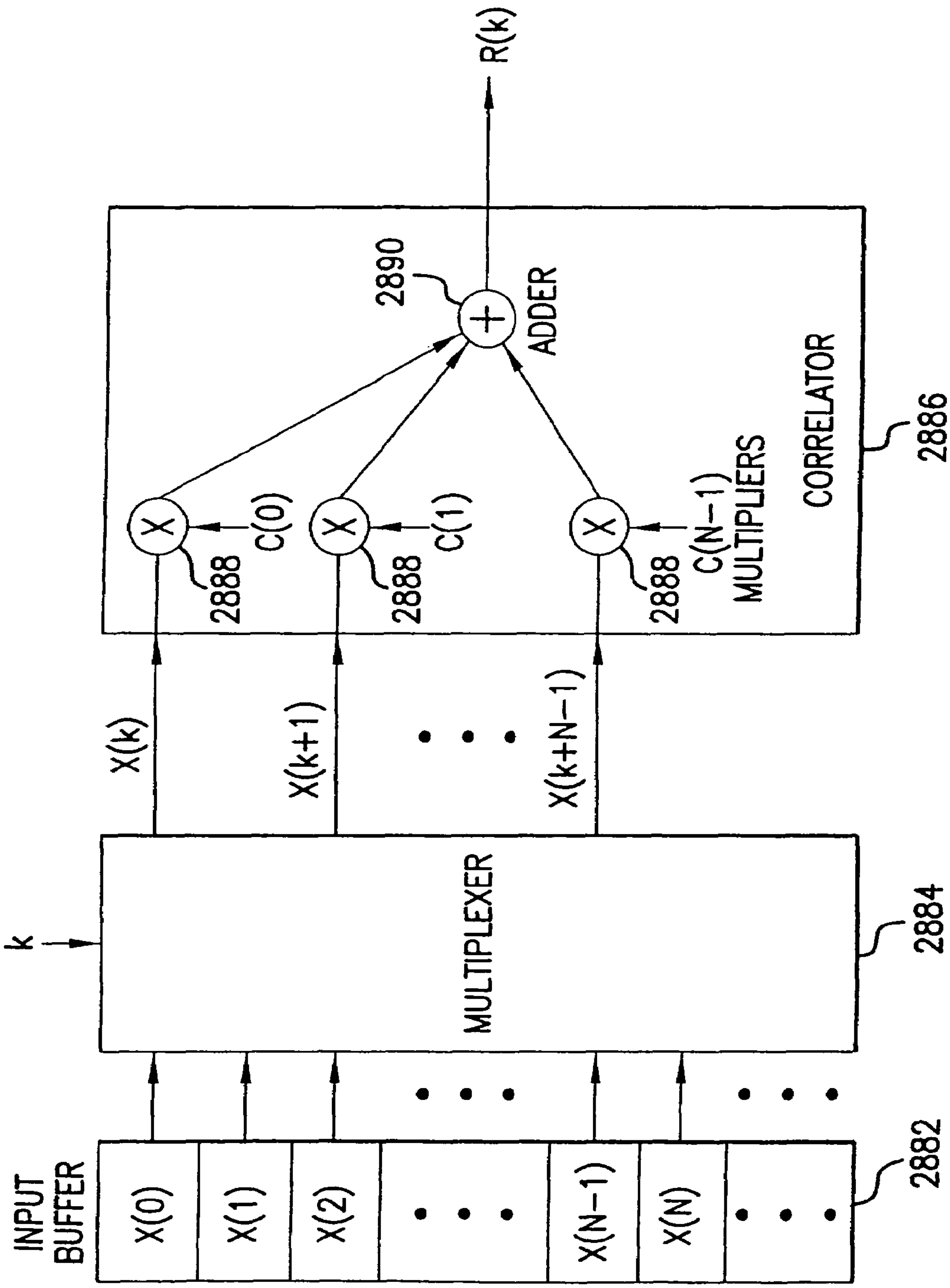
FIG. 28E illustrates a conventional approach to a RAKE receiver.

FIG. 28E illustrates a parallel approach. A data buffer 2882 stores consecutive time samples, X(n), of the received signal, and a multiplexer 2884 selects a range of N data values, {x(k), X(k+1), . . . X(k+N−1)}, which are sent to a correlator. A group of multipliers 2888, which corresponds to the inputs to the correlator 2886, multiples the data values by corresponding spreading code sequence values C(0), C(1), . . . C(N−1). The products are summed by an adder 2890 to form the correlation value R(k).

Figure 28F:
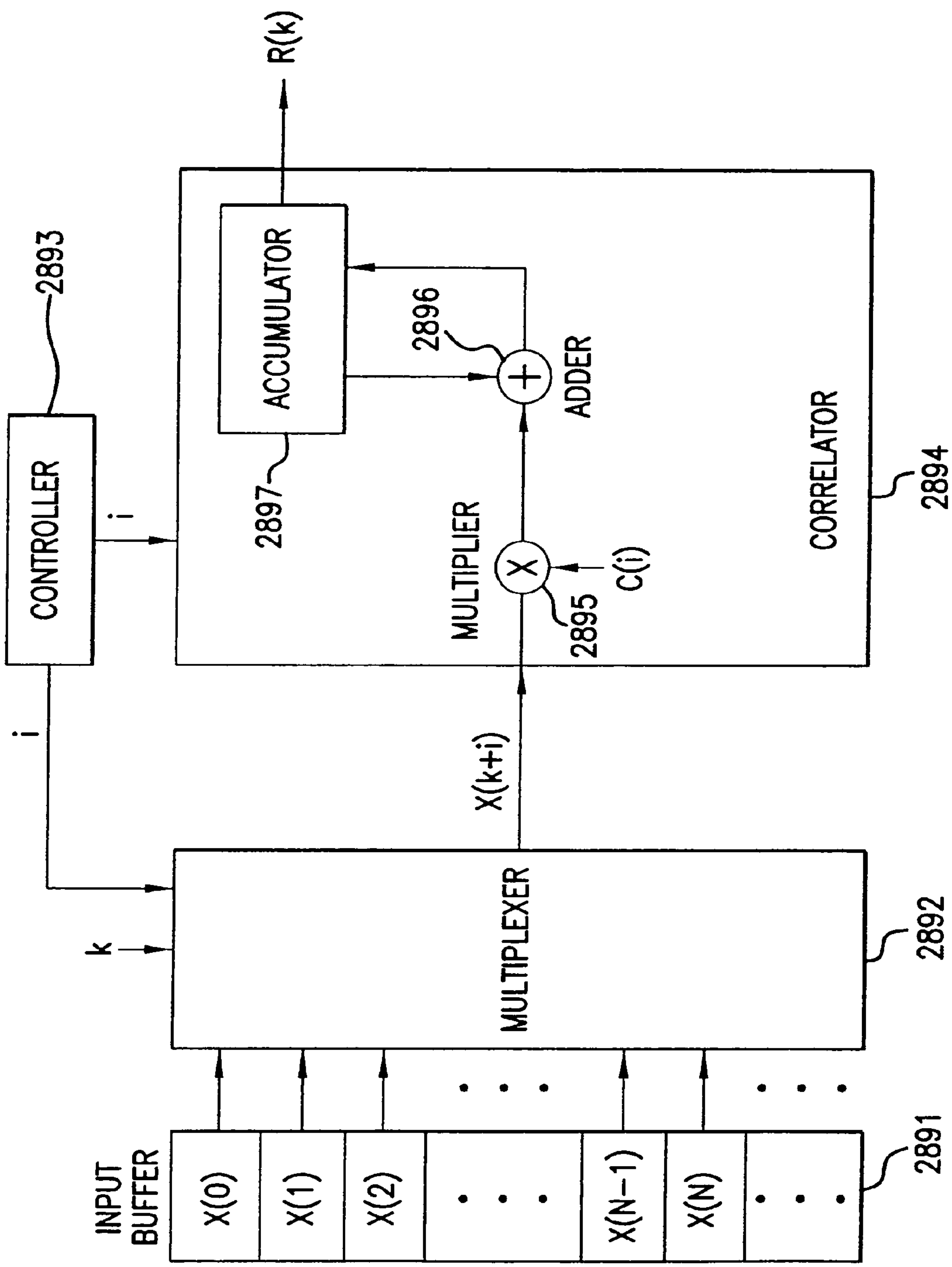
FIG. 28F illustrates a conventional approach to a RAKE receiver.

FIG. 28F illustrates serially accessing the input range to compute R(k). An input buffer stores the received data samples. The buffer 2891 may be only one sample long because only one sample will be correlated at a time. If the buffer 2891 is more than one sample long, a multiplexer 2892 would be provided to select a particular sample, X(k+i), where i is determined by a suitable control processor 2893. The sample stored or selected is sent to a correlator 2894, which computes the product of the sample X(k+i) with one element, C(i), of the code sequence using a multiplier 2895. This product is combined, in an adder 2896, with the contents of an accumulator 2897 that stores accumulated past products. The contents of the accumulator 2897 is originally set to zero, and i is stepped from 0 to N−1, allowing the accumulation of N products. After N products have been accumulated, the contents of the accumulator 2897 is output as the correlation value R(k).

Figure 28G:
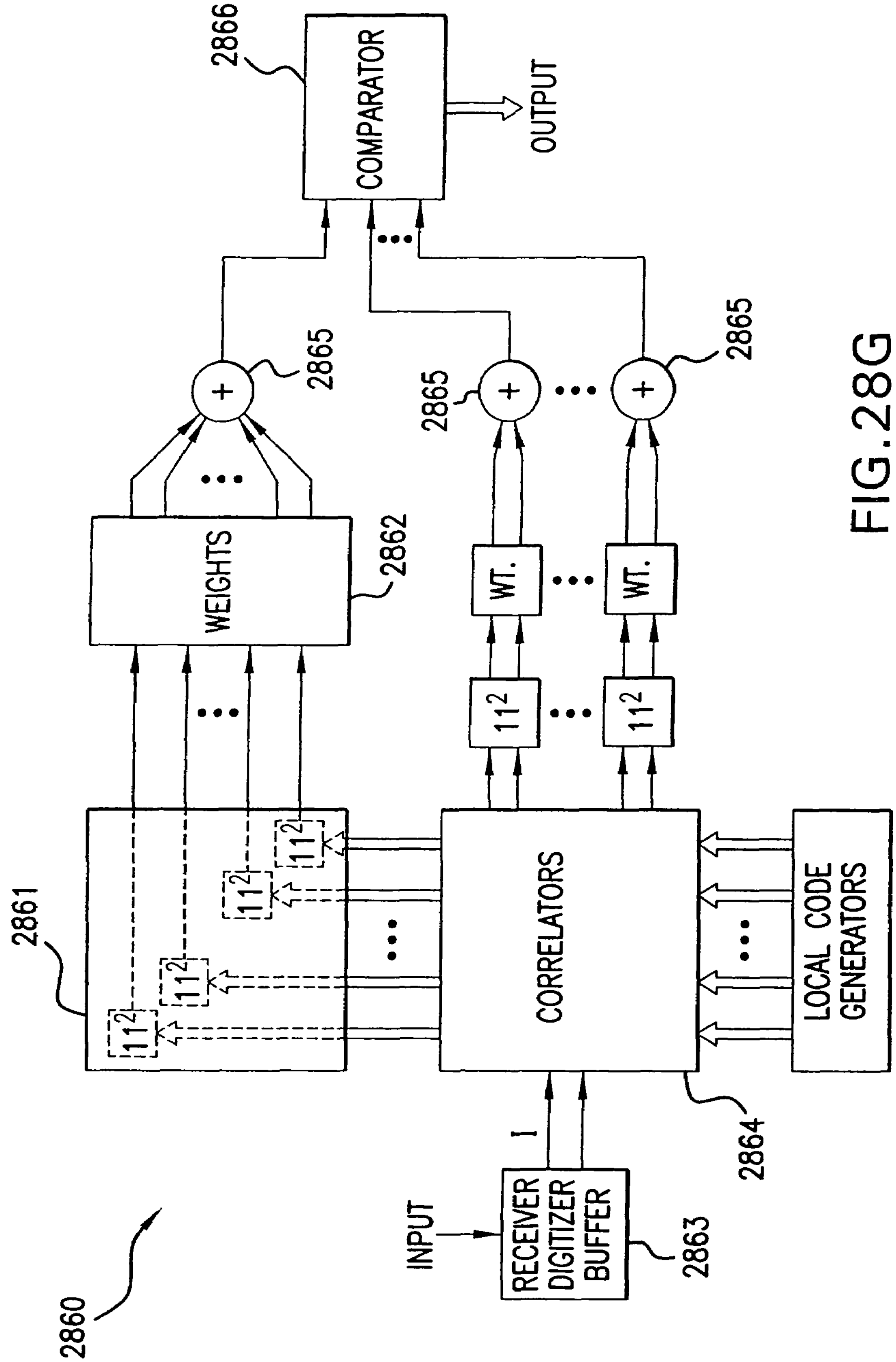
FIG. 28G illustrates the general arrangement of a non-coherent RAKE receiver.
Figure 28H:
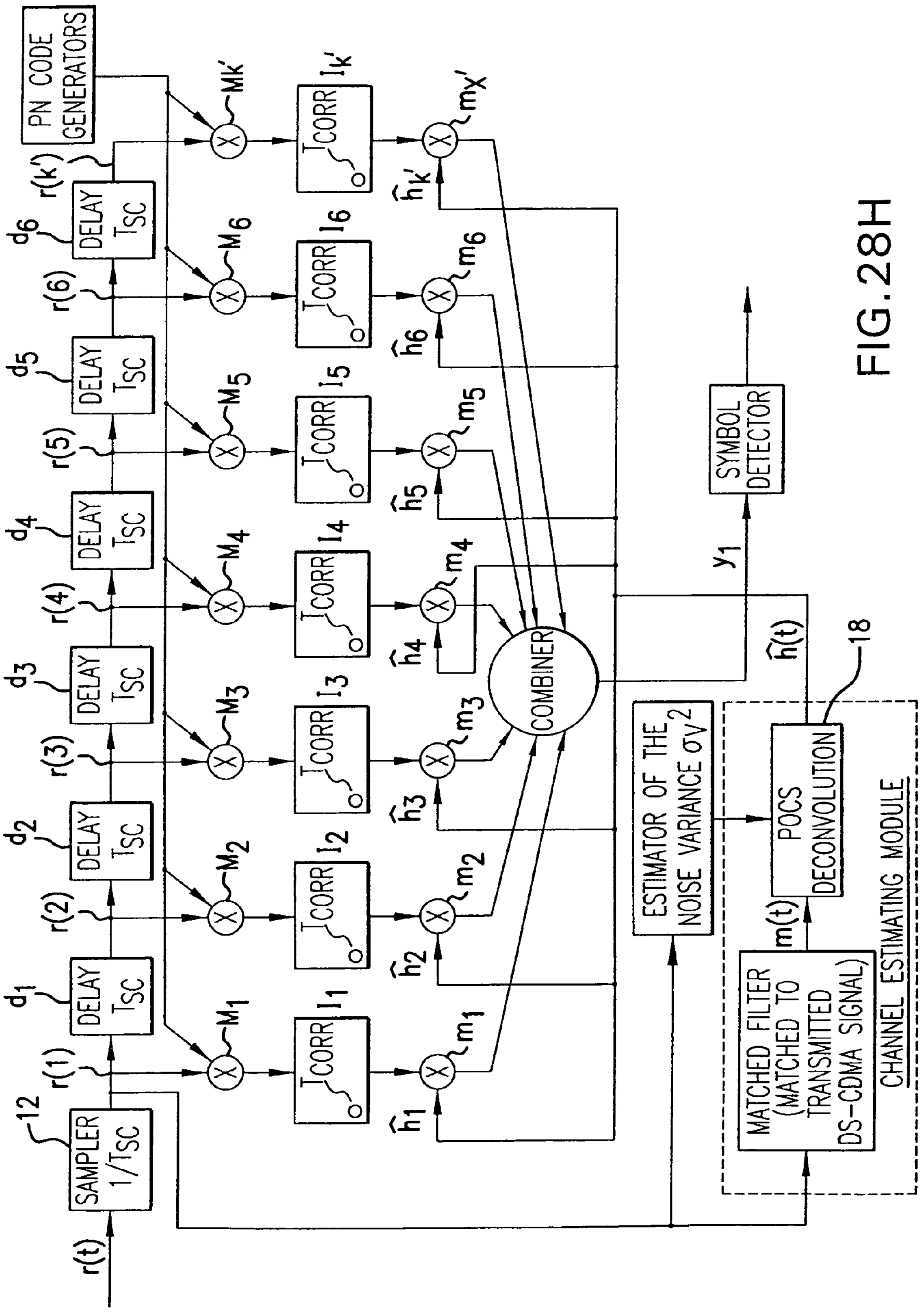
FIG. 28H illustrates an example embodiment of a RAKE receiver.

FIG. 28G illustrates the general arrangement of a non-coherent RAKE receiver 2860 for a system using a traditional spread spectrum with direct spreading. In RAKE receiver 2860, the tap weights are either 0 or 1, which means simply that the correlation value from a particular tap is either added to a total or not, also, in a non-coherent RAKE, the square magnitudes of the selected correlation values are summed, which obviates the need to align them in phase before summing. Accordingly, the weights can be applied either before or after the square magnitudes are determined. The main difference from the coherent receiver shown in FIG. 28D is that the set of complex multipliers 2876 (FIG. 28D) that apply the complex weights to respective complex correlation values are replaced by a squared-magnitude processor 2861 followed by weighting with 0 or 1 in a weight processor 2862.

In FIG. 28G, a suitable receiver/digitizer 2863 amplifies, filters, demodulates, analog-to-digital converts, and finally buffers the in-phase and quadrature components of the received composite radio signal into streams of complex digital samples I, Q. The sample streams I, Q are processed by a set 2864 of correlators that compute the values of correlations of the sequence of signal samples with shifts of the receiver's spreading code sequence that are generated by respective ones of a set of local code generators. Of course, one code generator and suitable components for shifting the generator's code sequence can be used instead. For a multipath profile such as that sown in FIG. 28A, the set of correlators 2864 could comprise four correlators, one for each of four shifts of the spreading code, and the shifts of each code sequence would ideally correspond to the arrival times $T_0$-$T_3$. It will be understood that the signal sample streams I, Q may be processed whether serially or initially collected in a memory and provided in parallel to the correlators.

Because the code sequences are typically only real-valued, either scalar correlators can separately operate on the I, Q samples or half-complex correlators can simultaneously compute the correlations of the I, Q samples with the code sequence shifts. In addition the correlation values may be averaged over a number of transmitted symbols to determine an average signal strength for the decoded signal. The squared magnitudes of the four complex correlation values for the four shifts of the spreading code are then computed from the in-phase (real part) and quadrature (imaginary part) component samples by the squared-magnitude processor 2861.

The RAKE multiplicative weighting coefficients are applied by the weight processor 2862 to the squared magnitudes of the correlation values. Because in a RAKE receiver the weights are only 0 or 1, processor 2862 can also be regarded as a tap selection device. The four weighted magnitudes for the shifts of the spreading code are then combined by an adder 2865. It will be appreciated that more or fewer than four shifts of each spreading code may be processed to handle other multipath profiles. Setting selected ones of the weights to zero in a RAKE receiver eliminates the contribution of the respective correlation magnitudes from the output for the adder 2865, and thus can be used to ignore rays that may have been deemed rarely to contain significant signal energy.

The sum of the weighted correlation magnitudes for the spreading code is provided to a comparative device 2866 for identifying the transmitted symbol. For a communication system employing block codes as spreading code sequences, the set 2864 of correlators would advantageously include a sufficient number of correlators to process simultaneously all code sequences and their shifts, which would be produced by the local code generators. A set of a squared-magnitude processor, a weight processor, and an adder would be provided for each different spreading code sequence. The outputs of the adders for the set of spreading codes would be provided to the comparator device 2866.

For a system using block codes, the output of the comparator device 2866 is an index value representing the spreading code that produced the largest adder output. In a system using 128 Walsh-Hadamard orthogonal spreading codes, the comparator device 2866 examines 128 adder outputs, yielding seven bits of information. Walsh-Hadamard codes are advantageous because a Fast Walsh Transform (FWT) processor, such as that described in U.S. Pat. No. 5,357,454, can produce the 128 correlations for each shift of the spreading codes very rapidly. The comparator device 2866 can advantageously be implemented by the maximum search processor described in U.S. Pat. No. 5,187,675. The above-cited patents are expressly incorporated herein by reference in their entireties.

In a coherent RAKE receiver, the complex weights scale the correlation values to maximize the overall signal-to-noise-and-interference ratio, and bring them in to phase so that they are coherently added by the accumulator 2878 (FIG. 28F). Each complex weight is optimal when it is the complex conjugate of the mean of its respective correlation value. It will be understood that the very concept of "mean value" implies that the underlying correlation value is static and only varies due to additive noise. Since at least the phase of each correlation (i.e., $R_Q(k)$) varies due to relative motion between the receiver and transmitter, a device such as a phase-locked loop is usually used to track correlation variations in order to maintain the correct weight angle. In addition, the magnitudes of the complex weights should also track correlation value variations due to varying signal-reflection characteristics of the objects causing the echoes.

In a spread spectrum system using 128 Walsh-Hadamard orthogonal spreading codes, a non-coherent RAKE receiver expecting a four-signal multipath profile requires 1024 squaring computations to develop the squared magnitudes from the real and imaginary parts of the correlation values and 512 multiplications to apply the weights. For such a system and profile, a coherent RAKE receiver requires at least 2048 multiplications to apply the complex weights to the correlation values. From a processor hardware point of view, multiplication is generally more difficult than squaring because multiplication involves two input arguments rather than one. Therefore, a coherent RAKE receiver is typically more complicated than a non-coherent RAKE receiver.

8.3.2 RAKE Receivers Utilizing a Universal Frequency Down-Conversion (UFD) Module The present invention is directed at a RAKE receiver that utilizes one or more universal frequency down-conversion (UFD) modules to down-convert and de-spread a spread spectrum signal in a unified (i.e. integrated) manner.

Figure 28I:
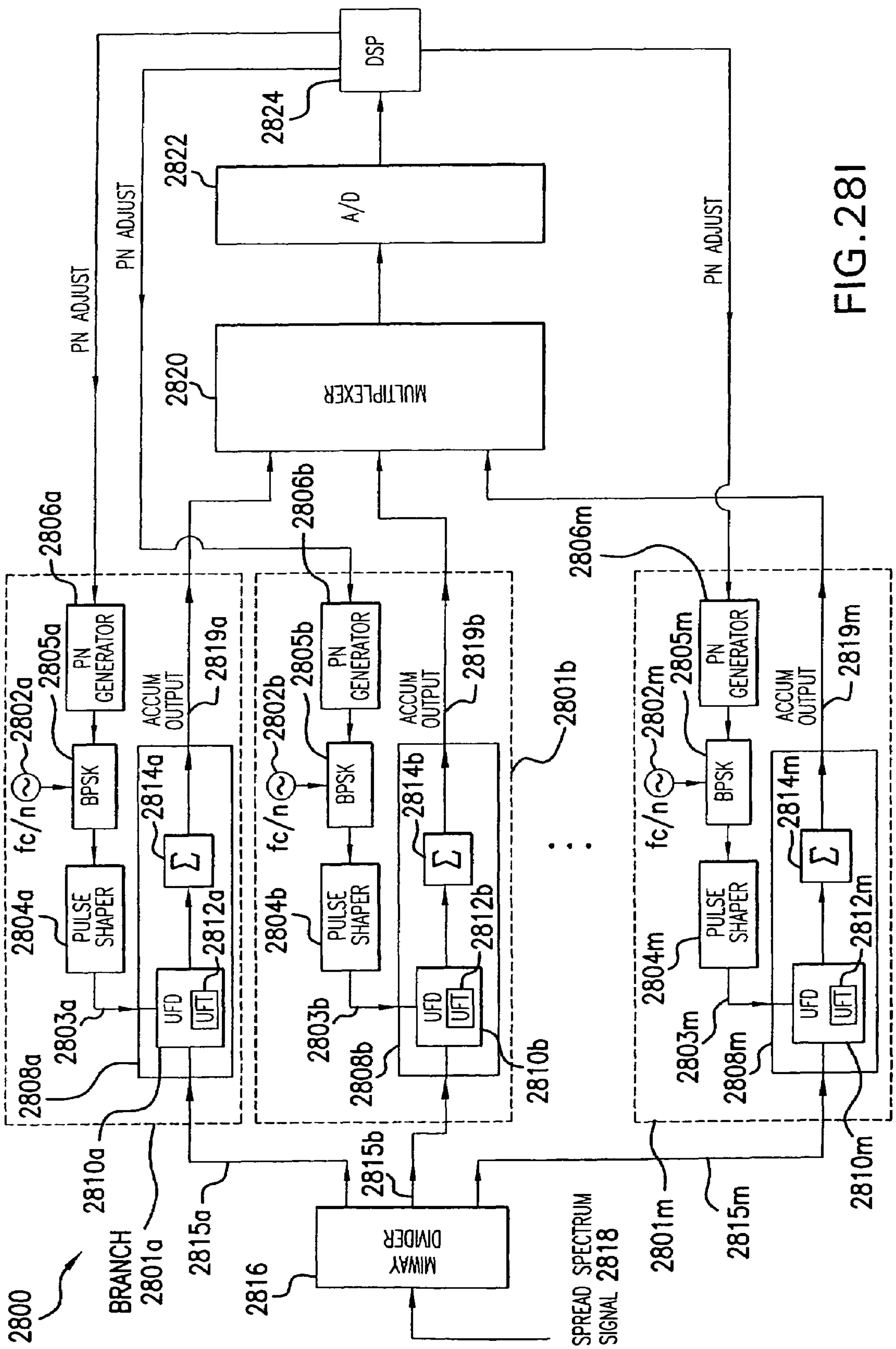
FIG. 28I illustrates a RAKE receiver, utilizing multiple UFD modules, for efficiently synchronizing the local spreading code to that of a received spread spectrum signal according to embodiments of the present invention.

FIG. 28I illustrates a RAKE receiver 2800 according to an embodiment of the present invention. Rake receiver 2800 includes: an M-way divider 2816, diversity branches 2801*a-m*, multiplexer 2820, A/D converter 2822, and DSP 2824. Each diversity branch 2801 includes: a correlator 2808, pulse generator 2804, BPSK modulator 2805, oscillator 2802, and PN generator 2806. Each correlator 2808 includes: UFD module 2810, summer 2814, where each UFD module includes a UFT module 2812. RAKE receiver 2800 operation occurs as follows.

RAKE receiver 2800 receives spread spectrum signal 2818 that may contain multipath effects. M-way divider 2816 divides spread spectrum signal 2818 into m-number of spread spectrum signals 2815*a-m* that are sent to diversity branches 2801*a-m*, one signal 2815 for each branch 2801.

Each diversity branch 2801 receives a spread spectrum signal 2815 and generates an accumulated output value 2819 that reflects the relative correlation between the received spread spectrum signal and the local PN code used by the diversity branch 2801. The operation of diversity branch 2801*a* is described as follows, and is representative of the other diversity branches 2801*b-m*.

Oscillator 2802 generates an oscillating signal that has a characteristic frequency $f_C/n$; where $f_C$ is the approximate center frequency of the input spread spectrum signal, and n represents a harmonic or subharmonic (n=0.5, 1, 2, 3 . . . ). PN generator 2806 generates a PN code under the direction of DSP 2824. BPSK modulator 2805 modulates the oscillating signal with the PN code, resulting in a BPSK modulated signal that carries the PN code information. Pulse generator 2804 receives the BPSK modulated signal, and generates a control signal including a plurality of pulses that contain the PN-code information. In one embodiment, the apertures associated with the control signal pulses are non-negligible and are established to improve energy transfer, as shown in FIG. 26E and the related discussion. In other embodiments, the apertures are negligible. Pulse generator 2804 sends the control signal to the correlator 2808, and specifically to the UFD module 2810.

UFD module 2810 receives the control signal (with PN code information) from the pulse generator 2804, and also receives the input spread spectrum signal 2815 from the M-way divider 2816. UFD module 2810 down-converts and de-spreads the spread spectrum signal 2815 in a unified manner. As discussed earlier, UFD module 2810 samples the spread spectrum signal utilizing the control signal and the UFT module 2812 (switch) to generate a de-spread baseband signal that is sent to summer 2814. More specifically, a controlled switch in the UFT module samples the input spread spectrum signal 2815 according to the spread control signal, to generate the de-spread baseband signal. Summer 2814 sums the magnitude of the baseband signal over the length of a PN code string to generate an accumulated output value 2819. The accumulated output value is representative of how well the local PN generator 2806 is correlated with the input spread spectrum signal. The higher the accumulated output value, the closer the PN code generator 2806 is correlated with the incoming spread spectrum signal. In one embodiment, the summer 2814 is an op amp configured to have a relatively slow time constant.

Figure 28J:
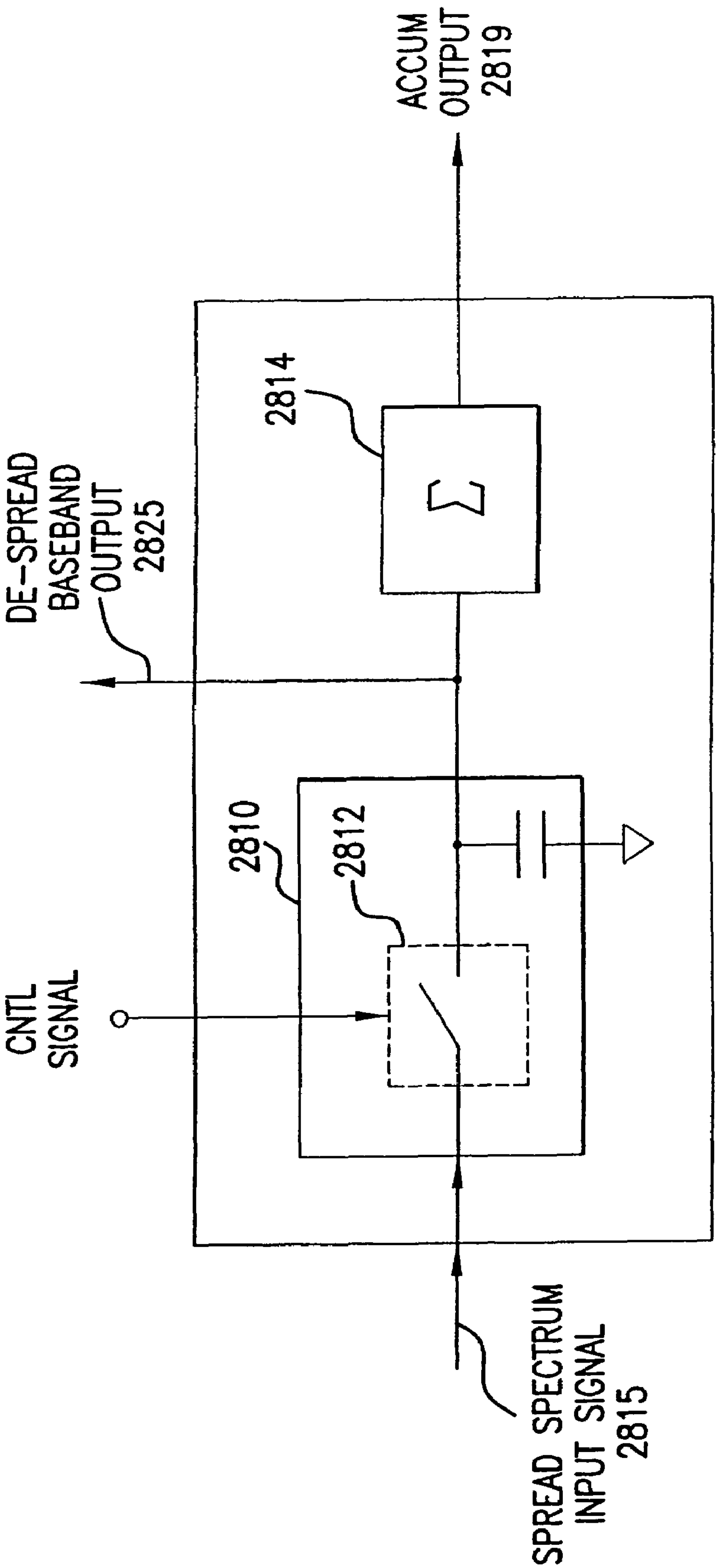
FIG. 28J illustrates a correlator having a UFD module according to embodiments of the invention.

Each diversity branch 2810*a-m* sends its respective output accumulation value 2819 to the multiplexer 2820. Multiplexer 2820 multiplexes the output accumulation values from the multiple diversity branches, and sends the multiplexed accumulation signal to A/D converter 2822. A/D converter 2822 digitizes the multiplexed accumulation signal and sends them to DSP 2824. DSP 2824 evaluates the relative accumulation values 2819 for each diversity branch 2801. If a threshold level is reached by one or more of the diversity branches, then there is sufficient PN code correlation to receive user data/voice through those diversity branches that exceed the threshold value. The de-spread baseband signal can be taken directly from the respective UFD module 2810, as represented by the output signal 2825 in FIG. 28J. The DSP 2824 preferably rejects (or corrects) multi-path effects that impact PN correlation of one or more diversity branches. Furthermore, the DSP 2824 can adjust (e.g. frequency or phase-shift) the PN codes generated by one or code generators 2806 to improve correlation with the respective input spread spectrum signals 2815, as will be understood by those skilled in the arts based on the teachings herein.

As will be apparent, a larger number of diversity branches 2801 improves the correlation capability of the RAKE receiver. The present invention (of using a UFD module in the correlator) leads to lower component count and reduced power consumption when compared to conventional de-spreading systems. The power savings can be used to increase the number of diversity branches and improve overall correlation and acquisition speed. As discussed earlier, the power savings occur because the down-conversion and de-spreading of the input spread spectrum signal is accomplished in a unified manner, by sampling the spread spectrum signal using a UFT module controlled by a PN-modulated control signal. Further spectral efficiencies can be achieved if the pulses in the control signal are non-negligible, and established to improve energy transfer to the de-spread baseband signal.

Based on the forgoing discussion with respect to rake receiver 2800 in FIG. 28I, those skilled in the arts will recognize how to implement a UDF module in the RAKE receiver embodiments shown in FIGS. 28A-H.

Furthermore, the present invention can be implemented in hardware, software, and firmware, as will be understood by those skilled in the relevant arts. For example, the operations of the multiplexer 2820, and the DSP 2824 can be implemented in software as will be understood by those skilled in the relevant arts based on the discussion herein.

8.4 Early/Late Spread Spectrum Receiver

An Early/Late spread spectrum receiver operates similar to the RAKE receiver. The difference being that three PN-code sequences (On-time, Early, and Late) are used to de-spread the spread spectrum signal during synchronization of the PN-code with the input spread spectrum signal. Other chip delay times could be used as will be understood by those skilled in the arts. The On-Time, Early, and Late PN-code sequences are defined as follows. The On-Time PN code is a reference to define the Early and Late PN code sequences; where the Early PN code sequence "leads" the On-Time PN code by preferably ½ chip in time, and the Late PN code sequence "lags" the On-Time PN code by preferably ½ chip in time. Other chip delay times could be used as will be understood by those skilled in the arts. The use of three PN codes shifted in time results in a faster acquisition during PN code synchronization because three phase-shifted code sequences are implemented in rapid succession, as will be shown below.

Figure 29:
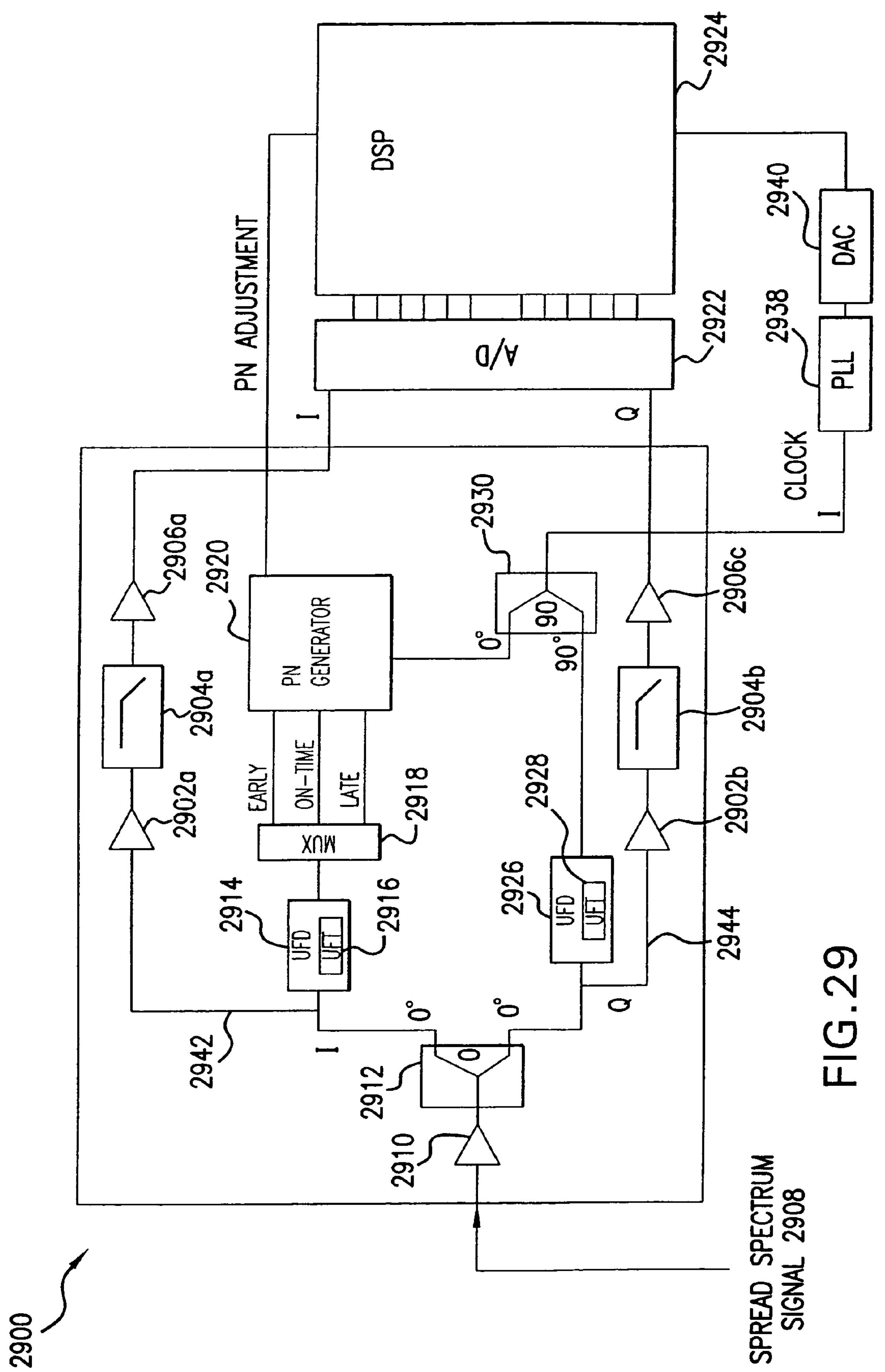
FIG. 29 illustrates an IQ configuration of an Early/Late receiver, utilizing multiple UFD modules according to embodiments of the present invention.

FIG. 29 illustrates an Early/Late I Q spread spectrum receiver 2900 using multiple UFD modules, according to one embodiment of the present invention. Early/Late receiver 2900 includes: (optional) amplifier 2910; in-phase power divider 2912; UFD modules 2914, 2926; MUX 2918; PN Generator 2920; A/D converter 2922; DSP 2924; (optional) amplifiers 2902, 2906; filter 2904, PLL 2938, and DAC 2940. Early/Late receiver 2900 initial synchronization operates as follows.

Power divider 2912 receives the spread spectrum signal 2908 and splits it into an in-phase (I) signal and quadrature (O) signal, where the I signal is sent to UFD module 2914, and the Q signal is sent to UFD module 2926. PN Generator 2920 generates 3 PN code sequences: Early, On-Time, and Late. As stated above, the On-Time PN code sequence is a reference for the Early and Late PN code sequences. The Early PN code sequence leads the On-Time PN code sequence by ½ a chip, and the Late PN code sequence lags by ½ chip. MUX 2918 multiplexes each three PN code sequences together to generate a control signal for the UFD module 2914. (It is assumed that any necessary pulse shaping or pulse generation is done by the PN generator 2920). In other words, the PN generator 2920 generates pulses (or chips) that carry the respective PN codes, and have apertures that are established to improve energy transfer to the de-spread baseband signals. In embodiments, the apertures are approximately ½ a period associated with the frequency of the spread spectrum input signal 2908.

The control signal (with Early, On-time, Late PN code information) controls the sampling by UFT module 2916 of the spread spectrum input signal, and down-converts and de-spreads the spread spectrum input signal in a unified manner. The effect of time-multiplexing the Early, On-time, and Late PN codes is to generate a de-spread baseband signal with an amplitude that varies over time. The DSP 2924 keeps track of the time order of the three PN codes, and evaluates the amplitude of each de-spread baseband signal for the time period associated with each PN code. The DSP can then select the PN code that produces the highest amplitude, and thus has the closest synchronization to the input spread spectrum signal. If none of the Early, On-Time, or Late PN codes meet a threshold level of synchronization, then the DSP 2924 can frequency and/or phase shift the PN codes to improve synchronization. After sufficient synchronization is achieved, then both I and Q channels can be used to de-spread user voice/data using UFD modules, as has been described previously. Amplifiers 2902, 2906, and filter 2904 provide some optional baseband processing for the output baseband signals 2942 and 2944, as will be understood by those skilled in the arts.

Figure 30:
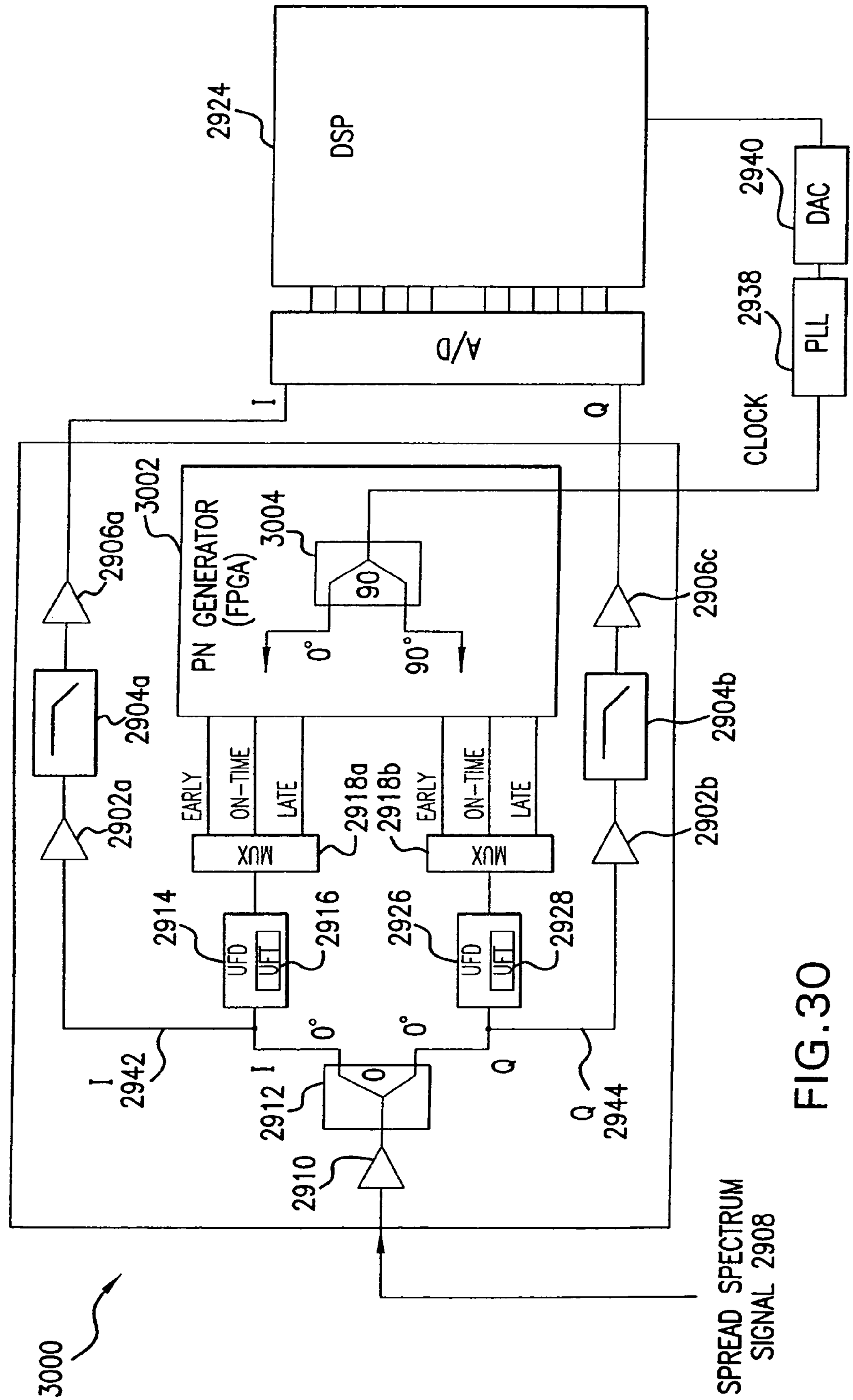
FIG. 30 illustrates an IQ configuration of an Early/Late rake receiver with multiple UFD modules, where PN code adjustment occurs on both the I & Q channels according to embodiments of the present invention.

Early/Late receiver 2900 implements the Early, On-time, and Late PN code multiplexing in the I channel only, as is shown in FIG. 29. In contrast, FIG. 30 illustrates Early/Late receiver 3000, which implements the Early, On-time, and Late code multiplexing on both the I channel and the Q channel, in parallel, using a quadrature power divider 3004 in a PN generator 3002. This will provide for even faster synchronization when compared with the Early/Late receiver 2900, because both the I channel and the Q channel can be used to synchronize the PN code to the incoming spread spectrum signal.

8.5 Integrated Up-Conversion and Spreading of a Spread Spectrum Signal

The present invention is directed at systems and methods of simultaneous up-conversion and spreading of a baseband signal, and applications of the same. One type of spread spectrum system is Code Division Multiple Access (CDMA). The present invention can be implemented in CDMA, and other spread spectrum systems as will be understood by those skilled in the arts based on the teachings herein.

In particular, the present invention includes a unified up-conversion and spreading (UUS) module that preforms up-conversion and spreading of a baseband signal to generate a spread spectrum signal in a unified (i.e. integrated) manner. In other words, the UUS module up-converts and spreads a baseband signal in a single step to generate a spread spectrum signal that exists at a higher frequency. The UUS module utilizes the universal frequency translation (UFT) module that was discussed above in relation to unified down-conversion and de-spreading. The advantages of the UUS module when compared to conventional systems are lower component count, and reduced power requirements. Furthermore, the present invention can be implemented in a CMOS Integrated Circuit (IC) architecture.

Figure 31A:
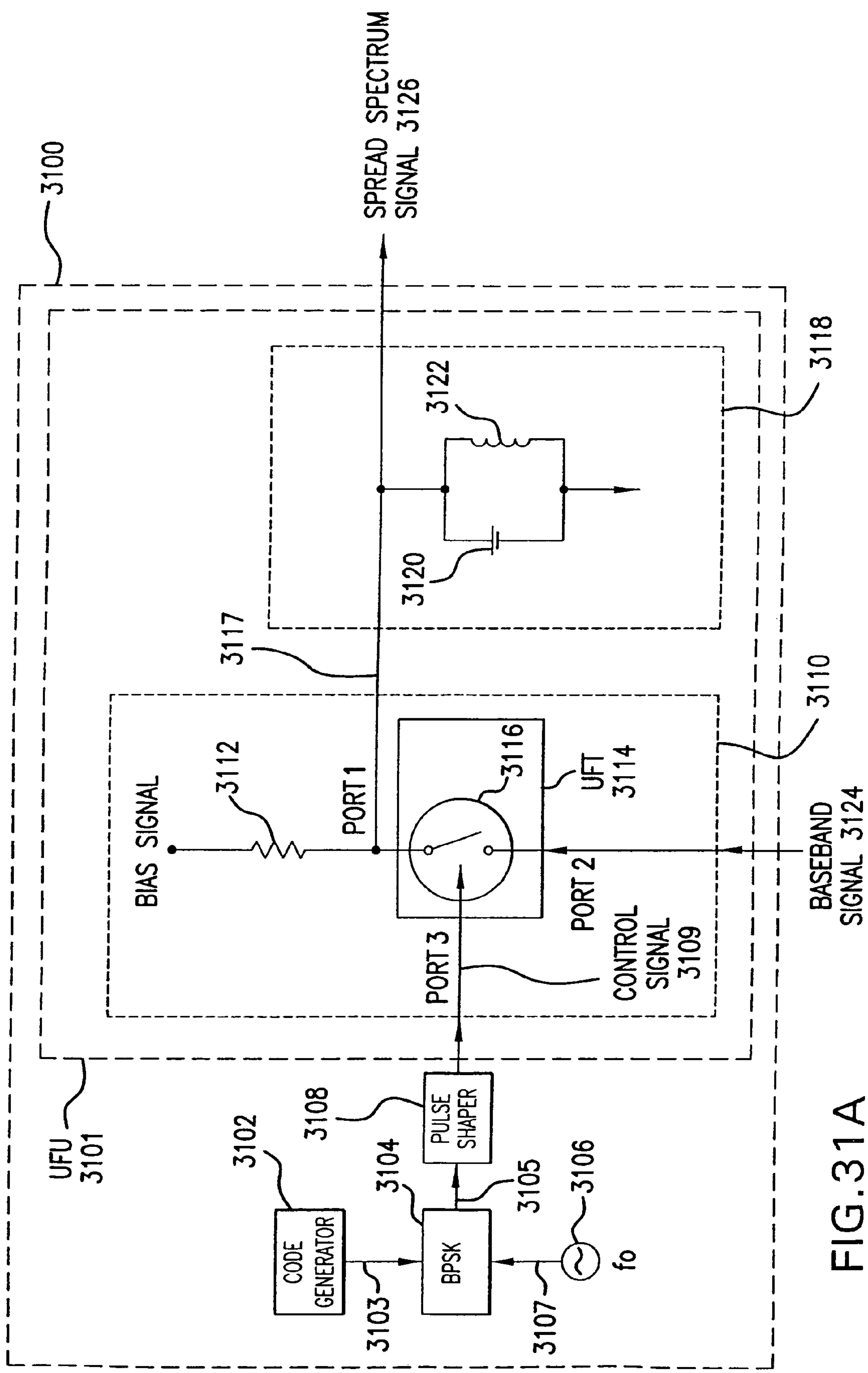
FIG. 31A illustrates a unified up-conversion and spreading (UUS) module, according to embodiments of the present invention.

FIG. 31A illustrates unified up-conversion and spreading (UUS) module 3100 according to one embodiment of the present invention. UUS module 3100 receives a baseband signal 3124 and generates an up-converted spread spectrum signal 3126. UUS module 3100 includes: PN generator 3102, BPSK modulator 3104, pulse generator 3108, oscillator 3106, and UFU module 3101. UFU module 3101 includes switch module 3110, and filter module 3118. Switch module 3110 includes (optional) resistor 3112, and UFT module 3114, which includes controlled switch 3116. UUS module 3100 is described in reference to flowchart 7700 that is shown FIG. 77, and operates as follows.

In step 7701, the UUS module 3100 receives the input baseband signal 3124.

In step 7702, the oscillator 3106 generates an oscillating signal 3107 with a frequency of $f_0$. In embodiments, the frequency of the oscillating signal is a sub-harmonic of the desired frequency of the spread spectrum output signal 3126.

In step 7704, the spreading code generator 3102 generates appropriate spreading code 3103. The present invention can be implemented with any type of spreading code including, but not limited to PN codes, Gold codes, and Walsh codes.

In step 7706, the BPSK modulator 3104 modulates the oscillating signal 3107 with the spreading code 3103, to generate a spread oscillating signal 3105. Other types of modulation schemes could be used as will be understood by those skilled in the relevant arts.

In step 7708, the pulse generator 3108 accepts the spread oscillating signal 3105 and generates a control signal 3109 that contains the spreading code information. In one embodiment, the control signal 3109 comprises a plurality of pulses, where the pulse width determines the relative amplitude of the frequency harmonics in a harmonically rich signal 3117. In other words, the narrower the pulses, the more energy resides in the higher frequency harmonics compared with the lower frequency harmonics. According to an embodiment of the invention, the pulse width may be shaped to ensure that the amplitude of the desired harmonic in signal 3117 is sufficient for its intended use (e.g. transmission), as will be discussed below.

Figure 31B:
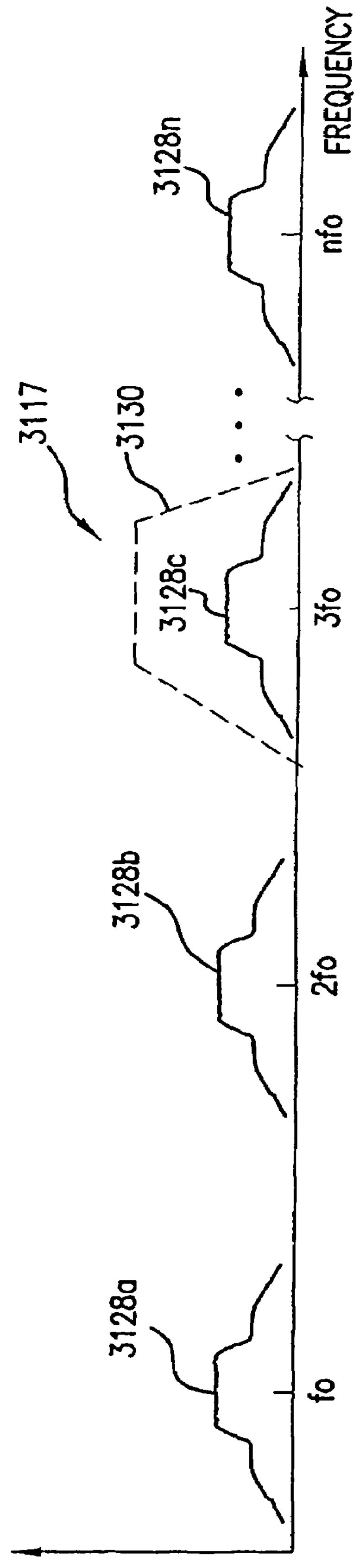
FIG. 31B illustrates a spread spectrum harmonically rich signal according to embodiments of the present invention.

In step 7710, the UFT module 3114 receives baseband signal 3124 and control signal 3109 (with PN code information). UFT module 3114 gates (or samples) baseband signal 3124 with switch 3116 as determined by control signal 3109, to generate a harmonically rich signal 3117. FIG. 31B illustrates the harmonically rich signal 3117 that includes multiple harmonic images 3128_a-n_ that repeat at harmonics of the sampling frequency $f_0$. Each image 3128 is a spread spectrum signal that contains the necessary amplitude, frequency, and phase information to reconstruct the input baseband signal 3124.

As stated above, the relative amplitude for each harmonic 3128 in the spread spectrum signal 3117 can be tuned by adjusting the pulse widths of the pulses in the control signal 3109. In other words, the pulse widths are established to improve energy transfer to a desired harmonic of interest. More specifically, narrowing the pulse width shifts energy into the higher frequency harmonics, and widening the pulses shifts energy into the lower frequency harmonics. In embodiments, the pulse width is adjusted so as to be ½ of a period of the harmonic of interest. For example, if the desired frequency of the output signal 3126 is 1 Ghz, then the pulse width of the pulses can be selected as 500 psec, which is ½ of a period of 1 Ghz. This can be restated as setting the pulse width to be π radians at the harmonic of interest. The generation of a harmonically rich signal by gating (or sampling) a baseband signal is further described in section 3 herein, and is also described in co-pending U.S. patent application titled, "Method and System for Frequency Up-conversion," Ser. No. 09/176,154, filed on Oct. 21, 1998. Additionally, matched filter concepts can incorporated as described in pending U.S. patent application titled, "Matched Filter Characterization and Implementation of Universal Frequency Translation Method and Apparatus," Ser. No. 09/521,878, filed Mar. 9, 2000.

In step 7712, the filter module 3118 selects a desired harmonic for transmission. As shown, the filter module 3118 is implemented as tank circuit containing the capacitor 3120 and the inductor 3122. Other filter configuration could be used as will be understood by those skilled in the arts based on the discussion herein. Additionally, the selection of a harmonic from the harmonically rich signal 3126 is represented as a passband 3130 selecting the harmonic 3128_c_ in FIG. 31B.

The advantage of the UUS module 3100 is that it performs simultaneous spreading and up-conversion of a baseband signal. This is accomplished sampling the baseband signal according to a periodic control that carries the spreading code. Furthermore, by adjusting pulse width of the control signal, energy can shifted into a desired harmonic (or harmonics) of the harmonically rich signal 3117.

Figure 32:
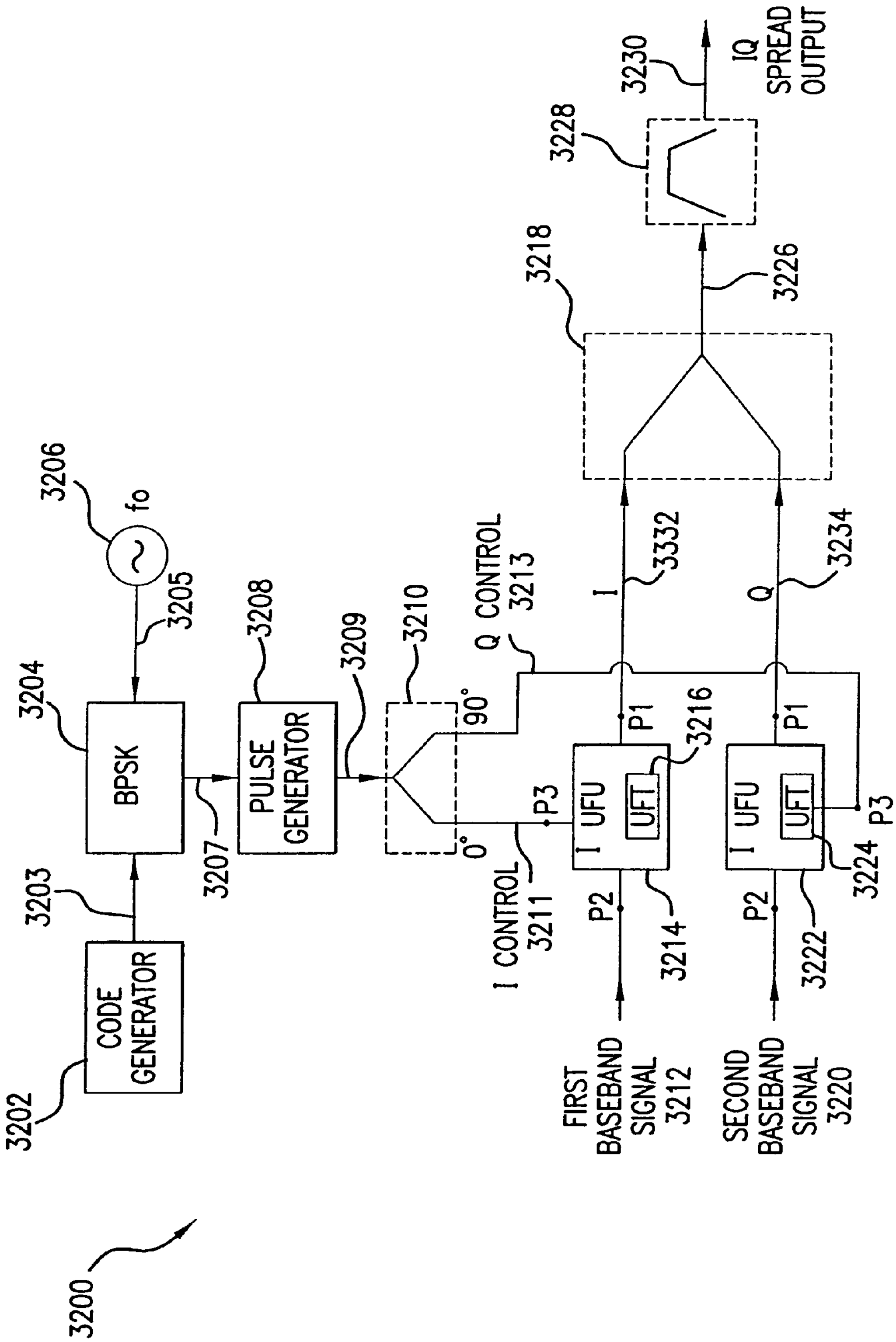
FIG. 32 illustrates an example IQ implementation of a UUS module according to embodiments of the present invention.

8.6 Integrated Up-Conversion and Spreading of Two Baseband Signals to Generate an IQ Spread Spectrum Signal As stated above, spread spectrum systems are often transmitted in an IQ format that represents two signals combined with a 90 degree phase shift. FIG. 32 illustrates a unified up-conversion and spreading (UUSIQ) module 3200 for IQ spread spectrum signals. UUSIQ module 3200 up-converts and spreads two baseband signals 3212 and 3220 in a unified manner, to generate an IQ spread spectrum signal 3226. Baseband signals 3212 and 3220 can be un-modulated signals, or modulated signals. For example, in IS-95, user voice/data signals are QPSK modulated prior to being spread with the PN code. The present invention can be used with one or more modulation layers, that use any type of modulation scheme including QPSK. UUSIQ module 3200 includes the following: code generator 3202; BPSK modulator 3204; oscillator 3206; pulse generator 3208; quadrature power divider 3210; UFU modules 3214, and 3222; and power combiner 3218. Each UFU module 3214 and 3222 contains a UFT module 3216 and 3224, respectively. UUSIQ module 3200 is described in reference to a flowchart 7800 that is shown in FIG. 78, and operates as follows. The steps in the flowchart 7800 can be rearranged as will be understood by those skilled in the arts.

In step 7801, the UUSIQ modulator 3200 receives the first baseband signal 3212 and the second baseband signal 3220.

In step 7802, the oscillator 3206 generates an oscillating signal 3105 with a frequency of $f_0$. In embodiments, the frequency of the oscillating signal is a sub-harmonic of the desired frequency of the spread spectrum output signal 3226.

In step 7804, the spreading code generator 3202 generates appropriate spreading code 3203. The present invention can be implemented with any type of spreading code including, but not limited to PN codes, Gold codes, and Walsh codes.

In step 7806, the BPSK modulator 3204 modulates the oscillating signal 3205 with the spreading code 3203, to generate a spread oscillating signal 3207. Other types of modulation schemes could be used as will be understood by those skilled in the relevant arts.

In step 7808, the pulse generator 3208 accepts the spread oscillating signal 3207 and generates a control signal 3209 that contains the spreading code information. In one embodiment, the control signal 3209 comprises a plurality of pulses, where the pulse width determines the relative amplitude of the frequency harmonics in a harmonically rich signal 3117. In other words, the narrower the pulses, the more energy resides in the higher frequency harmonics compared with the lower frequency harmonics. According to an embodiment of the invention, the pulse width may be shaped to ensure that the amplitude of the desired harmonic in signal 3117 is sufficient for its intended use (e.g. transmission), as will be discussed below.

In step 7810, the quadrature power divider 3210 divides the spread control signal 3209 into an (I) spread control signal 3211 and a Q spread control signal 3213. In this embodiment, the Q spread control signal 3213 is phase shifted by 90 degrees relative to the I control signal 3211 to implement the quadrature phase shift between the I and Q channels. Alternatively, the phase shift can be implemented using the power divider 3218.

In step 7812, the UFU module 3214 receives I-control signal 3211 and first baseband signal 3212. UFU module 3214 up-converts and spreads the first baseband signal 3212 in a unified manner using the UFT module 3216. More specifically, the UFT module 3216 samples the first baseband signal 3212 according to the I-control signal 3211, to generate an I-harmonically rich 3332. The I-harmonically rich signal 3332 includes harmonics that are spread spectrum signals and repeat at the sampling frequency $f_0$. Each harmonic contains the necessary amplitude, frequency, and phase information to reconstruct the baseband signal 3212. Up-conversion and spreading of a baseband signal using UFU (and UFT) modules was discussed in relation to FIG. 31A, to which the reader is referred for to further details.

In step 7814, the UFU module 3222 receives the Q-control signal 3213 and the second baseband signal 3220. UFU module 3220 up-converts and spreads the second baseband signal 3220 in a unified manner using the UFT module 3224. More specifically, the UFT module 3224 samples the second baseband signal 3220 according to the Q-control signal 3213, to generate an Q-harmonically rich 3334. The Q-harmonically rich signal 3334 includes multiple harmonics that are spread spectrum signals and repeat at the harmonics of the sampling frequency $f_0$. Each harmonic contains the necessary amplitude, frequency, and phase information to reconstruct the second baseband signal 3220. Furthermore, the Q harmonically rich signal 3334 is 90 degrees out-of-phase with I harmonically rich signal 3332, because of the phase shift between the I and Q control signals. In step 7816, the power combiner 3218 combines the I harmonically rich signal 3332 and the Q harmonically rich signal 3234, to generate a IQ harmonically rich signal 3226.

In step 7818, the filter 3228 selects the desired harmonic of interest from the IQ harmonically rich signal 3226, resulting in IQ spread output signal 3230. The IQ spread output signal 3230 is a spread spectrum signal at a desired harmonic of the sampling frequency $f_0$. Furthermore, the IQ spread output signal 3230 includes the necessary amplitude, frequency, and phase information to reconstruct the first baseband signal 3212 and the second baseband signal 3220.

FIG. 79 illustrates a UUSIQ module 7900 according to embodiments of the invention. The UUSIQ module 7900 is similar to UDDIQ module 3200, with the exception that the I and Q channels have separate spreading code generators 3202*a* and 3202*b*. As such, the I spreading code 3203*a* and the Q spreading code 3203*b* can be different from each other, and therefore the isolation between the I and Q channels can be improved when compared to a system that utilizes a single spreading code system. As discussed above, the I spreading code 3203*a* and the Q spreading code 3203*b* can be any type spreading code including but not limited to: a PN code, a Walsh code, and a Gold code. Additionally, the 90 degree phase shift between the I and Q channels is achieved using a 90 degree delay 7902 to phase shift Q oscillating signal 3205*b* by 90 degrees relative to the oscillating signal 3205*a*. Additionally, the UFT modules 3216 and 3224 are embodied as controlled switches 7904 and 7906, respecively, based on the discussions above.

FIG. 80 illustrates a UUSIQ module 8000 according to embodiments of the invention. The UUSIQ module 8000 is similar to the UUSIQ module 7900, with the exception the 90 degree delay 7902 is removed. Additionally, the in-phase combiner 3218 is replaced with the quadrature combiner 8002, which provides the necessary 90 degree phase shift between the I and Q harmonically rich signals, as will be understood by those skilled in the relevant arts.

8.6.1 Integrated Up-Conversion and Spreading Using an Amplitude Shaper

Figure 61A:
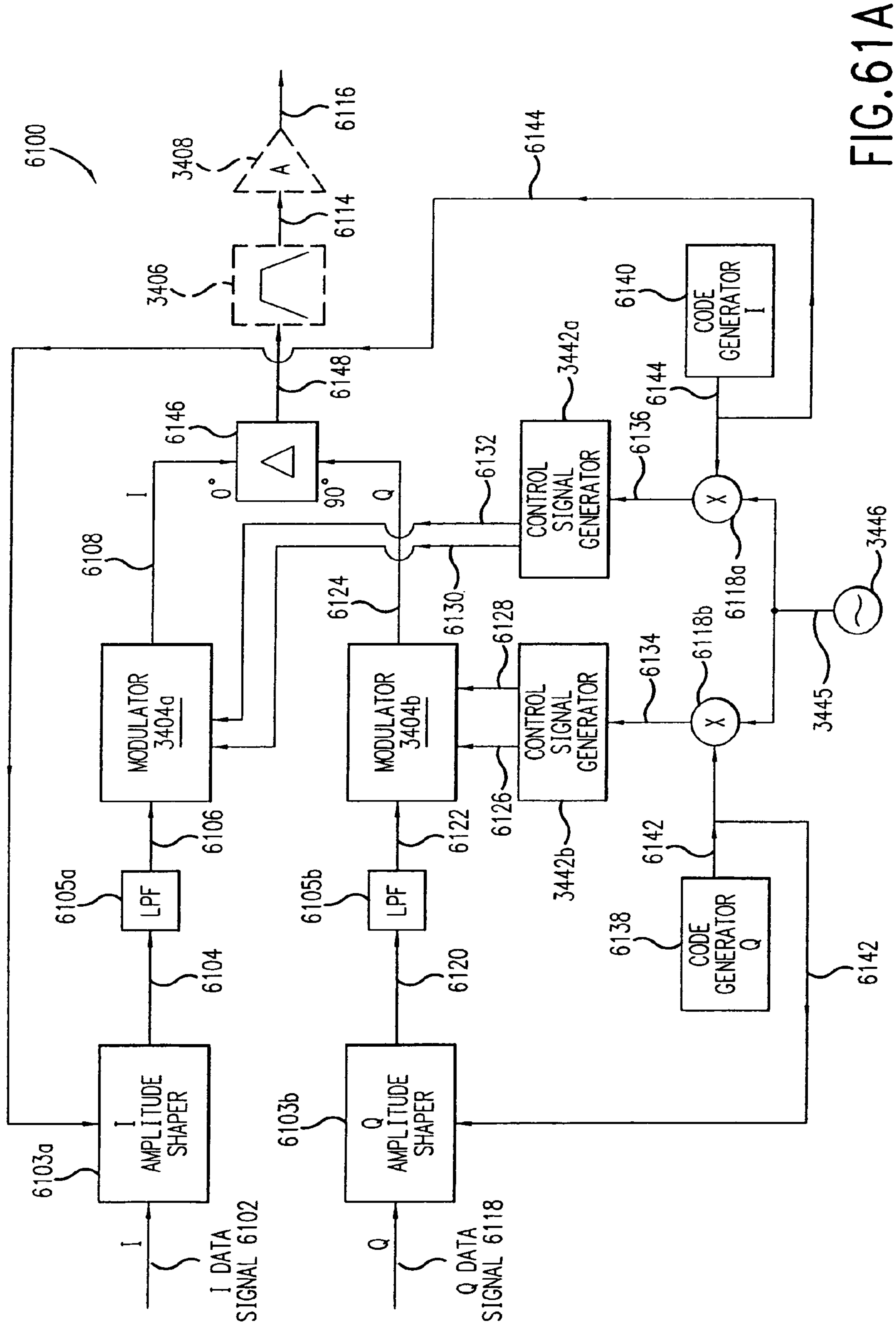
FIGS. 61A-B illustrate modulator 6100 and associated signal diagrams according to embodiments of the present invention.

FIG. 61A illustrates an IQ spread spectrum modulator 6100 that incorporated the UFT-based modulators 3404 that were discussed in FIG. 34. Spread spectrum modulator 6100 performs simultaneous up-conversion and spreading of an I baseband signal 6102 and a Q baseband signal 6118 to generate an IQ output signal 6116, where the spreading and up-conversion is done in an integrated manner. As will be shown, the spreading is accomplished by placing the spreading code on the control signals that operate the UFT modules. In order to control sidelobe spectral growth in the output signal 6116, the amplitude of the I baseband signal 6102 and the Q baseband signal 6118 are shaped in order to correspond with the spreading code. The operation of the modulator 6100 is described in detail with reference to the flowchart 7100 that is shown in FIGS. 71A and 71B.

In step 7101, the IQ modulator 6100 receives the I data signal 6102 and the Q data signal 6118.

In step 7102, the oscillator 3446 generates the clock signal 3445. As described earlier, the clock signal 3445 is preferably a sub-harmonic of the output signal 6116. Furthermore, in embodiments of the invention, the clock signal 3445 is preferably a periodic square wave or sinusoidal clock signal.

In step 7104, an I spreading code generator 6140 generates an I spreading code 6144 for the I channel. Likewise, a Q spreading code generator 6138 generates a Q spreading code 6142 for the Q channel. In embodiments of the invention, the spreading codes are PN codes, or any other type of spreading code that is useful for generating spread spectrum signals. In embodiments of the invention, the I spreading code and the Q spreading code can be the same spreading code. Alternatively, the I and Q spreading codes can be different to improve isolation between the I and Q channels, as will be understood by those skilled in the arts.

In step 7106, the multiplier 6118*a* modulates the clock signal 3445 with the I spreading code 6144 to generate a spread clock signal 6136. Likewise, the multiplier 6118*b* modulates the clock signal 3445 with the Q spreading code 6142 to generate a spread clock signal 6134.

In step 7108, the control signal generator 3442*a* receives the I clock signal 6136 and generates control signals 6130 and 6132 that operate the UFT modules in the modulator 3404*a*. The controls signals 6130 and 6132 are similar to clock signals 3423 and 3427 that were discussed in FIG. 34. The difference being that signals 6130 and 6132 are modulated with (and carry) the I spreading code 6144. Likewise, the control signal generator 3442*b* receives the Q clock signal 6134 and generates control signals 6126 and 6128 that operate the UFT modules in the modulator 3404*b*.

In step 7110, the amplitude shaper 6103*a* receives the I data signal 6102 and the shapes the amplitude so that it corresponds with the spreading code 6144, resulting in I shaped data signal 6104. This is achieved by feeding the spreading code 6144 back to the amplitude shaper 6103*a*. The amplitude shaper 6103*a* then shapes the amplitude of the input baseband signal 6102 to correspond to the spreading code 6144. More specifically, the amplitude of the input signal 6102 is shaped such that it is smooth and so that it has zero crossings that are in time synchronization with the I spreading code 6144. Likewise, the amplitude shaper 6103*b* receives the Q data signal 6118 and shapes amplitude of the Q data signal 6118 so that it corresponds with the Q spreading code 6142, resulting in Q shaped data signal 6120.

Figure 61B:
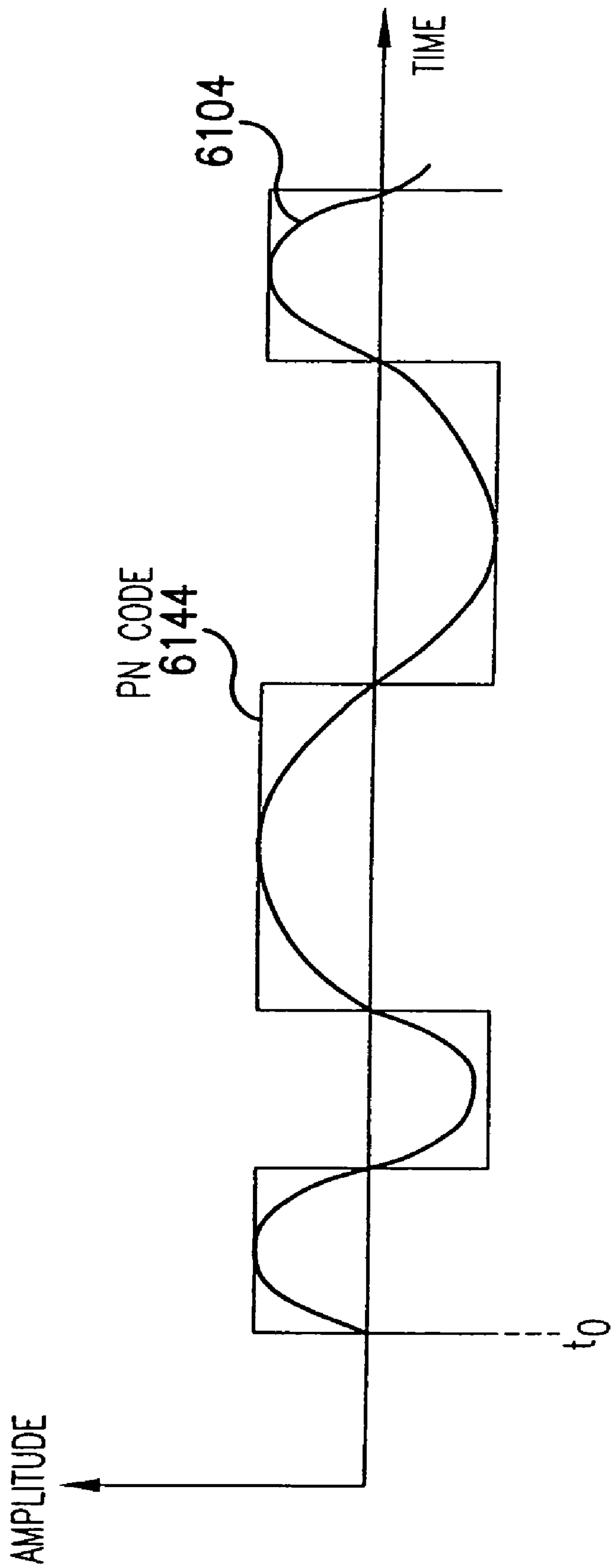

FIG. 61B illustrates the resulting shaped I signal 6104 and the corresponding spreading code 6144. The amplitude of the input signal 6102 is shaped such that it is smooth and so that it has zero crossings that are in time synchronization with the spreading code 6144. By smoothing input signal amplitude, high frequency components are removed from the input signal prior to sampling, which results lower sidelobe energy in the harmonic images produced during sampling.

In step 7112, the low pass filter 6105*a* filters the I shaped data signal 6104 to remove any unwanted high frequency components, resulting in an I filtered signal 6106. Likewise, the low pass filter 6105*b* filters the Q shaped data signal 6120, resulting in a Q filtered signal 6122.

In step 7114, the modulator 3404*a* samples the I filtered signal 6106 in a balanced and differential manner according to the control signals 6130 and 6132, to generate a harmonically rich signal 6108. As discussed in reference to FIG. 34, the control signals 6130 and 6132 trigger the controlled switches in the modulator 3404*a*, resulting in multiple harmonic images in the harmonically rich signal 6108, where each image contains the I baseband information. Since the control signals 6130 and 6132 also carry the I spreading code 6144, the modulator 3404*a* up-converts and spreads the filtered signal 6106 in an integrated manner during the sampling process. As such, the harmonic images in the harmonically rich signal 6108 are spread spectrum signals.

In step 7116, the modulator 3404*b* samples the Q filtered signal 6122 in a balanced and differential manner according to the control signals 6126 and 6128, to generate a harmonically rich signal 6124. The control signals 6126 and 6128 trigger the controlled switches in the modulator 3404*b*, resulting in multiple harmonic images in the harmonically rich signal 6124, where each image contains the Q baseband information. As with modulator 3404*a*, the control signals 6126 and 6128 carry the Q spreading code 6142 so that the modulator 3404*b* up-converts and spreads the filtered signal 6122 in an integrated manner during the sampling process. In other words, the harmonic images in the harmonically rich signal 6124 are also spread spectrum signals.

In step 7118, a 90 signal combiner 6146 combines the I harmonically rich signal 6108 and the Q harmonically rich signal 6124, to generate the IQ harmonically rich signal 6148. The IQ harmonically rich signal 6148 contains multiple harmonic images, where each images contains the spread I data and the spread Q data. The 90 degree combiner phase shifts the Q signal 6124 relative to the I signal 6108 so that no increase in spectrum width is needed for the IQ signal 6148, when compared the I signal or the Q signal.

In step 7120, the optional bandpass filter 3406 select the harmonic (or harmonics) of interest from the harmonically rich signal 6148, to generate a desired harmonic 6114.

In step 7122, the optional amplifier 3408 amplifies the desired harmonic 6114 for transmission, resulting in the output signal 6116.

Figure 62A:
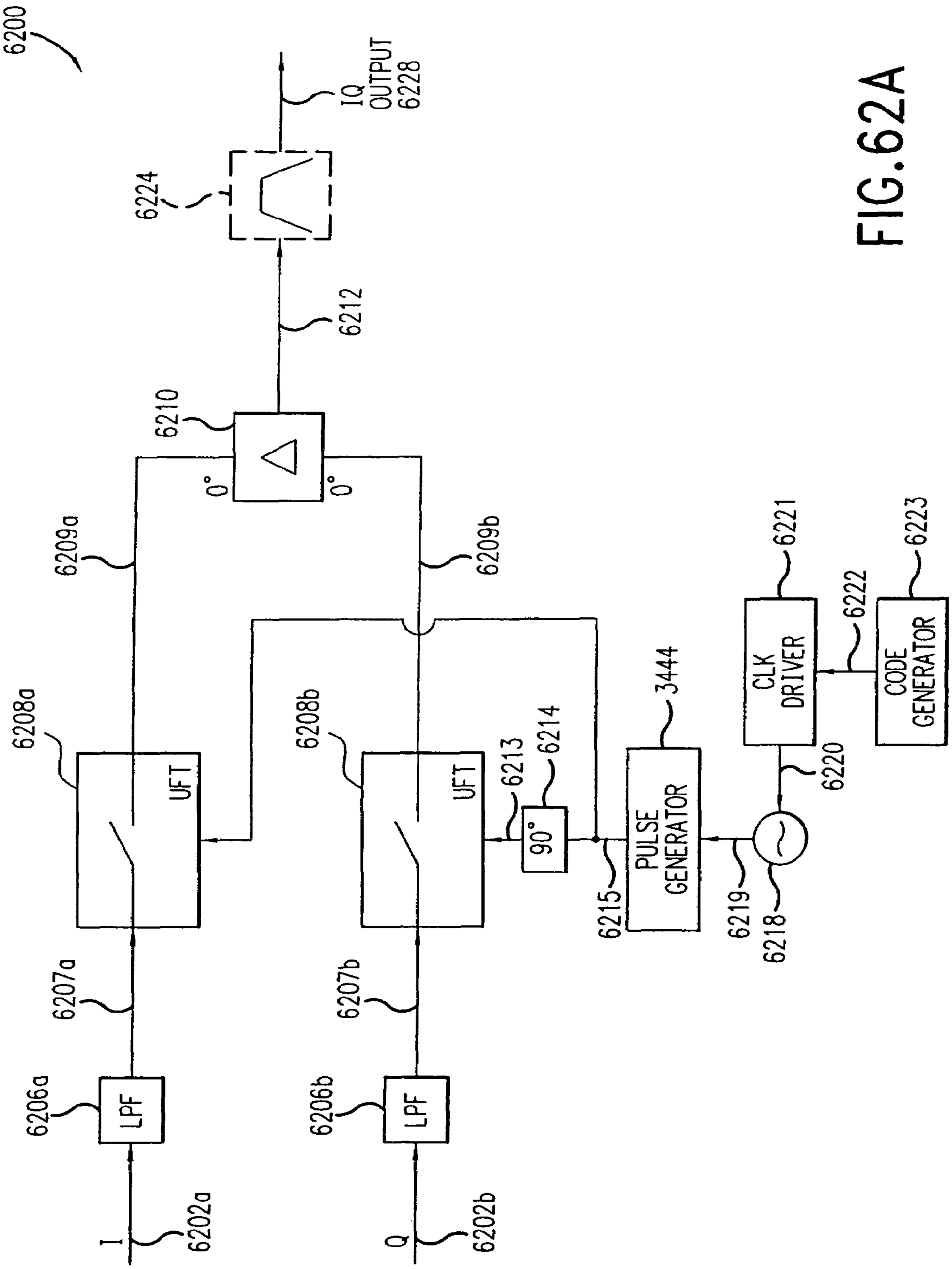
FIGS. 62A-B illustrate modulator 6200 and associated signal diagrams according to embodiments of the present invention.

8.6.2 Integrated Up-Conversion and Spreading Using a Smoothly Varying Clock Signal FIG. 62A illustrates a spread spectrum transmitter 6200 that is another embodiment of balanced UFT modules that perform up-conversion and spreading simultaneously. More specifically, the spread spectrum transmitter 6200 does simultaneous up-conversion and spreading of an I data signal 6202*a* and a Q data signal 6202*b* to generate an IQ output signal 6228. Similar to modulator 6100, transmitter 6200 modulates the clock signal that controls the UFT modules with the spreading codes to spread the input I and Q signals during up-conversion. However, the transmitter 6200 modulates the clock signal by smoothly varying the instantaneous frequency or phase of a voltage controlled oscillator (VCO) with the spreading code. The transmitter 6200 is described in detail as follows with reference to a flowchart 7200 that is shown in FIGS. 72A and 72B.

In step 7201, the transmitter 6200 receives the I baseband signal 6202*a* and the Q baseband signal 6202*b*.

In step 7202, a code generator 6223 generates a spreading code 6222. In embodiments of the invention, the spreading code 6222 is a PN code or any other type off useful code for spread spectrum systems. Additionally, in embodiments of the invention, there are separate spreading codes for the I and Q channels.

Figure 62B:
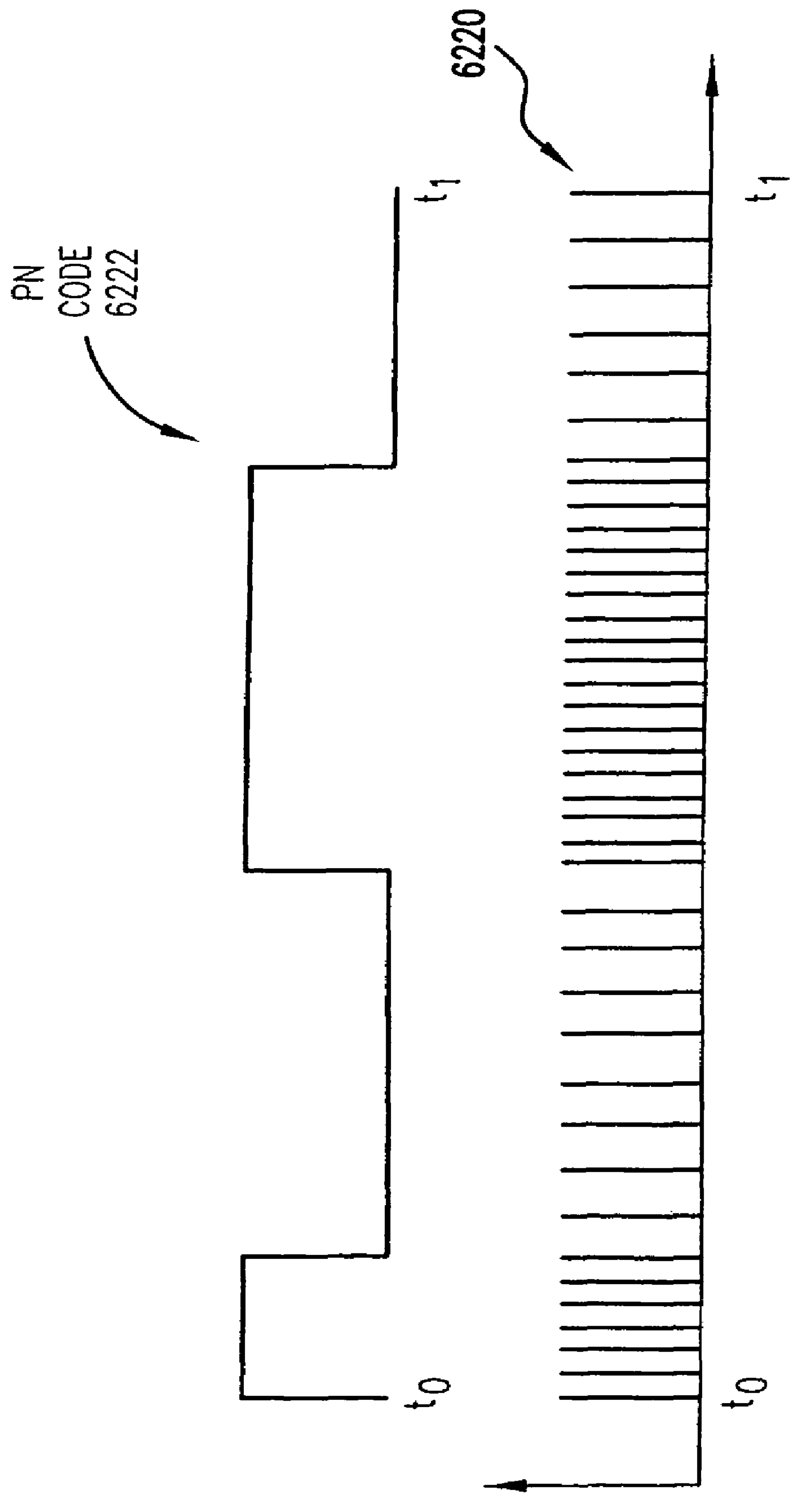

In step 7204, a clock driver circuit 6221 generates a clock driver signal 6220 that is phase modulated according to a spreading code 6222. FIG. 62B illustrates the clock driver signal 6220 as series of pulses, where the instantaneous frequency (or phase) of the pulses is determined by the spreading code 6222, as shown. In embodiments of the invention, the phase of the pulses in the clock driver 6220 is varied smoothly in correlation with the spreading code 6222.

In step 7206, a voltage controlled oscillator 6218 generates a clock signal 6219 that has a frequency that varies according to a clock driver signal 6220. As mentioned above, the phase of the pulses in the clock driver 6220 is varied smoothly in correlation with the spreading code 6222 in embodiments of the invention. Since the clock driver 6220 controls the oscillator 6218, the frequency of the clock signal 6219 varies smoothly as a function of the PN code 6222. By smoothly varying the frequency of the clock signal 6219, the sidelobe growth in the spread spectrum images is minimized during the sampling process.

In step 7208, the pulse generator 3444 generates a control signal 6215 based on the clock signal 6219 that is similar to either one the controls signals 3423 or 3427 (in FIGS. 35A and 35B). The control signal 6215 carries the spreading code 6222 via the clock signal 6219. In embodiments of the invention, the pulse width ($T_A$) of the control signal 6215 is established to optimize energy transfer to specific harmonics in the harmonically rich signal 6228 at the output. For the Q channel, a phase shifter 6214 shifts the phase of the control signal 6215 by 90 degrees to implement the desired quadrature phase shift between the I and Q channels, resulting in a control signal 6213.

In step 7210, a low pass filter (LPF) 6206_a_ filters the I data signal 6202_a_ to remove any unwanted high frequency components, resulting in an I signal 6207_a_. Likewise, a LPF 6206_b_ filters the Q data signal 6202_b_ to remove any unwanted high frequency components, to generate the Q signal 6207_b_.

In step 7212, a UFT module 6208_a_ samples the I data signal 6207_a_ according to the control signal 6215 to generate a harmonically rich signal 6209_a_. The harmonically rich signal 6209_a_ contains multiple spread spectrum harmonic images that repeat at harmonics of the sampling frequency. Similar to the transmitter 6100, the harmonic images in signal 6209_a_ carry the I baseband information, and are spread spectrum due to the spreading code on the control signal 6215.

In step 7214, a UFT module 6208_b_ samples the Q data signal 6207_b_ according to the control signal 6213 to generate harmonically rich signal 6209_b_. The harmonically rich signal 6209_b_ contains multiple spread spectrum harmonic images that repeat at harmonics of the sampling frequency. The harmonic images in signal 6209_b_ carry the Q baseband information, and are spread spectrum due to the spreading code on the control signal 6213.

In step 7216, a signal combiner 6210 combines the harmonically rich signal 6209_a_ with the harmonically rich signal 6209_b_ to generate an IQ harmonically rich signal 6212. The harmonically rich signal 6212 carries multiple harmonic images, where each image carries the spread I data and the spread Q data.

In step 7218, the optional bandpass filter 6224 selects a harmonic (or harmonics) of interest for transmission, to generate the IQ output signal 6228.

9.0 CONCLUSION

Example implementations of the systems and components of the invention have been described herein. As noted elsewhere, these example implementations have been described for illustrative purposes only, and are not limiting. Other implementation embodiments are possible and covered by the invention, such as but not limited to software and software/hardware implementations of the systems and components of the invention. Such implementation embodiments will be apparent to persons skilled in the relevant art(s) based on the teachings contained herein.

While various application embodiments of the present invention have been described above, it should be understood that they have been presented by way of example only, and not limitation. Thus, the breadth and scope of the present invention should not be limited by any of the above-described exemplary embodiments.

What is claimed is:

1. A system for down-converting and de-spreading a spread spectrum signal, comprising:

a first module configured to generate a spreading code corresponding to the spread spectrum signal;

a second module configured to generate a control signal that comprises said spreading code; and a third module configured to sample said spread spectrum signal and store said samples, said third module controlled at least in part by said control signal, so as to down-convert and de-spread said spread spectrum signal to obtain a de-spread baseband signal;

wherein said third module comprises a storage device coupled to a switch to store said samples, wherein successive samples form said de-spread baseband signal; and wherein said storage device integrates energy over multiple half-cycles of said spread spectrum signal as a function of said control signal.

2. The system of claim 1, further comprising a fourth module configured to generate an oscillating signal.

3. The system of claim 2, further comprising a fifth module configured to modulate the oscillating signal with the spreading code to generate a spread oscillating signal.

4. The system of claim 3, further comprising a sixth module configured to convert said spread oscillating signal into said control signal that comprises a plurality of pulses.

5. The system of claim 4, wherein a pulse width of a pulse of said control signal is non-negligible.

6. The system of claim 4, wherein a pulse width of a pulse of said control signal is negligible.

7. The system of claim 4, wherein a pulse width of a pulse of said control signal is any fraction of a center frequency of a baseband of said spread spectrum signal.

8. The system of claim 4, wherein a frequency of said control signal is based at least in part on a frequency of said spread oscillating signal.

9. The system of claim 1, wherein said control signal is a harmonic or sub-harmonic of said spread spectrum signal.

10. The system of claim 1, wherein said third module comprises a switch controlled by said control signal to under-sample the spread spectrum signal, resulting in under-samples.

11. The system of claim 10, wherein said switch is a transistor.

12. The system of claim 1, wherein said storage device is a capacitor.

13. The system of claim 1, wherein a center frequency of said control signal is approximately equal to a center frequency of said spread spectrum signal.

14. The system of claim 1, wherein a center frequency of said control signal is above a baseband frequency of said spread spectrum signal.

15. The system of claim 1, wherein sampling comprises transferring charge from said spread spectrum signal.

16. The system of claim 1, wherein the spread spectrum signal is directly down-converted and de-spread to obtain a de-spread baseband signal.

17. The system of claim 16, wherein directly down-converting said spread spectrum signal to a de-spread baseband signal eliminates use of front-end mixers, front-end radio frequency amplification circuitry and intermediate frequency conversion circuitry.

18. A system to down-convert and de-spread a spread spectrum signal, comprising:

a first circuit configured to modulate an oscillating signal based on a spreading code, and to generate a control signal that comprises a plurality of pulses; and a second circuit configured to transfer charge from said spread spectrum signal and integrate said charge over multiple cycles of said spread spectrum signal as a function of said control signal;

wherein the second circuit comprises a switch controlled by said control signal to under-sample the spread spectrum signal, resulting in under-samples.

19. The system of claim 18, wherein a frequency of said control signal is a harmonic or sub-harmonic of said spread spectrum signal.

20. The system of claim 18, further comprising a third circuit for generating an oscillating signal.

21. The system of claim 18, wherein a frequency of said control signal is based at least in part on a frequency of said oscillating signal.

22. The system of claim 18, wherein said control signal is a harmonic or sub-harmonic of said spread spectrum signal.

23. The system of claim 18, wherein said switch is a transistor.

24. The system of claim 18, wherein a center frequency of said control signal is approximately equal to a center frequency of said spread spectrum signal.

25. The system of claim 18, wherein a center frequency of said control signal is above a baseband frequency of said spread spectrum signal.

26. The system of claim 18, wherein the spread spectrum signal is directly down-converted and de-spread to obtain a de-spread baseband signal.

27. The system of claim 26, wherein directly down-converting said spread spectrum signal to a de-spread baseband signal eliminates use of front-end mixers, front-end radio frequency amplification circuitry and intermediate frequency conversion circuitry.

28. A system to down-convert and de-spread a spread spectrum signal, comprising:

a first circuit configured to modulate an oscillating signal based on a spreading code, and to generate a control signal that comprises a plurality of pulses; and a second circuit configured to transfer charge from said spread spectrum signal and integrate said charge over multiple cycles of said spread spectrum signal as a function of said control signal;

wherein the second circuit further comprises a storage device coupled to a switch to store said charge, wherein successive samples of said charge form said de-spread baseband signal.

29. The system of claim 28, wherein said storage device is a capacitor.

* * * * *